US009530546B2

(12) United States Patent
Nukaga et al.

(10) Patent No.: US 9,530,546 B2
(45) Date of Patent: Dec. 27, 2016

(54) CHIP RESISTOR AND METHOD OF PRODUCING THE SAME

(71) Applicant: ROHM CO., LTD., Kyoto (JP)

(72) Inventors: Eiji Nukaga, Kyoto (JP); Hiroshi Tamagawa, Kyoto (JP); Yasuhiro Kondo, Kyoto (JP); Katsuya Matsuura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 223 days.

(21) Appl. No.: 14/368,757

(22) PCT Filed: Dec. 18, 2012

(86) PCT No.: PCT/JP2012/082725
§ 371 (c)(1),
(2) Date: Jun. 25, 2014

(87) PCT Pub. No.: WO2013/099688
PCT Pub. Date: Jul. 4, 2013

(65) Prior Publication Data

US 2014/0354396 A1 Dec. 4, 2014

(30) Foreign Application Priority Data

Dec. 28, 2011 (JP) ................................ 2011-289282
Jan. 27, 2012 (JP) ................................ 2012-015423
(Continued)

(51) Int. Cl.
*H01C 7/18* (2006.01)
*H01C 7/00* (2006.01)
(Continued)

(52) U.S. Cl.
CPC ................ *H01C 7/006* (2013.01); *H01C 7/00* (2013.01); *H01C 13/02* (2013.01); *H01C 17/006* (2013.01);
(Continued)

(58) Field of Classification Search
CPC ....... H01C 7/006; H01C 17/006; H01C 13/02; H01C 7/00
(Continued)

(56) References Cited

U.S. PATENT DOCUMENTS 5,548,269 A * 8/1996 Katsuno .................. H01C 7/00 338/195
6,023,217 A * 2/2000 Yamada ................ H01C 1/142 338/307
(Continued)

FOREIGN PATENT DOCUMENTS

JP S61-230301 A 10/1986
JP H02-222103 A 9/1990
(Continued)

*Primary Examiner* — Kyung Lee
(74) *Attorney, Agent, or Firm* — Rabin & Berdo, P.C.

(57) ABSTRACT

[Subject]To provide a chip resistor free from chipping of corner portions thereof and a method of producing the chip resistor.
[Solution] The chip resistor (1) includes: a board (2) having a device formation surface (2A), a back surface (2B) opposite from the device formation surface (2A) and side surfaces (2C-2F) connecting the device formation surface (2A) to the back surface (2B), a resistor portion (56) provided on the device formation surface (2A), a first connection electrode (3) and a second connection electrode (4) provided on the device formation surface (2A) and electrically connected to the resistor portion (56), and a resin film (24) covering the device formation surface (2A) with the first connection electrode (3) and the second connection electrode (4) being exposed therefrom. Intersection portions (11) of the board
(Continued)

1

(2) along which the back surface (2B) intersects the side surfaces (2C-2F) each have a rounded shape.

20 Claims, 162 Drawing Sheets

(30) Foreign Application Priority Data

| | | |
|---|---|---|
| Jan. 27, 2012 | (JP) | 2012-015424 |
| Jan. 27, 2012 | (JP) | 2012-015425 |
| Feb. 24, 2012 | (JP) | 2012-039179 |
| Feb. 24, 2012 | (JP) | 2012-039180 |
| Dec. 10, 2012 | (JP) | 2012-269719 |

(51) Int. Cl.

| | |
|---|---|
| ***H01C 13/02*** | (2006.01) |
| ***H01C 17/06*** | (2006.01) |
| ***H01C 17/242*** | (2006.01) |
| ***H01C 17/00*** | (2006.01) |
| ***H01G 2/06*** | (2006.01) |

(52) U.S. Cl.

CPC ............ *H01C 17/06* (2013.01); *H01C 17/242* (2013.01); *H01G 2/065* (2013.01); *Y10T 29/49082* (2015.01)

(58) Field of Classification Search

USPC .................................................. 338/204, 195

See application file for complete search history.

(56) References Cited

U.S. PATENT DOCUMENTS

| | | | | | |
|---|---|---|---|---|---|
| 6,984,543 | B2 * | 1/2006 | Mihara | C04B 35/4682 | 438/106 |
| 7,053,749 | B2 * | 5/2006 | Ishida | H01C 1/144 | 338/323 |
| 7,612,429 | B2 | 11/2009 | Tsukada et al. | | |
| 8,154,379 | B2 * | 4/2012 | Theissl | H01C 1/1406 | 338/22 R |
| 8,941,462 | B2 * | 1/2015 | Lee | H01C 7/008 | 338/13 |
| 2002/0084531 | A1 * | 7/2002 | Abe | H01C 1/01 | 257/777 |
| 2012/0223807 | A1 * | 9/2012 | Sakai | H01C 1/142 | 338/327 |

FOREIGN PATENT DOCUMENTS

| | | | |
|---|---|---|---|
| JP | H07-326501 | A | 12/1995 |
| JP | H08-124701 | A | 5/1996 |
| JP | H10-135016 | A | 5/1998 |
| JP | 2000-340530 | A | 12/2000 |
| JP | 2001-076912 | A | 3/2001 |
| JP | 2001-284166 | A | 10/2001 |
| JP | 2004-140285 | A | 5/2004 |
| JP | 2004-186541 | A | 7/2004 |
| JP | 2005-268300 | A | 9/2005 |
| JP | 2006-245293 | A | 9/2006 |

* cited by examiner (a)

(b)

(a)

(b)

( a )

( b )

(a)

(b)

( a )

( b )

( a )

( b )

( c )

(a)

(b)

( a )

( b )

(a)

(b)

(c)

(a)

(b)

(c)

CHIP RESISTOR AND METHOD OF PRODUCING THE SAME

TECHNICAL FIELD

The present invention relates to a chip resistor and a method of producing the same.

BACKGROUND ART

In a chip resistor disclosed in PTL1, elements such as a resistive film and main electrodes connected to opposite ends of the resistive film are provided on a front surface of a chip-type insulative board. For production of the chip resistor, a material substrate having a plurality of devices formed on a front surface thereof is cut along predetermined dicing lines on boundaries between the devices by means of a dicing saw to be thereby divided into a plurality of insulative boards. Then, surfaces of the electrodes on each of the insulative boards are plated. Thus, the chip resistor is completed.

CITATION LIST

Patent Literature

PTL1: JP-2001-76912A

SUMMARY OF INVENTION

Technical Problem

In PTL1, the material substrate is cut by means of the dicing saw. Therefore, corner portions of each of the insulative boards resulting from the cutting and the dividing of the material substrate are angled and hence susceptible to chipping (cracking or fragmentation). If the chipping occurs, the chip resistor has a poorer appearance. This may prevent improvement of the productivity of the chip resistor. If the chip resistor is chipped when being mounted on a mount board, fragments of a corner portion of the chip resistor are scattered as foreign matter on the mount board, resulting in a short circuit or a mounting failure.

It is therefore an object of the present invention to provide a chip resistor which is free from chipping of a corner portion thereof, and to provide a method of producing the same.

Solution to Problem

The inventive chip resistor includes: a board having a device formation surface, a back surface opposite from the device formation surface and a side surface connecting the device formation surface to the back surface; a resistor portion provided on the device formation surface; an external connection electrode provided on the device formation surface and electrically connected to the resistor portion; and a resin film which covers the device formation surface with the external connection electrode being exposed therefrom, wherein an intersection portion of the board along which the back surface intersects the side surface has a rounded shape (claim 1). This arrangement prevents the chipping of the intersection portion (corner portion) of the board between the back surface and the side surface, thereby improving the productivity.

The board has a plurality of side surfaces intersecting one another, and intersection portions of the board along which the side surfaces intersect one another preferably each have a rounded shape (claim 2). This arrangement prevents not only the chipping of the intersection portions between the back surface and the side surfaces but also the chipping of the intersection portions between the side surfaces. The rounded shape preferably has a curvature radius of not greater than 20 μm (claim 3). An insulative layer is preferably provided between the board and the resistor portion (claim 4).

The resistor portion preferably includes a thin film resistor body provided on the device formation surface. The chip resistor preferably further includes an interconnection film provided on the device formation surface and connected to the thin film resistor body, and the resin film preferably covers the thin film resistor body and the interconnection film (claim 5). This arrangement prevents foreign matter from adhering to the thin film resistor body and the interconnection film, thereby preventing a short circuit of the thin film resistor body and the interconnection film.

The resistor portion includes a plurality of thin film resistor bodies each having the same resistance value, and the thin film resistor bodies are preferably connected in a connection state which is changeable in a predetermined trimming region (claim 6). The chip resistor preferably further includes a protective film provided over the device formation surface as covering the thin film resistor body and the interconnection film, and the resin film preferably covers a surface of the protective film (claim 7). With this arrangement, the thin film resistor body and the interconnection film can be double-protected with the protective film and the resin film.

An intersection portion of the board along which the device formation surface intersects the side surface may have a shape different from the rounded shape (claim 8). In this case, the resin film preferably covers the intersection portion of the board along which the device formation surface intersects the side surface (claim 9). With this arrangement, the resin film prevents the chipping of the intersection portion of the board between the device formation surface and the side surface.

The resin film is preferably bulged outwardly of the board on the intersection portion of the board along which the device formation surface intersects the side surface (claim 10). With this arrangement, when the chip resistor is brought into contact with the surroundings, a bulged portion of the resin film first meets the surroundings to reduce an impact occurring due to the contact. This prevents the impact from influencing the device and the like of the chip resistor.

The resin film is preferably provided on a region of the side surface of the board located adjacent the device formation surface away from the back surface (claim 11). The resin film preferably comprises a polyimide (claim 12). The inventive chip resistor production method includes the steps of: defining a plurality of chip resistor regions each having a resistor portion on a device formation surface of a substrate; removing a part of the substrate from a boundary region defined between adjacent chip resistor regions to form a side surface perpendicular to the device formation surface; dividing the substrate along the boundary region to separate chip resistors from each other; and etching the substrate from a back surface of the substrate opposite from the device formation surface to round an intersection portion of a board of each of the separated chip resistors along which the back surface intersects the side surface (claim 13). This method makes it possible to produce the chip resistors, in which the intersection portion of the board between the back surface and the side surface has a rounded shape.

In the side surface forming step, a plurality of side surfaces which intersect one another are preferably formed, and the etching is preferably isotropic etching. Further, intersection portions along which the side surfaces intersect one another are preferably rounded (claim 14). Thus, the chip resistors can be produced, in which the intersection portions of the board between the back surface and the side surfaces as well as the intersection portions of the board between the side surfaces each have a rounded shape.

The etching step preferably includes the step of spouting a mist of an etching liquid toward the back surfaces of the chip resistors (claim 15). Thus, the mist of the etching liquid can easily adhere to the intersection portions, so that the intersection portions can be preferentially etched. This makes it possible to round the intersection portions while suppressing the etching of the back surfaces and the side surfaces. The production method preferably further includes the step of forming a resin film which covers the device formation surface (claim 16). Thus, the device formation surface can be protected with the resin film.

The resin film forming step preferably includes the step of covering, with the resin film, the intersection portion of the board along which the device formation surface intersects the side surface (claim 17). Thus, the intersection portion of the board between the device formation surface and the side surface can be protected with the resin film, making it possible to prevent the chipping of the intersection portion. The side surface forming step preferably includes the step of forming a trench in the boundary region of the substrate defined between the adjacent chip resistor regions, and the chip resistor separating step preferably includes the step of thinning the substrate from the back surface to the trench (claim 18). Thus, the substrate can be divided into the individual chip resistors.

The production method preferably further includes the step of bonding a support base to the device formation surface after the formation of the trench, and the substrate is preferably thinned from the back surface in the thinning step while being supported by the support base. Further, the plurality of chip resistors are preferably etched while being supported by the support base (claim 19). Thus, the intersection portions of the respective chip resistors can be simultaneously rounded.

The etching is preferably performed while the support base is rotated within a plane coplanar with the back surface (claim 20). Thus, the etching agent can be evenly applied to the intersection portions of the respective chip resistors, making it possible to uniformly round the intersection portions of the respective chip resistors.

BRIEF DESCRIPTION OF THE DRAWINGS

FIG. 31(*c*) is a plan view of the chip resistor.

FIG. 54(*c*) is a plan view of the chip resistor.

FIG. 61 is a sectional view taken along a sectional line LXI-LXI in

FIG. 60.

FIG. 75B is a schematic sectional view showing a process step subsequent to that shown in FIG. 75A.

FIG. 75C is a schematic sectional view showing a process step subsequent to that shown in FIG. 75B.

FIG. 75D is a schematic sectional view showing a process step subsequent to that shown in FIG. 75C.

FIG. 76A is a schematic sectional view showing chip resistors after the step of FIG. 73G.

FIG. 76B is a schematic sectional view showing a process step subsequent to that shown in FIG. 76A.

FIG. 76C is a schematic sectional view showing a process step subsequent to that shown in FIG. 76B.

FIG. 77(*a*) is a schematic vertical sectional view taken longitudinally of the chip resistor, and FIG. 77(*b*) is a schematic vertical sectional view taken widthwise of the chip resistor. FIG. 77(*c*) is a plan view of the chip resistor.

FIG. 78 illustrate a chip resistor according to a first modification of the third reference embodiment, FIG. 78(*a*) being a schematic vertical sectional view taken longitudinally of the chip resistor, FIG. 78(*b*) being a schematic vertical sectional view taken widthwise of the chip resistor.

FIG. 79 illustrate a chip resistor according to a second modification of the third reference embodiment, FIG. 79(*a*) being a schematic vertical sectional view taken longitudinally of the chip resistor, FIG. 79(*b*) being a schematic vertical sectional view taken widthwise of the chip resistor, FIG. 79(*c*) being a plan view of the chip resistor.

FIG. 80 illustrate a chip resistor according to a third modification of the third reference embodiment, FIG. 80(*a*) being a schematic vertical sectional view taken longitudinally of the chip resistor, FIG. 80(*b*) being a schematic vertical sectional view taken widthwise of the chip resistor.

FIG. 81 illustrate a chip resistor according to a fourth modification of the third reference embodiment, FIG. 81(*a*) being a schematic vertical sectional view taken longitudinally of the chip resistor, FIG. 81(*b*) being a schematic vertical sectional view taken widthwise of the chip resistor.

FIG. 82 illustrate a chip resistor according to a fifth modification of the third reference embodiment, FIG. 82(*a*) being a schematic vertical sectional view taken longitudinally of the chip resistor, FIG. 82(*b*) being a schematic vertical sectional view taken widthwise of the chip resistor.

Figure 83:
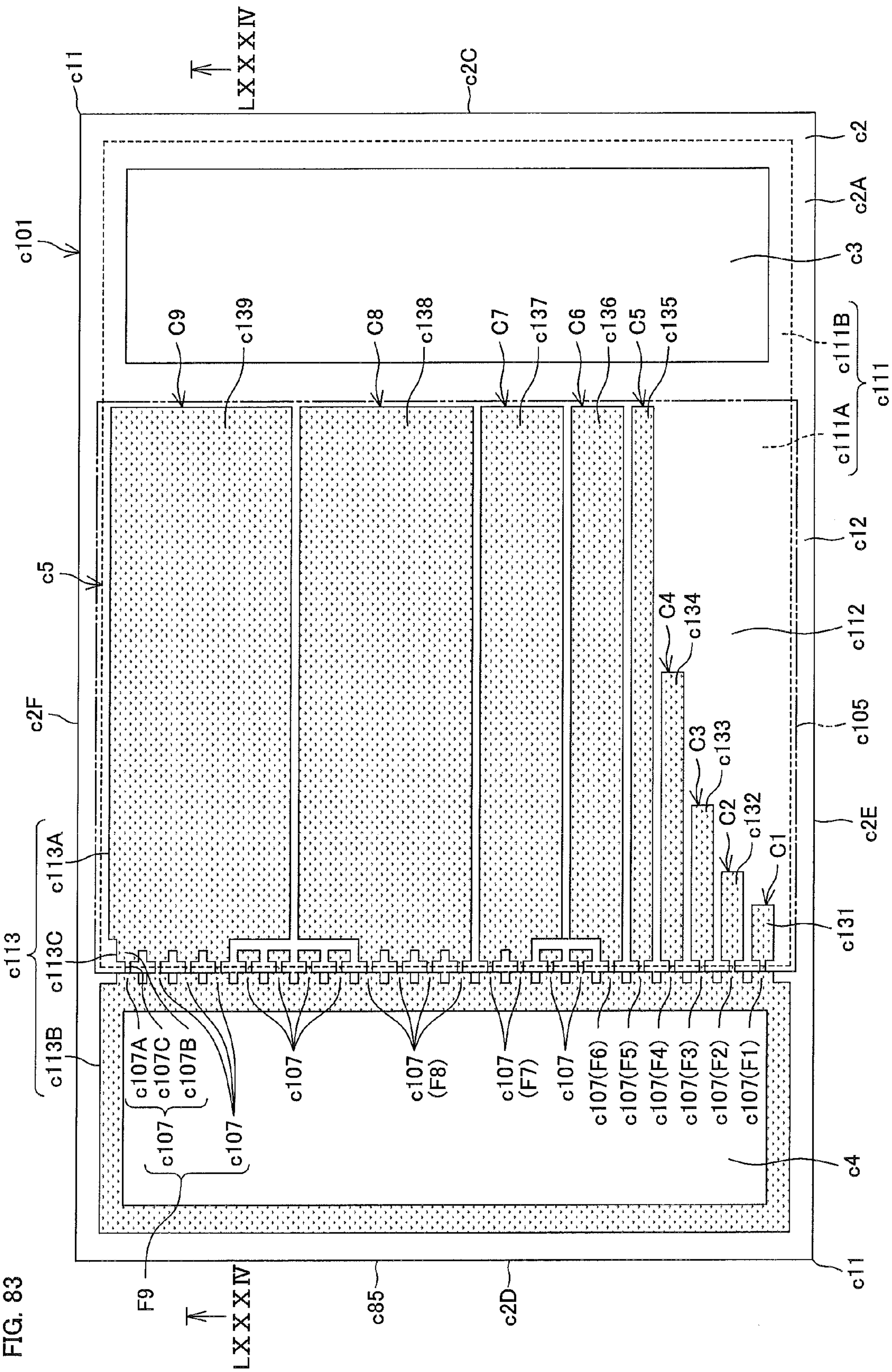

FIG. 83 is a plan view of a chip capacitor according to another example of the third reference embodiment.

Figure 84:
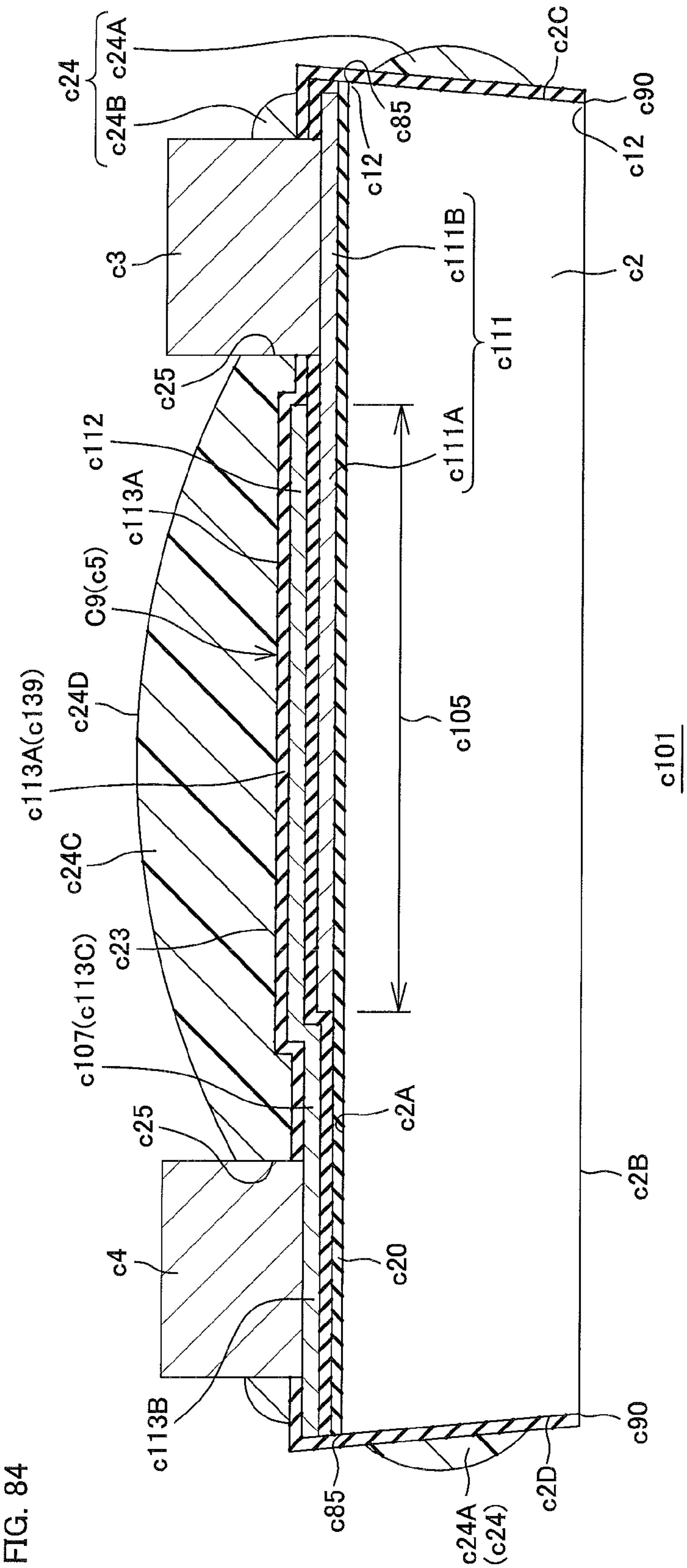

FIG. 84 is a sectional view taken along a sectional line LXXXIV-LXXXIV in FIG. 83.

Figure 85:
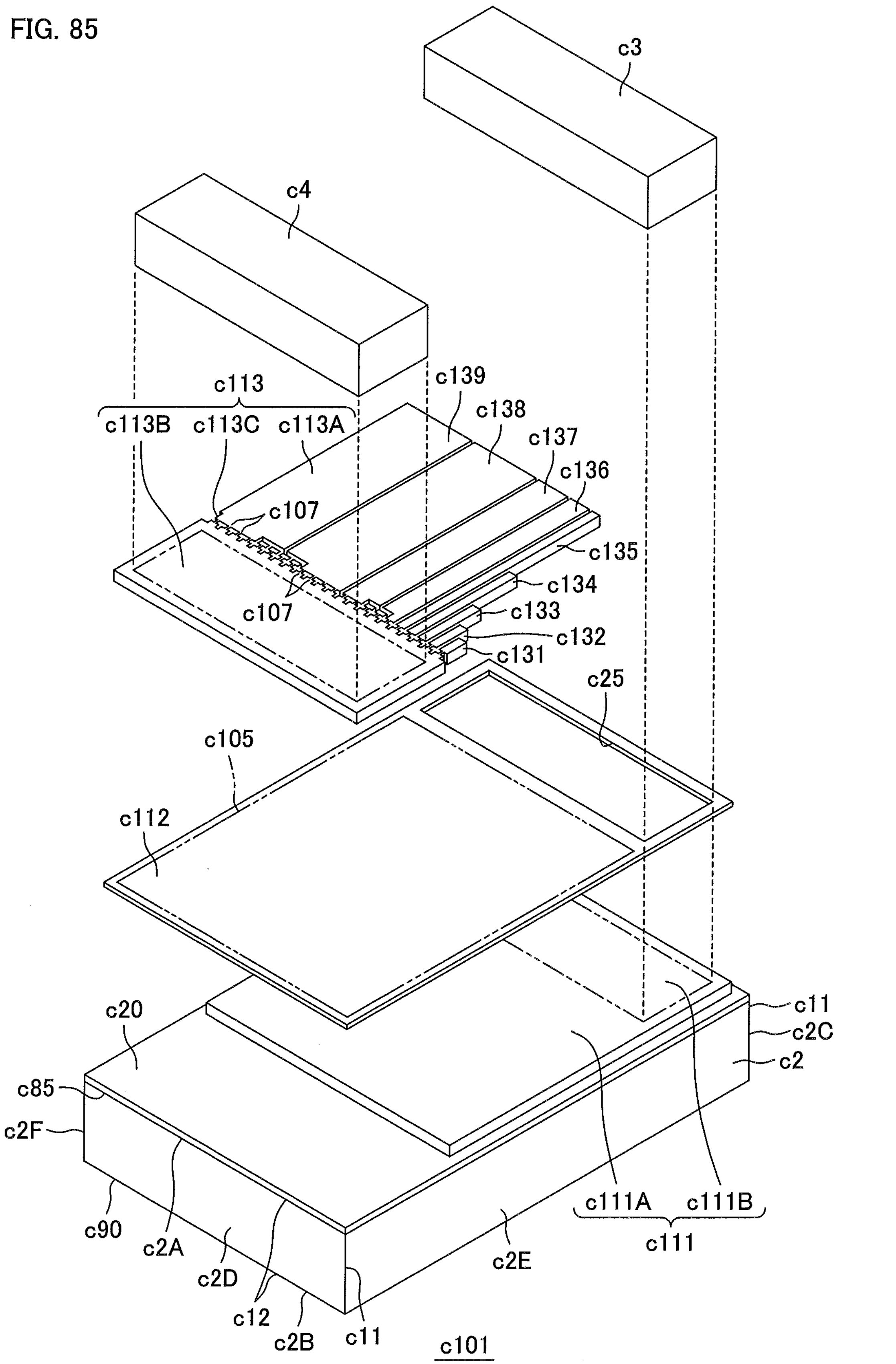

FIG. 85 is an exploded perspective view illustrating the chip capacitor with parts thereof separated.

Figure 86:
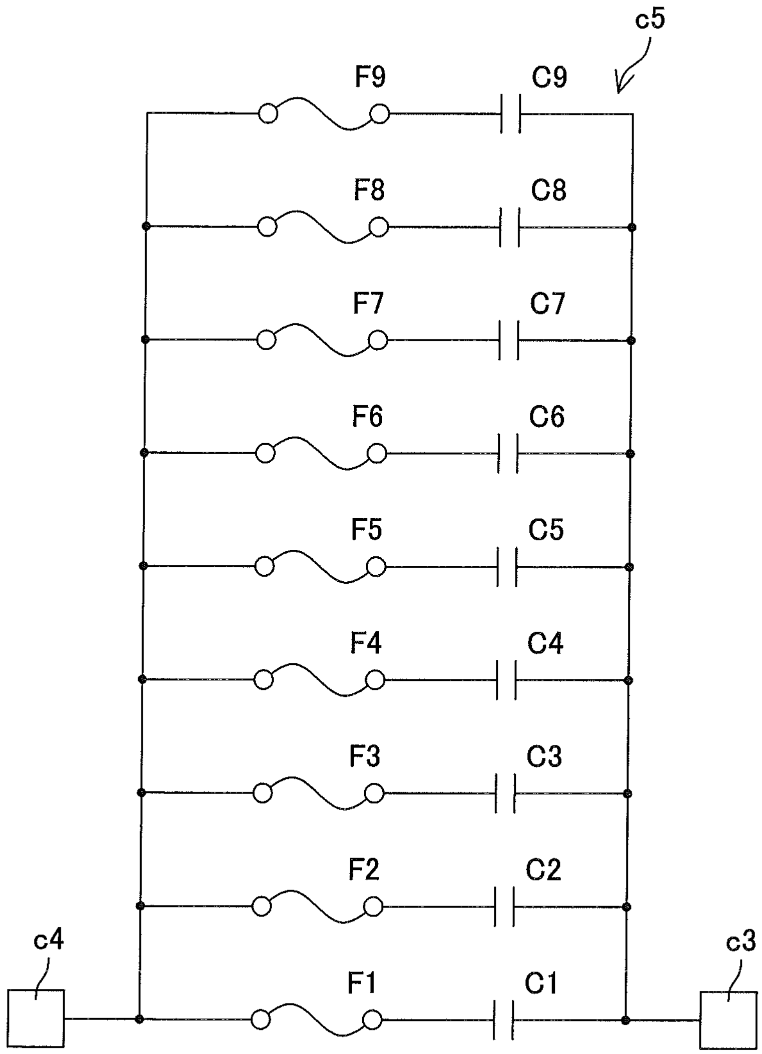

FIG. 86 is a circuit diagram showing the internal electrical configuration of the chip capacitor.

Figure 87:
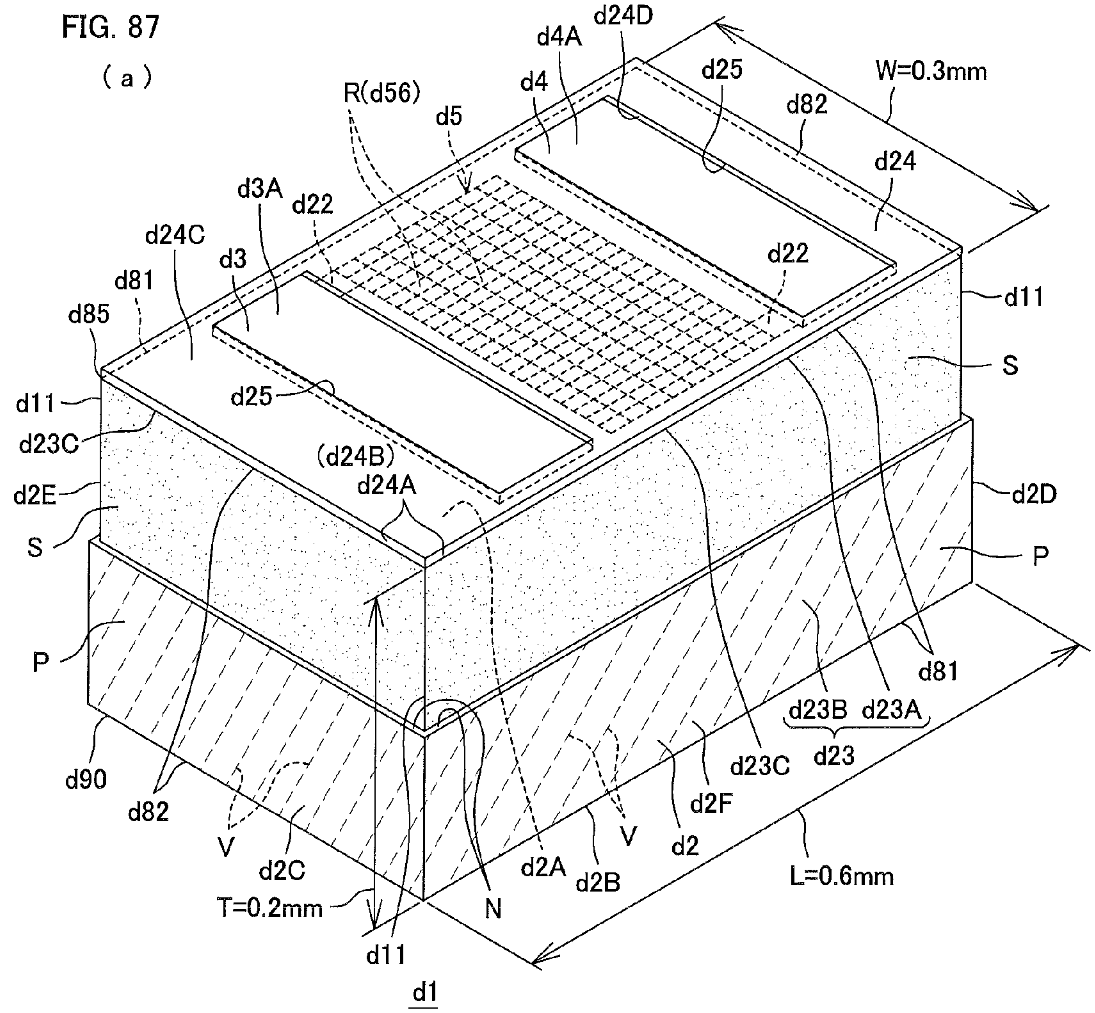
Figure 87:
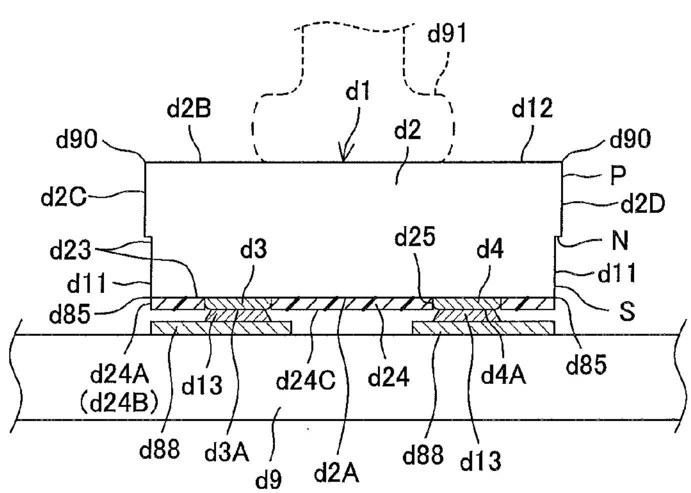

FIG. 87(*a*) is a schematic perspective view for explaining the construction of a chip resistor according to an example of a fourth reference embodiment, and FIG. 87(*b*) is a schematic sectional view illustrating the chip resistor, which is mounted on a mount board.

Figure 88:
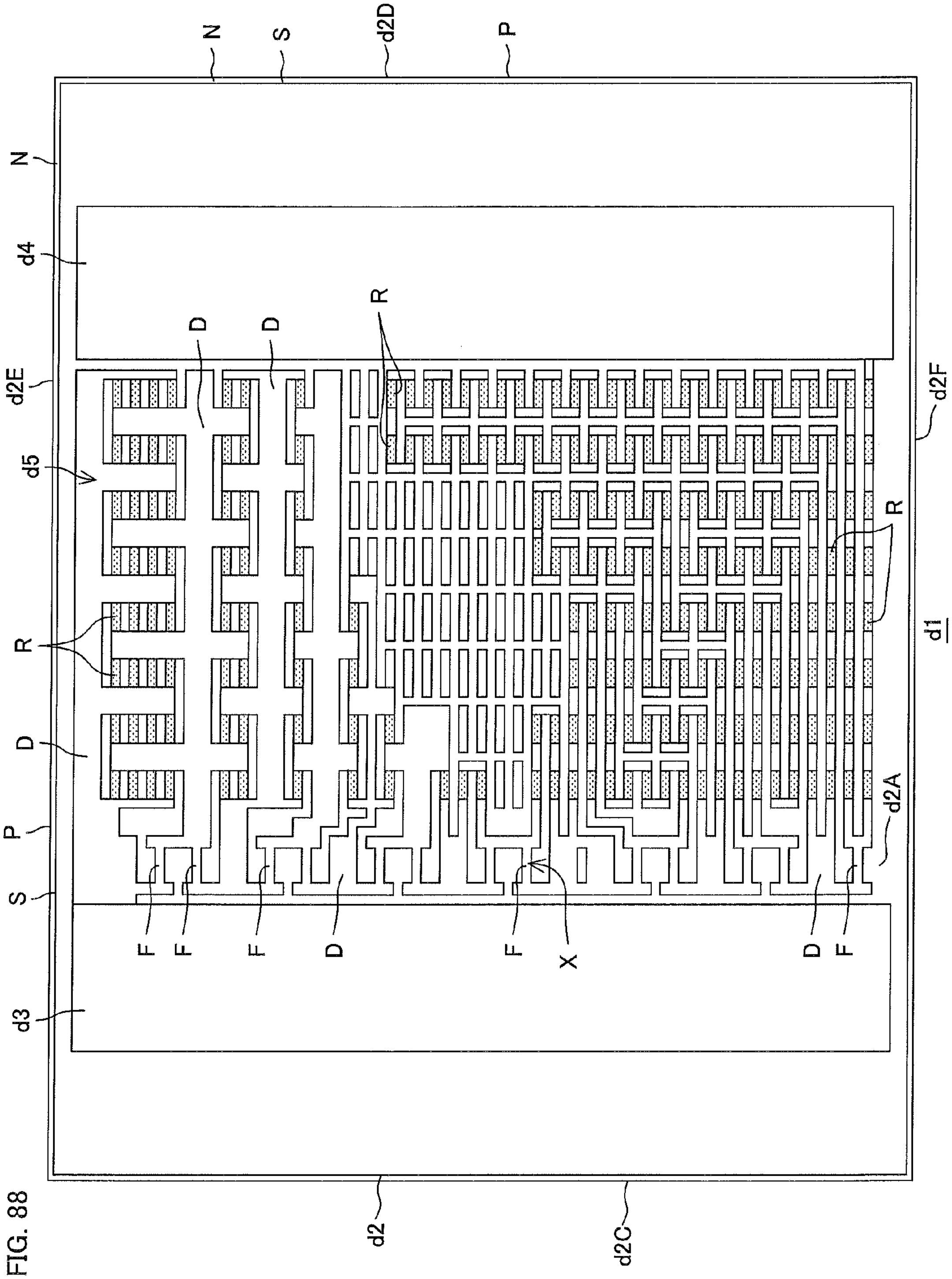

FIG. 88 is a plan view of the chip resistor showing the layout of a first connection electrode, a second connection electrode and a device, and the structure of the device as viewed in plan.

Figure 89A:
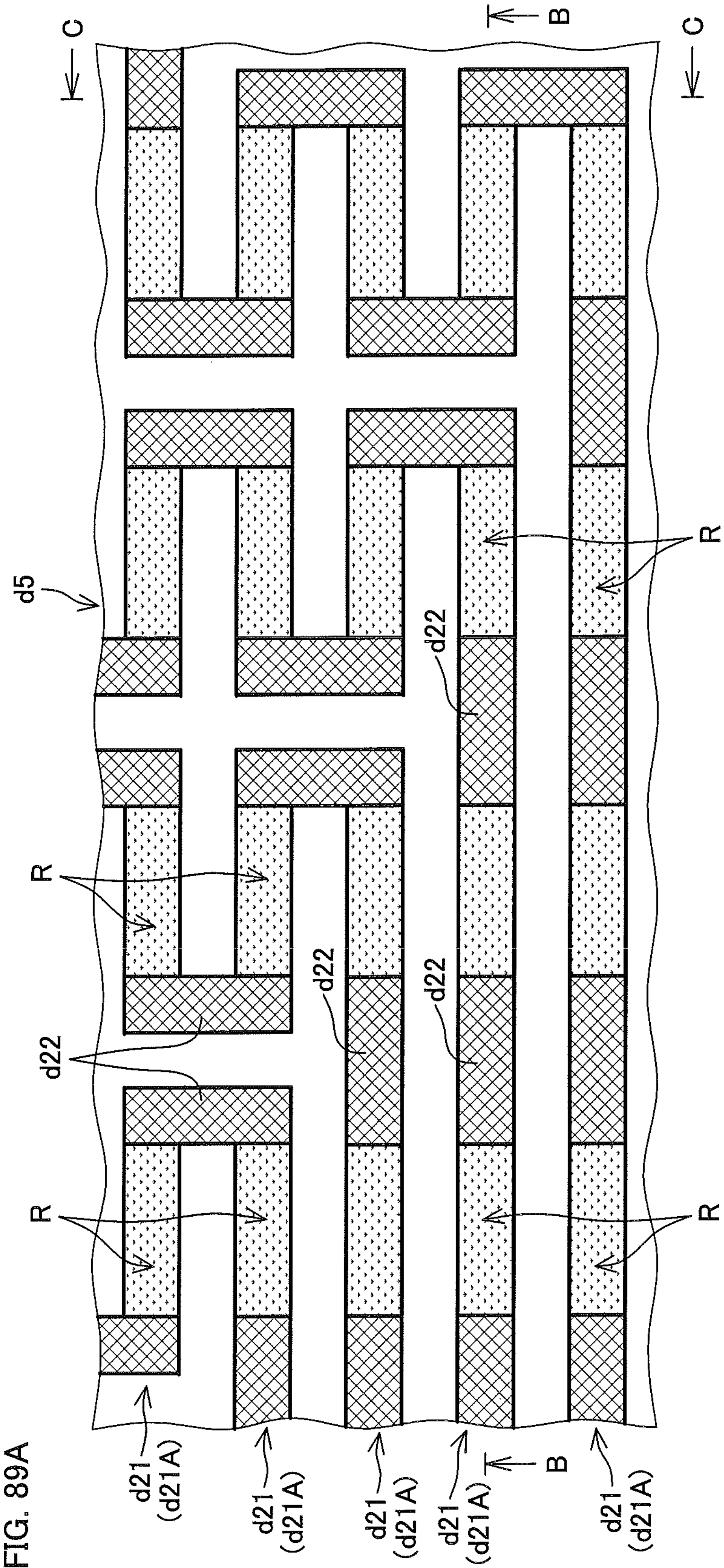

FIG. 89A is a plan view illustrating a part of the device shown in FIG. 88 on an enlarged scale.

Figure 89B:
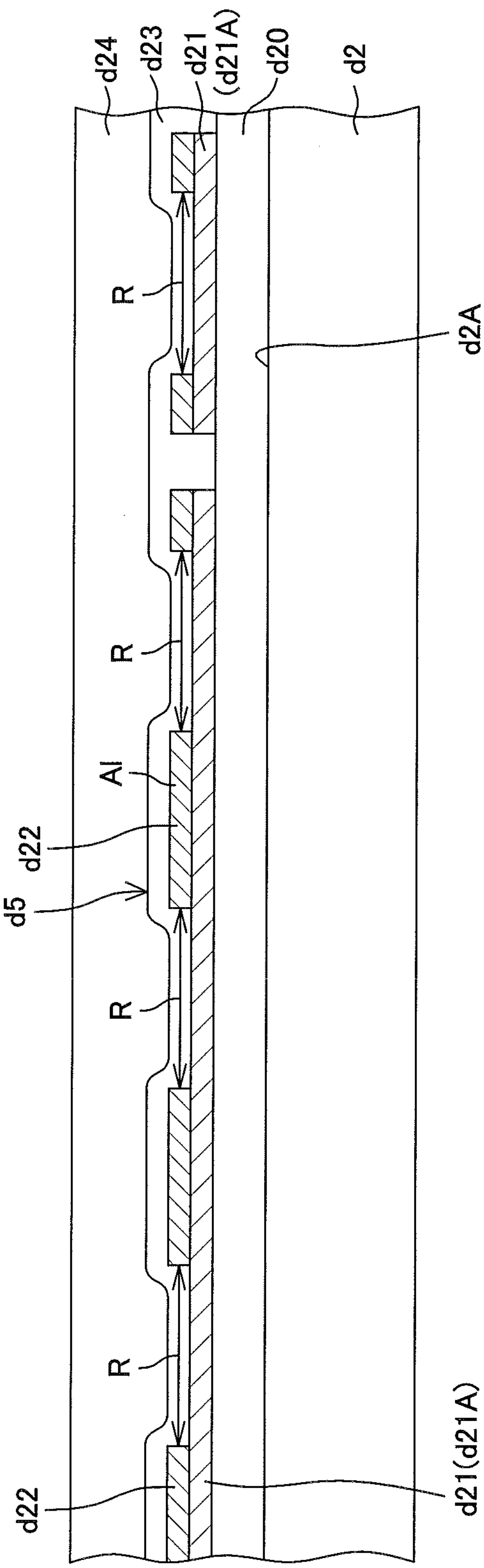

FIG. 89B is a longitudinal vertical sectional view taken along a line B-B in FIG. 89A for explaining the structure of resistor bodies of the device.

Figure 89C:
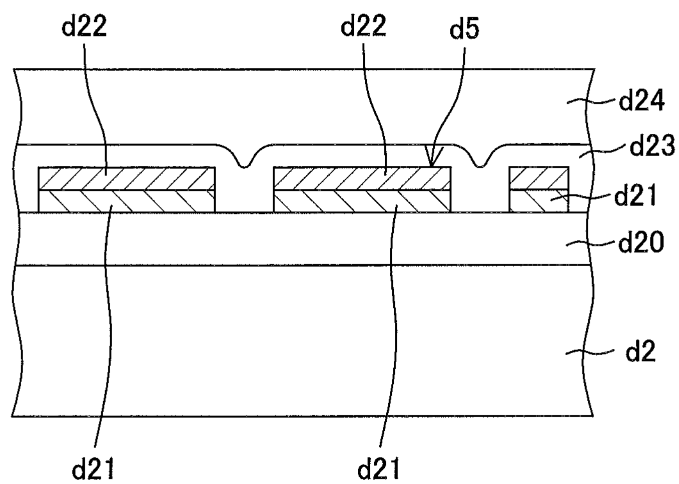

FIG. 89C is a widthwise vertical sectional view taken along a line C-C in FIG. 89A for explaining the structure of the resistor bodies of the device.

Figure 90:
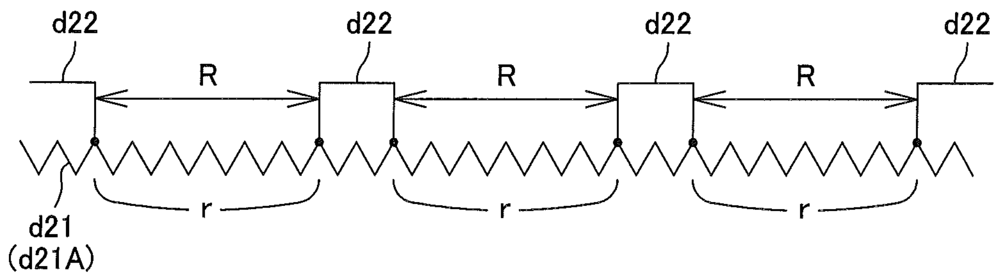
Figure 90:
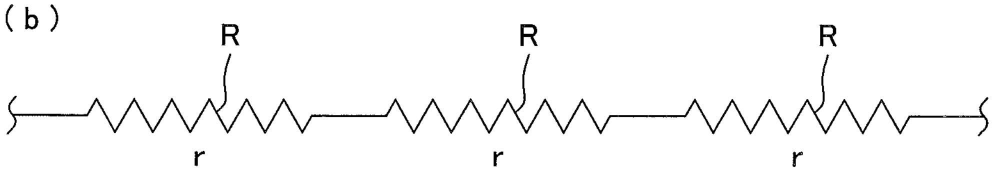
Figure 90:
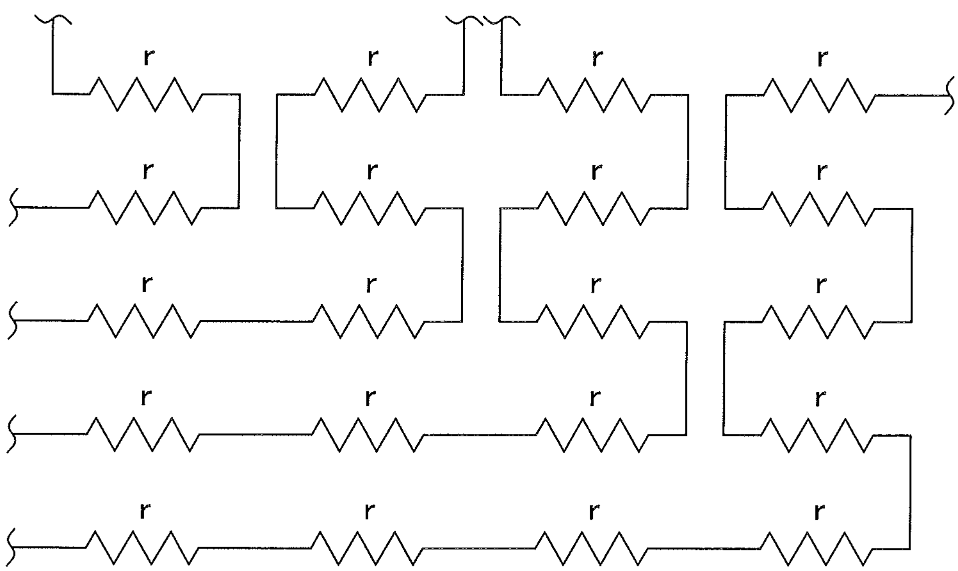

FIG. 90 are diagrams showing the electrical characteristic features of a resistive film line and an interconnection film by way of circuit symbols and electric circuit diagrams.

Figure 91:
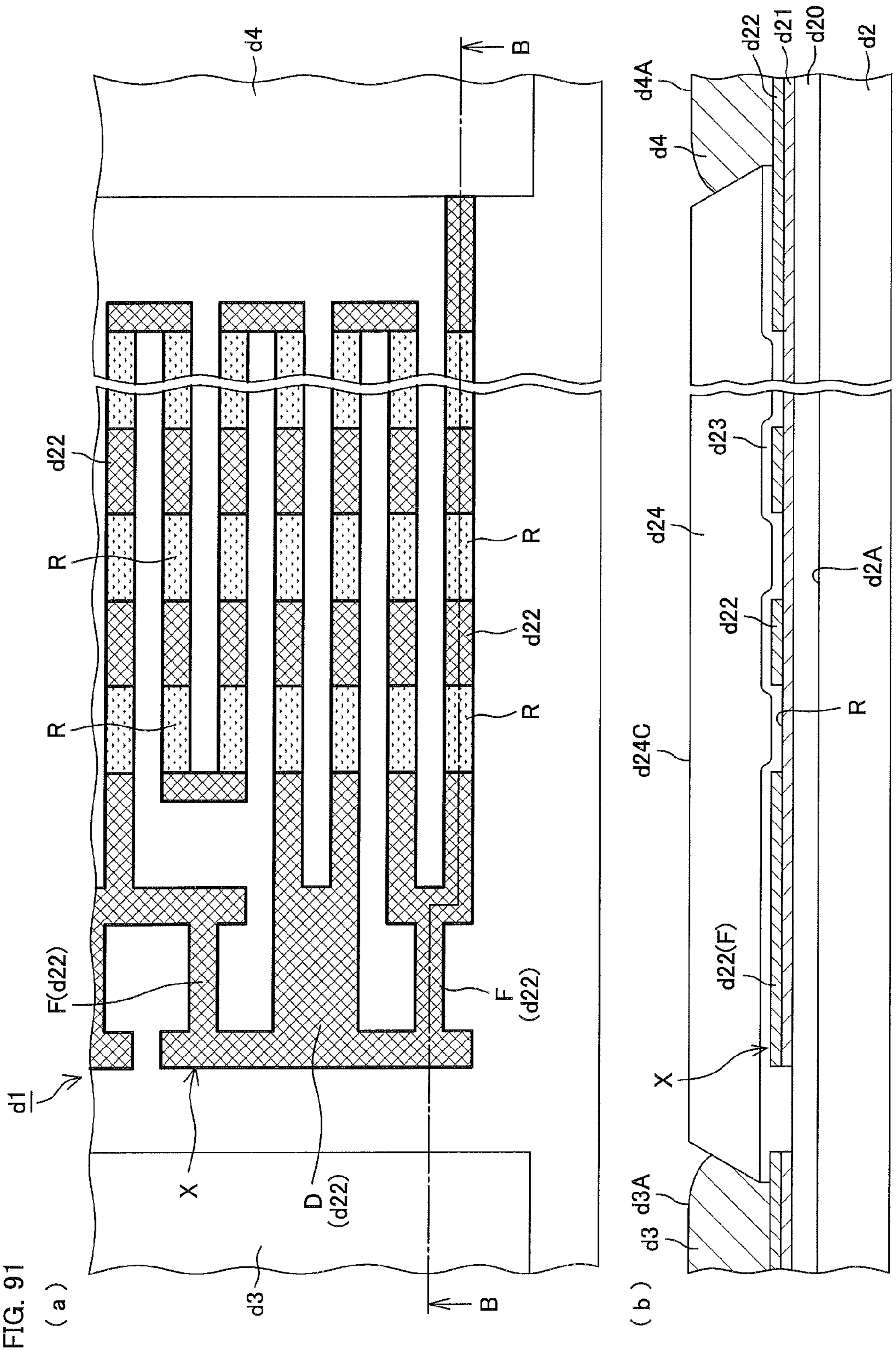

FIG. 91(*a*) is an enlarged partial plan view illustrating a region of the chip resistor including fuses shown in a part of the plan view of FIG. 88 on an enlarged scale, and FIG. 91(*b*) is a diagram showing a sectional structure taken along a line B-B in FIG. 91(*a*).

Figure 92:
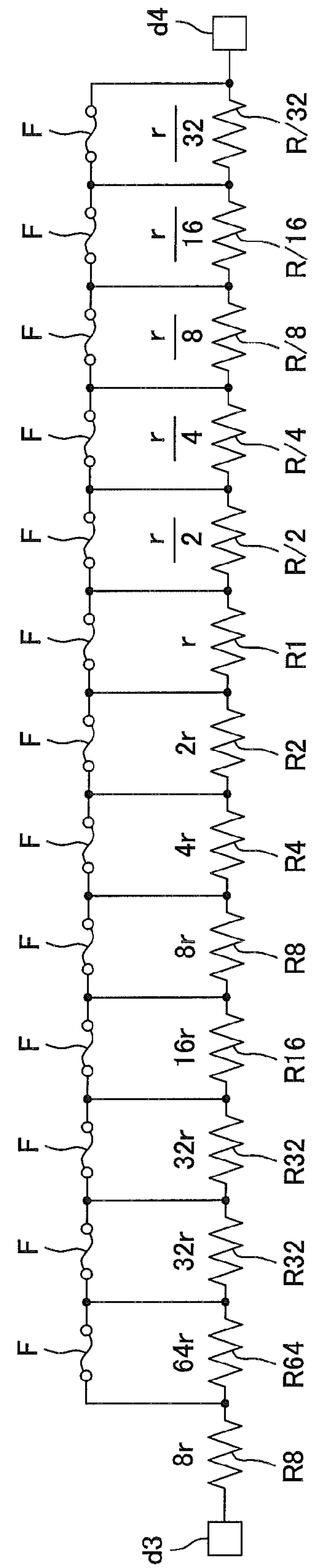

FIG. 92 is an electric circuit diagram of the device according to the example of the fourth reference embodiment.

Figure 93:
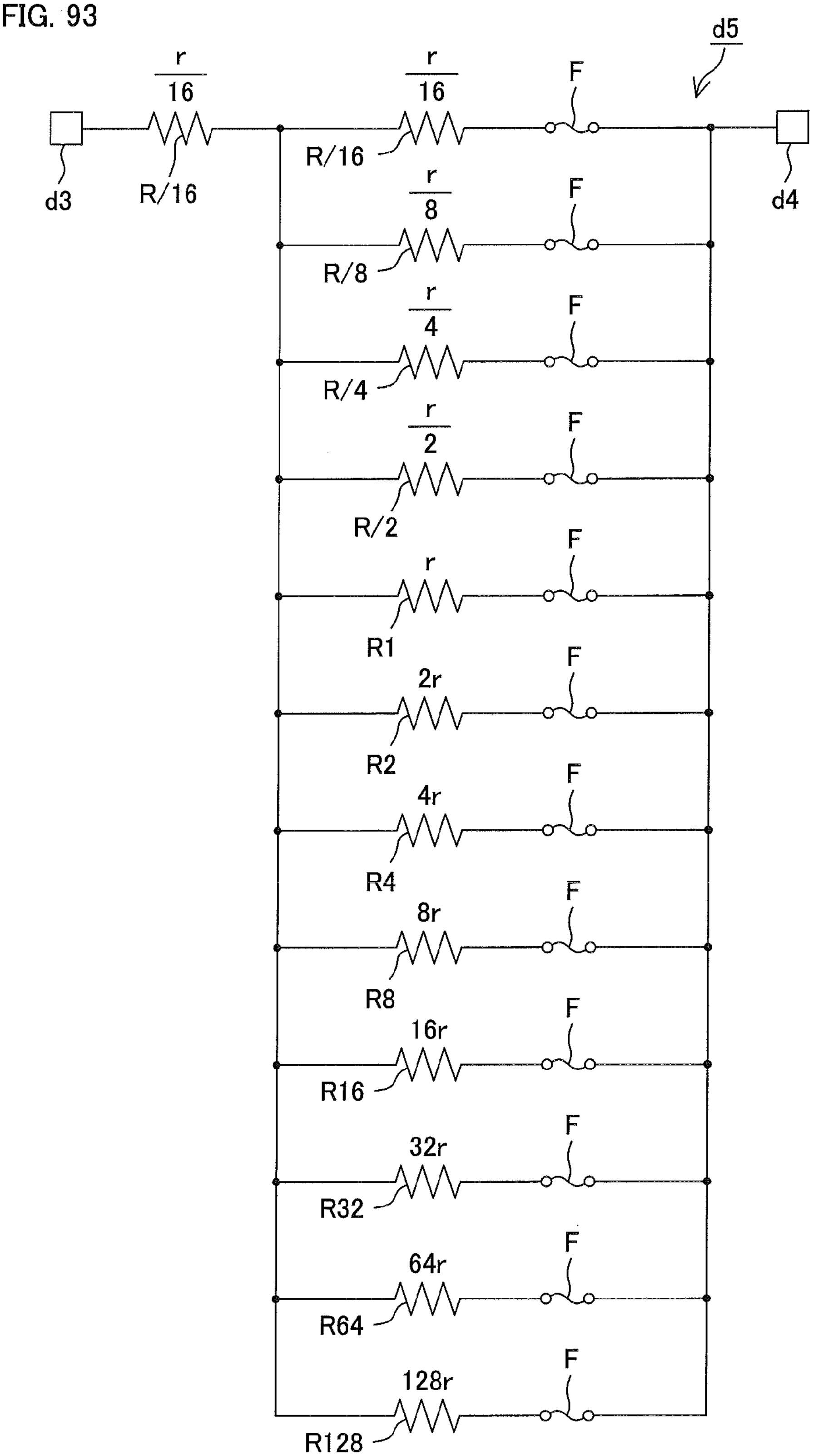

FIG. 93 is an electric circuit diagram of a device according to another example of the fourth reference embodiment.

Figure 94:
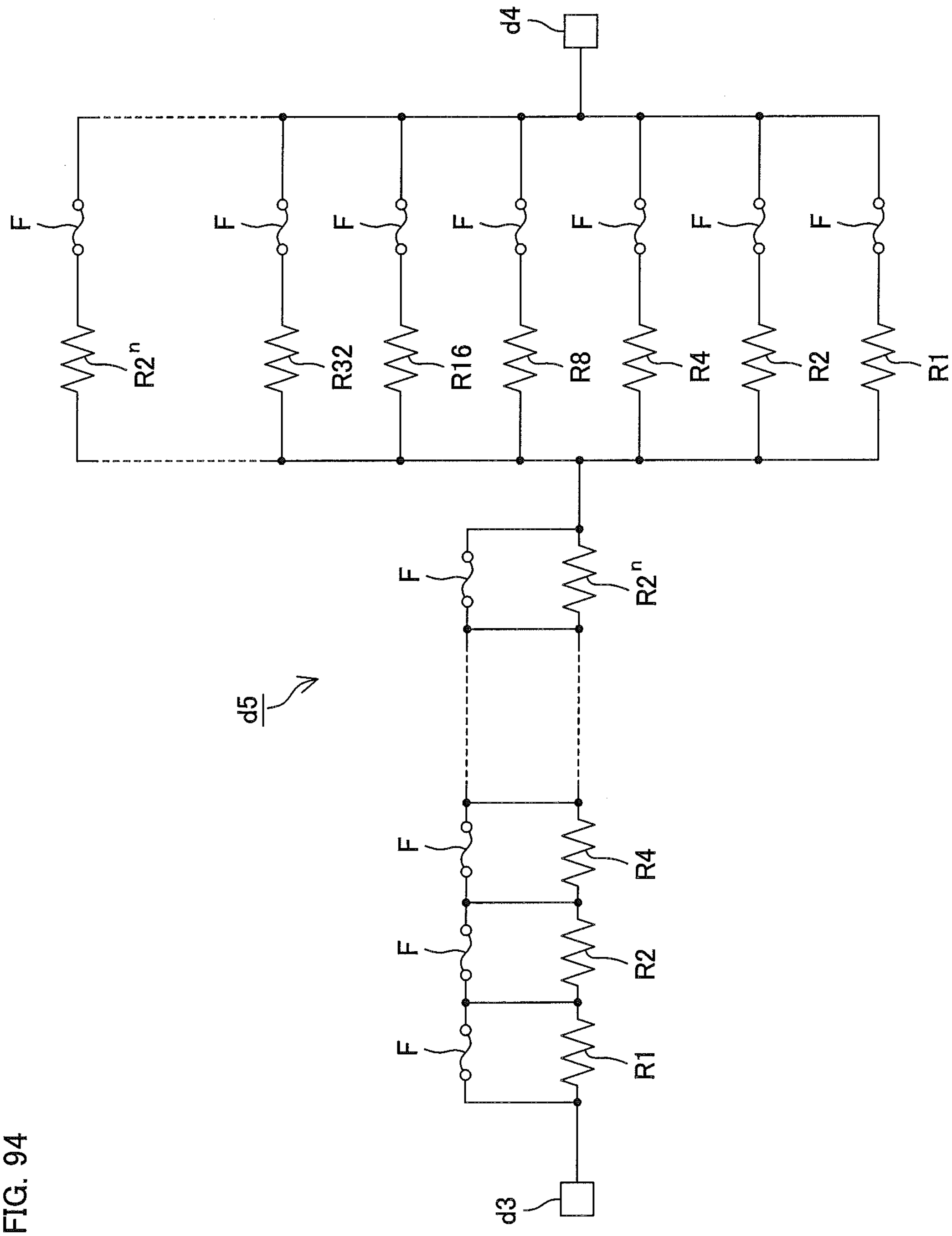

FIG. 94 is an electric circuit diagram of a device according to further another example of the fourth reference embodiment.

Figure 95:
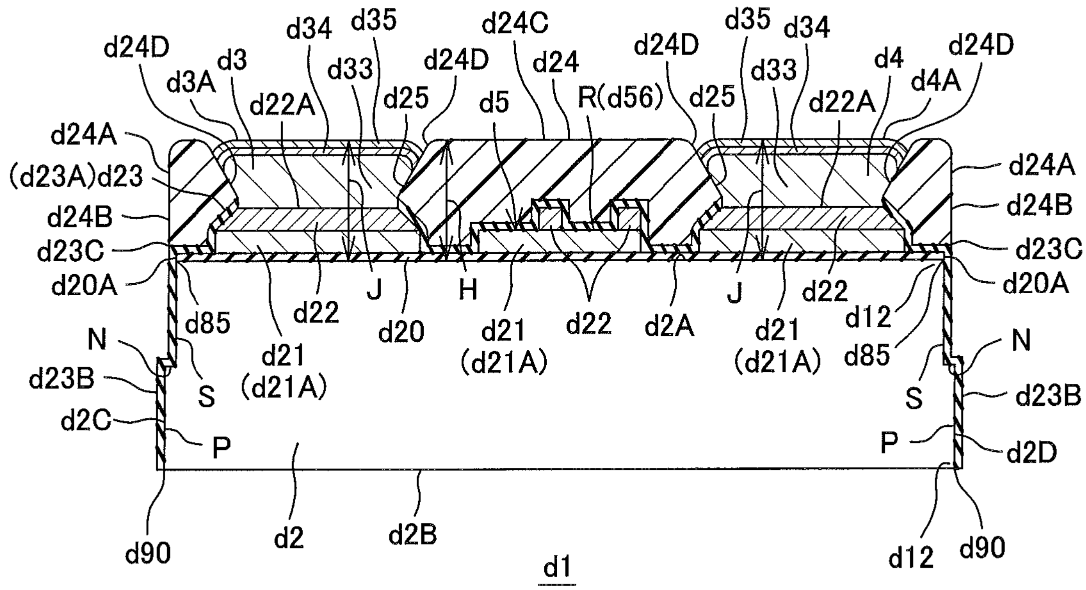

FIG. 95 is a schematic sectional view of the chip resistor.

Figure 96A:
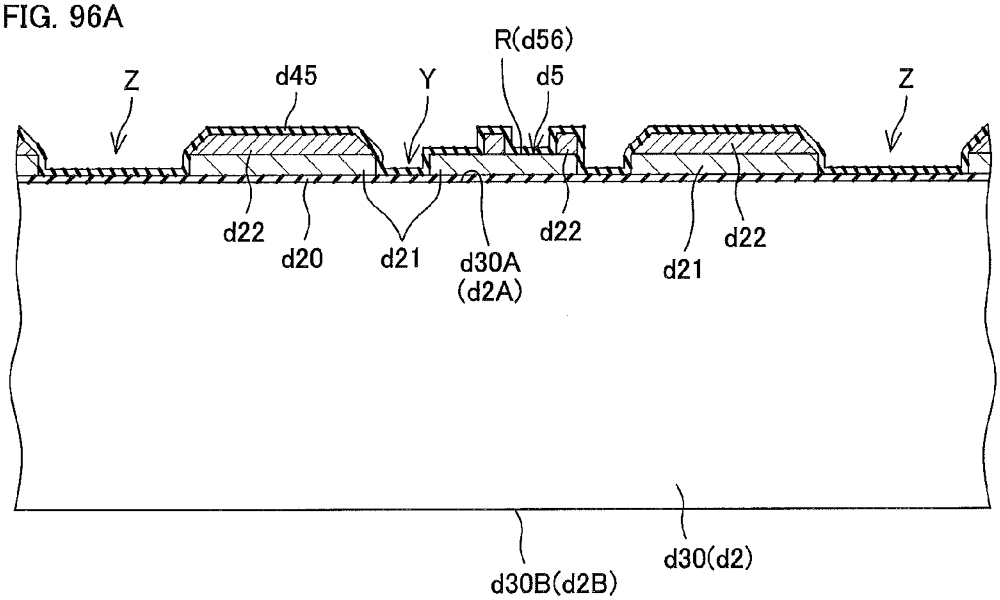

FIG. 96A is a schematic sectional view showing a production method for the chip resistor shown in FIG. 95.

Figure 96B:
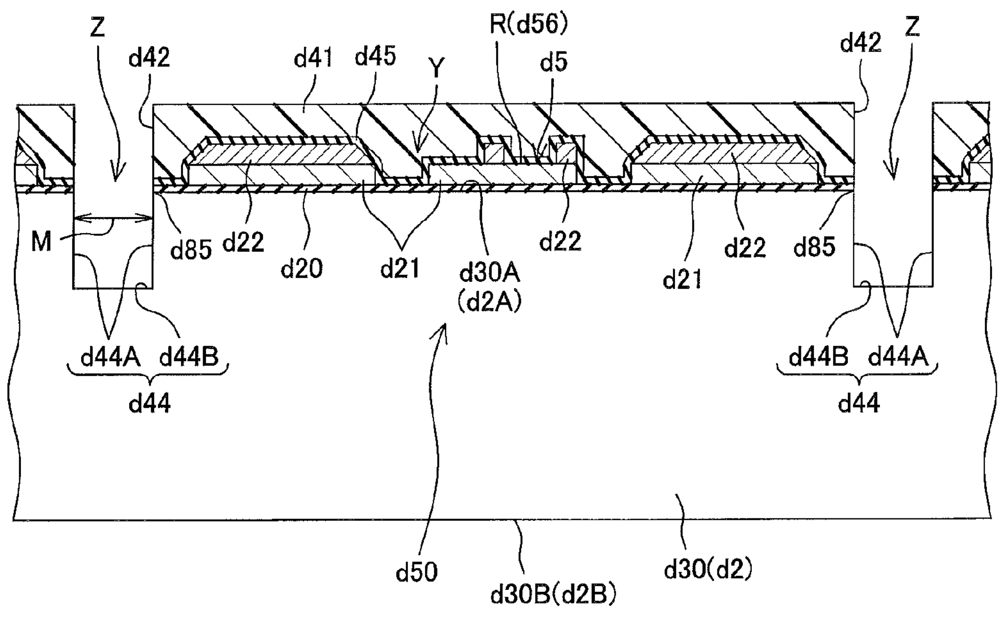

FIG. 96B is a schematic sectional view showing a process step subsequent to that shown in FIG. 96A.

Figure 96C:
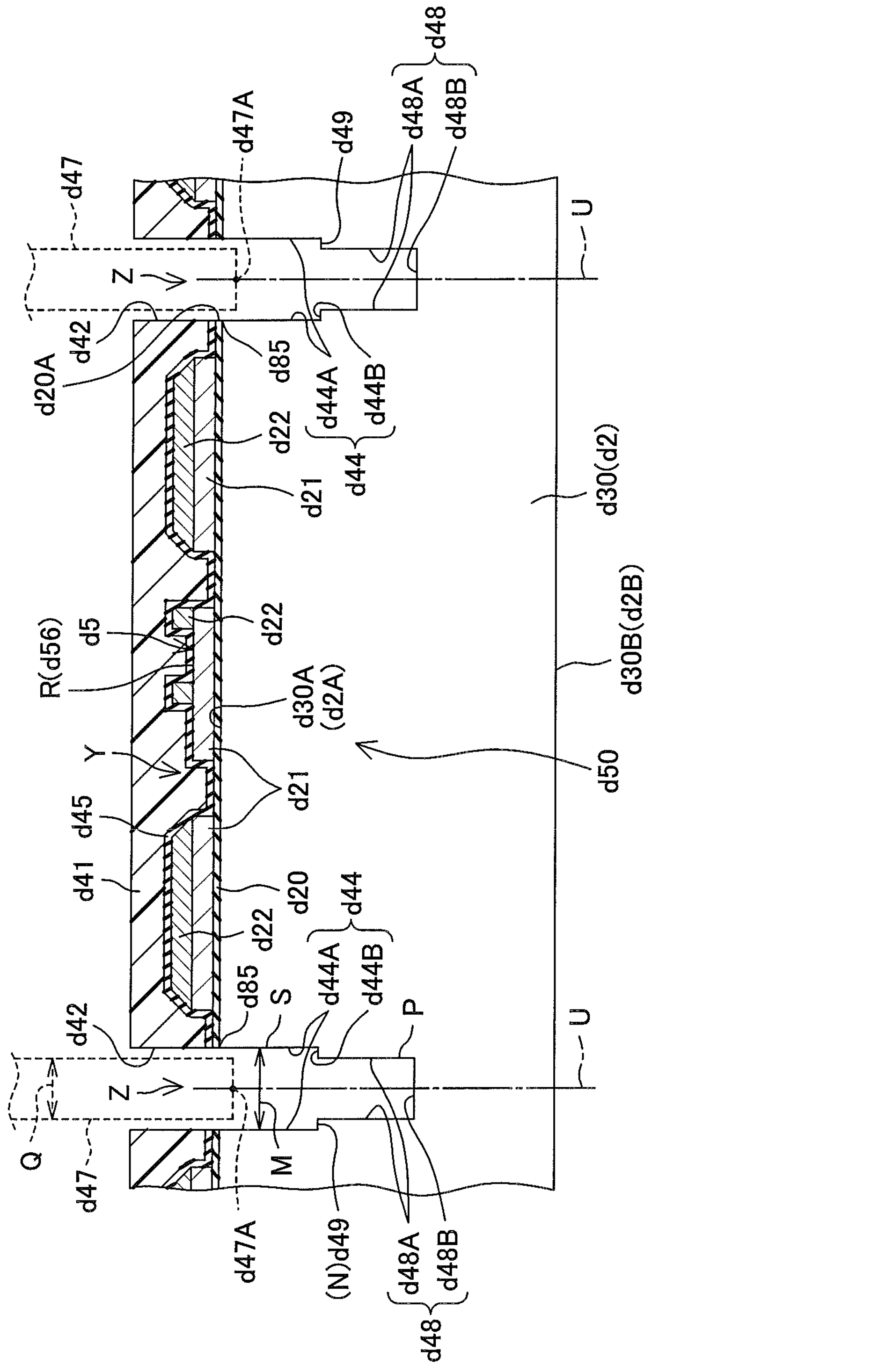

FIG. 96C is a schematic sectional view showing a process step subsequent to that shown in FIG. 96B.

Figure 96D:
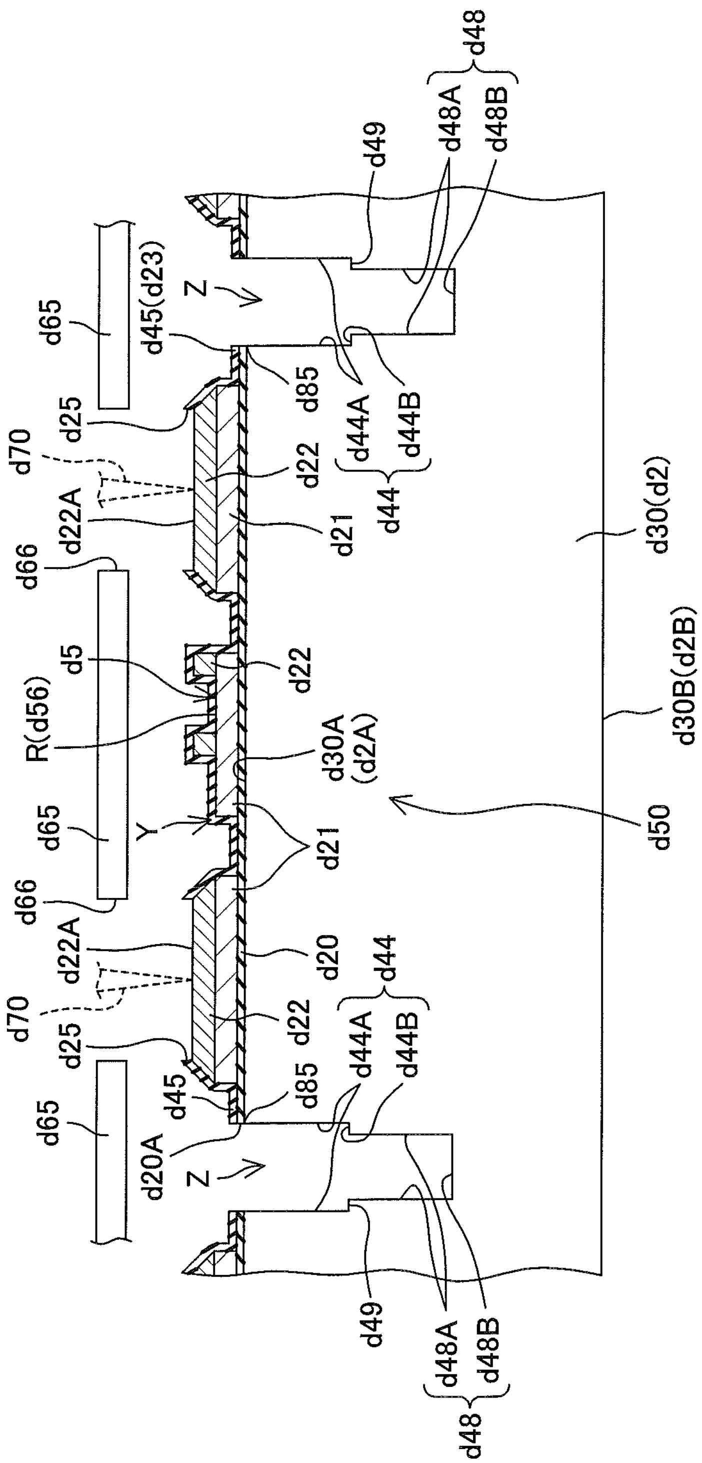

FIG. 96D is a schematic sectional view showing a process step subsequent to that shown in FIG. 96C.

Figure 96E:
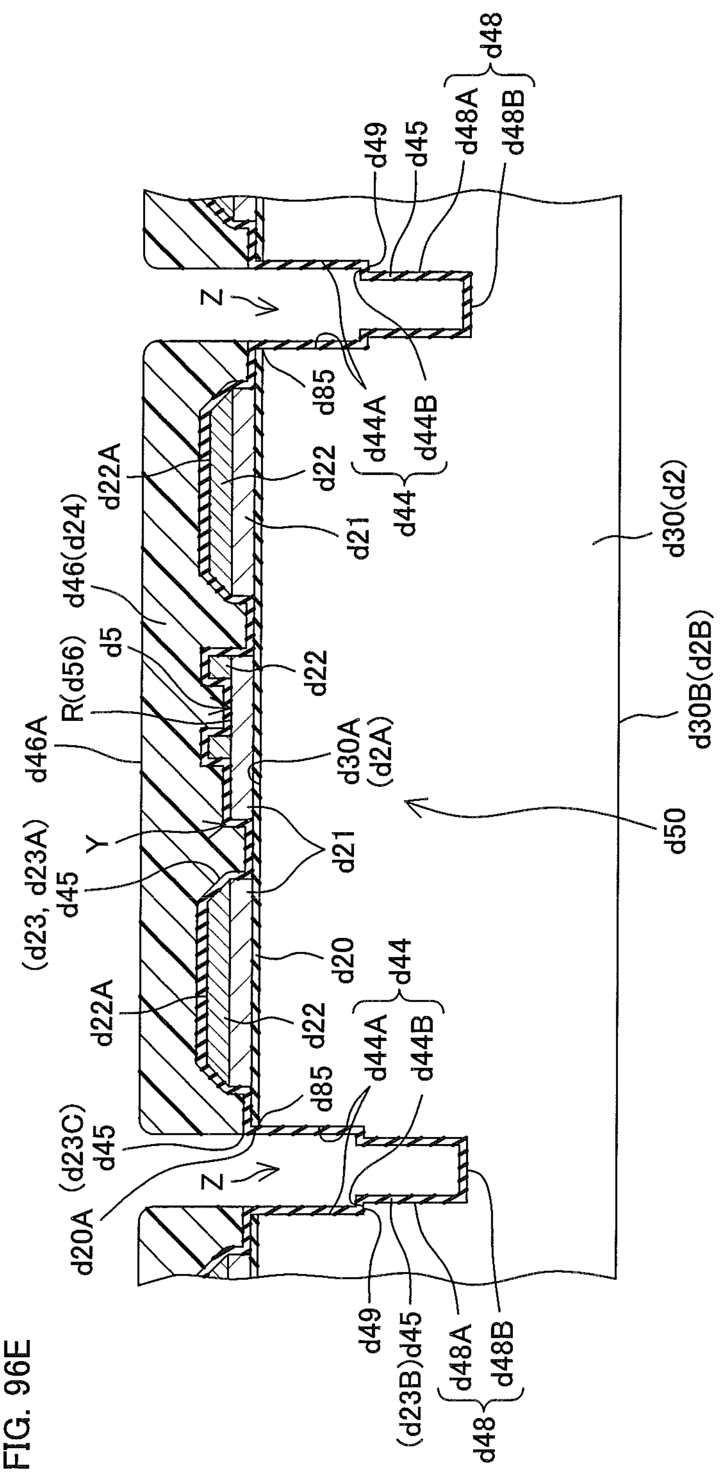

FIG. 96E is a schematic sectional view showing a process step subsequent to that shown in FIG. 96D.

Figure 96F:
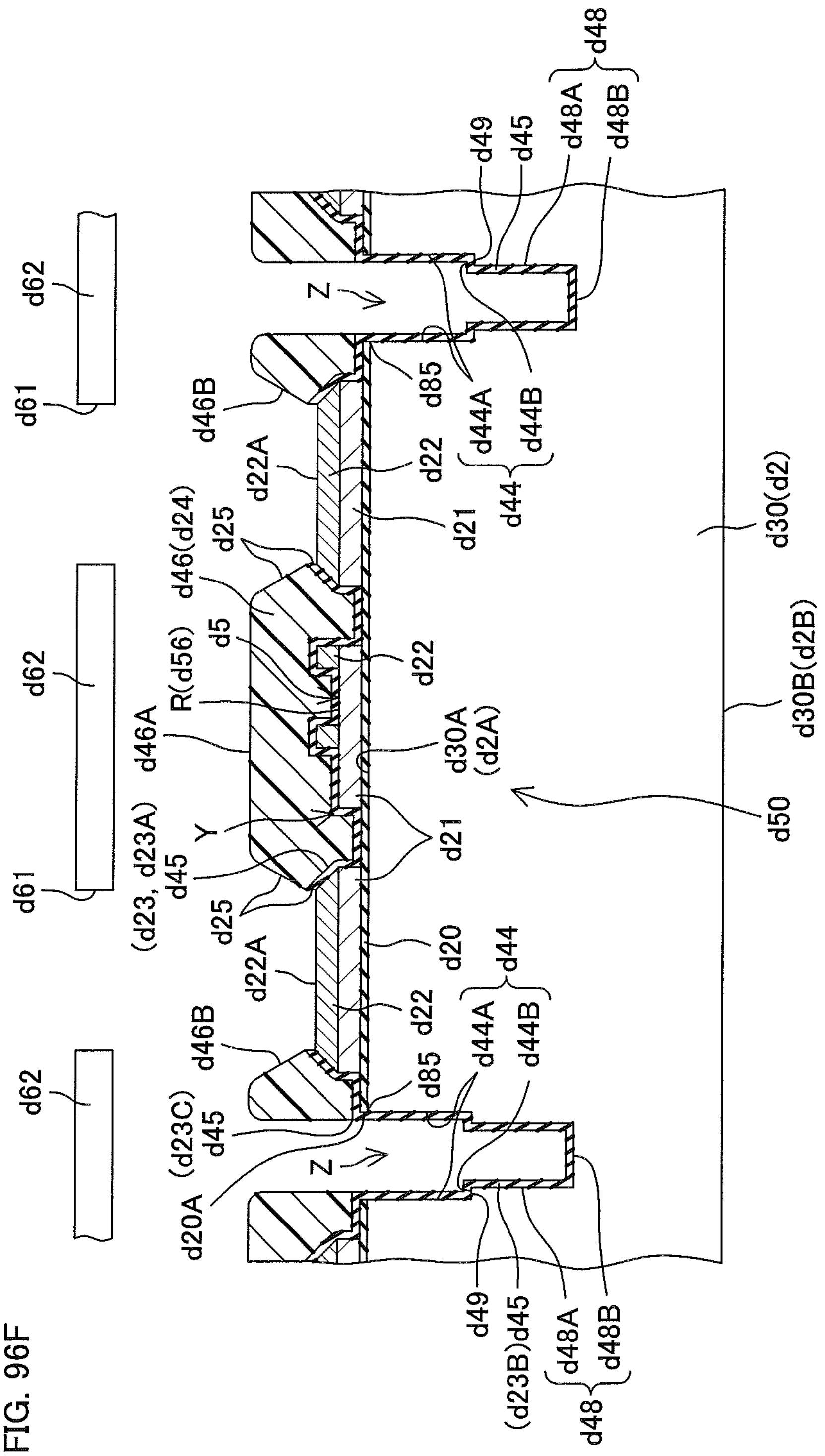

FIG. 96F is a schematic sectional view showing a process step subsequent to that shown in FIG. 96E.

Figure 96G:
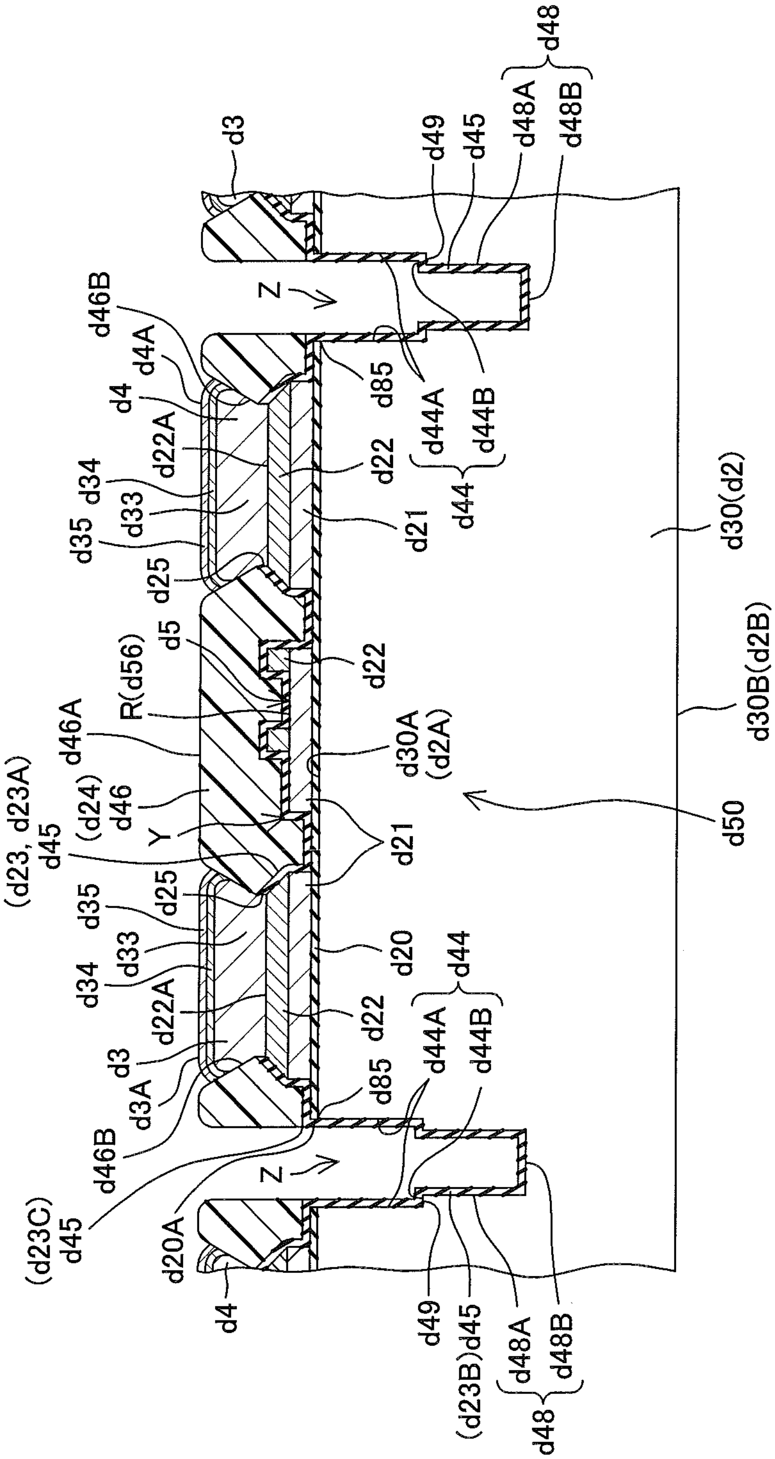

FIG. 96G is a schematic sectional view showing a process step subsequent to that shown in FIG. 96F.

Figure 96H:
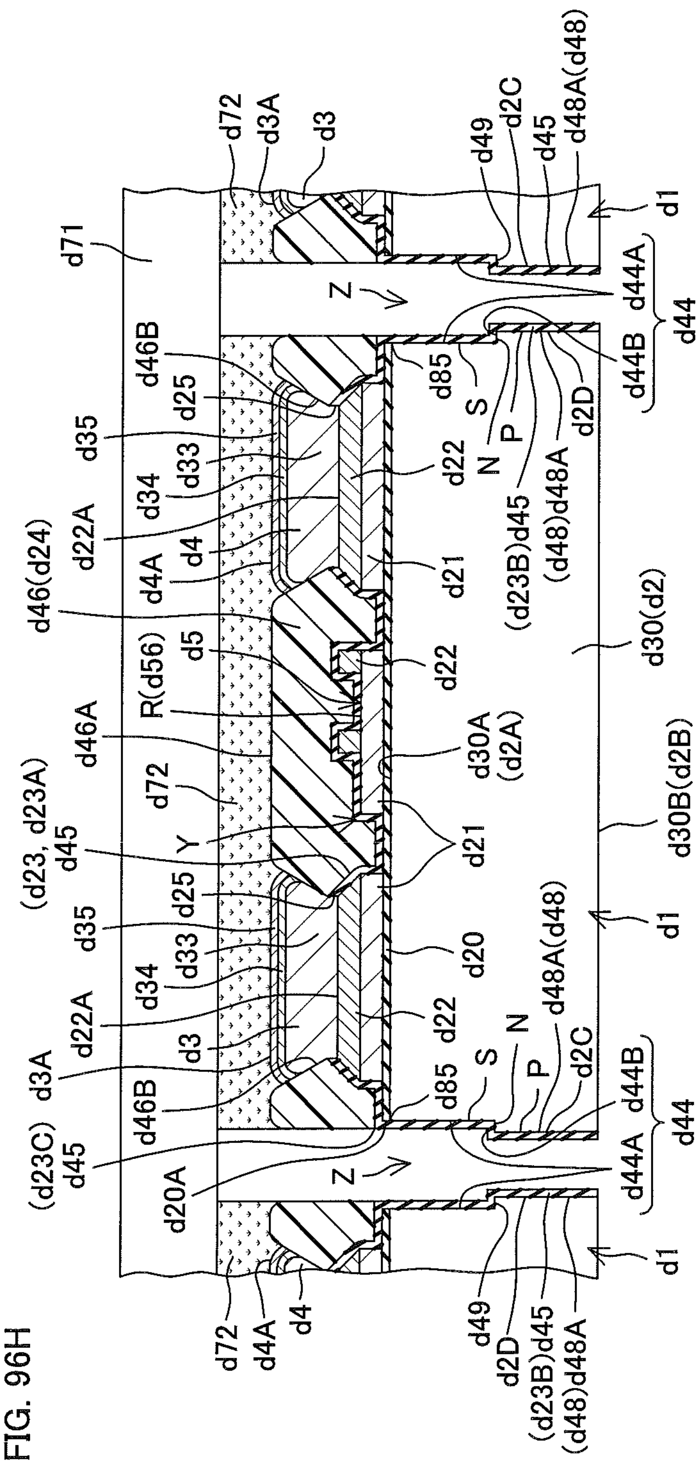

FIG. 96H is a schematic sectional view showing a process step subsequent to that shown in FIG. 96G.

Figure 97:
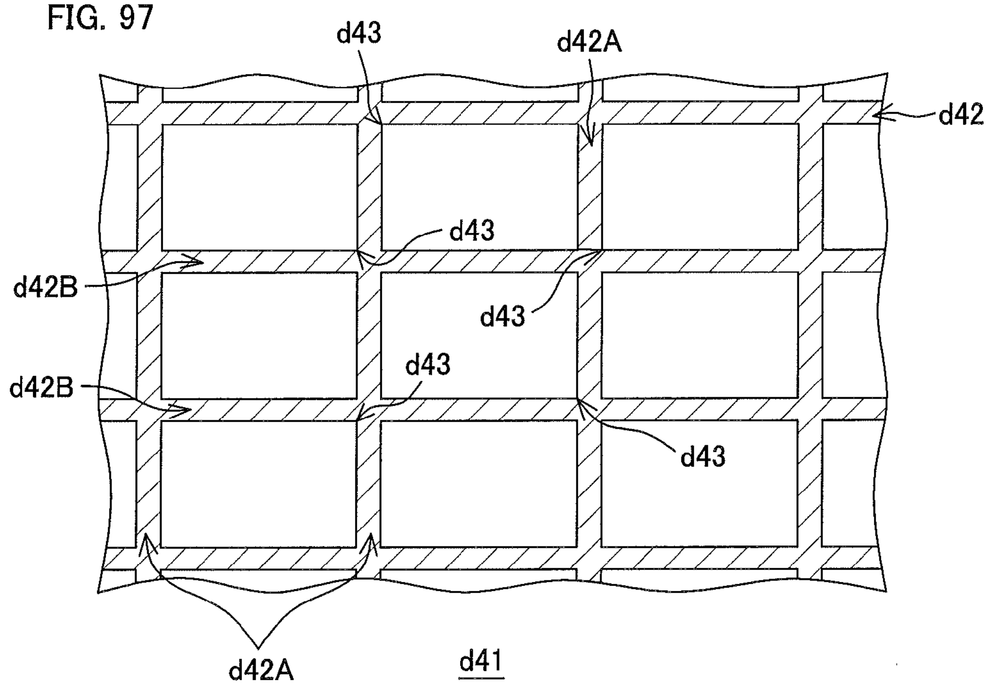

FIG. 97 is a schematic plan view showing a part of a resist pattern to be used for forming a first trench in the step of FIG. 96B.

Figure 98:
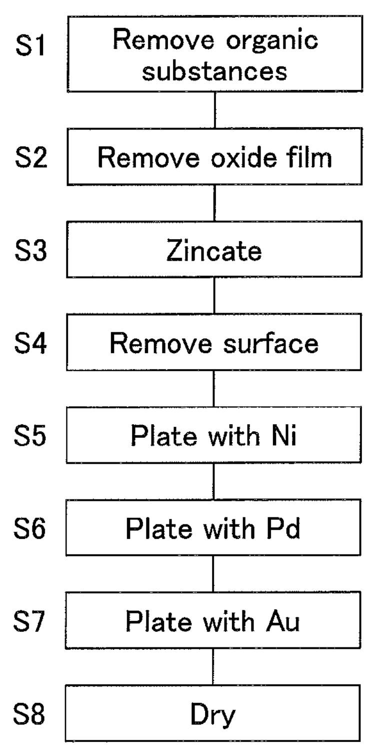

FIG. 98 is a diagram for explaining a process for producing the first connection electrode and the second connection electrode.

Figure 99:
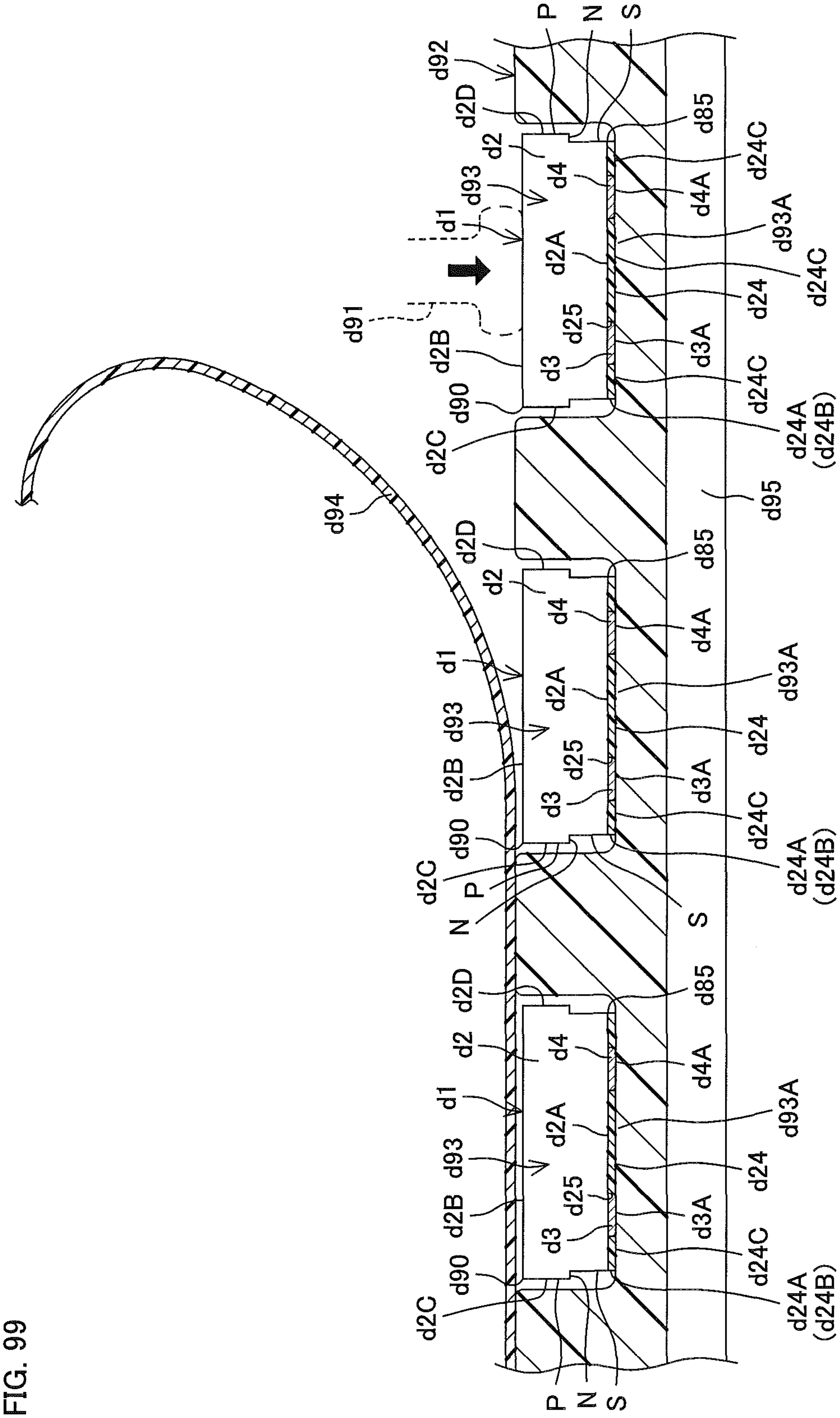

FIG. 99 is a schematic diagram for explaining how to accommodate completed chip resistors in an embossed carrier tape.

Figure 100:
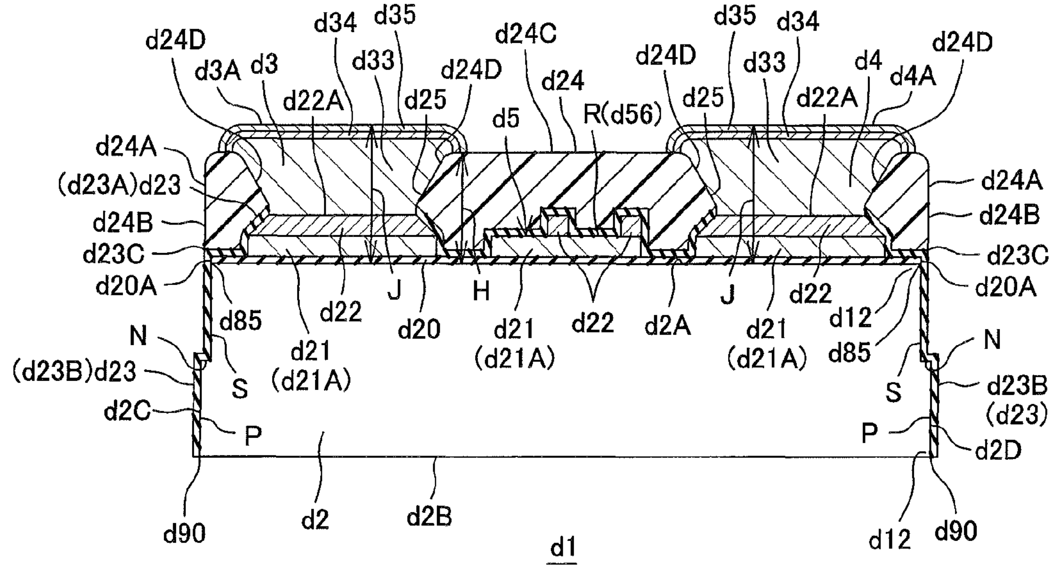

FIG. 100 is a schematic sectional view of a chip resistor according to a first modification of the fourth reference embodiment.

Figure 101:
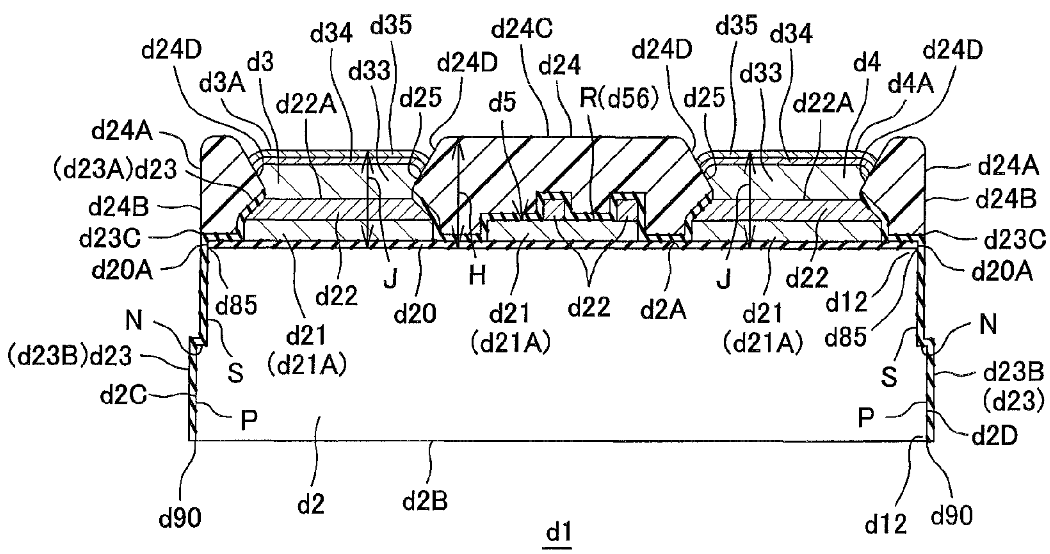

FIG. 101 is a schematic sectional view of a chip resistor according to a second modification of the fourth reference embodiment.

Figure 102:
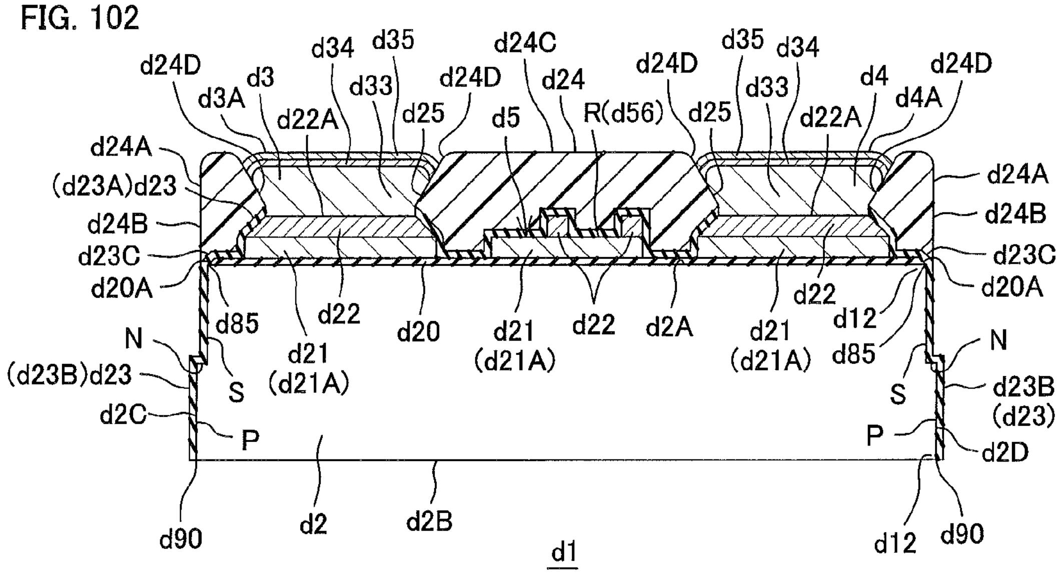

FIG. 102 is a schematic sectional view of a chip resistor according to a third modification of the fourth reference embodiment.

Figure 103:
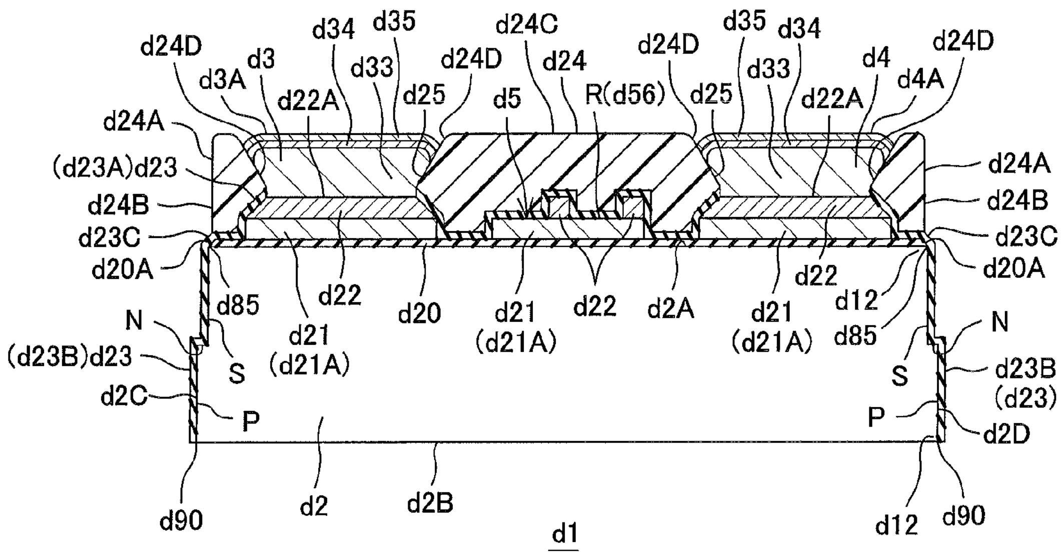

FIG. 103 is a schematic sectional view of a chip resistor according to a fourth modification of the fourth reference embodiment.

Figure 104:
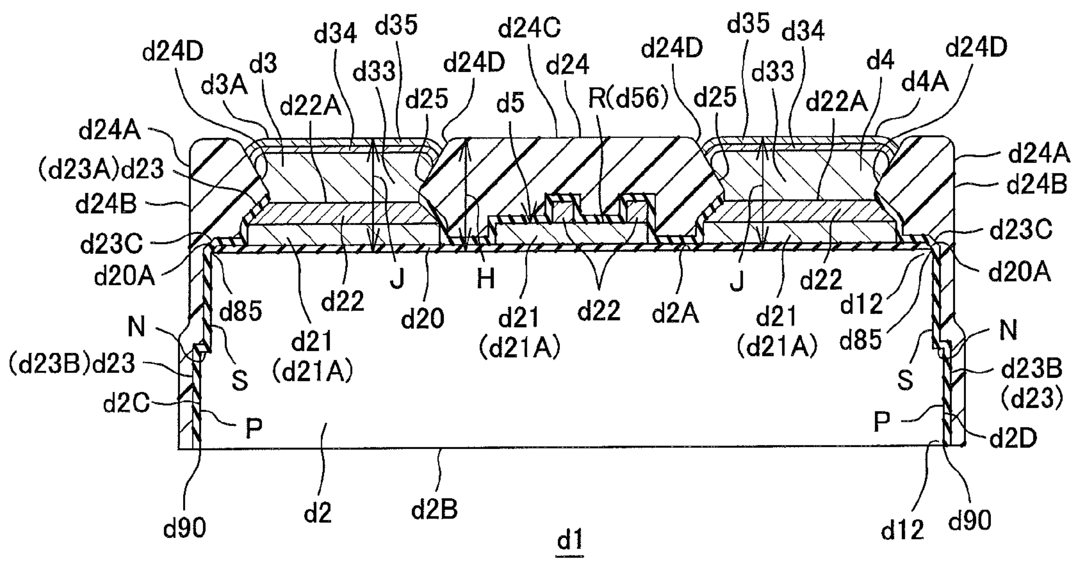

FIG. 104 is a schematic sectional view of a chip resistor according to a fifth modification of the fourth reference embodiment.

Figure 105:
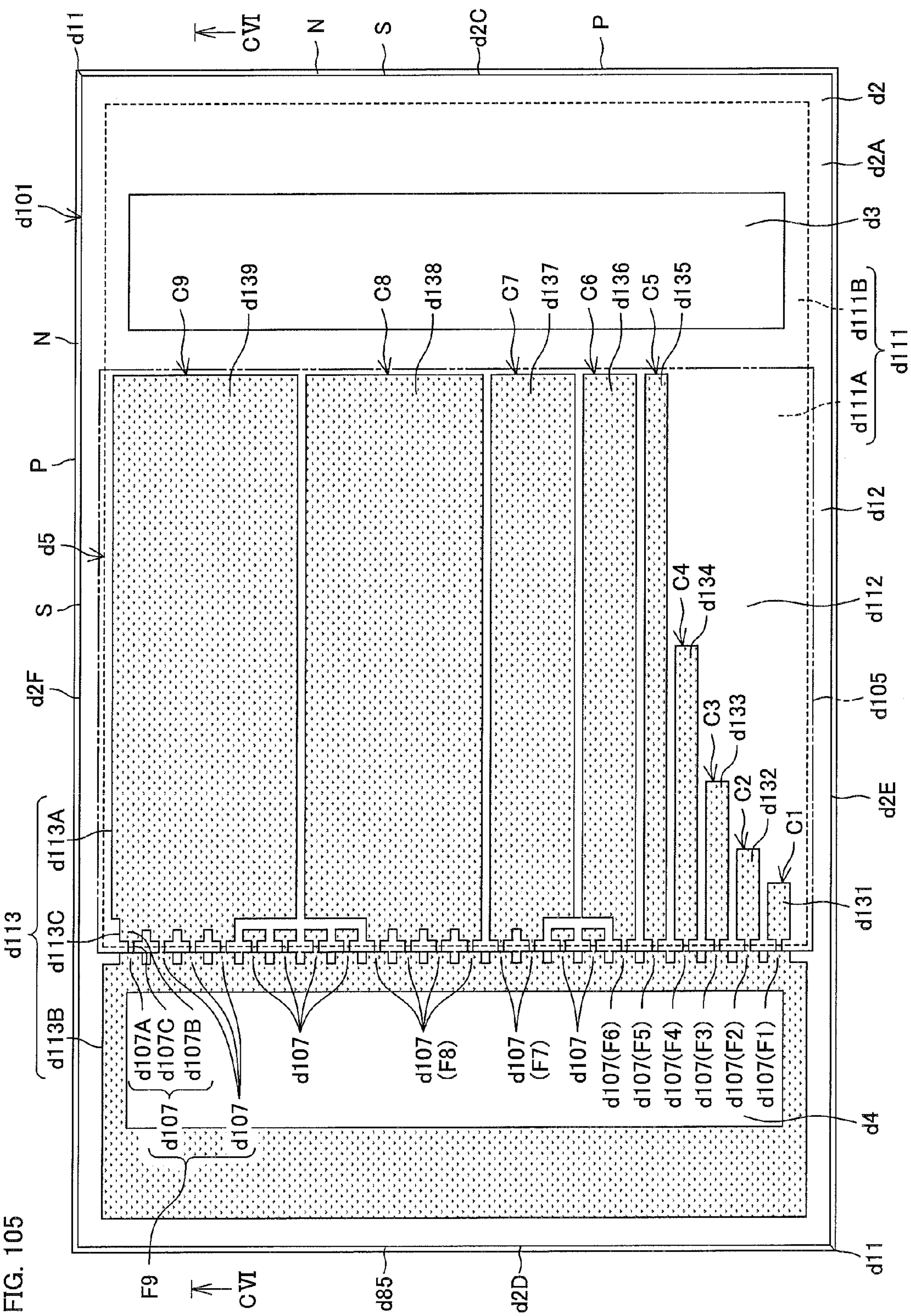

FIG. 105 is a plan view of a chip capacitor according to another example of the fourth reference embodiment.

Figure 106:
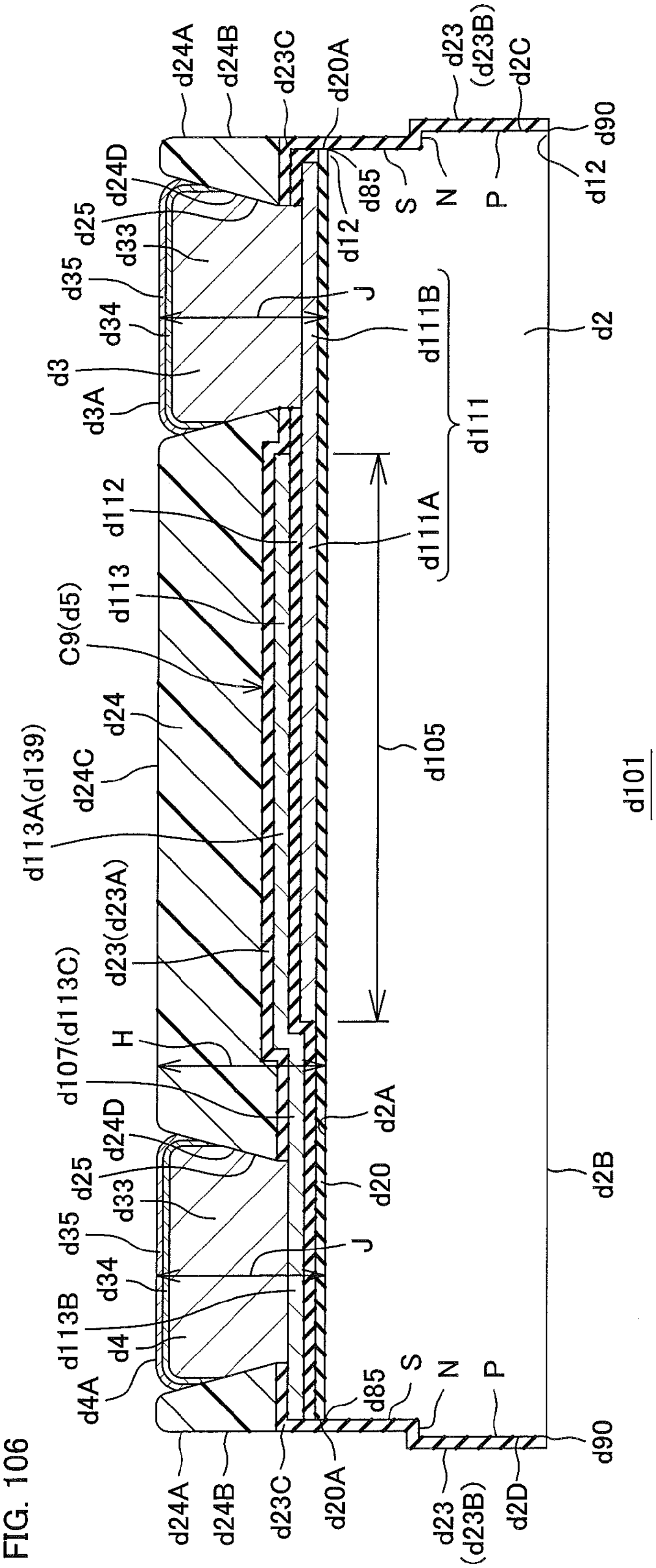

FIG. 106 is a sectional view taken along a sectional line CVI-CVI in FIG. 105.

Figure 107:
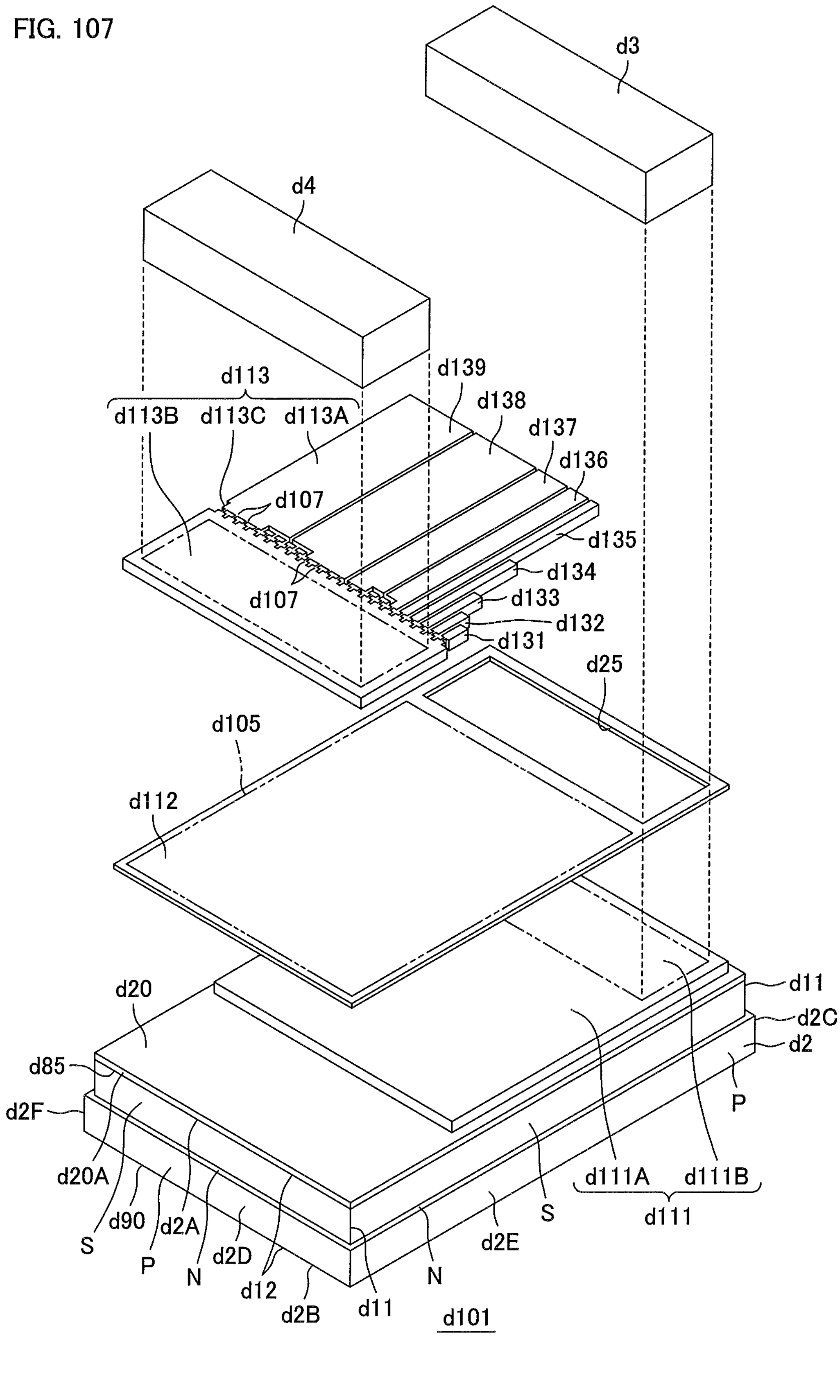

FIG. 107 is an exploded perspective view illustrating the chip capacitor with parts thereof separated.

Figure 108:
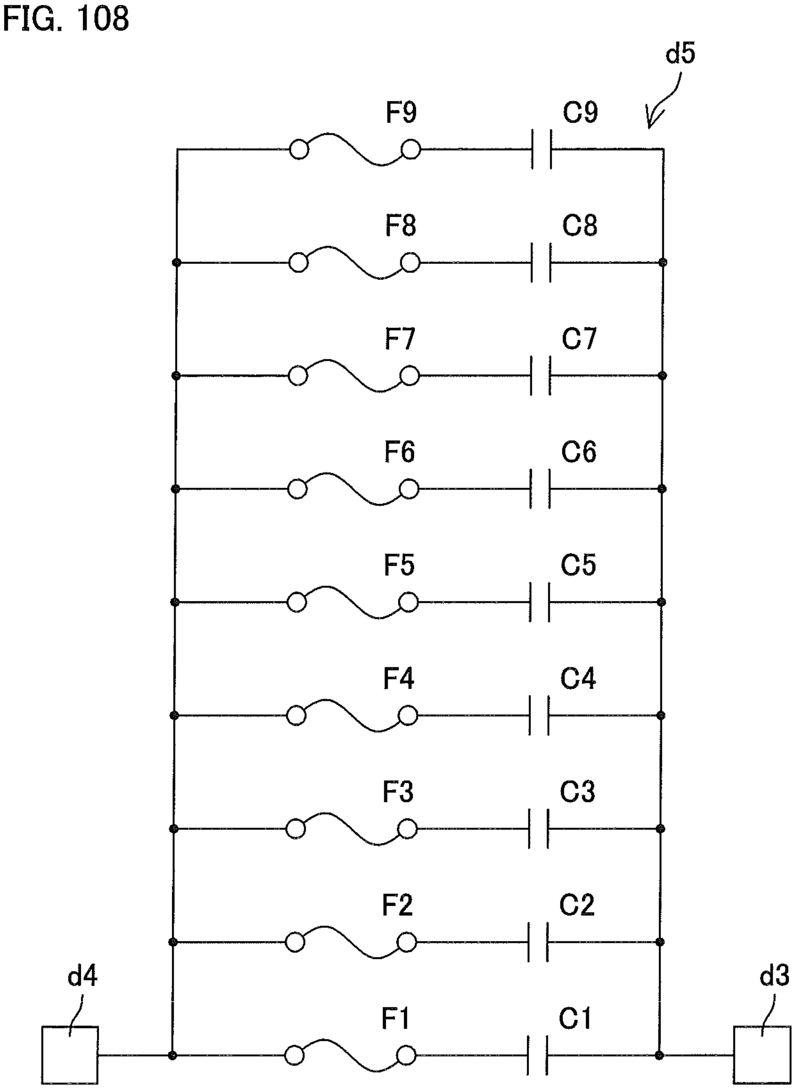

FIG. 108 is a circuit diagram showing the internal electrical configuration of the chip capacitor.

Figure 109:
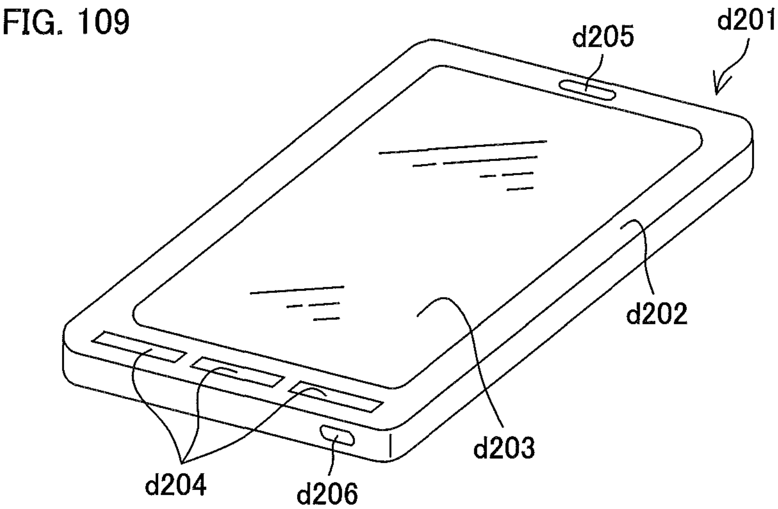

FIG. 109 is a perspective view showing the appearance of a smartphone as an exemplary electronic device which employs a chip component according to the fourth reference embodiment.

Figure 110:
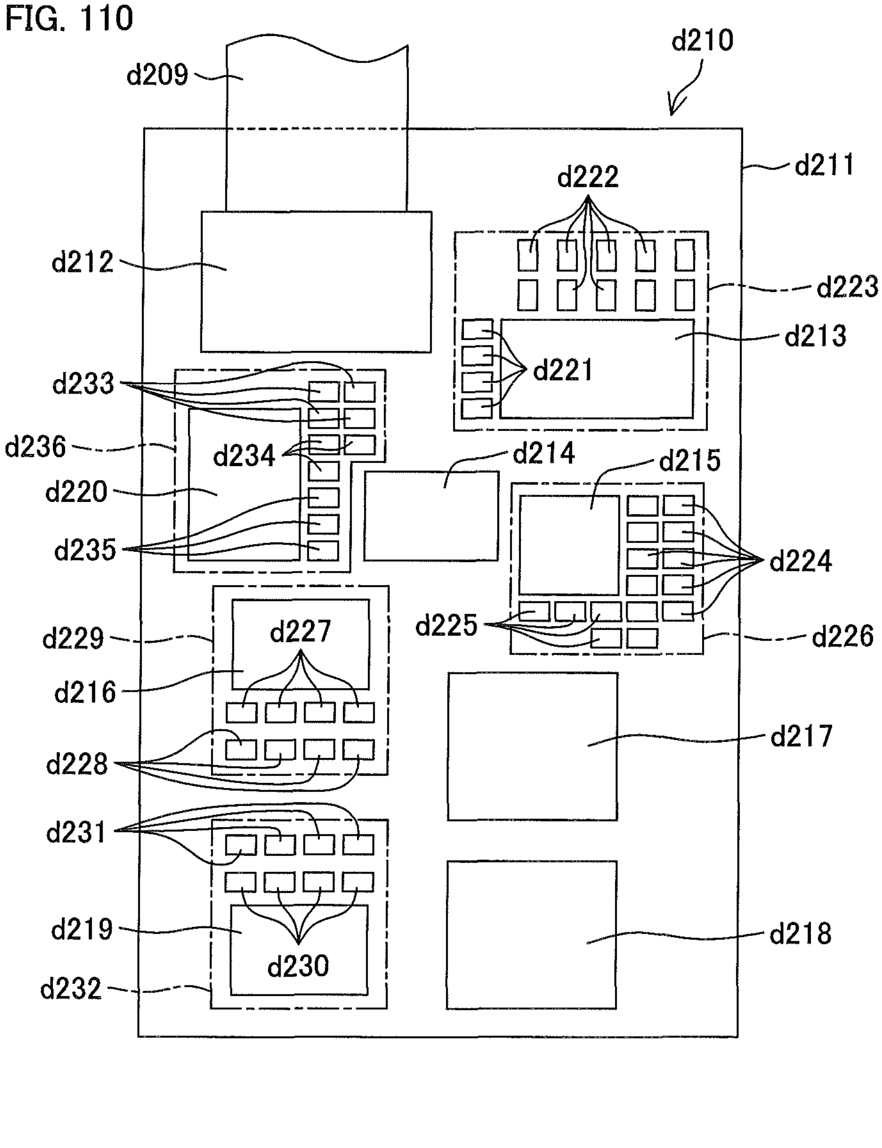

FIG. 110 is a schematic plan view showing the configuration of an electronic circuit assembly accommodated in a housing of the smartphone.

Figure 111:
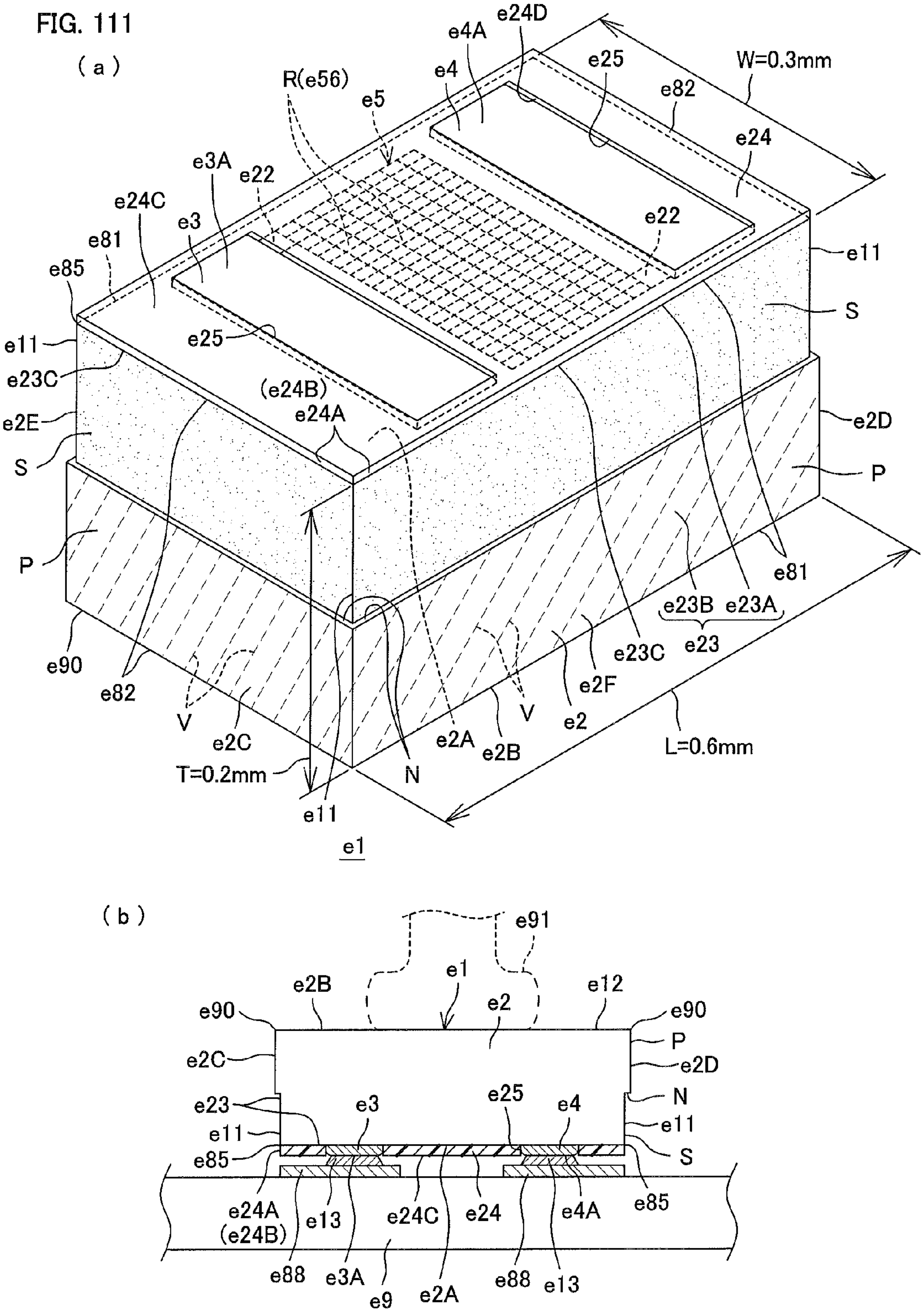

FIG. 111(*a*) is a schematic perspective view for explaining the construction of a chip resistor according to an example of a fifth reference embodiment, and FIG. 111(*b*) is a schematic sectional view illustrating the chip resistor, which is mounted on a mount board.

Figure 112:
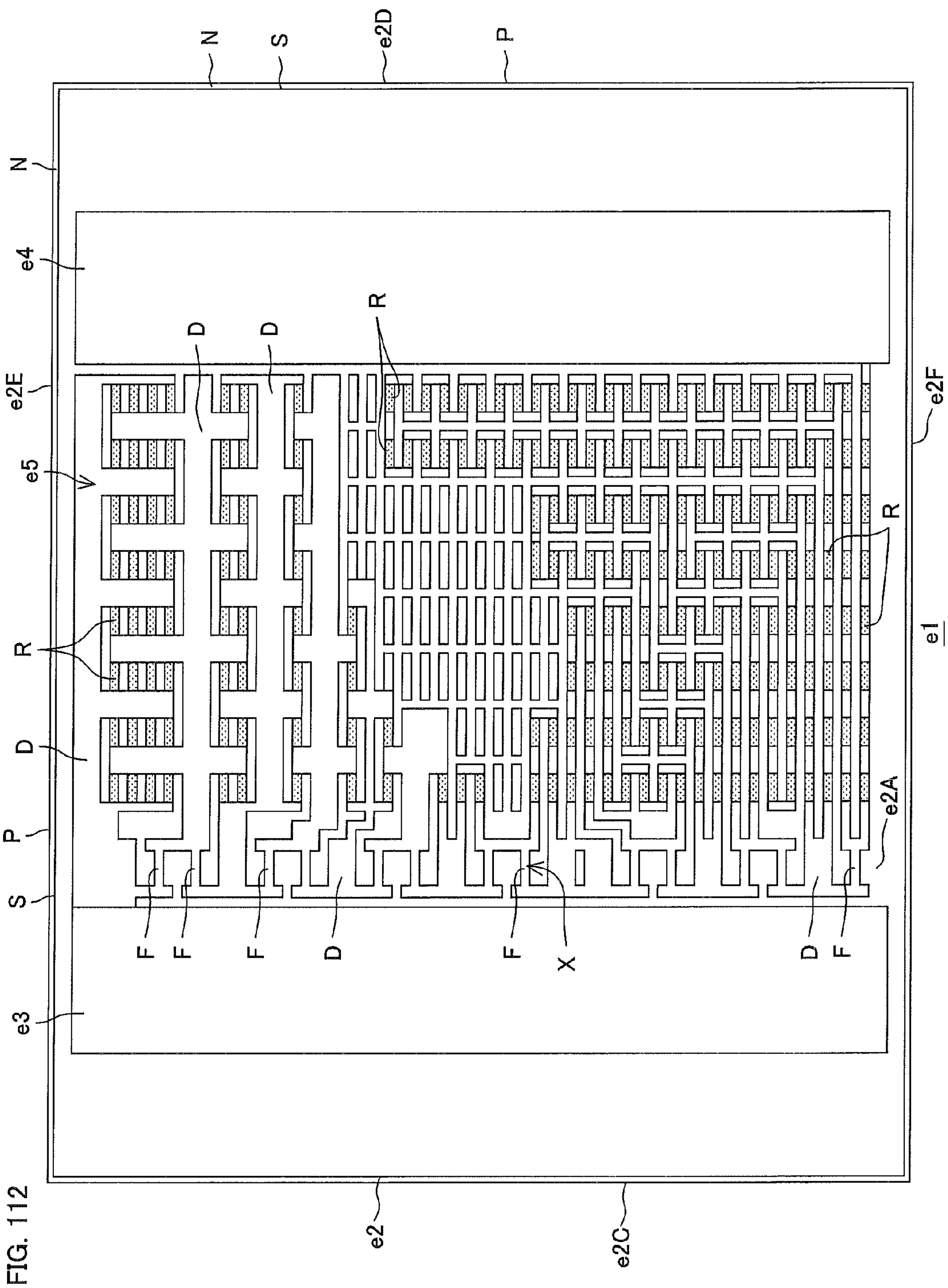

FIG. 112 is a plan view of the chip resistor showing the layout of a first connection electrode, a second connection electrode and a device, and the structure of the device as viewed in plan.

Figure 113A:
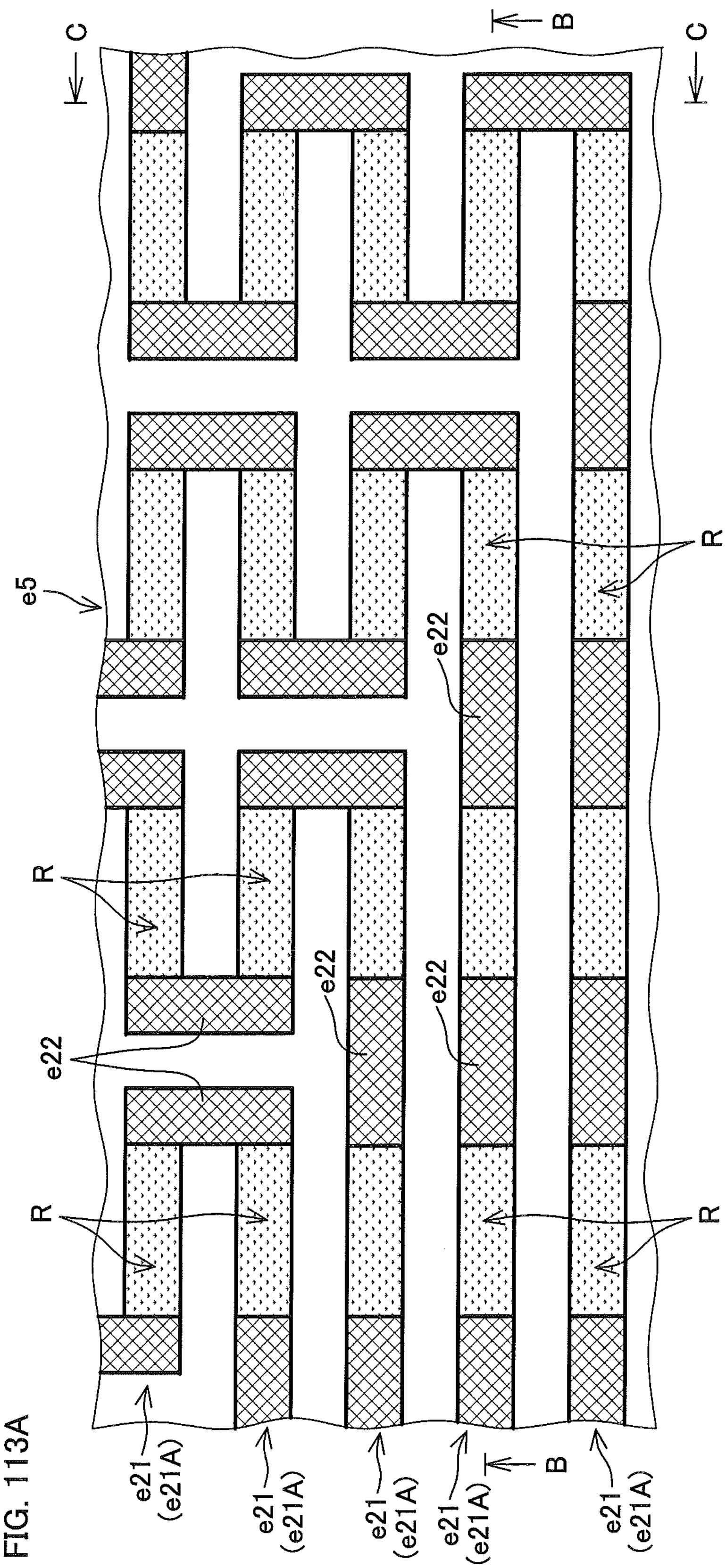

FIG. 113A is a plan view illustrating a part of the device shown in FIG. 112 on an enlarged scale.

Figure 113B:
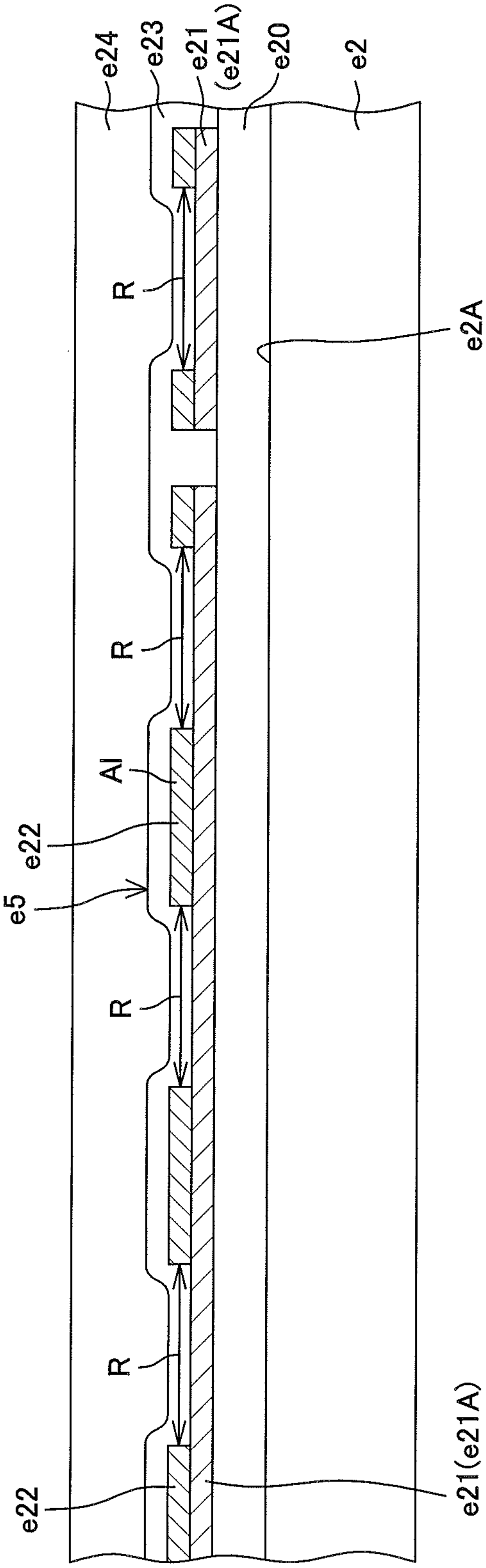

FIG. 113B is a longitudinal vertical sectional view taken along a line B-B in FIG. 113A for explaining the structure of resistor bodies of the device.

Figure 113C:
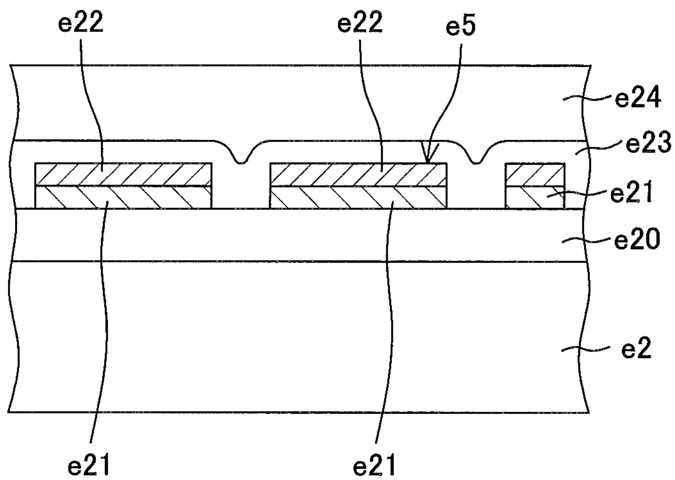

FIG. 113C is a widthwise vertical sectional view taken along a line C-C in FIG. 113A for explaining the structure of the resistor bodies of the device.

Figure 114:
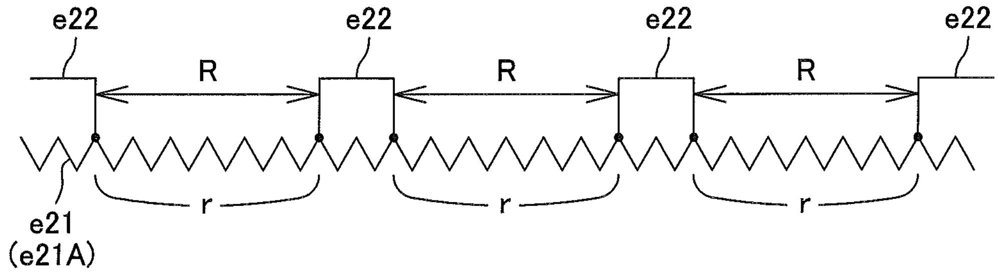
Figure 114:
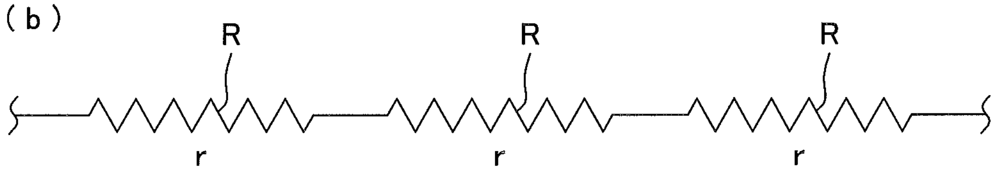
Figure 114:
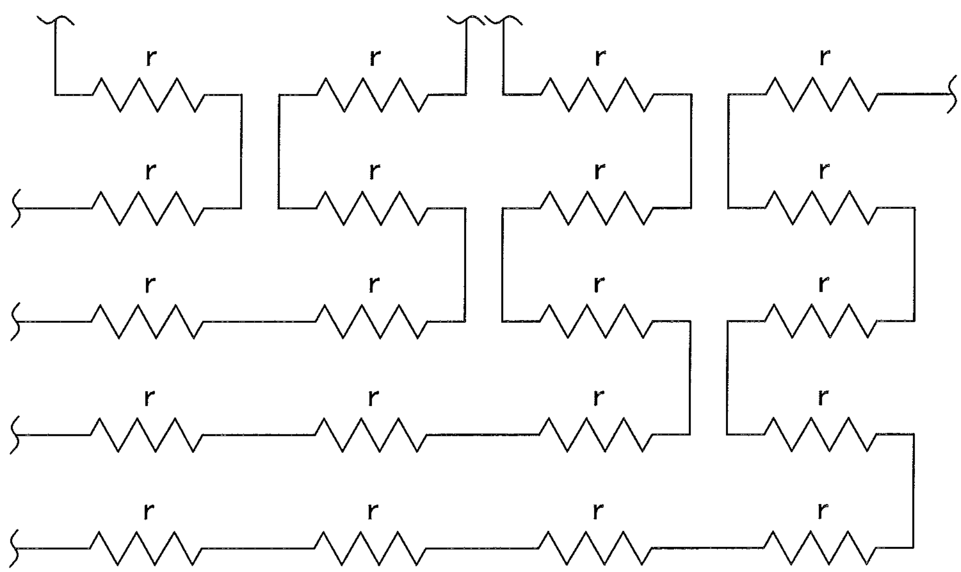

FIG. 114 are diagrams showing the electrical characteristic features of a resistive film line and an interconnection film by way of circuit symbols and electric circuit diagrams.

Figure 115:
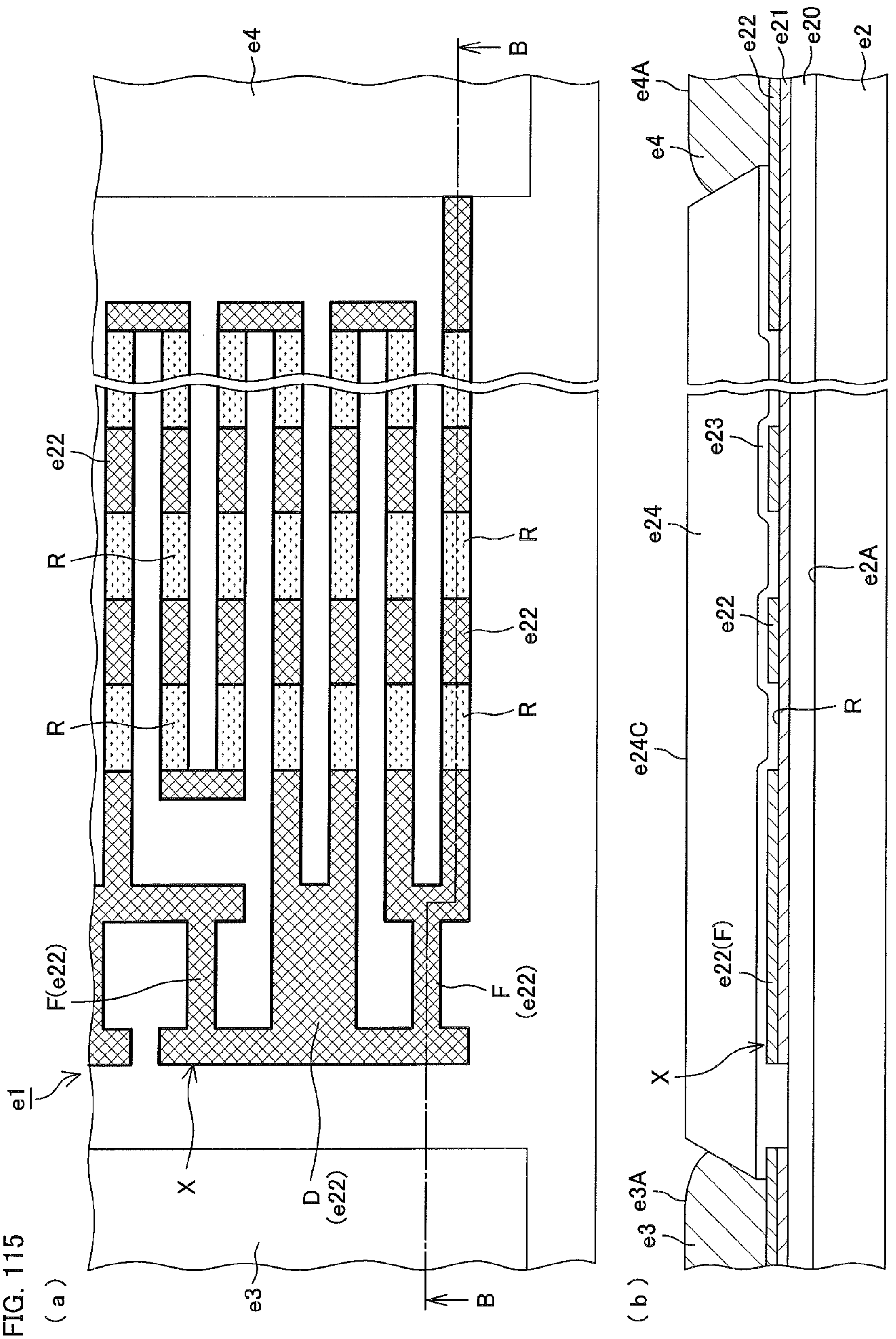

FIG. 115(*a*) is an enlarged partial plan view illustrating a region of the chip resistor including fuses shown in a part of the plan view of FIG. 112 on an enlarged scale, and FIG. 115(*b*) is a diagram showing a sectional structure taken along a line B-B in FIG. 115(*a*).

Figure 116:
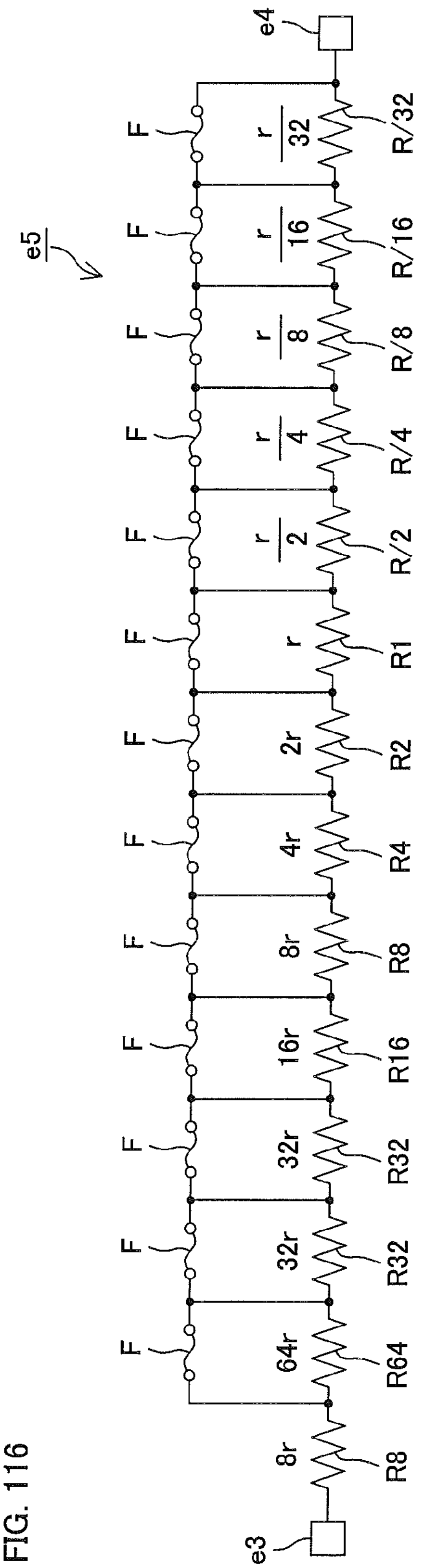

FIG. 116 is an electric circuit diagram of the device according to the example of the fifth reference embodiment.

Figure 117:
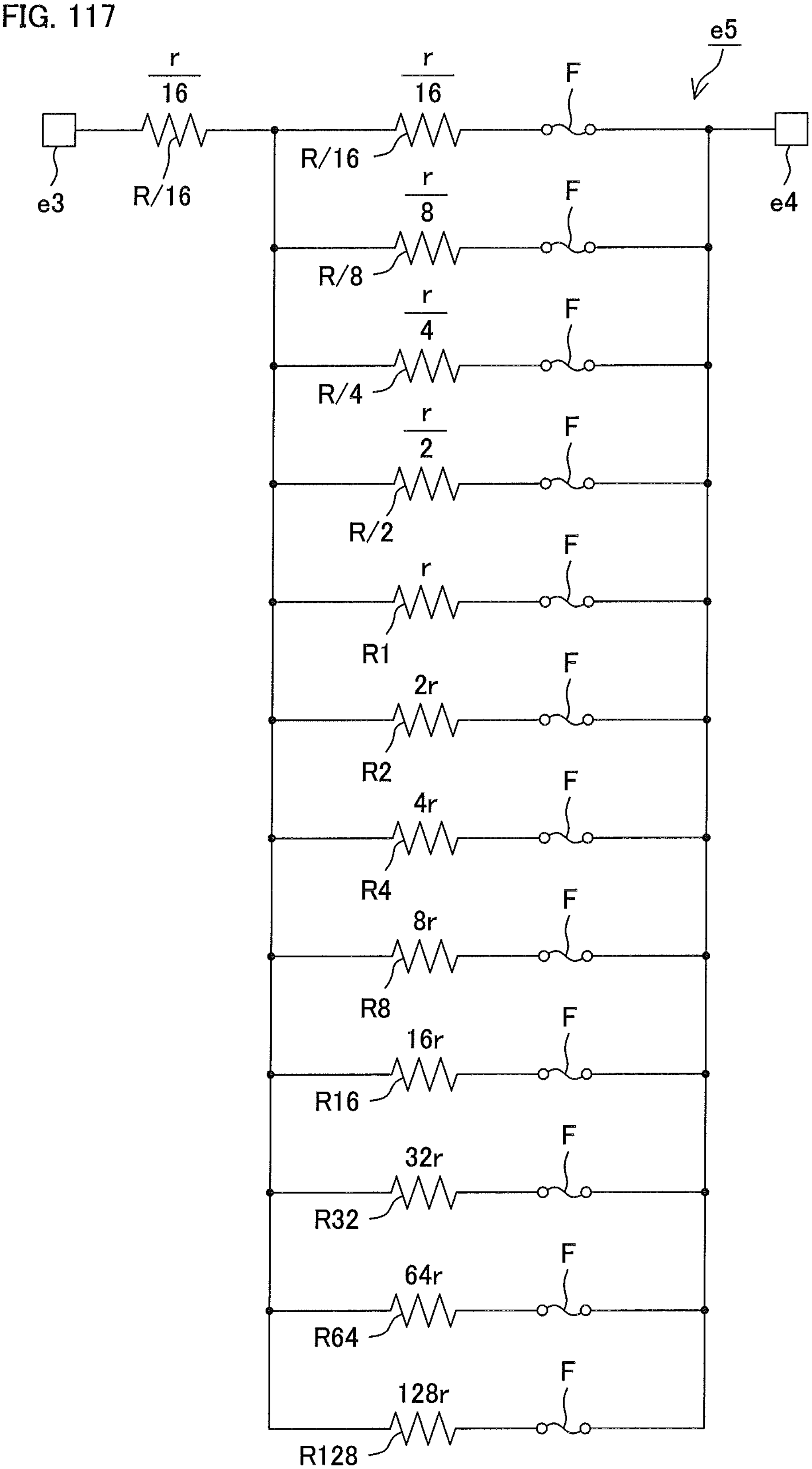

FIG. 117 is an electric circuit diagram of a device according to another example of the fifth reference embodiment.

Figure 118:
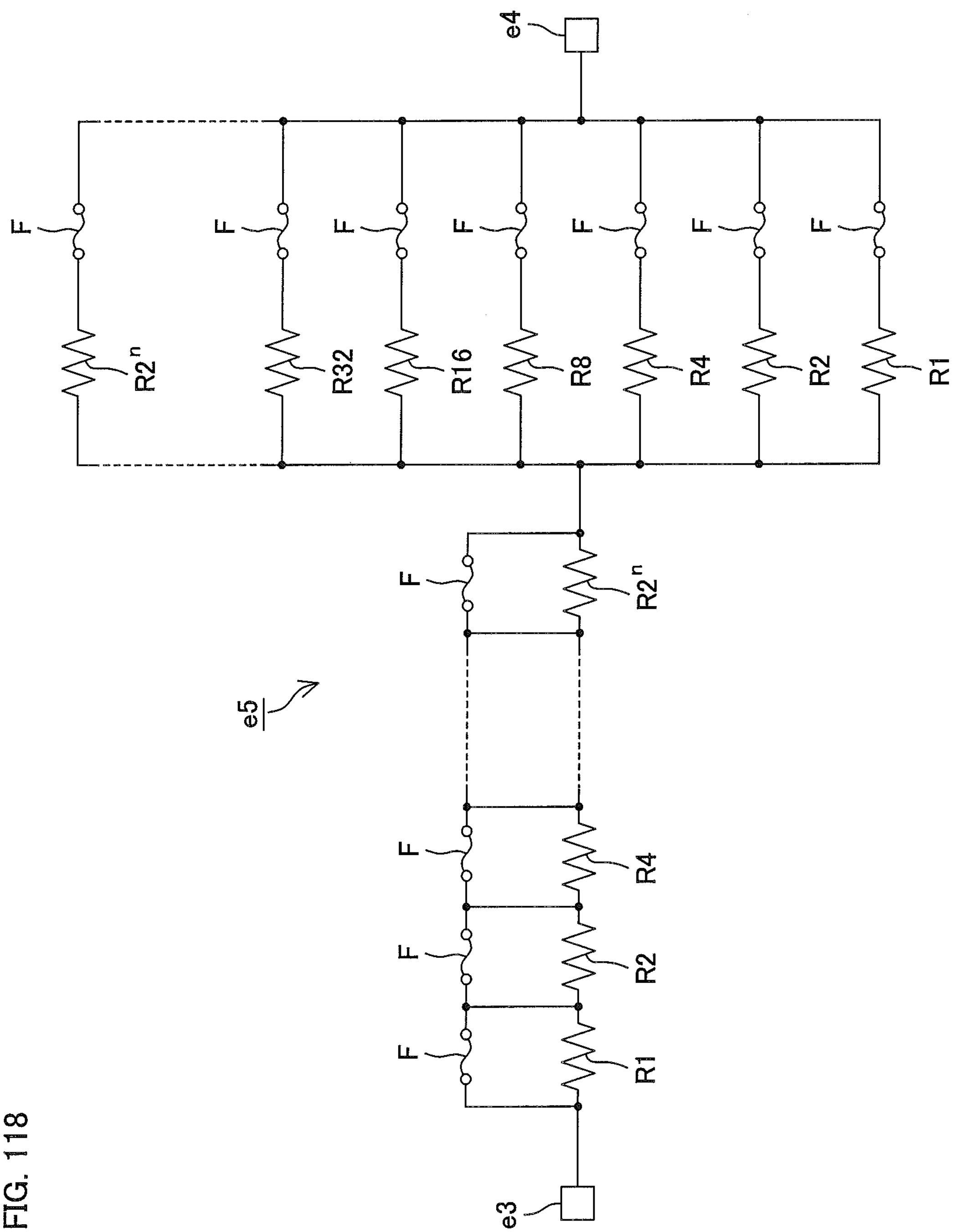

FIG. 118 is an electric circuit diagram of a device according to further another example of the fifth reference embodiment.

Figure 119:
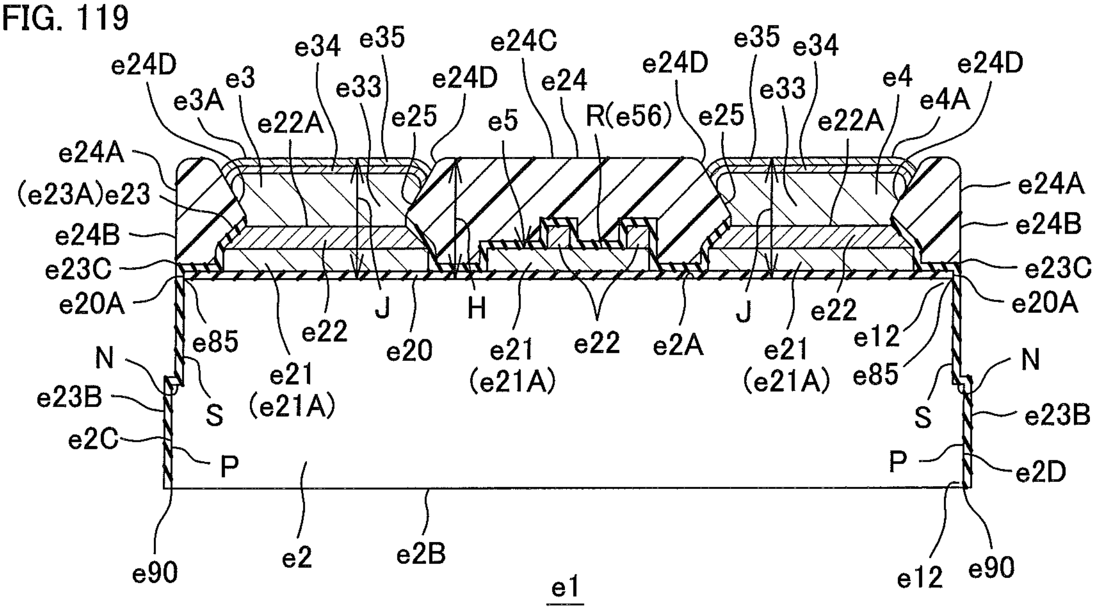

FIG. 119 is a schematic sectional view of the chip resistor.

Figure 120A:
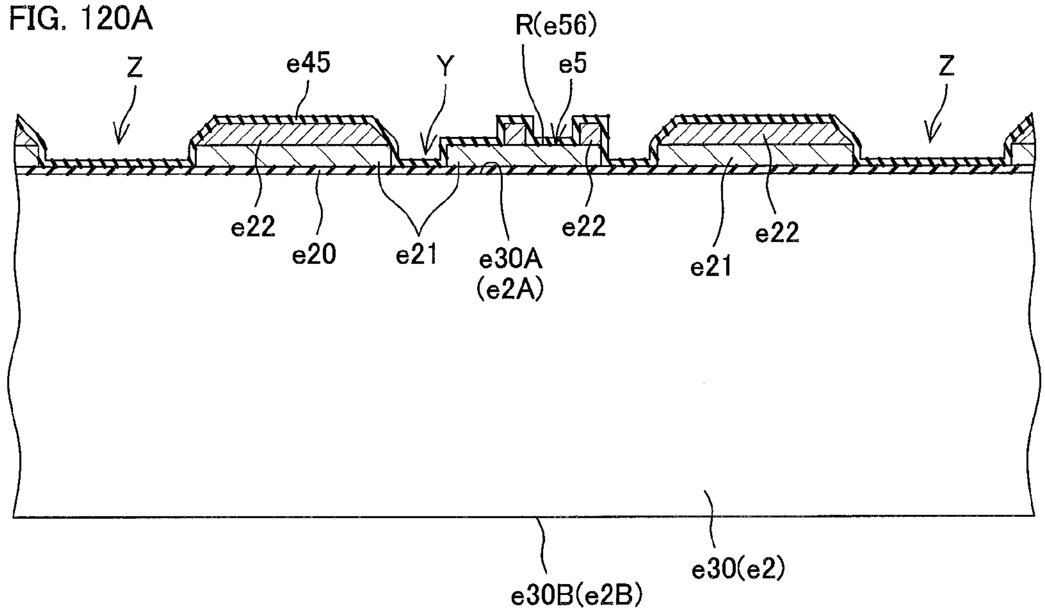

FIG. 120A is a schematic sectional view showing a production method for the chip resistor shown in FIG. 119.

Figure 120B:
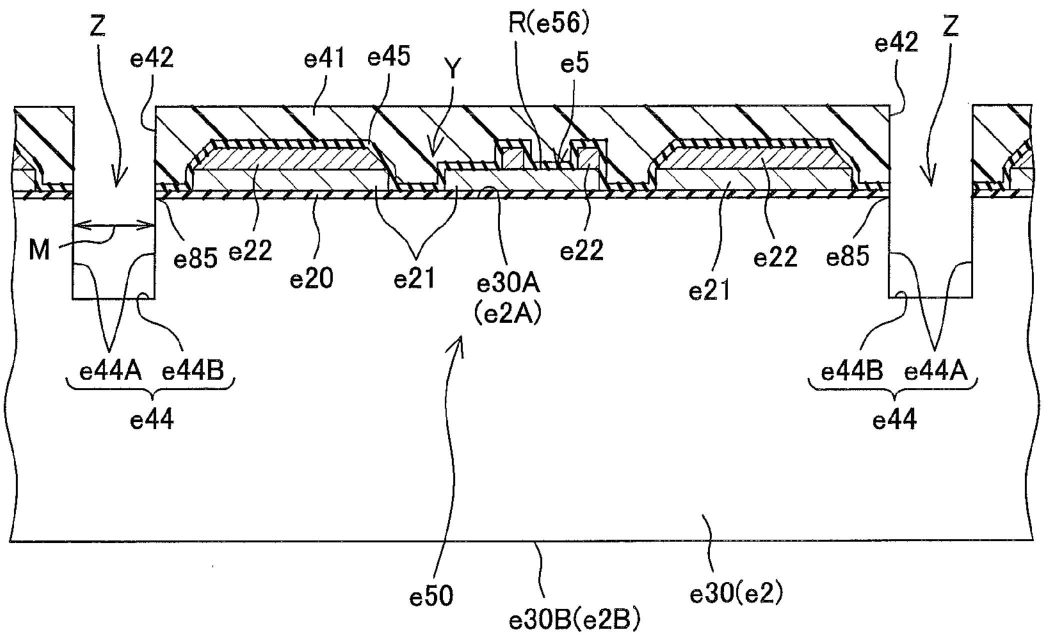

FIG. 120B is a schematic sectional view showing a process step subsequent to that shown in FIG. 120A.

Figure 120C:
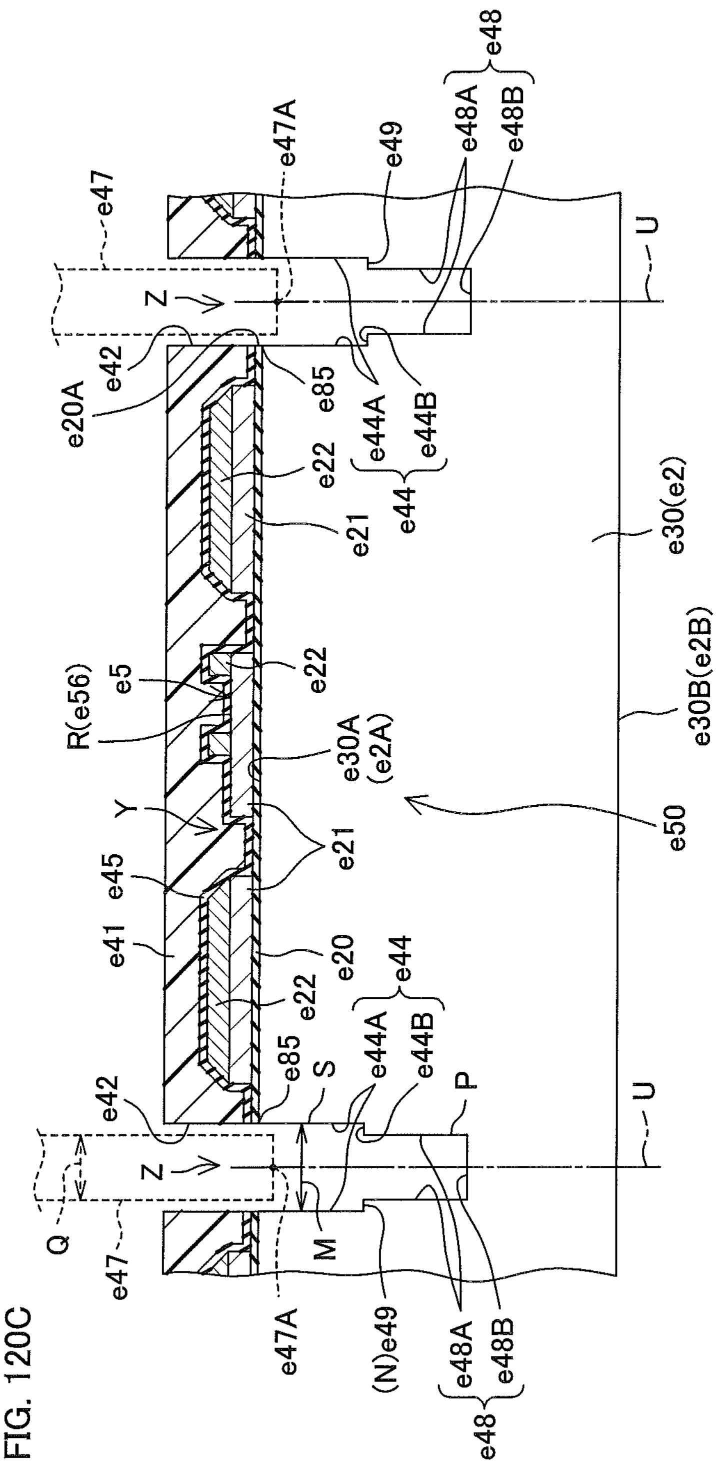

FIG. 120C is a schematic sectional view showing a process step subsequent to that shown in FIG. 120B.

Figure 120D:
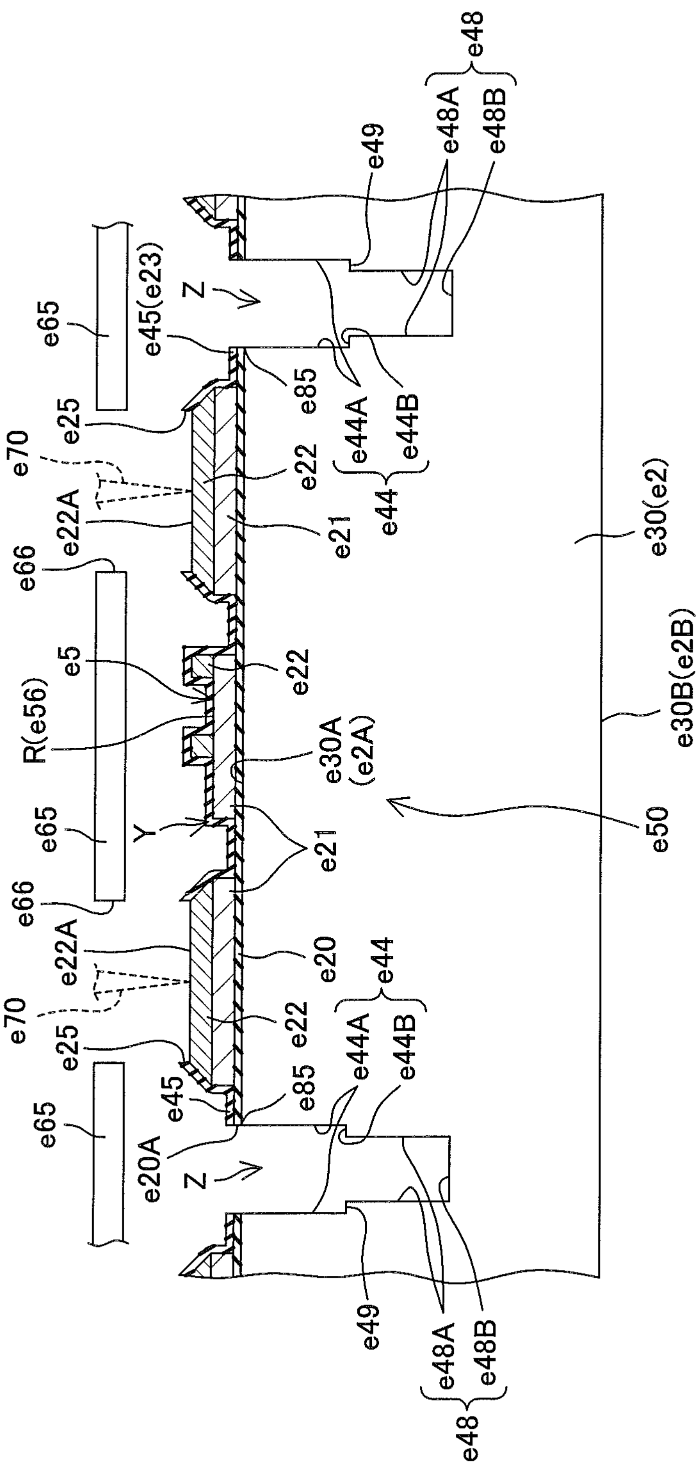

FIG. 120D is a schematic sectional view showing a process step subsequent to that shown in FIG. 120C.

Figure 120E:
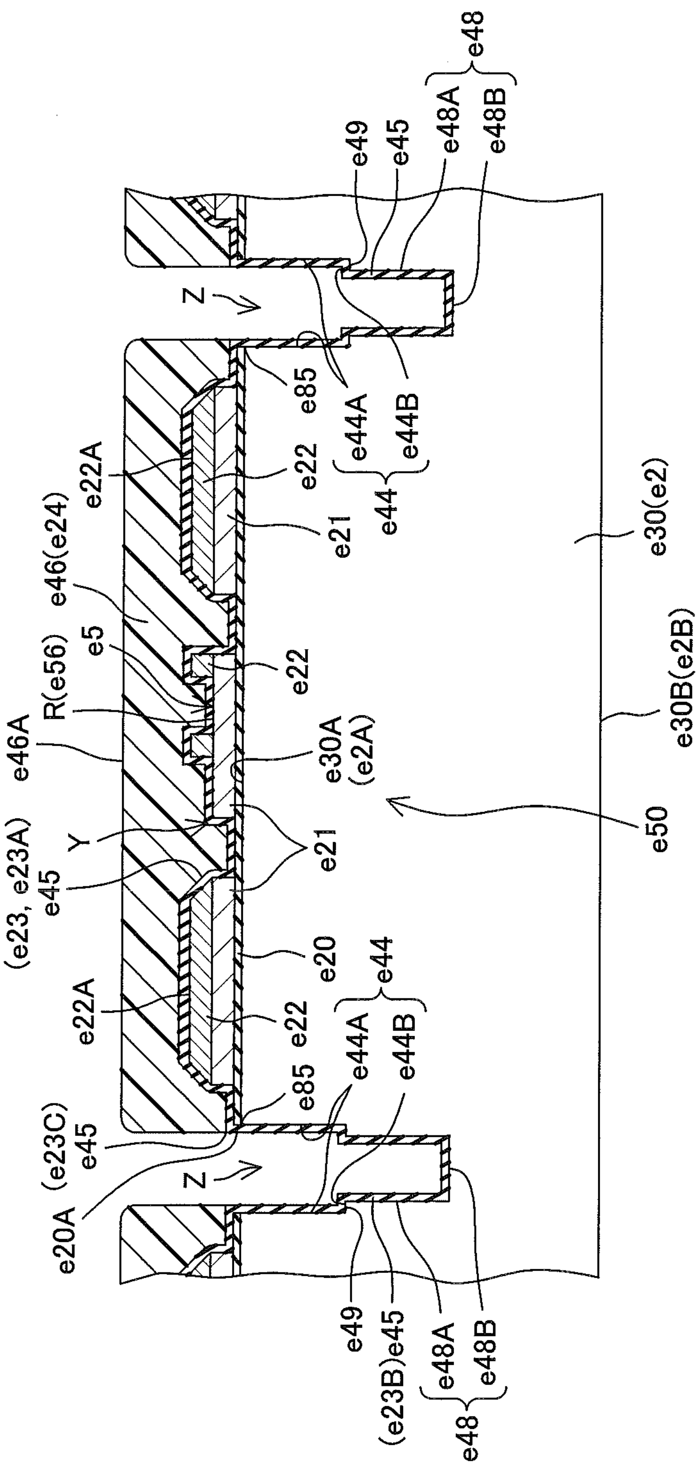

FIG. 120E is a schematic sectional view showing a process step subsequent to that shown in FIG. 120D.

Figure 120F:
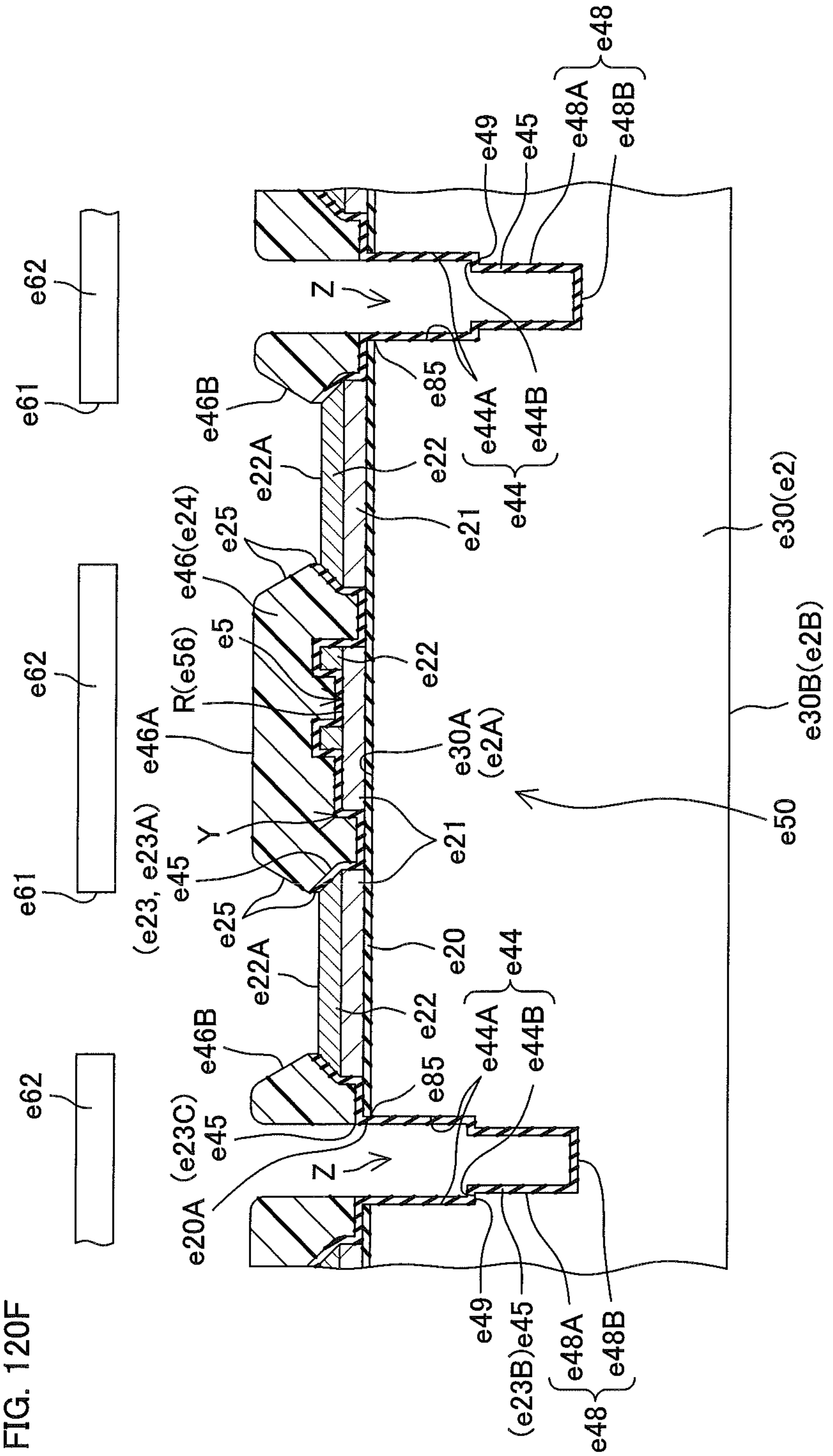

FIG. 120F is a schematic sectional view showing a process step subsequent to that shown in FIG. 120E.

Figure 120G:
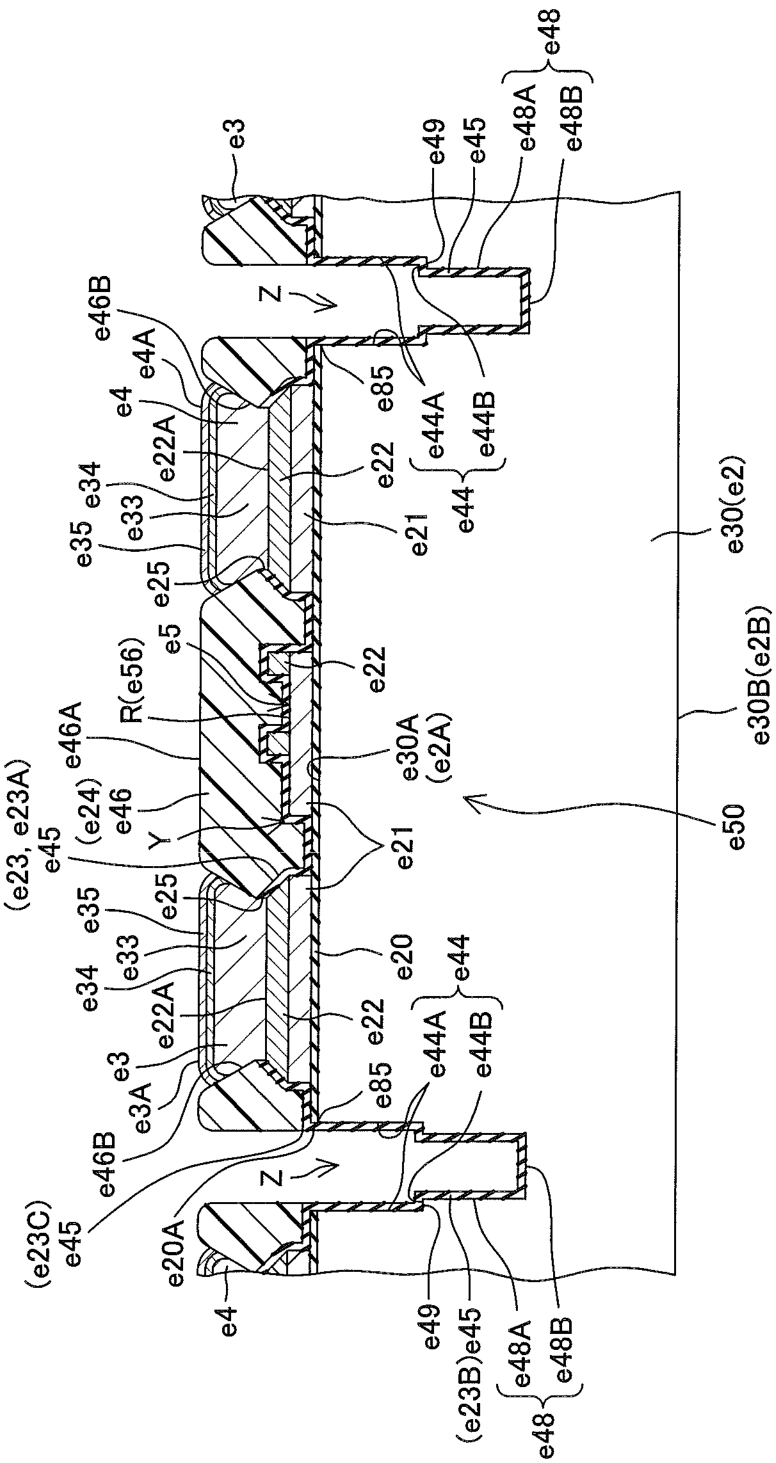

FIG. 120G is a schematic sectional view showing a process step subsequent to that shown in FIG. 120F.

Figure 120H:
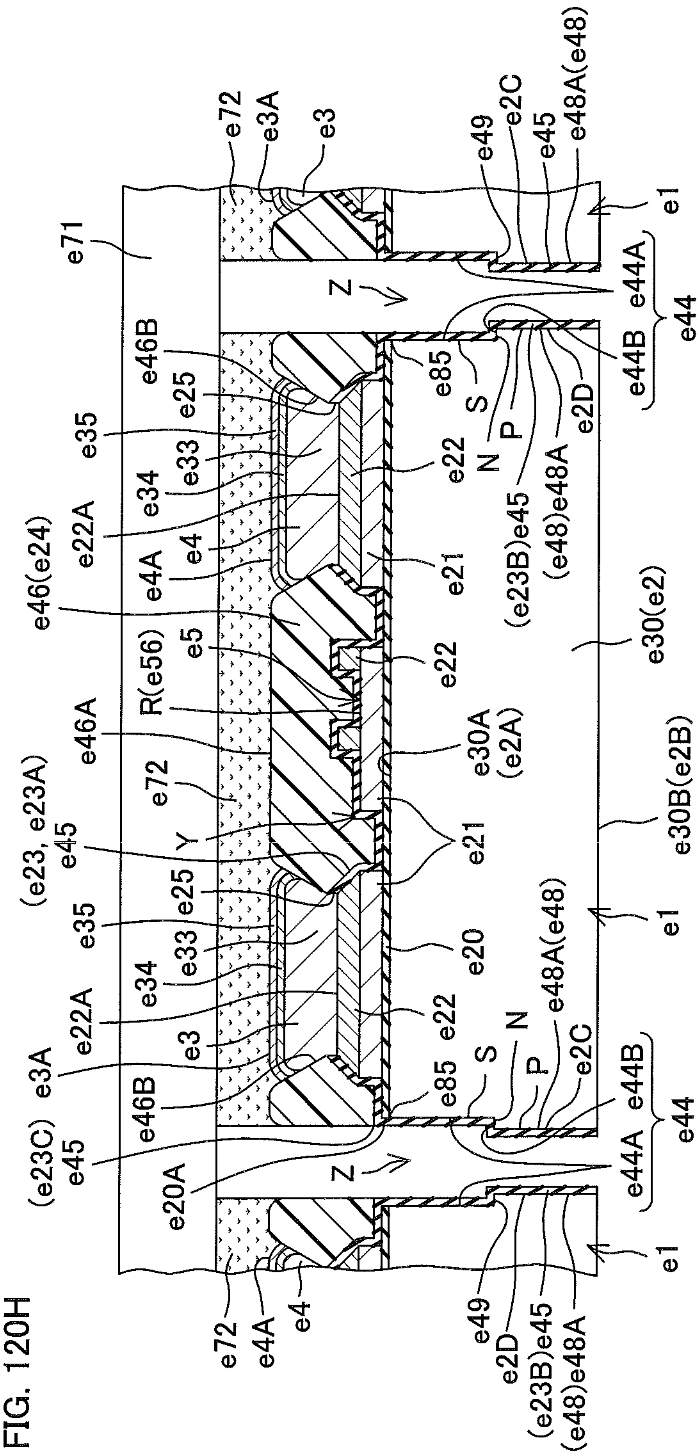

FIG. 120H is a schematic sectional view showing a process step subsequent to that shown in FIG. 120G.

Figure 121:
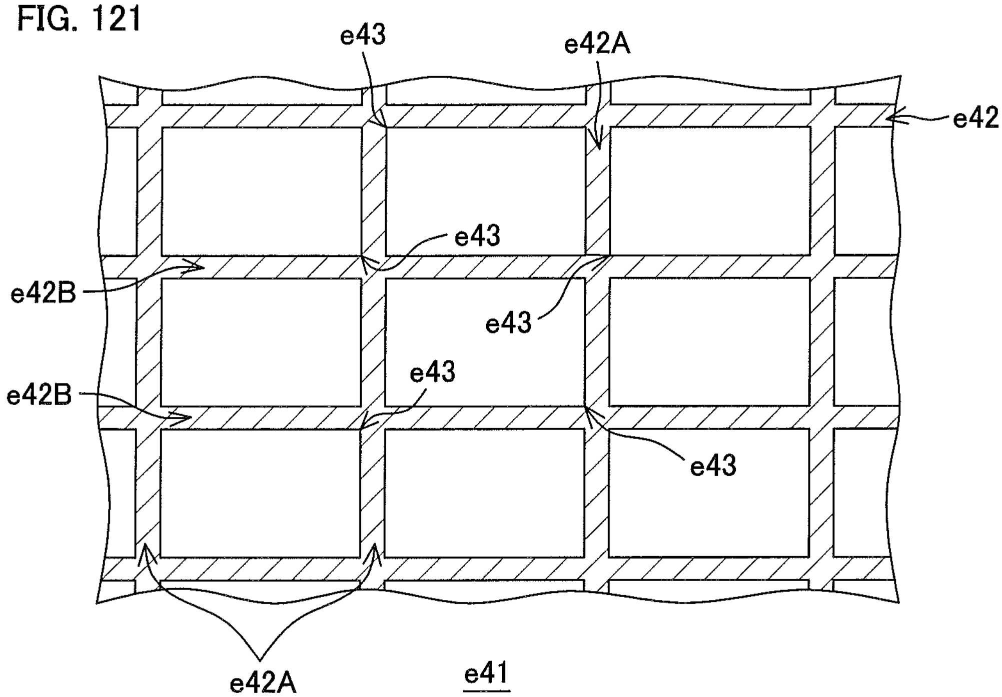

FIG. 121 is a schematic plan view showing a part of a resist pattern to be used for forming a first trench in the step of FIG. 120B.

Figure 122:
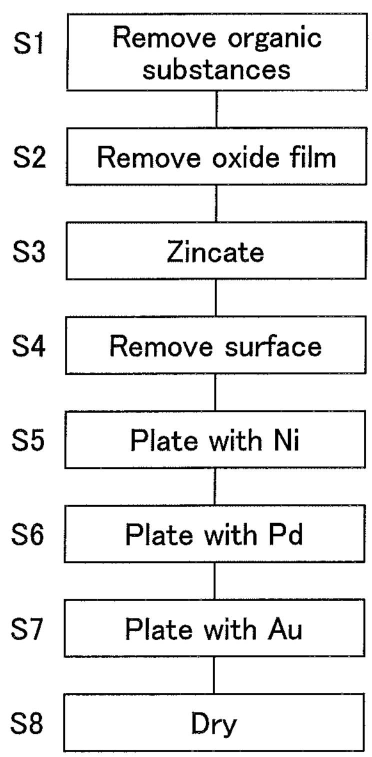

FIG. 122 is a diagram for explaining a process for producing the first connection electrode and the second connection electrode.

Figure 123:
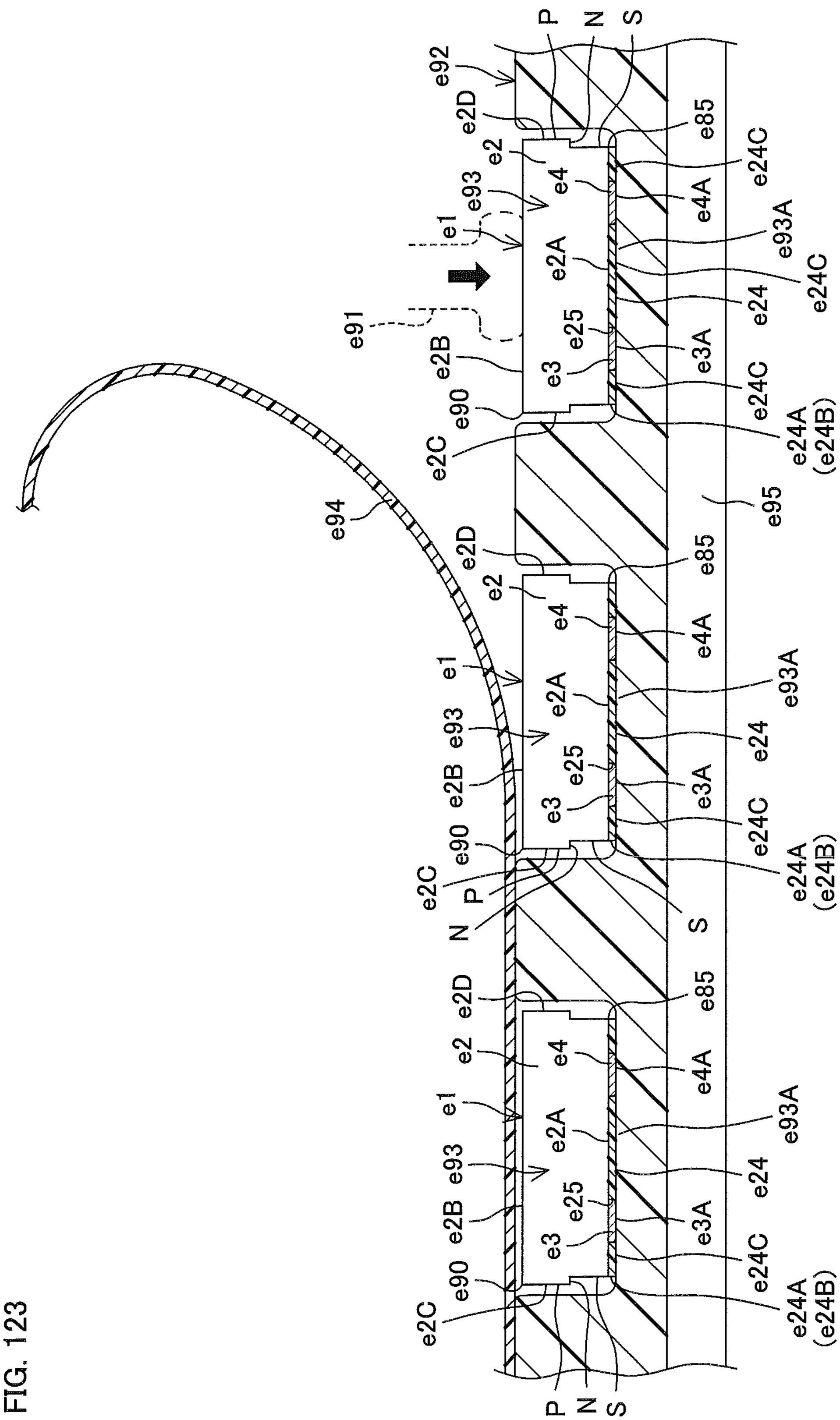

FIG. 123 is a schematic diagram for explaining how to accommodate completed chip resistors in an embossed carrier tape.

Figure 124:
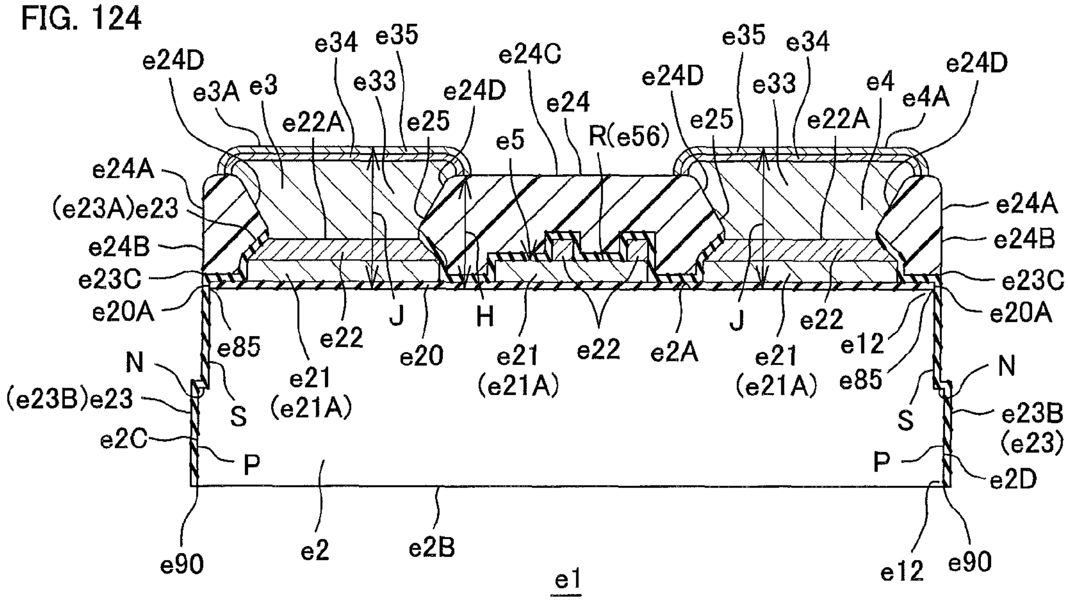

FIG. 124 is a schematic sectional view of a chip resistor according to a first modification of the fifth reference embodiment.

Figure 125:
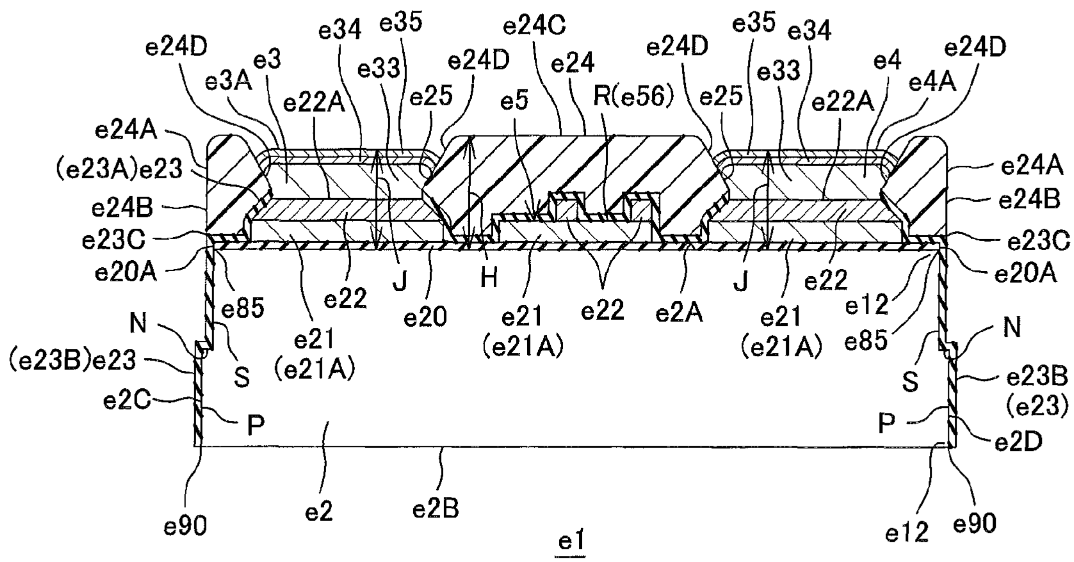

FIG. 125 is a schematic sectional view of a chip resistor according to a second modification of the fifth reference embodiment.

Figure 126:
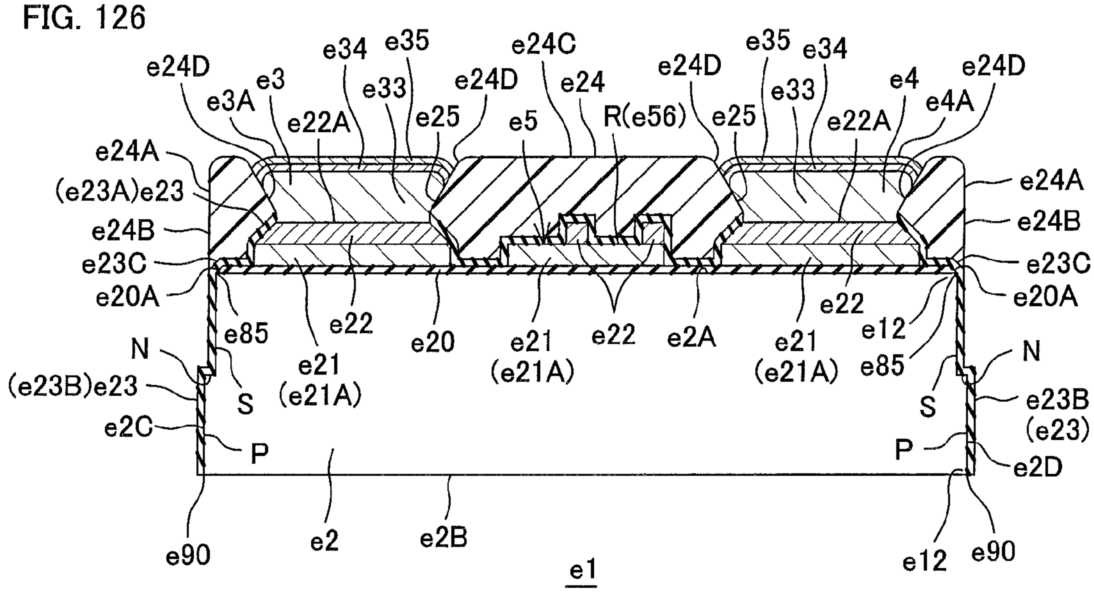

FIG. 126 is a schematic sectional view of a chip resistor according to a third modification of the fifth reference embodiment.

Figure 127:
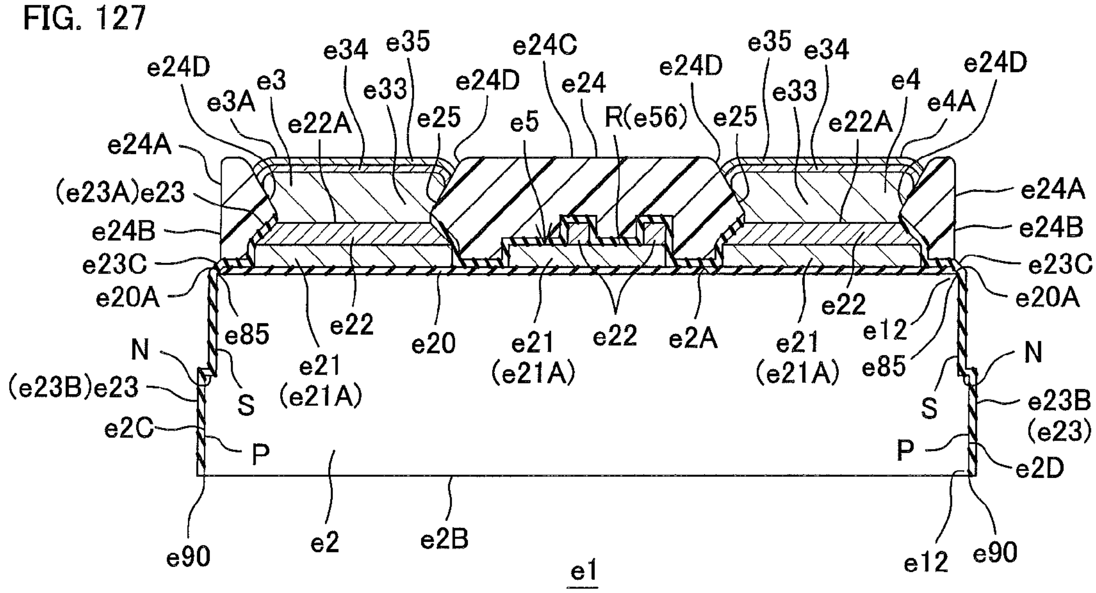

FIG. 127 is a schematic sectional view of a chip resistor according to a fourth modification of the fifth reference embodiment.

Figure 128:
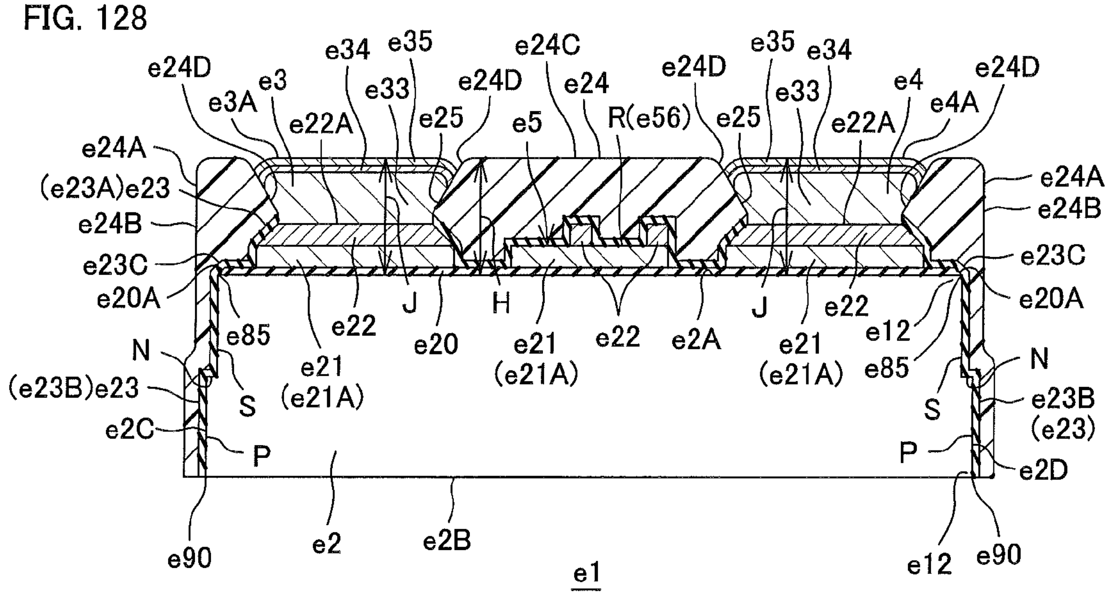

FIG. 128 is a schematic sectional view of a chip resistor according to a fifth modification of the fifth reference embodiment.

Figure 129:
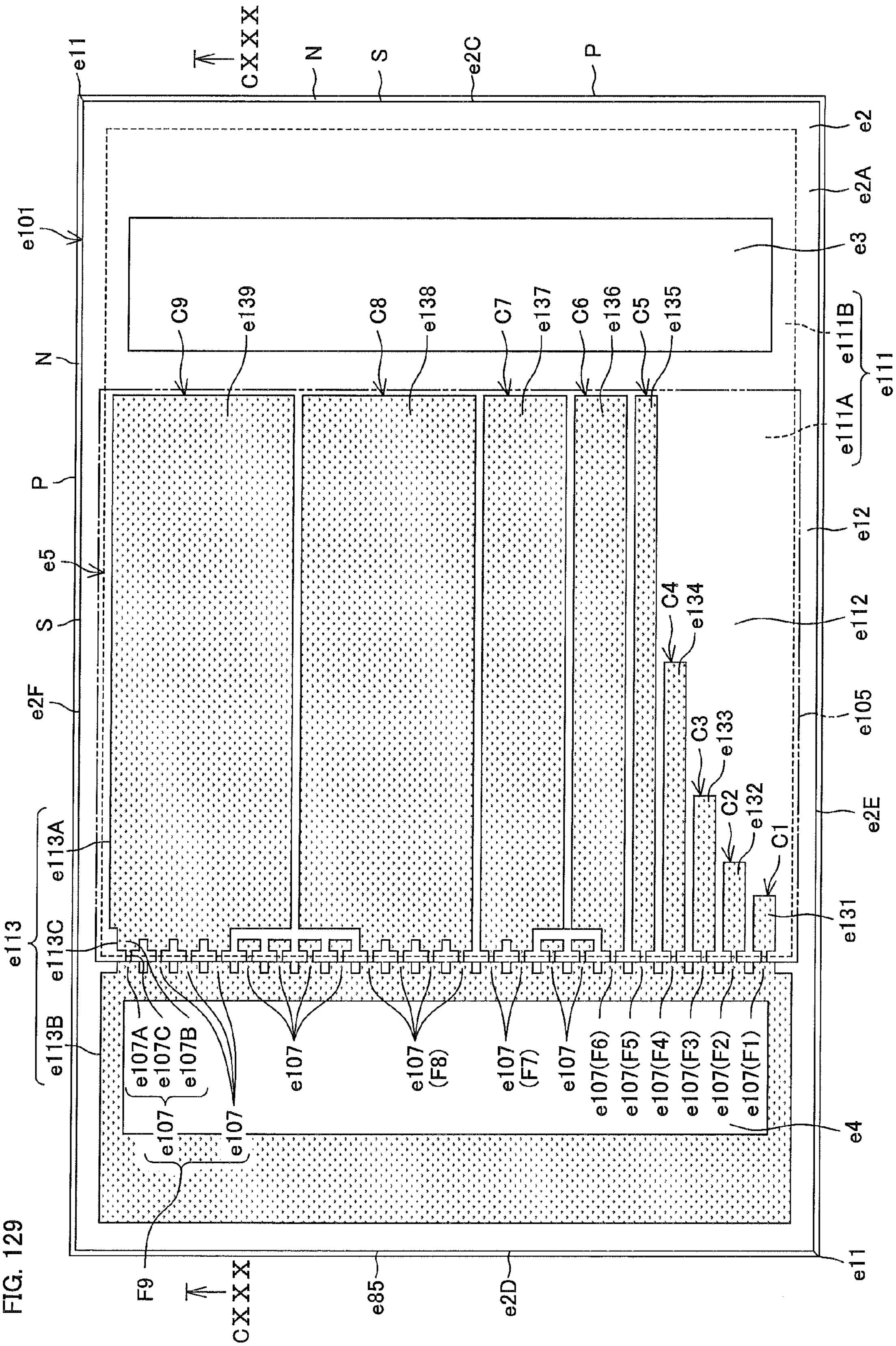

FIG. 129 is a plan view of a chip capacitor according to another example of the fifth reference embodiment.

Figure 130:
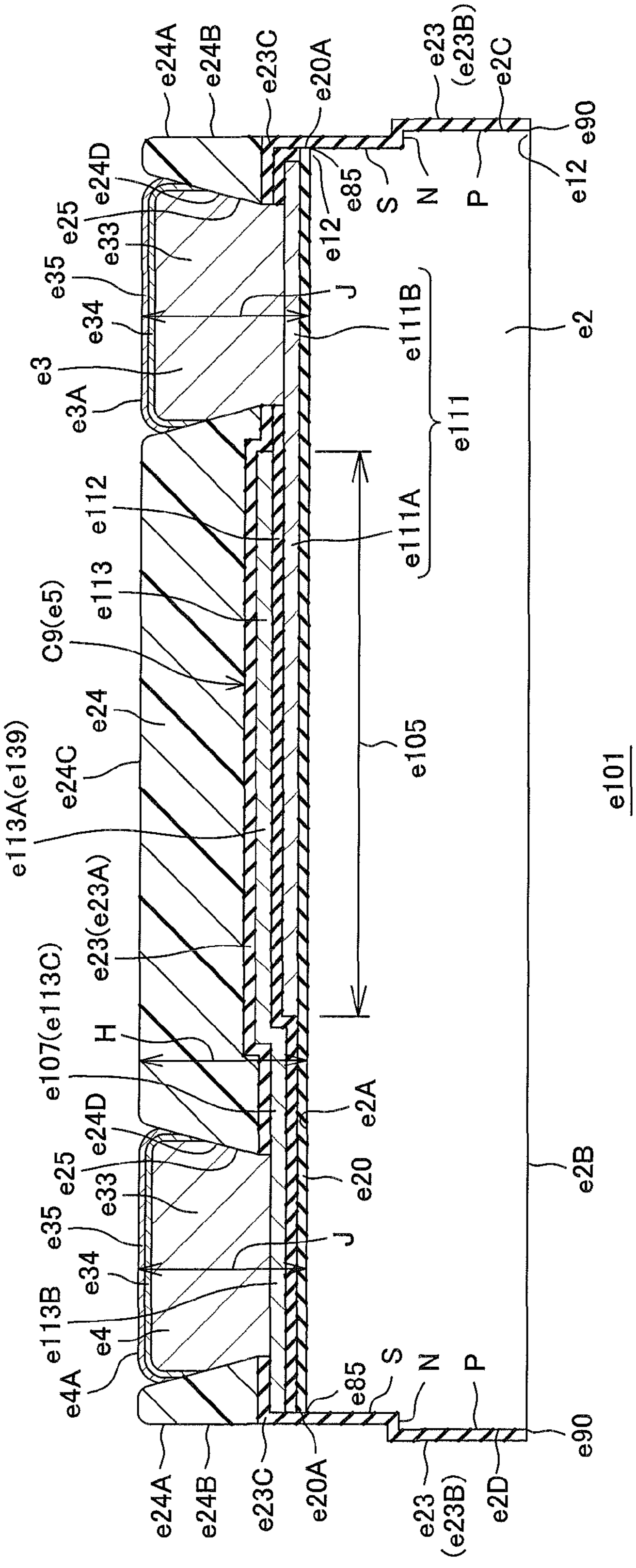

FIG. 130 is a sectional view taken along a sectional line CXXX-CXXX in FIG. 129.

Figure 131:
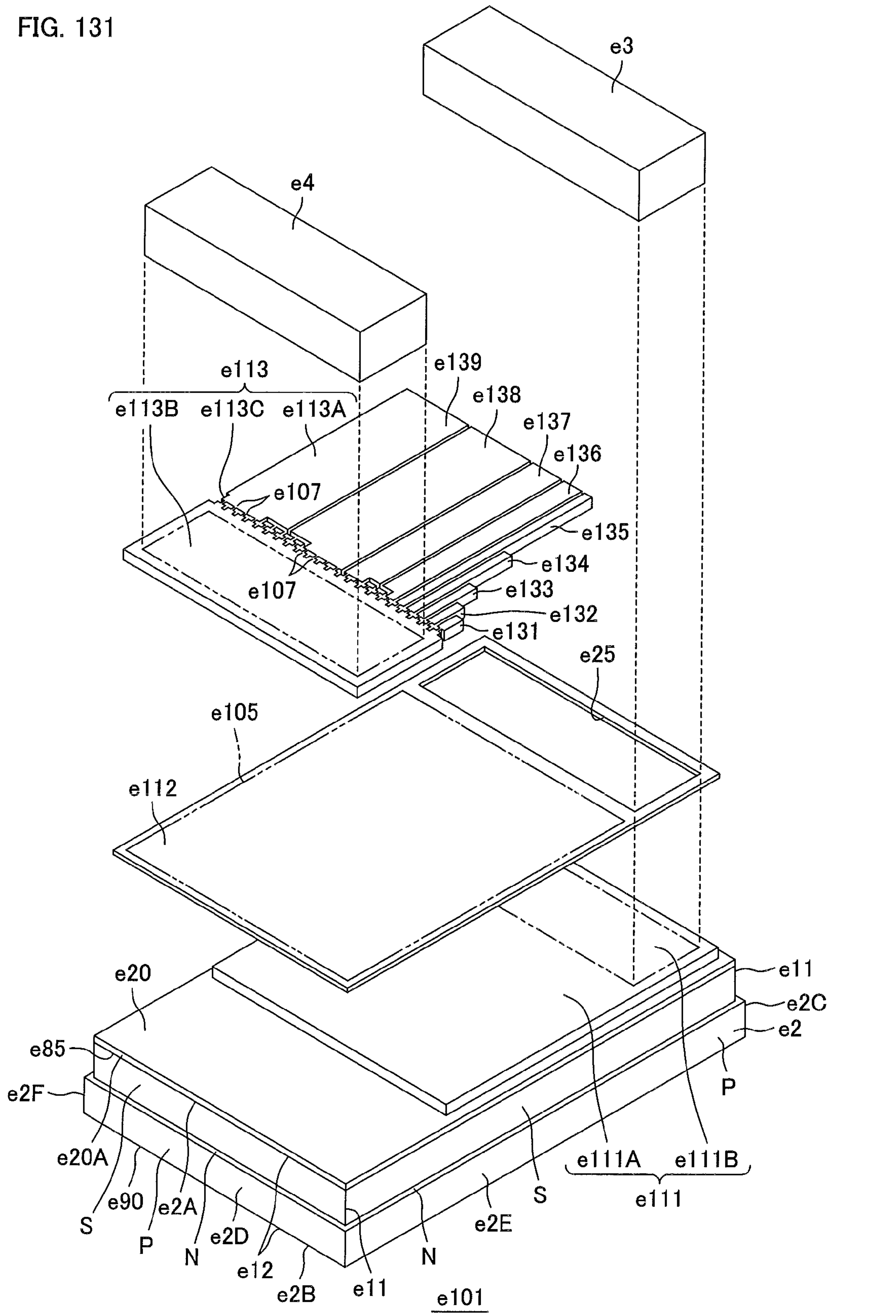

FIG. 131 is an exploded perspective view illustrating the chip capacitor with parts thereof separated.

Figure 132:
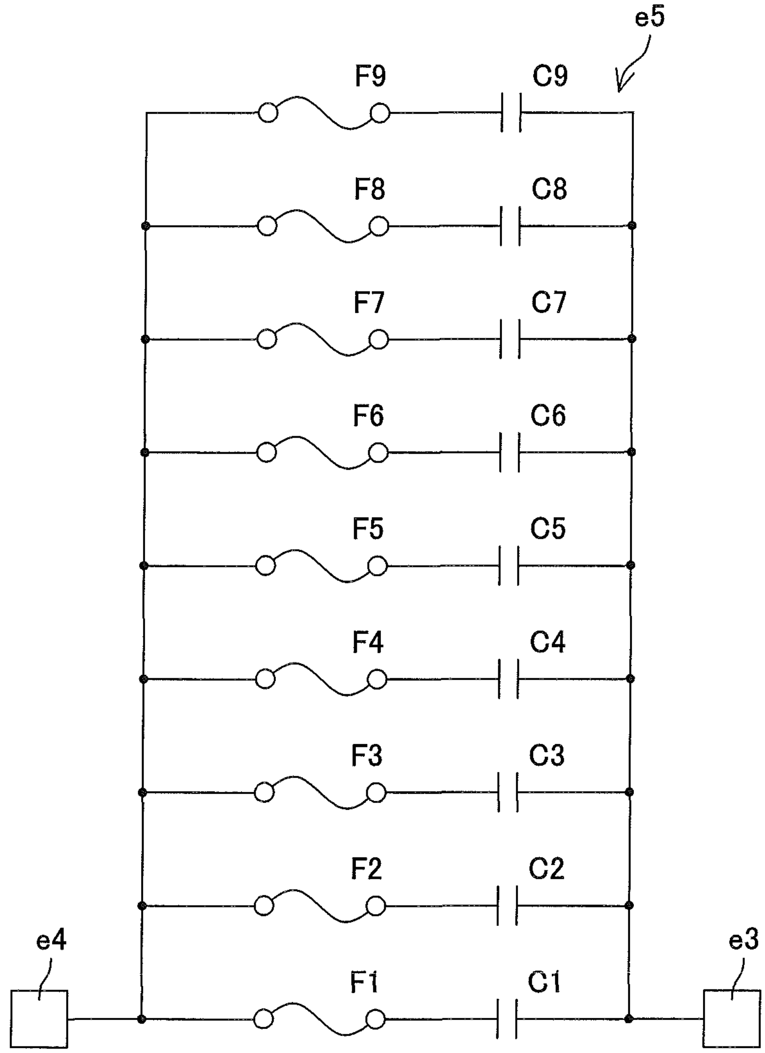

FIG. 132 is a circuit diagram showing the internal electrical configuration of the chip capacitor.

Figure 133:
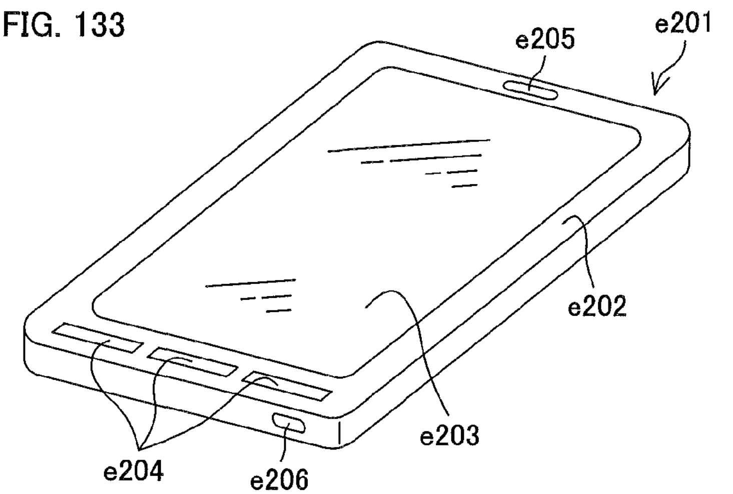

FIG. 133 is a perspective view showing the appearance of a smartphone as an exemplary electronic device which employs a chip component according to the fifth reference embodiment.

Figure 134:
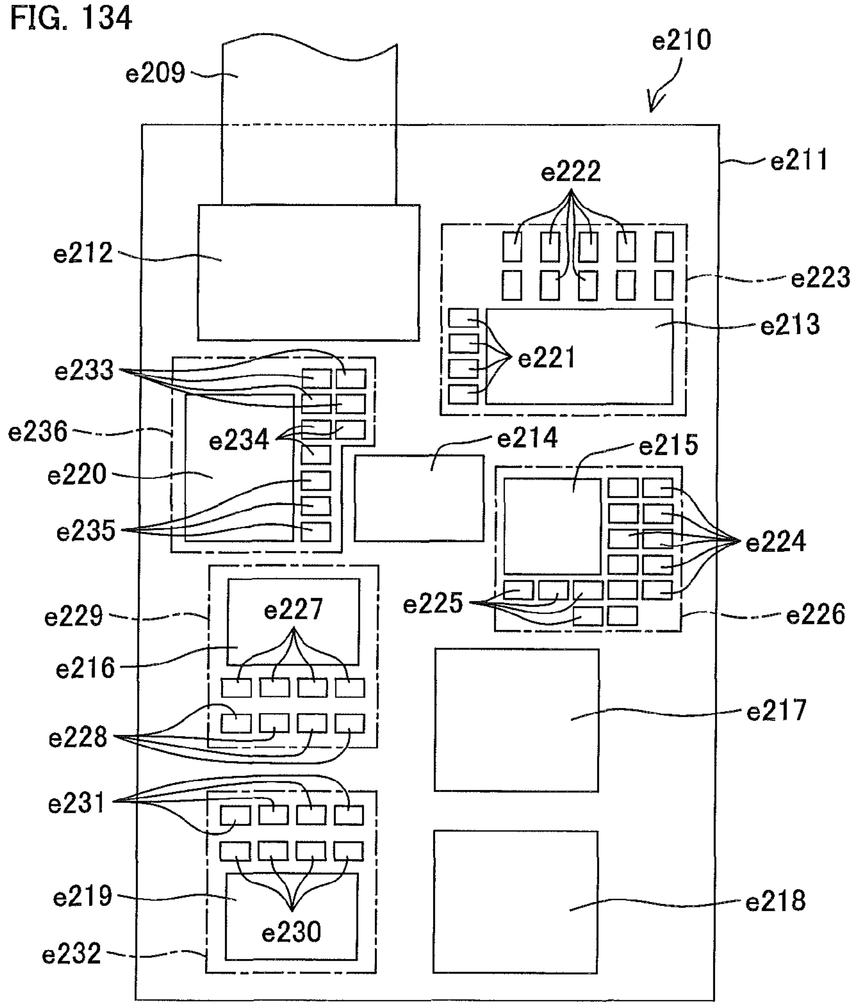

FIG. 134 is a schematic plan view showing the configuration of an electronic circuit assembly accommodated in a housing of the smartphone.

DESCRIPTION OF EMBODIMENTS

Embodiments of the present invention will hereinafter be described in detail with reference to the attached drawings.

Figure 1:
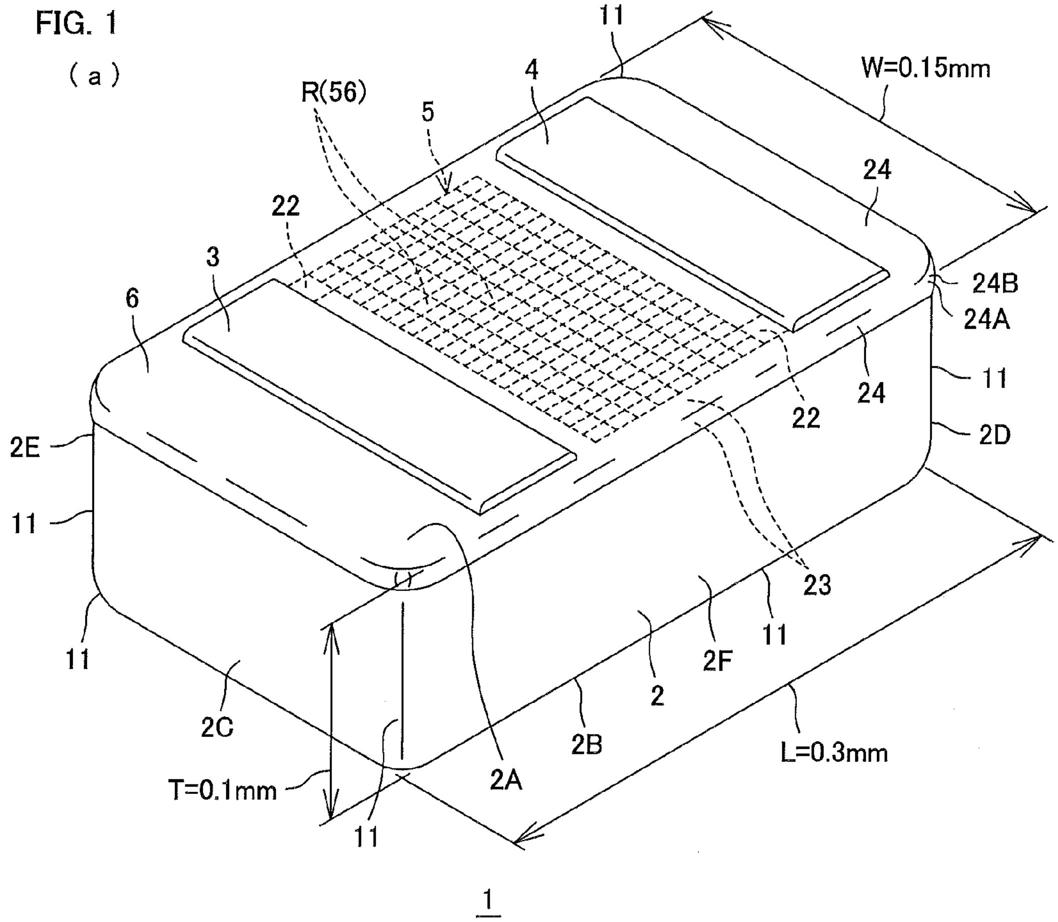
FIG. 1(*a*) is a schematic perspective view for explaining the construction of a chip resistor according to an embodiment of the present invention, and FIG. 1(*b*) is a schematic side view illustrating the chip resistor, which is mounted on a circuit board.
Figure 1:
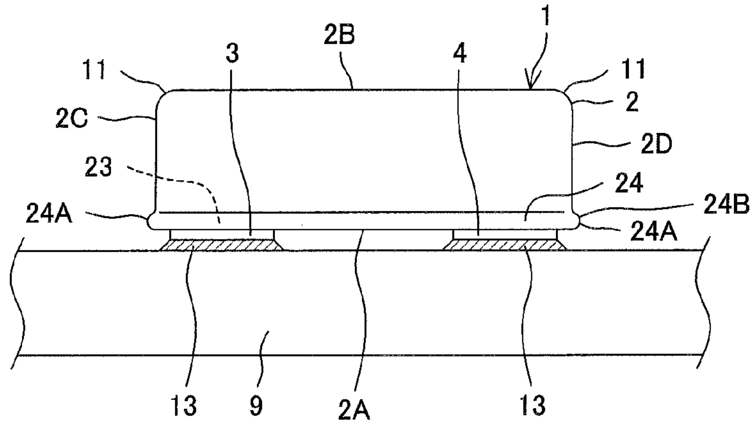

FIG. 1(*a*) is a schematic perspective view for explaining the construction of a chip resistor according to an embodiment of the present invention, and FIG. 1(*b*) is a schematic side view illustrating the chip resistor, which is mounted on a circuit board. The chip resistor 1 is a minute chip component, and has a rectangular prismatic shape as shown in FIG. 1(*a*). The chip resistor 1 is dimensioned such as to have a length L of about 0.3 mm, a width W of about 0.15 mm, and a thickness T of about 0.1 mm.

The chip resistor 1 is obtained by forming a multiplicity of chip resistors 1 in a lattice form on a substrate, then forming a trench in the substrate, and grinding a back surface of the substrate (or dividing the substrate along the trench) to separate the chip resistors 1 from each other. The chip resistor 1 principally includes a board 2, a first connection electrode 3 and a second connection electrode 4 serving as external connection electrodes, and a device (element) 5.

The board 2 has a generally rectangular prismatic chip shape. An upper surface of the board 2 as seen in FIG. 1(*a*) serves as a device formation surface 2A. The device formation surface 2A is a front surface of the board 2, and has a generally rectangular shape. A surface of the board 2 opposite from the device formation surface 2A with respect to the thickness of the board 2 is a back surface 2B. The device formation surface 2A and the back surface 2B have substantially the same shape. In addition to the device formation surface 2A and the back surface 2B, the board 2 has side surfaces 2C, 2D, 2E and 2F extending perpendicularly to the device formation surface 2A and the back surface 2B to connect the device formation surface 2A to the back surface 2B.

The side surface 2C is disposed between edges of the device formation surface 2A and the back surface 2B on one of longitudinally opposite sides (on a left front side in FIG. 1(*a*)). The side surface 2D is disposed between edges of the device formation surface 2A and the back surface 2B on the other of the longitudinally opposite sides (on a right rear side in FIG. 1(*a*)). The side surfaces 2C, 2D are longitudinally opposite end faces of the board 2. The side surface 2E is disposed between edges of the device formation surface 2A and the back surface 2B on one of widthwise opposite sides (on a left rear side in FIG. 1(*a*)). The side surface 2F is disposed between edges of the device formation surface 2A and the back surface 2B on the other of the widthwise opposite sides (on a right front side in FIG. 1(*a*)). The side surfaces 2E, 2F are widthwise opposite end faces of the board 2. The side surfaces 2C, 2D intersect (more strictly, orthogonally intersect) the side surfaces 2E, 2F.

The entire device formation surface 2A of the board 2 is covered with an insulative film 23. More strictly, therefore, the entire device formation surface 2A is located on an inner side (back side) of the insulative film 23, and is not exposed to the outside in FIG. 1(*a*). Further, the insulative film 23 on the device formation surface 2A is covered with a resin film 24. The resin film 24 protrudes from the device formation surface 2A to edges (upper edges in FIG. 1(*a*)) of the side surfaces 2C, 2D, 2E, 2F adjacent to the device formation surface 2A. The insulative film 23 and the resin film 24 will be detailed later.

Intersection portions 11 of the rectangular prismatic board 2 along which adjacent ones of the back surface 2B and the side surfaces 2C, 2D, 2E, 2F intersect each other (corner portions defined by boundaries between adjacent ones of these surfaces) are rounded to each have a rounded shape. The rounded shape of each of the intersection portions 11 preferably has a curvature radius of not greater than 20 μm.

Thus, bent portions (intersection portions 11) of the contour of the board 2 as seen in plan (from the bottom side) and as seen laterally each have a rounded shape. This makes it possible to prevent the chipping of the rounded intersection portions 11 (corner portions) when the chip resistor 1 is handled or transported with the intersection portions 11 being clamped. This improves the yield (improves the productivity) in the production of the chip resistor 1.

The first connection electrode 3 and the second connection electrode 4 are provided on the device formation surface 2A of the board 2, and partly exposed from the resin film 24. The first connection electrode 3 and the second connection electrode 4 each have a structure such that an Ni (nickel) layer, a Pd (palladium) layer and an Au (gold) layer are stacked in this order on the device formation surface 2A. The first connection electrode 3 and the second connection electrode 4 are spaced from each other longitudinally of the device formation surface 2A, and are each elongated widthwise of the device formation surface 2A. On the device formation surface 2A, the first connection electrode 3 is disposed closer to the side surface 2C, and the second connection electrode 4 is disposed closer to the side surface 2D in FIG. 1(*a*).

The device 5 is a circuit device (element), which is provided between the first connection electrode 3 and the second connection electrode 4 on the device formation surface 2A of the board 2, and is covered with the insulative film 23 and the resin film 24 from the upper side. In this embodiment, the device 5 serves as a resistor portion 56 which is a circuit network including a plurality of resistor bodies (thin film resistor bodies) R of a thin TiN (titanium nitride) film and a thin TiON (titanium oxide nitride) film arranged in a matrix array on the device formation surface 2A. The device 5 (resistor bodies R) is electrically connected to portions of an interconnection film 22 to be described later, and electrically connected to the first connection electrode 3 and the second connection electrode 4 via the interconnection film portions 22. Thus, the resistor circuit of the device 5 is provided between the first connection electrode 3 and the second connection electrode 4 in the chip resistor 1.

As shown in FIG. 1(*b*), the chip resistor 1 can be mounted on a circuit board 9 (through flip chip connection) by electrically and mechanically connecting the first connection electrode 3 and the second connection electrode 4 to a circuit (not shown) of the circuit board 9 by solder 13 with the first connection electrode 3 and the second connection electrode 4 opposed to the circuit board 9. The first connection electrode 3 and the second connection electrode 4 functioning as the external connection electrodes are desirably formed of gold (Au) or plated with gold for improvement of solder wettability and reliability.

Figure 2:
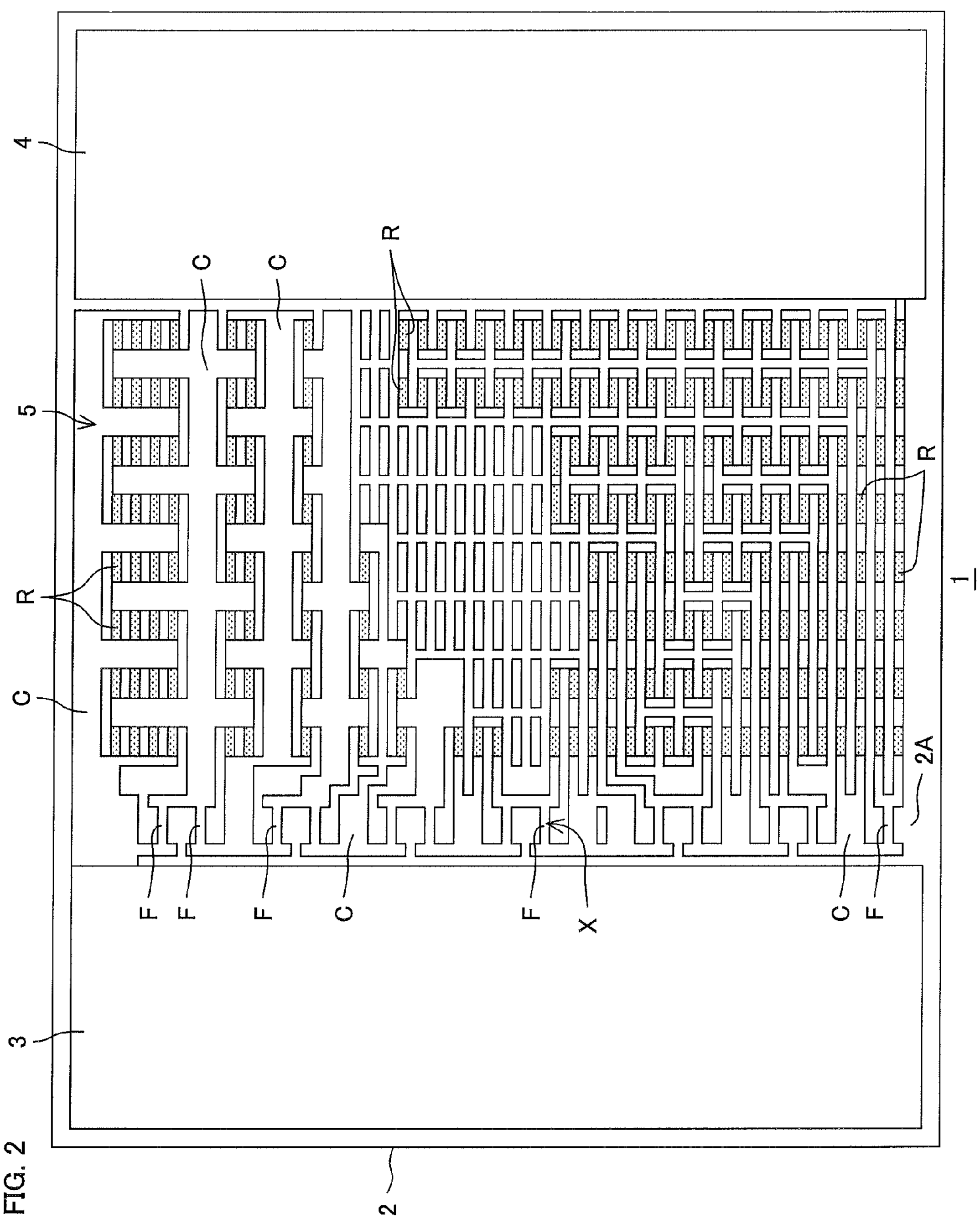
FIG. 2 is a plan view of the chip resistor showing the layout of a first connection electrode, a second connection electrode and a device, and the structure of the device as viewed in plan.

FIG. 2 is a plan view of the chip resistor showing the layout of the first connection electrode, the second connection electrode and the device, and the structure of the device as viewed in plan. Referring to FIG. 2, the device 5 provided as the resistor circuit network includes, for example, 352 resistor bodies in total with 8 resistor bodies R aligned in each row (longitudinally of the board 2) and with 44 resistor bodies R aligned in each column (widthwise of the board 2). The resistor bodies R each have the same resistance value. That is, the resistor body assembly (device 5, resistor portion 56) is constituted by a plurality of resistor bodies R each having the same resistance value.

The multiplicity of resistor bodies R are grouped in predetermined numbers, and a predetermined number of resistor bodies R (1 to 64 resistor bodies R) in each group are electrically connected to one another, whereby plural types of resistor units (unit resistors) are formed. The plural types of resistor units thus formed are connected to one another in a predetermined form via connection conductor films C. Further, a plurality of fusible fuse films (fuses) F are provided on the device formation surface 2A of the board 2 for electrically incorporating the resistor units into the device 5 or electrically isolating the resistor units from the device 5. The fuse films F and the connection conductor films C are arranged in a linear region alongside an inner edge of the first connection electrode 3. More specifically, the fuse films F and the connection conductor films C are linearly arranged.

Figure 3A:
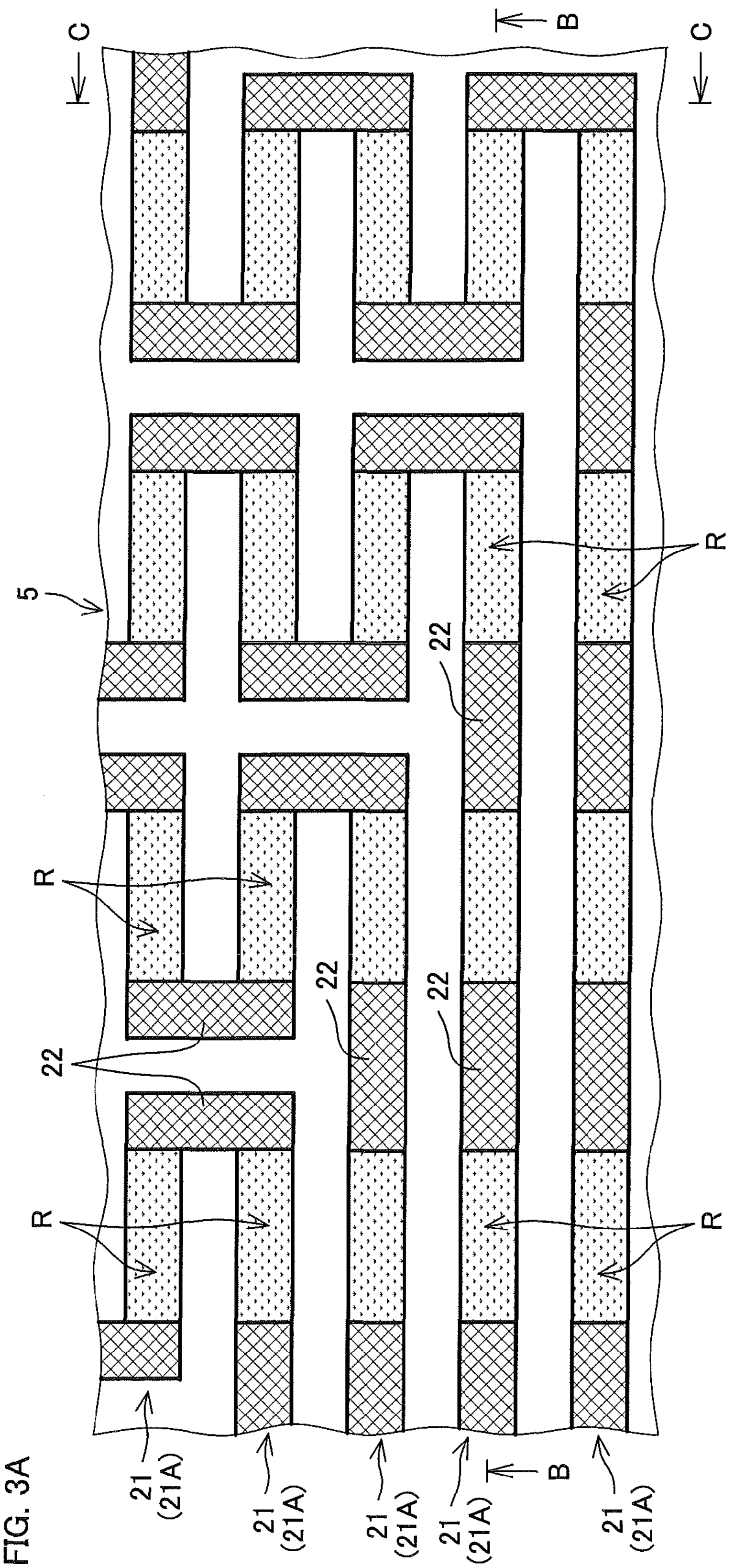
FIG. 3A is a plan view illustrating a part of the device shown in FIG. 2 on an enlarged scale.
Figure 3B:
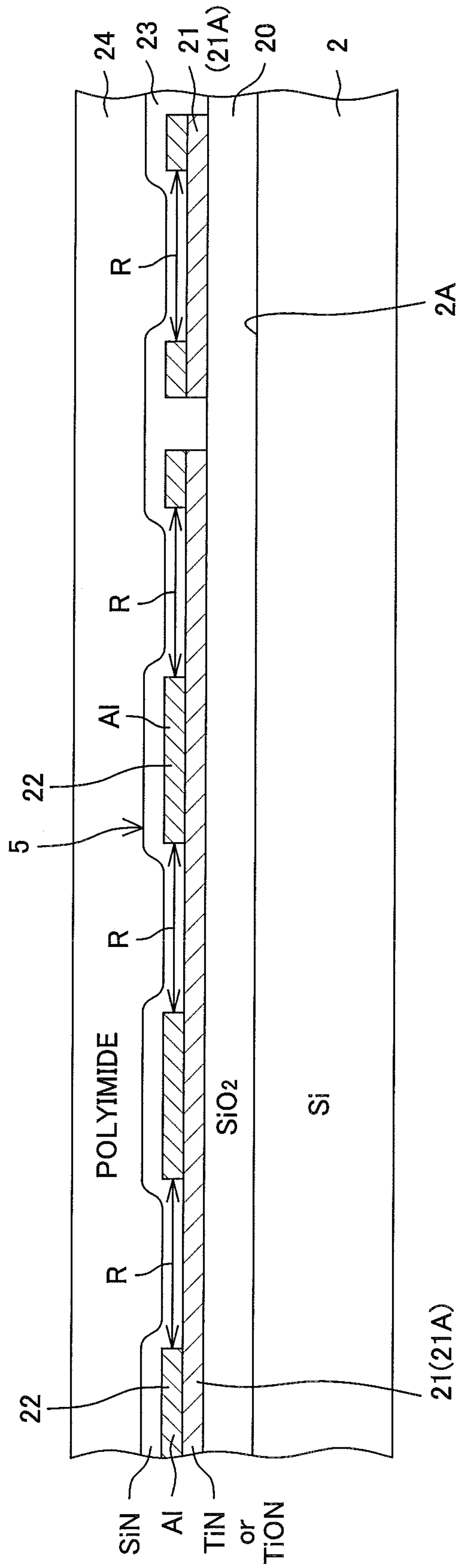
FIG. 3B is a longitudinal vertical sectional view taken along a line B-B in FIG. 3A for explaining the structure of resistor bodies of the device.
Figure 3C:
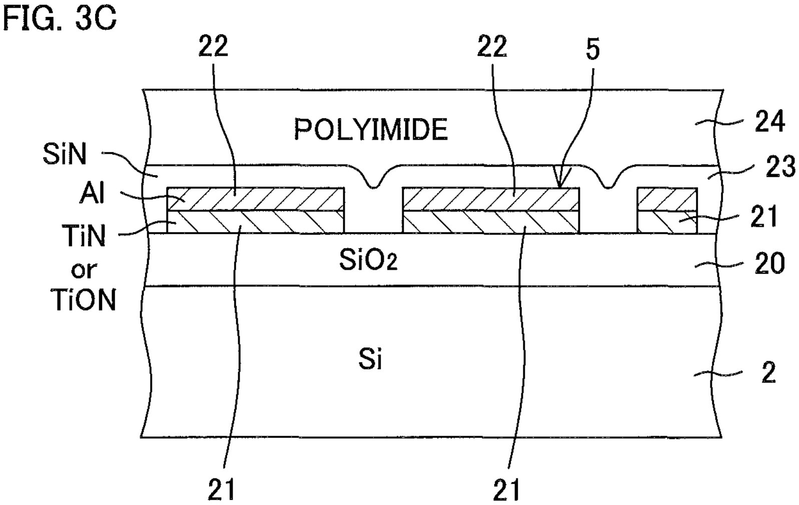
FIG. 3C is a widthwise vertical sectional view taken along a line C-C in FIG. 3A for explaining the structure of the resistor bodies of the device.

FIG. 3A is a plan view illustrating a part of the device shown in FIG. 2 on an enlarged scale. FIG. 3B is a longitudinal vertical sectional view taken along a line B-B in FIG. 3A for explaining the structure of the resistor bodies of the device. FIG. 3C is a widthwise vertical sectional view taken along a line C-C in FIG. 3A for explaining the structure of the resistor bodies of the device. Referring to FIGS. 3A, 3B and 3C, the structure of the resistor bodies R will be described.

The chip resistor 1 includes an insulative layer 20 and a resistive film 21 in addition to the interconnection film 22, the insulative film 23 and the resin film 24 described above (see FIGS. 3B and 3C). The insulative layer 20, the resistive film 21, the interconnection film 22, the insulative film 23 and the resin film 24 are provided on the board 2 (on the device formation surface 2A). The insulative layer 20 is made of $SiO_2$ (silicon oxide). The insulative layer 20 covers the entire device formation surface 2A of the board 2. The insulative layer 20 has a thickness of about 10000 Å. The insulative layer 20 and the insulative film 23 are separate members different from each other.

The resistive film 21 forms the resistor bodies R. The resistive film 21 is made of TiN or TiON, and provided on a surface of the insulative layer 20. The resistive film 21 has a thickness of about 2000 Å. The resistive film 21 includes a plurality of lines (hereinafter referred to as "resistive film lines 21A") extending linearly between the first connection electrode 3 and the second connection electrode 4. Some of the resistive film lines 21A are cut at predetermined positions with respect to a line extending direction (see FIG. 3A).

Figure 4:
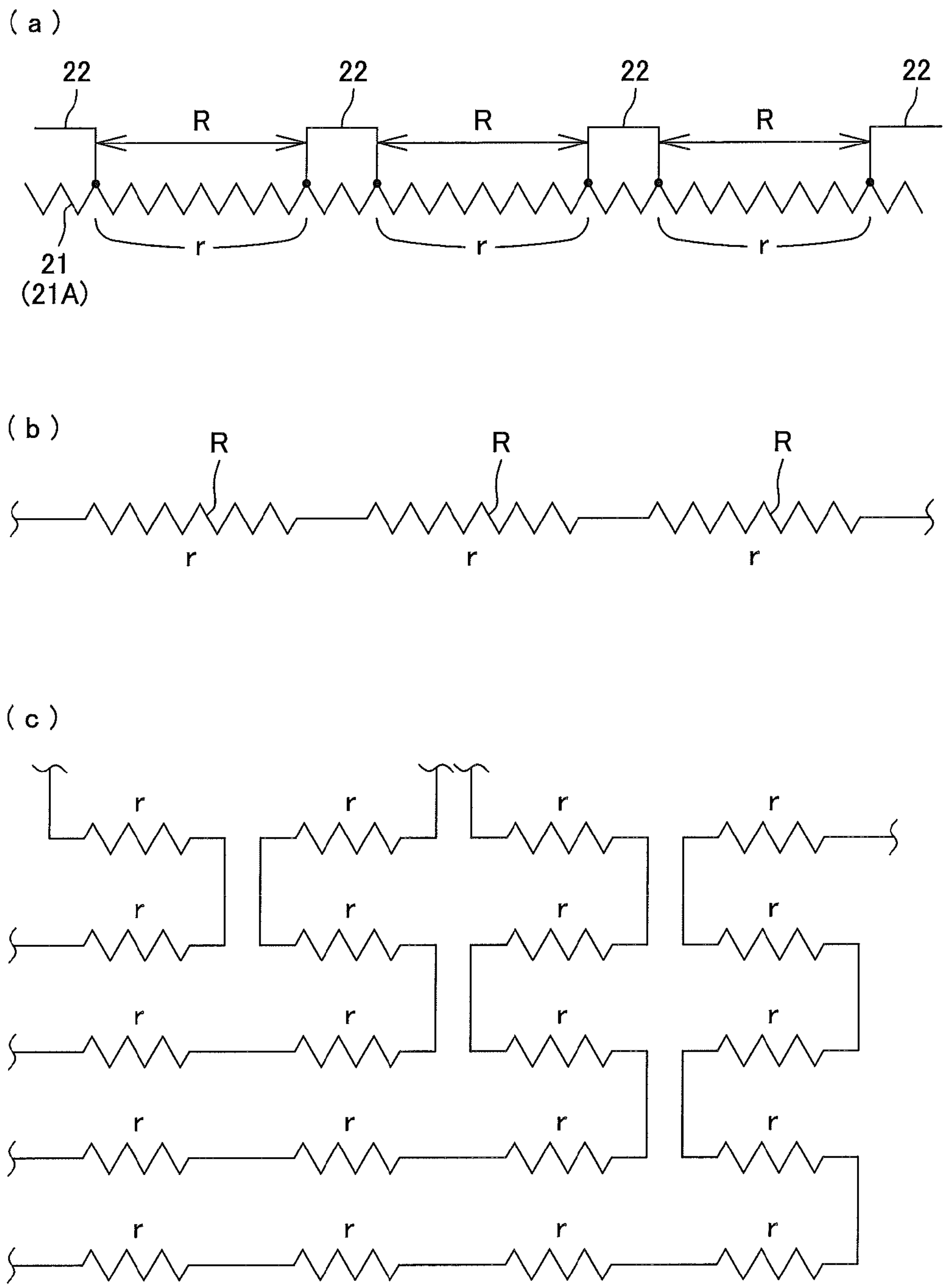
FIG. 4 are diagrams showing the electrical characteristic features of a resistive film line and an interconnection film by way of circuit symbols and electric circuit diagrams.

Portions of the interconnection film 22 are provided on the resistive film lines 21A. The interconnection film portions 22 are each made of Al (aluminum) or an alloy (AlCu alloy) of aluminum and Cu (copper). The interconnection film portions 22 each have a thickness of about 8000 Å. The interconnection film portions 22 are provided on the resistive film lines 21A, and spaced a predetermined distance R from one another in the line extending direction. In FIG. 4, the electrical characteristic features of the resistive film lines 21A and the interconnection film portions 22 of this arrangement are shown by way of circuit symbols and electric circuit diagrams. As shown in FIG. 4(*a*), portions of each of the resistive film lines 21A present between the interconnection film portions 22 spaced the predetermined distance R from one another each serve as a single resistor body R having a predetermined resistance value r.

The interconnection film portions 22, which electrically connect adjacent resistor bodies R to each other, cause short circuit in each of the resistive film lines 21A on which the interconnection film portions 22 are provided. Thus, a resistor circuit is provided, in which the resistor bodies R each having a resistance r are connected in series as shown in FIG. 4(*b*). Further, adjacent resistive film lines 21A are connected to each other by the resistive film 21 and the interconnection film 22, so that a resistor circuit network of the device 5 shown in FIG. 3A constitutes a resistor circuit (including a resistor unit of resistor bodies R) shown in FIG. 4(*c*). Thus, the device 5 is constituted by the resistive film 21 and the interconnection film 22.

Based on a characteristic property such that resistive film portions 21 formed on the board 2 as having the same shape and the same size each have substantially the same resistance value, the multiplicity of resistor bodies R arranged in the matrix array on the board 2 each have the same resistance value. The interconnection film portions 22 provided on the resistive film lines 21A define the resistor bodies R, and also serve as connection interconnection films for connecting the resistor bodies R to one another to provide the resistor units.

Figure 5:
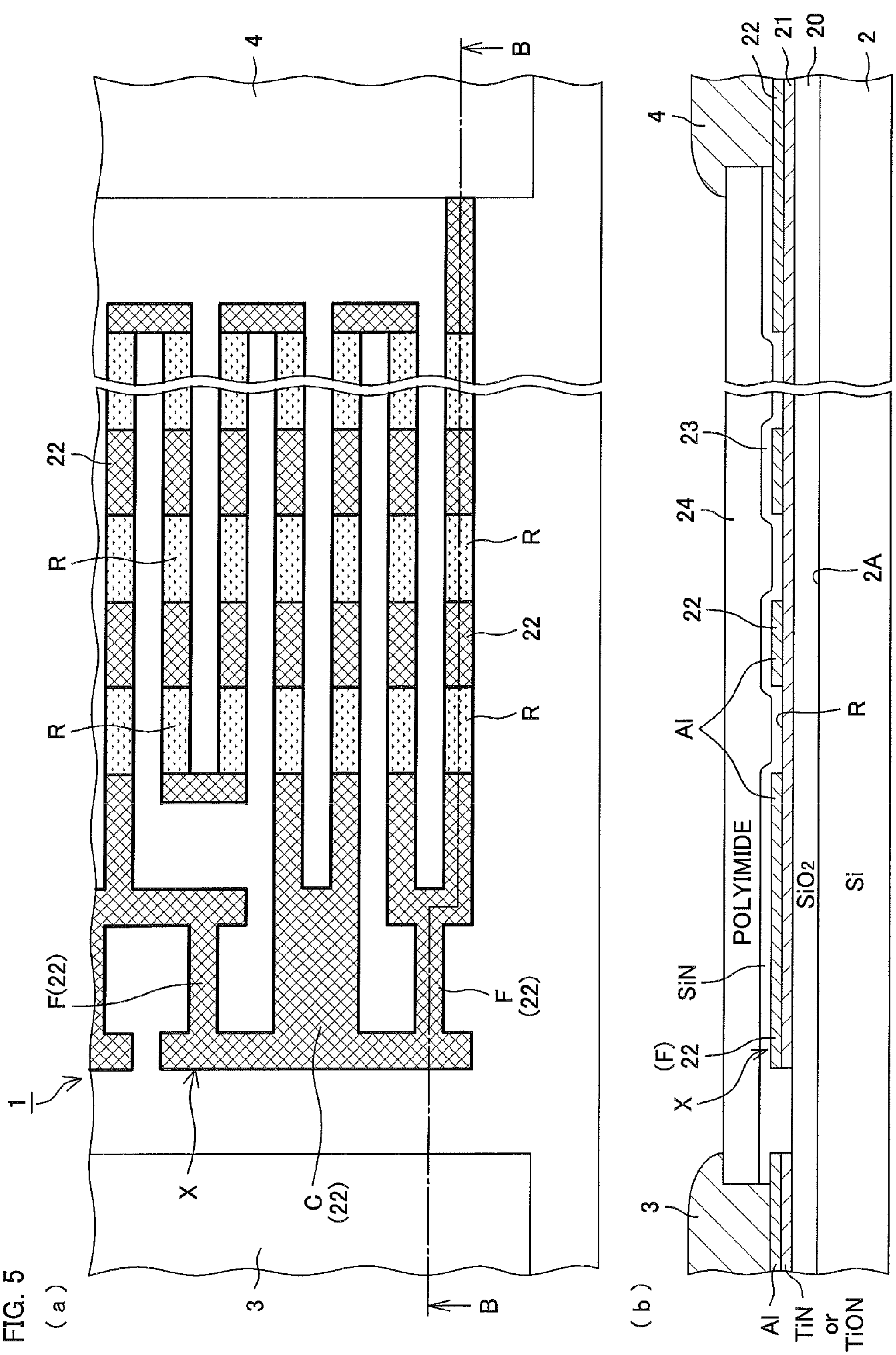
FIG. 5(*a*) is an enlarged partial plan view illustrating a region of the chip resistor including fuse films shown in a part of the plan view of FIG. 2 on an enlarged scale, and FIG. 5(*b*) is a diagram showing a sectional structure taken along a line B-B in FIG. 5(*a*).

FIG. 5(*a*) is an enlarged partial plan view illustrating a region of the chip resistor including fuse films shown in a part of the plan view of FIG. 2 on an enlarged scale, and FIG. 5(*b*) is a diagram showing a sectional structure taken along a line B-B in FIG. 5(*a*). As shown in FIGS. 5(*a*) and 5(*b*), the fuse films F and the connection conductor films C described above are formed from a portion of the same interconnection film 22 as the interconnection film portions 22 provided on the resistive film 21 for the resistor bodies R. That is, the fuse films F and the connection conductor films C are formed of Al or the AlCu alloy, which is the same metal material as for the interconnection film portions 22 provided on the resistive film lines 21A to define the resistor bodies R, and provided at the same level as the interconnection film portions 22.

That is, the interconnection film portions 22 for the resistor bodies R, the interconnection film portion 22 for the fuse films F and the connection conductor films C, and the interconnection film portions 22 for connecting the device 5 to the first connection electrode 3 and the second connection electrode 4 are formed of the same metal material (Al or the AlCu alloy) and provided at the same level on the resistive film 21. It is noted that the fuse films F are different (discriminated) from the other interconnection film portions 22 in that the fuse films F are thinner for easy disconnection and no circuit element is present around the fuse films F.

A region of the interconnection film portion 22 in which the fuse films F are disposed is herein referred to as "trimming region X" (see FIGS. 2 and 5(*a*)). The trimming region X linearly extends alongside the inner edge of the first connection electrode 3, and not only the fuse films F but also some of the connection conductor films C are present in the trimming region X. The resistive film 21 is partly present below the interconnection film portion 22 in the trimming region X (see FIG. 5(*b*)). The fuse films F are each spaced a greater distance from the surrounding interconnection film portions 22 than the other interconnection film portions 22 present outside the trimming region X.

The fuse films F each do not simply designate a part of the interconnection film portion 22, but may each designate a fuse element which is a combination of a part of the resistor body R (resistive film 21) and a part of the interconnection film portion 22 on the resistive film 21. In the above description, the fuse films F are located at the same level as the connection conductor films C, but an additional conductor film may be provided on the respective connection conductor films C to reduce the resistance values of the connection conductor films C as a whole. Even in this case, the fusibility of the fuse films F is not reduced as long as the additional conductor film is not present on the fuse films F.

Figure 6:
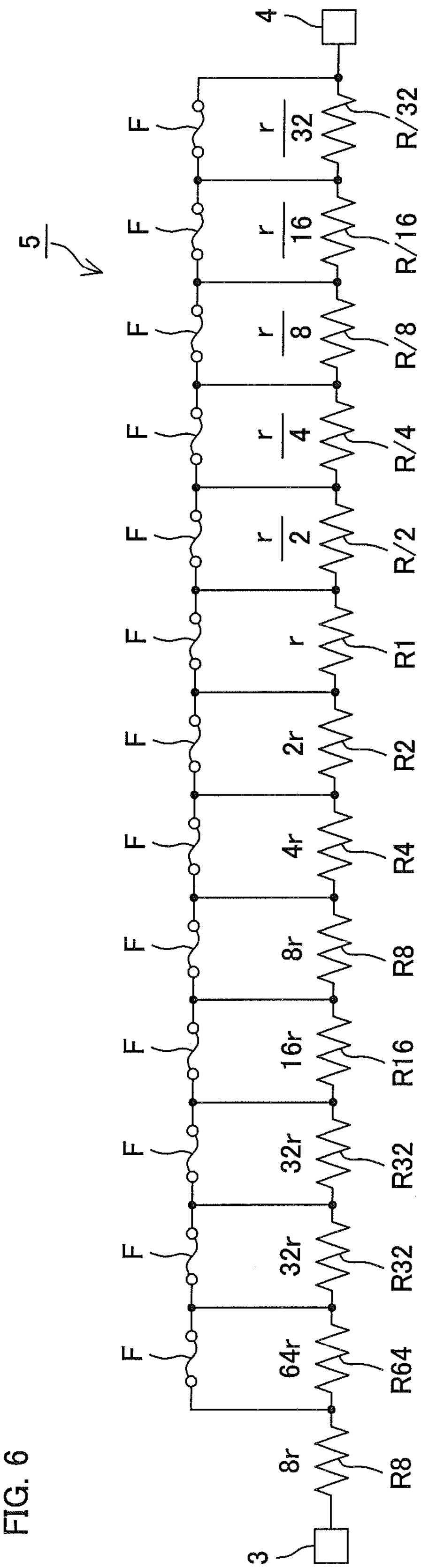
FIG. 6 is an electric circuit diagram of the device according to the embodiment of the present invention.

FIG. 6 is an electric circuit diagram of the device according to the inventive embodiment. Referring to FIG. 6, the device 5 includes a reference resistor unit R8, a resistor unit R64, two resistor units R32, a resistor unit R16, a resistor unit R8, a resistor unit R4, a resistor unit R2, a resistor unit R1, a resistor unit R/2, a resistor unit R/4, a resistor unit R/8, a resistor unit R/16 and a resistor unit R/32, which are connected in series in this order from the first connection electrode 3. The reference resistor unit R8 and the resistor units R64 to R2 each include resistor bodies R in the same number as the suffix number of the reference character (e.g., 64 resistor bodies for the resistor unit R64), wherein the resistor bodies R are connected in series. The resistor unit R1 includes a single resistor body R. The resistor units R/2 to R/32 each include resistor bodies R in the same number as the suffix number of the reference character (e.g., 32 resistor bodies for the resistor unit R/32), wherein the resistor bodies R are connected in parallel. The suffix number of the reference character for the designation of the resistor unit has the same definition in FIGS. 7 and 8 to be described later.

A single fuse film F is connected in parallel to each of the resistor units R64 to R/32 except the reference resistor unit R8. The fuse films F are connected in series to one another directly or via the connection conductor films C (see FIG. 5(*a*)). With none of the fuse films F fused off as shown in FIG. 6, the device 5 provides a resistor circuit such that a reference resistor unit R8 (having a resistance value of 8r) including 8 resistor bodies R connected in series is provided between the first connection electrode 3 and the second connection electrode 4. Where the resistor bodies R each have a resistance value r of r=8Ω, for example, the chip resistor 1 is configured such that the first connection electrode 3 and the second connection electrode 4 are connected to each other through a resistor circuit having a resistance value of 8r=64Ω.

With none of the fuse films F fused off, the plural types of resistor units except the reference resistor unit R8 are short-circuited. That is, 12 types of 13 resistor units R64 to R/32 are connected in series to the reference resistor unit R8, but are short-circuited by the fuse films F connected in parallel thereto. Therefore, the resistor units except the reference resistor unit R8 are not electrically incorporated in the device 5.

In the chip resistor 1 according to this embodiment, the fuse films F are selectively fused off, for example, by a laser beam according to the required resistance value. Thus, a resistor unit connected in parallel to a fused fuse film F is incorporated in the device 5. Therefore, the device 5 has an overall resistance value which is controlled by connecting, in series, resistor units incorporated by fusing off the corresponding fuse films F.

Particularly, the plural types of resistor units include plural types of serial resistor units which respectively include 1, 2, 4, 8, 16, 32, . . . resistor bodies R (whose number increases in a geometrically progressive manner)

each having the same resistance value and connected in series, and plural types of parallel resistor units which respectively include 2, 4, 8, 16, . . . resistor bodies R (whose number increases in a geometrically progressive manner) each having the same resistance value and connected in parallel. Therefore, the overall resistance value of the device 5 (resistor portion 56) can be digitally and finely controlled to a desired resistance value by selectively fusing off the fuse films F (or the fuse elements described above). Thus, the chip resistor 1 can have the desired resistance value.

Figure 7:
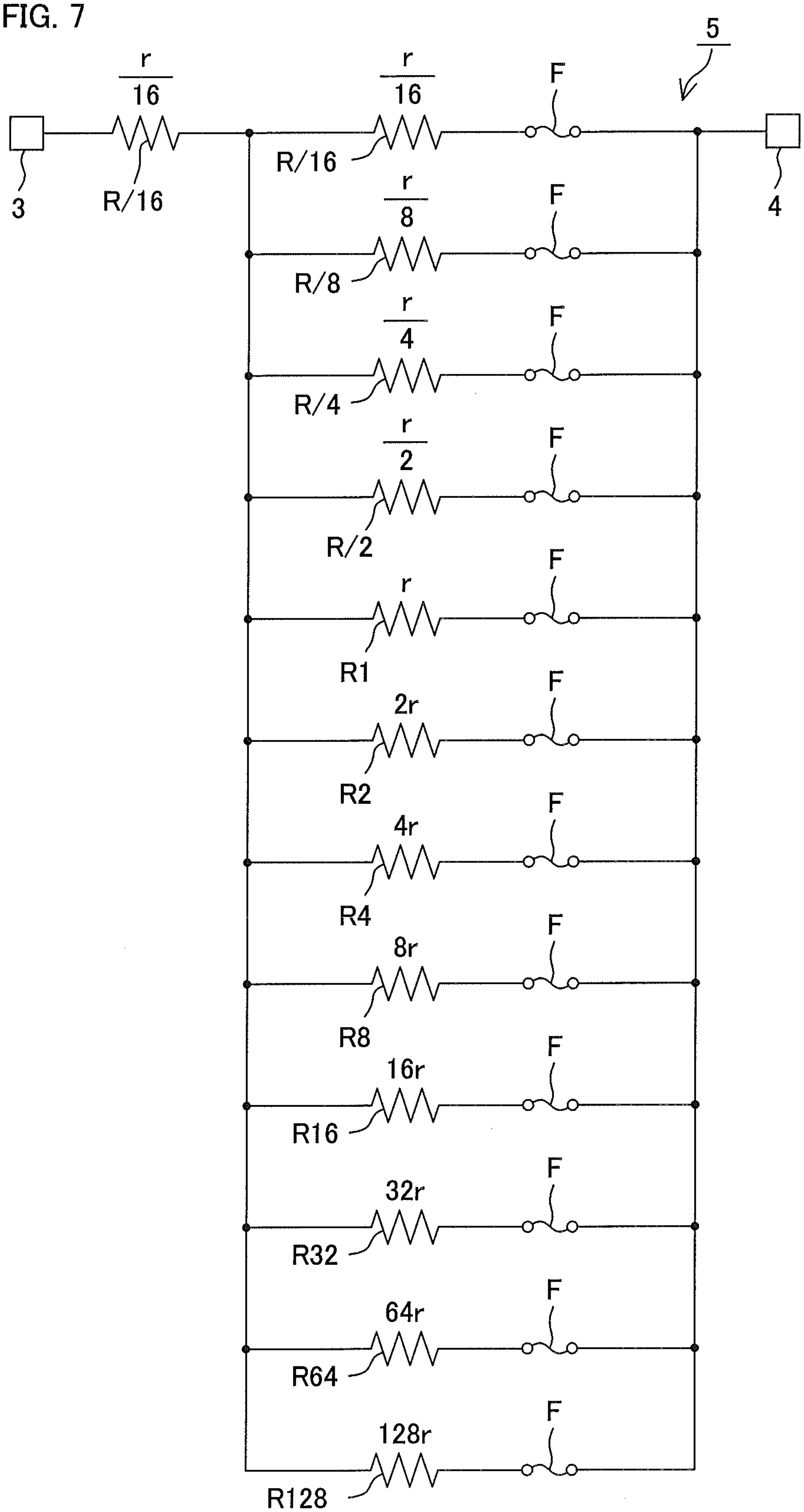
FIG. 7 is an electric circuit diagram of a device according to another embodiment of the present invention.

FIG. 7 is an electric circuit diagram of a device according to another embodiment of the present invention. The device 5 may be configured as shown in FIG. 7, rather than by connecting the resistor units R64 to R/32 in series to the reference resistor unit R8 as described above. More specifically, the device 5 may include a resistor circuit network configured such that a parallel connection circuit including 12 types of resistor units R/16, R/8, R/4, R/2, R1, R2, R4, R8, R16, R32, R64, R128 is connected in series to a reference resistor unit R/16 between the first connection electrode 3 and the second connection electrode 4.

In this case, a fuse film F is connected in series to each of the 12 types of resistor units except the reference resistor unit R/16. With none of the fuse films F fused off, all the resistor units are electrically incorporated in the device 5. The fuse films F are selectively fused off, for example, by a laser beam according to the required resistance value. Thus, a resistor unit associated with a fused fuse film F (a resistor unit connected in series to the fused fuse film F) is electrically isolated from the device 5 to control the overall resistance value of the chip resistor 1.

Figure 8:
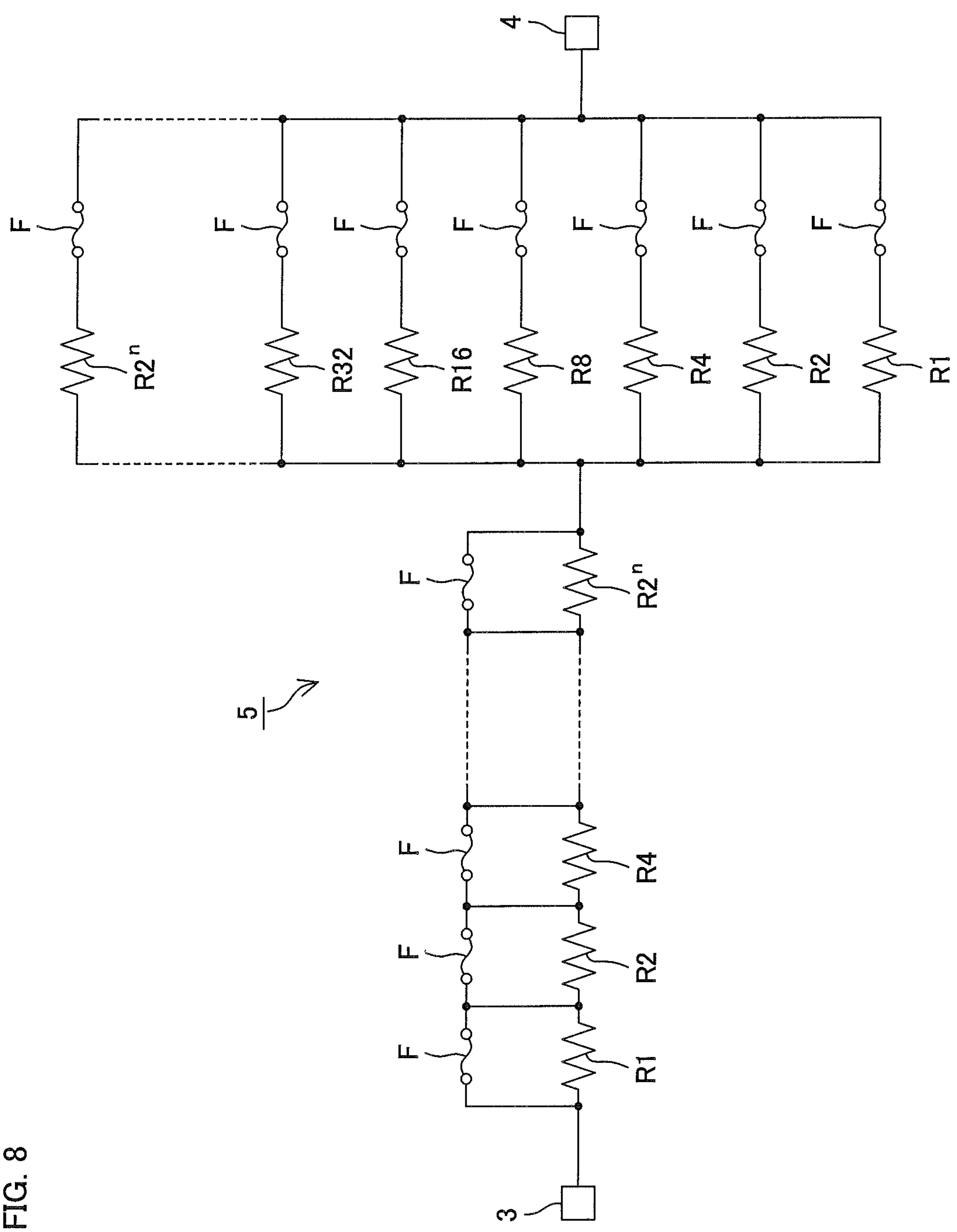
FIG. 8 is an electric circuit diagram of a device according to further another embodiment of the present invention.

FIG. 8 is an electric circuit diagram of a device according to further another embodiment of the present invention. The device 5 shown in FIG. 8 has a characteristic circuit configuration such that a serial connection circuit including plural types of resistor units is connected in series to a parallel connection circuit including plural types of resistor units. As in the preceding embodiment, a fuse film F is connected in parallel to each of the plural types of resistor units connected in series, and all the plural types of resistor units connected in series are short-circuited by the fuse films F. With a fuse film F fused off, therefore, a resistor unit which has been short-circuited by that fuse film F is electrically incorporated in the device 5.

On the other hand, a fuse film F is connected in series to each of the plural types of resistor units connected in parallel. With the fuse film F fused off, therefore, a resistor unit which has been connected in series to that fuse film F is electrically isolated from the parallel connection circuit of the resistor units. With this arrangement, a resistance of smaller than 1 kΩ may be formed in the parallel connection circuit, and a resistor circuit of 1 kΩ or greater may be formed in the serial connection circuit. Thus, a resistor circuit network having a resistance value extensively ranging from a smaller resistance value on the order of several ohms to a greater resistance value on the order of several megaohms can be produced from resistor circuits designed based on the same basic design concept.

Figure 9:
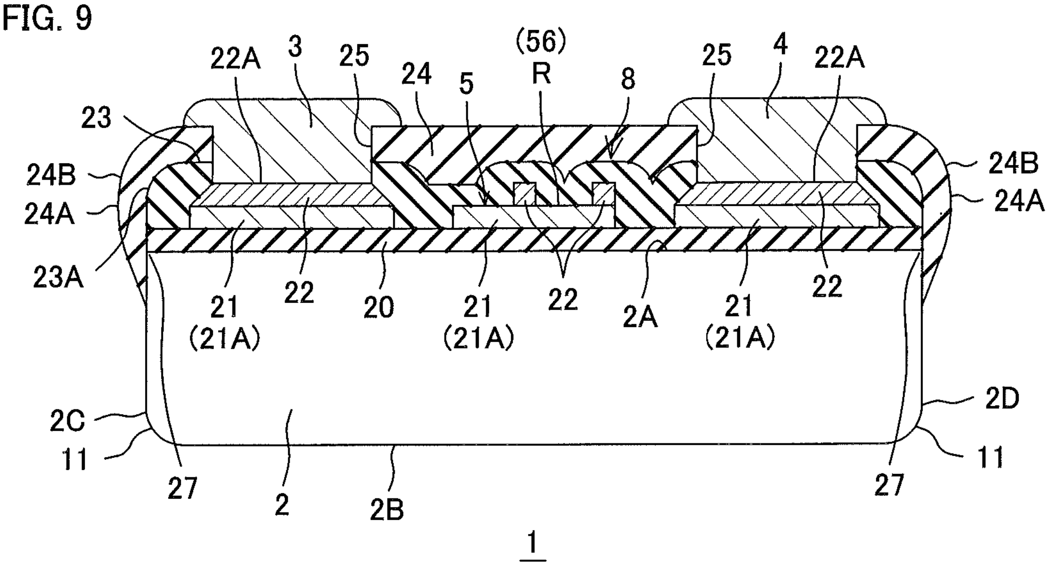
FIG. 9 is a schematic sectional view of the chip resistor.

In the chip resistor 1, as described above, the connection of the plurality of resistor bodies R (resistor units) can be changed in the trimming region X. FIG. 9 is a schematic sectional view of the chip resistor. Referring next to FIG. 9, the chip resistor 1 will be described in greater detail. In FIG. 9, the device 5 described above is simplified, and components other than the board 2 are hatched for convenience of description.

The insulative film 23 and the resin film 24 will be described. The insulative film 23 is made of, for example, SiN (silicon nitride), and has a thickness of 1000 Å to 5000 Å (here, about 3000 Å). The insulative film 23 is provided over the entire device formation surface 2A to cover the resistive film 21 and the interconnection film portions 22 on the resistive film 21 (i.e., the device 5) from the front side (from the upper side in FIG. 9) and to cover upper surfaces of the resistor bodies R of the device 5. Thus, the insulative film 23 also covers the interconnection film portion 22 in the trimming region X described above (see FIG. 5(*b*)). The insulative film 23 contacts the device 5 (the interconnection film 22 and the resistive film 21), and contacts the insulative layer 20 in a region not formed with the resistive film 21. Thus, the insulative film 23 covers the entire device formation surface 2A to function as a protective film for protecting the device 5 and the insulative layer 20.

Further, the insulative film 23 prevents an unintended short circuit which may be a short circuit other than that occurring between the interconnection film portions 22 present between the resistor bodies R (an unintended short circuit which may occur between adjacent resistive film lines 21A). A surface of an edge portion 23A of the insulative film 23 located along the edges of the device formation surface 2A is curved to be bulged laterally (outward of the chip resistor 1 (board 2) in directions parallel to the device formation surface 2A).

Though not shown, the insulative film 23 may protrude from the device formation surface 2A to cover boundary portions of the side surfaces 2C to 2F with respect to the device formation surface 2A and to cover portions of the insulative layer 20 exposed on the side surfaces 2C to 2F. Together with the insulative film 23, the resin film 24 protects the device formation surface 2A of the chip resistor 1, and is made of a resin such as a polyimide. The resin film 24 has a thickness of about 5 μm. The resin film 24 covers the entire surface of the insulative film 23 (including the resistive film 21 and the interconnection film portions 22 covered with the insulative film 23), and covers the boundary portions (upper edge portions in FIG. 9) of the side surfaces 2C to 2F with respect to the device formation surface 2A and the portions of the insulative layer 20 exposed on the side surfaces 2C to 2F. Therefore, portions of the four side surfaces 2C to 2F opposite from the device formation surface 2A (on the lower side in FIG. 9) are exposed to the outside on the outer surface of the chip resistor 1.

Thus, the insulative film 23 covers the resistive film 21 (thin film resistor bodies R) and the interconnection film portions 22, while the resin film 24 covers the surface of the insulative film 23. Therefore, the thin film resistor bodies R and the interconnection film portions 22 (device formation surface 2A) can be double-protected with the insulative film 23 and the resin film 24. The insulative film 23 and the resin film 24 prevent foreign matter from adhering to the thin film resistor bodies R and the interconnection film portions 22, thereby preventing the short-circuits of the thin film resistor bodies R and the interconnection film portions 22.

Portions of the resin film 24 extending along the four side surfaces 2C to 2F as seen in plan are bulged laterally (outward) of the board 2 from the side surfaces to define arcuately bulged portions 24A. That is, the resin film 24 (bulged portions 24A) protrudes from the (corresponding) side surfaces 2C to 2F. Thus, the resin film 24 has rounded side surfaces 24B bulged laterally on the arcuately bulged portions 24A.

In intersection portions 27 defined along boundaries between the device formation surface 2A and the side surfaces 2C to 2F, the device formation surface 2A intersects the side surfaces 2C to 2F. The intersection portions 27 each have an angled shape rather than the rounded shape (the rounded shape of the intersection portions 11). Therefore, the intersection portions 27 are covered with the bulged portions 24A. In this case, the chipping of the intersection portions 27 can be prevented by the resin film 24. Further, the bulged portions 24A are bulged outward of the side surfaces 2C to 2F (outward of the board 2 in directions parallel to the device formation surface 2A) on the intersection portions 27. Therefore, when the chip resistor 1 is brought into contact with the surroundings, the bulged portions 24A first meet the surroundings to reduce an impact occurring due to the contact. This prevents the impact from influencing the device 5 and the like. Particularly, the side surfaces 24B of the bulged portions 24A each have a rounded shape, so that the impact occurring due to the contact can be smoothly reduced.

Further, the resin film 24 is disposed on portions of the side surfaces 2C to 2F adjacent to the intersection portions 27 (apart from the back surface 2B toward the device formation surface 2A). However, the resin film 24 may be completely absent from the side surfaces 2C to 2F (the side surfaces 2C to 2F may be entirely exposed). The resin film 24 has two openings 25 respectively formed at two positions spaced from each other as seen in plan. The openings 25 are through-holes extending continuously thicknesswise through the resin film 24 and the insulative film 23. Therefore, not only the resin film 24 but also the insulative film 23 has the openings 25. The interconnection film portions 22 are partly exposed from the respective openings 25. The parts of the interconnection film portions 22 exposed from the respective openings 25 serve as pad regions 22A for the external connection.

One of the two openings 25 is completely filled with the first connection electrode 3, and the other opening 25 is completely filled with the second connection electrode 4. The first connection electrode 3 and the second connection electrode 4 partly protrude from the respective openings 25 above the surface of the resin film 24. The first connection electrode 3 is electrically connected to the pad region 22A of the interconnection film portion 22 present in the one opening 25 through the one opening 25. The second connection electrode 4 is electrically connected to the pad region 22A of the interconnection film portion 22 present in the other opening 25 through the other opening 25. Thus, the first connection electrode 3 and the second connection electrode 4 are electrically connected to the device 5. Here, the interconnection film portions 22 serve as interconnections connected to the assembly of the resistor bodies R (resistor portion 56), the first connection electrode 3 and the second connection electrode 4.

Thus, the resin film 24 and the insulative film 23 formed with the openings 25 cover the device formation surface 2A with the first connection electrode 3 and the second connection electrode 4 being exposed from the respective openings 25. Therefore, the electrical connection between the chip resistor 1 and the circuit board 9 is achieved through the first connection electrode 3 and the second connection electrode 4 partly protruding from the surface of the resin film 24 through the openings 25 (see FIG. 1(*b*)).

Figure 10A:
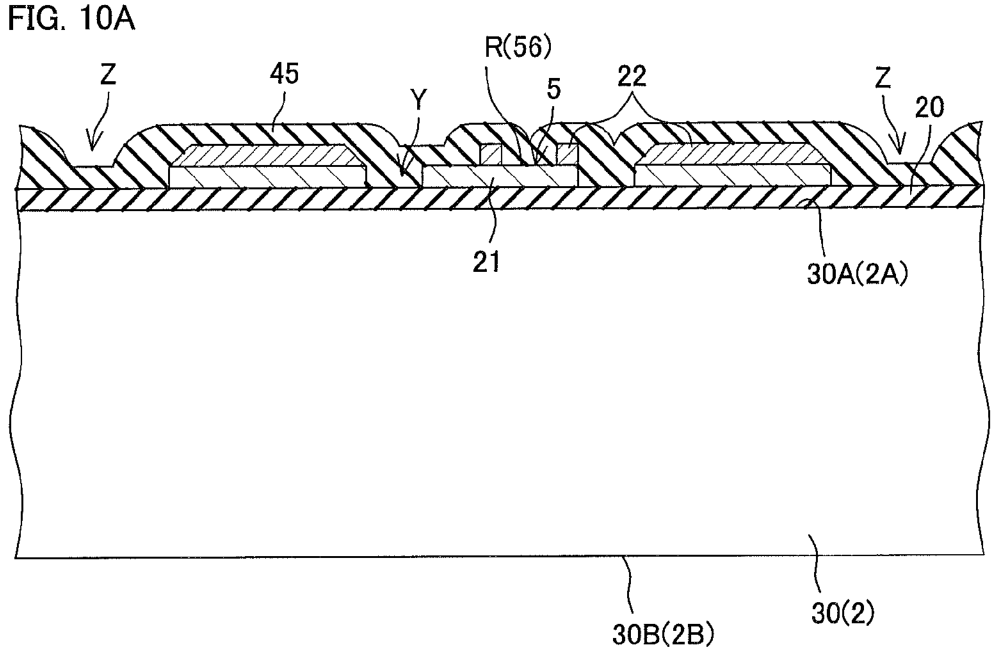
FIG. 10A is a schematic sectional view showing a production method for the chip resistor shown in FIG. 9.

FIGS. 10A to 10G are schematic sectional views showing a production method for the chip resistor shown in FIG. 9. First, as shown in FIG. 10A, a substrate 30 is prepared as a material for the board 2. In this case, a front surface 30A of the substrate 30 corresponds to the device formation surface 2A of the board 2, and a back surface 30B of the substrate 30 corresponds to the back surface 2B of the board 2.

Then, an insulative layer 20 of $SiO_2$ or the like is formed on the front surface 30A of the substrate 30, and devices 5 (each including resistor bodies R and interconnection film portions 22 connected to the resistor bodies R) are formed on the insulative layer 20. More specifically, a resistive film 21 of TiN or TiON is formed on the entire surface of the insulative layer 20 by sputtering, and then an interconnection film 22 of aluminum (Al) is formed on the resistive film 21. Thereafter, parts of the resistive film 21 and the interconnection film 22 are selectively removed by a photolithography process and then, for example, by dry etching. Thus, as shown in FIG. 3A, resistive film lines 21A each formed with the resistive film 21 and having a predetermined width are arranged at a predetermined interval in a column direction as seen in plan. At this time, the resistive film lines 21A and the interconnection film portions 22 are partly cut, and fuse films F and connection conductor films C are formed in trimming regions X described above (see FIG. 2). In turn, parts of the interconnection film portions 22 provided on the respective resistive film lines 21A are selectively removed. As a result, the devices 5 are produced, which are each configured such that interconnection film portions 22 spaced a predetermined distance R from one another are provided on the resistive film lines 21A.

Referring to FIG. 10A, a multiplicity of such devices 5 are formed on the front surface 30A of the substrate 30 according to the number of the chip resistors 1 to be formed on the single substrate 30. Regions of the substrate 30 respectively formed with the devices 5 (the aforementioned resistor portions 56) are each herein referred to as a chip resistor region Y. Accordingly, a plurality of chip resistor regions Y (devices 5) each having the resistor portion 56 are defined on the front surface 30A of the substrate 30. A region of the front surface 30A of the substrate 30 defined between adjacent chip resistor regions Y is herein referred to as a boundary region Z.

Then, as shown in FIG. 10A, an insulative film (CVD insulative film) 45 of SiN is formed over the entire front surface 30A of the substrate 30 by a CVD (Chemical Vapor Deposition) method. The CVD insulative film 45 thus formed has a thickness of 1000 Å to 5000 Å (here, about 3000 Å). The CVD insulative film 45 entirely covers the insulative layer 20 and the devices 5 (the resistive film 21 and the interconnection film 22) present on the insulative layer 20, and contacts the insulative layer 20 and the devices 5. Therefore, the CVD insulative film 45 also covers interconnection film portions 22 in the aforementioned trimming regions X (see FIG. 2). Since the CVD insulative film 45 is formed over the entire front surface 30A of the substrate 30, the CVD insulative film 45 extends to a region other than the trimming regions X on the front surface 30A. Thus, the CVD insulative film 45 serves as a protective film for protecting the entire front surface 30A (including the devices 5 on the front surface 30A).

Figure 10B:
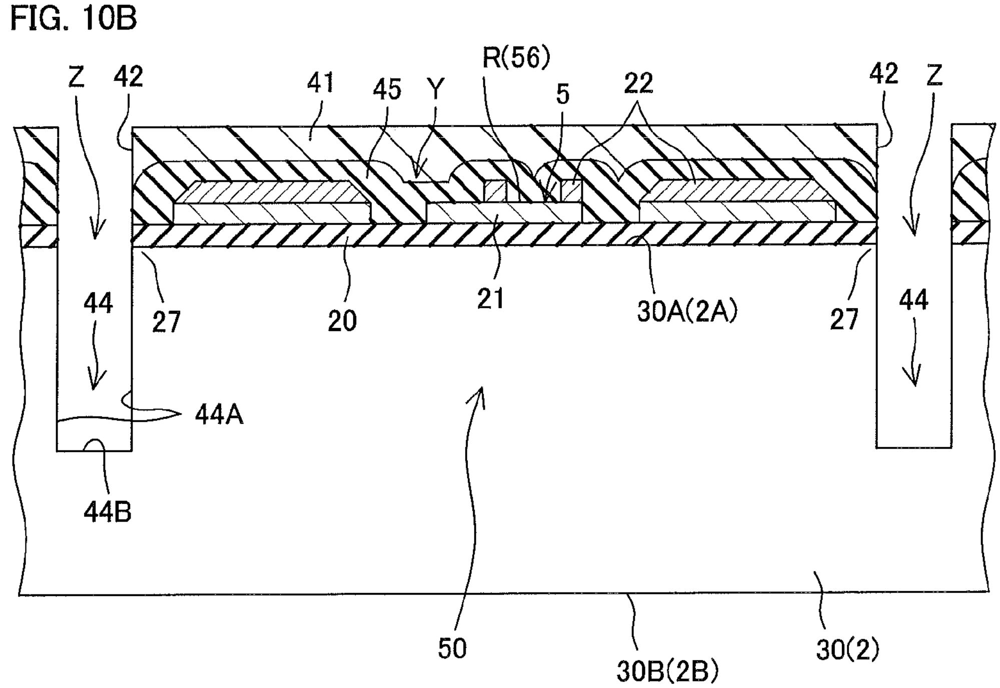
FIG. 10B is a schematic sectional view showing a process step subsequent to that shown in FIG. 10A.
Figure 11:
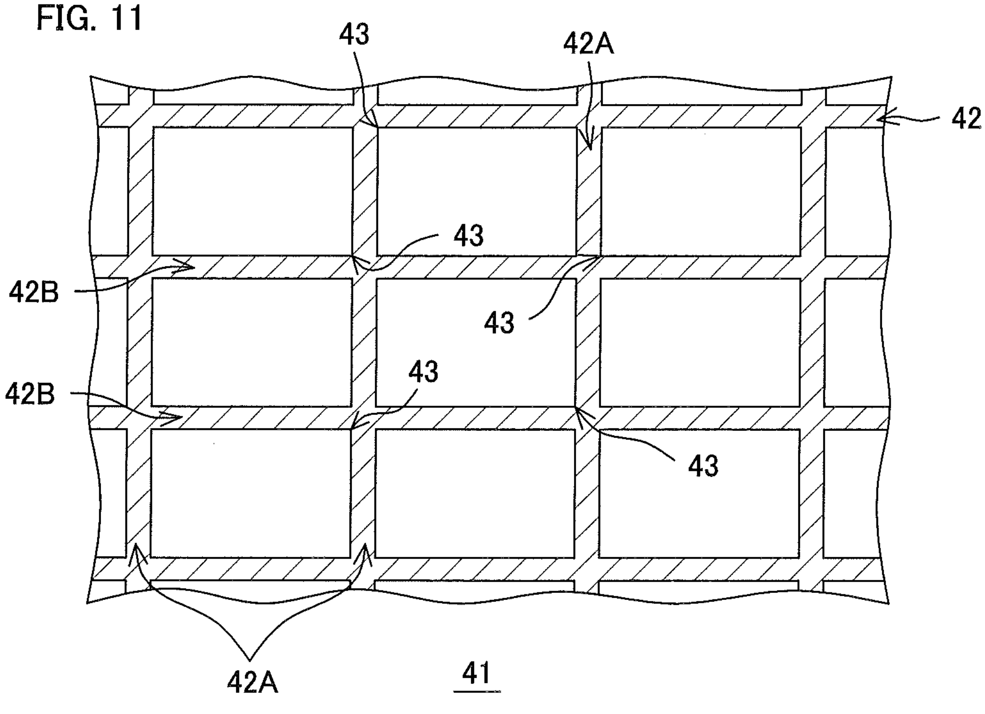
FIG. 11 is a schematic plan view showing a part of a resist pattern to be used for forming a trench in the step of FIG. 10B.

In turn, as shown in FIG. 10B, a resist pattern 41 is formed over the entire front surface 30A of the substrate 30 to entirely cover the CVD insulative film 45. The resist pattern 41 has an opening 42. FIG. 11 is a schematic plan view showing a part of the resist pattern to be used for forming a trench in the process step of FIG. 10B.

Referring to FIG. 11, the opening 42 (hatched in FIG. 11) of the resist pattern 41 is aligned with a region (i.e., the boundary region Z) defined between the contours of adjacent chip resistors 1 (i.e., the chip resistor regions Y described above) as seen in plan when the chip resistors 1 are arranged in a matrix array (or in a lattice form). As a whole, the opening 42 has a lattice shape including linear portions 42A and linear portions 42B orthogonally crossing each other.

The linear portions 42A and the linear portions 42B of the opening 42 of the resist pattern 41 are connected to each other as crossing orthogonally to each other (without any curvature). Therefore, the linear portions 42A and the linear portions 42B interest each other at an angle of about 90 degrees as seen in plan to form angled intersection portions 43. Referring to FIG. 10B, parts of the CVD insulative film 45, the insulative layer 20 and the substrate 30 are selectively removed by plasma etching with the use of the resist pattern 41 as a mask. Thus, a portion of the substrate 30 is removed from the boundary region Z defined between the adjacent devices 5 (chip resistor regions Y). As a result, a trench 44 is formed in the position (boundary region Z) aligned with the opening 42 of the resist pattern 41 as seen in plan as extending through the CVD insulative film 45 and the insulative layer 20 into the substrate 30 to a depth halfway the thickness of the substrate 30. The trench 44 has side surfaces 44A opposed to each other and a bottom surface 44B extending between lower edges of the opposed side surfaces 44A (edges of the opposed side surfaces 44A on the side of the back surface 30B of the substrate 30). The trench 44 has a depth of about 100 μm as measured from the front surface 30A of the substrate 30, and a width of about 20 μm (as measured between the opposed side surfaces 44A).

Figure 12:
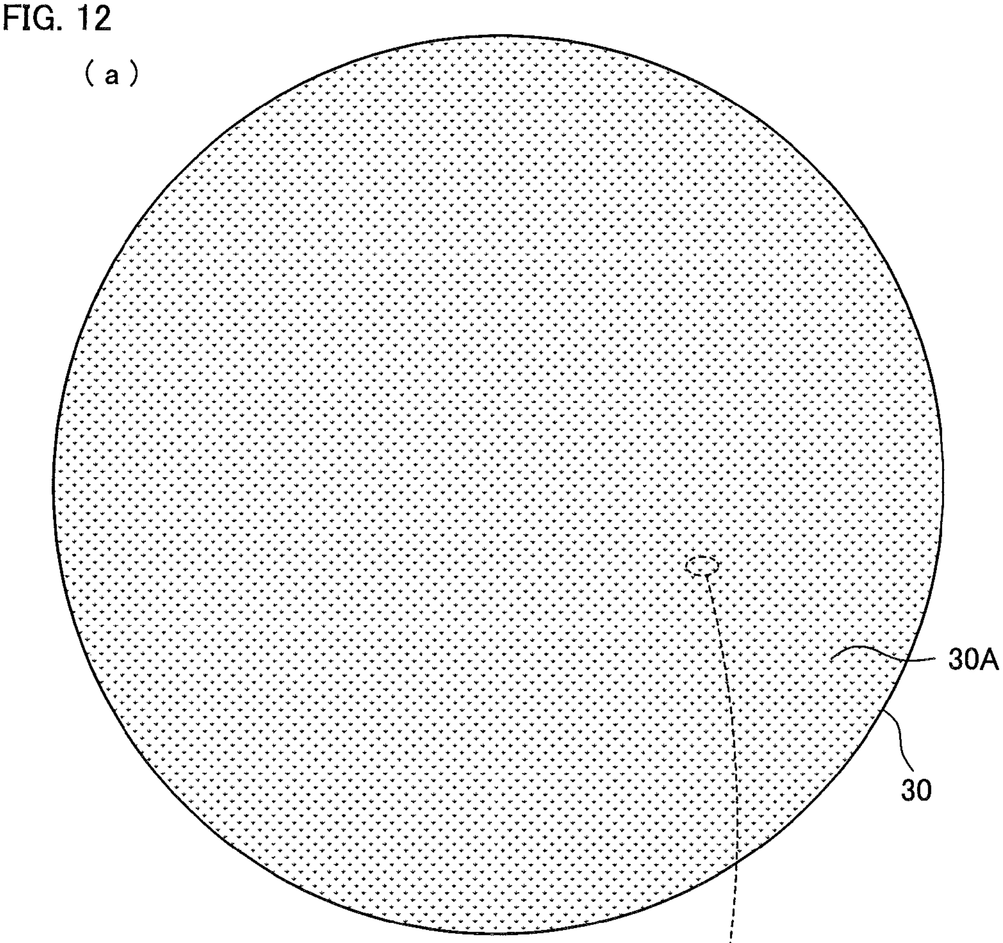
FIG. 12(*a*) is a schematic plan view of a substrate formed with the trench in the step of FIG. 10B, and FIG. 12(*b*) is an enlarged view showing a part of the substrate shown in FIG. 12(*a*).
Figure 12:
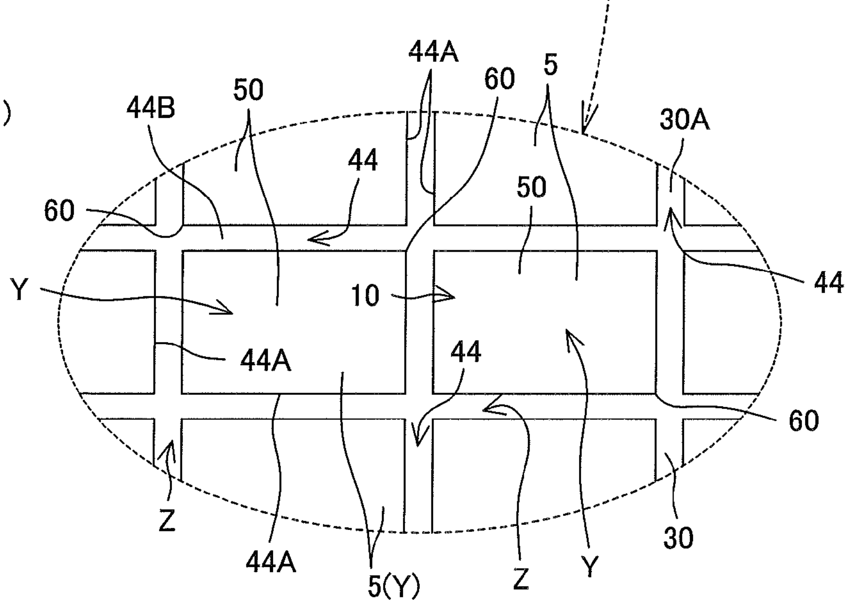

FIG. 12(*a*) is a schematic plan view of the substrate formed with the trench in the process step of FIG. 10B, and FIG. 12(*b*) is an enlarged view showing a part of the substrate shown in FIG. 12(*a*). Referring to FIG. 12(*b*), the trench 44 has a lattice shape as a whole corresponding to the shape of the opening 42 (see FIG. 11) of the resist pattern 41 as seen in plan. On the front surface 30A of the substrate 30, rectangular frame-like portions of the trench 44 (boundary region Z) respectively surround the chip resistor regions Y in which the devices 5 are respectively provided. Portions of the substrate 30 respectively formed with the devices 5 are semi-finished products 50 of the chip resistors 1. The semi-finished products 50 are respectively located in the chip resistor regions Y surrounded by the trench 44 provided in the front surface 30A of the substrate 30. These semi-finished products 50 are arranged in a matrix array.

Figure 10C:
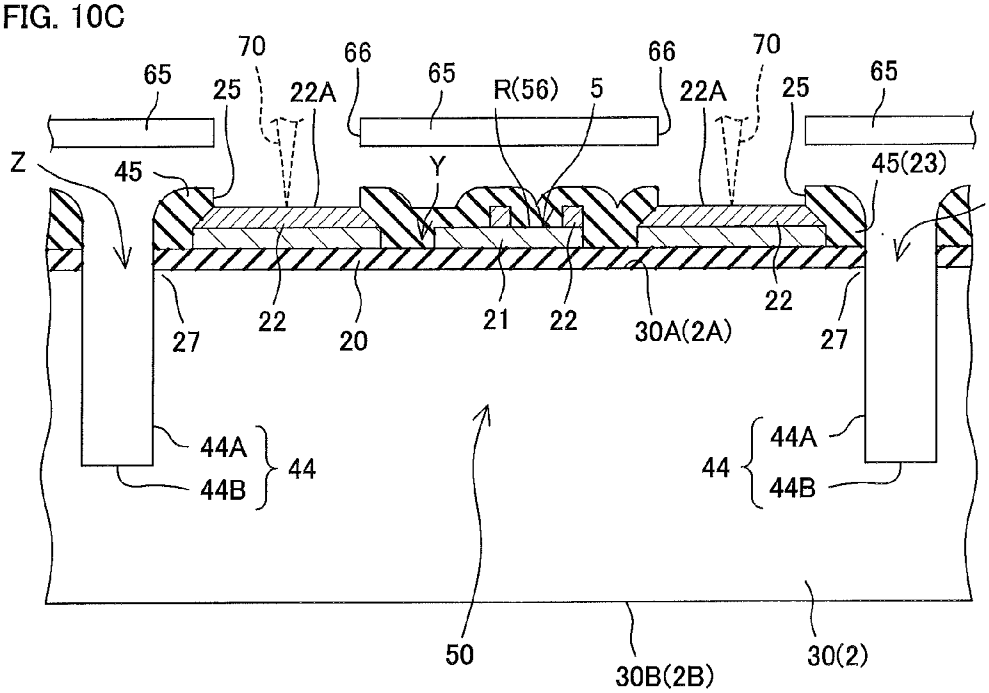
FIG. 10C is a schematic sectional view showing a process step subsequent to that shown in FIG. 10B.

Corner portions 60 of the semi-finished products 50 (corresponding to the intersection portions 11 of the chip resistor 1) are generally right-angled, as seen in plan, as corresponding to the angled intersection portions 43 (see FIG. 11) of the opening 42 of the resist pattern 41. After the trench 44 is formed as shown in FIG. 10B, the resist pattern 41 is removed, and the CVD insulative film 45 is selectively etched off with the use of a mask 65 as shown in FIG. 10C. The mask 65 has openings 66 formed in association with portions of the CVD insulative film 45 aligned with the pad regions 22A (see FIG. 9) as seen in plan. Thus, portions of the CVD insulative film 45 aligned with the openings 66 are etched off, whereby openings 25 are formed in these portions of the CVD insulative film 45. Thus, the pad regions 22A are exposed from the CVD insulative film 45 in the openings 25. The semi-finished products 50 each have two openings 25.

Figure 13A:
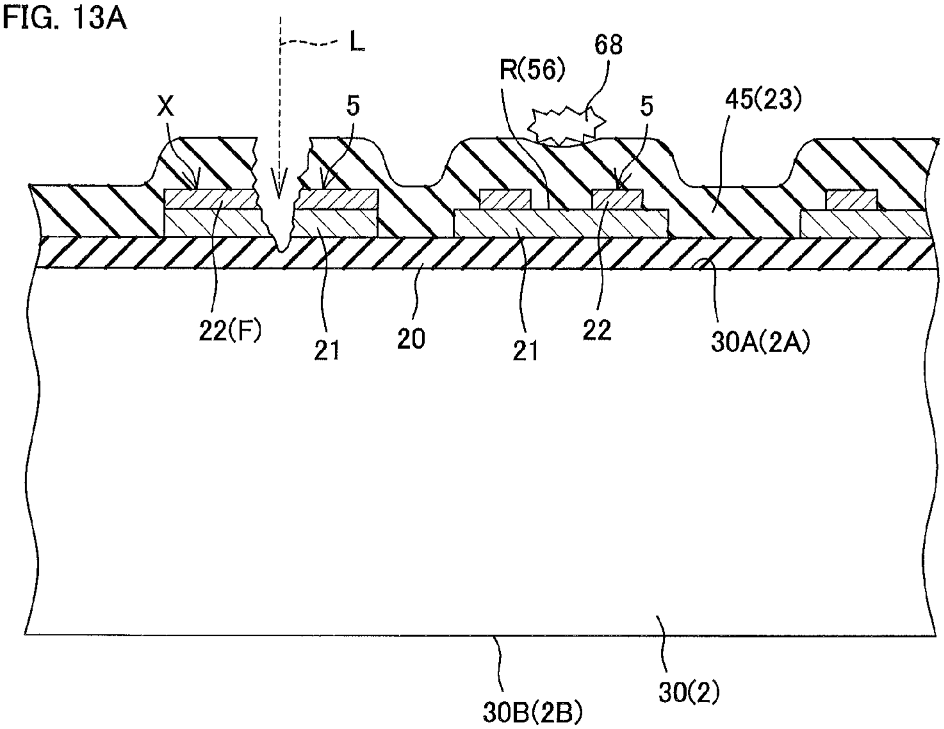
FIG. 13A is a schematic sectional view showing a state of the chip resistor of the inventive embodiment under production.
Figure 13B:
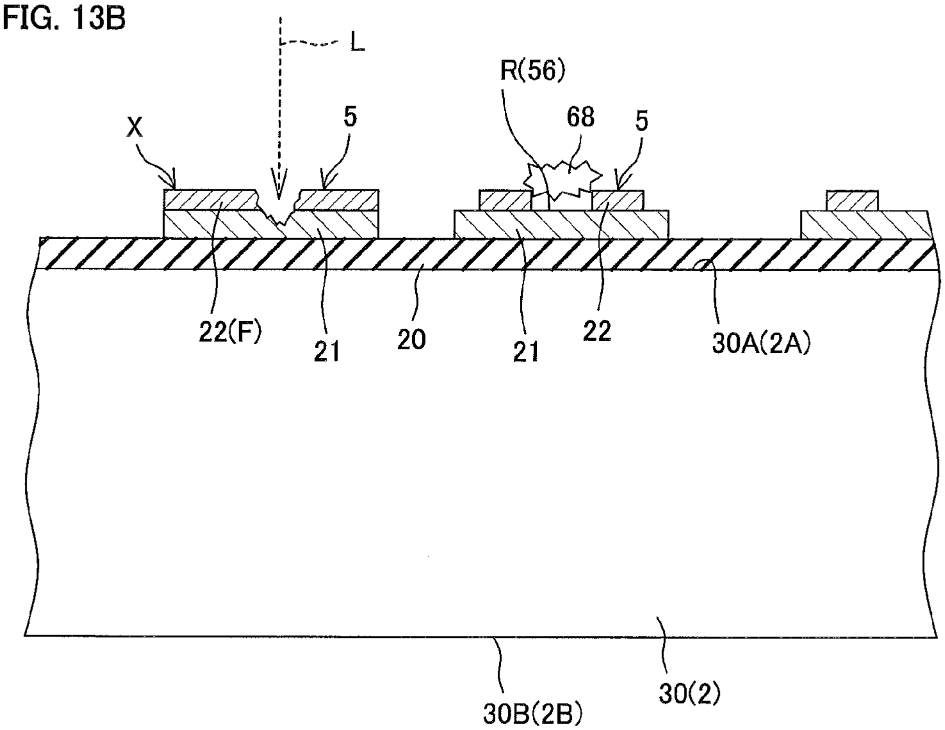
FIG. 13B is a schematic sectional view showing a state of a chip resistor of a comparative example under production.

FIG. 13A is a schematic sectional view showing a state of the chip resistor of the inventive embodiment under production. FIG. 13B is a schematic sectional view showing a state of a chip resistor of a comparative example under production. After the two openings 25 are formed in the CVD insulative film 45 of each of the semi-finished products 50 as shown in FIG. 10C, probes 70 of a resistance measuring device (not shown) are brought into contact with the pad regions 22A in the respective openings 25 to detect the overall resistance value of the device 5. Subsequently, a laser beam L is applied to desired ones of the fuse films F through the CVD insulative film 45 as shown in FIG. 13A, whereby the desired fuse films F of the interconnection film portion 22 in the trimming region X described above are trimmed by the laser beam L to be fused off. The fuse films F thus fused off are parts of the interconnection film portion 22 trimmed (fused off) in the trimming region X described above. Thus, the overall resistance value of the semi-finished product 50 (i.e., the chip resistor 1) can be controlled, as described above, by selectively fusing off (trimming) the fuse films F for the required resistance value.

In this embodiment, the laser beam L has a power (energy) of 1.2 μJ to 2.7 μJ, and a spot diameter of 3 μm to 5 μm. When the laser beam L passes through the CVD insulative film 45, a portion of the CVD insulative film 45 through which the laser beam L passes is removed. In regions where the parts of the interconnection film portion 22 are fused off, the resistive film 21 is also fused off, and the insulative layer 20 is partly removed together with the fused parts of the interconnection film portion 22.

As described above, the interconnection film 22 partly serving as the fuse films F is entirely covered with the CVD insulative film 45. Therefore, the laser beam L to be applied to the interconnection film portion 22 in the trimming region X passes through the CVD insulative film 45 and reaches the interconnection film portion 22 (fuse film F) in the trimming region X. Thus, the energy of the laser beam L is easily and effectively concentrated on (accumulated in) the fuse film F, so that the fuse film F can be reliably and speedily fused off by the laser beam L (by a laser trimming process). Since the CVD insulative film 45 contacts the interconnection film 22, the interconnection film 22 is reliably covered with the CVD insulative film 45. Thus, the energy of the laser beam L can be effectively intensively applied to the desired parts of the interconnection film portion 22, allowing for reliable and effective trimming of the interconnection film portion 22.

Since the interconnection film 22 is covered with the CVD insulative film 45, there is no possibility that a debris (foreign matter 68) occurring during the laser trimming process contacts the interconnection film 22 (device 5) to cause a short circuit. That is, a short circuit attributable to the trimming can be prevented. Thus, the fusibility of the fuse films F (i.e., in the trimming of the fuse films F (interconnection film portion 22)) is improved, thereby improving the yield and hence the productivity of the chip resistor 1.

Here, the formation of the CVD insulative film 45 is achieved by the CVD process, so that the quality of the CVD insulative film 45 (particularly, a portion of the CVD insulative film 45 in the entire trimming region X) can be stabilized as compared with a case in which the formation of the CVD insulative film 45 is achieved by applying a paste of the same material as for the CVD insulative film 45 over the interconnection film 22. Thus, the interconnection film 22 can be entirely covered with the CVD insulative film 45. Therefore, any desired parts of the interconnection film portion 22 in the trimming region X can be reliably trimmed. That is, the use of the CVD insulative film 45 reliably improves the fusibility of the fuse films F and hence the yield.

The CVD insulative film 45 desirably has a thickness of 1000 Å to 5000 Å as described above. In this case, the energy of the laser beam can be effectively intensively applied onto the desired part of the interconnection film portion 22, allowing for reliable and effective trimming of the interconnection film portion 22. If the thickness of the CVD insulative film 45 is smaller than 1000 Å, the effect of efficiently and intensively applying the energy of the laser beam L onto the fuse film F is reduced. If the thickness of the CVD insulative film 45 is greater than 5000 Å, it is difficult to partly remove the CVD insulative film 45 by the laser beam L and hence to fuse (trim) the fuse film F.

The deposition temperature of SiN for the CVD insulative film 45 in the CVD process is lower than the melting point of Al or the AlCu alloy of the interconnection film 22, so that the CVD insulative film 45 can be formed over the interconnection film 22 without melting the interconnection film 22. If the CVD insulative film 45 was made of $SiO_2$ (silicon oxide), the interconnection film 22 would be melted during the formation of the CVD insulative film 45 of $SiO_2$ because the deposition temperature of $SiO_2$ is higher than the melting point of Al or the AlCu alloy. This would make it impossible to form the CVD insulative film 45 on the interconnection film 22.

In the comparative example, as shown in FIG. 13B, the interconnection film 22 is uncovered with the CVD insulative film 45 to be exposed unlike in the inventive embodiment. In this case, the energy of the laser beam L is not concentrated on (accumulated in) the fuse film F, but scattered around the fuse film 22. More specifically, the energy of the laser beam L is reflected on the surface of the interconnection film 22, scattered in the interconnection film 22, or absorbed by the resistive film 21 or the insulative layer 20. This makes it difficult to reliably fuse the fuse film F by the laser beam L, and increases the time required for fusing off the fuse film F. Further, the interconnection film 22 (device 5) is exposed, so that foreign matter 68 is liable to adhere to the device 5 to cause a short circuit in the device 5.

Figure 14:
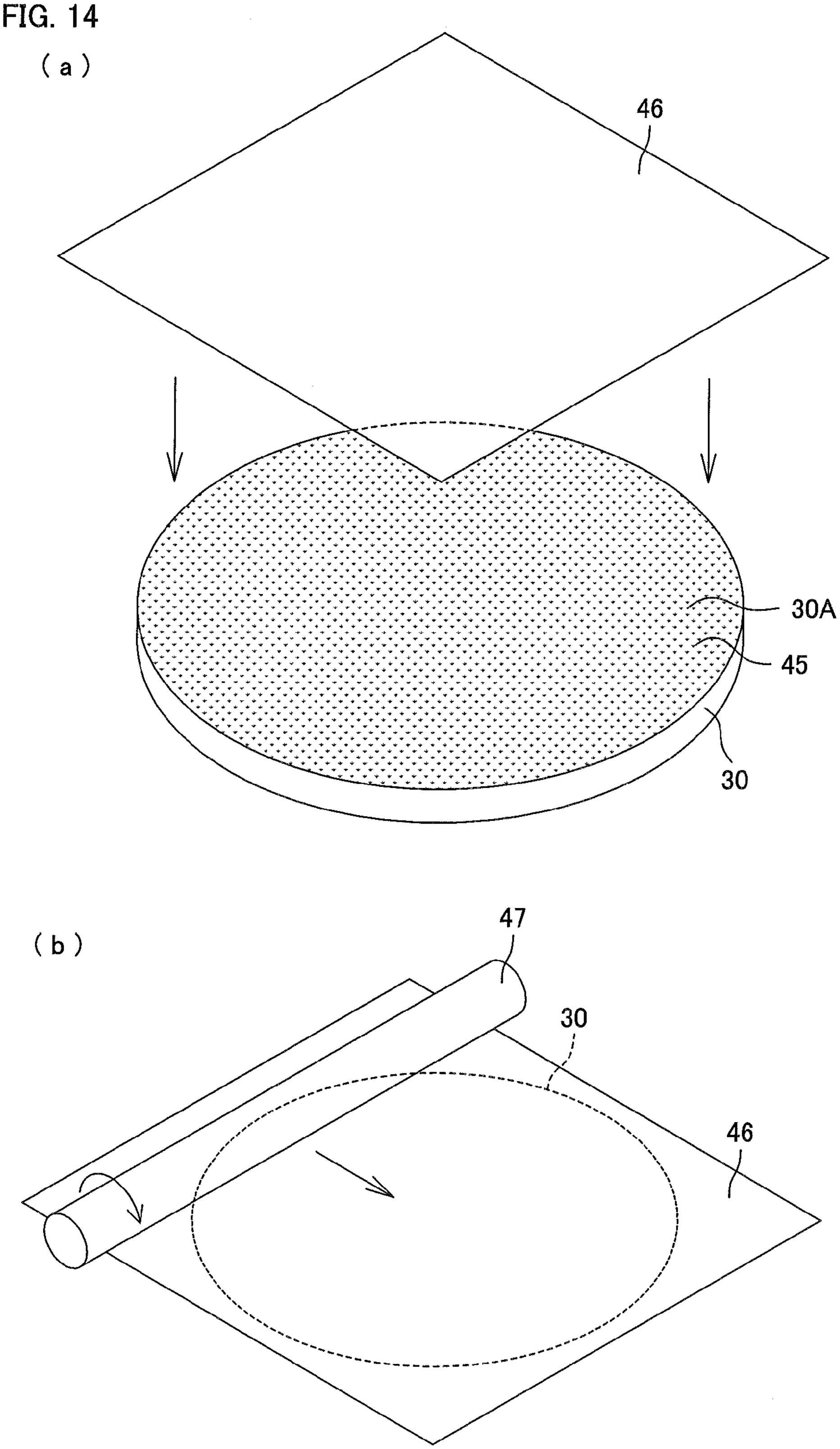
FIGS. 14(*a*) and 14(*b*) are schematic perspective views showing how to bond a polyimide sheet onto the substrate in the step of FIG. 10D.

After the overall resistance value of each of the semi-finished products 50 is adjusted as described above, as shown in FIG. 10D, a photosensitive resin sheet 46 of a polyimide is bonded to the substrate 30 from above the CVD insulative film 45. FIGS. 14(*a*) and 14(*b*) are schematic perspective views showing how to bond the polyimide sheet onto the substrate in the process step of FIG. 10D.

Figure 10D:
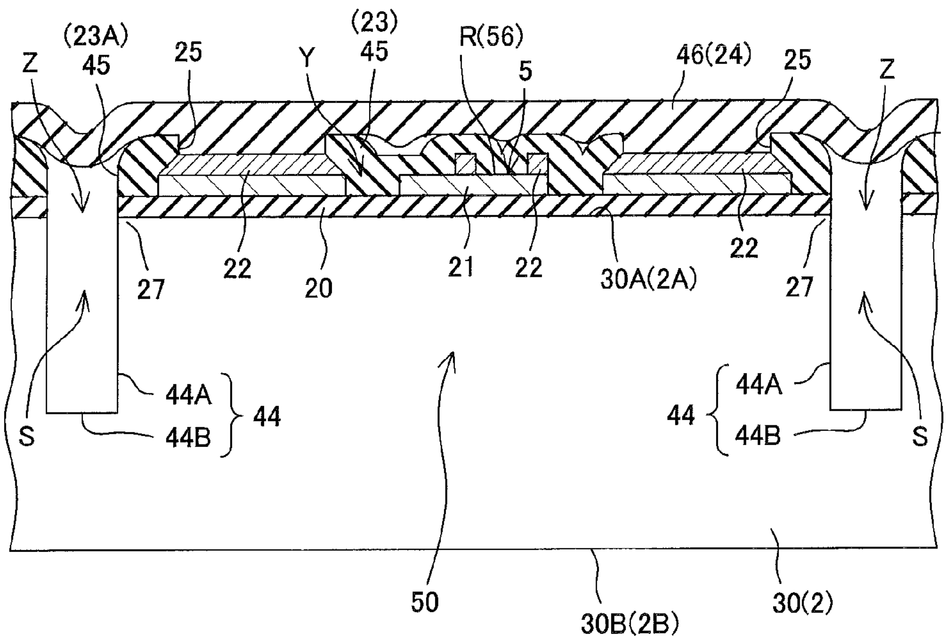
FIG. 10D is a schematic sectional view showing a process step subsequent to that shown in FIG. 10C.

More specifically, the polyimide sheet 46 is applied over the front surface 30A of the substrate 30 (more strictly, onto the CVD insulative film 45 on the substrate 30) as shown in FIG. 14(*a*), and then the sheet 46 is pressed against the substrate 30 by a rotating roller 47 as shown in FIG. 14(*b*). When the sheet 46 is bonded over the entire surface of the CVD insulative film 45, the sheet 46 partly enters the trench 44 as shown in FIG. 10D. However, the sheet 46 merely covers parts of the side surfaces 44A of the trench 44 on the side of the devices 5 (on the side of the front surface 30A), but does not reach the bottom surface 44B of the trench 44. Therefore, a space S having substantially the same size as the trench 44 is defined by the bottom surface 44B of the trench 44 and the sheet 46 in the trench 44. At this time, the sheet 46 has a thickness of 10 μm to 30 μm. Further, the sheet 46 partly enters the openings 25 of the CVD insulative film 45 to close the openings 25.

Figure 10E:
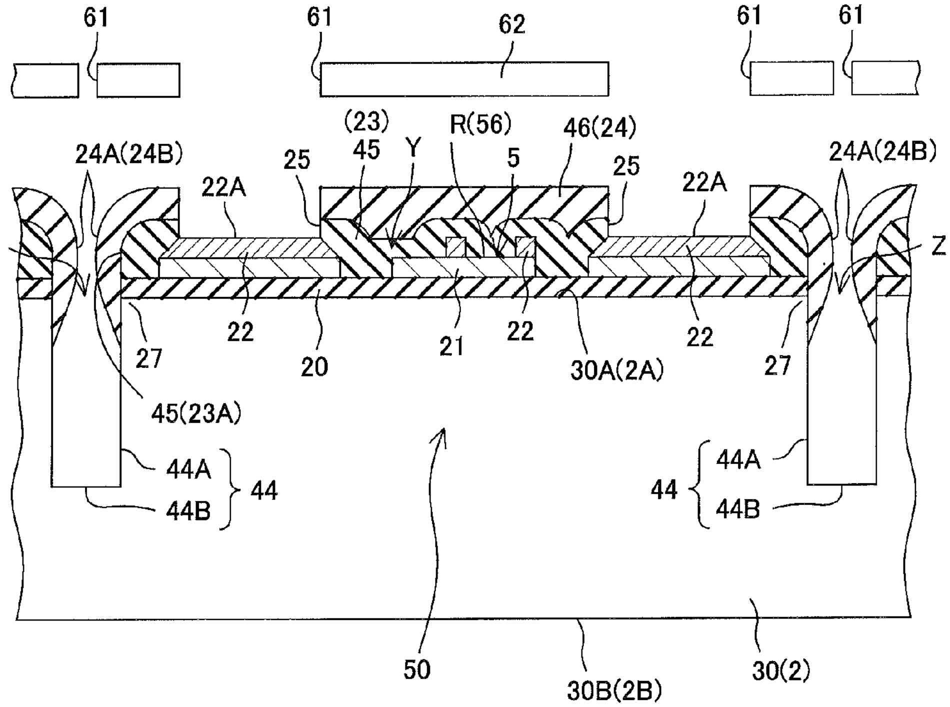
FIG. 10E is a schematic sectional view showing a process step subsequent to that shown in FIG. 10D.

Then, the sheet 46 is thermally treated. Thus, the sheet 46 is thermally shrunk to a thickness of about 5 μm. In turn, as shown in FIG. 10E, parts of the sheet 46 aligned with the trench 44 and the pad regions 22A of the interconnection film 22 (openings 25) are selectively removed by patterning the sheet 46. More specifically, the sheet 46 is exposed to light with the use of a mask 62 of a pattern having openings 61 corresponding to (aligned with) the trench 44 and the pad regions 22A as seen in plan, and then developed into the pattern. Thus, the parts of the sheet 46 are removed above the trench 44 and the pad regions 22A, and edge portions of the sheet 46 around the removed portions above the trench 44 droop into the trench 44 to overlie the side surfaces 44A of the trench 44. Therefore, the edge portions of the sheet 46 naturally form the bulged portions 24A (each having the rounded side surface 24B). Thus, the intersection portions 27 described above are covered with the sheet 46 by the formation of the bulged portions 24A.

Figure 10F:
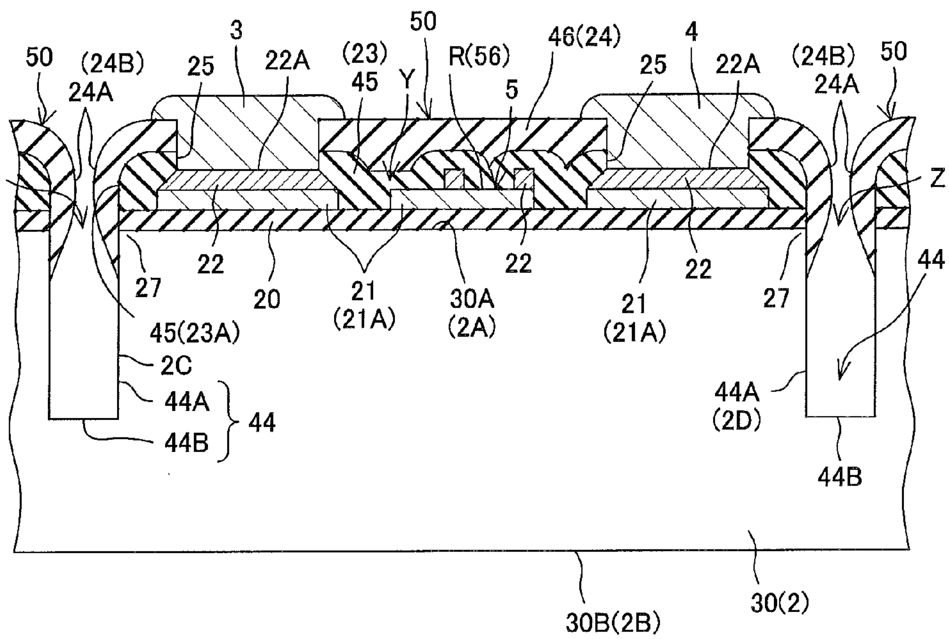
FIG. 10F is a schematic sectional view showing a process step subsequent to that shown in FIG. 10E.

At this time, the parts of the sheet 46 entering the openings 25 of the CVD insulative film 45 are also removed, so that the openings 25 are uncovered. In turn, Ni/Pd/Au multilayer films are formed in the openings 25 on the pad regions 22A by depositing Ni, Pd and Au by electroless plating. At this time, the Ni/Pd/Au multilayer films project from the openings 25 above the surface of the sheet 46. Thus, the Ni/Pd/Au multilayer films formed in the openings 25 serve as the first and second connection electrodes 3, 4 as shown in FIG. 10F.

Figure 10G:
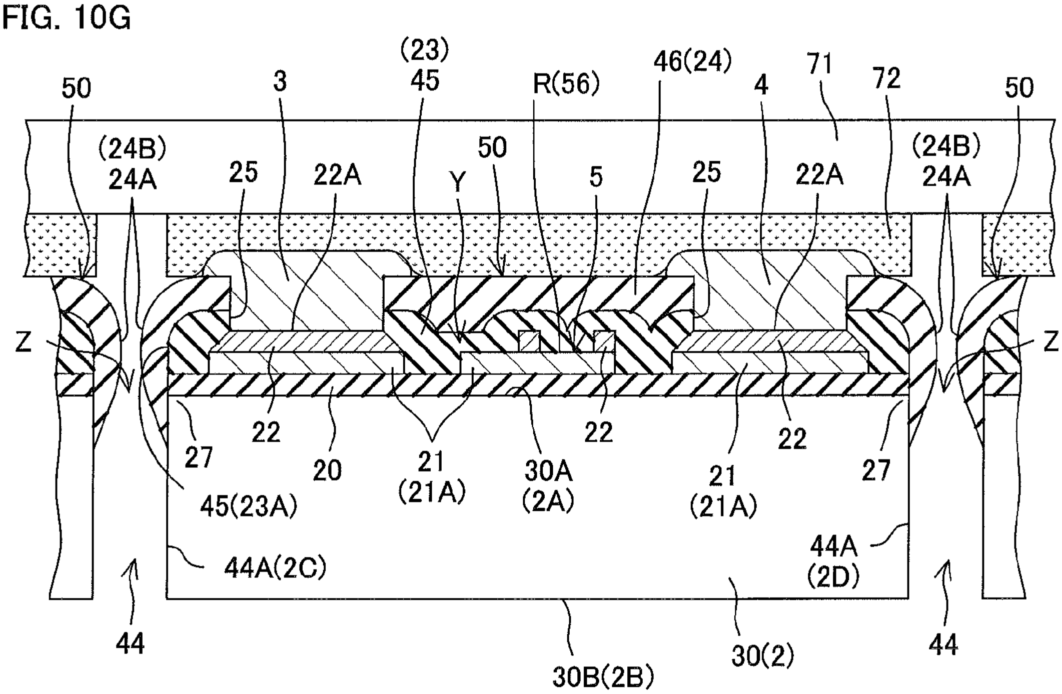
FIG. 10G is a schematic sectional view showing a process step subsequent to that shown in FIG. 10F.

After a continuity test is performed between the first connection electrode 3 and the second connection electrode 4 of each of the semi-finished products 50, the substrate 30 is ground from the back surface 30B. More specifically, as shown in FIG. 10G, a thin-plate support base 71 of PET (polyethylene terephthalate) is bonded to the semi-finished products 50 on the side of the first and second connection electrodes 3, 4 (i.e., on the side of the device formation surface 2A) with an adhesive agent 72 after the formation of the trench 44. Thus, the semi-finished products 50 are supported by the support base 71. Here, a laminate sheet, for example, may be used as the combination of the support base 71 and the adhesive agent 72.

With the semi-finished products 50 supported by the support base 71, the substrate 30 is ground from the back surface 30B. After the substrate 30 is thinned to the bottom surface 44B of the trench 44 (see FIG. 10F) by the grinding, nothing connects the adjacent semi-finished products 50. Therefore, the substrate 30 is divided along the trench 44 into the individual semi-finished products 50. That is, the substrate 30 is divided along the trench 44 (i.e., along the boundary region Z), whereby the individual semi-finished products 50 are separated from each other.

Thereafter, the back surface 30B of the substrate 30 for the semi-finished products 50 is polished to be mirror-finished. The side surfaces 44A of the trench 44 for the semi-finished products 50 provide the side surfaces 2C to 2F of the boards 2 of the respective chip resistors 1, and the back surface 30B provides the back surfaces 2B of the respective chip resistors 1. That is, the aforementioned step of forming the trench 44 (see FIG. 10B) is involved in the step of forming the side surfaces 2C to 2F. Then, the CVD insulative film 45 provides the insulative films 23 of the respective chip resistors 1, and the divided sheet 46 provides the resin films 24 of the respective chip resistors 1.

Even if the chip resistors 1 each have a smaller chip size, the semi-finished products 50 (chip resistors 1) can be separated from each other by first forming the trench 44 and then grinding the substrate 30 from the back surface 30B. This reduces the costs and the production time, and improves the yield as compared with the conventional case in which the chip resistors 1 are separated from each other by dicing the substrate 30 by a dicing saw.

Figure 15:
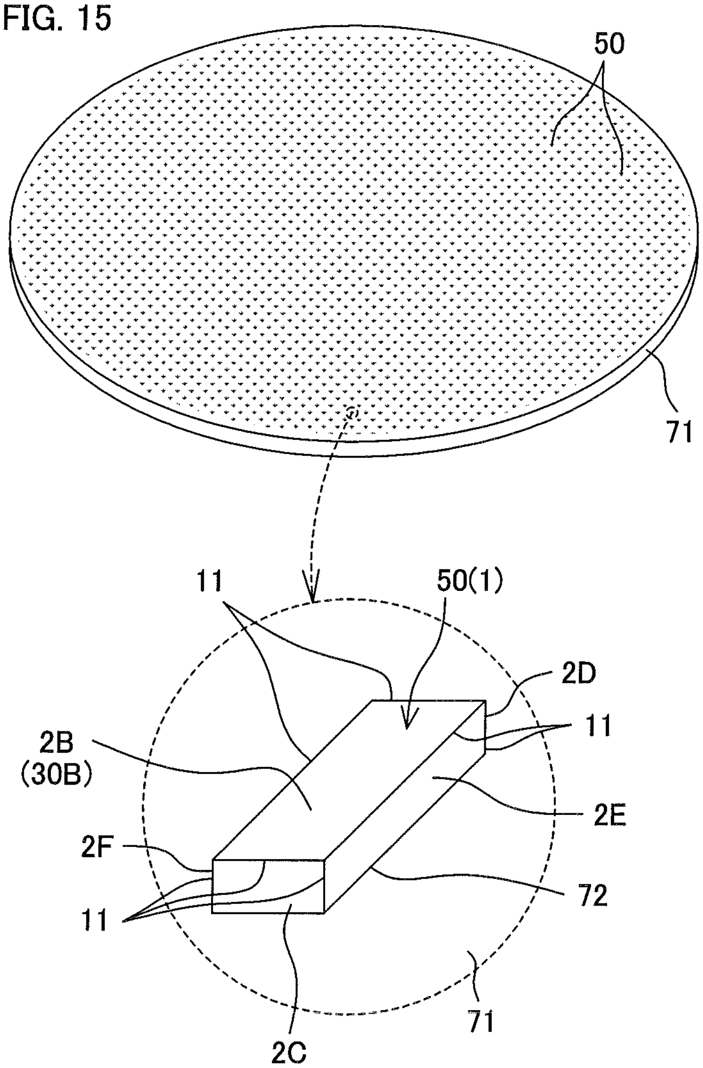
FIG. 15 is a schematic perspective view showing a semi-finished product of the chip resistor immediately after the step of FIG. 10G.

FIG. 15 is a schematic perspective view showing the semi-finished product of the chip resistor immediately after the step of FIG. 10G. Immediately after the semi-finished products 50 are separated from each other, the semi-finished products 50 are kept bonded to the support base 71 to be thereby supported by the support base 71 as shown in FIG. 15. At this time, the back surface 30B (back surfaces 2B) of the semi-finished products 50 are exposed from the support base 71. As shown in an enlarged diagram enclosed by a broken line circle in FIG. 15, the intersection portions 11 of each of the semi-finished products 50 defined between adjacent ones of the back surface 2B and the side surfaces 2C, 2D, 2E, 2F are generally right-angled.

Figure 16:
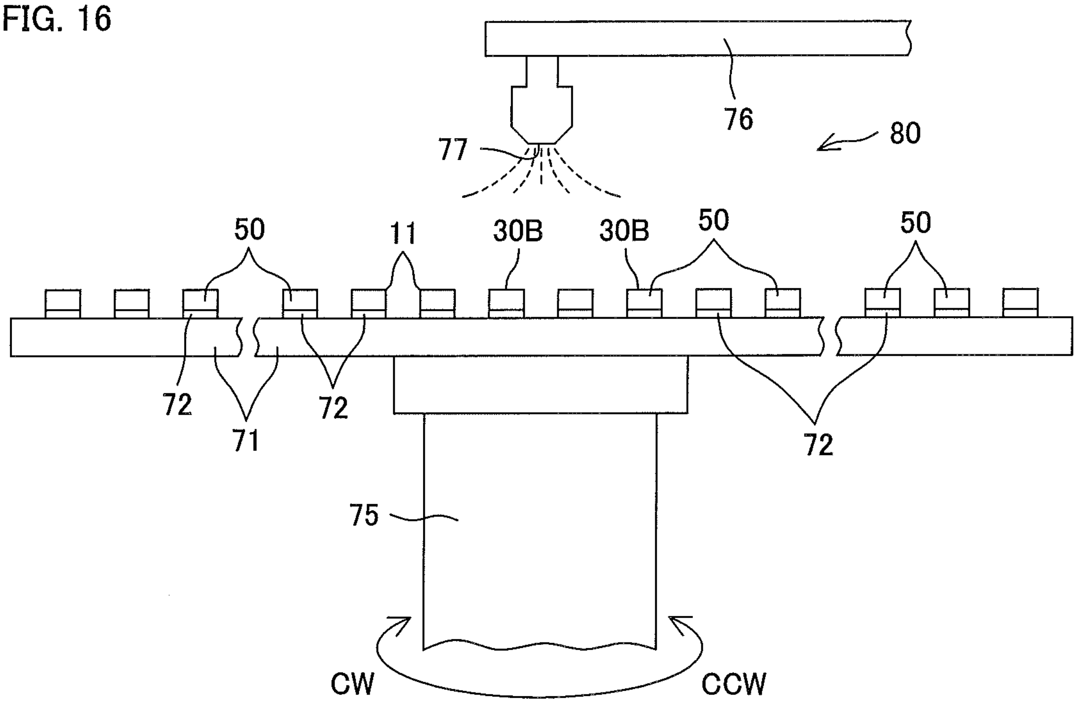
FIG. 16 is a first schematic diagram showing a process step subsequent to that of FIG. 10G.
Figure 17:
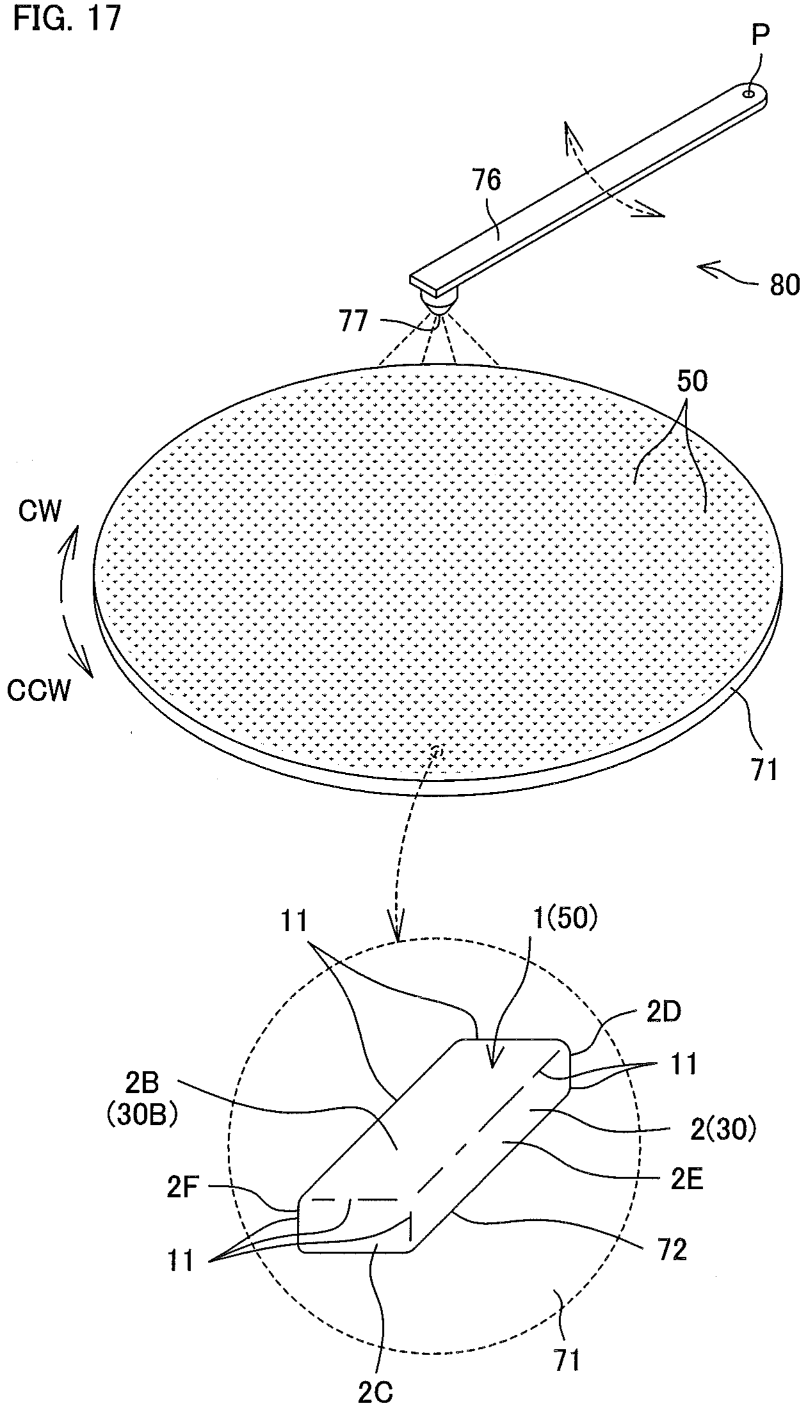
FIG. 17 is a second schematic diagram showing the process step subsequent to that of FIG. 10G.

FIG. 16 is a first schematic diagram showing a process step subsequent to that of FIG. 10G. FIG. 17 is a second schematic diagram showing the process step subsequent to that of FIG. 10G. Referring to FIG. 16, a rotation shaft 75 is connected to the support base 71 (to a lower surface of the support base 71 in FIG. 16) at the gravity center position on a side of the support base 71 opposite from the surface of the support base 71 to which the semi-finished products 50 are bonded, after the semi-finished products 50 are separated from each other by the grinding from the back surface 30B as described above. The rotation shaft 75 receives a driving force from a motor (not shown) to be thereby rotated about its axis in both a clockwise direction CW and a counter-clockwise direction CCW. The support base 71 which supports the semi-finished products 50 is rotated together (unitarily) with the rotation shaft 75 within a plane extending along the back surface 30B of the semi-finished products 50.

Then, an etching nozzle 76 is located to face toward the side of the support base 71 to which the semi-finished products 50 are bonded. The etching nozzle 76 is, for example, a pipe extending parallel to the support base 71, and has a supply port 77 facing toward the semi-finished products 50. The etching nozzle 76 is connected to a tank (not shown) which stores a chemical liquid or the like. Referring to FIG. 17, the etching nozzle 76 is pivotal about a pivot point P (located opposite from the supply port 77) parallel to the support base 71 as indicated by broken line arrows. The rotation shaft 75 and the etching nozzle 76 constitute a part of a spin etcher 80.

After the semi-finished products 50 are separated from each other and the back surface 30B is polished, the support base 71 is rotated in one or both of the clockwise direction CW and the counterclockwise direction CCW in a predetermined manner, and the etching nozzle 76 is pivoted. In this state, the etching agent (etching liquid) is uniformly sprayed from the supply port 77 of the etching nozzle 76 over the back surfaces 2B of the semi-finished products 50 supported by the support base 71. Thus, the semi-finished products 50 supported by the support base 71 are isotropically etched from the side of the back surfaces 2B by a chemical etching (wet etching) process. Particularly, the intersection portions 11 of each of the semi-finished products 50 between adjacent ones of the back surface 2B and the side surfaces 2C, 2D, 2E, 2F are isotropically etched. Where the intersection portions 11 are angled before the etching (see FIG. 15), edges of the intersection portions 11 are easily removed due to crystal defects by the etching. Therefore, the intersection portions 11 are finally rounded by the isotropic etching (see an enlarged portion enclosed by the broken line circuit in FIG. 17). Further, the isotropic etching is performed with the support base 71 being rotated, whereby the etching agent is evenly applied to the intersection portions 11 of the semi-finished products 50. Thus, the intersection portions 11 of the semi-finished products 50 can be evenly rounded. Further, the isotropic etching is performed on the plurality of semi-finished products 50 supported by the support base 71. Thus, the intersection portions 11 of the respective semi-finished products 50 can be simultaneously rounded.

The etching liquid is preferably spouted (sprayed) in a mist form toward the back surfaces 2B of the semi-finished products 50 in the isotropic etching. Where the etching liquid is spouted in a liquid form, not only the intersection portions 11 but also the back surfaces 2B and the side surfaces 2C, 2D, 2E, 2F are etched. Where the etching liquid is spouted in the mist form toward the semi-finished products 50, on the other hand, the mist of the etching liquid is more liable to adhere to the intersection portions 11, which are preferentially etched. This makes it possible to round the intersection portions 11 while suppressing the etching of the back surfaces 2B and the side surfaces 2C, 2D, 2E, 2F.

After the intersection portions 11 are rounded, the etching process ends, and the chip resistors 1 (see FIG. 9) are completed. Thereafter, a rinse liquid (water) is applied to the chip resistors 1 from the etching nozzle 76 to rinse the chip resistors 1. At this time, the support base 71 may be rotated, and the etching nozzle 76 may be pivoted. After the rinsing, the chip resistors 1 are each separated from the support base 71, and mounted, for example, on the circuit board 9 described above (see FIG. 1(*b*)).

The etching liquid may herein be acidic or alkaline. For the isotropic etching of the intersection portions 11, the acidic etching liquid is preferably used. Where the alkaline etching liquid is used, the intersection portions 11 are anisotropically etched, so that a longer period of time is required for rounding the intersection portions 11 than with the acidic etching liquid. An example of the acidic etching liquid is a liquid mixture prepared by mixing $H_2SO_4$ (sulfuric acid) and $CH_3COOH$ (acetic acid) with a base liquid containing HF (hydrogen fluoride) and $HNO_3$ (nitric acid). The viscosity of this etching liquid is controlled by addition of sulfuric acid, and the etching rate is controlled by addition of acetic acid.

While the embodiment of the present invention has thus been described, the invention may be embodies in other ways. By way of example, the substrate 30 is ground from the back surface 30B to the bottom surface 44B of the trench 44 (see FIG. 10F) when being divided into the individual chip resistors 1. Alternatively, the substrate 30 may be divided into the individual chip resistors 1 by selectively etching off a portion of the substrate 30 aligned with the trench 44 as seen in plan from the back surface 30B. Further, the substrate 30 may be diced by means of a dicing blade (not shown) to be divided into the individual chip resistors 1.

The chip resistors 1 (each including the first connection electrode 3, the second connection electrode 4, the device 5 and the like) may each be formed on the board 2 through a semiconductor device production process. In this case, the board 2 and the substrate 30 may be a semiconductor substrate of Si (silicon). It should be understood that various design modifications may be made within the scope of the present invention defined by the appended claims.

<First Reference Embodiment of Present Invention>

(1) Inventive Features of First Reference Embodiment

The first reference embodiment has, for example, the following inventive features (A1) to (A14):

(A1) A chip component production method is provided, which includes the steps of: forming a device in each of a plurality of chip component regions defined on a front surface of a substrate; forming a trench in a boundary region defined between the chip component regions, the trench having a predetermined depth as measured from the front surface of the substrate; and grinding a back surface of the substrate to the trench to divide the substrate into a plurality of chip components.

This method makes it possible to simultaneously separate the chip component regions defined on the substrate from each other to provide the individual chip components, thereby improving the productivity of the chip components.

(A2) In the chip component production method of the feature (A1), the trench forming step includes the steps of: forming a resist pattern for the boundary region; and etching the substrate by using the resist pattern as a mask to form the trench.

According to this method, the trench can be formed at a higher level of accuracy by the etching, so that the chip components provided by dividing the substrate along the trench each have an improved outer dimensional accuracy. Further, the pitch of trench lines can be reduced according to the resist pattern, allowing for size reduction of the chip components formed between adjacent trench lines. In addition, the chipping of corner portions of the chip components are less liable to occur, because the etching does not involve the cutting-out of the chip components. This improves the appearance of the chip components.

(A3) In the chip production method of the feature (A2), the etching is plasma etching.

According to this method, the trench can be formed at a further higher level of accuracy, so that the trench line pitch can be further reduced. Thus, the chip components are further improved in outer dimensional accuracy and appearance, and allowed to have a further reduced size.

(A4) In the chip component production method of any one of the features (A1) to (A3), the device forming step includes the step of forming a resistor portion, and the chip components are chip resistors.

This method can provide smaller size chip resistors which are improved in productivity, outer dimensional accuracy and appearance.

(A5) In the chip component production method of the feature (A4), the resistor portion forming step includes the steps of: forming a resistive film on the front surface of the substrate; forming an interconnection film in contact with the resistive film; and patterning the resistive film and the interconnection film to form a plurality of resistor elements, and the chip component production method further includes the steps of: forming an external connection electrode for external connection of the device on the substrate; and forming a plurality of fuses disconnectably connecting the resistor elements to the external connection electrode on the substrate.

According to this method, the chip resistors can be each easily and speedily customized to have any of plural resistance values by selectively disconnecting one or more of the fuses. In other words, the chip resistors can be each customized based on the same design concept so as to have various resistance values by selectively combining resistor elements having different resistance values.

(A6) In the chip component production method of any one of the features (A1) to (A3), the device forming step includes the step of forming a capacitor portion, and the chip components are chip capacitors.

This method can provide smaller size chip capacitors which are improved in productivity, outer dimensional accuracy and appearance.

(A7) In the chip component production method of the feature (A6), the capacitor portion forming step includes the steps of: forming a capacitive film on the front surface of the substrate; forming an electrode film in contact with the capacitive film; dividing the electrode film into a plurality of electrode film portions to form a plurality of capacitor elements in association with the electrode film portions; forming an external connection electrode for external connection of the device; and forming a plurality of fuses disconnectably connecting the capacitor elements to the external connection electrode on the substrate.

According to this method, the chip capacitors can be each easily and speedily customized to have any of plural capacitance values by selectively disconnecting one or more of the fuses. In other words, the chip capacitors can be each customized based on the same design concept so as to have various capacitance values by selectively combining capacitor elements having different capacitance values.

(A8) In the chip component production method of any one of the features (A1) to (A7), the chip component regions each have a rectangular plan shape defined by two orthogonally intersecting edges, one of which has a length of not greater than 0.4 mm and the other of which has a length of not greater than 0.2 mm.

This method can provide very small chip components.

(A9) In the chip component production method of any one of the features (A1) to (A8), a zonal boundary region having a width of 1 μm to 60 μm is provided between the chip component regions.

This method can provide very small chip components.

(A10) A chip component is provided, which includes: a board; a plurality of device elements provided on a front surface of the board; an external connection electrode provided on the front surface of the board; and a plurality of fuses disconnectably connecting the device elements to the external connection electrode; wherein the board has a rough side surface having an irregular pattern.

Where a plurality of chip components each having the aforementioned arrangement are produced by dividing a substrate into the chip components along a trench which is formed as having a predetermined depth from the front surface of the substrate by etching with the use of a resist pattern, the side surface of the board of each of the chip components originally defined by the trench is a rough surface having an irregular pattern. Since devices formed on the substrate can be simultaneously separated from each other by the etching to produce the individual chip components, the productivity of the chip components can be improved. Further, the trench can be formed at a higher level of accuracy by the etching, so that the chip components produced by dividing the substrate along the trench are improved in outer dimensional accuracy. The pitch of trench lines can be reduced according to the resist pattern, allowing for size reduction of the chip components formed between adjacent trench lines. In addition, the chipping of corner portions of the chip components is less liable to occur, because the etching does not involve the cutting-out of the chip components. This improves the appearance of the chip components.

(A11) The chip component of the feature (A10) is a chip resistor, wherein the device elements are resistor elements which each include a resistive film provided on the front surface of the board, and an interconnection film provided on the resistive film in contact with the resistive film.

With this arrangement, a smaller size chip resistor can be provided which is improved in productivity, outer dimensional accuracy and appearance. The chip resistor can be easily and speedily customized to have any of plural resistance values by selectively disconnecting one or more of the fuses. In other words, the chip resistor can be customized based on the same design concept so as to have various resistance values by selectively combining resistor elements having different resistance values.

(A12) The chip component of the feature (A10) is a chip capacitor, wherein the device elements are capacitor elements which each include a capacitive film provided on the front surface of the board, and an electrode film provided in contact with the capacitive film.

With this arrangement, a smaller size chip capacitor can be provided which is improved in productivity, outer dimensional accuracy and appearance. The chip capacitor can be easily and speedily customized to have any of plural capacitance values by selectively disconnecting one or more of the fuses. In other words, the chip capacitor can be customized based on the same design concept so as to have various capacitance values by selectively combining capacitor elements having different capacitance values.

(A13) The chip component may be a chip inductor.

(A14) The chip component may be a chip diode.

(2) Examples of First Reference Embodiment of Present Invention

Examples of the first reference embodiment will hereinafter be described in detail with reference to the attached drawings. Reference characters shown in FIGS. 18 to 40 are effective only in FIGS. 18 to 40, so that components designated by these reference characters could be different from those designated by the same reference characters in other embodiments.

Figure 18:
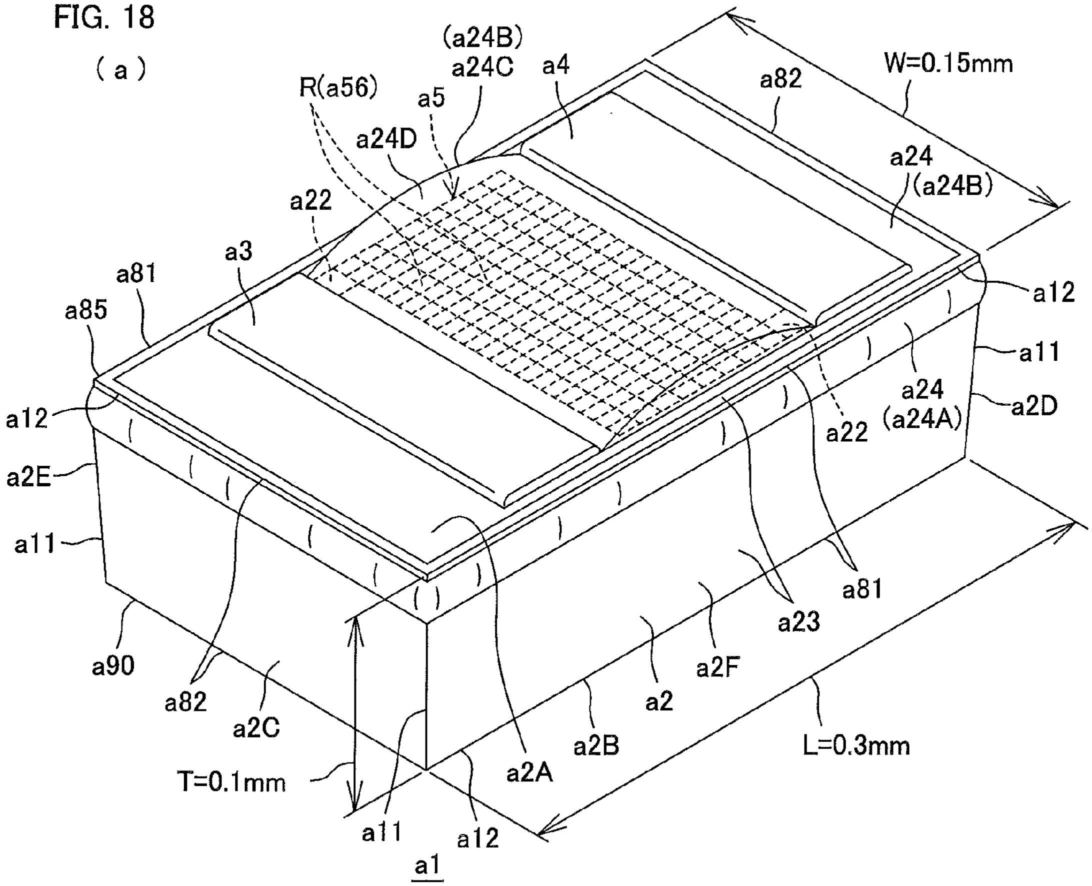
FIG. 18(*a*) is a schematic perspective view for explaining the construction of a chip resistor according to an example of a first reference embodiment, and FIG. 18(*b*) is a schematic side view showing the chip resistor, which is mounted on a mount board.
Figure 18:
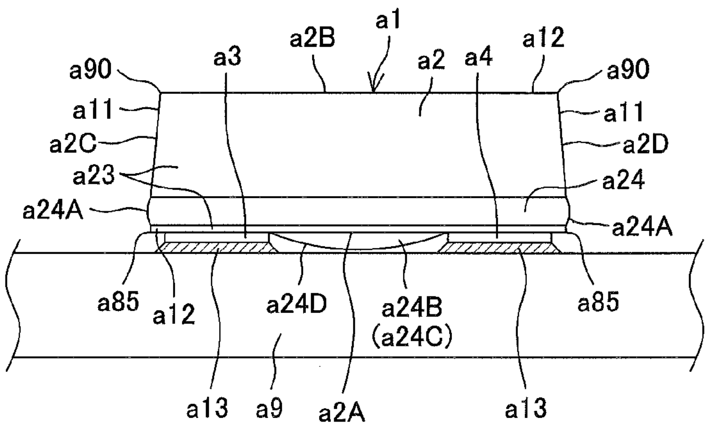

FIG. 18(*a*) is a schematic perspective view for explaining the construction of a chip resistor according to an example of the first reference embodiment, and FIG. 18(*b*) is a schematic side view showing the chip resistor, which is mounted on a mount board. The chip resistor a1 is a minute chip component, and has a rectangular prismatic shape as shown in FIG. 18(*a*). The chip resistor a1 has a rectangular plan shape defined by two perpendicularly intersecting edges (a longer edge a81 and a shorter edge a82), one of which has a length of not greater than 0.4 mm and the other of which has a length of not greater than 0.2 mm. More preferably, the chip resistor a1 is dimensioned such as to have a length L (a length of the longer edge a81) of about 0.3 mm, a width W (a length of the shorter edge a82) of about 0.15 mm, and a thickness T of about 0.1 mm.

The chip resistor a1 is obtained by forming a multiplicity of chip resistors a1 in a lattice form on a substrate, then forming a trench in the substrate, and grinding a back surface of the substrate (or dividing the substrate along the trench) to separate the chip resistors a1 from each other. The chip resistor a1 principally includes a board a2 which constitutes a part of a main body of the chip resistor a1 (resistor main body), a first connection electrode a3 and a second connection electrode a4 serving as external connection electrodes, and a device (element) a5 connected to the outside via the first connection electrode a3 and the second connection electrode a4.

The board a2 has a generally rectangular prismatic chip shape. An upper surface of the board a2 as seen in FIG. 18(*a*) is a front surface a2A. The front surface a2A is a surface (device formation surface) of the board a2 on which the device a5 is provided, and has a generally rectangular shape. A surface of the board a2 opposite from the front surface a2A with respect to the thickness of the board a2 is a back surface a2B. The front surface a2A and the back surface a2B have substantially the same shape, and are parallel to each other. However, the front surface a2A is greater than the back surface a2B. When the back surface a2B is seen in plan perpendicularly to the front surface a2A, therefore, the back surface a2B is accommodated within the front surface a2A. The front surface a2A has a rectangular edge portion a85 defined along a pair of longer edges a81 and a pair of shorter edges a82 thereof, and the back surface a2B has a rectangular edge portion a90 defined along a pair of longer edges a81 and a pair of shorter edges a82 thereof.

In addition to the front surface a2A and the back surface a2B, the board a2 has side surfaces a2C, a2D, a2E and a2F intersecting the front surface a2A and the back surface a2B to connect the front surface a2A and the back surface a2B to each other. The side surface a2C is disposed between shorter edges a82 of the front surface a2A and the back surface a2B on one of longitudinally opposite sides (on a left front side in FIG. 18(*a*)). The side surface a2D is disposed between shorter edges a82 of the front surface a2A and the back surface a2B on the other of the longitudinally opposite sides (on a right rear side in FIG. 18(*a*)). The side surfaces a2C, a2D are longitudinally opposite end faces of the board a2. The side surface a2E is disposed between longer edges a81 of the front surface a2A and the back surface a2B on one of widthwise opposite sides (on a left rear side in FIG. 18(*a*)). The side surface a2F is disposed between longer edges a81 of the front surface a2A and the back surface a2B on the other of the widthwise opposite sides (on a right front side in FIG. 18(*a*)). The side surfaces a2E, a2F are widthwise opposite end faces of the board a2. The side surfaces a2C, a2D intersect (generally orthogonally intersect) the side surfaces a2E, a2F. Since the front surface a2A is greater than the back surface a2B as described above, the side surfaces a2C to a2F each have an isosceles trapezoidal shape having an upper base on the side of the back surface a2B and a lower base on the side of the front surface a2A. That is, side surfaces of the chip resistor a1 each have an isosceles trapezoidal shape. Therefore, adjacent ones of the front surface a2A, the back surface a2B and the side surfaces a2C to a2F form an acute angle or an obtuse angle. More specifically, the side surfaces a2C, a2D, a2E, a2F each form an acute angle with respect to the front surface a2A, and each form an obtuse angle with respect to the back surface a2B. For convenience of description, the inclinations of the side surfaces a2C to a2F are greater than actual inclinations (exaggerated) in FIG. 18 and subsequent figures.

The front surface a2A and the side surfaces a2C to a2F of the board a2 are entirely covered with an insulative film a23. More strictly, therefore, the front surface a2A and the side surfaces a2C to a2F are entirely located on an inner side (back side) of the insulative film a23, and are not exposed to the outside in FIG. 18(*a*). Further, the chip resistor a1 has a resin film a24. The resin film a24 includes a first resin film a24A, and a second resin film a24B which is different from the first resin film a24A. The first resin film a24A is provided on portions of the side surfaces a2C, a2D, a2E, a2F located slightly apart from the edge portion a85 of the front surface a2A toward the back surface a2B. The second resin film a24B covers a portion of the insulative film a23 on the front surface a2A in a region not overlapping the edge portion a85 of the front surface a2A (inward of the edge portion a85). The insulative film a23 and the resin film a24 will be detailed later.

The first connection electrode a3 and the second connection electrode a4 are provided inward of the edge portion a85 on the front surface a2A of the board a2, and partly exposed from the second resin film a24B on the front surface a2A. In other words, the second resin film a24B covers the front surface a2A (strictly, the insulative film a23 on the front surface a2A) with the first connection electrode a3 and the second connection electrode a4 being exposed therefrom. The first connection electrode a3 and the second connection electrode a4 each have a structure such that an Ni (nickel) layer, a Pd (palladium) layer and an Au (gold) layer are stacked in this order on the front surface a2A. The first connection electrode a3 and the second connection electrode a4 are spaced from each other longitudinally of the front surface a2A, and are each elongated widthwise of the front surface a2A. On the front surface a2A, the first connection electrode a3 is disposed closer to the side surface a2C, and the second connection electrode a4 is disposed closer to the side surface a2D in FIG. 18(*a*).

The device a5 is a circuit device (element), which is provided between the first connection electrode a3 and the second connection electrode a4 on the front surface a2A of the board a2, and is covered with the insulative film a23 and the second resin film a24B from the upper side. The device a5 constitutes a part of the resistor main body described above. In this example, the device a5 is a resistor portion a56. The resistor portion a56 is a circuit network including a plurality of (unit) resistor bodies R each having the same resistance value and arranged in a matrix array on the front surface a2A. The resistor bodies R are each made of TiN (titanium nitride), TiON (titanium oxide nitride) or TiSiON. The device a5 is electrically connected to portions of an interconnection film a22 to be described later, and electrically connected to the first connection electrode a3 and the second connection electrode a4 via the interconnection film portions a22.

As shown in FIG. 18(*b*), the chip resistor a1 can be mounted on the mount board a9 (through flip chip connection) by electrically and mechanically connecting the first connection electrode a3 and the second connection electrode a4 to a circuit (not shown) of the mount board a9 by solder a13 with the first connection electrode a3 and the second connection electrode a4 opposed to the mount board a9. The first connection electrode a3 and the second connection electrode a4 functioning as the external connection electrodes are desirably formed of gold (Au) or plated with gold for improvement of solder wettability and reliability.

Figure 19:
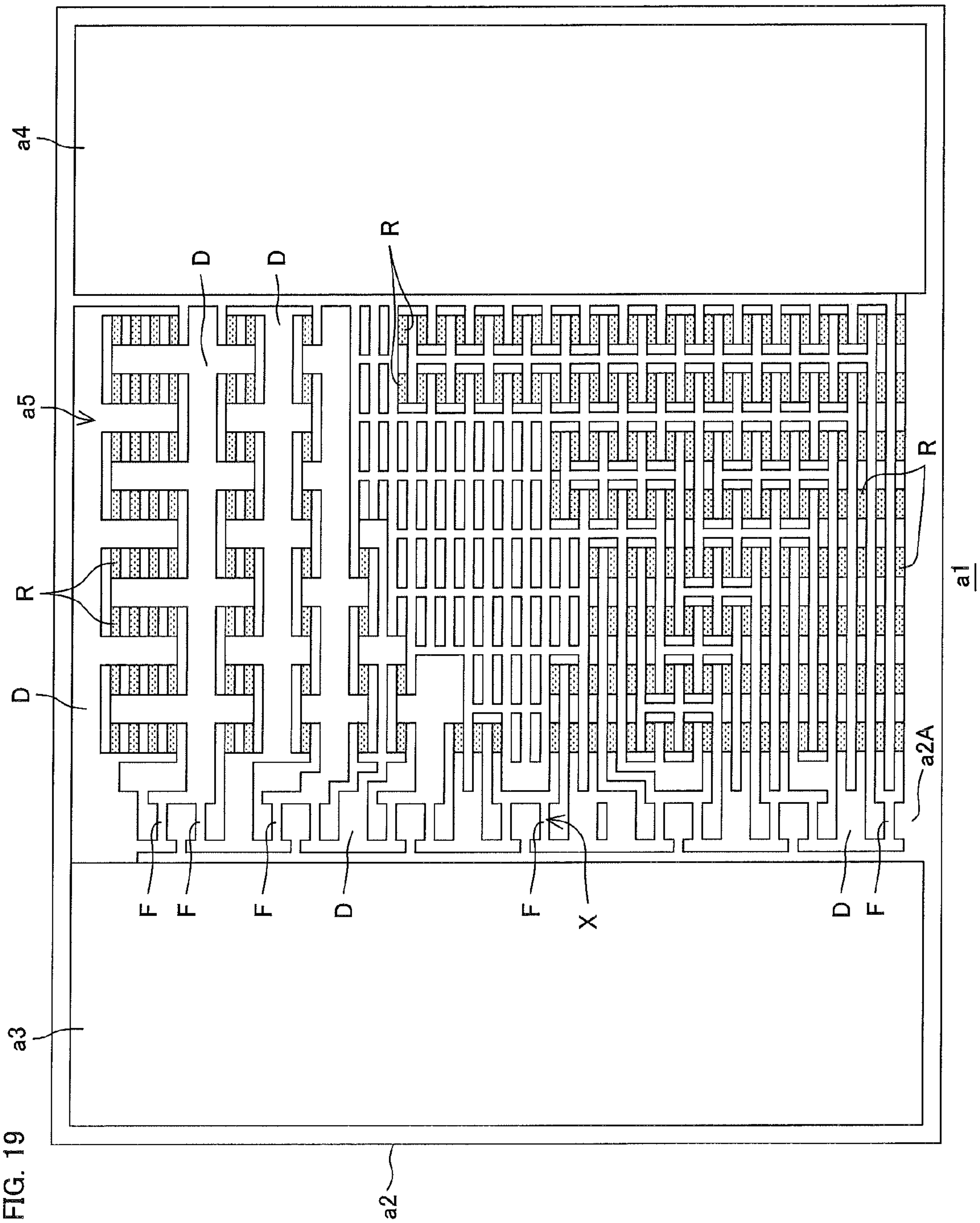
FIG. 19 is a plan view of the chip resistor showing the layout of a first connection electrode, a second connection electrode and a device, and the structure of the device as viewed in plan.

FIG. 19 is a plan view of the chip resistor showing the layout of the first connection electrode, the second connection electrode and the device, and the structure (layout pattern) of the device as viewed in plan. Referring to FIG. 19, the device a5 is a resistor circuit network. More specifically, the device a5 includes 352 resistor bodies R in total with 8 resistor bodies R aligned in each row (longitudinally of the board a2) and with 44 resistor bodies R aligned in each column (widthwise of the board a2). These resistor bodies R are elements of the resister circuit network of the device a5.

The multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface a2A of the board a2 for electrically incorporating the resistor circuits into the device a5 or electrically isolating the resistor circuits from the device a5. The fuses F and the conductor films D are arranged in a linear region alongside an inner edge of the first connection electrode a3. More specifically, the fuses F and the conductor films D are arranged in adjacent relation in a linear arrangement direction. The fuses F disconnectably (separably) connect the plural types of resistor circuits (each including a plurality of resistor bodies R) with respect to the first connection electrode a3. The fuses F and the conductor films D constitute a part of the resistor main body described above.

Figure 20A:
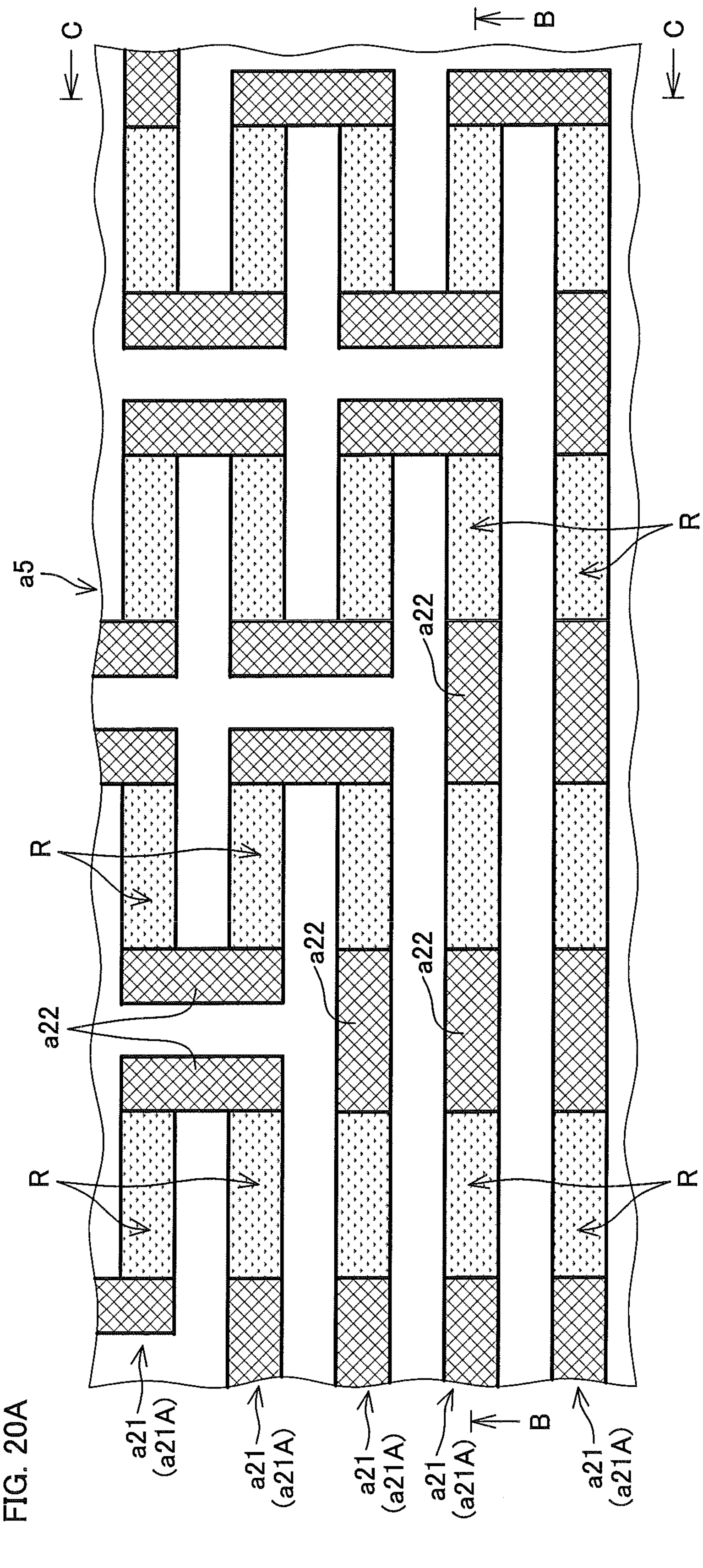
FIG. 20A is a plan view illustrating a part of the device shown in FIG. 19 on an enlarged scale.
Figure 20B:
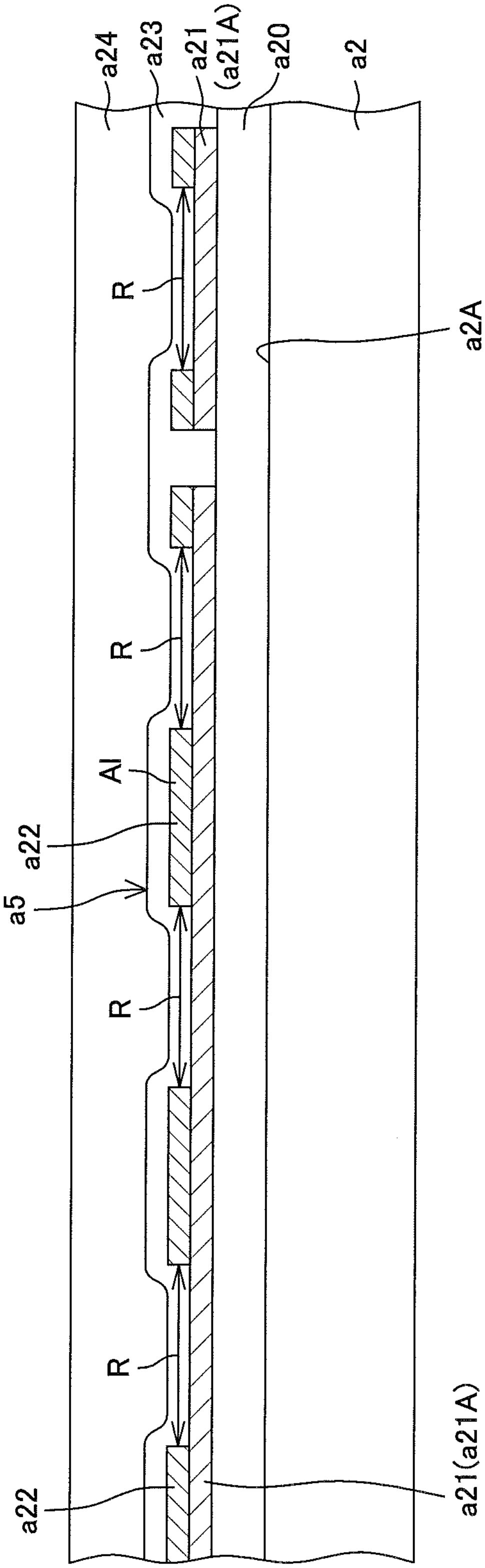
FIG. 20B is a longitudinal vertical sectional view taken along a line B-B in FIG. 20A for explaining the structure of resistor bodies of the device.
Figure 20C:
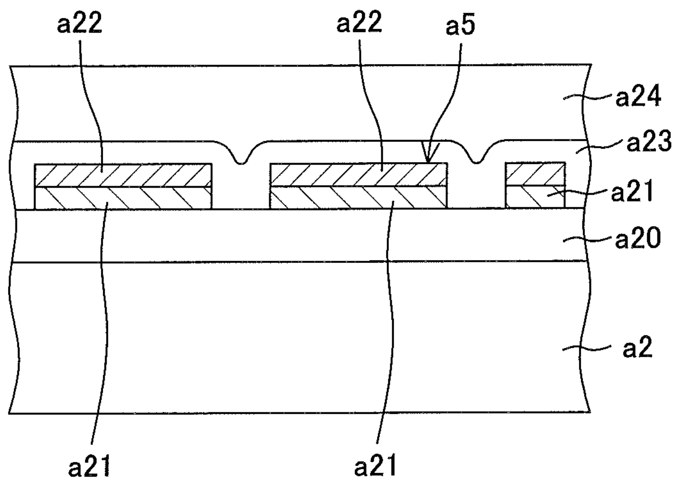
FIG. 20C is a widthwise vertical sectional view taken along a line C-C in FIG. 20A for explaining the structure of the resistor bodies of the device.

FIG. 20A is a plan view illustrating a part of the device shown in FIG. 19 on an enlarged scale. FIG. 20B is a longitudinal vertical sectional view taken along a line B-B in FIG. 20A for explaining the structure of the resistor bodies of the device. FIG. 20C is a widthwise vertical sectional view taken along a line C-C in FIG. 20A for explaining the structure of the resistor bodies of the device. Referring to FIGS. 20A, 20B and 20C, the structure of the resistor bodies R will be described.

The chip resistor a1 includes an insulative layer a20 and a resistive film a21 in addition to the interconnection film a22, the insulative film a23 and the resin film a24 described above (see FIGS. 20B and 20C). The insulative layer a20, the resistive film a21, the interconnection film a22, the insulative film a23 and the resin film a24 are provided on the board a2 (on the front surface a2A). The insulative layer a20 is made of $SiO_2$ (silicon oxide). The insulative layer a20 covers the entire front surface a2A of the board a2. The insulative layer a20 has a thickness of about 10000 Å.

The resistive film a21 is provided on the insulative layer a20. The resistive film a21 is made of TiN, TION or TiSiON. The resistive film a21 has a thickness of about 2000 Å. The resistive film a21 includes a plurality of resistive film portions (hereinafter referred to as "resistive film lines a21A") extending linearly parallel to each other between the first connection electrode a3 and the second connection electrode a4. Some of the resistive film lines a21A are cut at predetermined positions with respect to a line extending direction (see FIG. 20A).

Portions of the interconnection film a22 are provided on the resistive film lines a21A. The interconnection film portions a22 are each made of Al (aluminum) or an alloy (AlCu alloy) of aluminum and Cu (copper). The interconnection film portions a22 each have a thickness of about 8000 Å. The interconnection film portions a22 are provided on the resistive film lines a21A in contact with the resistive film lines a21A, and spaced a predetermined distance R from one another in the line extending direction.

Figure 21:
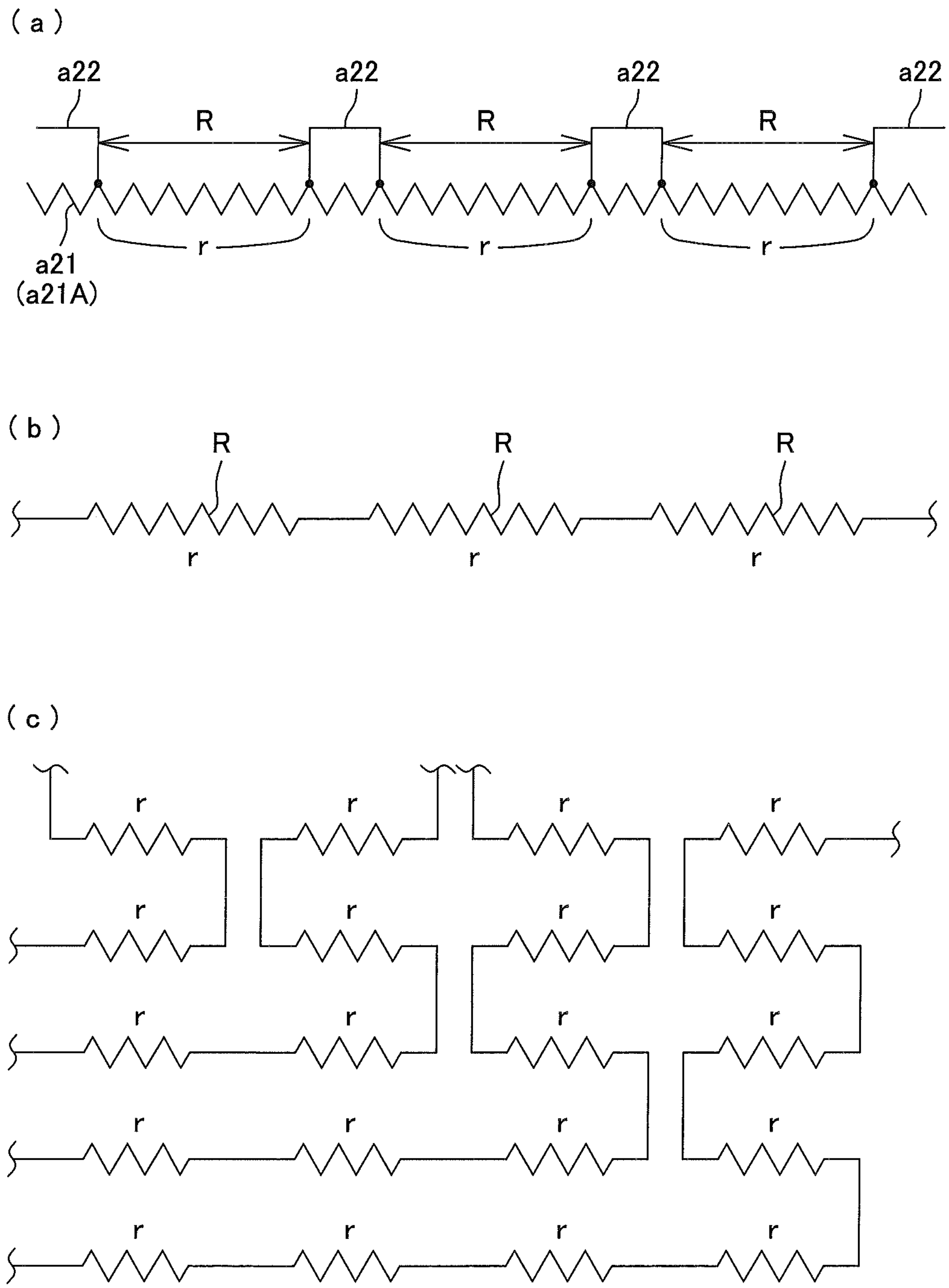
FIG. 21 are diagrams showing the electrical characteristic features of a resistive film line and an interconnection film by way of circuit symbols and electric circuit diagrams.

In FIG. 21, the electrical characteristic features of the resistive film lines a21A and the interconnection film portions a22 of this arrangement are shown by way of circuit symbols. As shown in FIG. 21(*a*), portions of each of the resistive film lines a21A present between the interconnection film portions a22 spaced the predetermined distance R from one another each serve as a single resistor body R having a predetermined resistance value r. The interconnection film portions a22, which electrically connect adjacent resistor bodies R to each other, cause short circuit in each of the resistive film lines a21A on which the interconnection film portions a22 are provided. Thus, a resistor circuit is provided, in which the resistor bodies R each having a resistance r are connected in series as shown in FIG. 21(*b*).

Further, adjacent resistive film lines a21A are connected to each other by the resistive film a21 and the interconnection film a22, so that the resistor circuit network of the device a5 shown in FIG. 20A constitutes a resistor circuit (including the resistor unit of the resistor bodies R described above) shown in FIG. 21(*c*). Thus, the resistor bodies R and the resistor circuits (i.e., the device a5) are constituted by the resistive film a21 and the interconnection film a22. The resistor bodies R each include a resistive film line a21A (resistive film a21), and a plurality of interconnection film portions a22 spaced the predetermined distance from one another in the line extending direction on the resistive film line a21A. Portions of the resistive film line a21A not provided with the interconnection film portions a22 spaced the predetermined distance R from one another each define a single resistor body R. The portions of the resistive film line a21A defining the resistor bodies R each have the same shape and the same size. Therefore, the multiplicity of resistor bodies R arranged in the matrix array on the board a2 have the same resistance value.

Figure 22:
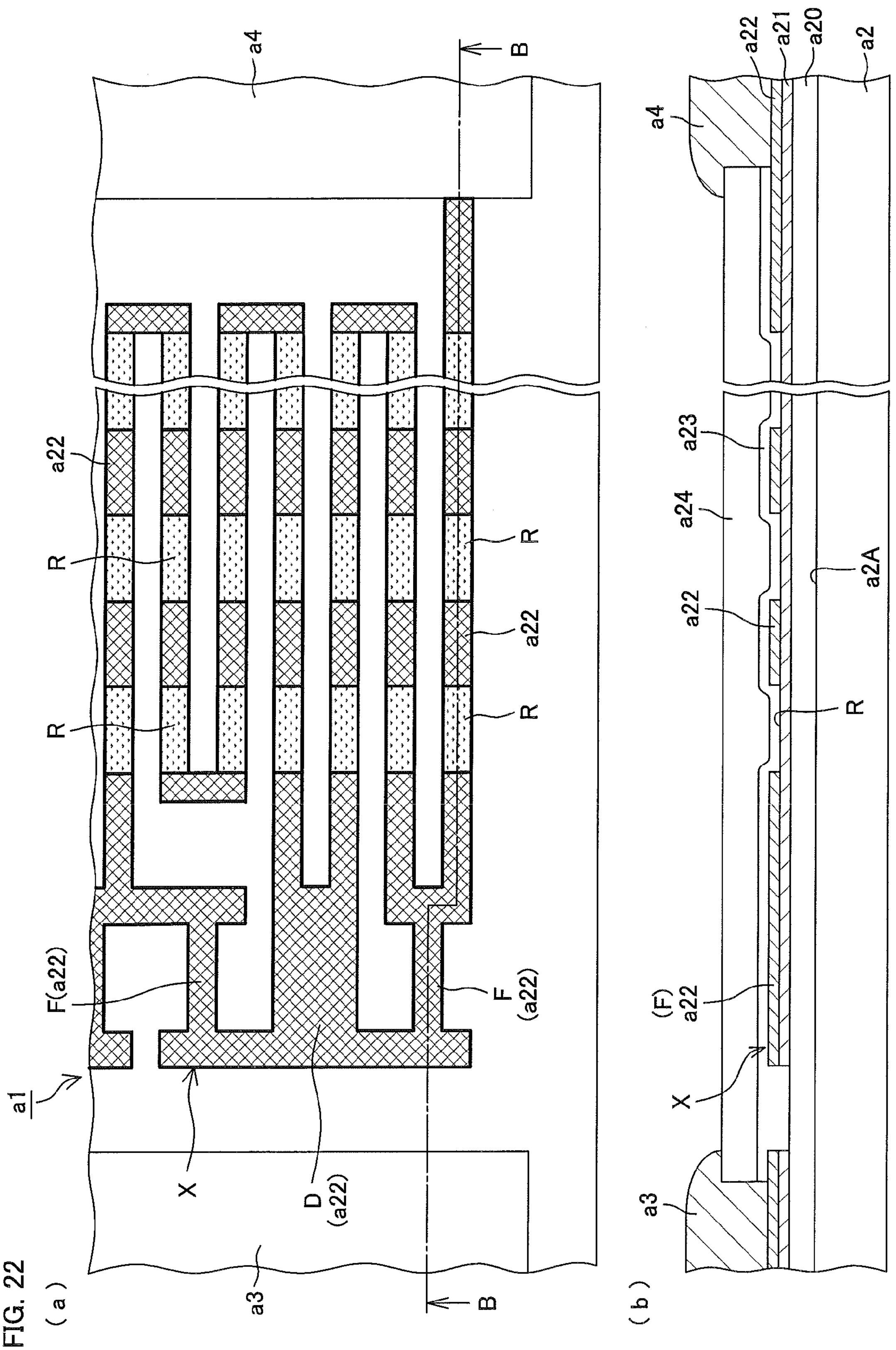
FIG. 22(*a*) is an enlarged partial plan view illustrating a region of the chip resistor including fuses shown in a part of the plan view of FIG. 19 on an enlarged scale, and FIG. 22(*b*) is a diagram showing a sectional structure taken along a line B-B in FIG. 22(*a*).

The interconnection film portions a22 provided on the resistive film lines a21A define the resistor bodies R, and also serve as conductor films D for connecting the resistor bodies R to one another to provide the resistor circuits (see FIG. 19). FIG. 22(*a*) is an enlarged partial plan view illustrating a region of the chip resistor including fuses shown in a part of the plan view of FIG. 19 on an enlarged scale, and FIG. 22(*b*) is a diagram showing a sectional structure taken along a line B-B in FIG. 22(*a*).

As shown in FIGS. 22(*a*) and 22(*b*), the interconnection film portion a22 for the fuses F and the conductor films D described above is formed from the same interconnection film a22 as the interconnection film portions a22 provided on the resistive film a21 for the resistor bodies R. That is, the fuses F and the conductor films D are formed of Al or the AlCu alloy, which is the same metal material as for the interconnection film portions a22 provided on the resistive film lines a21A to define the resistor bodies R, and provided at the same level as the interconnection film portions a22. As described above, the interconnection film portion a22 serves as the conductor films D for electrically connecting the plurality of resistor bodies R to form the resistor circuit.

That is, the interconnection film portions a22 for defining the resistor bodies R, the interconnection film portion a22 for the fuses F and the conductor films D, and the interconnection film portions a22 for connecting the device a5 to the first connection electrode a3 and the second connection electrode a4 are formed of the same metal material (Al or the AlCu alloy) and provided at the same level on the resistive film a21. It is noted that the fuses F are different (discriminated) from the other interconnection film portions a22 in that the fuses F are thinner for easy disconnection and no circuit element is present around the fuses F.

A region of the interconnection film portion a22 in which the fuses F are disposed is herein referred to as "trimming region X" (see FIGS. 19 and 22(*a*)). The trimming region X linearly extends alongside the inner edge of the first connection electrode a3, and not only the fuses F but also some of the conductor films D are present in the trimming region X. The resistive film a21 is partly present below the interconnection film portion a22 in the trimming region X (see FIG. 22(*b*)). The fuses F are each spaced a greater distance from the surrounding interconnection film portions a22 than the other interconnection film portions a22 present outside the trimming region X.

The fuses F each do not simply designate a part of the interconnection film portion a22, but may each designate a fuse element which is a combination of a part of the resistor body R (resistive film a21) and a part of the interconnection film portion a22 on the resistive film a21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

Figure 23:
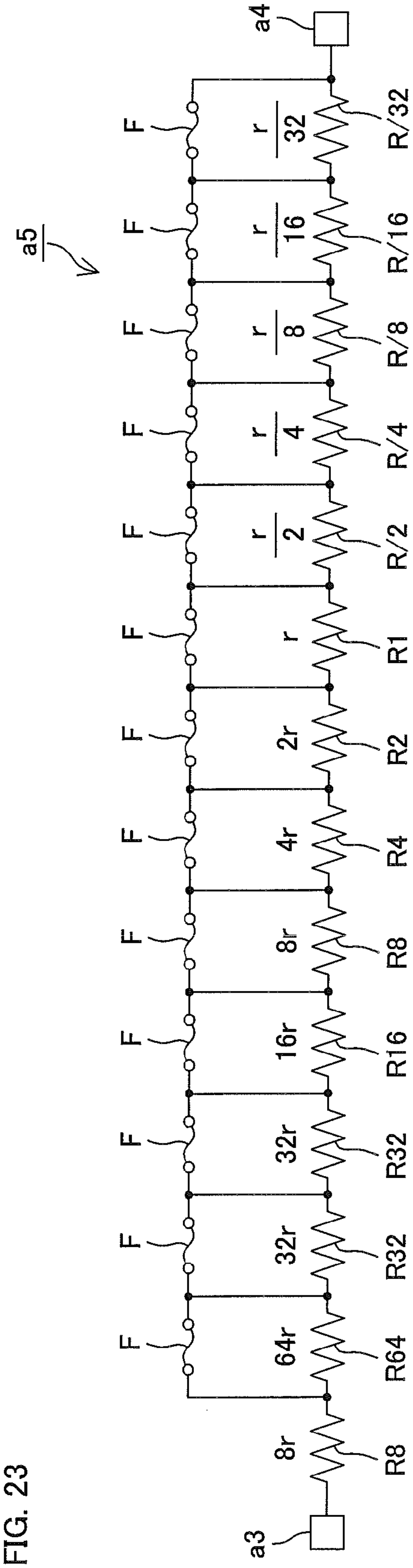
FIG. 23 is an electric circuit diagram of the device according to the example of the first reference embodiment.

FIG. 23 is an electric circuit diagram of the device according to the example of the first reference embodiment. Referring to FIG. 23, the device a5 includes a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first connection electrode a3. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 24 and 25 to be described later.

A single fuse F is connected in parallel to each of the resistor circuits R64 to R/32 except the reference resistor circuit R8. The fuses F are connected in series to one another directly or via the conductor films D (see FIG. 22(*a*)). With none of the fuses F fused off as shown in FIG. 23, the device a5 includes a resistor circuit such that the reference resistor circuit R8 including 8 resistor bodies R connected in series is provided between the first connection electrode a3 and the second connection electrode a4. Where the resistor bodies R each have a resistance value r of $r=8\Omega$, for example, the chip resistor a1 is configured such that the first connection electrode a3 and the second connection electrode a4 are connected to each other through a resistor circuit (including the reference resistor circuit R8) having a resistance value of $8r=64\Omega$.

With none of the fuses F fused off, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto. Therefore, the resistor circuits except the reference resistor circuit R8 are not electrically incorporated in the device a5.

In the chip resistor a1 according to this example, the fuses F are selectively fused off, for example, by a laser beam according to the required resistance value. Thus, a resistor circuit connected in parallel to a fused fuse F is incorporated in the device a5. Therefore, the device a5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device a5 (resistor portion a56) can be digitally and finely controlled to a desired resistance value by selectively fusing off the fuses F (or the fuse elements described above). Thus, the chip resistor a1 can have the desired resistance value.

Figure 24:
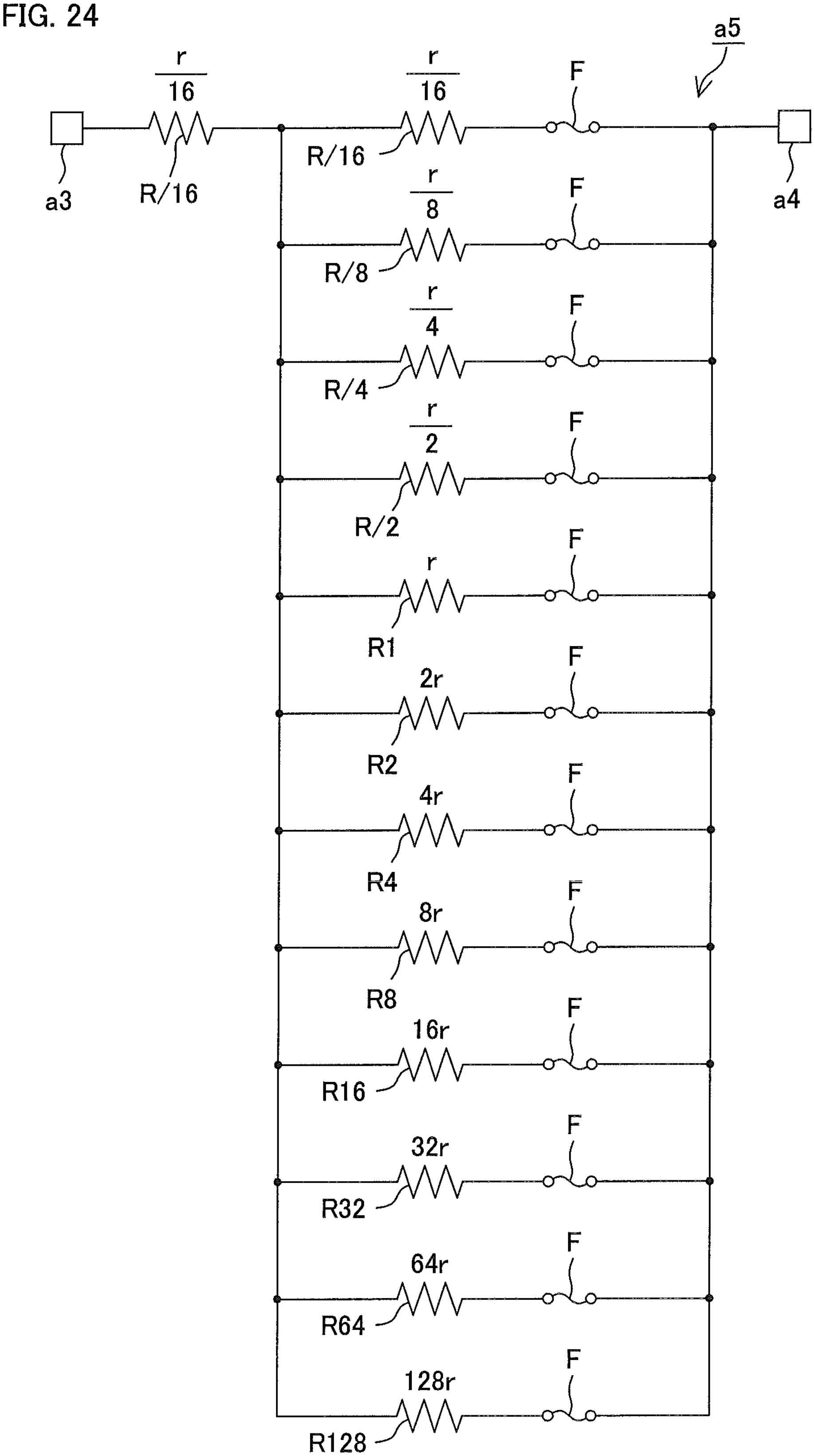
FIG. 24 is an electric circuit diagram of a device according to another example of the first reference embodiment.

FIG. 24 is an electric circuit diagram of a device according to another example of the first reference embodiment.

The device a5 may be configured as shown in FIG. 24, rather than by connecting the resistor circuits R64 to R/32 in series to the reference resistor circuit R8 as shown in FIG. 23. More specifically, the device a5 may include a resistor circuit network configured such that a parallel connection circuit including 12 types of resistor circuits R/16, R/8, R/4, R/2, R1, R2, R4, R8, R16, R32, R64, R128 is connected in series to a reference resistor circuit R/16 between the first connection electrode a3 and the second connection electrode a4.

In this case, a fuse F is connected in series to each of the 12 types of resistor circuits except the reference resistor circuit R/16. With none of the fuses F fused off, all the resistor circuits are electrically incorporated in the device a5. The fuses F are selectively fused off, for example, by a laser beam according to the required resistance value. Thus, a resistor circuit associated with a fused fuse F (a resistor circuit connected in series to the fused fuse F) is electrically isolated from the device a5 to control the overall resistance value of the chip resistor a1.

Figure 25:
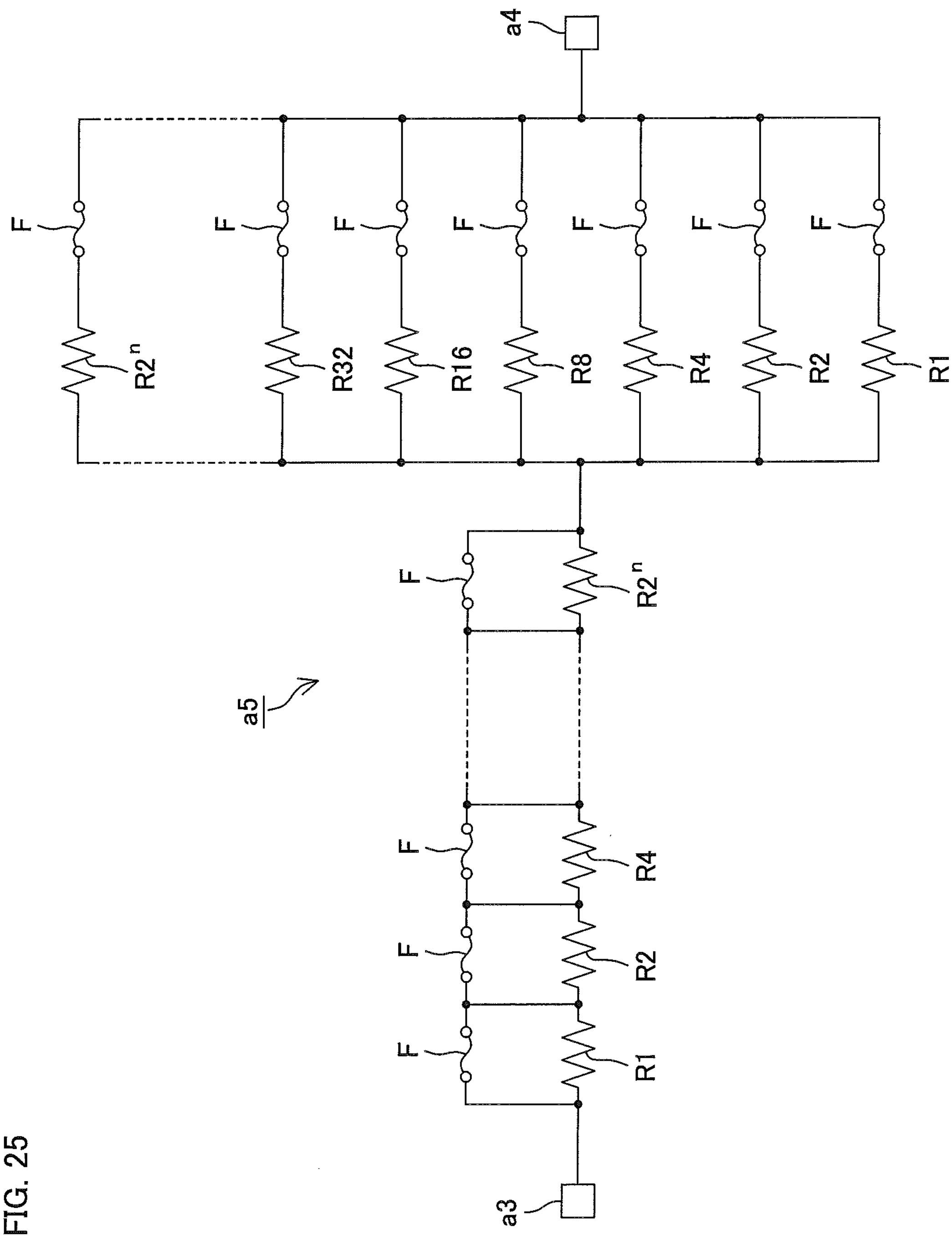
FIG. 25 is an electric circuit diagram of a device according to further another example of the first reference embodiment.

FIG. 25 is an electric circuit diagram of a device according to further another example of the first reference embodiment. The device a5 shown in FIG. 25 has a characteristic circuit configuration such that a serial connection circuit including plural types of resistor circuits is connected in series to a parallel connection circuit including plural types of resistor circuits. As in the previous example, a fuse F is connected in parallel to each of the plural types of resistor circuits connected in series, and all the plural types of resistor circuits connected in series are short-circuited by the fuses F. With a fuse F fused off, therefore, a resistor circuit which has been short-circuited by that fuse F is electrically incorporated in the device a5.

On the other hand, a fuse F is connected in series to each of the plural types of resistor circuits connected in parallel. With a fuse F fused off, therefore, a resistor circuit which has been connected in series to that fuse F is electrically isolated from the parallel connection circuit of the resistor circuits. With this arrangement, a resistance of smaller than 1 kΩ may be formed in the parallel connection circuit, and a resistor circuit of 1 kΩ or greater may be formed in the serial connection circuit. Thus, a resistor circuit having a resistance value extensively ranging from a smaller resistance value on the order of several ohms to a greater resistance value on the order of several megaohms can be produced from resistor circuit networks designed based on the same basic design concept. That is, the chip resistor a1 can be easily and speedily customized to have any of plural resistance values by selectively disconnecting one or more of the fuses F. In other words, the chip resistor a1 can be customized based on the same design concept so as to have various resistance values by selectively combining the resistor bodies R having different resistance values.

Figure 26:
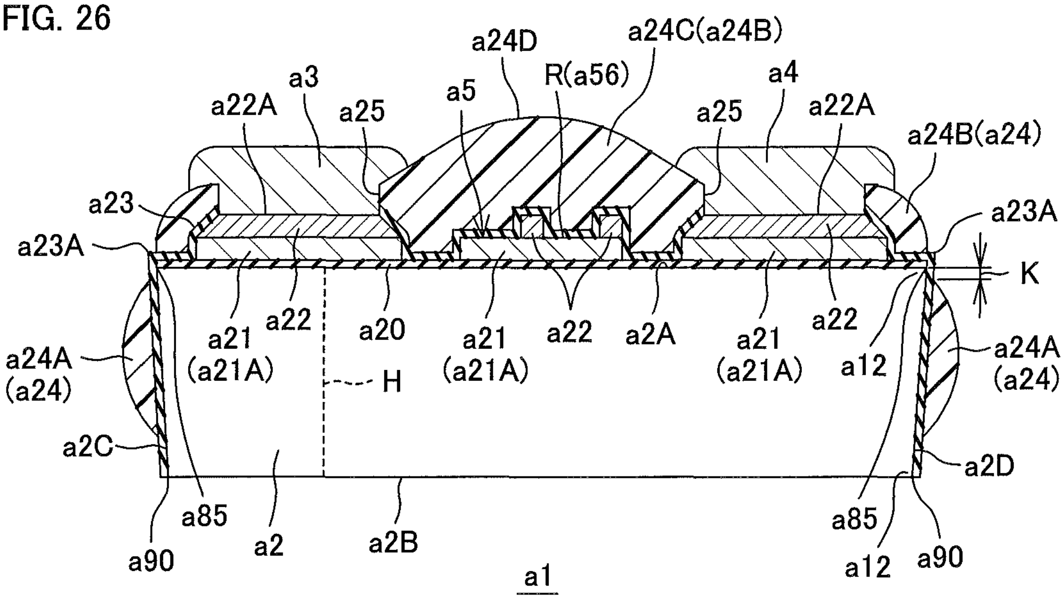
FIG. 26 is a schematic sectional view of the chip resistor.

In the chip resistor a1, as described above, the connection of the plurality of resistor bodies R (resistor circuits) can be changed in the trimming region X. FIG. 26 is a schematic sectional view of the chip resistor. Referring next to FIG. 26, the chip resistor a1 will be described in greater detail. In FIG. 26, the device a5 described above is simplified, and components other than the board a2 are hatched for convenience of description.

The insulative film a23 and the resin film a24 will be described. The insulative film a23 is made of, for example, SiN (silicon nitride), and has a thickness of 1000 Å to 5000 Å (here, about 3000 Å). The insulative film a23 is provided over the front surface a2A and the side surfaces a2C to a2F. A portion of the insulative film a23 present on the front surface a2A covers the resistive film a21 and the interconnection film portions a22 present on the resistive film a21 (i.e., the device a5) from the front side (from the upper side in FIG. 26), thereby covering the upper surfaces of the resistor bodies R of the device a5. Thus, the insulative film portion a23 also covers the interconnection film portion a22 in the trimming region X described above (see FIG. 22(*b*)). Further, the insulative film portion a23 contacts the device a5 (the interconnection film a22 and the resistive film a21), and also contacts the insulative layer a20 in a region not formed with the resistive film a21. Thus, the insulative film portion a23 present on the front surface a2A covers the entire front surface a2A to function as a protective film for protecting the device a5 and the insulative layer a20. On the front surface a2A, the insulative film portion a23 prevents an unintended short circuit which may be a short circuit other than that occurring between the interconnection film portions a22 present between the resistor bodies R (an unintended short circuit which may occur between adjacent resistive film lines a21A).

On the other hand, portions of the insulative film a23 present on the respective side surfaces a2C to a2F function as protective layers which respectively protect the side surfaces a2C to a2F. The edge portion a85 described above is present on the boundaries between the front surface a2A and the side surfaces a2C to a2F, and the insulative film a23 also covers the boundaries (the edge portion a85). A portion of the insulative film a23 covering the edge portion a85 (overlying the edge portion a85) is herein referred to as an edge portion a23A.

Together with the insulative film a23, the resin film a24 protects the front surface a2A of the chip resistor a1. The resin film a24 is made of a resin such as a polyimide. The resin film a24 has a thickness of about 5 μm. As described above, the resin film a24 includes the first resin film a24A and the second resin film a24B. The first resin film a24A covers the portions of the side surfaces a2C to a2F located slightly apart from the edge portion a85 (the edge portion a23A of the insulative film a23) toward the back surface a2B. More specifically, the first resin film a24A is provided on regions of the side surfaces a2C to a2F spaced a distance K from the edge portion a85 of the front surface a2A toward the back surface a2B. However, the first resin film a24A is located closer to the front surface a2A than to the back surface a2B. Portions of the first resin film a24A on the side surfaces a2C, a2D each linearly extend alongside the entire shorter edge a82 (see FIG. 18(*a*)). Portions of the first resin film a24A on the side surfaces a2E, a2F each linearly extend alongside the entire longer edge a81 (see FIG. 18(*a*)). The first resin film a24A on the side surfaces a2C to a2F protrudes outward of the edges (the edge portion a85) of the front surface a2A. More specifically, the first resin film a24A is arcuately bulged outward of the edge portion a85 in directions parallel to the front surface a2A. Therefore, the first resin film a24A defines the contour of the chip resistor a1 as seen in plan.

The second resin film a24B generally entirely covers the surface of the insulative film a23 on the front surface a2A (including the resistive film a21 and the interconnection film a22 covered with the insulative film a23). More specifically, the second resin film a24B is offset from the edge portion a23A of the insulative film a23 (the edge portion a85 of the front surface a2A) so as not to cover the edge portion a23A. Therefore, the first resin film a24A and the second resin film a24B are not continuous to each other, but discontinuous along the edge portion a23A (on the entire edge portion a85).

Thus, the edge portion a23A of the insulative film a23 (on the entire edge portion a85) is exposed to the outside.

The second resin film a24B has two openings a25 respectively formed at two positions spaced from each other as seen in plan. The openings a25 are through-holes extending continuously thicknesswise through the second resin film a24B and the insulative film a23. Therefore, not only the second resin film a24B but also the insulative film a23 has the openings a25. The interconnection film portions a22 are partly exposed from the respective openings a25. The parts of the interconnection film portions a22 exposed from the respective openings a25 serve as pad regions a22A for the external connection.

One of the two openings a25 is completely filled with the first connection electrode a3, and the other opening a25 is completely filled with the second connection electrode a4. The first connection electrode a3 and the second connection electrode a4 partly protrude from the respective openings a25 above the surface of the second resin film a24B. The first connection electrode a3 is electrically connected to the pad region a22A of the interconnection film portion a22 present in the one opening a25 through the one opening a25. The second connection electrode a4 is electrically connected to the pad region a22A of the interconnection film portion a22 present in the other opening a25 through the other opening a25. Thus, the first connection electrode a3 and the second connection electrode a4 are electrically connected to the device a5. Here, the interconnection film portions a22 serve as interconnections connected to the assembly of the resistor bodies R (resistor portion a56), the first connection electrode a3 and the second connection electrode a4.

Thus, the second resin film a24B and the insulative film a23 formed with the openings a25 cover the front surface a2A with the first connection electrode a3 and the second connection electrode a4 being exposed from the respective openings a25. Therefore, the electrical connection between the chip resistor a1 and the mount board a9 is achieved through the first connection electrode a3 and the second connection electrode a4 partly protruding from the surface of the second resin film a24B through the openings a25 (see FIG. 18(*b*)).

Here, a portion of the second resin film a24B present between the first connection electrode a3 and the second connection electrode a4 (hereinafter referred to as "middle portion a24C") is raised to a level higher than the first connection electrode a3 and the second connection electrode a4 (away from the front surface a2A). That is, the middle portion a24C has a surface a24D raised to a level higher than the first connection electrode a3 and the second connection electrode a4. The surface a24D is convexly curved away from the front surface a2A.

Figure 27A:
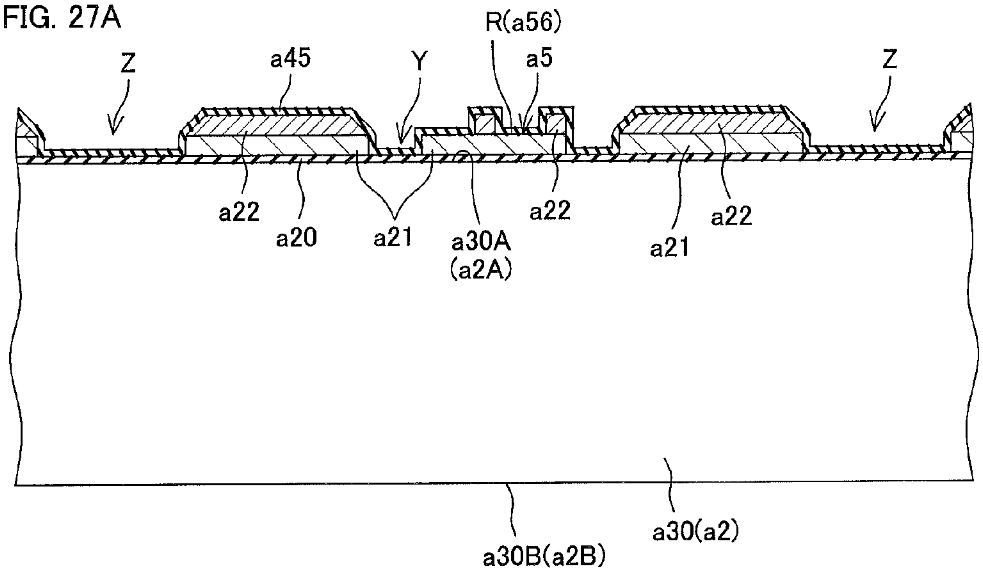
FIG. 27A is a schematic sectional view showing a production method for the chip resistor shown in FIG. 26.

FIGS. 27A to 27G are schematic sectional views showing a production method for the chip resistor shown in FIG. 26. First, as shown in FIG. 27A, a substrate a30 is prepared as a material for the board a2. In this case, a front surface a30A of the substrate a30 corresponds to the front surface a2A of the board a2, and a back surface a30B of the substrate a30 corresponds to the back surface a2B of the board a2.

Then, an insulative layer a20 of $SiO_2$ or the like is formed in the front surface a30A of the substrate a30 by thermally oxidizing the front surface a30A of the substrate a30, and devices a5 (each including resistor bodies R and interconnection film portions a22 connected to the resistor bodies R) are formed on the insulative layer a20. More specifically, a resistive film a21 of TiN, TiON or TiSiON is formed on the entire surface of the insulative layer a20 by sputtering, and then an interconnection film a22 of aluminum (Al) is formed on the resistive film a21 in contact with the resistive film a21. Thereafter, parts of the resistive film a21 and the interconnection film a22 are selectively removed for patterning by a photolithography process and dry etching such as RIE (Reactive Ion Etching). Thus, as shown in FIG. 20A, resistive film lines a21A each formed with the resistive film a21 and having a predetermined width are arranged at a predetermined interval in a column direction as seen in plan. At this time, the resistive film lines a21A and the interconnection film portions a22 are partly cut, and fuses F and conductor films D are formed in trimming regions X described above (see FIG. 19). In turn, parts of the interconnection film portions a22 provided on the respective resistive film lines a21A are selectively removed, for example, by wet etching. As a result, the devices a5 are produced, which are each configured such that interconnection film portions a22 spaced a predetermined distance R from one another are provided on the resistive film lines a21A. At this time, the overall resistance value of each of the devices a5 may be measured in order to check if the resistive film a21 and the interconnection film a22 are formed as each having intended dimensions.

Referring to FIG. 27A, a multiplicity of such devices a5 are formed on the front surface a30A of the substrate a30 according to the number of the chip resistors a1 to be formed on the single substrate a30. Regions of the substrate a30 respectively formed with the devices a5 (the aforementioned resistor portions a56) are each herein referred to as a chip component region Y (or a chip resistor region Y). Therefore, a plurality of chip component regions Y (i.e., the devices a5) each having the resistor portion a56 are formed (defined) on the front surface a30A of the substrate a30. The chip component regions Y each correspond to a single complete chip resistor a1 (see FIG. 26) as seen in plan. A region of the front surface a30A of the substrate a30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate a30. This allows for mass production of the chip resistors a1.

Then, as shown in FIG. 27A, an insulative film a45 of SiN is formed over the entire front surface a30A of the substrate a30 by a CVD (Chemical Vapor Deposition) method. The insulative film a45 entirely covers the insulative layer a20 and the devices a5 (the resistive film a21 and the interconnection film a22) present on the insulative layer a20, and contacts the insulative layer a20 and the devices a5. Therefore, the insulative film a45 also covers the interconnection film portions a22 in the aforementioned trimming regions X (see FIG. 19). Since the insulative film a45 is formed over the entire front surface a30A of the substrate a30, the insulative film a45 extends to a region other than the trimming regions X on the front surface a30A. Thus, the insulative film a45 serves as a protective film for protecting the entire front surface a30A (including the devices a5 on the front surface a30A).

Figure 27B:
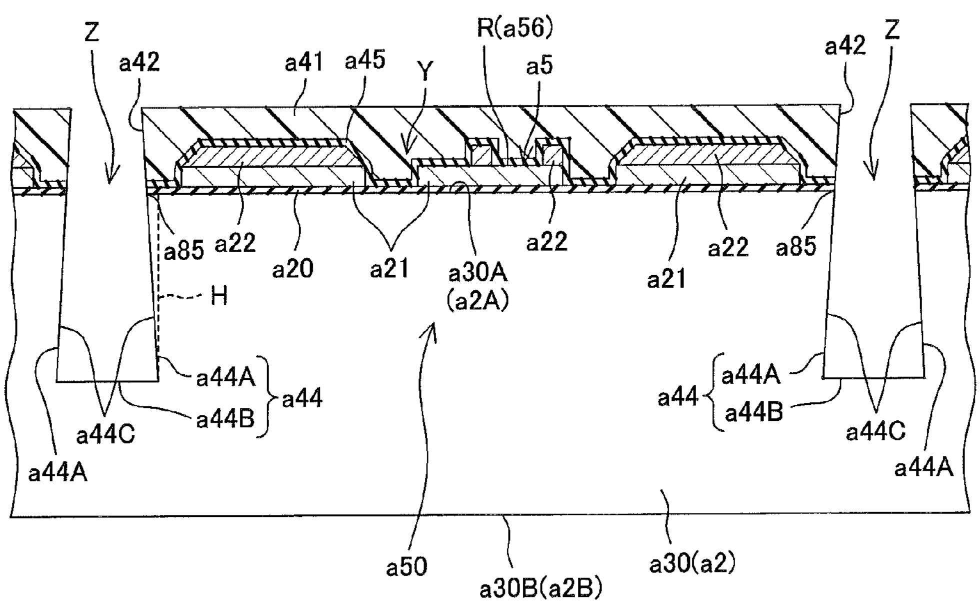
FIG. 27B is a schematic sectional view showing a process step subsequent to that shown in FIG. 27A.
Figure 28:
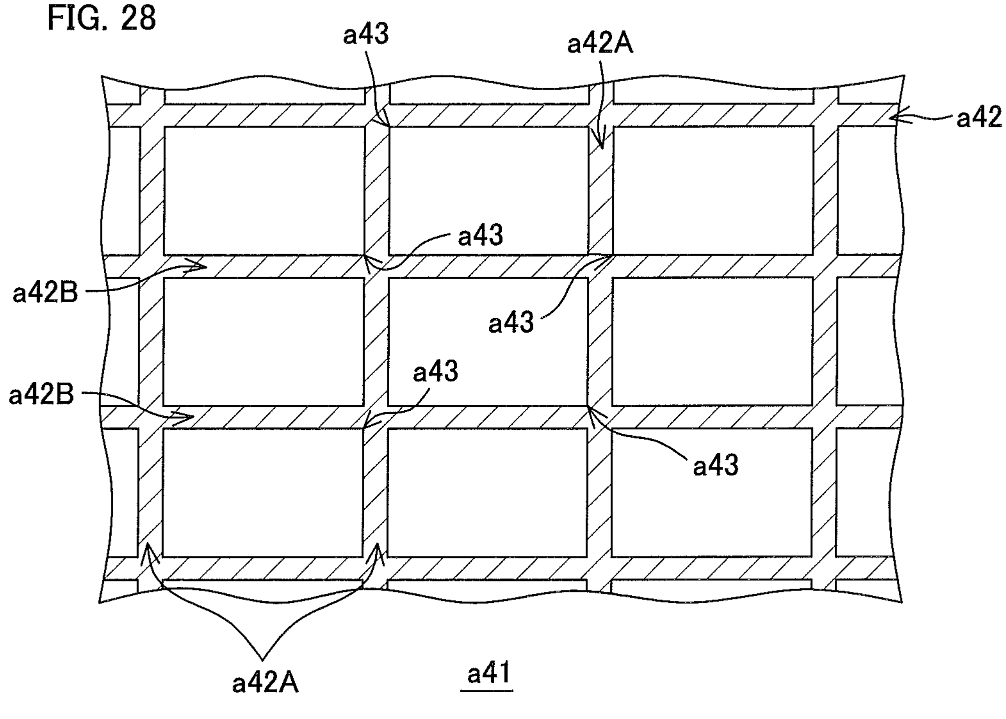
FIG. 28 is a schematic plan view showing a part of a resist pattern to be used for forming a trench in the step of FIG. 27B.

In turn, as shown in FIG. 27B, a resist pattern a41 is formed over the entire front surface a30A of the substrate a30 to entirely cover the insulative film a45. The resist pattern a41 has an opening a42. FIG. 28 is a schematic plan view showing a part of the resist pattern to be used for forming a trench in the process step of FIG. 27B.

Referring to FIG. 28, the opening a42 (hatched in FIG. 28) of the resist pattern a41 is aligned with (or corresponds to) a region (i.e., the boundary region Z) defined between the contours of adjacent chip resistors a1 (i.e., the chip component regions Y described above) as seen in plan when the chip resistors a1 are arranged in a matrix array (or in a lattice form). As a whole, the opening a42 has a lattice shape including linear portions a42A and linear portions a42B orthogonally crossing each other.

The linear portions a42A and the linear portions a42B of the opening a42 of the resist pattern a41 are connected to each other as crossing orthogonally to each other (without any curvature). Therefore, the linear portions a42A and the linear portions a42B interest each other at an angle of about 90 degrees as seen in plan to form angled intersection portions a43. Referring to FIG. 27B, parts of the insulative film a45, the insulative layer a20 and the substrate a30 are selectively removed by plasma etching with the use of the resist pattern a41 as a mask. Thus, a portion of the substrate a30 is removed from the boundary region Z defined between the adjacent devices a5 (chip component regions Y). As a result, a trench a44 is formed in the position (boundary region Z) corresponding to the opening a42 of the resist pattern a41 as seen in plan as extending through the insulative film a45 and the insulative layer a20 into the substrate a30 to a depth halfway the thickness of the substrate a30 from the front surface a30A of the substrate a30. The trench a44 is defined by pairs of side walls a44A opposed to each other, and a bottom wall a44B extending between lower edges of the paired side walls a44A (edges of the paired side walls a44A on the side of the back surface a30B of the substrate a30). The trench a44 has a depth of about 100 μm as measured from the front surface a30A of the substrate a30, and a width of about 20 μm (as measured between the opposed side walls a44A). However, the width of the trench a44 increases toward the bottom wall a44B. Therefore, side surfaces (wall surfaces a44C) of the respective side walls a44A defining the trench a44 are each tilted with respect to a plane H perpendicular to the front surface a30A of the substrate a30.

The trench a44 of the substrate a30 has a lattice shape as a whole corresponding to the shape of the opening a42 (see FIG. 28) of the resist pattern a41 as seen in plan. On the front surface a30A of the substrate a30, rectangular frame-like portions of the trench a44 (the boundary region Z) respectively surround the chip component regions Y in which the devices a5 are respectively provided. Portions of the substrate a30 respectively formed with the devices a5 are semi-finished products a50 of the chip resistors a1. The semi-finished products a50 are respectively located in the chip component regions Y surrounded by the trench a44 on the front surface a30A of the substrate a30. These semi-finished products a50 are arranged in a matrix array. By thus forming the trench a44, the substrate a30 is divided into a plurality of boards a2 (resistor main bodies described above) respectively defined by the chip component regions Y.

Figure 27C:
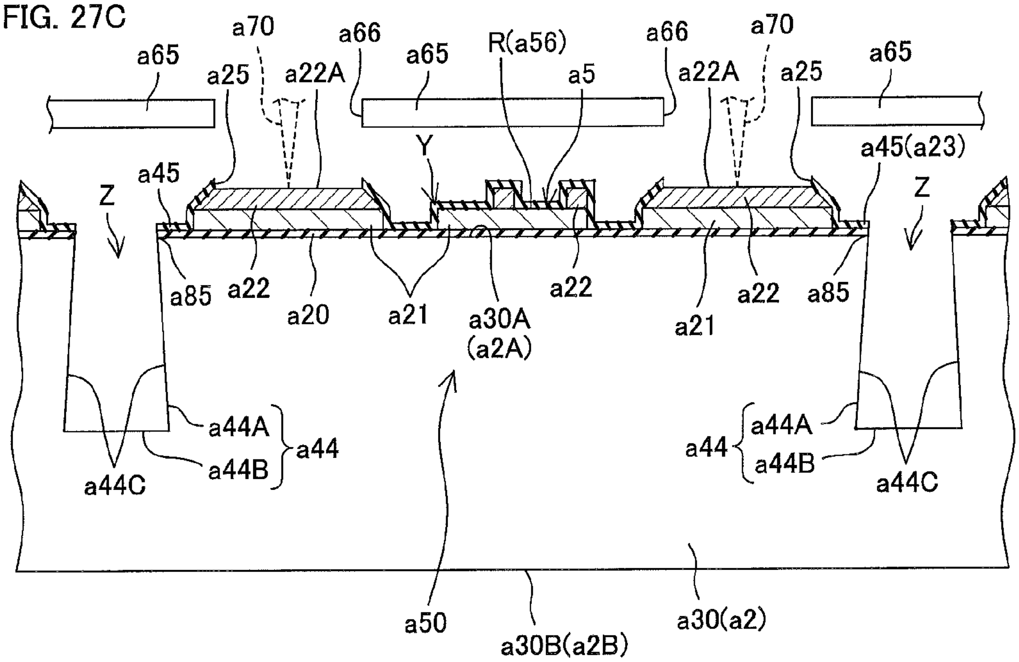
FIG. 27C is a schematic sectional view showing a process step subsequent to that shown in FIG. 27B.

After the trench a44 is formed as shown in FIG. 27B, the resist pattern a41 is removed, and the insulative film a45 is selectively etched off with the use of a mask a65 as shown in FIG. 27C. The mask a65 has openings a66 formed in association with portions of the insulative film a45 aligned with the pad regions a22A (see FIG. 26) as seen in plan. Thus, the portions of the insulative film a45 aligned with the openings a66 are etched off, whereby openings a25 are formed in these portions of the insulative film a45. Thus, the pad regions a22A are exposed from the insulative film a45 in the openings a25. The semi-finished products a50 each have two openings a25.

After the two openings a25 are formed in the insulative film a45 of each of the semi-finished products a50, probes a70 of a resistance measuring device (not shown) are brought into contact with the pad regions a22A in the respective openings a25 to detect the overall resistance value of the device a5. Subsequently, a laser beam (not shown) is applied to desired ones of the fuses F (see FIG. 19) through the insulative film a45, whereby the desired fuses F of the interconnection film portion a22 in the trimming region X described above are trimmed by the laser beam to be fused off. Thus, the overall resistance value of the semi-finished product a50 (i.e., the chip resistor a1) can be controlled, as described above, by selectively fusing off (trimming) the fuses F for the required resistance value. At this time, the insulative film a45 serves as a cover film for covering the devices a5, thereby preventing a short circuit which may otherwise occur when a debris occurring during the fusing adheres to any of the devices a5. Further, the insulative film a45 covers the fuses F (resistive film a21), so that the desired fuse F can be reliably fused off by accumulating the energy of the laser beam therein.

Figure 27D:
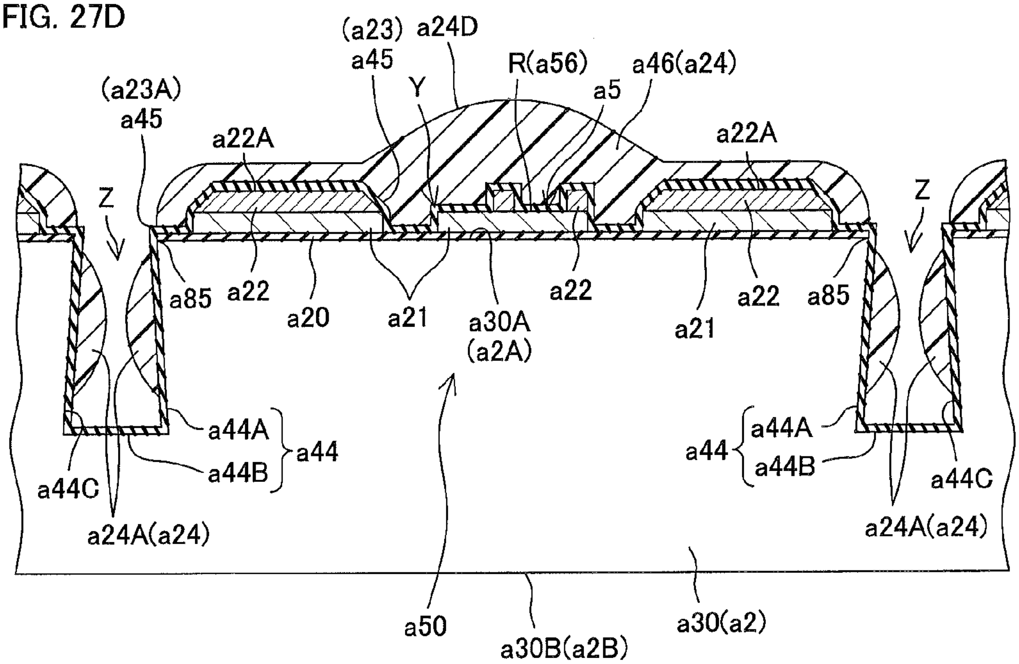
FIG. 27D is a schematic sectional view showing a process step subsequent to that shown in FIG. 27C.

Thereafter, SiN is further deposited on the insulative film a45 by the CVD method to thicken the insulative film a45. At this time, as shown in FIG. 27D, the insulative film a45 is also formed on the entire inner peripheral surface of the trench a44 (the wall surfaces a44C of the side walls a44A and an upper surface of the bottom wall a44B). The insulative film a45 finally has a thickness of 1000 Å to 5000 Å (here, about 3000 Å) (in a state shown in FIG. 27D). At this time, the insulative film a45 partly enters the openings a25 to close the openings a25.

Thereafter, a liquid photosensitive resin of a polyimide is sprayed over the resulting substrate a30 from above the insulative film a45. Thus, a photosensitive resin coating film a46 is formed as shown in FIG. 27D. The liquid photosensitive resin does not stagnate around the mouth of the trench a44 (corresponding to the edge portion a23A of the insulative film a23 and the edge portion a85 of the board a2), but flows. Therefore, the liquid photosensitive resin adheres to regions of the side walls a44A (wall surfaces a44C) of the trench a44 located apart from the front surface a30A of the substrate a30 toward the back surface a30B (toward the bottom wall a44B) and to regions of the front surface a30A located apart from the edge portion a23A of the insulative film a23 to thereby form a coating film a46 (resin film) on these regions. Portions of the coating film a46 present on the front surface a30A each have an upwardly convexly curved shape.

Portions of the coating film a46 formed on the side walls a44A of the trench a44 merely cover parts of the side walls a44A of the trench a44 on the side of the devices a5 (on the side of the front surface a30A), and do not reach the bottom wall a44B of the trench a44. Therefore, the trench a44 is not closed with the coating film a46. In turn, the coating film a46 is thermally treated (cured). Thus, the coating film a46 is thermally shrunk to a smaller thickness, and hardened to have a stable film quality.

Figure 27E:
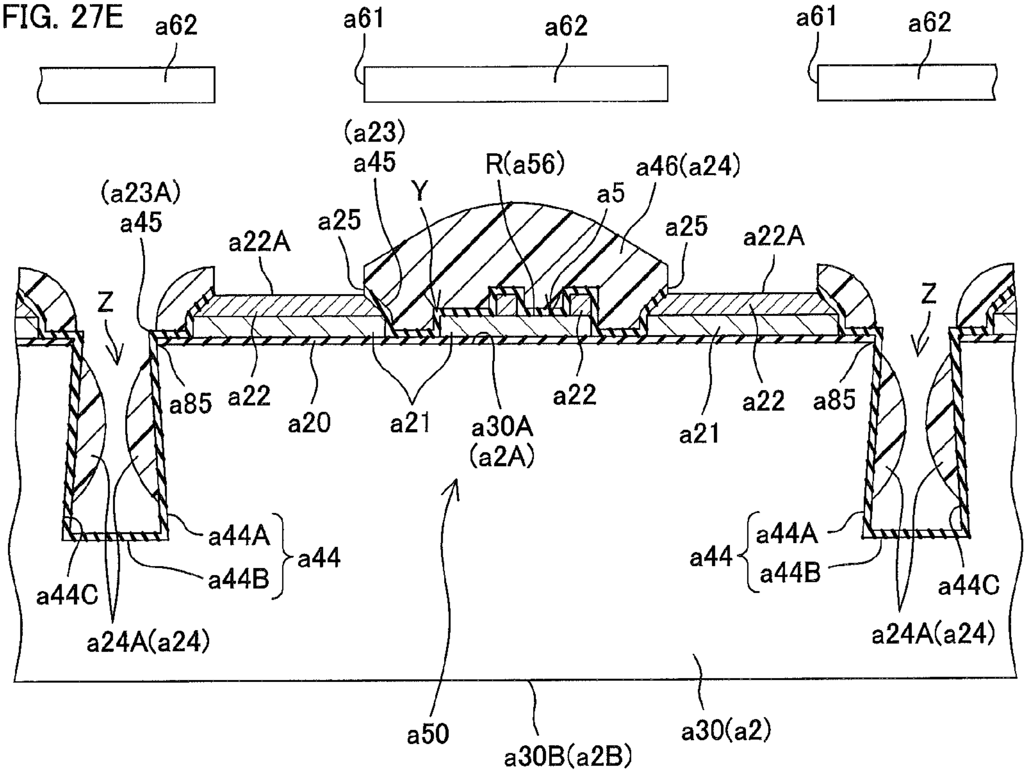
FIG. 27E is a schematic sectional view showing a process step subsequent to that shown in FIG. 27D.

In turn, as shown in FIG. 27E, parts of the coating film a46 aligned with the pad regions a22A of the interconnection film a22 (openings a25) on the front surface a30A as seen in plan are selectively removed by patterning the coating film a46. More specifically, the coating film a46 is exposed to light with the use of a mask a62 of a pattern having openings a61 aligned with (corresponding to) the pad regions a22A as seen in plan, and then developed in the pattern. Thus, the parts of the coating film a46 are removed from above the pad regions a22A. Then, parts of the insulative film a45 on the pad regions a22A are removed by RIE using a mask not shown, whereby the openings a25 are uncovered to expose the pad regions a22A.

Figure 27F:
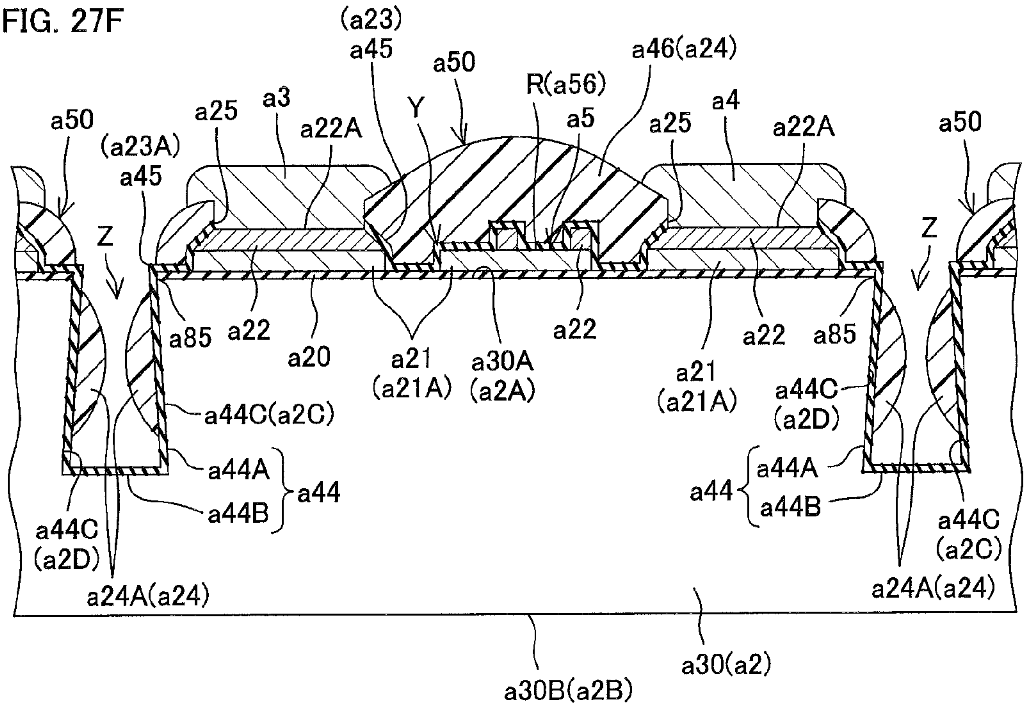
FIG. 27F is a schematic sectional view showing a process step subsequent to that shown in FIG. 27E.

In turn, Ni/Pd/Au multilayer films are formed in the openings a25 on the pad regions a22A by depositing Ni, Pd and Au by electroless plating. At this time, the Ni/Pd/Au multilayer films respectively project from the openings a25 above the surface of the coating film a46. Thus, the Ni/Pd/Au multilayer films formed in the openings a25 serve as the first and second connection electrodes a3, a4 as shown in FIG. 27F. Upper surfaces of the first and second connection electrodes a3, a4 are located at a lower level than apexes of the upwardly convexly curved portions of coating film a46 on the front surface a30A.

Figure 27G:
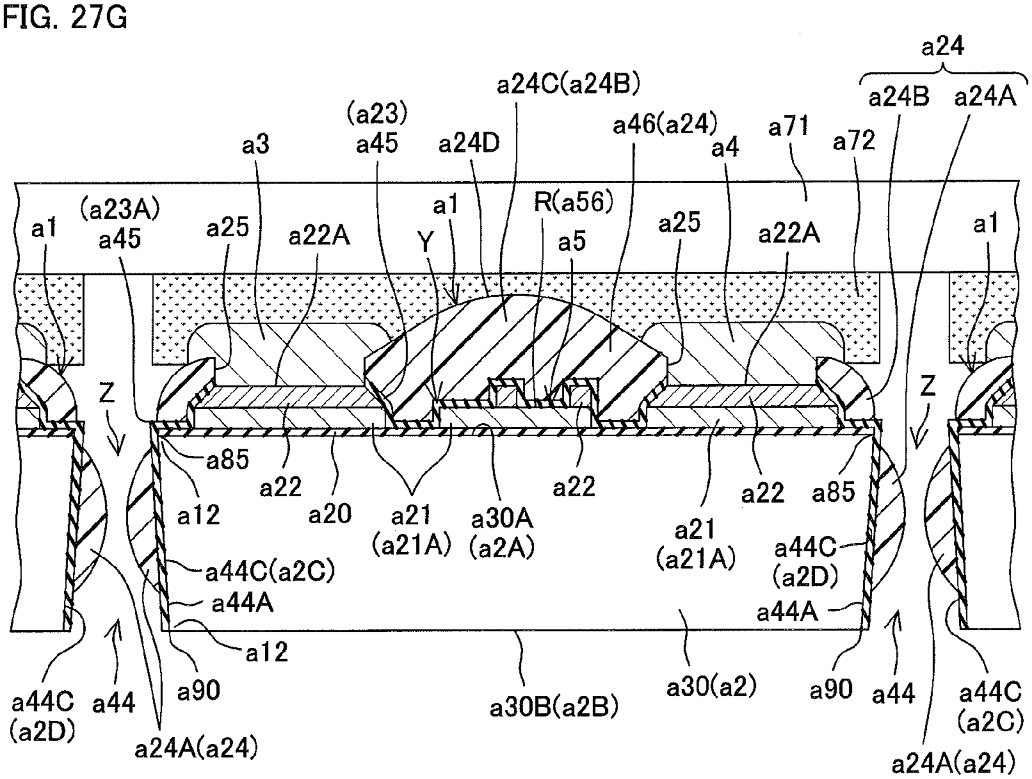
FIG. 27G is a schematic sectional view showing a process step subsequent to that shown in FIG. 27F.

After a continuity test is performed between the first connection electrode a3 and the second connection electrode a4 of each of the semi-finished products a50, the substrate a30 is ground from the back surface a30B. More specifically, as shown in FIG. 27G, a thin-plate support tape a71 of PET (polyethylene terephthalate) having an adhesive surface a72 is applied to the semi-finished products a50 with the adhesive surface a72 bonded to the first and second connection electrodes a3, a4 of the respective semi-finished products a50 (i.e., on the side of the front surface a30A) after the formation of the trench a44. Thus, the semi-finished products a50 are supported by the support tape a71. Here, a laminate tape, for example, may be used as the support tape a71.

With the semi-finished products a50 supported by the support tape a71, the substrate a30 is ground from the back surface a30B. After the substrate a30 is thinned to the bottom wall a44B of the trench a44 (see FIG. 27F) by the grinding, nothing connects the adjacent semi-finished products a50. Therefore, the substrate a30 is divided into the individual semi-finished products a50 along the trench a44. Thus, the chip resistors a1 are completed. That is, the substrate a30 is divided (split) along the trench a44 (i.e., along the boundary region Z), whereby the individual chip resistors a1 are separated from each other. Alternatively, the chip resistors a1 may be separated from each other by etching the substrate a30 from the back surface a30B to the bottom wall a44B of the trench a44.

The wall surfaces a44C of the side walls a44A of the trench a44 provide the side surfaces a2C to a2F of the boards a2 of the respective completed chip resistors a1, and the back surface a30B provides the back surfaces a2B of the respective chip resistors a1. That is, the step of forming the trench a44 by the etching as described above (see FIG. 27B) is involved in the step of forming the side surfaces a2C to a2F. In the step of forming the trench a44, the wall surfaces a44C around the chip component regions Y of the substrate a30 (the side surfaces of the respective chip resistors a1) are simultaneously formed as each having a portion tilted with respect to the plane H perpendicular to the front surface a30A of the substrate a30 (see FIG. 27B). In other words, the formation of the trench a44 is equivalent to the simultaneous formation of the side surfaces a2C to a2F of the boards a2 of the respective chip resistors a1 each having a portion tilted with respect to the plane H.

By the formation of the trench a44 by the etching, the side surfaces a2C to a2F of the completed chip resistors a1 are imparted with rough texture of an irregular pattern. Where the trench a44 is mechanically formed by means of a dicing saw (not shown), a multiplicity of streaks of a regular pattern remain on the side surfaces a2C to a2F. These streaks cannot be removed from the side surfaces a2C to a2F by the etching.

Further, the insulative film a45 provides the insulative films a23 of the respective chip resistors a1, and the divided coating film a46 provides the resin films a24 of the respective chip resistors a1. As described above, the chip resistors a1 (chip components) formed in the respective chip component regions Y defined on the substrate a30 are simultaneously separated from each other (the individual chip resistors a1 can be simultaneously provided) by forming the trench a44 in the substrate a30 and then grinding the substrate a30 from the back surface a30B. This reduces the time required for the production of the plurality of chip resistors a1, thereby improving the productivity of the chip resistors a1. Where the substrate a30 has a diameter of 8 inches, for example, about 500,000 chip resistors a1 can be produced from the single substrate a30. If only the dicing saw (not shown) was used to form the trench a44 in the substrate a30 for cutting out the chip resistors a1, it would be necessary to move the dicing saw many times to form a multiplicity of trench lines a44 in the substrate a30. Therefore, a longer period of time would be required for the production of the chip resistors a1. Where the trench a44 is formed at a time by the etching according to the first reference embodiment, in contrast, the aforementioned inconvenience can be eliminated.

Even if the chip resistors a1 each have a smaller chip size, the chip resistors a1 can be simultaneously separated from each other by first forming the trench a44 and then grinding the substrate a30 from the back surface a30B. The elimination of the dicing step reduces the costs and the production time, and improves the yield as compared with the conventional case in which the chip resistors a1 are separated from each other by dicing the substrate a30 by means of the dicing saw.

Further, the trench a44 can be formed accurately by the etching, so that the chip resistors a1 produced by dividing the substrate along the trench a44 are improved in outer dimensional accuracy. Particularly, the trench a44 can be more accurately formed by the plasma etching. More specifically, the dimensional error of the chip resistors a1 produced according to the first reference embodiment can be reduced to about ±5 μm, while the dimensional error of chip resistors a1 produced by a common method in which the dicing saw is used for the formation of the trench a44 is ±20 μm. Further, the pitch of the trench lines a44 can be reduced according to the resist pattern a41 (see FIG. 28), allowing for size reduction of the chip resistors a1 formed between adjacent trench lines a44. In addition, the chipping of corner portions Al 1 of the chip resistors a1 defined between the side surfaces a2C to a2F (see FIG. 18(*a*)) is less liable to occur, because the etching does not involve the cutting-out of the chip resistors a1 which may otherwise be involved when the dicing saw is used. This improves the appearance of the chip resistors a1.

When the substrate a30 is ground from the back surface a30B, the chip resistors a1 are separated from each other in a time staggered manner. That is, the chip resistors a1 are separated from each other with slight time differences. In this case, a chip resistor a1 separated earlier is liable to laterally vibrate to be brought into contact with adjacent chip resistors a1. At this time, the resin films a24 (first resin films a24A) of the respective chip resistors a1 each function as a bumper. Therefore, even if adjacent ones of the chip resistors a1 supported by the support tape a71 before separation thereof bump against each other, the resin films a24 of the respective chip resistors a1 are first brought into contact with each other. This prevents or suppresses the chipping of corner portions a12 of the front surface a2A and the back surface a2B (particularly, the edge portion a85 of the front surface a2A) of each of the chip resistors a1. Particularly, the first resin film a24A projects outward of the edge portion a85 of the front surface a2A of the chip resistor a1, preventing the edge portion a85 from being brought into contact with the surroundings. This prevents or suppresses the chipping of the edge portion a85.

Figure 29A:
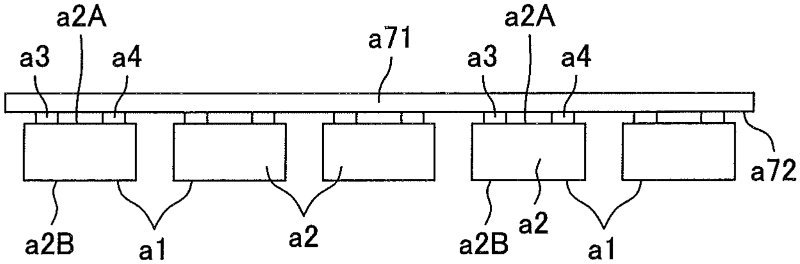
FIG. 29A is a schematic sectional view showing chip resistors after the step of FIG. 27G.
Figure 29B:
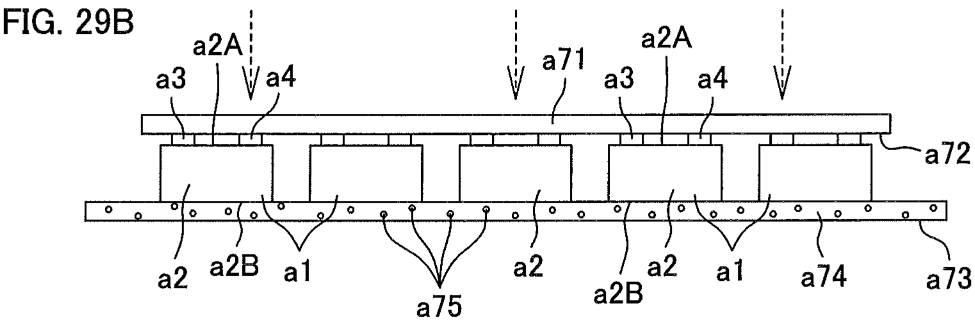
FIG. 29B is a schematic sectional view showing a process step subsequent to that shown in FIG. 29A.

The back surface a2B of the board a2 of the completed chip resistor a1 may be polished or etched to be mirror-finished. FIGS. 29A to 29D are schematic sectional views showing a chip resistor collecting step to be performed after the process step of FIG. 27G. In FIG. 29A, the chip resistors a1 separated from each other still adhere to the support tape a71. In this state, as shown in FIG. 29B, a heat-foamable sheet a73 is bonded to the back surfaces a2B of the boards a2 of the respective chip resistors a1. The heat-foamable sheet a73 includes a sheet body a74 in a sheet form and a multiplicity of foamable particles a75 dispersed in the sheet body a74 by kneading.

Figure 29C:
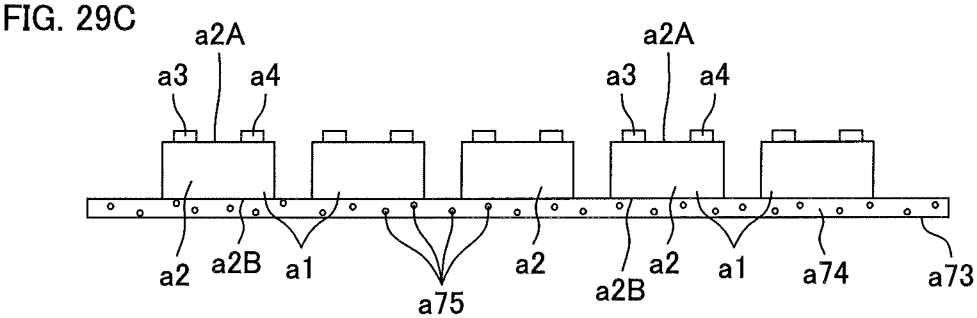
FIG. 29C is a schematic sectional view showing a process step subsequent to that shown in FIG. 29B.

The sheet body a74 has a greater adhesive force than the adhesive surface a72 of the support tape a71. Therefore, the heat-foamable sheet a73 is bonded to the back surfaces a2B of the boards a2 of the respective chip resistors a1, and then the support tape a71 is removed from the chip resistors a1 as shown in FIG. 29C. Thus, the chip resistors a1 are transferred to the heat-foamable sheet a73. At this time, the support tape a71 is irradiated with ultraviolet radiation (as indicated by broken line arrows in FIG. 29B), whereby the adhesive force of the adhesive surface a72 is reduced. This makes it easier to remove the support tape a71 from the chip resistors a1.

Figure 29D:
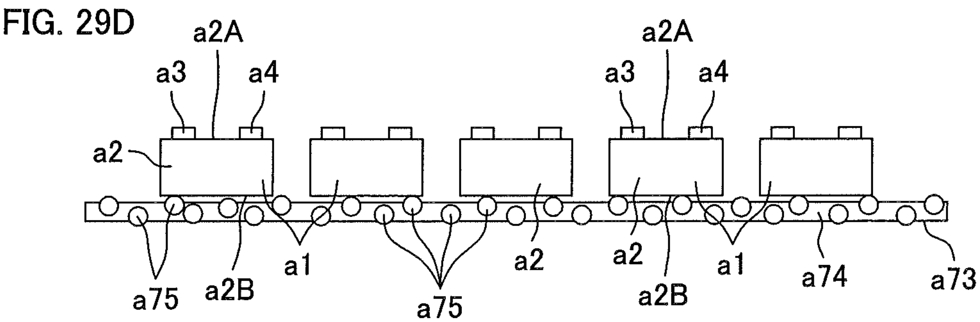
FIG. 29D is a schematic sectional view showing a process step subsequent to that shown in FIG. 29C.

Then, the heat-foamable sheet a73 is heated. Thus, as shown in FIG. 29D, the foamable particles a75 dispersed in the sheet body a74 are foamed in the heat-foamable sheet a73, whereby the foamable particles a75 are bulged from a surface of the sheet body a74. As a result, the heat-foamable sheet a73 contacts the back surfaces a2B of the boards a2 of the respective chip resistors a1 with a smaller contact area, so that all the chip resistors a1 are naturally removed (fall out) from the heat-foamable sheet a73. The chip resistors a1 collected in this manner are each mounted on a mount board a9 (see FIG. 18(*b*)), or respectively accommodated in accommodation spaces formed in an embossed carrier tape (not shown). In this case, the process time can be reduced as compared with a case in which the chip resistors a1 are removed one by one from the support tape a71 or the heat-foamable sheet a73. Of course, a predetermined number of chip resistors a1 out of the chip resistors a1 bonded to the support tape a71 (see FIG. 29A) may be removed at a time directly from the support tape a71 without the use of the heat-foamable sheet a73.

Figure 30A:
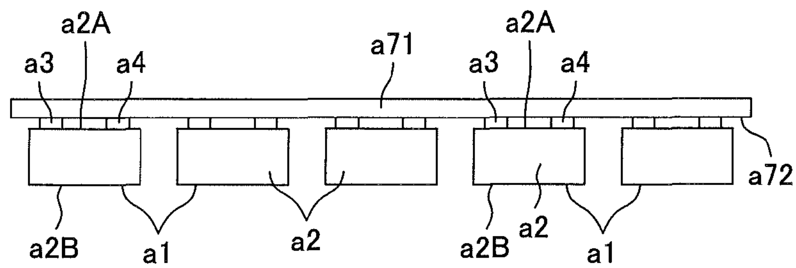
FIG. 30A is a schematic sectional view showing chip resistors after the step of FIG. 27G.
Figure 30B:
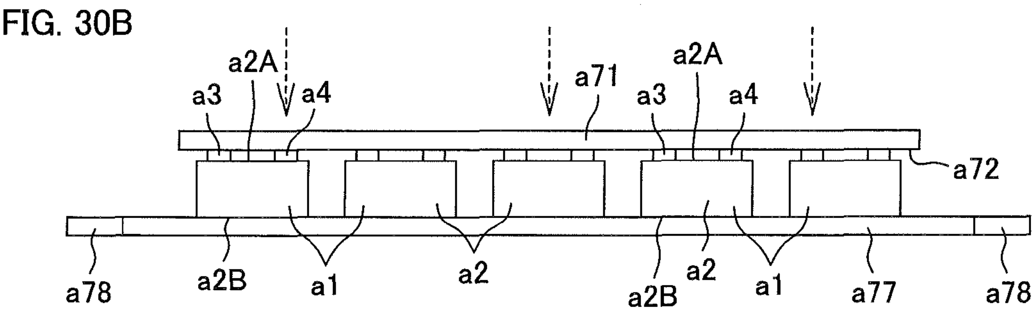
FIG. 30B is a schematic sectional view showing a process step subsequent to that shown in FIG. 30A.
Figure 30C:
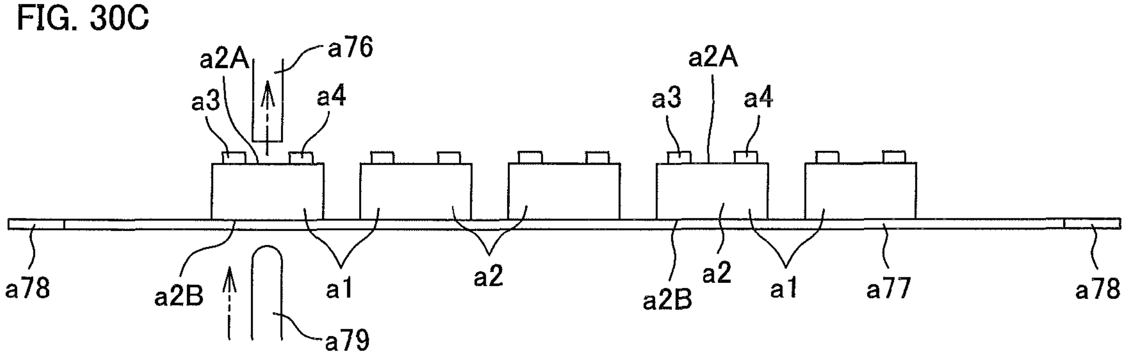
FIG. 30C is a schematic sectional view showing a process step subsequent to that shown in FIG. 30B.

FIGS. 30A to 30C are schematic sectional views showing a modification of the chip resistor collecting step to be performed after the process step of FIG. 27G. The chip resistors a1 may be collected by another method shown in FIGS. 30A to 30C. In FIG. 30A, the chip resistors a1 separated from each other still adhere to the support tape a71 as in FIG. 29A. In this state, as shown in FIG. 30B, a transfer tape a77 is bonded to the back surfaces a2B of the boards a2 of the respective chip resistors a1. The transfer tape a77 has a greater adhesive force than the adhesive surface a72 of the support tape a71. After the transfer tape a77 is bonded to the chip resistors a1, the support tape a71 is removed from the chip resistors a1 as shown in FIG. 30C. At this time, the support tape a71 may be irradiated with ultraviolet radiation (as indicated by broken line arrows in FIG. 30B) for reduction of the adhesiveness of the adhesive surface a72 as described above.

Frames a78 of a collecting device (not shown) are respectively bonded to opposite ends of the transfer tape a77. The frames a78 on the opposite sides are movable toward and away from each other. After the support tape a71 is removed from the chip resistors a1, the opposite-side frames a78 are moved away from each other, whereby the transfer tape a77 is stretched to be thinned. This reduces the adhesive force of the transfer tape a77, making it easier to remove the chip resistors a1 from the transfer tape a77. In this state, a suction nozzle a76 of a transport device (not shown) is moved toward the front surface a2A of one of the chip resistors a1, whereby the chip resistor a1 is removed from the transfer tape a77 by a suction force generated by the transport device (not shown) and sucked by the suction nozzle a76. At this time, the chip resistor a1 may be pushed up toward the suction nozzle a76 from a side opposite from the suction nozzle a76 with the intervention of the transfer tape a77. Thus, the chip resistor a1 can be smoothly removed from the transfer tape a77. The chip resistor a1 collected in this manner is transported by the transport device (not shown) while being sucked by the suction nozzle a76.

Figure 31:
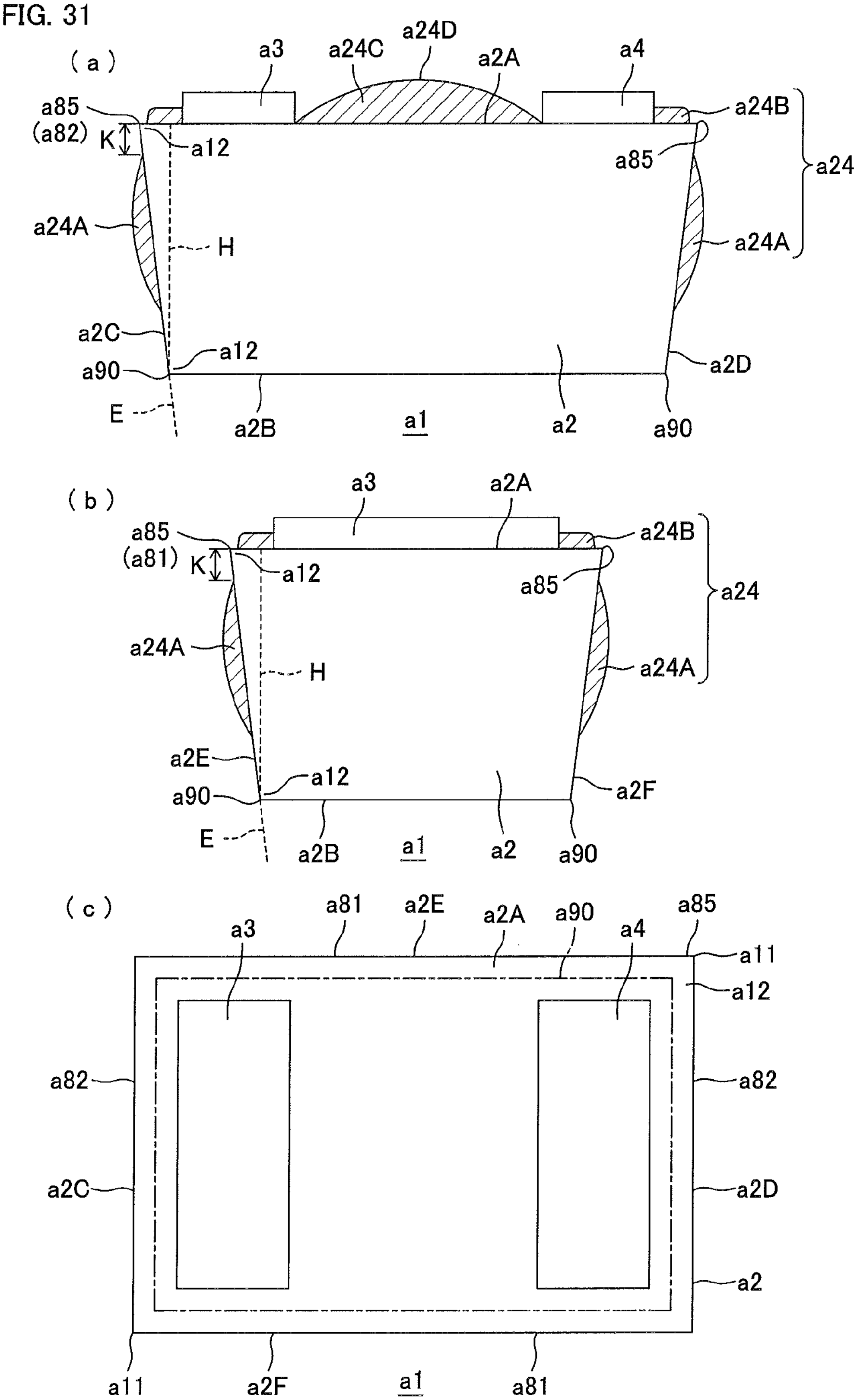
FIG. 31(*a*) is a schematic vertical sectional view taken longitudinally of the chip resistor, and FIG. 31(*b*) is a schematic vertical sectional view taken widthwise of the chip resistor.
Figure 32:
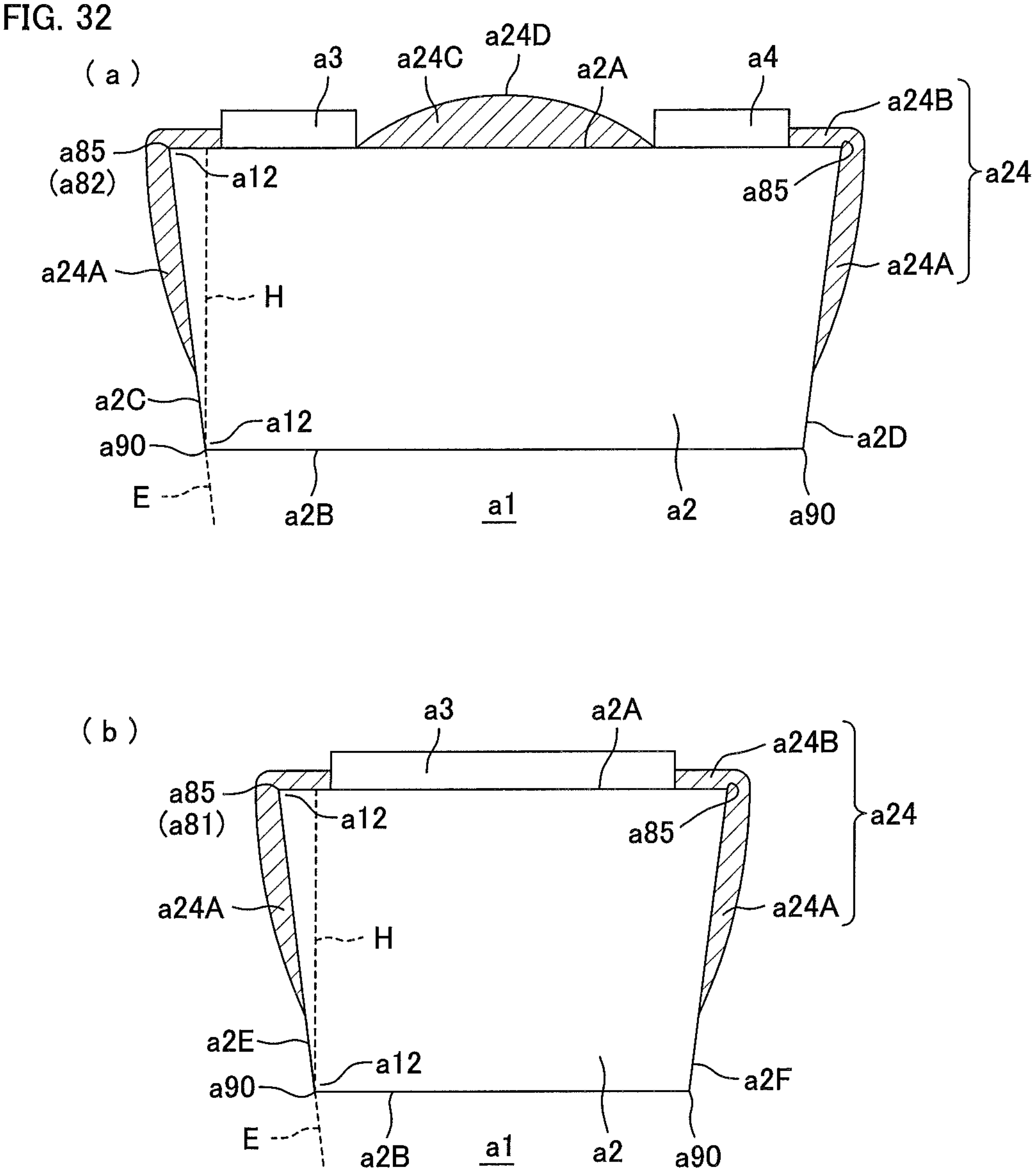
FIG. 32 illustrate a chip resistor according to a first modification of the first reference embodiment, FIG. 32(*a*) being a schematic vertical sectional view taken longitudinally of the chip resistor, FIG. 32(*b*) being a schematic vertical sectional view taken widthwise of the chip resistor.
Figure 33:
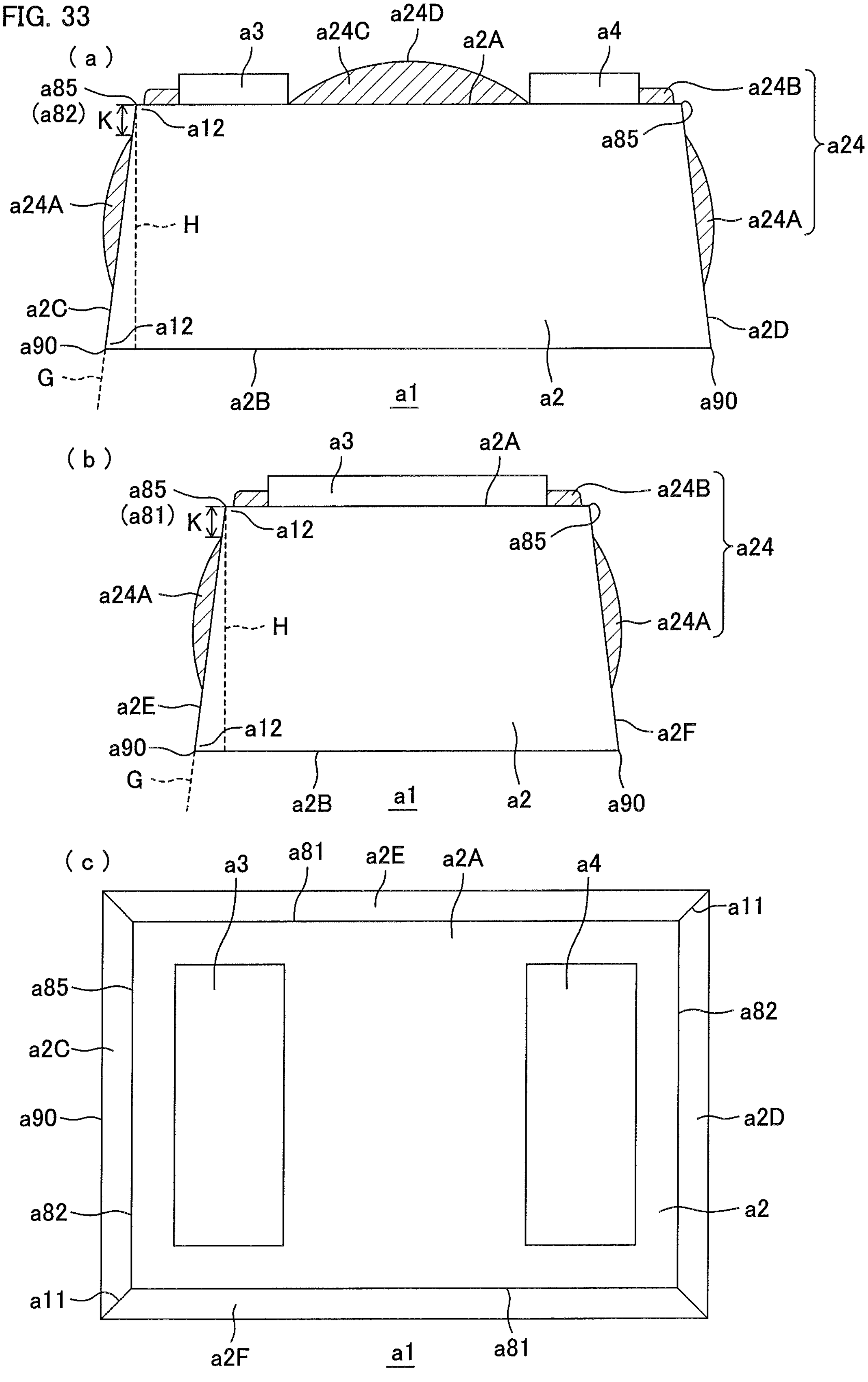
FIG. 33 illustrate a chip resistor according to a second modification of the first reference embodiment, FIG. 33(*a*) being a schematic vertical sectional view taken longitudinally of the chip resistor, FIG. 33(*b*) being a schematic vertical sectional view taken widthwise of the chip resistor, FIG. 31(*c*) being a plan view of the chip resistor.

FIGS. 31 to 36 are vertical sectional views of the chip resistors according to the embodiment described above and modifications of the embodiment, and FIGS. 31 and 33 also show plan views. In FIGS. 31 to 36, the insulative film a23 and some other elements are omitted, but only the board a2, the first connection electrode a3, the second connection electrode a4 and the resin film a24 are shown for convenience of description. In FIGS. 31(*c*) and 33(*c*), the resin film a24 is not shown.

As shown in FIGS. 31 to 36, the side surfaces a2C to a2F of the board a2 each have a portion tilted with respect to the plane H perpendicular to the front surface a2A of the board a2. In each of the chip resistors a1 shown in FIGS. 31 and 32, the side surfaces a2C to a2F of the board a2 each extend along a plane E tilted with respect to the plane H described above. Further, the side surfaces a2C to a2F of the board a2 each form an acute angle with respect to the front surface a2A of the board a2. Therefore, the edge portion a90 of the back surface a2B of the board a2 is retracted with respect to the edge portion a85 of the front surface a2A of the board a2 inward of the board a2. More specifically, the rectangular edge portion a90 defining the contour of the back surface a2B is located inward of the rectangular edge portion a85 defining the contour of the front surface a2A as seen in plan (see FIG. 31(*c*)). Therefore, the planes E for the side surfaces a2C to a2F are tilted as extending from the edge portion a85 of the front surface a2A toward the edge portion a90 of the back surface a2B inward of the board a2. Thus, the side surfaces a2C to a2F of the chip resistor a1 each have a trapezoidal shape (generally isosceles trapezoidal shape) tapered toward the back surface a2B.

As described above, the first resin film a24A of the resin film a24 is provided on the portions of the side surfaces a2C to a2F located apart from the boundaries between the front surface a2A and the respective side surfaces (the edge portion a85) toward the back surface a2B, and the second resin film a24B is provided on the front surface a2A. Alternatively, as shown in FIG. 32, the first resin film a24A provided on the side surfaces a2C to a2F may be inseparable from the second resin film a24B along the boundaries between the front surface a2A and the respective side surfaces (the edge portion a85). In this case, the resin film a24 extends continuously from the side surfaces a2C to a2F to the front surface a2A.

In the chip resistor a1 shown in FIG. 33, the side surfaces a2C to a2F each extend along a plane G tilted with respect to the aforementioned plane H. The side surfaces a2C to a2F of the board a2 each form an obtuse angle with respect to the front surface a2A of the board a2. Therefore, the edge portion a90 of the back surface a2B of the board a2 projects with respect to the edge portion a85 of the front surface a2A of the board a2 outward of the board a2. More specifically, the rectangular edge portion a90 defining the contour of the back surface a2B is located outward of the rectangular edge portion a85 defining the contour of the front surface a2A as seen in plan (see FIG. 33(*c*)). Therefore, the planes G for the side surfaces a2C to a2F are tilted as extending from the edge portion a85 of the front surface a2A toward the edge portion a90 of the back surface a2B outward of the board a2. Thus, the side surfaces a2C to a2F of the chip resistor a1 each have a trapezoidal shape (generally isosceles trapezoidal shape) tapered toward the front surface a2A.

Figure 34:
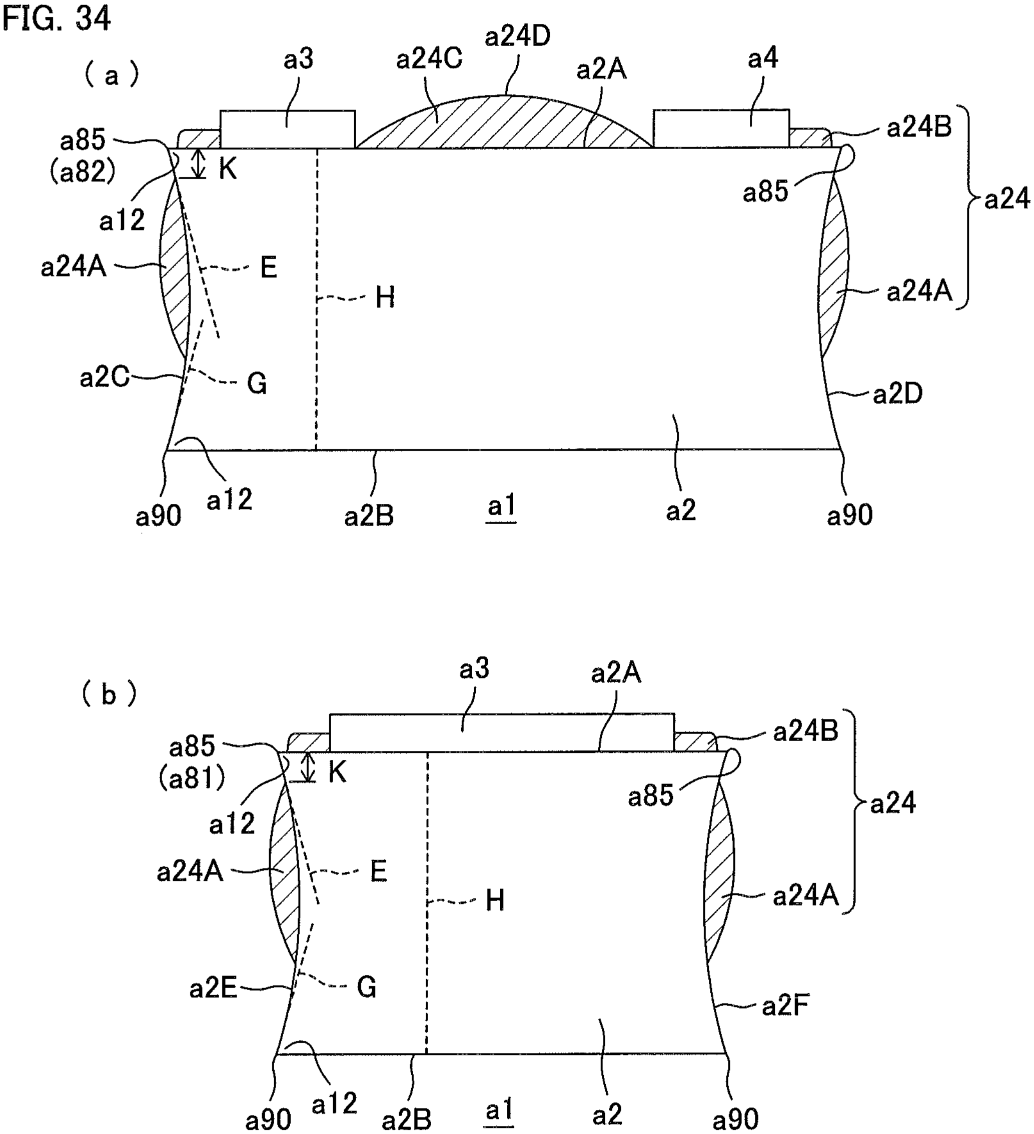
FIG. 34 illustrate a chip resistor according to a third modification of the first reference embodiment, FIG. 34(*a*) being a schematic vertical sectional view taken longitudinally of the chip resistor, FIG. 34(*b*) being a schematic vertical sectional view taken widthwise of the chip resistor.
Figure 35:
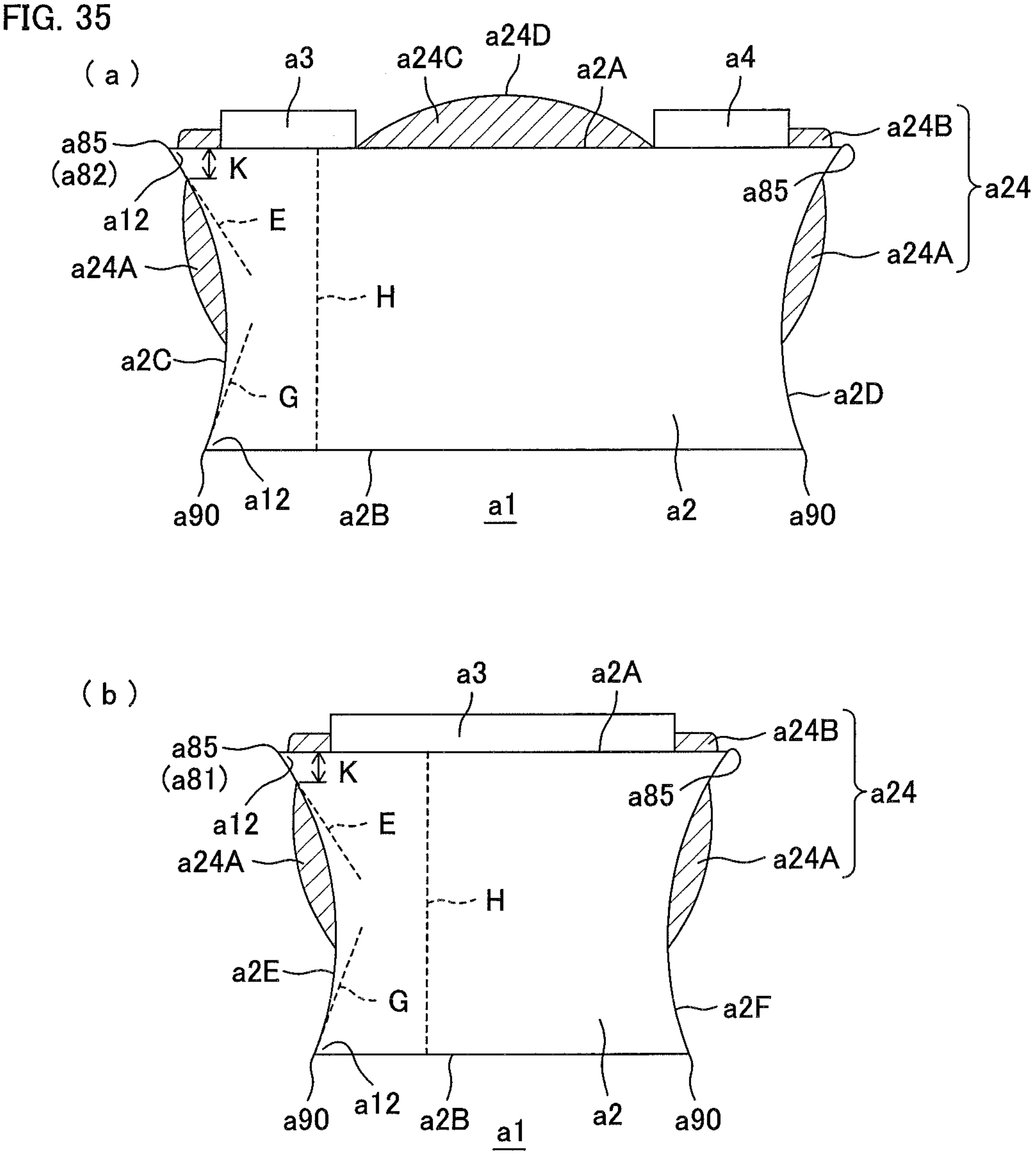
FIG. 35 illustrate a chip resistor according to a fourth modification of the first reference embodiment, FIG. 35(*a*) being a schematic vertical sectional view taken longitudinally of the chip resistor, FIG. 35(*b*) being a schematic vertical sectional view taken widthwise of the chip resistor.
Figure 36:
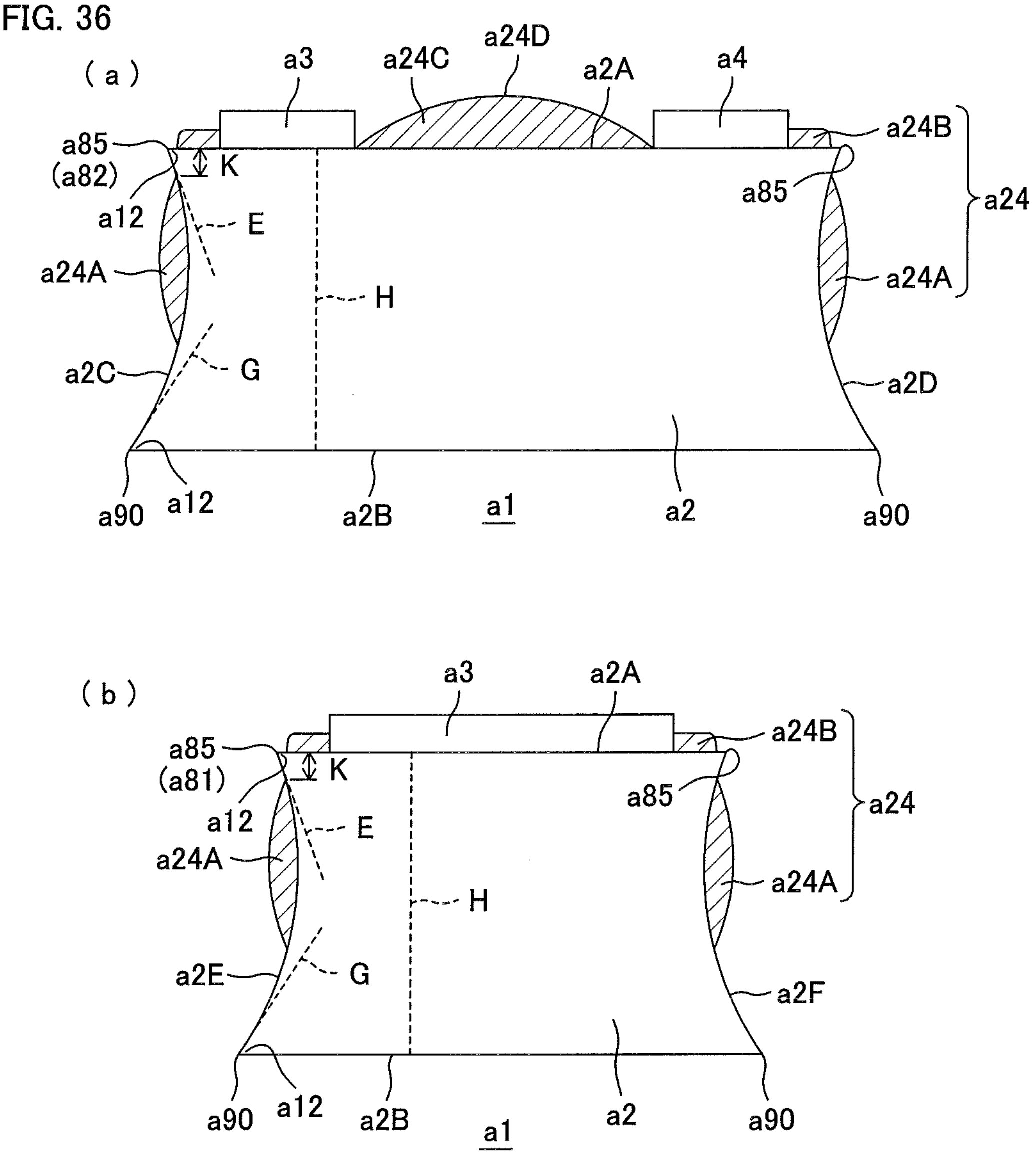
FIG. 36 illustrate a chip resistor according to a fifth modification of the first reference embodiment, FIG. 36(*a*) being a schematic vertical sectional view taken longitudinally of the chip resistor, FIG. 36(*b*) being a schematic vertical sectional view taken widthwise of the chip resistor.

The side surfaces a2C to a2F are not necessarily each required to be a flat surface tilted with respect to the plane H as described above, but may each be a surface, as shown in FIGS. 34 to 36, which is curved concavely inward of the board a2 and has portions tilted with respect to the plane H (curved surface portions tangent to the planes E and G). In this case, the side surfaces a2C to a2F of the board a2 each form an acute angle with respect to the front surface a2A of the board a2, and each form an acute angle with respect to the back surface a2B of the board a2.

In FIG. 34, the edge portion a90 of the back surface a2B of the board a2 is not offset from the edge portion a85 of the front surface a2A of the board a2 either inward or outward of the board a2, but coincides with the edge portion a85 of the front surface a2A of the board a2 as seen in plan. In FIG. 35, the edge portion a90 of the back surface a2B of the board a2 is retracted with respect to the edge portion a85 of the front surface a2A of the board a2 inward of the board a2. In FIG. 36, the edge portion a90 of the back surface a2B of the board a2 projects with respect to the edge portion a85 of the front surface a2A of the board a2 outward of the board a2.

The side surfaces a2C to a2F shown in any of FIGS. 31 to 36 can be formed by properly controlling the etching conditions for the formation of the trench a44. That is, the shapes of the side surfaces a2C to a2F of the board a2 can be controlled by etching techniques. As described above, either one of the edge portion a85 of the front surface a2A and the edge portion a90 of the back surface a2B of the board a2 of the chip resistor a1 projects with respect to the other edge portion outward of the board a2 (the chip resistor a1 shown in FIG. 34 is an exception). Therefore, none of the corner portions a12 of the front surface a2A and the back surface a2B of the chip resistor a1 is right-angled, so that the corner portions a12 (particularly, obtuse corner portions a12) are less susceptible to the chipping.

Particularly, the back surface a2B of the board a2 of the chip resistor a1 shown in either of FIGS. 31 and 32 has obtuse corner portions a12 (in the edge portion a90), so that these corner portions a12 are less susceptible to the chipping. Further, the front surface a2A of the board a2 of the chip resistor a1 shown in FIG. 33 has obtuse corner portions a12 (in the edge portion a85), so that these corner portions a12 are less susceptible to the chipping.

When the chip resistor a1 is mounted on a mount board a9 (see FIG. 18(*b*)), a suction nozzle (not shown) of an automatic mounting machine sucks the back surface a2B of the chip resistor a1, and is moved to the mount board a9. Thus, the chip resistor a1 is mounted on the mount board a9. Prior to the suction of the chip resistor a1 by the suction nozzle (not shown), the contour of the chip resistor a1 is detected from the side of the front surface a2A or the back surface a2B through image recognition, and a portion of the back surface a2B of the chip resistor a1 to be sucked by the suction nozzle (not shown) is determined. Where either one of the edge portion a85 of the front surface a2A and the edge portion a90 of the back surface a2B of the board a2 projects with respect to the other edge portion outward of the board a2, the contour of the chip component detected from the side of the front surface a2A or the back surface a2B of the board a2 through the image recognition is clearly defined by the one edge portion a85 or a90 (the edge portion projecting outward of the board a2). Therefore, the contour of the chip resistor a1 can be accurately detected, so that the intended portion (e.g., a center portion) of the back surface a2B of the chip resistor a1 can be accurately sucked by the suction nozzle (not shown). Thus, the chip resistor a1 can be accurately mounted on the mount board a9 (see FIG. 18(*b*)). That is, the mount positioning accuracy can be improved.

In the chip resistor a1 shown in any of FIGS. 31 and 33 to 36, particularly, the first resin film a24A is provided on the regions of the side surfaces a2C to a2F each spaced the distance K from the front surface a2A so that the edge portion a85 of the board a2 is exposed. In the chip resistor a1 shown in any of FIGS. 31 and 34 to 36, the side surfaces a2C to a2F of the board a2 each form an acute angle with respect to the front surface a2A. Therefore, the edge portion a85 of the front surface a2A of the board a2 is distinctive, so that the contour of the chip resistor a1 (the edge portion a85) can be further clearly detected. Thus, the chip resistor a1 can be more accurately mounted on the mount board a9. That is, the contour of the chip resistor a1 can be easily detected based on the edge portion a85. Thus, the suction nozzle (not shown) can accurately suck the intended portion of the chip resistor a1. Where a focus is placed on the edge portion a85 or the edge portion a90 for the image recognition, the first resin film a24A is out of focus and hence is obscure. Thus, the edge portion a85 or the edge portion a90 can be distinguished from the first resin film a24A.

Where the prevention of the chipping of the corner portions a12 precedes the improvement of the mount positioning accuracy, on the other hand, the corner portions a12 of the board a2 (here, the corner portions a12 of the front surface a2A) may be covered with the resin film a24 as shown in FIG. 32. In this case, the chipping of the corner portions a12 can be reliably prevented or suppressed. Further, the front surface a2A of the board a2 is protected with the second resin film a24B. Particularly, the surface a24D of the second resin film a24B (the middle portion a24C) is located at a higher height level than the first connection electrode a3 and the second connection electrode a4 (not shown in FIGS. 31(*b*), 32(*b*), 33(*b*), 34(*b*), 35(*b*) and 36(*b*)). Even if an impact is applied to the front surface a2A of the board a2 from the mount board a9 when the chip resistor a1 is mounted on the mount board a9 as shown in FIG. 18(*b*), the second resin film a24B (the middle portion a24C) first receives the impact. Thus, the second resin film a24B can reduce the impact, making it possible to reliably protect the front surface a2A of the board a2.

While the examples of the first reference embodiment have thus been described, the first reference embodiment may be embodied in other forms. In the examples described above, the chip resistor a1 is disclosed as an exemplary chip component according to the first reference embodiment. The first reference embodiment is applicable to a chip capacitor, a chip inductor, a chip diode and other chip components. The chip capacitor will hereinafter be described.

Figure 37:
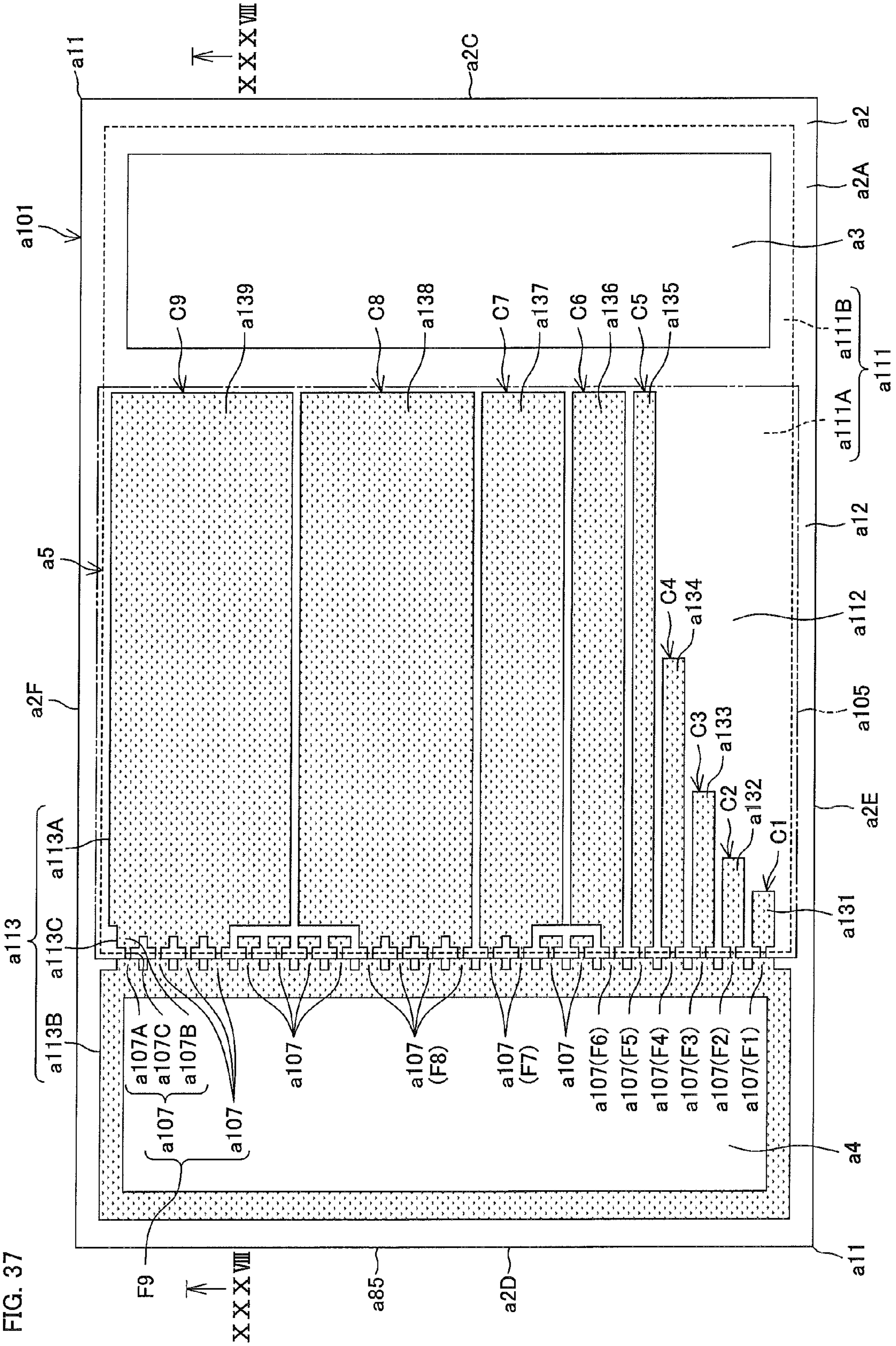
FIG. 37 is a plan view of a chip capacitor according to another example of the first reference embodiment.
Figure 38:
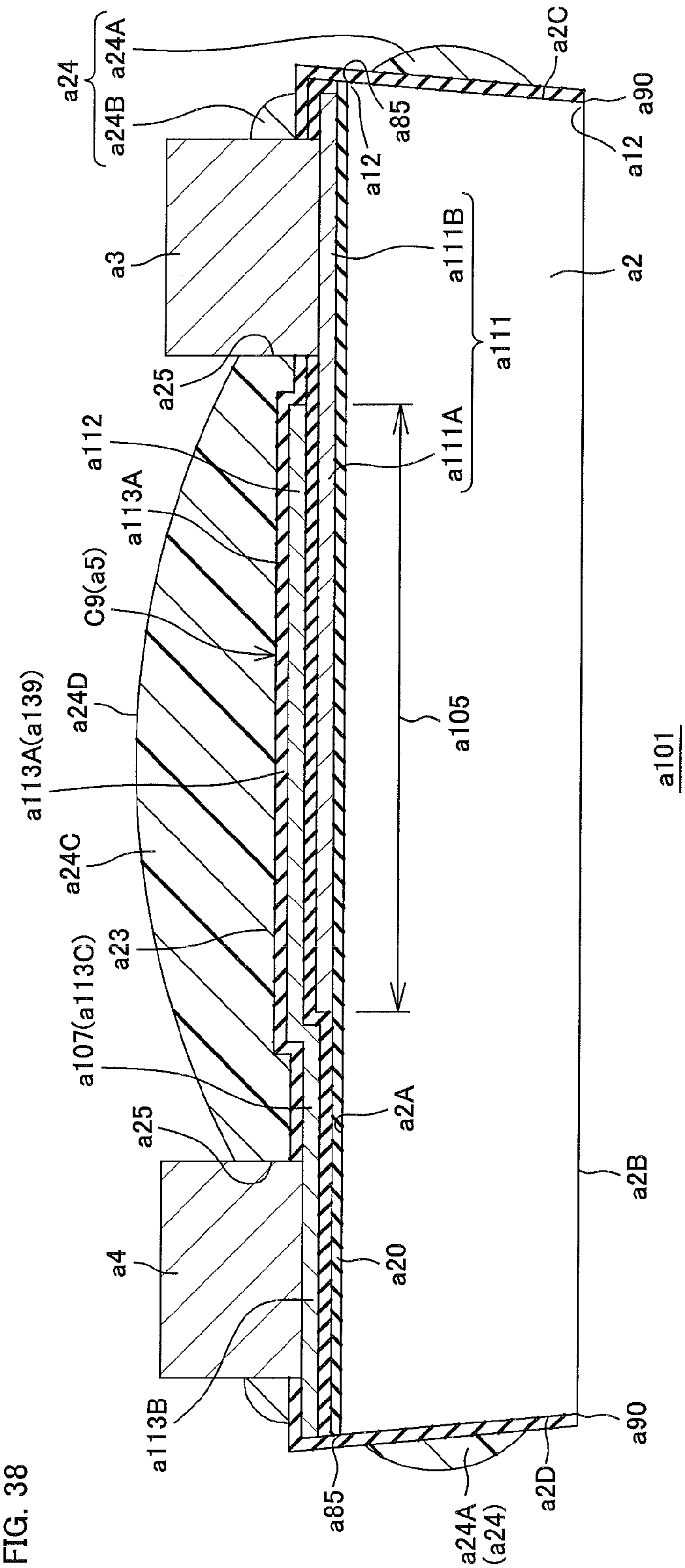
FIG. 38 is a sectional view taken along a sectional line XXXVIII-XXXVIII in FIG. 37.
Figure 39:
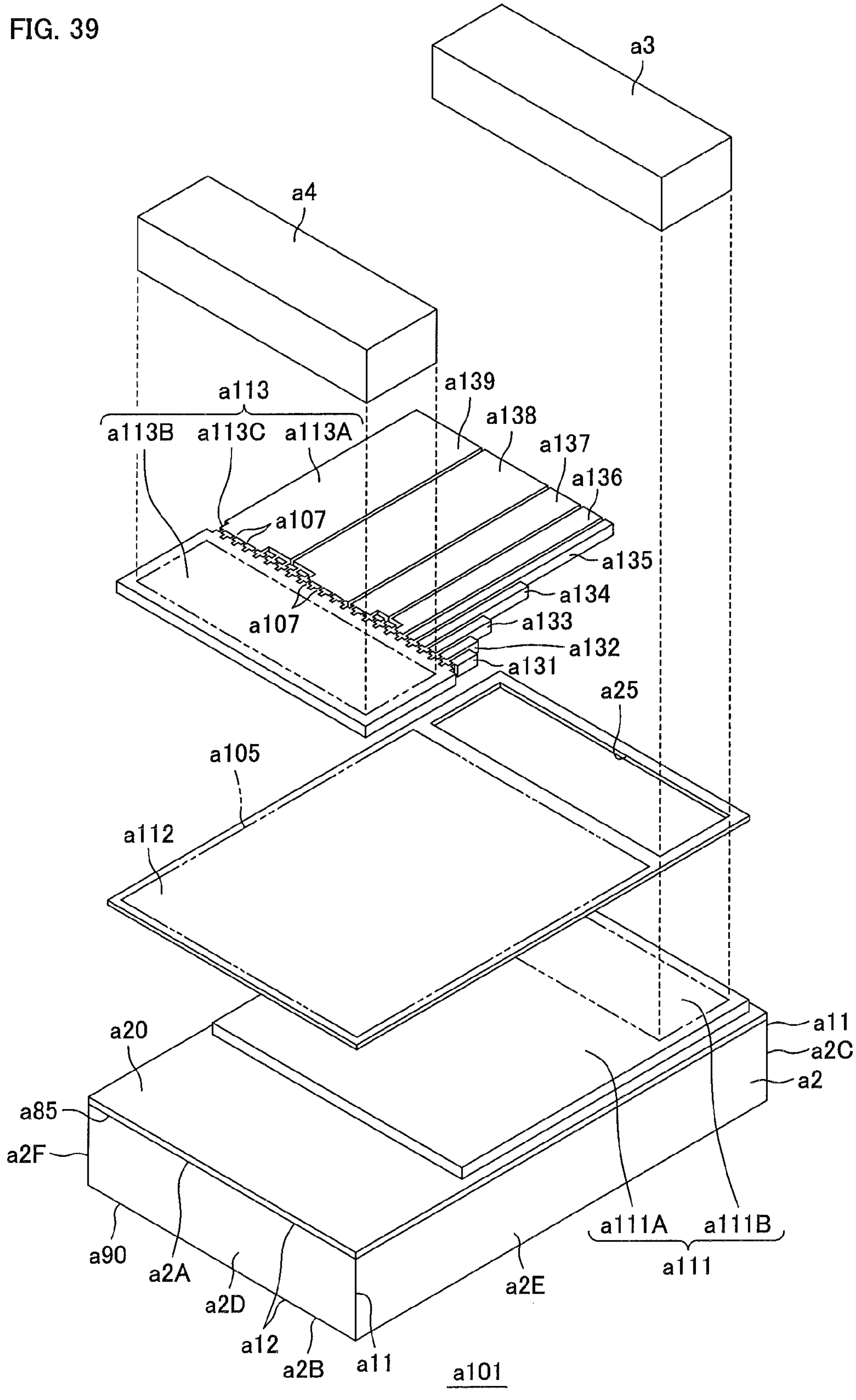
FIG. 39 is an exploded perspective view illustrating the chip capacitor with parts thereof separated.

FIG. 37 is a plan view of a chip capacitor according to another example of the first reference embodiment. FIG. 38 is a sectional view taken along a sectional line XXXVIII-XXXVIII in FIG. 37. FIG. 39 is an exploded perspective view illustrating the chip capacitor with parts thereof separated. Components of the chip capacitor a101 corresponding to those of the chip resistor a1 will be designated by the same reference characters, and will not be described in detail. In the chip capacitor a101, components designated by the same reference characters as in the chip resistor a1 have the same construction as in the chip resistor a1 and the same effects as in the chip resistor a1, unless otherwise specified.

Referring to FIG. 37, the chip capacitor a101, like the chip resistor a1, includes a board a2, a first connection electrode a3 provided on the board a2 (on a front surface a2A of the board a2), and a second connection electrode a4 also provided on the board a2. In this example, the board a2 has a rectangular shape as seen in plan. The first connection electrode a3 and the second connection electrode a4 are respectively disposed on longitudinally opposite end portions of the board a2. In this example, the first connection electrode a3 and the second connection electrode a4 each have a generally rectangular plan shape elongated widthwise of the board a2. A plurality of capacitor elements C1 to C9 are provided in a capacitor provision region a105 between the first connection electrode a3 and the second connection electrode a4 on the front surface a2A of the board a2. The capacitor elements C1 to C9 are device elements constituting a device a5 (capacitor portion), and are electrically connected to the second connection electrode a4 via a plurality of fuse units a107 (corresponding to the fuses F described above).

As shown in FIGS. 38 and 39, an insulative layer a20 is provided on the front surface a2A of the board a2, and a lower electrode film a111 is provided on a surface of the insulative layer a20. The lower electrode film a111 extends over substantially the entire capacitor provision region a105. Further, the lower electrode film a111 extends to under the first connection electrode a3. More specifically, the lower electrode film a111 has a capacitor electrode region a111A functioning as a common lower electrode for the capacitor elements C1 to C9 in the capacitor provision region a105, and a pad region a111B disposed under the first connection electrode a3 for external electrode connection. The capacitor electrode region a111A is located in the capacitor provision region a105, while the pad region a111B is located under the first connection electrode a3 in contact with the first connection electrode a3.

A capacitive film (dielectric film) a112 is provided over the lower electrode film a111 (capacitor electrode region a111A) in contact with the lower electrode film a111 in the capacitor provision region a105. The capacitive film a112 extends over the entire capacitor electrode region a111A (capacitor provision region a105). In this example, the capacitive film a112 also covers a part of the insulative layer a20 outside the capacitor provision region a105.

An upper electrode film a113 is provided on the capacitive film a112. In FIG. 37, the upper electrode film a113 is hatched for clarification. The upper electrode film a113 has a capacitor electrode region a113A located in the capacitor provision region a105, a pad region a113B located under the second connection electrode a4 in contact with the second connection electrode a4, and a fuse region a113C located between the capacitor electrode region a113A and the pad region a113B.

The capacitor electrode region a113A of the upper electrode film a113 is divided (split) into a plurality of electrode film portions (upper electrode film portions) a131 to a139. In this example, the electrode film portions a131 to a139 each have a rectangular shape, and extend linearly from the fuse region a113C toward the first connection electrode a3. The electrode film portions a131 to a139 are opposed to the lower electrode film a111 with a plurality of facing areas with the intervention of the capacitive film a112 (in contact with the capacitive film a112). More specifically, the facing areas of the respective electrode film portions a131 to a139 with respect to the lower electrode film a111 may be defined to have a ratio of 1:2:4:8:16:32:64:128:128. That is, the electrode film portions a131 to a139 include a plurality of electrode film portions having different facing areas, more specifically, a plurality of electrode film portions a131 to a138 (or a131 to a137 and a139) respectively having facing areas which are defined by a geometric progression with a geometric ratio of 2. Thus, the capacitor elements C1 to C9 respectively defined by the electrode film portions a131 to a139 and the lower electrode film a111 opposed to the electrode film portions a131 to a139 with the intervention of the capacitive film a112 include a plurality of capacitor elements having different capacitance values. Where the facing areas of the electrode film portions a131 to a139 have the aforementioned ratio, the ratio of the capacitance values of the capacitor elements C1 to C9 is 1:2:4:8:16:32:64:128:128, which is equal to the ratio of the facing areas. That is, the capacitor elements C1 to C9 include a plurality of capacitor elements C1 to C8 (or C1 to C7 and C9) which respectively have capacitance values defined by the geometric progression with a geometric ratio of 2.

In this example, the electrode film portions a131 to a135 each have a strip shape of the same width, and respectively have lengths defined to have a ratio of 1:2:4:8:16. The electrode film portions a135, a136, a137, a138, a139 each have a strip shape of the same length, and respectively have widths defined to have a ratio of 1:2:4:8:8. The electrode film portions a135 to a139 extend from an edge of the second connection electrode a4 to an edge of the first connection electrode a3 in the capacitor provision region a105, and the electrode film portions a131 to a134 are shorter than the electrode film portions a135 to a139.

The pad region a113B is generally analogous to the second connection electrode a4, and has a generally rectangular plan shape. As shown in FIG. 38, the pad region a113B of the upper electrode film a113 contacts the second connection electrode a4. The fuse region a113C is located alongside a longer edge (an inner longer edge with respect to a periphery of the board a2) of the pad region a113B. The fuse region a113C includes the plurality of fuse units a107, which are arranged alongside the longer edge of the pad region a113B.

The fuse units a107 are formed of the same material as the pad region a113B of the upper electrode film a113 unitarily with the pad region a113B. The electrode film portions a131 to a139 are each formed integrally with one or more of the fuse units a107, and connected to the pad region a113B via these fuse units a107 to be thereby electrically connected to the second connection electrode a4 via the pad region a113B. As shown in FIG. 37, the electrode film portions a131 to a136 each having a relatively small area are each connected to the pad region a113B via a single fuse unit a107, and the electrode film portions a137 to a139 each having a relatively great area are each connected to the pad region a113B via a plurality of fuse units a107. It is not necessary to use all the fuse units a107, and some of the fuse units a107 are unused in this example.

The fuse units a107 each include a first wider portion a107A for connection to the pad region a113B, a second wider portion a107B for connection to the electrode film portions a131 to a139, and a narrower portion a107C connecting the first and second wider portions a107A, a107B to each other. The narrower portion a107C is configured to be disconnected (fused off) by a laser beam. With this arrangement, unnecessary ones of the electrode film portions a131 to a139 are electrically isolated from the first and second connection electrodes a3, a4 by disconnecting corresponding ones of the fuse units a107.

As shown in FIG. 38 but not shown in FIGS. 37 and 39, a front surface of the chip capacitor a101 including a surface of the upper electrode film a113 is covered with an insulative film a23. The insulative film a23 is formed of, for example, a nitride film, and extends to side surfaces a2C to a2F of the board a2 to cover not only the upper surface of the chip capacitor a101 but also the entire side surfaces a2C to a2F. Further, a resin film a24 is provided on the insulative film a23. The resin film a24 includes a first resin film a24A covering portions of the side surfaces a2C to a2F adjacent to the front surface a2A, and a second resin film a24B covering the front surface a2A. The resin film a24 is discontinuous on an edge portion a85 of the front surface a2A, so that the edge portion a85 is exposed from the resin film a24.

The insulative film a23 and the resin film a24 each serve as a protective film for protecting the front surface of the chip capacitor a101, and each have openings a25 in association with the first connection electrode a3 and the second connection electrode a4. The openings a25 extend through the insulative film a23 and the resin film a24 to expose a part of the pad region a111B of the lower electrode film a111 and a part of the pad region a113B of the upper electrode film a113. In this example, the opening a25 associated with the first connection electrode a3 also extends through the capacitive film a112.

The first connection electrode a3 and the second connection electrode a4 are respectively provided in the openings a25. Thus, the first connection electrode a3 is connected to the pad region a111B of the lower electrode film a111, while the second connection electrode a4 is connected to the pad region a113B of the upper electrode film a113. The first and second connection electrodes a3, a4 project from a surface of the resin film a24. Thus, the chip capacitor a101 can be connected to a mount board through flip chip connection.

Figure 40:
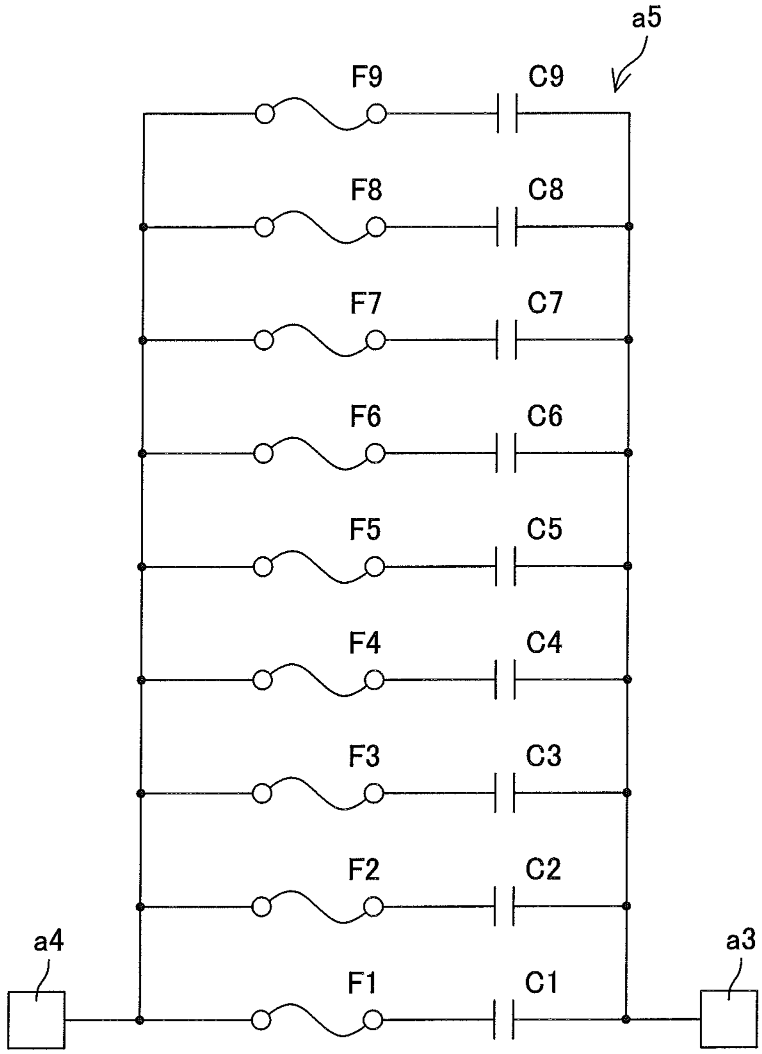
FIG. 40 is a circuit diagram showing the internal electrical configuration of the chip capacitor.

FIG. 40 is a circuit diagram showing the internal electrical configuration of the chip capacitor a101. The plurality of capacitor elements C1 to C9 are connected in parallel between the first connection electrode a3 and the second connection electrode a4. Fuses F1 to F9 each including one or more fuse units a107 are respectively connected in series between the second connection electrode a4 and the capacitor elements C1 to C9.

Where all the fuses F1 to F9 are connected, the overall capacitance value of the chip capacitor a101 is equal to the sum of the capacitance values of the respective capacitor elements C1 to C9. Where one or two or more fuses selected from the fuses F1 to F9 are disconnected, the capacitor elements associated with the disconnected fuses are isolated, so that the overall capacitance value of the chip capacitor a101 is reduced by the sum of the capacitance values of the isolated capacitor elements.

Therefore, the overall capacitance value of the chip capacitor can be adjusted to a desired capacitance value (through laser trimming) by measuring a capacitance value between the pad regions a111B and a113B (the total capacitance value of the capacitor elements C1 to C9) and then fusing off one or more fuses properly selected from the fuses F1 to F9 according to the desired capacitance value by the laser beam. Particularly, where the capacitance values of the capacitor elements C1 to C8 are defined by the geometric progression with a geometric ratio of 2, the overall capacitance value of the chip capacitor a101 can be finely adjusted to the desired capacitance value with an accuracy equivalent to the capacitance value of the smallest capacitance capacitor element C1 (the value of the first term of the geometric progression).

For example, the capacitance values of the capacitor elements C1 to C9 may be as follows: C1=0.03125 pF; C2=0.0625 pF; C3=0.125 pF; C4=0.25 pF; C5=0.5 pF; C6=1 pF; C7=2 pF; C8=4 pF; and C9=4 pF. In this case, the capacitance of the chip capacitor a101 can be finely adjusted with a minimum adjustable accuracy of 0.03125 pF. By properly selecting the to-be-disconnected fuses from the fuses F1 to F9, the chip capacitor a101 can be provided as having a desired capacitance value ranging from 10 pF to 18 pF.

In this example, as described above, the plurality of capacitor elements C1 to C9 which can be isolated by disconnecting the associated fuses F1 to F9 are provided between the first connection electrode a3 and the second connection electrode a4. The capacitor elements C1 to C9 include a plurality of capacitor elements having different capacitance values, more specifically, a plurality of capacitor elements having capacitance values defined by the geometric progression. Therefore, the chip capacitor a101 can be adapted for the plural capacitance values without changing the design, and customized based on the same design concept so as to have a desired capacitance value which is accurately controlled by selectively fusing off one or more of the fuses F1 to F9.

The respective components of the chip capacitor a101 will hereinafter be described in detail. Referring to FIG. 37, the board a2 may have a rectangular plan shape, for example, having a size of 0.3 mm×0.15 mm or 0.4 mm×0.2 mm (preferably, a size of not greater than 0.4 mm×0.2 mm). The capacitor provision region a105 is generally a square region which has an edge having a length equivalent to the length of the shorter edge of the board a2. The board a2 may have a thickness of about 150 μm. Referring to FIG. 38, the board a2 may be a board obtained by grinding or polishing a substrate from a back side (not formed with the capacitor elements C1 to C9) for thinning the substrate. A semiconductor substrate typified by a silicon substrate, a glass substrate or a resin film may be used as a material for the board a2.

The insulative layer a20 may be an oxide film such as a silicon oxide film, and may have a thickness of about 500 Å to about 2000 Å. The lower electrode film a111 is preferably an electrically conductive film, particularly preferably a metal film, and may be an aluminum film. The lower electrode film a111 of the aluminum film may be formed by a sputtering method. Similarly, the upper electrode film a113 is preferably an electrically conductive film, particularly preferably a metal film, and may be an aluminum film. The upper electrode film a113 of the aluminum film may be formed by a sputtering method. Further, a photolithography and etching process may be employed for patterning to divide the capacitor electrode region a113A of the upper electrode film a113 into the electrode film portions a131 to a139 and to shape the fuse region a113C into the plurality of fuse units a107.

The capacitive film a112 may be formed of, for example, a silicon nitride film, and have a thickness of 500 Å to 2000 Å (e.g., 1000 Å). The silicon nitride film for the capacitive film a112 may be formed by plasma CVD (chemical vapor deposition). The insulative film a23 may be formed of, for example, a silicon nitride film, for example, by a plasma CVD method. The insulative film a23 may have a thickness of about 8000 Å. The resin film a24 may be formed of a polyimide film or other resin film as described above.

The first and second connection electrodes a3, a4 may each be formed of a multilayer film including a nickel layer provided in contact with the lower electrode film a111 or the upper electrode film a113, a palladium layer provided on the nickel layer and a gold layer provided on the palladium layer, which may each be formed by a plating method (more specifically, an electroless plating method). The nickel layer improves the adhesiveness to the lower electrode film a111 or the upper electrode film a113, and the palladium layer functions as a diffusion preventing layer which suppresses mutual diffusion of the material of the upper and lower electrode films and gold of the uppermost layers of the first and second connection electrodes a3, a4.

For production of the chip capacitor a101, the same production process as for the chip resistor a1 may be employed after formation of the device a5. For the formation of the device a5 (capacitor portion) for the chip capacitor a101, an insulative layer a20 of an oxide film (e.g., a silicon oxide film) is first formed on a front surface of a substrate a30 (board a2) by a thermal oxidation method and/or a CVD method. Then, a lower electrode film a111 of an aluminum film is formed on the entire surface of the insulative layer a20, for example, by a sputtering method. The lower electrode film a111 may have a thickness of about 8000 Å. In turn, a resist pattern corresponding to the final shape of the lower electrode film a111 is formed on a surface of the lower electrode film by photolithography. The lower electrode film is etched by using the resist pattern as a mask. Thus, the lower electrode film a111 is provided as having a pattern shown in FIG. 37 and the like. The etching of the lower electrode film a111 may be achieved, for example, by reactive ion etching.

Then, a capacitive film a112 such as of a silicon nitride film is formed on the lower electrode film a111, for example, by a plasma CVD method. In a region not formed with the lower electrode film a111, the capacitive film a112 is formed on the surface of the insulative layer a20. In turn, an upper electrode film a113 is formed on the capacitive film a112. The upper electrode film a113 is formed from, for example, an aluminum film which is formed by a sputtering method. The upper electrode film a113 may have a thickness of about 8000 Å. Then, a resist pattern corresponding to the final shape of the upper electrode film a113 is formed on a surface of the upper electrode film a113 by photolithography. The upper electrode film a113 is etched with the use of this resist pattern as a mask to be thereby patterned into the final shape (see FIG. 37 and the like). Thus, the upper electrode film a113 is configured in a pattern such as to include a plurality of electrode film portions a131 to a139 in the capacitor electrode region a113A, a plurality of fuse units a107 in the fuse region a113C and a pad region a113B connected to the fuse units a107. The etching for the patterning of the upper electrode film a113 may be achieved by wet etching with the use of an etching liquid such as phosphoric acid or by reactive ion etching.

In this manner, devices a5 (the capacitor elements C1 to C9 and the fuse units a107) for chip capacitors a101 are formed. After the formation of the devices a5, an insulative film a45 is formed as entirely covering the devices a5 (the upper electrode films a113 and a region of the capacitive film a112 not formed with the upper electrode films a113) by a plasma CVD method (see FIG. 27A). Thereafter, a trench a44 is formed (see FIG. 27B), and then openings a25 are formed (see FIG. 27C). Subsequently, probes a70 are pressed against the pad region a113B of the upper electrode film a113 and the pad region a111B of the lower electrode film a111 exposed from the openings a25 to measure the total capacitance value of the capacitor elements C1 to C9 for each of the devices a5 (see FIG. 27C). Based on the total capacitance value thus measured, capacitor elements to be isolated, i.e., fuses to be disconnected, are selected according to a target capacitance value of the chip capacitor a101.

In this state, a laser trimming process is performed for selectively fusing off the fuse units a107. That is, the laser beam is applied to fuse units a107 of the fuses selected according to the result of the measurement of the total capacitance value, whereby the narrower portions a107C of the selected fuse units a107 (see FIG. 37) are fused off. Thus, the associated capacitor elements are isolated from the pad region a113B. When the laser beam is applied to the fuse units a107, the energy of the laser beam is accumulated around the fuse units a107 by the function of the insulative film a45 serving as the cover film, thereby fusing off the fuse units a107. Thus, the capacitance value of the chip capacitor a101 can be reliably adjusted to the target capacitance value.

Subsequently, a silicon nitride film is deposited on the cover film (insulative film a45), for example, by a plasma CVD method to form an insulative film a23. The aforementioned cover film is finally unified with the insulative film a23 to form a part of the insulative film a23. The insulative film a23 formed after the disconnection of the fuses enters holes formed in the cover film when the cover layer is partly broken during the fuse-off of the fuses, and covers disconnection surfaces of the fuse units a107 for protection. Therefore, the insulative film a23 prevents intrusion of foreign matter and moisture in the disconnected portions of the fuse units a107. This makes it possible to produce highly reliable chip capacitors a101. The insulative film a23 may be formed as having an overall thickness of, for example, about 8000 Å.

Then, a coating film a46 is formed (see FIG. 27D). Thereafter, the openings a25 closed with the coating film a46 and the insulative film a23 are uncovered (see FIG. 27E), and the first and second connection electrodes a3, a4 are thickened, for example, by an electroless plating method (see FIG. 27F). Subsequently, as in the case of the chip resistors a1, the substrate a30 is ground from the back surface 30B (see FIG. 27G), whereby the resulting chip capacitors a101 are separated from each other.

In the patterning of the upper electrode film a113 by utilizing the photolithography process, the electrode film portions a131 to a139 each having a very small area can be highly accurately formed, and the fuse units a107 can be formed in a minute pattern. After the patterning of the upper electrode film a113, the total capacitance value of the capacitor elements is measured, and the fuses to be disconnected are selected. The chip capacitors a101 can be provided as each having a desired capacitance value, which is accurately adjusted by disconnecting the selected fuses.

While the chip components (the chip resistor a1 and the chip capacitor a101) according to the first reference embodiment have thus been described, the first reference embodiment may be embodied in other forms. In the aforementioned examples, the chip resistor a1 includes a plurality of resistor circuits having different resistance values defined by the geometric progression with a geometric ratio $r$ $(0<r, r\neq 1)=2$ by way of example, but the geometric ratio for the geometric progression may have a value other than 2. The chip capacitor a101 includes a plurality of capacitor elements having different capacitance values defined by the geometric progression with a geometric ratio $r$ $(0<r, r\neq 1)=2$ by way of example, but the geometric ratio for the geometric progression may have a value other than 2.

In the chip resistor a1 and the chip capacitor a101, the insulative layer a20 is provided on the front surface of the board a2. Where the board a2 is an insulative board, however, the insulative layer a20 may be obviated. In the chip capacitor a101, only the upper electrode film a113 is divided into a plurality of electrode film portions. However, only the lower electrode film a111 may be divided into a plurality of electrode film portions, or the upper electrode film a113 and the lower electrode film a111 may be each divided into a plurality of electrode film portions. In the aforementioned example, the fuse units are provided integrally with the upper electrode film or the lower electrode film, but may be formed from a conductor film different from the upper and lower electrode films. The chip capacitor a101 described above has a single-level capacitor structure including the upper electrode film a113 and the lower electrode film a111. Alternatively, a multi-level capacitor structure may be provided by stacking another electrode film on the upper electrode film a113 with the intervention of a capacitive film.

The chip capacitor a101 may be configured such that an electrically conductive board employed as the board a2 serves as the lower electrode and the capacitive film a112 is provided in contact with a surface of the electrically conductive board. In this case, one of the external electrodes may extend from the back surface of the electrically conductive board.

<Second Reference Embodiment of Present Invention>

(1) Inventive Features of Second Reference Embodiment

The second reference embodiment has, for example, the following inventive features (B1) to (B19):

(B1) A chip component is provided, which includes: a board; a device provided on a front surface of the board; and an external connection electrode provided on the front surface of the board; wherein the board has a side surface including a portion tilted with respect to a plane perpendicular to the front surface of the board.

With this arrangement, one of edge portions of the front and back surfaces of the board of the chip component projects with respect to the other edge portion outward of the board. Therefore, corner portions of the chip component are not right-angled. Thus, the corner portions (particularly, obtuse corner portions) are less susceptible to chipping. In this case, the contour of the chip component to be detected from the front side or the back side of the board through image recognition is clearly defined by one of the edge portions of the front and back surfaces of the board (the outer one of the edge portions of the board). Therefore, the contour of the chip component can be accurately detected, so that the chip component can be highly accurately mounted on a mount board. That is, the mount positioning accuracy can be improved.

(B2) In the chip component of the feature (B1), the side surface of the board extends along a plane tilted with respect to the plane perpendicular to the front surface of the board.

With this arrangement, one of the edge portions of the front and back surfaces of the board of the chip component can reliably project with respect to the other edge portion outward of the board.

(B3) In the chip component of the feature (B1) or (B2), the edge portion of the back surface of the board is retracted with respect to the edge portion of the front surface of the board inward of the board.

With this arrangement, the corner portion of the back surface of the board of the chip component is obtuse and, therefore, less susceptible to chipping.

(B4) In the chip component of the feature (B1) or (B2), the edge portion of the back surface of the board projects with respect to the edge portion of the front surface of the board outward of the board.

With this arrangement, the corner portion of the front surface of the board is obtuse and, therefore, is less susceptible to chipping.

(B5) In the chip component of any one of the features (B1) to (B4), the front surface of the board forms an acute angle with respect to the side surface of the board.

With this arrangement, the edge portion of the front surface of the board is distinctive, making it easier to clearly detect the contour of the chip component. Thus, the chip component can be more accurately mounted on the mount board.

(B6) In the chip component of any one of the features (B1) to (B5), the device includes a plurality of device elements. The chip component further includes a plurality of fuses which disconnectably connect the respective device elements to the external connection electrode.

(B7) In the chip component of the feature (B6), the device elements are resistor elements each including a resistive film provided on the board and an interconnection film provided on the resistive film in contact with the resistive film.

With this arrangement, the chip component is a chip resistor. The chip resistor can be easily and speedily customized to have any of plural resistance values by selectively disconnecting one or more of the fuses. In other words, the chip resistor can be customized based on the same design concept so as to have various resistance values by selectively combining resistor elements having different resistance values.

(B8) In the chip component of the feature (B6), the device elements are capacitor elements each including a capacitive film provided on the board and an electrode film provided in contact with the capacitive film.

With this arrangement, the chip component is a chip capacitor. The chip capacitor can be easily and speedily customized to have any of plural capacitance values by selectively disconnecting one or more of the fuses. In other words, the chip capacitor can be customized based on the same design concept so as to have various capacitance values by selectively combining capacitor elements having different capacitance values.

(B9) The chip component may be a chip inductor.

(B10) The chip component may be a chip diode.

(B11) A chip component production method is provided, which includes the steps of: forming a device on a front surface of a board; forming an external connection electrode on the front surface of the board; and shaping a side surface of the board so that the side surface has a portion tilted with respect to a plane perpendicular to the front surface of the board.

One of edge portions of the front and back surfaces of the board of a complete chip component produced by this method projects with respect to the other edge portion outward of the board. Therefore, corner portions of the chip component are not right-angled. Thus, the corner portions (particularly, obtuse corner portions) are less susceptible to chipping. In this case, the contour of the chip component to be detected from the front side or the back side of the board through image recognition is clearly defined by one of the edge portions of the front and back surfaces of the board (the outer one of the edge portions of the board). Therefore, the contour of the chip component can be accurately detected, so that the chip component can be highly accurately mounted on a mount board. That is, the mount positioning accuracy can be improved.

(B12) A chip component production method is provided, which includes the steps of: forming a device and an external connection electrode in each of plural chip component regions defined on a front surface of a substrate; forming a trench in a boundary region defined between the chip component regions, the trench having a predetermined depth as measured from the front surface of the substrate and defined by side walls each having a portion tilted with respect to a plane perpendicular to the front surface of the substrate; and grinding a back surface of the substrate to the trench to divide the substrate into a plurality of chip components.

In the trench forming step of this method, side surfaces of the respective chip components are simultaneously shaped as each having a portion tilted with respect to the plane perpendicular to the front surface of the substrate. Further, the plurality of chip components can be simultaneously produced from the substrate by grinding the back surface of the substrate to the trench. Thus, the time required for the production of the chip components can be reduced.

(B13) The chip component production method of the feature (B11) or (B12) includes the step of shaping the side surface of the board so that the side surface extends along a plane tilted with respect to the plane perpendicular to the front surface of the board.

One of edge portions of the front and back surfaces of the board of the chip component produced by this method can reliably project with respect to the other edge portion outward of the board.

(B14) The chip component production method of any one of the features (B11) to (B13) includes the step of configuring the chip component such that the edge portion of the back surface of the board is retracted with respect to the edge portion of the front surface of the board inward of the board. A corner portion of the back surface of the board of the chip component produced by this method is obtuse and, therefore, is less susceptible to chipping.

(B15) The chip component production method of any one of the features (B11) to (B13) includes the step of configuring the chip component such that the edge portion of the back surface of the board projects with respect to the edge portion of the front surface of the board outward of the board.

A corner portion of the front surface of the board of the chip component produced by this method is obtuse and, therefore, is less susceptible to chipping.

(B16) In the chip component production method of any one of the features (B11) to (B15), the front surface of the board forms an acute angle with respect to the side surface of the board. The edge portion of the front surface of the board of the chip component produced by this method is distinctive, making it easier to clearly detect the contour of the chip component. Thus, the chip component can be more accurately mounted on a mount board (i.e., the mount positioning accuracy can be further improved).

(B17) In the chip component production method of any one of the features (B11) to (B16), the device includes a plurality of device elements. The chip component production method further includes the step of forming a plurality of fuses on the board, the fuses disconnectably connecting the respective device elements to the external connection electrode.

(B18) In the chip component production method of the feature (B17), the device elements are resistor elements each including a resistive film provided on the board and an interconnection film provided on the resistive film in contact with the resistive film.

The chip component produced by this method is a chip resistor. The chip resistor can be easily and speedily customized to have any of plural resistance values by selectively disconnecting one or more of the fuses. In other words, the chip resistor can be customized based on the same design concept so as to have various resistance values by selectively combining resistor elements having different resistance values.

(B19) In the chip component production method of the feature (B17), the device elements are capacitor elements each including a capacitive film provided on the board and an electrode film provided in contact with the capacitive film.

The chip component produced by this method is a chip capacitor. The chip capacitor can be easily and speedily customized to have any of plural capacitance values by selectively disconnecting one or more of the fuses. In other words, the chip capacitor can be customized based on the same design concept so as to have various capacitance values by selectively combining capacitor elements having different capacitance values.

(2) Examples of Second Reference Embodiment of Present Invention

Examples of the second reference embodiment will hereinafter be described in detail with reference to the attached drawings. Reference characters shown in FIGS. 41 to 63 are effective only in FIGS. 41 to 63, so that components designated by these reference characters may be different from those designated by the same reference characters in other embodiments.

Figure 41:
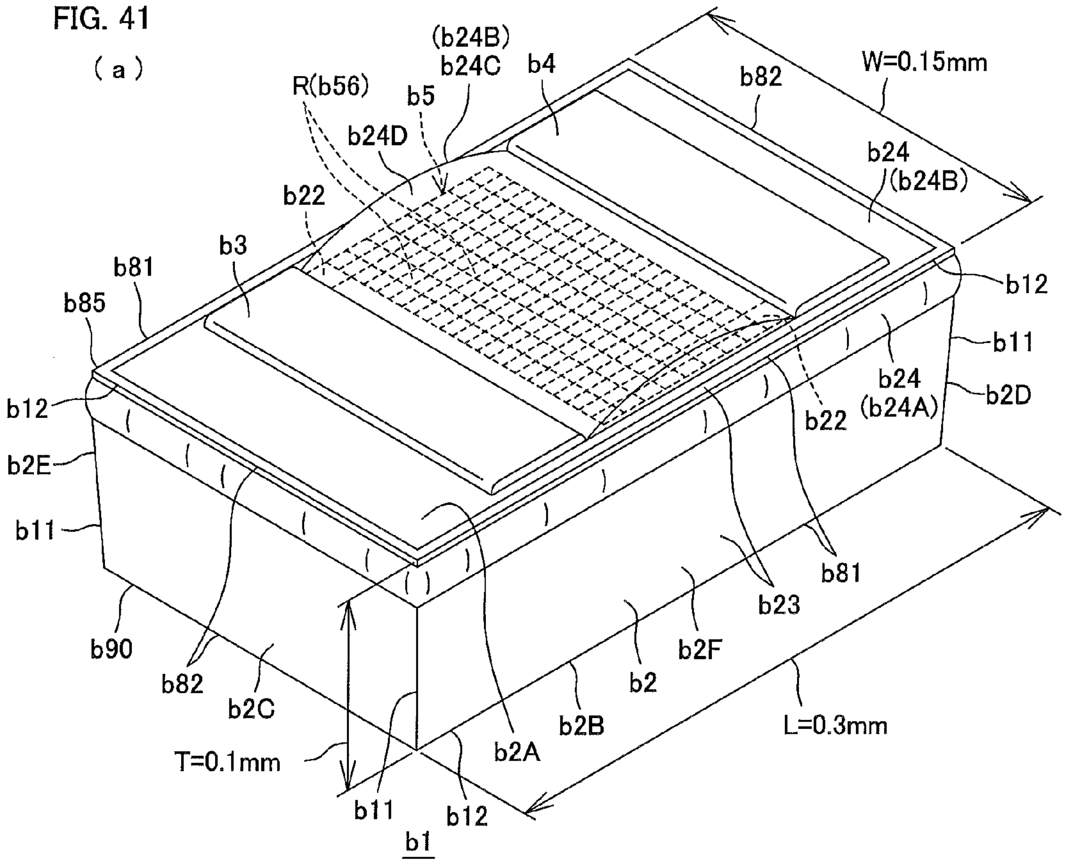
FIG. 41(*a*) is a schematic perspective view for explaining the construction of a chip resistor according to an example of a second reference embodiment, and FIG. 41(*b*) is a schematic side view illustrating the chip resistor, which is mounted on a mount board.
Figure 41:
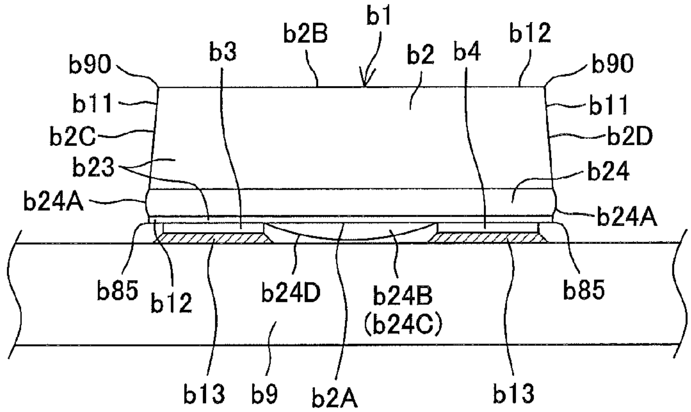

FIG. 41(*a*) is a schematic perspective view for explaining the construction of a chip resistor according to an example of the second reference embodiment, and FIG. 41(*b*) is a schematic side view illustrating the chip resistor, which is mounted on a mount board. The chip resistor b1 is a minute chip component, and has a rectangular prismatic shape as shown in FIG. 41(*a*). The chip resistor b1 has a rectangular plan shape defined by two perpendicularly intersecting edges (a longer edge b81 and a shorter edge b82), one of which has a length of not greater than 0.4 mm and the other of which has a length of not greater than 0.2 mm. More preferably, the chip resistor b1 is dimensioned such as to have a length L (a length of the longer edge b81) of about 0.3 mm, a width W (a length of the shorter edge b82) of about 0.15 mm, and a thickness T of about 0.1 mm.

The chip resistor b1 is obtained by forming a multiplicity of chip resistors b1 in a lattice form on a substrate, then forming a trench in the substrate, and grinding a back surface of the substrate (or dividing the substrate along the trench) to separate the chip resistors b1 from each other. The chip resistor b1 principally includes a board b2 which constitutes a part of a main body of the chip resistor b1 (resistor main body), a first connection electrode b3 and a second connection electrode b4 serving as external connection electrodes, and a device (element) b5 connected to the outside via the first connection electrode b3 and the second connection electrode b4.

The board b2 has a generally rectangular prismatic chip shape. An upper surface of the board b2 as seen in FIG. 41(*a*) is a front surface b2A. The front surface b2A is a surface (device formation surface) of the board b2 on which the device b5 is provided, and has a generally rectangular shape. A surface of the board b2 opposite from the front surface b2A with respect to the thickness of the board b2 is a back surface b2B. The front surface b2A and the back surface b2B have substantially the same shape, and are parallel to each other. However, the front surface b2A is greater than the back surface b2B. When the back surface b2B is seen in plan perpendicularly to the front surface b2A, therefore, the back surface b2B is accommodated within the front surface b2A. The front surface b2A has a rectangular edge portion b85 defined along a pair of longer edges b81 and a pair of shorter edges b82 thereof, and the back surface b2B has a rectangular edge portion b90 defined along a pair of longer edges b81 and a pair of shorter edges b82 thereof.

In addition to the front surface b2A and the back surface b2B, the board b2 has side surfaces b2C, b2D, b2E and b2F intersecting the front surface b2A and the back surface b2B to connect the front surface b2A and the back surface b2B to each other. The side surface b2C is disposed between shorter edges b82 of the front surface b2A and the back surface b2B on one of longitudinally opposite sides (on a left front side in FIG. 41(*a*)). The side surface b2D is disposed between shorter edges b82 of the front surface b2A and the back surface b2B on the other of the longitudinally opposite sides (on a right rear side in FIG. 41(*a*)). The side surfaces b2C, b2D are longitudinally opposite end faces of the board b2. The side surface b2E is disposed between longer edges b81 of the front surface b2A and the back surface b2B on one of widthwise opposite sides (on a left rear side in FIG. 41(*a*)). The side surface b2F is disposed between longer edges b81 of the front surface b2A and the back surface b2B on the other of the widthwise opposite sides (on a right front side in FIG. 41(*a*)). The side surfaces b2E, b2F are widthwise opposite end faces of the board b2. The side surfaces b2C, b2D intersect (generally orthogonally intersect) the side surfaces b2E, b2F. Since the front surface b2A is greater than the back surface b2B as described above, the side surfaces b2C to b2F each have an isosceles trapezoidal shape having an upper base on the side of the back surface b2B and a lower base on the side of the front surface b2A. That is, side surfaces of the chip resistor b1 each have an isosceles trapezoidal shape. Therefore, adjacent ones of the front surface b2A, the back surface b2B and the side surfaces b2C to b2F form an acute angle or an obtuse angle. More specifically, the side surfaces b2C, b2D, b2E, b2F each form an acute angle with respect to the front surface b2A, and each form an obtuse angle with respect to the back surface b2B. For convenience of description, the inclinations of the side surfaces b2C to b2F are greater than actual inclinations (exaggerated) in FIG. 41 and subsequent figures.

The front surface b2A and the side surfaces b2C to b2F of the board b2 are entirely covered with an insulative film b23. More strictly, therefore, the front surface b2A and the side surfaces b2C to b2F are entirely located on an inner side (back side) of the insulative film b23, and are not exposed to the outside in FIG. 41(*a*). Further, the chip resistor b1 has a resin film b24. The resin film b24 includes a first resin film b24A, and a second resin film b24B which is different from the first resin film b24A. The first resin film b24A is provided on portions of the side surfaces b2C, b2D, b2E, b2F located slightly apart from the edge portion b85 of the front surface b2A toward the back surface b2B. The second resin film b24B covers a portion of the insulative film b23 on the front surface b2A in a region not overlapping the edge portion b85 of the front surface b2A (inward of the edge portion b85). The insulative film b23 and the resin film b24 will be detailed later.

The first connection electrode b3 and the second connection electrode b4 are provided inward of the edge portion b85 on the front surface b2A of the board b2, and partly exposed from the second resin film b24B on the front surface b2A. In other words, the second resin film b24B covers the front surface b2A (strictly, the insulative film b23 on the front surface b2A) with the first connection electrode b3 and the second connection electrode b4 being exposed therefrom. The first connection electrode b3 and the second connection electrode b4 each have a structure such that an Ni (nickel) layer, a Pd (palladium) layer and an Au (gold) layer are stacked in this order on the front surface b2A. The first connection electrode b3 and the second connection electrode b4 are spaced from each other longitudinally of the front surface b2A, and are each elongated widthwise of the front surface b2A. On the front surface b2A, the first connection electrode b3 is disposed closer to the side surface b2C, and the second connection electrode b4 is disposed closer to the side surface b2D in FIG. 41(*a*).

The device b5 is a circuit device (element), which is provided between the first connection electrode b3 and the second connection electrode b4 on the front surface b2A of the board b2, and is covered with the insulative film b23 and the second resin film b24B from the upper side. The device b5 constitutes a part of the resistor main body described above. In this example, the device b5 is a resistor portion b56. The resistor portion b56 is a circuit network including a plurality of (unit) resistor bodies R each having the same resistance value and arranged in a matrix array on the front surface b2A. The resistor bodies R are each made of TiN (titanium nitride), TiON (titanium oxide nitride) or TiSiON. The device b5 is electrically connected to portions of an interconnection film b22 to be described later, and electrically connected to the first connection electrode b3 and the second connection electrode b4 via the interconnection film portions b22.

As shown in FIG. 41(*b*), the chip resistor b1 can be mounted on the mount board b9 (through flip chip connection) by electrically and mechanically connecting the first connection electrode b3 and the second connection electrode b4 to a circuit (not shown) of the mount board b9 by solder b13 with the first connection electrode b3 and the second connection electrode b4 opposed to the mount board b9. The first connection electrode b3 and the second connection electrode b4 functioning as the external connection electrodes are desirably formed of gold (Au) or plated with gold for improvement of solder wettability and reliability.

Figure 42:
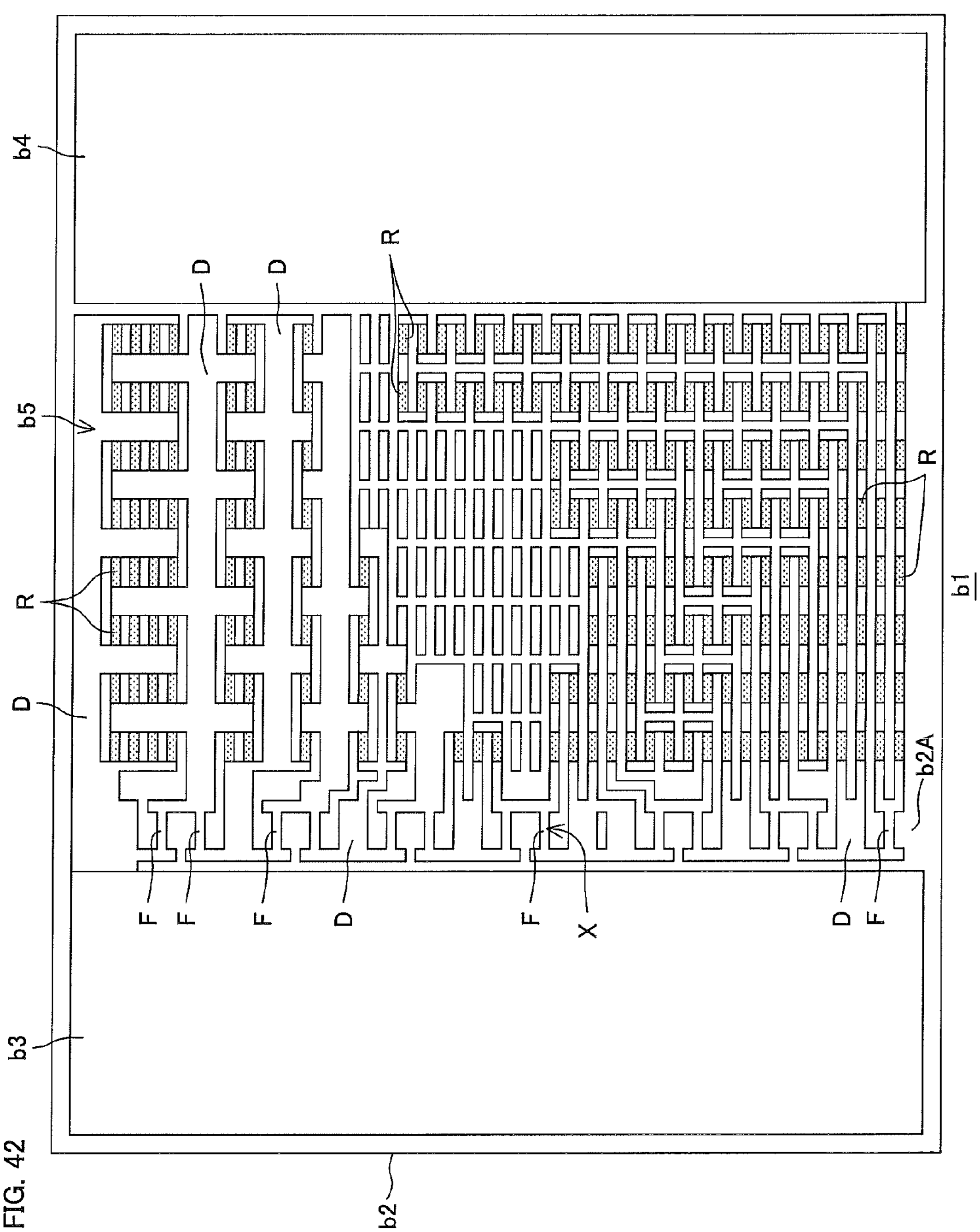
FIG. 42 is a plan view of the chip resistor showing the layout of a first connection electrode, a second connection electrode and a device, and the structure of the device as viewed in plan.

FIG. 42 is a plan view of the chip resistor showing the layout of the first connection electrode, the second connection electrode and the device, and the structure (layout pattern) of the device as viewed in plan. Referring to FIG. 42, the device b5 is a resistor circuit network. More specifically, the device b5 includes 352 resistor bodies R in total with 8 resistor bodies R aligned in each row (longitudinally of the board b2) and with 44 resistor bodies R aligned in each column (widthwise of the board b2). These resistor bodies R are elements of the resister circuit network of the device b5.

The multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface b2A of the board b2 for electrically incorporating the resistor circuits into the device b5 or electrically isolating the resistor circuits from the device b5. The fuses F and the conductor films D are arranged in a linear region alongside an inner edge of the first connection electrode b3. More specifically, the fuses F and the conductor films D are arranged in adjacent relation in a linear arrangement direction. The fuses F disconnectably (separably) connect the plural types of resistor circuits (each including a plurality of resistor bodies R) with respect to the first connection electrode b3. The fuses F and the conductor films D constitute a part of the resistor main body described above.

Figure 43A:
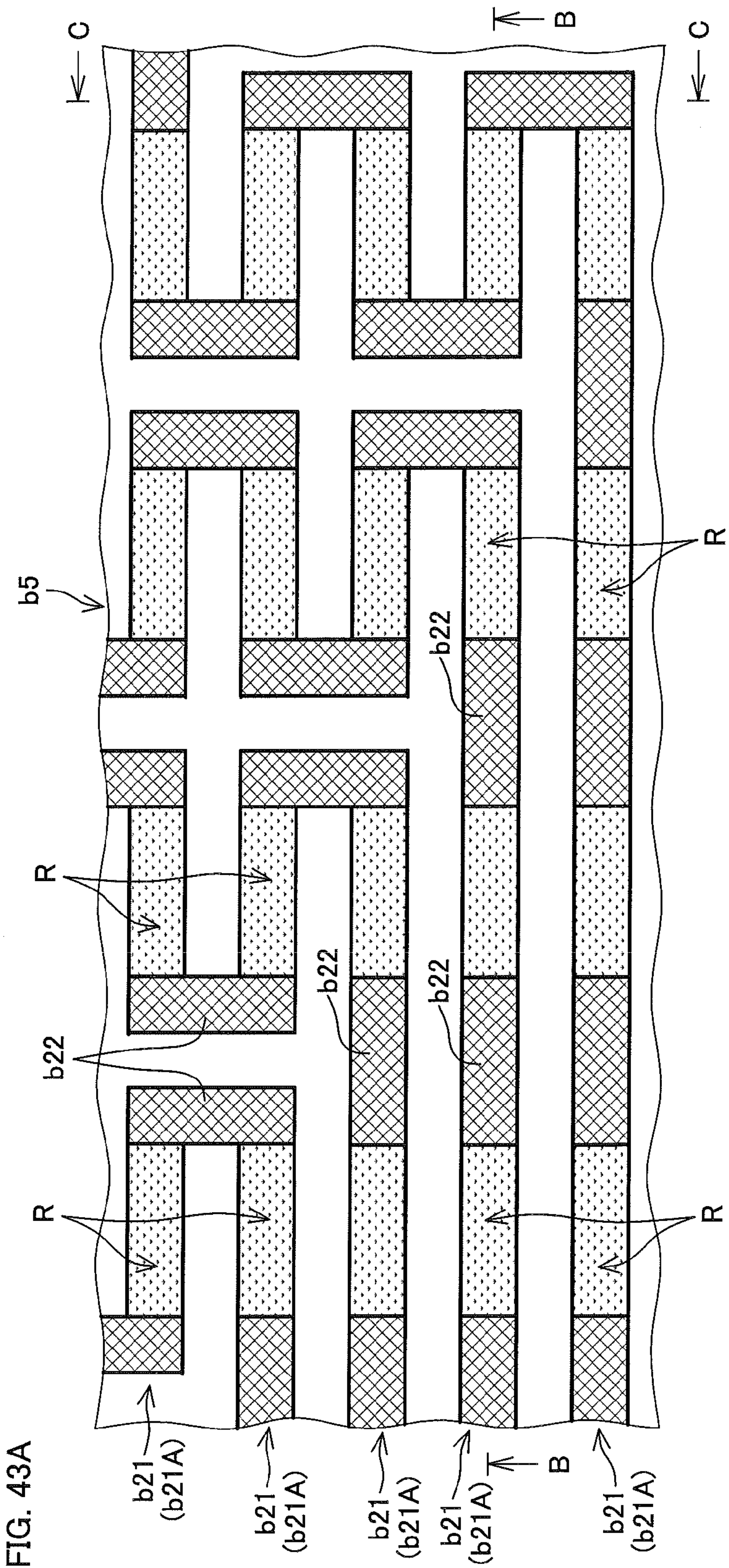
FIG. 43A is a plan view illustrating a part of the device shown in FIG. 42 on an enlarged scale.
Figure 43B:
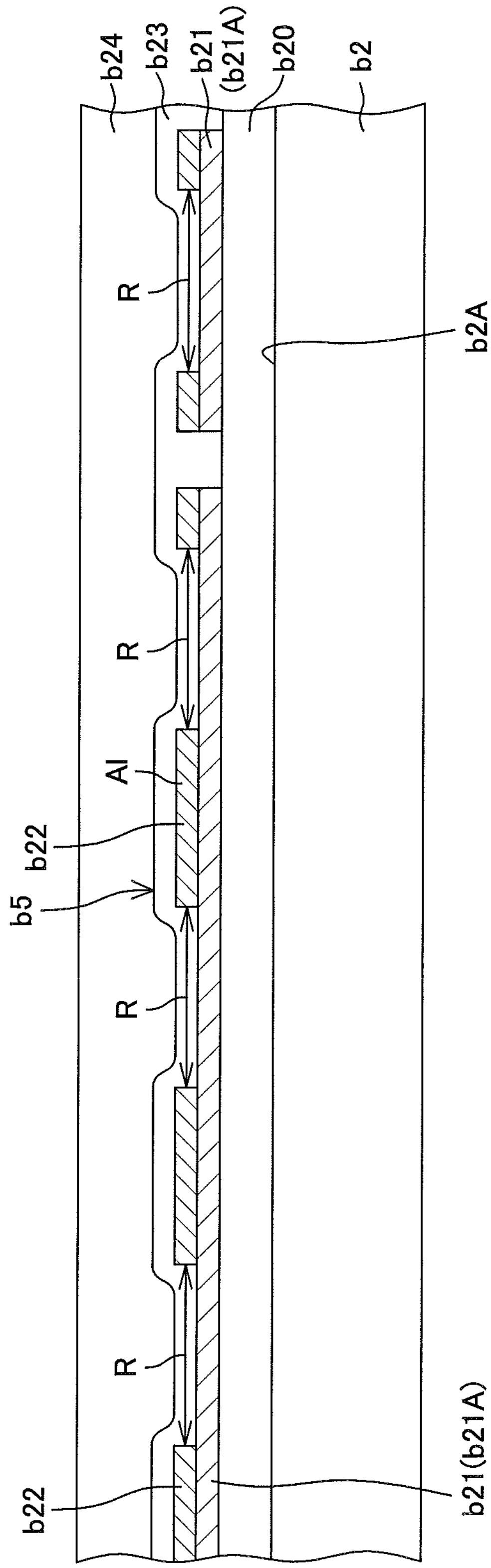
FIG. 43B is a longitudinal vertical sectional view taken along a line B-B in FIG. 43A for explaining the structure of resistor bodies of the device.
Figure 43C:
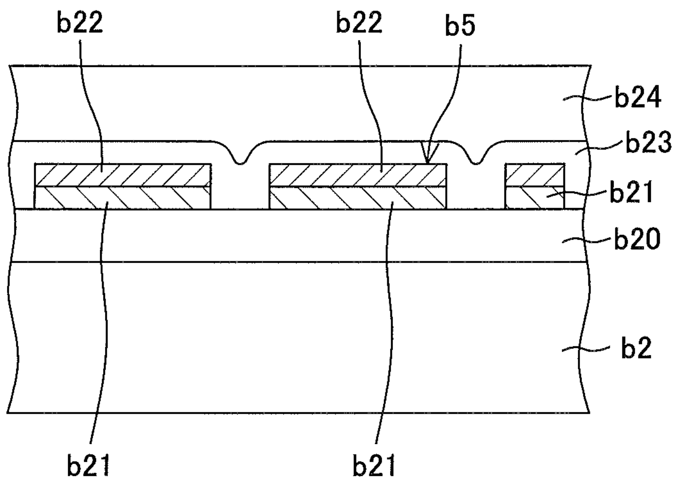
FIG. 43C is a widthwise vertical sectional view taken along a line C-C in FIG. 43A for explaining the structure of the resistor bodies of the device.

FIG. 43A is a plan view illustrating a part of the device shown in FIG. 42 on an enlarged scale. FIG. 43B is a longitudinal vertical sectional view taken along a line B-B in FIG. 43A for explaining the structure of the resistor bodies of the device. FIG. 43C is a widthwise vertical sectional view taken along a line C-C in FIG. 43A for explaining the structure of the resistor bodies of the device. Referring to FIGS. 43A, 43B and 43C, the structure of the resistor bodies R will be described.

The chip resistor b1 includes an insulative layer b20 and a resistive film b21 in addition to the interconnection film b22, the insulative film b23 and the resin film b24 described above (see FIGS. 43B and 43C). The insulative layer b20, the resistive film b21, the interconnection film b22, the insulative film b23 and the resin film b24 are provided on the board b2 (on the front surface b2A). The insulative layer b20 is made of $SiO_2$ (silicon oxide). The insulative layer b20 covers the entire front surface b2A of the board b2. The insulative layer b20 has a thickness of about 10000 Å.

The resistive film b21 is provided on the insulative layer b20. The resistive film b21 is made of TiN, TION or TiSiON. The resistive film b21 has a thickness of about 2000 Å. The resistive film b21 includes a plurality of resistive film portions (hereinafter referred to as "resistive film lines b21A") extending linearly parallel to each other between the first connection electrode b3 and the second connection electrode b4. Some of the resistive film lines b21A are cut at predetermined positions with respect to a line extending direction (see FIG. 43A).

Portions of the interconnection film b22 are provided on the resistive film lines b21A. The interconnection film portions b22 are each made of Al (aluminum) or an alloy (AlCu alloy) of aluminum and Cu (copper). The interconnection film portions b22 each have a thickness of about 8000 Å. The interconnection film portions b22 are provided on the resistive film lines b21A in contact with the resistive film lines b21A, and spaced a predetermined distance R from one another in the line extending direction.

Figure 44:
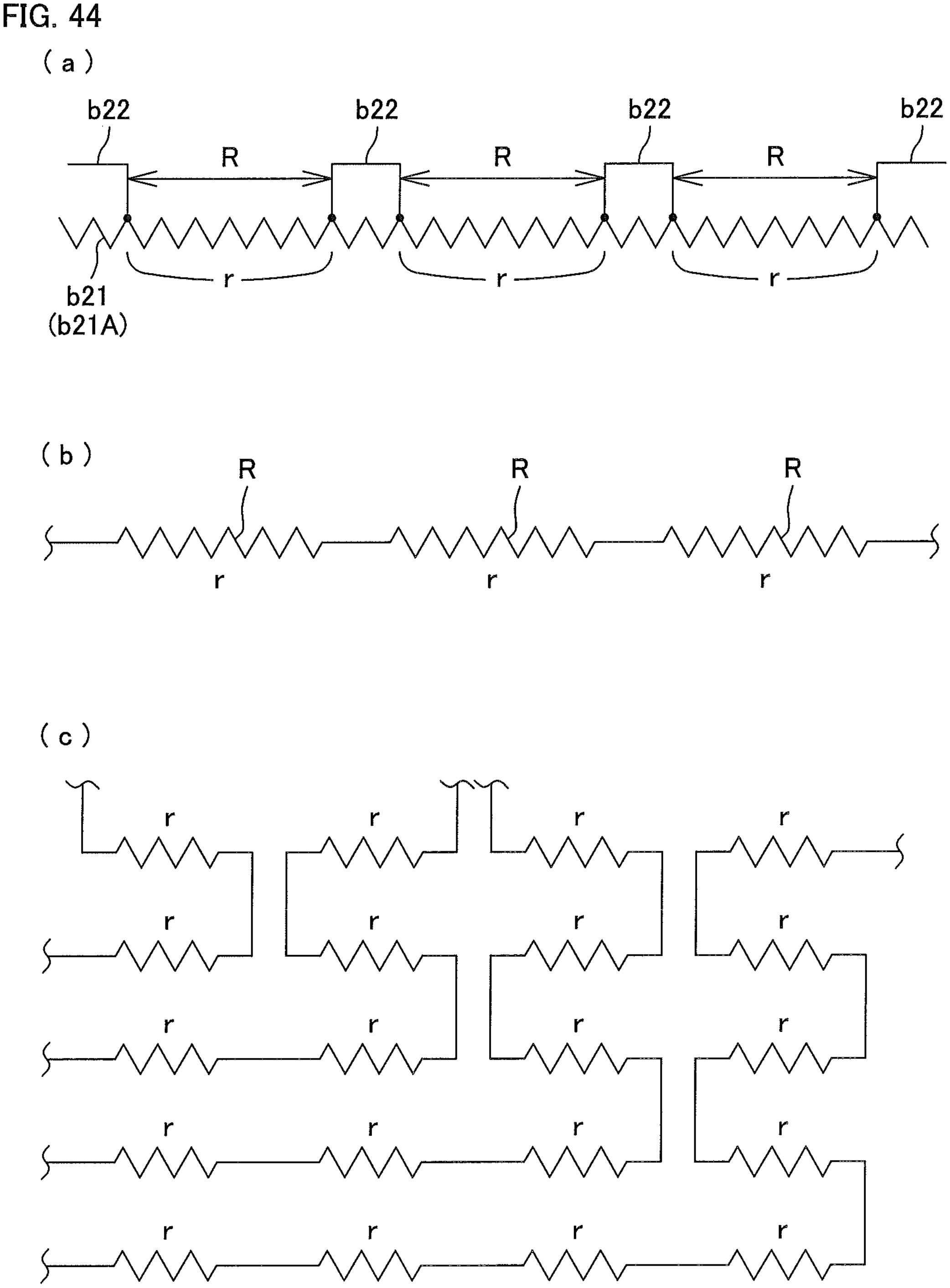
FIG. 44 are diagrams showing the electrical characteristic features of a resistive film line and an interconnection film by way of circuit symbols and electric circuit diagrams.

In FIG. 44, the electrical characteristic features of the resistive film lines b21A and the interconnection film portions b22 of this arrangement are shown by way of circuit symbols. As shown in FIG. 44(*a*), portions of each of the resistive film lines b21A present between the interconnection film portions b22 spaced the predetermined distance R from one another each serve as a single resistor body R having a predetermined resistance value r. The interconnection film portions b22, which electrically connect adjacent resistor bodies R to each other, cause short circuit in each of the resistive film lines b21A on which the interconnection film portions b22 are provided. Thus, a resistor circuit is provided, in which the resistor bodies R each having a resistance r are connected in series as shown in FIG. 44(*b*).

Further, adjacent resistive film lines b21A are connected to each other by the resistive film b21 and the interconnection film b22, so that the resistor circuit network of the device b5 shown in FIG. 43A constitutes a resistor circuit (including the resistor unit of the resistor bodies R described above) shown in FIG. 44(*c*). Thus, the resistor bodies R and the resistor circuits (i.e., the device b5) are constituted by the resistive film b21 and the interconnection film b22. The resistor bodies R each include a resistive film line b21A (resistive film b21), and a plurality of interconnection film portions b22 spaced the predetermined distance from one another in the line extending direction on the resistive film line b21A. Portions of the resistive film line b21A not provided with the interconnection film portions b22 spaced the predetermined distance R from one another each define a single resistor body R. The portions of the resistive film line b21A defining the resistor bodies R each have the same shape and the same size. Therefore, the multiplicity of resistor bodies R arranged in the matrix array on the board b2 have the same resistance value.

Figure 45:
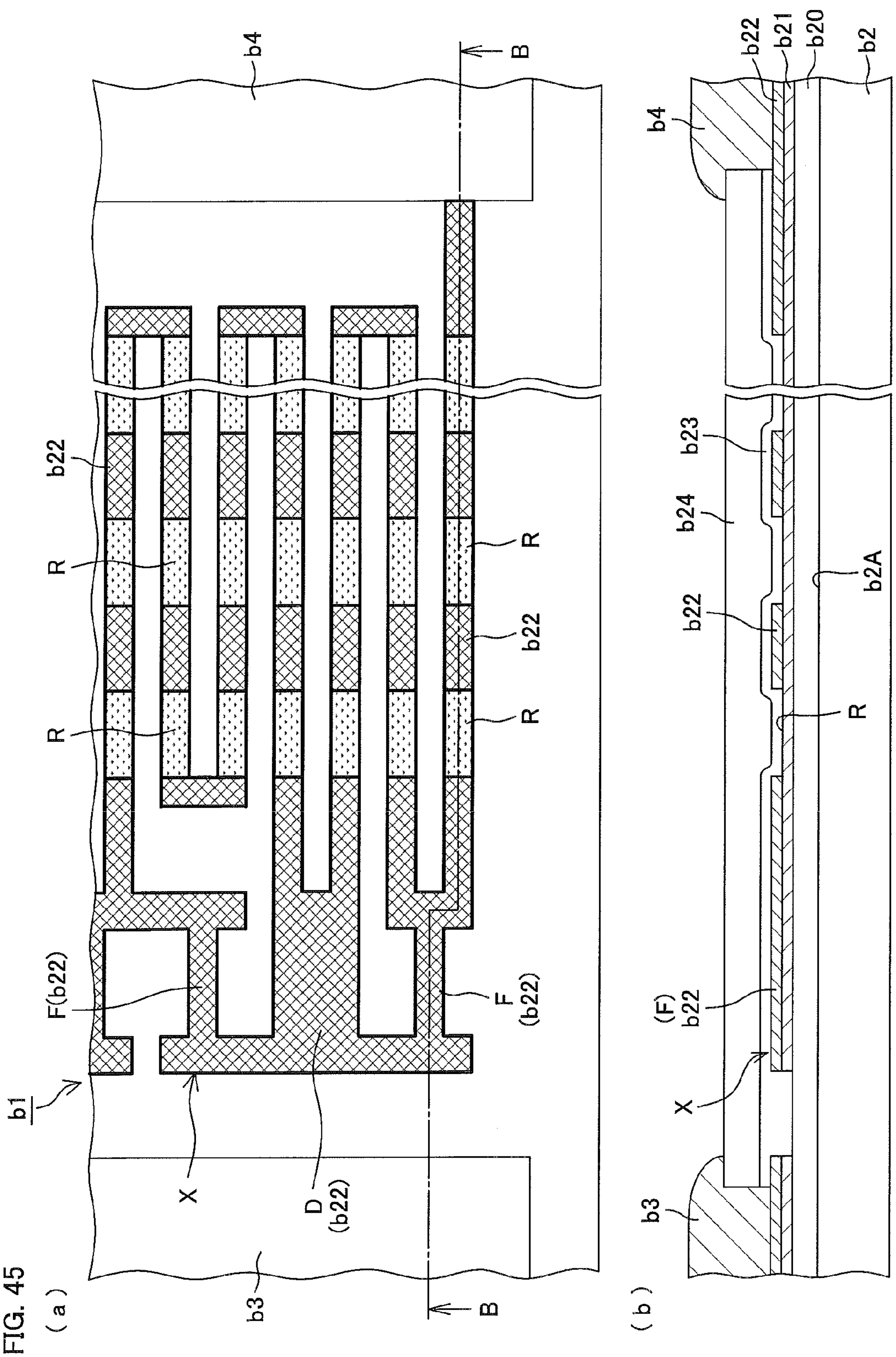
FIG. 45(*a*) is an enlarged partial plan view illustrating a region of the chip resistor including fuses shown in a part of the plan view of FIG. 42 on an enlarged scale, and FIG. 45(*b*) is a diagram showing a sectional structure taken along a line B-B in FIG. 45(*a*).

The interconnection film portions b22 provided on the resistive film lines b21A define the resistor bodies R, and also serve as conductor films D for connecting the resistor bodies R to one another to provide the resistor circuits (see FIG. 42). FIG. 45(*a*) is an enlarged partial plan view illustrating a region of the chip resistor including fuses shown in a part of the plan view of FIG. 42 on an enlarged scale, and FIG. 45(*b*) is a diagram showing a sectional structure taken along a line B-B in FIG. 45(*a*).

As shown in FIGS. 45(*a*) and 45(*b*), the interconnection film portion b22 for the fuses F and the conductor films D described above is formed from the same interconnection film b22 as the interconnection film portions b22 provided on the resistive film b21 for the resistor bodies R. That is, the fuses F and the conductor films D are formed of Al or the AlCu alloy, which is the same metal material as for the interconnection film portions b22 provided on the resistive film lines b21A to define the resistor bodies R, and provided at the same level as the interconnection film portions b22. As described above, the interconnection film portion b22 serves as the conductor films D for electrically connecting the plurality of resistor bodies R to form the resistor circuit.

That is, the interconnection film portions b22 for defining the resistor bodies R, the interconnection film portion b22 for the fuses F and the conductor films D, and the interconnection film portions b22 for connecting the device b5 to the first connection electrode b3 and the second connection electrode b4 are formed of the same metal material (Al or the AlCu alloy) and provided at the same level on the resistive film b21. It is noted that the fuses F are different (discriminated) from the other interconnection film portions b22 in that the fuses F are thinner for easy disconnection and no circuit element is present around the fuses F.

A region of the interconnection film portion b22 in which the fuses F are disposed is herein referred to as "trimming region X" (see FIGS. 42 and 45(*a*)). The trimming region X linearly extends alongside the inner edge of the first connection electrode b3, and not only the fuses F but also some of the conductor films D are present in the trimming region X. The resistive film b21 is partly present below the interconnection film portion b22 in the trimming region X (see FIG. 45(*b*)). The fuses F are each spaced a greater distance from the surrounding interconnection film portions b22 than the other interconnection film portions b22 present outside the trimming region X.

The fuses F each do not simply designate a part of the interconnection film portion b22, but may each designate a fuse element which is a combination of a part of the resistor body R (resistive film b21) and a part of the interconnection film portion b22 on the resistive film b21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

Figure 46:
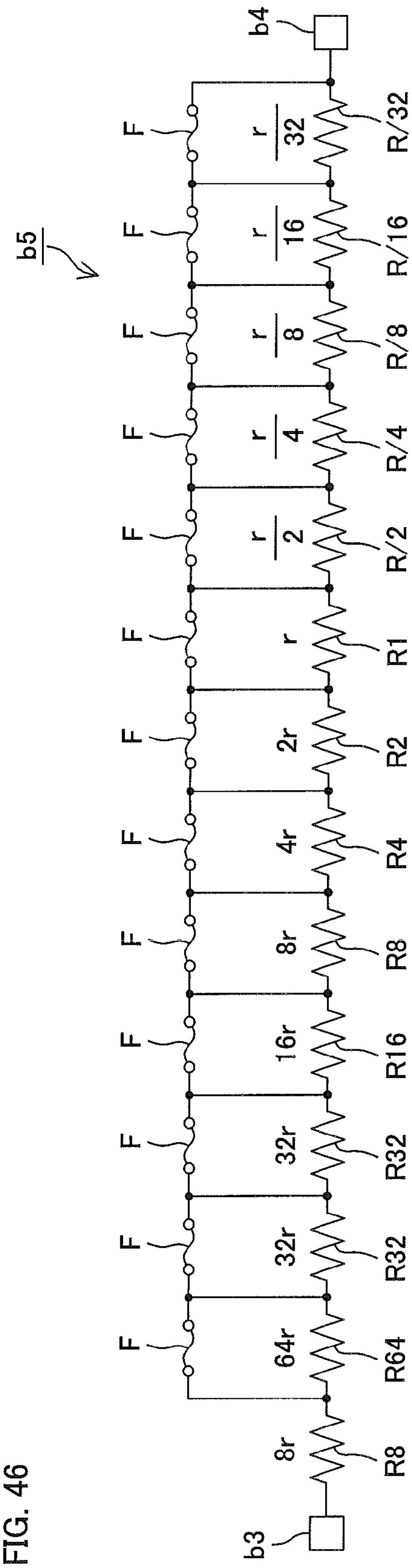
FIG. 46 is an electric circuit diagram of the device according to the example of the second reference embodiment.

FIG. 46 is an electric circuit diagram of the device according to the example of the second reference embodiment. Referring to FIG. 46, the device b5 includes a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first connection electrode b3. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 47 and 48 to be described later.

A single fuse F is connected in parallel to each of the resistor circuits R64 to R/32 except the reference resistor circuit R8. The fuses F are connected in series to one another directly or via the conductor films D (see FIG. 45(*a*)). With none of the fuses F fused off as shown in FIG. 46, the device b5 includes a resistor circuit such that the reference resistor circuit R8 including 8 resistor bodies R connected in series is provided between the first connection electrode b3 and the second connection electrode b4. Where the resistor bodies R each have a resistance value r of r=8Ω, for example, the chip resistor b1 is configured such that the first connection electrode b3 and the second connection electrode b4 are connected to each other through a resistor circuit (including the reference resistor circuit R8) having a resistance value of 8r=64Ω.

With none of the fuses F fused off, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto. Therefore, the resistor circuits except the reference resistor circuit R8 are not electrically incorporated in the device b5.

In the chip resistor b1 according to this example, the fuses F are selectively fused off, for example, by a laser beam according to the required resistance value. Thus, a resistor circuit connected in parallel to a fused fuse F is incorporated in the device b5. Therefore, the device b5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device b5 (resistor portion b56) can be digitally and finely controlled to a desired resistance value by selectively fusing off the fuses F (or the fuse elements described above). Thus, the chip resistor b1 can have the desired resistance value.

Figure 47:
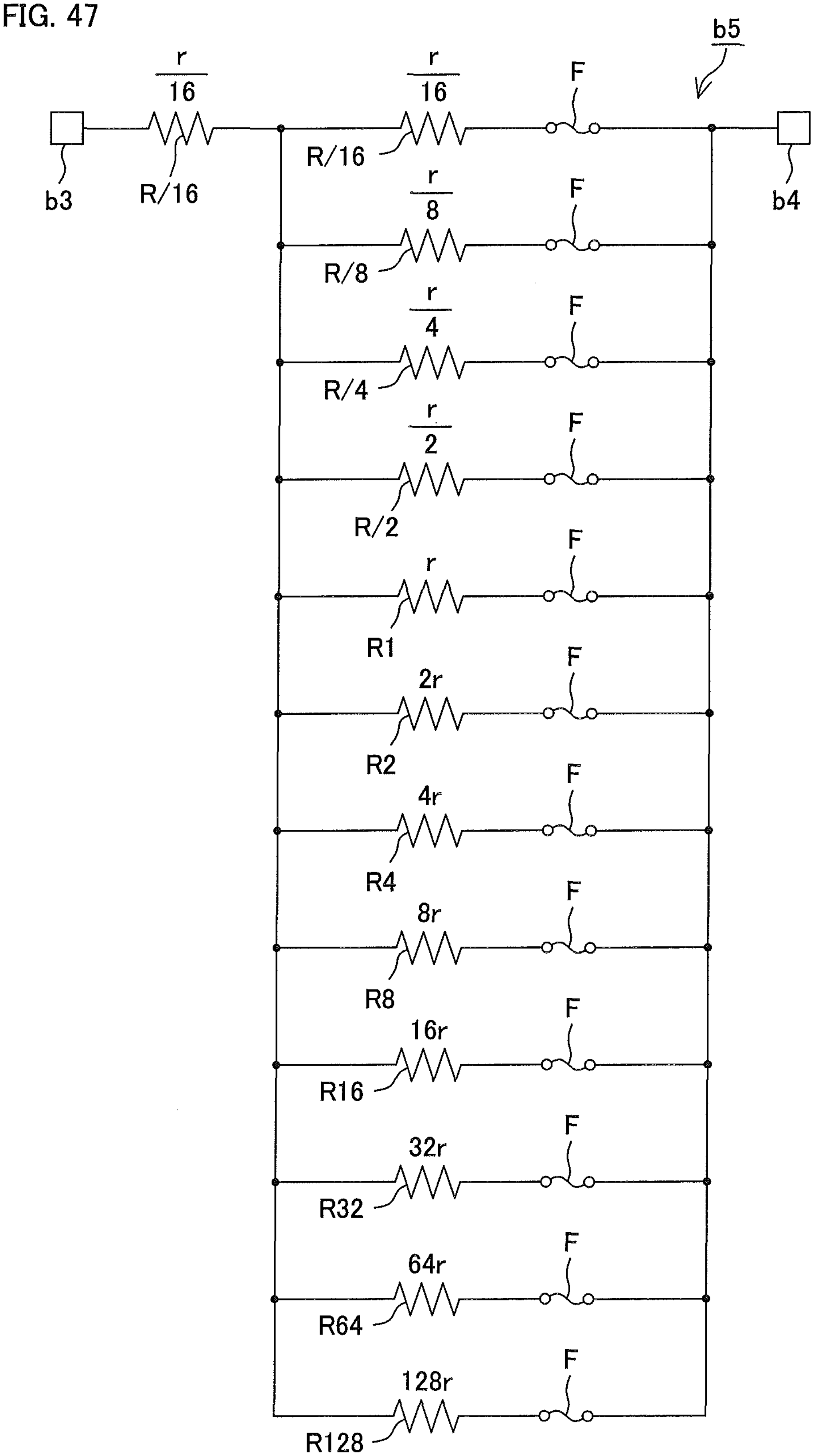
FIG. 47 is an electric circuit diagram of a device according to another example of the second reference embodiment.

FIG. 47 is an electric circuit diagram of a device according to another example of the second reference embodiment. The device b5 may be configured as shown in FIG. 47, rather than by connecting the resistor circuits R64 to R/32 in series to the reference resistor circuit R8 as shown in FIG. 46. More specifically, the device b5 may include a circuit configured such that a parallel connection circuit including 12 types of resistor circuits R/16, R/8, R/4, R/2, R1, R2, R4, R8, R16, R32, R64, R128 is connected in series to a reference resistor circuit R/16 between the first connection electrode b3 and the second connection electrode b4.

In this case, a fuse F is connected in series to each of the 12 types of resistor circuits except the reference resistor circuit R/16. With none of the fuses F fused off, all the resistor circuits are electrically incorporated in the device b5. The fuses F are selectively fused off, for example, by a laser beam according to the required resistance value. Thus, a resistor circuit associated with a fused fuse F (a resistor circuit connected in series to the fused fuse F) is electrically isolated from the device b5 to control the overall resistance value of the chip resistor b1.

Figure 48:
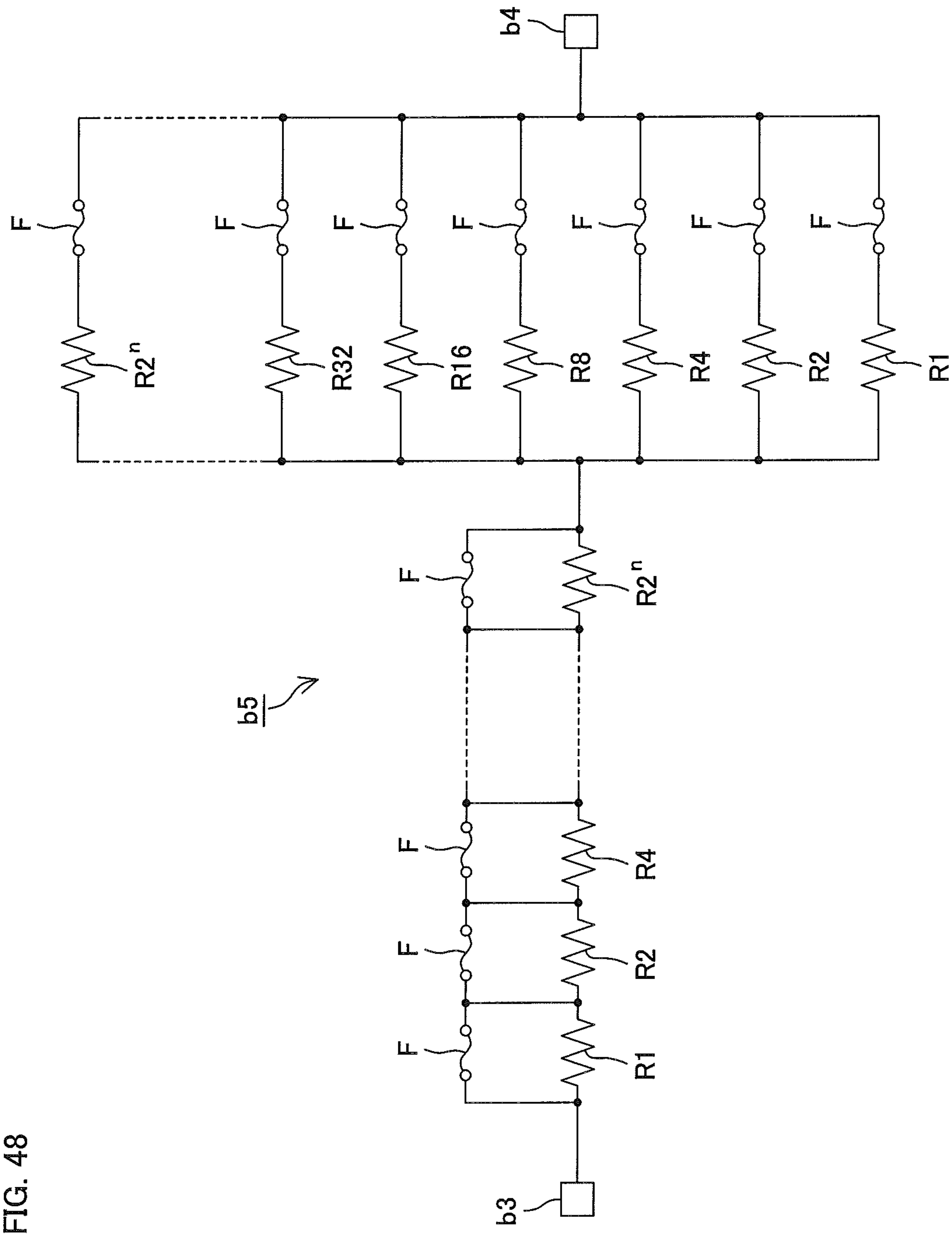
FIG. 48 is an electric circuit diagram of a device according to further another example of the second reference embodiment.

FIG. 48 is an electric circuit diagram of a device according to further another example of the second reference embodiment. The device b5 shown in FIG. 48 has a characteristic circuit configuration such that a serial connection circuit including plural types of resistor circuits is connected in series to a parallel connection circuit including plural types of resistor circuits. As in the previous example, a fuse F is connected in parallel to each of the plural types of resistor circuits connected in series, and all the plural types of resistor circuits connected in series are short-circuited by the fuses F. With a fuse F fused off, therefore, a resistor circuit which has been short-circuited by that fuse F is electrically incorporated in the device b5.

On the other hand, a fuse F is connected in series to each of the plural types of resistor circuits connected in parallel. With a fuse F fused off, therefore, a resistor circuit which has been connected in series to that fuse F is electrically isolated from the parallel connection circuit of the resistor circuits. With this arrangement, a resistance of smaller than 1 kΩ may be formed in the parallel connection circuit, and a resistor circuit of 1 kΩ or greater may be formed in the serial connection circuit. Thus, a resistor circuit having a resistance value extensively ranging from a smaller resistance value on the order of several ohms to a greater resistance value on the order of several megaohms can be produced from resistor circuit networks designed based on the same basic design concept. That is, the chip resistor b1 can be easily and speedily customized to have any of plural resistance values by selectively disconnecting one or more of the fuses F. In other words, the chip resistor b1 can be customized based on the same design concept so as to have various resistance values by selectively combining the resistor bodies R having different resistance values.

Figure 49:
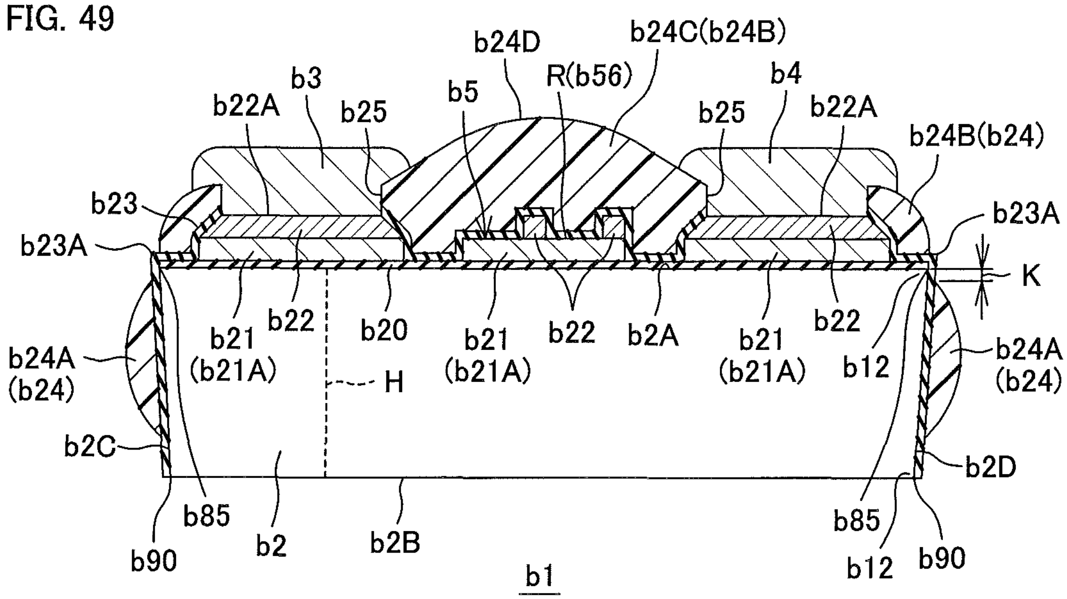
FIG. 49 is a schematic sectional view of the chip resistor.

In the chip resistor b1, as described above, the connection of the plurality of resistor bodies R (resistor circuits) can be changed in the trimming region X. FIG. 49 is a schematic sectional view of the chip resistor. Referring next to FIG. 49, the chip resistor b1 will be described in greater detail. In FIG. 49, the device b5 described above is simplified, and components other than the board b2 are hatched for convenience of description.

The insulative film b23 and the resin film b24 will be described. The insulative film b23 is made of, for example, SiN (silicon nitride), and has a thickness of 1000 Å to 5000 Å (here, about 3000 Å). The insulative film b23 is provided over the front surface b2A and the side surfaces b2C to b2F. A portion of the insulative film b23 present on the front surface b2A covers the resistive film b21 and the interconnection film portions b22 present on the resistive film b21 (i.e., the device b5) from the front side (from the upper side in FIG. 49), thereby covering the upper surfaces of the resistor bodies R of the device b5. Thus, the insulative film portion b23 also covers the interconnection film portion b22 in the trimming region X described above (see FIG. 45(*b*)). Further, the insulative film portion b23 contacts the device b5 (the interconnection film b22 and the resistive film b21), and also contacts the insulative layer b20 in a region not formed with the resistive film b21. Thus, the insulative film portion b23 present on the front surface b2A covers the entire front surface b2A to function as a protective film for protecting the device b5 and the insulative layer b20. On the front surface b2A, the insulative film portion b23 prevents an unintended short circuit which may be a short circuit other than that occurring between the interconnection film portions b22 present between the resistor bodies R (an unintended short circuit which may occur between adjacent resistive film lines b21A).

On the other hand, portions of the insulative film b23 present on the respective side surfaces b2C to b2F function as protective layers which respectively protect the side surfaces b2C to b2F. The edge portion b85 described above is present on the boundaries between the front surface b2A and the side surfaces b2C to b2F, and the insulative film b23 also covers the boundaries (the edge portion b85). A portion of the insulative film b23 covering the edge portion b85 (overlying the edge portion b85) is herein referred to as an edge portion b23A.

Together with the insulative film b23, the resin film b24 protects the front surface b2A of the chip resistor b1. The resin film b24 is made of a resin such as a polyimide. The resin film b24 has a thickness of about 5 μm. As described above, the resin film b24 includes the first resin film b24A and the second resin film b24B. The first resin film b24A covers the portions of the side surfaces b2C to b2F located slightly apart from the edge portion b85 (the edge portion b23A of the insulative film b23) toward the back surface b2B. More specifically, the first resin film b24A is provided on regions of the side surfaces b2C to b2F spaced a distance K from the edge portion b85 of the front surface b2A toward the back surface b2B. However, the first resin film b24A is located closer to the front surface b2A than to the back surface b2B. Portions of the first resin film b24A on the side surfaces b2C, b2D each linearly extend alongside the entire shorter edge b82 (see FIG. 41(*a*)). Portions of the first resin film b24A on the side surfaces b2E, b2F each linearly extend alongside the entire longer edge b81 (see FIG. 41(*a*)). The first resin film b24A on the side surfaces b2C to b2F protrudes outward of the edges (the edge portion b85) of the front surface b2A. More specifically, the first resin film b24A is arcuately bulged outward of the edge portion b85 in directions parallel to the front surface b2A. Therefore, the first resin film b24A defines the contour of the chip resistor b1 as seen in plan.

The second resin film b24B generally entirely covers the surface of the insulative film b23 on the front surface b2A (including the resistive film b21 and the interconnection film b22 covered with the insulative film b23). More specifically, the second resin film b24B is offset from the edge portion b23A of the insulative film b23 (the edge portion b85 of the front surface b2A) so as not to cover the edge portion b23A. Therefore, the first resin film b24A and the second resin film b24B are not continuous to each other, but discontinuous along the edge portion b23A (on the entire edge portion b85). Thus, the edge portion b23A of the insulative film b23 (on the entire edge portion b85) is exposed to the outside.

The second resin film b24B has two openings b25 respectively formed at two positions spaced from each other as seen in plan. The openings b25 are through-holes extending continuously thicknesswise through the second resin film b24B and the insulative film b23. Therefore, not only the second resin film b24B but also the insulative film b23 has the openings b25. The interconnection film portions b22 are partly exposed from the respective openings b25. The parts of the interconnection film portions b22 exposed from the respective openings b25 serve as pad regions b22A for the external connection.

One of the two openings b25 is completely filled with the first connection electrode b3, and the other opening b25 is completely filled with the second connection electrode b4. The first connection electrode b3 and the second connection electrode b4 partly protrude from the respective openings b25 above the surface of the second resin film b24B. The first connection electrode b3 is electrically connected to the pad region b22A of the interconnection film portion b22 present in the one opening b25 through the one opening b25. The second connection electrode b4 is electrically connected to the pad region b22A of the interconnection film portion b22 present in the other opening b25 through the other opening b25. Thus, the first connection electrode b3 and the second connection electrode b4 are electrically connected to the device b5. Here, the interconnection film portions b22 serve as interconnections connected to the assembly of the resistor bodies R (resistor portion b56), the first connection electrode b3 and the second connection electrode b4.

Thus, the second resin film b24B and the insulative film b23 formed with the openings b25 cover the front surface b2A with the first connection electrode b3 and the second connection electrode b4 being exposed from the respective openings b25. Therefore, the electrical connection between the chip resistor b1 and the mount board b9 is achieved through the first connection electrode b3 and the second connection electrode b4 partly protruding from the surface of the second resin film b24B through the openings b25 (see FIG. 41(*b*)).

Here, a portion of the second resin film b24B present between the first connection electrode b3 and the second connection electrode b4 (hereinafter referred to as "middle portion b24C") is raised to a level higher than the first connection electrode b3 and the second connection electrode b4 (away from the front surface b2A). That is, the middle portion b24C has a surface b24D raised to the level higher than the first connection electrode b3 and the second connection electrode b4. The surface b24D is convexly curved away from the front surface b2A.

Figure 50A:
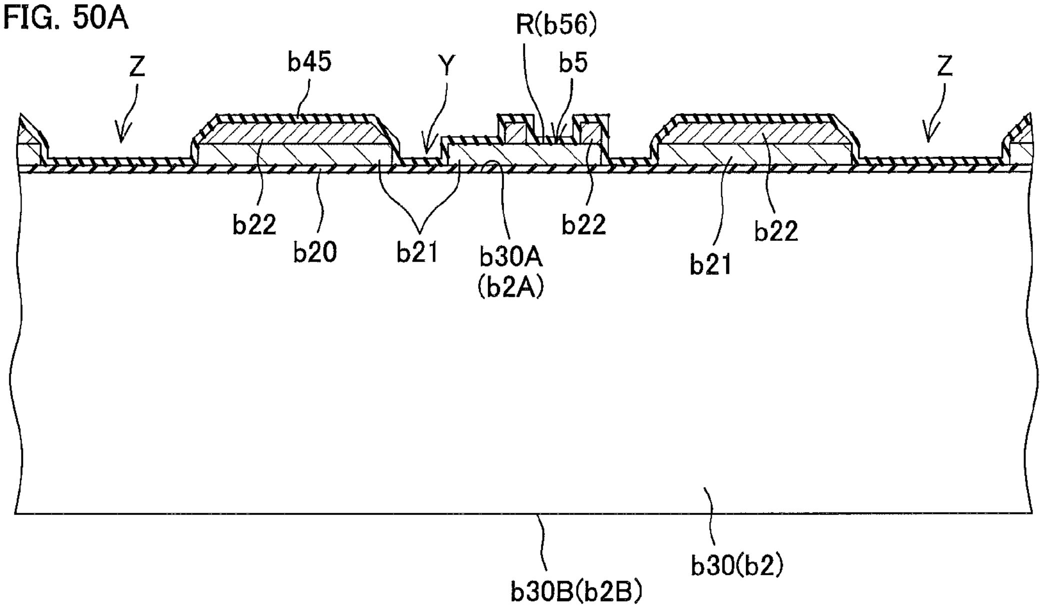
FIG. 50A is a schematic sectional view showing a production method for the chip resistor shown in FIG. 49.

FIGS. 50A to 50G are schematic sectional views showing a production method for the chip resistor shown in FIG. 49. First, as shown in FIG. 50A, a substrate b30 is prepared as a material for the board b2. In this case, a front surface b30A of the substrate b30 corresponds to the front surface b2A of the board b2, and a back surface b30B of the substrate b30 corresponds to the back surface b2B of the board b2.

Then, an insulative layer b20 of $SiO_2$ or the like is formed in the front surface b30A of the substrate b30 by thermally oxidizing the front surface b30A of the substrate b30, and devices b5 (each including resistor bodies R and interconnection film portions b22 connected to the resistor bodies R) are formed on the insulative layer b20. More specifically, a resistive film b21 of TiN, TiON or TiSiON is formed on the entire surface of the insulative layer b20 by sputtering, and then an interconnection film b22 of aluminum (Al) is formed on the resistive film b21 in contact with the resistive film b21. Thereafter, parts of the resistive film b21 and the interconnection film b22 are selectively removed for patterning by a photolithography process and dry etching such as RIE (Reactive Ion Etching). Thus, as shown in FIG. 43A, resistive film lines b21A each formed with the resistive film b21 and having a predetermined width are arranged at a predetermined interval in a column direction as seen in plan. At this time, the resistive film lines b21A and the interconnection film portions b22 are partly cut, and fuses F and conductor films D are formed in trimming regions X described above (see FIG. 42). In turn, parts of the interconnection film portions b22 provided on the respective resistive film lines b21A are selectively removed, for example, by wet etching. As a result, the devices b5 are produced, which are each configured such that interconnection film portions b22 spaced a predetermined distance R from one another are provided on the resistive film lines b21A. At this time, the overall resistance value of each of the devices b5 may be measured in order to check if the resistive film b21 and the interconnection film b22 are formed as each having intended dimensions.

Referring to FIG. 50A, a multiplicity of such devices b5 are formed on the front surface b30A of the substrate b30 according to the number of the chip resistors b1 to be formed on the single substrate b30. Regions of the substrate b30 respectively formed with the devices b5 (the aforementioned resistor portions b56) are each herein referred to as a chip component region Y (or a chip resistor region Y). Therefore, a plurality of chip component regions Y (i.e., the devices b5) each having the resistor portion b56 are formed (defined) on the front surface b30A of the substrate b30. The chip component regions Y each correspond to a single complete chip resistor b1 (see FIG. 49) as seen in plan. A region of the front surface b30A of the substrate b30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate b30. This allows for mass production of the chip resistors b1.

Then, as shown in FIG. 50A, an insulative film b45 of SiN is formed over the entire front surface b30A of the substrate b30 by a CVD (Chemical Vapor Deposition) method. The insulative film b45 entirely covers the insulative layer b20 and the devices b5 (the resistive film b21 and the interconnection film b22) present on the insulative layer b20, and contacts the insulative layer b20 and the devices b5. Therefore, the insulative film b45 also covers the interconnection film portions b22 in the aforementioned trimming regions X (see FIG. 42). Since the insulative film b45 is formed over the entire front surface b30A of the substrate b30, the insulative film b45 extends to a region other than the trimming regions X on the front surface b30A. Thus, the insulative film b45 serves as a protective film for protecting the entire front surface b30A (including the devices b5 on the front surface b30A).

Figure 50B:
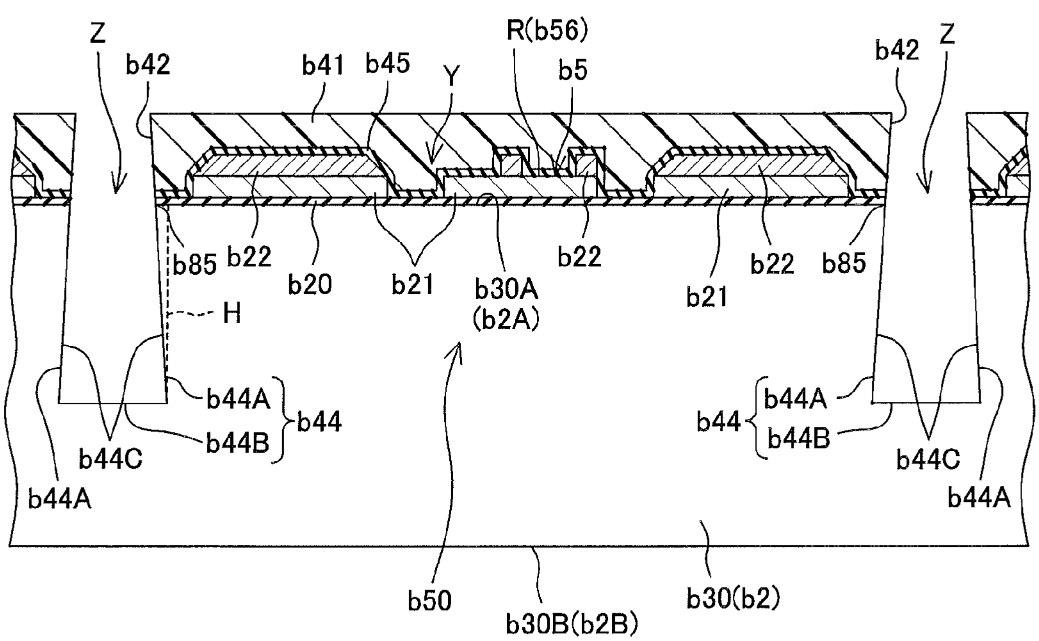
FIG. 50B is a schematic sectional view showing a process step subsequent to that shown in FIG. 50A.
Figure 51:
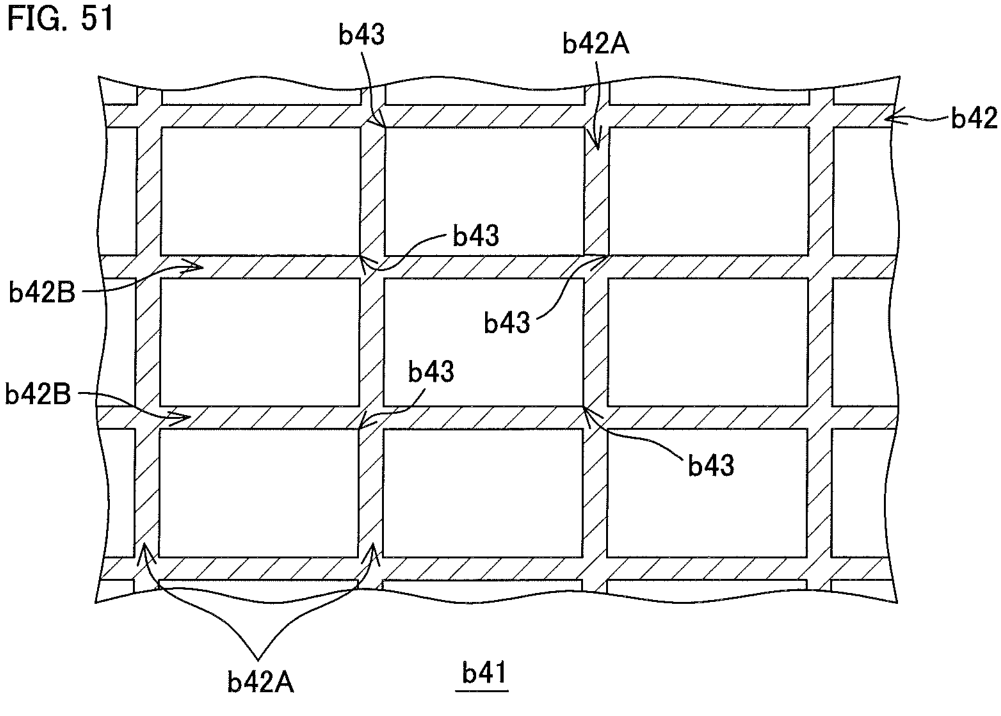
FIG. 51 is a schematic plan view showing a part of a resist pattern to be used for forming a trench in the step of FIG. 50B.

In turn, as shown in FIG. 50B, a resist pattern b41 is formed over the entire front surface b30A of the substrate b30 to entirely cover the insulative film b45. The resist pattern b41 has an opening b42. FIG. 51 is a schematic plan view showing a part of the resist pattern to be used for forming a trench in the process step of FIG. 50B.

Referring to FIG. 51, the opening b42 (hatched in FIG. 51) of the resist pattern b41 is aligned with (or corresponds to) a region (i.e., the boundary region Z) between the contours of adjacent chip resistors b1 (i.e., the chip component regions Y described above) as seen in plan when the chip resistors b1 are arranged in a matrix array (or in a lattice form). As a whole, the opening b42 has a lattice shape including linear portions b42A and linear portions b42B orthogonally crossing each other.

The linear portions b42A and the linear portions b42B of the opening b42 of the resist pattern b41 are connected to each other as crossing orthogonally to each other (without any curvature). Therefore, the linear portions b42A and the linear portions b42B interest each other at an angle of about 90 degrees as seen in plan to form angled intersection portions b43. Referring to FIG. 50B, parts of the insulative film b45, the insulative layer b20 and the substrate b30 are selectively removed by plasma etching with the use of the resist pattern b41 as a mask. Thus, a portion of the substrate b30 is removed from the boundary region Z defined between the adjacent devices b5 (chip component regions Y). As a result, a trench b44 is formed in the position (boundary region Z) corresponding to the opening b42 of the resist pattern b41 as seen in plan as extending through the insulative film b45 and the insulative layer b20 into the substrate b30 to a depth halfway the thickness of the substrate b30 from the front surface b30A of the substrate b30. The trench b44 is defined by pairs of side walls b44A opposed to each other, and a bottom wall b44B extending between lower edges of the paired side walls b44A (edges of the paired side walls b44A on the side of the back surface b30B of the substrate b30). The trench b44 has a depth of about 100 μm as measured from the front surface b30A of the substrate b30, and a width of about 20 μm (as measured between the opposed side walls b44A). However, the width of the trench b44 increases toward the bottom wall b44B. Therefore, side surfaces (wall surfaces b44C) of the respective side walls b44A defining the trench b44 are each tilted with respect to a plane H perpendicular to the front surface b30A of the substrate b30.

The trench b44 of the substrate b30 has a lattice shape as a whole corresponding to the shape of the opening b42 (see FIG. 51) of the resist pattern b41 as seen in plan. On the front surface b30A of the substrate b30, rectangular frame-like portions of the trench b44 (the boundary region Z) respectively surround the chip component regions Y in which the devices b5 are respectively provided. Portions of the substrate b30 respectively formed with the devices b5 are semi-finished products b50 of the chip resistors b1. The semi-finished products b50 are respectively located in the chip component regions Y surrounded by the trench b44 on the front surface b30A of the substrate b30. These semi-finished products b50 are arranged in a matrix array. By thus forming the trench b44, the substrate b30 is divided into a plurality of boards b2 (resistor main bodies described above) respectively defined by the chip component regions Y.

Figure 50C:
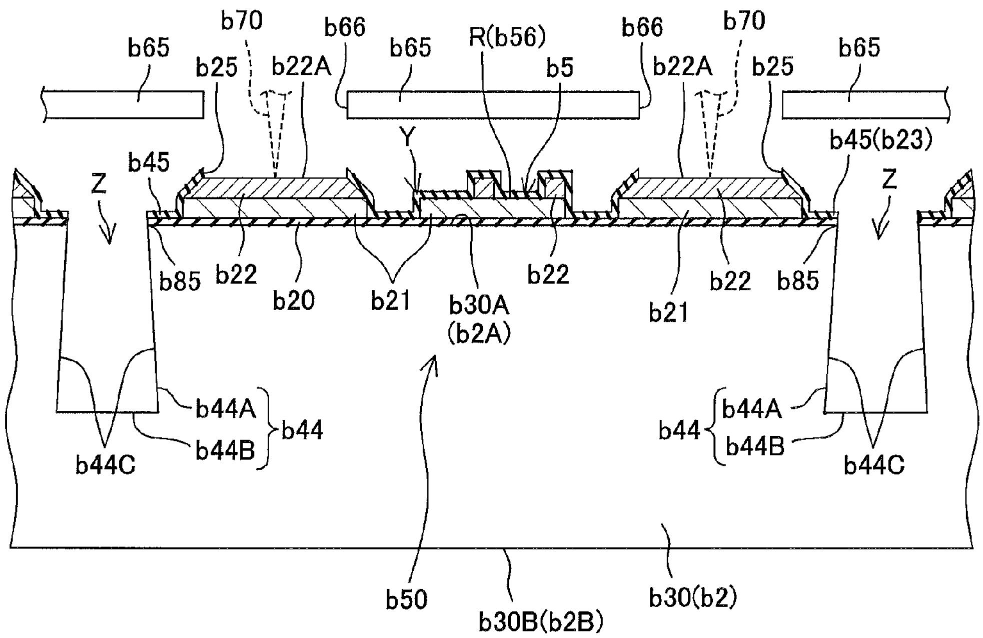
FIG. 50C is a schematic sectional view showing a process step subsequent to that shown in FIG. 50B.

After the trench b44 is formed as shown in FIG. 50B, the resist pattern b41 is removed, and the insulative film b45 is selectively etched off with the use of a mask b65 as shown in FIG. 50C. The mask b65 has openings b66 formed in association with portions of the insulative film b45 aligned with the pad regions b22A (see FIG. 49) as seen in plan. Thus, the portions of the insulative film b45 aligned with the openings b66 are etched off, whereby openings b25 are formed in these portions of the insulative film b45. Thus, the pad regions b22A are exposed from the insulative film b45 in the openings b25. The semi-finished products b50 each have two openings b25.

After the two openings b25 are formed in the insulative film b45 of each of the semi-finished products b50, probes b70 of a resistance measuring device (not shown) are brought into contact with the pad regions b22A in the respective openings b25 to detect the overall resistance value of the device b5. Subsequently, a laser beam (not shown) is applied to desired ones of the fuses F (see FIG. 42) through the insulative film b45, whereby the desired fuses F of the interconnection film portion b22 in the trimming region X described above are trimmed by the laser beam to be fused off. Thus, the overall resistance value of the semi-finished product b50 (i.e., the chip resistor b1) can be controlled, as described above, by selectively fusing off (trimming) the fuses F for the required resistance value. At this time, the insulative film b45 serves as a cover film for covering the devices b5, thereby preventing a short circuit which may otherwise occur when a debris occurring during the fusing adheres to any of the devices b5. Further, the insulative film b45 covers the fuses F (resistive film b21), so that the desired fuses F can be reliably fused off by accumulating the energy of the laser beam therein.

Figure 50D:
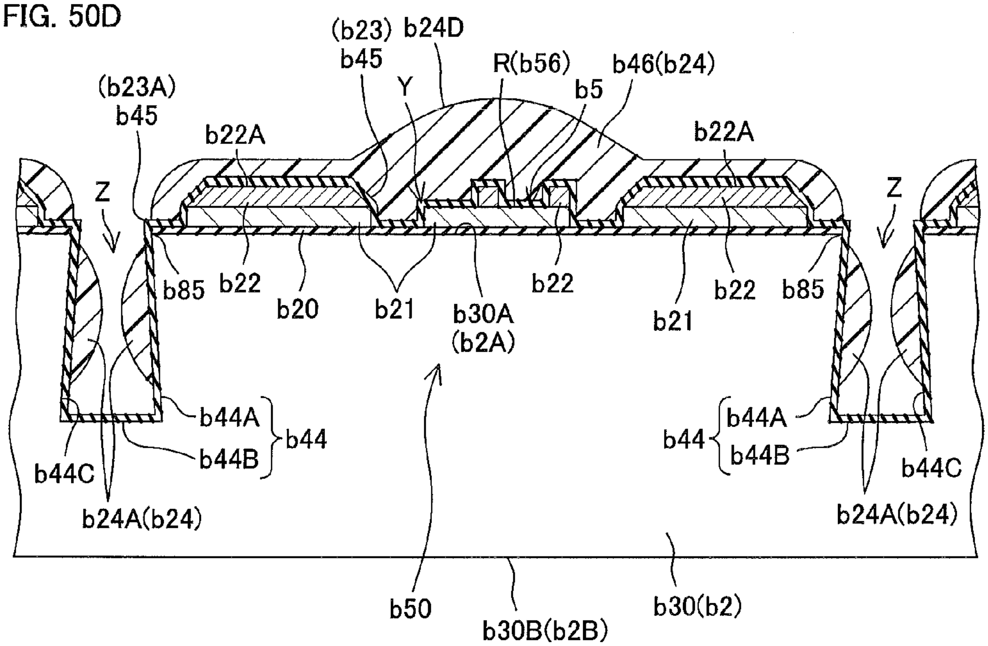
FIG. 50D is a schematic sectional view showing a process step subsequent to that shown in FIG. 50C.

Thereafter, SiN is further deposited on the insulative film b45 by the CVD method to thicken the insulative film b45. At this time, as shown in FIG. 50D, the insulative film b45 is also formed on the entire inner peripheral surface of the trench b44 (the wall surfaces b44C of the side walls b44A and an upper surface of the bottom wall b44B). The insulative film b45 finally has a thickness of 1000 Å to 5000 Å (here, about 3000 Å) (in a state shown in FIG. 50D). At this time, the insulative film b45 partly enters the openings b25 to close the openings b25.

Thereafter, a liquid photosensitive resin of a polyimide is sprayed over the resulting substrate b30 from above the insulative film b45. Thus, a photosensitive resin coating film b46 is formed as shown in FIG. 50D. The liquid photosensitive resin does not stagnate around the mouth of the trench b44 (corresponding to the edge portion b23A of the insulative film b23 and the edge portion b85 of the board b2), but flows. Therefore, the liquid photosensitive resin adheres to regions of the side walls b44A (wall surfaces b44C) of the trench b44 located apart from the front surface b30A of the substrate b30 toward the back surface b30B (toward the bottom wall b44B) and to regions of the front surface b30A located apart from the edge portion b23A of the insulative film b23 to thereby form a coating film b46 (resin film) on these regions. Portions of the coating film b46 present on the front surface b30A each have an upwardly convexly curved shape.

Portions of the coating film b46 formed on the side walls b44A of the trench b44 merely cover parts of the side walls b44A of the trench b44 on the side of the devices b5 (on the side of the front surface b30A), and do not reach the bottom wall b44B of the trench b44. Therefore, the trench b44 is not closed with the coating film b46. In turn, the coating film b46 is thermally treated (cured). Thus, the coating film b46 is thermally shrunk to a smaller thickness, and hardened to have a stable film quality.

Figure 50E:
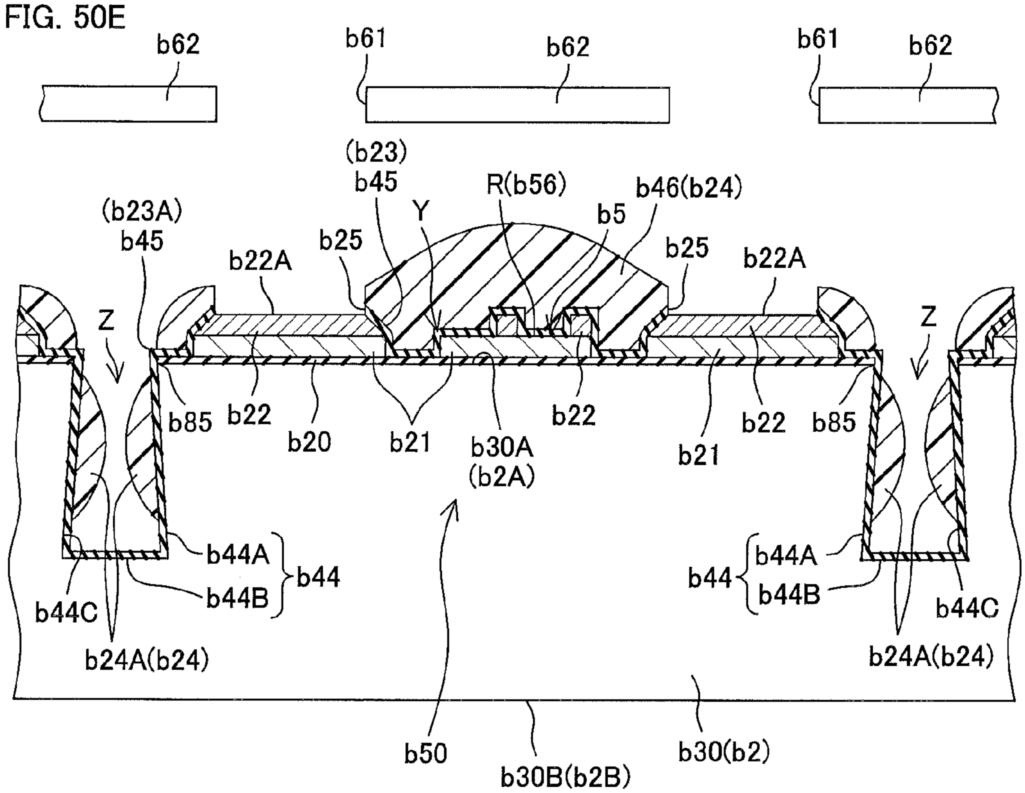
FIG. 50E is a schematic sectional view showing a process step subsequent to that shown in FIG. 50D.

In turn, as shown in FIG. 50E, parts of the coating film b46 aligned with the pad regions b22A of the interconnection film b22 (openings b25) on the front surface b30A as seen in plan are selectively removed by patterning the coating film b46. More specifically, the coating film b46 is exposed to light with the use of a mask b62 of a pattern having openings b61 aligned with (corresponding to) the pad regions b22A as seen in plan, and then developed in the pattern. Thus, the parts of the coating film b46 are removed from above the pad regions b22A. Then, parts of the insulative film b45 on the pad regions b22A are removed by RIE using a mask not shown, whereby the openings b25 are uncovered to expose the pad regions b22A.

Figure 50F:
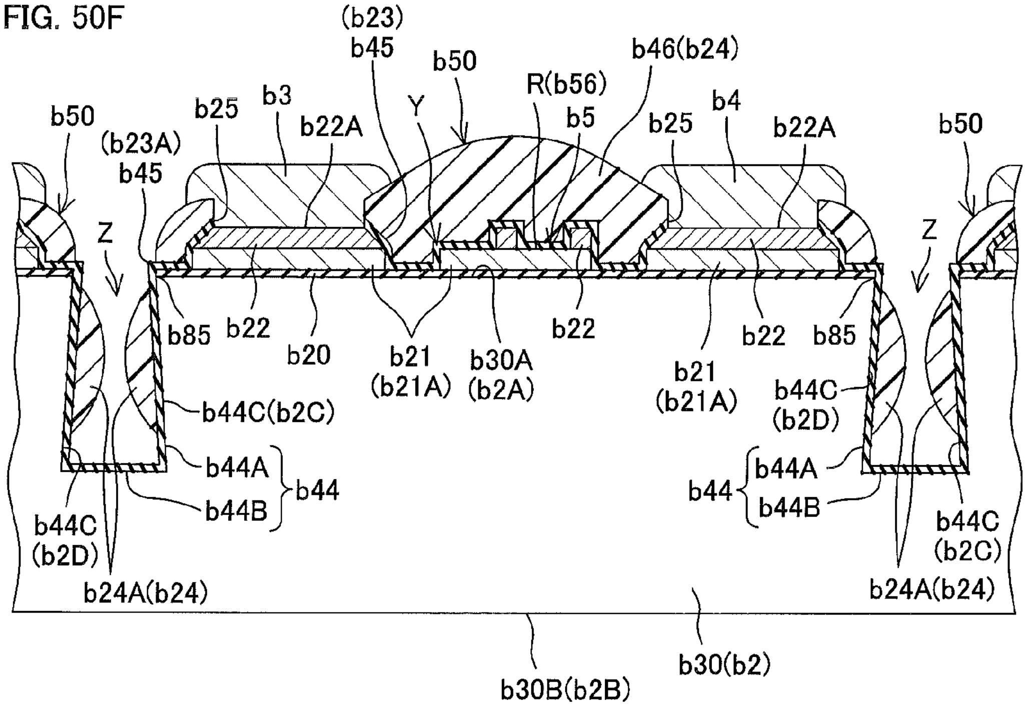
FIG. 50F is a schematic sectional view showing a process step subsequent to that shown in FIG. 50E.

In turn, Ni/Pd/Au multilayer films are formed in the openings b25 on the pad regions b22A by depositing Ni, Pd and Au by electroless plating. At this time, the Ni/Pd/Au multilayer films respectively project from the openings b25 above the surface of the coating film b46. Thus, the Ni/Pd/Au multilayer films formed in the openings b25 serve as the first and second connection electrodes b3, b4 as shown in FIG. 50F. Upper surfaces of the first and second connection electrodes b3, b4 are located at a lower level than apexes of the upwardly convexly curved portions of the coating film b46 on the front surface b30A.

Figure 50G:
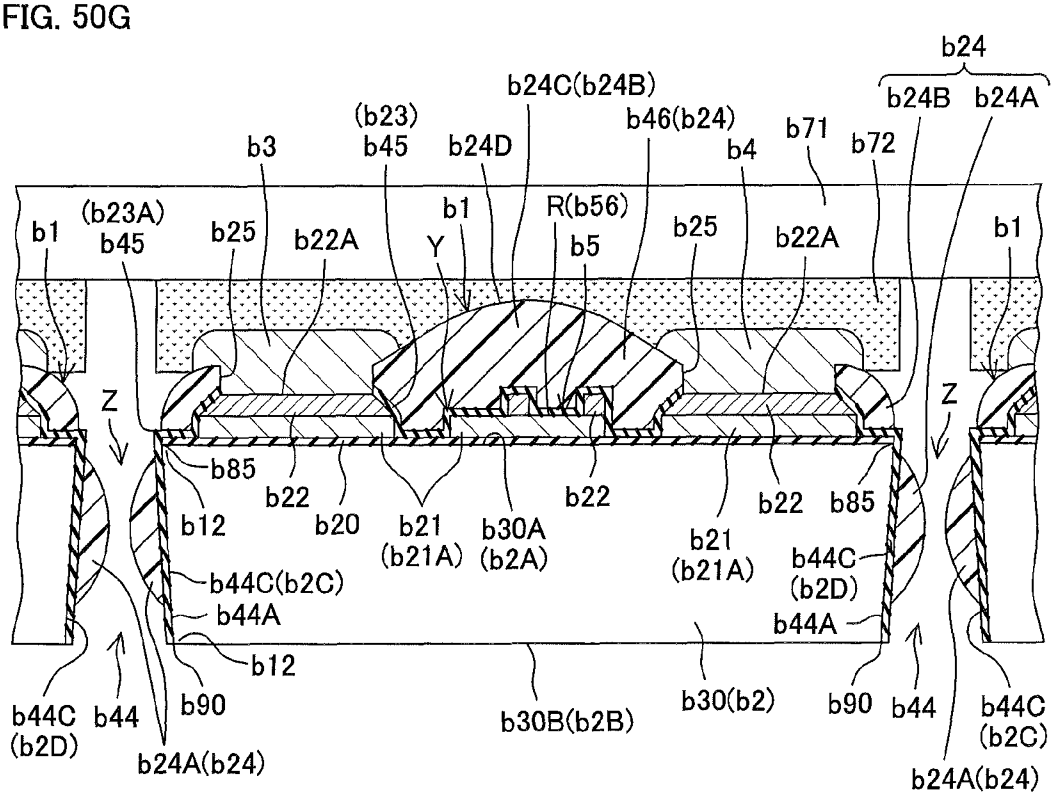
FIG. 50G is a schematic sectional view showing a process step subsequent to that shown in FIG. 50F.

After a continuity test is performed between the first connection electrode b3 and the second connection electrode b4 of each of the semi-finished products b50, the substrate b30 is ground from the back surface b30B. More specifically, as shown in FIG. 50G, a thin-plate support tape b71 of PET (polyethylene terephthalate) having an adhesive surface b72 is applied to the semi-finished products b50 with the adhesive surface b72 bonded to the first and second connection electrodes b3, b4 of the respective semi-finished products b50 (i.e., on the side of the front surface b30A) after the formation of the trench b44. Thus, the semi-finished products b50 are supported by the support tape b71. Here, a laminate tape, for example, may be used as the support tape b71.

With the semi-finished products b50 supported by the support tape b71, the substrate b30 is ground from the back surface b30B. After the substrate b30 is thinned to the bottom wall b44B of the trench b44 (see FIG. 50F) by the grinding, nothing connects the adjacent semi-finished products b50. Therefore, the substrate b30 is divided into the individual semi-finished products b50 along the trench b44. Thus, the chip resistors b1 are completed. That is, the substrate b30 is divided (split) along the trench b44 (i.e., along the boundary region Z), whereby the individual chip resistors b1 are separated from each other. Alternatively, the chip resistors b1 may be separated from each other by etching the substrate b30 from the back surface b30B to the bottom wall b44B of the trench b44.

The wall surfaces b44C of the side walls b44A of the trench b44 provide the side surfaces b2C to b2F of the boards b2 of the respective completed chip resistors b1, and the back surface b30B provides the back surfaces b2B of the respective chip resistors b1. That is, the step of forming the trench b44 by the etching as described above (see FIG. 50B)

is involved in the step of forming the side surfaces b2C to b2F. In the step of forming the trench b44, the wall surfaces b44C around the chip component regions Y of the substrate b30 (the side surfaces of the respective chip resistors b1) are simultaneously formed as each having a portion tilted with respect to the plane H perpendicular to the front surface b30A of the substrate b30 (see FIG. 50B). In other words, the formation of the trench b44 is equivalent to the simultaneous formation of the side surfaces b2C to b2F of the boards b2 of the respective chip resistors b1 each having a portion tilted with respect to the plane H.

By the formation of the trench b44 by the etching, the side surfaces b2C to b2F of the completed chip resistors b1 are imparted with rough texture of an irregular pattern. Where the trench b44 is mechanically formed by means of a dicing saw (not shown), a multiplicity of streaks of a regular pattern remain on the side surfaces b2C to b2F. These streaks cannot be removed from the side surfaces b2C to b2F by the etching.

Further, the insulative film b45 provides the insulative films b23 of the respective chip resistors b1, and the divided coating film b46 provides the resin films b24 of the respective chip resistors b1. As described above, the chip resistors b1 (chip components) formed in the respective chip component regions Y defined on the substrate b30 are simultaneously separated from each other (the individual chip resistors b1 can be simultaneously provided) by forming the trench b44 in the substrate b30 and then grinding the substrate b30 from the back surface b30B. This reduces the time required for the production of the plurality of chip resistors b1, thereby improving the productivity of the chip resistors b1. Where the substrate b30 has a diameter of 8 inches, for example, about 500,000 chip resistors b1 can be produced from the single substrate b30. If only the dicing saw (not shown) was used to form the trench b44 in the substrate b30 for cutting out the chip resistors b1, it would be necessary to move the dicing saw many times to form a multiplicity of trench lines b44 in the substrate b30. Therefore, a longer period of time would be required for the production of the chip resistors b1. Where the trench b44 is formed at a time by the etching according to the second reference embodiment, in contrast, the aforementioned inconvenience can be eliminated.

Even if the chip resistors b1 each have a smaller chip size, the chip resistors b1 can be simultaneously separated from each other by first forming the trench b44 and then grinding the substrate b30 from the back surface b30B. The elimination of the dicing step reduces the costs and the production time, and improves the yield as compared with the conventional case in which the chip resistors b1 are separated from each other by dicing the substrate b30 by means of the dicing saw.

Further, the trench b44 can be formed accurately by the etching, so that the chip resistors b1 produced by dividing the substrate along the trench b44 are improved in outer dimensional accuracy. Particularly, the trench b44 can be more accurately formed by the plasma etching. More specifically, the dimensional error of the chip resistors b1 produced according to the second reference embodiment can be reduced to about ±5 μm, while the dimensional error of chip resistors b1 produced by a common method in which the dicing saw is used for the formation of the trench b44 is ±20 μm. Further, the pitch of the trench lines b44 can be reduced according to the resist pattern b41 (see FIG. 51), allowing for size reduction of the chip resistors b1 formed between adjacent trench lines b44. In addition, the chipping of corner portions b11 of the chip resistors b1 defined between the side surfaces b2C to b2F (see FIG. 41(*a*)) is less liable to occur, because the etching does not involve the cutting-out of the chip resistors b1 which may otherwise be involved when the dicing saw is used. This improves the appearance of the chip resistors b1.

When the substrate b30 is ground from the back surface b30B, the chip resistors b1 are separated from each other in a time staggered manner. That is, the chip resistors b1 are separated from each other with slight time differences. In this case, a chip resistor b1 separated earlier is liable to laterally vibrate to be brought into contact with adjacent chip resistors b1. At this time, the resin films b24 (first resin films b24A) of the respective chip resistors b1 each function as a bumper. Therefore, even if adjacent ones of the chip resistors b1 supported by the support tape b71 before separation thereof bump against each other, the resin films b24 of the respective chip resistors b1 are first brought into contact with each other. This prevents or suppresses the chipping of corner portions b12 of the front surface b2A and the back surface b2B (particularly, the edge portion b85 of the front surface b2A) of each of the chip resistors b1. Particularly, the first resin film b24A projects outward of the edge portion b85 of the front surface b2A of the chip resistor b1, preventing the edge portion b85 from being brought into contact with the surroundings. This prevents or suppresses the chipping of the edge portion b85.

Figure 52A:
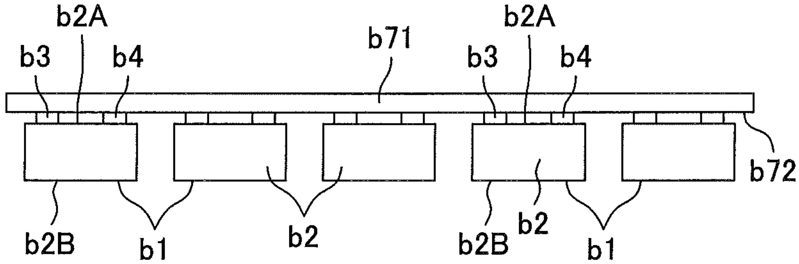
FIG. 52A is a schematic sectional view showing chip resistors after the step of FIG. 50G.
Figure 52B:
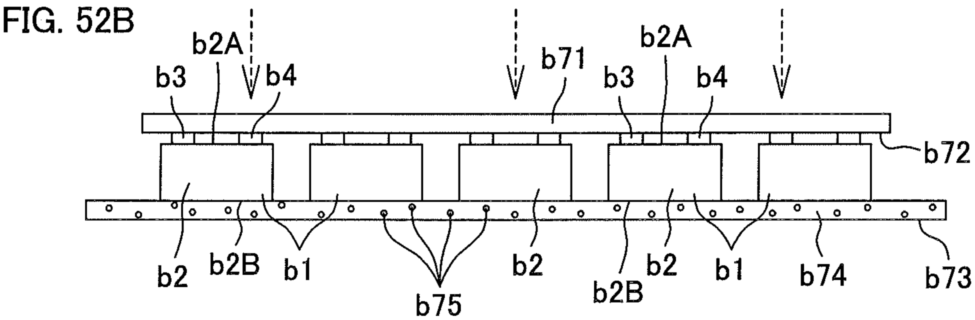
FIG. 52B is a schematic sectional view showing a process step subsequent to that shown in FIG. 52A.

The back surface b2B of the board b2 of the completed chip resistor b1 may be polished or etched to be mirror-finished. FIGS. 52A to 52D are schematic sectional views showing a chip resistor collecting step to be performed after the process step of FIG. 50G. In FIG. 52A, the chip resistors b1 separated from each other still adhere to the support tape b71. In this state, as shown in FIG. 52B, a heat-foamable sheet b73 is bonded to the back surfaces b2B of the boards b2 of the respective chip resistors b1. The heat-foamable sheet b73 includes a sheet body b74 in a sheet form and a multiplicity of foamable particles b75 dispersed in the sheet body b74 by kneading.

Figure 52C:
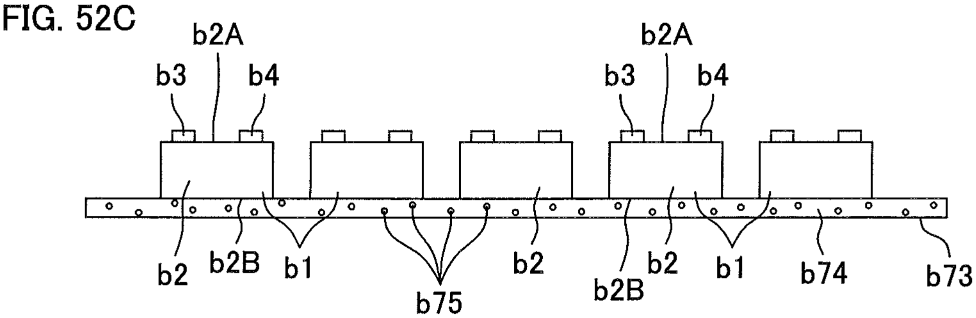
FIG. 52C is a schematic sectional view showing a process step subsequent to that shown in FIG. 52B.

The sheet body b74 has a greater adhesive force than the adhesive surface b72 of the support tape b71. Therefore, the heat-foamable sheet b73 is bonded to the back surfaces b2B of the boards b2 of the respective chip resistors b1, and then the support tape b71 is removed from the chip resistors b1 as shown in FIG. 52C. Thus, the chip resistors b1 are transferred to the heat-foamable sheet b73. At this time, the support tape b71 is irradiated with ultraviolet radiation (as indicated by broken line arrows in FIG. 52B), whereby the adhesive force of the adhesive surface b72 is reduced. This makes it easier to remove the support tape b71 from the chip resistors b1.

Figure 52D:
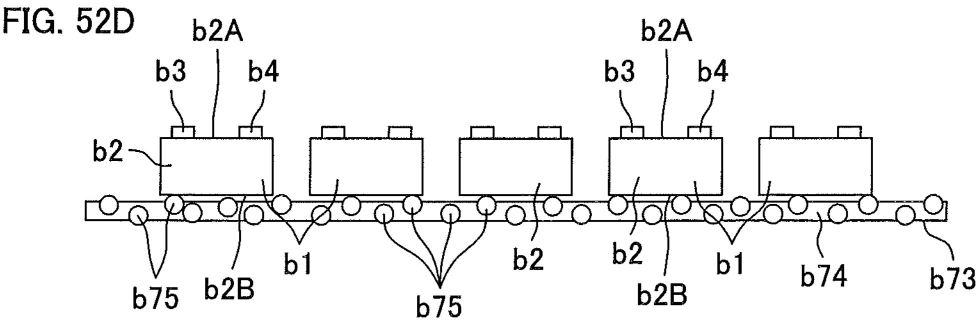
FIG. 52D is a schematic sectional view showing a process step subsequent to that shown in FIG. 52C.

Then, the heat-foamable sheet b73 is heated. Thus, as shown in FIG. 52D, the foamable particles b75 dispersed in the sheet body b74 are foamed in the heat-foamable sheet b73, whereby the foamable particles b75 are bulged from a surface of the sheet body b74. As a result, the heat-foamable sheet b73 contacts the back surfaces b2B of the boards b2 of the respective chip resistors b1 with a smaller contact area, so that all the chip resistors b1 are naturally removed (fall out) from the heat-foamable sheet b73. The chip resistors b1 collected in this manner are each mounted on a mount board b9 (see FIG. 41(*b*)), or respectively accommodated in accommodation spaces formed in an embossed carrier tape (not shown). In this case, the process time can be reduced as compared with a case in which the chip resistors b1 are removed one by one from the support tape b71 or the heat-foamable sheet b73. Of course, a predetermined number of chip resistors b1 out of the chip resistors b1 bonded to the support tape b71 (see FIG. 52A) may be removed at a time directly from the support tape b71 without the use of the heat-foamable sheet b73.

Figure 53A:
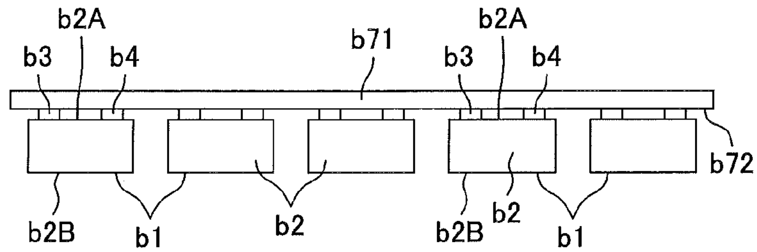
FIG. 53A is a schematic sectional view showing chip resistors after the step of FIG. 50G.
Figure 53B:
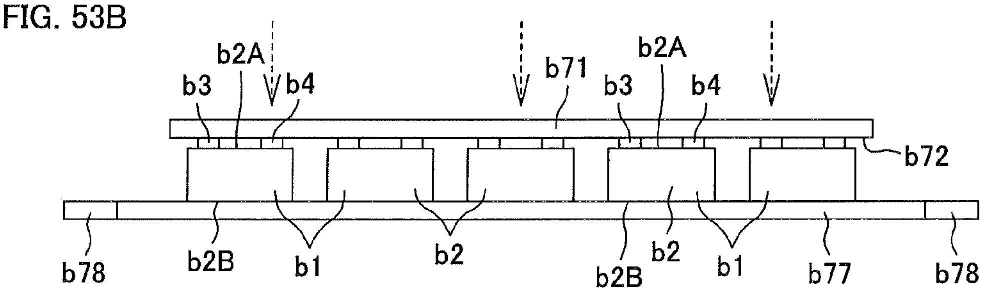
FIG. 53B is a schematic sectional view showing a process step subsequent to that shown in FIG. 53A.
Figure 53C:
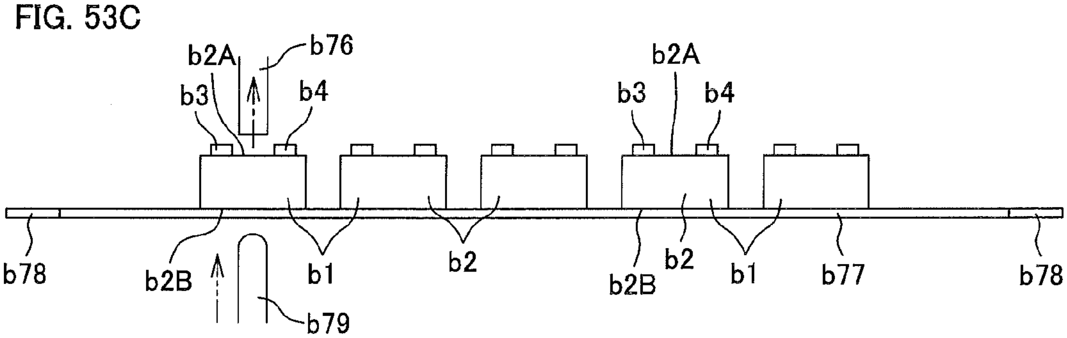
FIG. 53C is a schematic sectional view showing a process step subsequent to that shown in FIG. 53B.

FIGS. 53A to 53C are schematic sectional views showing a modification of the chip resistor collecting step to be performed after the process step of FIG. 50G. The chip resistors b1 may be collected by another method shown in FIGS. 53A to 53C. In FIG. 53A, the chip resistors b1 separated from each other still adhere to the support tape b71 as in FIG. 52A. In this state, as shown in FIG. 53B, a transfer tape b77 is bonded to the back surfaces b2B of the boards b2 of the respective chip resistors b1. The transfer tape b77 has a greater adhesive force than the adhesive surface b72 of the support tape b71. After the transfer tape b77 is bonded to the chip resistors b1, the support tape b71 is removed from the chip resistors b1 as shown in FIG. 53C. At this time, the support tape b71 may be irradiated with ultraviolet radiation (as indicated by broken line arrows in FIG. 53B) for reduction of the adhesiveness of the adhesive surface b72 as described above.

Frames b78 of a collecting device (not shown) are respectively bonded to opposite ends of the transfer tape b77. The frames b78 on the opposite sides are movable toward and away from each other. After the support tape b71 is removed from the chip resistors b1, the opposite-side frames b78 are moved away from each other, whereby the transfer tape b77 is stretched to be thinned. This reduces the adhesive force of the transfer tape b77, making it easier to remove the chip resistors b1 from the transfer tape b77. In this state, a suction nozzle b76 of a transport device (not shown) is moved toward the front surface b2A of one of the chip resistors b11, whereby the chip resistor b1 is removed from the transfer tape b77 by a suction force generated by the transport device (not shown) and sucked by the suction nozzle b76. At this time, the chip resistor b1 may be pushed up toward the suction nozzle b76 from a side opposite from the suction nozzle b76 with the intervention of the transfer tape b77. Thus, the chip resistor b1 can be smoothly removed from the transfer tape b77. The chip resistor b1 collected in this manner is transported by the transport device (not shown) while being sucked by the suction nozzle b76.

Figure 54:
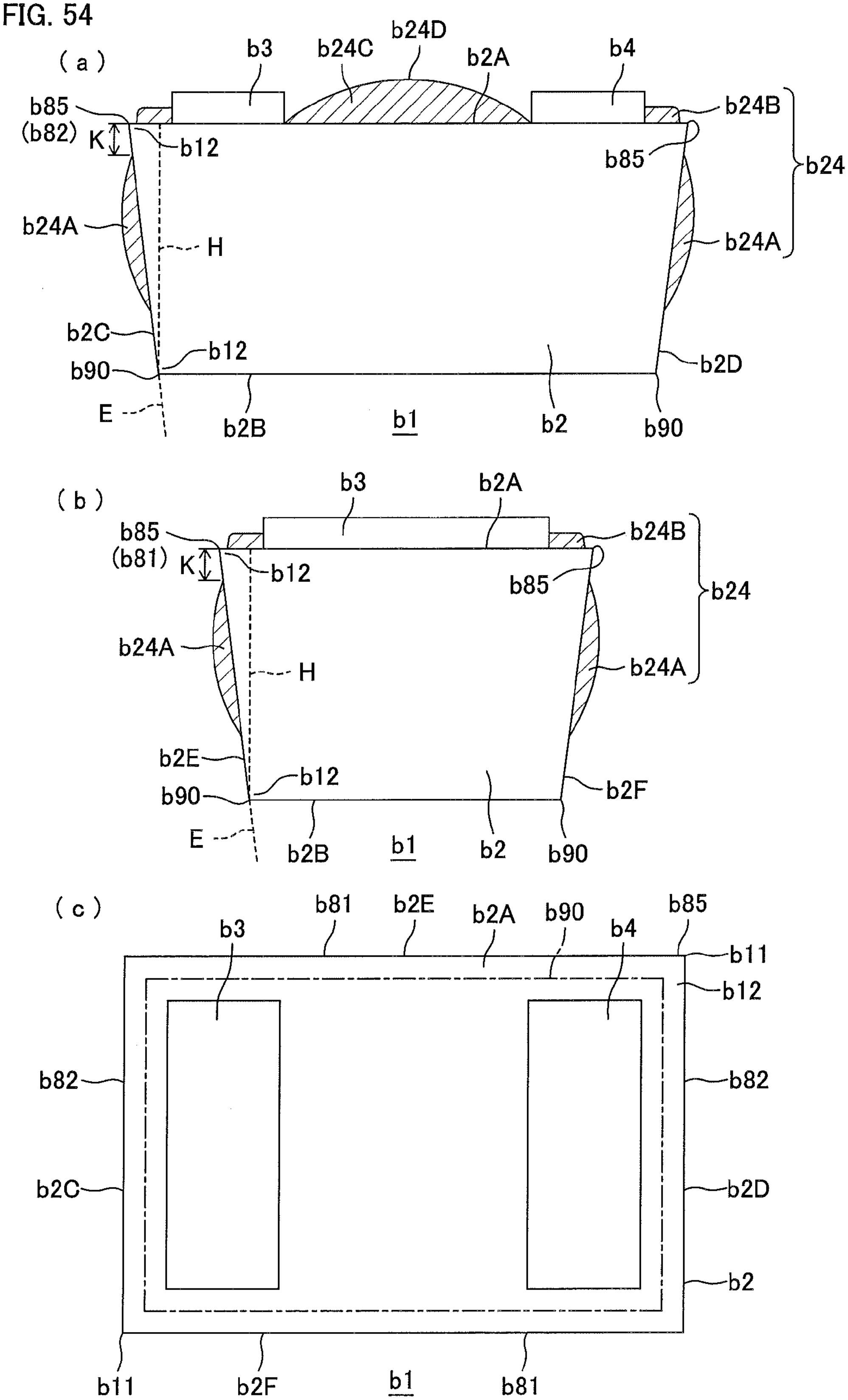
FIG. 54(*a*) is a schematic vertical sectional view taken longitudinally of the chip resistor, and FIG. 54(*b*) is a schematic vertical sectional view taken widthwise of the chip resistor.
Figure 55:
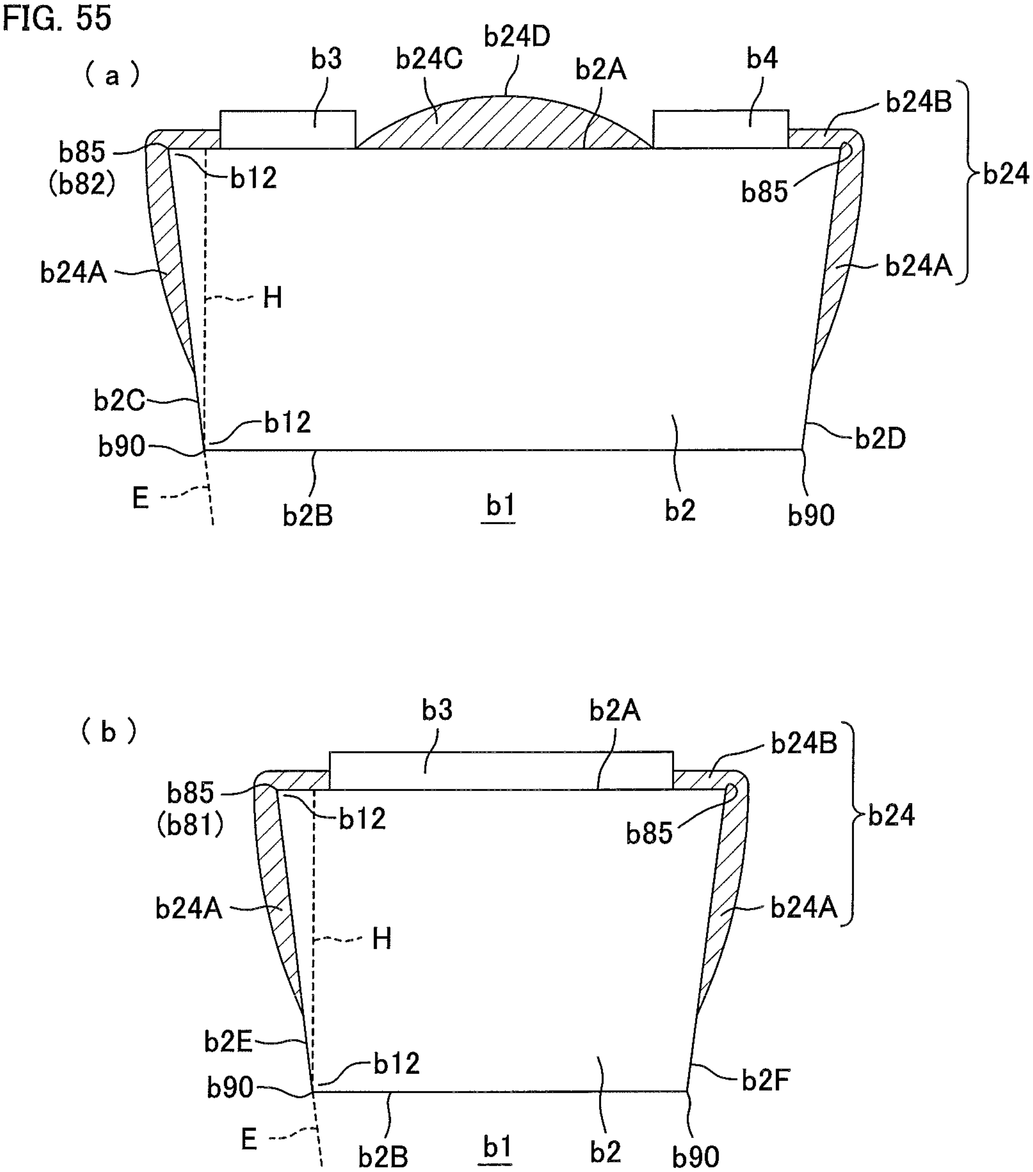
FIG. 55 illustrate a chip resistor according to a first modification of the second reference embodiment, FIG. 55(*a*) being a schematic vertical sectional view taken longitudinally of the chip resistor, FIG. 55(*b*) being a schematic vertical sectional view taken widthwise of the chip resistor.
Figure 56:
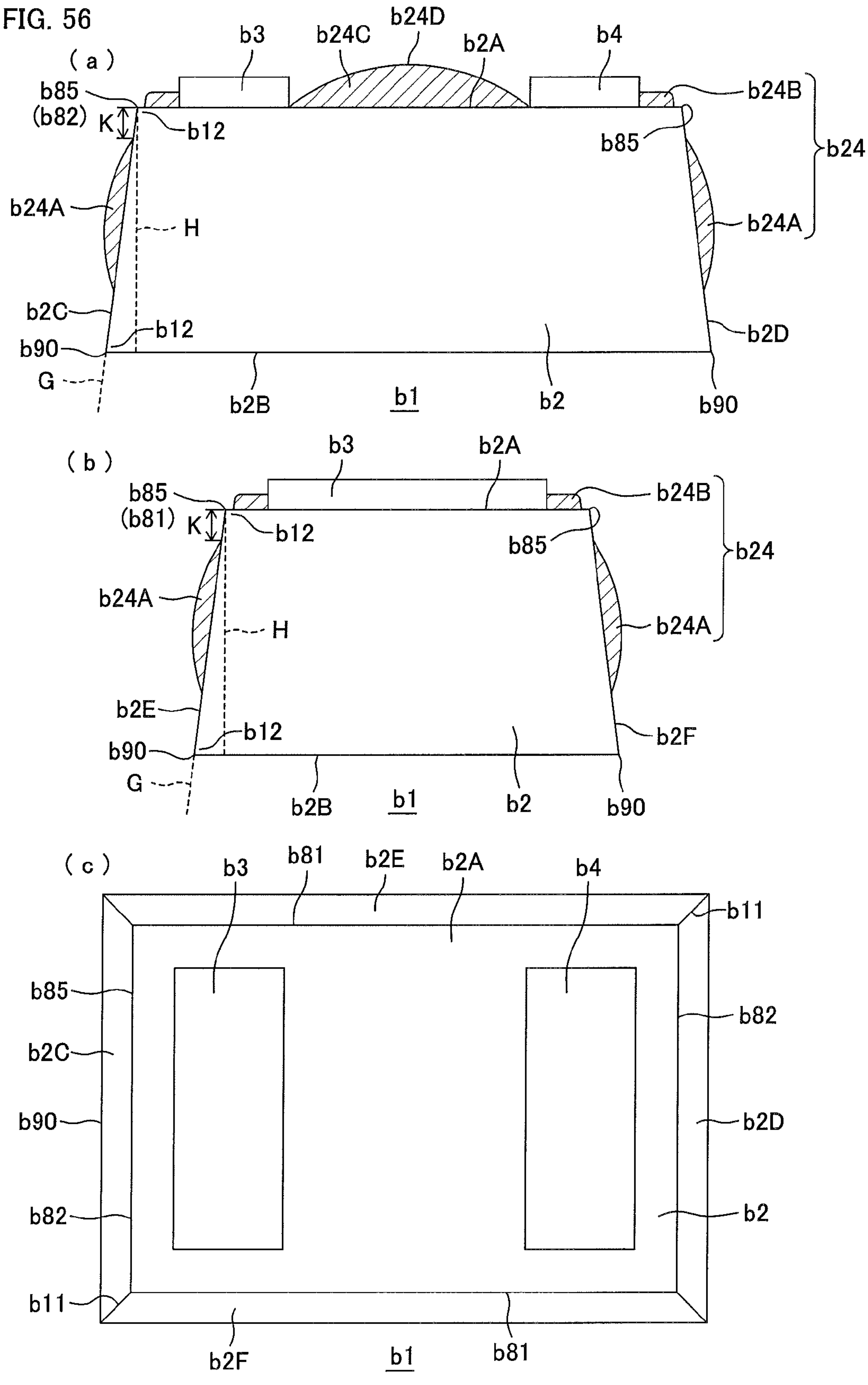
FIG. 56 illustrate a chip resistor according to a second modification of the second reference embodiment, FIG. 56(*a*) being a schematic vertical sectional view taken longitudinally of the chip resistor, FIG. 56(*b*) being a schematic vertical sectional view taken widthwise of the chip resistor, FIG. 56(*c*) being a plan view of the chip resistor.

FIGS. 54 to 59 are vertical sectional views of the chip resistors according to the embodiment described above and modifications of the embodiment, and FIGS. 54 and 56 also show plan views. In FIGS. 54 to 59, the insulative film b23 and some other elements are omitted, but only the board b2, the first connection electrode b3, the second connection electrode b4 and the resin film b24 are shown for convenience of description. In FIGS. 54(*c*) and 56(*c*), the resin film b24 is not shown.

As shown in FIGS. 54 to 59, the side surfaces b2C to b2F of the board b2 each have a portion tilted with respect to the plane H perpendicular to the front surface b2A of the board b2. In each of the chip resistors b1 shown in FIGS. 54 and 55, the side surfaces b2C to b2F of the board b2 each extend along a plane E tilted with respect to the plane H described above. Further, the side surfaces b2C to b2F of the board b2 each form an acute angle with respect to the front surface b2A of the board b2. Therefore, the edge portion b90 of the back surface b2B of the board b2 is retracted with respect to the edge portion b85 of the front surface b2A of the board b2 inward of the board b2. More specifically, the rectangular edge portion b90 defining the contour of the back surface b2B is located inward of the rectangular edge portion b85 defining the contour of the front surface b2A as seen in plan (see FIG. 54(*c*)). Therefore, the planes E for the side surfaces b2C to b2F are tilted as extending from the edge portion b85 of the front surface b2A toward the edge portion b90 of the back surface b2B inward of the board b2. Thus, the side surfaces b2C to b2F of the chip resistor b1 each have a trapezoidal shape (generally isosceles trapezoidal shape) tapered toward the back surface b2B.

As described above, the first resin film b24A of the resin film b24 is provided on the portions of the side surfaces b2C to b2F located apart from the boundaries between the front surface b2A and the respective side surfaces (the edge portion b85) toward the back surface b2B, and the second resin film b24B is provided on the front surface b2A. Alternatively, as shown in FIG. 55, the first resin film b24A provided on the side surfaces b2C to b2F may be inseparable from the second resin film b24B along the boundaries between the front surface b2A and the respective side surfaces (the edge portion b85). In this case, the resin film b24 extends continuously from the side surfaces b2C to b2F to the front surface b2A.

In the chip resistor b1 shown in FIG. 56, the side surfaces b2C to b2F each extend along a plane G tilted with respect to the aforementioned plane H. The side surfaces b2C to b2F of the board b2 each form an obtuse angle with respect to the front surface b2A of the board b2. Therefore, the edge portion b90 of the back surface b2B of the board b2 projects with respect to the edge portion b85 of the front surface b2A of the board b2 outward of the board b2. More specifically, the rectangular edge portion b90 defining the contour of the back surface b2B is located outward of the rectangular edge portion b85 defining the contour of the front surface b2A as seen in plan (see FIG. 56(*c*)). Therefore, the planes G for the side surfaces b2C to b2F are tilted as extending from the edge portion b85 of the front surface b2A toward the edge portion b90 of the back surface b2B outward of the board b2. Thus, the side surfaces b2C to b2F of the chip resistor b1 each have a trapezoidal shape (generally isosceles trapezoidal shape) tapered toward the front surface b2A.

Figure 57:
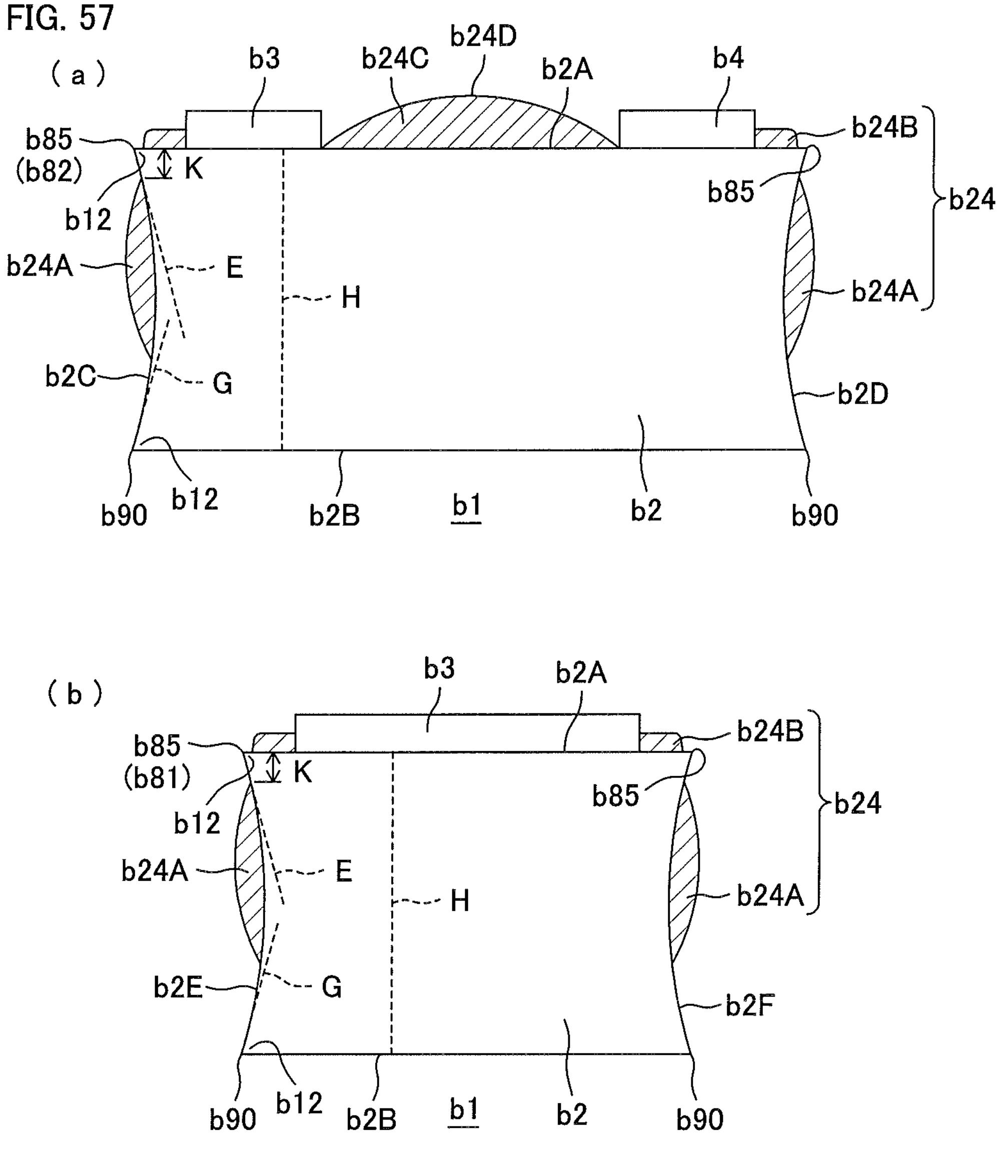
FIG. 57 illustrate a chip resistor according to a third modification of the second reference embodiment, FIG. 57(*a*) being a schematic vertical sectional view taken longitudinally of the chip resistor, FIG. 57(*b*) being a schematic vertical sectional view taken widthwise of the chip resistor.
Figure 58:
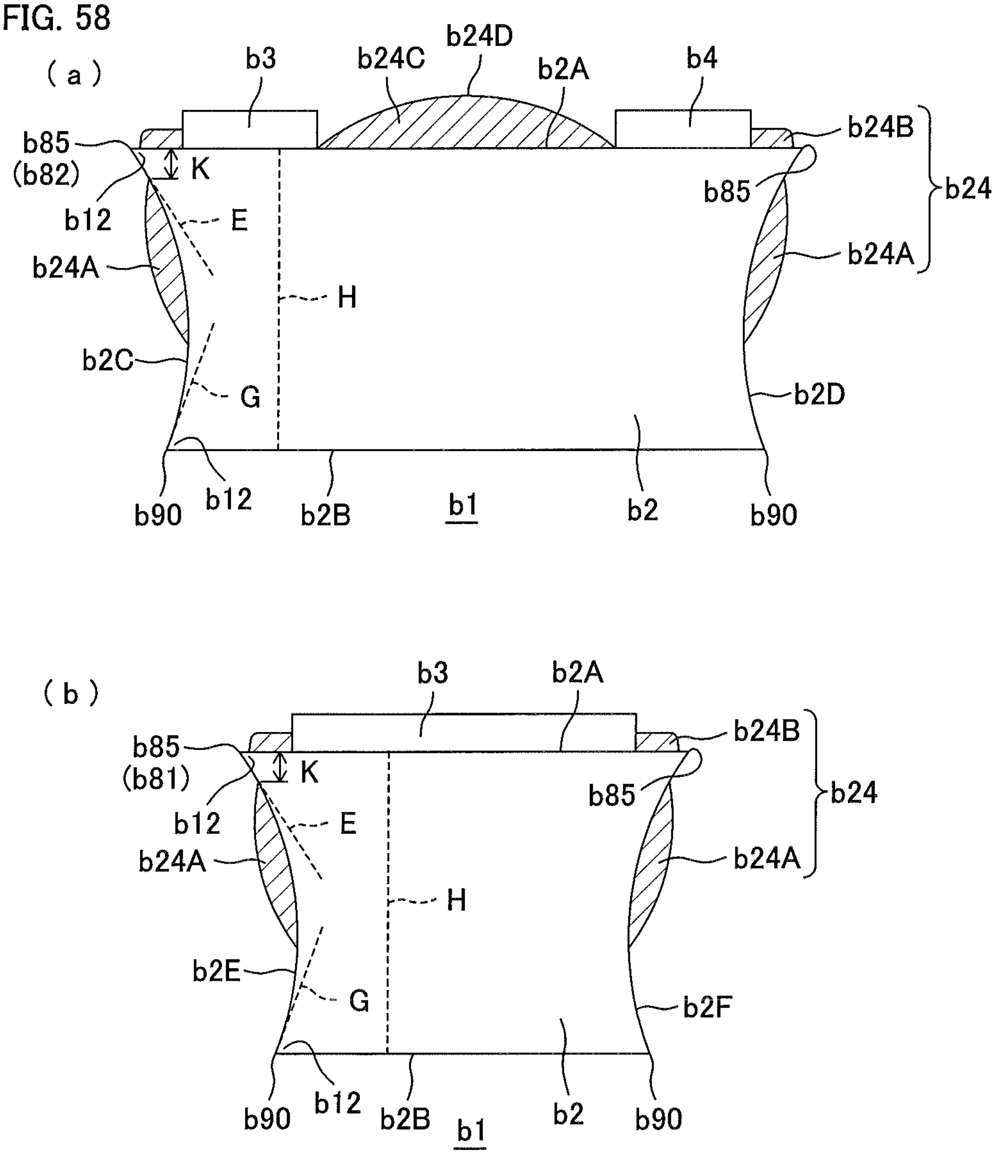
FIG. 58 illustrate a chip resistor according to a fourth modification of the second reference embodiment, FIG. 58(*a*) being a schematic vertical sectional view taken longitudinally of the chip resistor, FIG. 58(*b*) being a schematic vertical sectional view taken widthwise of the chip resistor.
Figure 59:
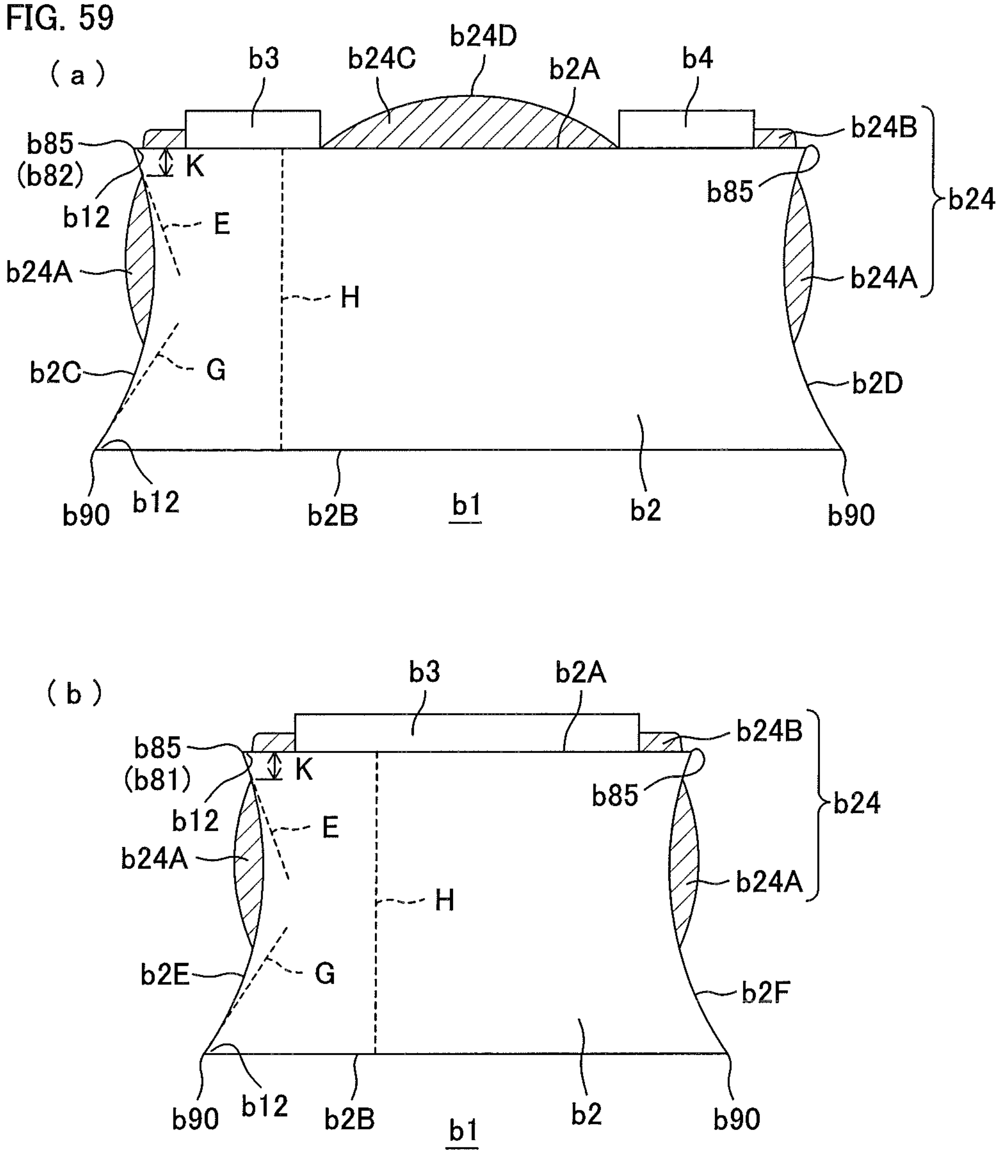
FIG. 59 illustrate a chip resistor according to a fifth modification of the second reference embodiment, FIG. 59(*a*) being a schematic vertical sectional view taken longitudinally of the chip resistor, FIG. 59(*b*) being a schematic vertical sectional view taken widthwise of the chip resistor.

The side surfaces b2C to b2F are not necessarily each required to be a flat surface tilted with respect to the plane H as described above, but may each be a surface, as shown in FIGS. 57 to 59, which is curved concavely inward of the board b2 and has portions tilted with respect to the plane H (curved surface portions tangent to the planes E and G). In this case, the side surfaces b2C to b2F of the board b2 each form an acute angle with respect to the front surface b2A of the board b2, and each form an acute angle with respect to the back surface b2B of the board b2.

In FIG. 57, the edge portion b90 of the back surface b2B of the board b2 is not offset from the edge portion b85 of the front surface b2A of the board b2 either inward or outward of the board b2, but coincides with the edge portion b85 of the front surface b2A of the board b2 as seen in plan. In FIG. 58, the edge portion b90 of the back surface b2B of the board b2 is retracted with respect to the edge portion b85 of the front surface b2A of the board b2 inward of the board b2. In FIG. 59, the edge portion b90 of the back surface b2B of the board b2 projects with respect to the edge portion b85 of the front surface b2A of the board b2 outward of the board b2.

The side surfaces b2C to b2F shown in any of FIGS. 54 to 59 can be formed by properly controlling the etching conditions for the formation of the trench b44. That is, the shapes of the side surfaces b2C to b2F of the board b2 can be controlled by etching techniques. As described above, either one of the edge portion b85 of the front surface b2A and the edge portion b90 of the back surface b2B of the board b2 of the chip resistor b1 projects with respect to the other edge portion outward of the board b2 (the chip resistor b1 shown in FIG. 57 is an exception). Therefore, none of the corner portions b12 of the front surface b2A and the back surface b2B of the chip resistor b1 is right-angled, so that the corner portions b12 (particularly, obtuse corner portions b12) are less susceptible to the chipping.

Particularly, the back surface b2B of the board b2 of the chip resistor b1 shown in either of FIGS. 54 and 55 has obtuse corner portions b12 (in the edge portion b90), so that these corner portions b12 are less susceptible to the chipping. Further, the front surface b2A of the board b2 of the chip resistor b1 shown in FIG. 56 has obtuse corner portions b12 (in the edge portion b85), so that these corner portions b12 are less susceptible to the chipping.

When the chip resistor b1 is mounted on a mount board b9 (see FIG. 41(*b*)), a suction nozzle (not shown) of an automatic mounting machine sucks the back surface b2B of the chip resistor b1, and is moved to the mount board b9. Thus, the chip resistor b1 is mounted on the mount board b9. Prior to the suction of the chip resistor b1 by the suction nozzle (not shown), the contour of the chip resistor b1 is detected from the side of the front surface b2A or the back surface b2B through image recognition, and a portion of the back surface b2B of the chip resistor b1 to be sucked by the suction nozzle (not shown) is determined. Where either one of the edge portion b85 of the front surface b2A and the edge portion b90 of the back surface b2B of the board b2 projects with respect to the other edge portion outward of the board b2, the contour of the chip component detected from the side of the front surface b2A or the back surface b2B of the board b2 through the image recognition is clearly defined by the one edge portion b85 or b90 (the edge portion projecting outward of the board b2). Therefore, the contour of the chip resistor b1 can be accurately detected, so that the intended portion (e.g., a center portion) of the back surface b2B of the chip resistor b1 can be accurately sucked by the suction nozzle (not shown). Thus, the chip resistor b1 can be accurately mounted on the mount board b9 (see FIG. 41(*b*)). That is, the mount positioning accuracy can be improved.

In the chip resistor b1 shown in any of FIGS. 54 and 56 to 59, particularly, the first resin film b24A is provided on the regions of the side surfaces b2C to b2F each spaced the distance K from the front surface b2A so that the edge portion b85 of the board b2 is exposed. In the chip resistor b1 shown in any of FIGS. 54 and 57 to 59, the side surfaces b2C to b2F of the board b2 each form an acute angle with respect to the front surface b2A of the board b2. Therefore, the edge portion b85 of the front surface b2A of the board b2 is distinctive, so that the contour of the chip resistor b1 (the edge portion b85) can be further clearly detected. Thus, the chip resistor b1 can be more accurately mounted on the mount board b9. That is, the contour of the chip resistor b1 can be easily detected based on the edge portion b85. Thus, the suction nozzle (not shown) can accurately suck an intended portion of the chip resistor b1. Where a focus is placed on the edge portion b85 or the edge portion b90 for the image recognition, the first resin film b24A is out of focus and hence is obscure. Thus, the edge portion b85 or the edge portion b90 can be distinguished from the first resin film b24A.

Where the prevention of the chipping of the corner portions b12 precedes the improvement of the mount positioning accuracy, on the other hand, the corner portions b12 of the board b2 (here, the corner portions b12 of the front surface b2A) may be covered with the resin film b24 as shown in FIG. 55. In this case, the chipping of the corner portions b12 can be reliably prevented or suppressed. Further, the front surface b2A of the board b2 is protected with the second resin film b24B. Particularly, the surface b24D of the second resin film b24B (the middle portion b24C) is located at a higher height level than the first connection electrode b3 and the second connection electrode b4 (not shown in FIGS. 54(*b*), 55(*b*), 56(*b*), 57(*b*), 58(*b*) and 59(*b*)). Even if an impact is applied to the front surface b2A of the board b2 from the mount board b9 when the chip resistor b1 is mounted on the mount board b9 as shown in FIG. 41(*b*), the second resin film b24B (the middle portion b24C) first receives the impact. Thus, the second resin film b24B can reduce the impact, making it possible to reliably protect the front surface b2A of the board b2.

While the examples of the second reference embodiment have thus been described, the second reference embodiment may be embodied in other forms. In the examples described above, the chip resistor b1 is disclosed as an exemplary chip component according to the second reference embodiment. The second reference embodiment is applicable to a chip capacitor, a chip inductor, a chip diode and other chip components. The chip capacitor will hereinafter be described.

Figure 60:
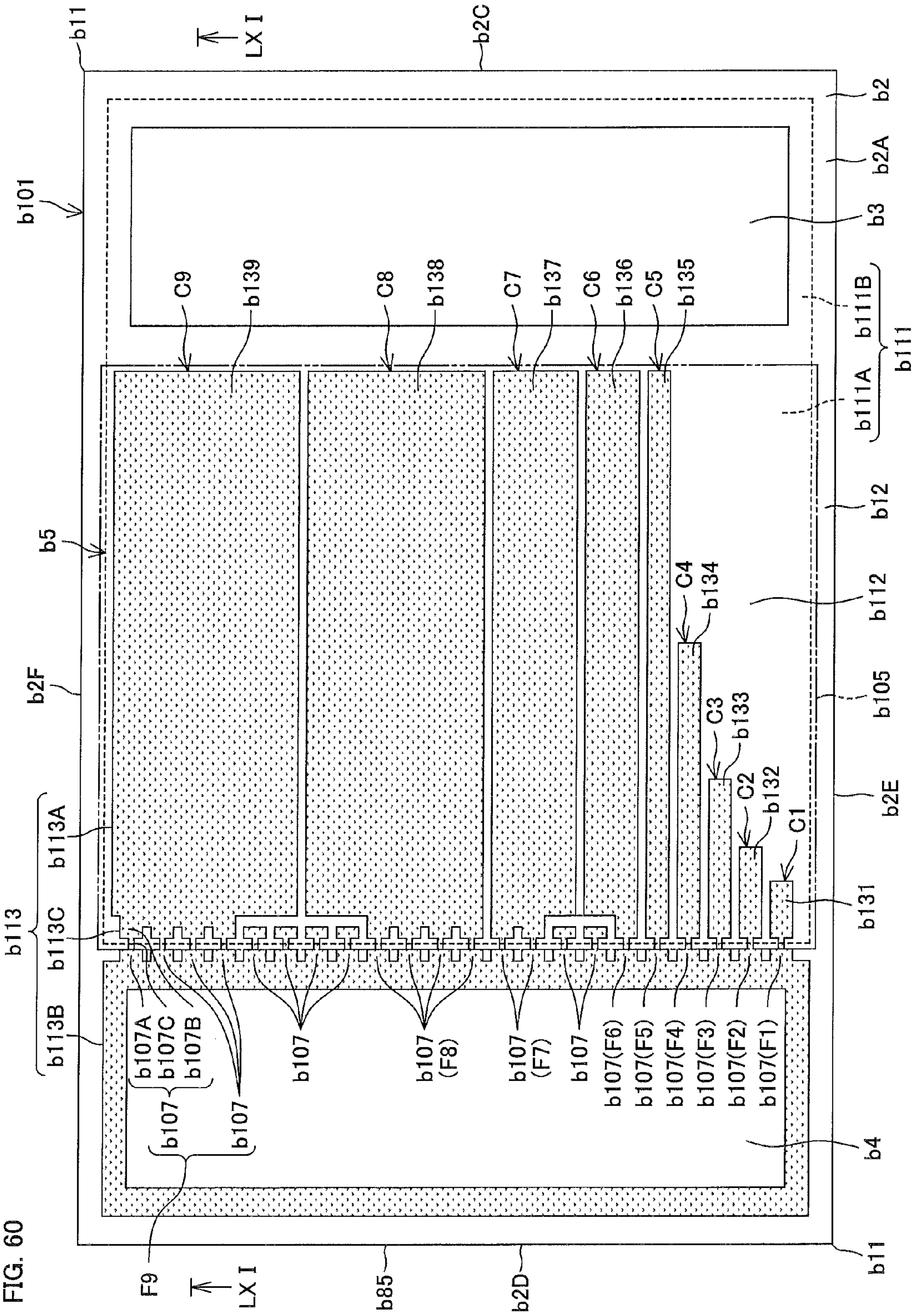
FIG. 60 is a plan view of a chip capacitor according to another example of the second reference embodiment.
Figure 61:
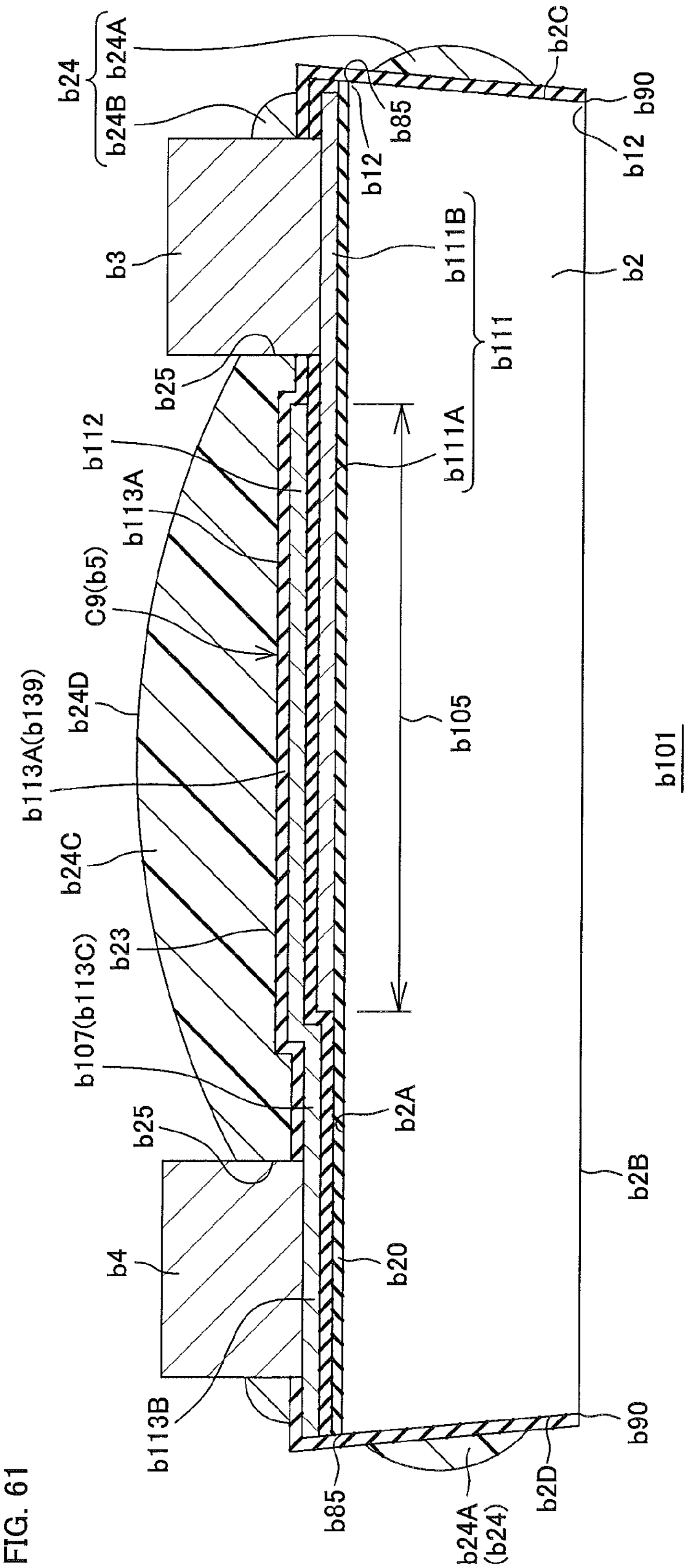
Figure 62:
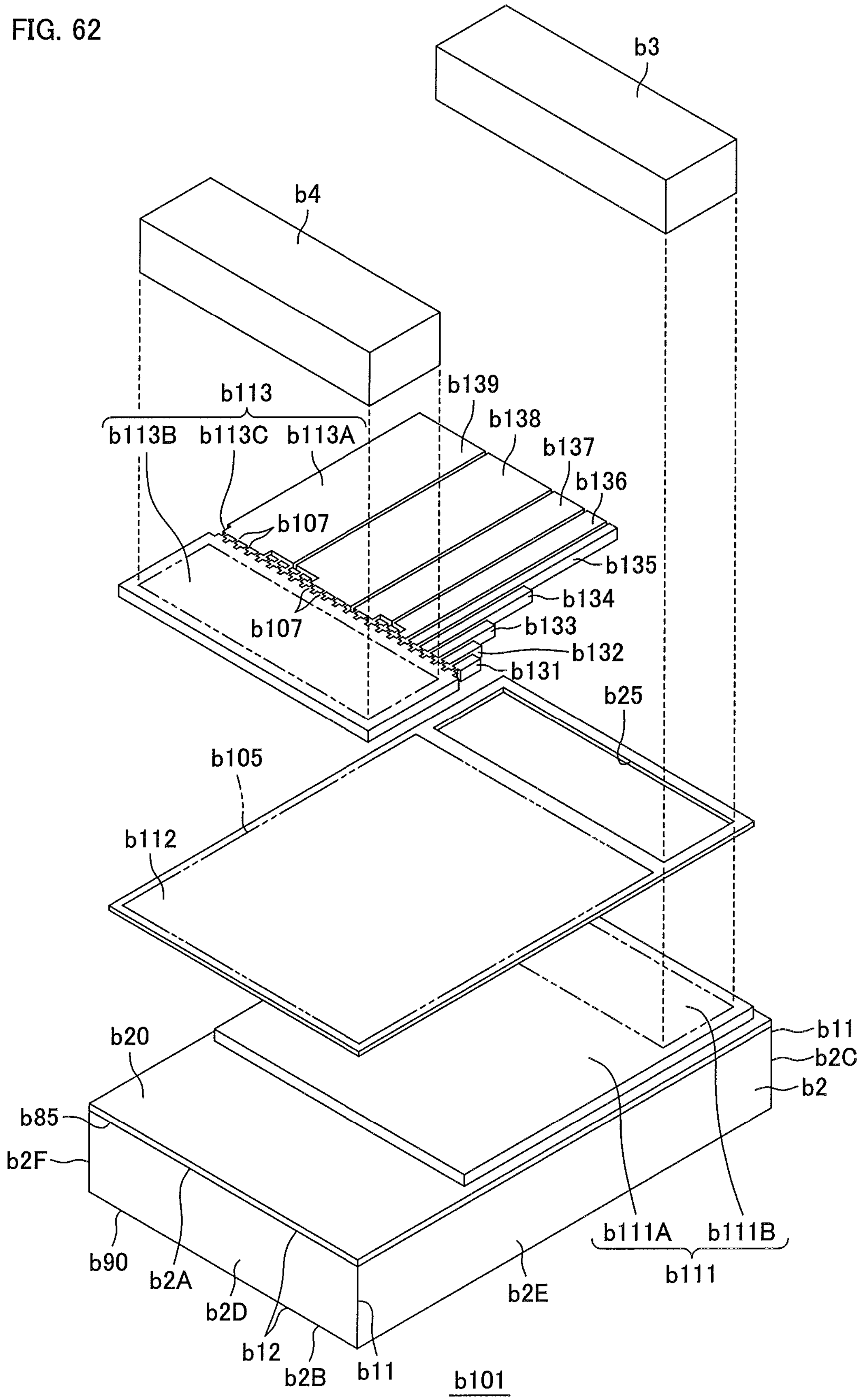
FIG. 62 is an exploded perspective view illustrating the chip capacitor with parts thereof separated.

FIG. 60 is a plan view of a chip capacitor according to another example of the second reference embodiment. FIG. 61 is a sectional view taken along a sectional line LXI-LXI in FIG. 60. FIG. 62 is an exploded perspective view illustrating the chip capacitor with parts thereof separated. Components of the chip capacitor b101 corresponding to those of the chip resistor b1 will be designated by the same reference characters, and will not be described in detail. In the chip capacitor b101, components designated by the same reference characters as in the chip resistor b1 have the same construction as in the chip resistor b1 and the same effects as in the chip resistor b1, unless otherwise specified.

Referring to FIG. 60, the chip capacitor b101, like the chip resistor b1, includes a board b2, a first connection electrode b3 provided on the board b2 (on a front surface b2A of the board b2), and a second connection electrode b4 also provided on the board b2. In this example, the board b2 has a rectangular shape as seen in plan. The first connection electrode b3 and the second connection electrode b4 are respectively disposed on longitudinally opposite end portions of the board b2. In this example, the first connection electrode b3 and the second connection electrode b4 each have a generally rectangular plan shape elongated widthwise of the board b2. A plurality of capacitor elements C1 to C9 are provided in a capacitor provision region b105 between the first connection electrode b3 and the second connection electrode b4 on the front surface b2A of the board b2. The capacitor elements C1 to C9 are device elements constituting a device b5 (capacitor portion), and are electrically connected to the second connection electrode b4 via a plurality of fuse units b107 (corresponding to the fuses F described above).

As shown in FIGS. 61 and 62, an insulative layer b20 is provided on the front surface b2A of the board b2, and a lower electrode film bill is provided on a surface of the insulative layer b20. The lower electrode film bill extends over substantially the entire capacitor provision region b105. Further, the lower electrode film bill extends to under the first connection electrode b3. More specifically, the lower electrode film bill has a capacitor electrode region b111A functioning as a common lower electrode for the capacitor elements C1 to C9 in the capacitor provision region b105, and a pad region b111B disposed under the first connection electrode b3 for external electrode connection. The capacitor electrode region b111A is located in the capacitor provision region b105, while the pad region b111B is located under the first connection electrode b3 in contact with the first connection electrode b3.

A capacitive film (dielectric film) b112 is provided over the lower electrode film bill (the capacitor electrode region b111A) in contact with the lower electrode film bill in the capacitor provision region b105. The capacitive film b112 extends over the entire capacitor electrode region b111A (the capacitor provision region b105). In this example, the capacitive film b112 also covers a part of the insulative layer b20 outside the capacitor provision region b105.

An upper electrode film b113 is provided on the capacitive film b112. In FIG. 60, the upper electrode film b113 is hatched for clarification. The upper electrode film b113 has a capacitor electrode region b113A located in the capacitor provision region b105, a pad region b113B located under the second connection electrode b4 in contact with the second connection electrode b4, and a fuse region b113C located between the capacitor electrode region b113A and the pad region b113B.

The capacitor electrode region b113A of the upper electrode film b113 is divided (split) into a plurality of electrode film portions (upper electrode film portions) b131 to b139. In this example, the electrode film portions b131 to b139 each have a rectangular shape, and extend linearly from the fuse region b113C toward the first connection electrode b3. The electrode film portions b131 to b139 are opposed to the lower electrode film bill with a plurality of facing areas with the intervention of the capacitive film b112 (in contact with the capacitive film b112). More specifically, the facing areas of the respective electrode film portions b131 to b139 with respect to the lower electrode film bill may be defined to have a ratio of 1:2:4:8:16:32:64:128:128. That is, the electrode film portions b131 to b139 include a plurality of electrode film portions having different facing areas, more specifically, a plurality of electrode film portions b131 to b138 (or b131 to b137 and b139) respectively having facing areas which are defined by a geometric progression with a geometric ratio of 2. Thus, the capacitor elements C1 to C9 respectively defined by the electrode film portions b131 to b139 and the lower electrode film bill opposed to the electrode film portions b131 to b139 with the intervention of the capacitive film b112 include a plurality of capacitor elements having different capacitance values. Where the facing areas of the electrode film portions b131 to b139 have the aforementioned ratio, the ratio of the capacitance values of the capacitor elements C1 to C9 is 1:2:4:8:16:32:64:128:128, which is equal to the ratio of the facing areas. That is, the capacitor elements C1 to C9 include a plurality of capacitor elements C1 to C8 (or C1 to C7 and C9) which respectively have capacitance values defined by the geometric progression with a geometric ratio of 2.

In this example, the electrode film portions b131 to b135 each have a strip shape of the same width, and respectively have lengths defined to have a ratio of 1:2:4:8:16. The electrode film portions b135, b136, b137, b138, b139 each have a strip shape of the same length, and respectively have widths defined to have a ratio of 1:2:4:8:8. The electrode film portions b135 to b139 extend from an edge of the second connection electrode b4 to an edge of the first connection electrode b3 in the capacitor provision region b105, and the electrode film portions b131 to b134 are shorter than the electrode film portions b135 to b139.

The pad region b113B is generally analogous to the second connection electrode b4, and has a generally rectangular plan shape. As shown in FIG. 61, the pad region b113B of the upper electrode film b113 contacts the second connection electrode b4. The fuse region b113C is located alongside a longer edge (an inner longer edge with respect to a periphery of the board b2) of the pad region b113B. The fuse region b113C includes the plurality of fuse units b107, which are arranged alongside the longer edge of the pad region b113B.

The fuse units b107 are formed of the same material as the pad region b113B of the upper electrode film b113 unitarily with the pad region b113B. The electrode film portions b131 to b139 are each formed integrally with one or more of the fuse units b107, and connected to the pad region b113B via these fuse units b107 to be thereby electrically connected to the second connection electrode b4 via the pad region b113B. As shown in FIG. 60, the electrode film portions b131 to b136 each having a relatively small area are each connected to the pad region b113B via a single fuse unit b107, and the electrode film portions b137 to b139 each having a relatively great area are each connected to the pad region b113B via a plurality of fuse units b107. It is not necessary to use all the fuse units b107, and some of the fuse units b107 are unused in this example.

The fuse units b107 each include a first wider portion b107A for connection to the pad region b113B, a second wider portion b107B for connection to the electrode film portions b131 to b139, and a narrower portion b107C connecting the first and second wider portions b107A, b107B to each other. The narrower portion b107C is configured to be disconnected (fused off) by a laser beam. With this arrangement, unnecessary ones of the electrode film portions b131 to b139 are electrically isolated from the first and second connection electrodes b3, b4 by disconnecting corresponding ones of the fuse units b107.

As shown in FIG. 61 but not shown in FIGS. 60 and 62, a front surface of the chip capacitor b101 including a surface of the upper electrode film b113 is covered with an insulative film b23. The insulative film b23 is formed of, for example, a nitride film, and extends to side surfaces b2C to b2F of the board b2 to cover not only the upper surface of the chip capacitor b101 but also the entire side surfaces b2C to b2F. Further, a resin film b24 is provided on the insulative film b23. The resin film b24 includes a first resin film b24A covering portions of the side surfaces b2C to b2F adjacent to the front surface b2A, and a second resin film b24B covering the front surface b2A. The resin film b24 is discontinuous on an edge portion b85 of the front surface b2A, so that the edge portion b85 is exposed from the resin film b24.

The insulative film b23 and the resin film b24 each serve as a protective film for protecting the front surface of the chip capacitor b101, and each have openings b25 in association with the first connection electrode b3 and the second connection electrode b4. The openings b25 extend through the insulative film b23 and the resin film b24 to expose a part of the pad region b111B of the lower electrode film bill and a part of the pad region b113B of the upper electrode film b113. In this example, the opening b25 associated with the first connection electrode b3 also extends through the capacitive film b112.

The first connection electrode b3 and the second connection electrode b4 are respectively provided in the openings b25. Thus, the first connection electrode b3 is connected to the pad region b111B of the lower electrode film bill, while the second connection electrode b4 is connected to the pad region b113B of the upper electrode film b113. The first and second connection electrodes b3, b4 project from a surface of the resin film b24. Thus, the chip capacitor b101 can be connected to a mount board through flip chip connection.

Figure 63:
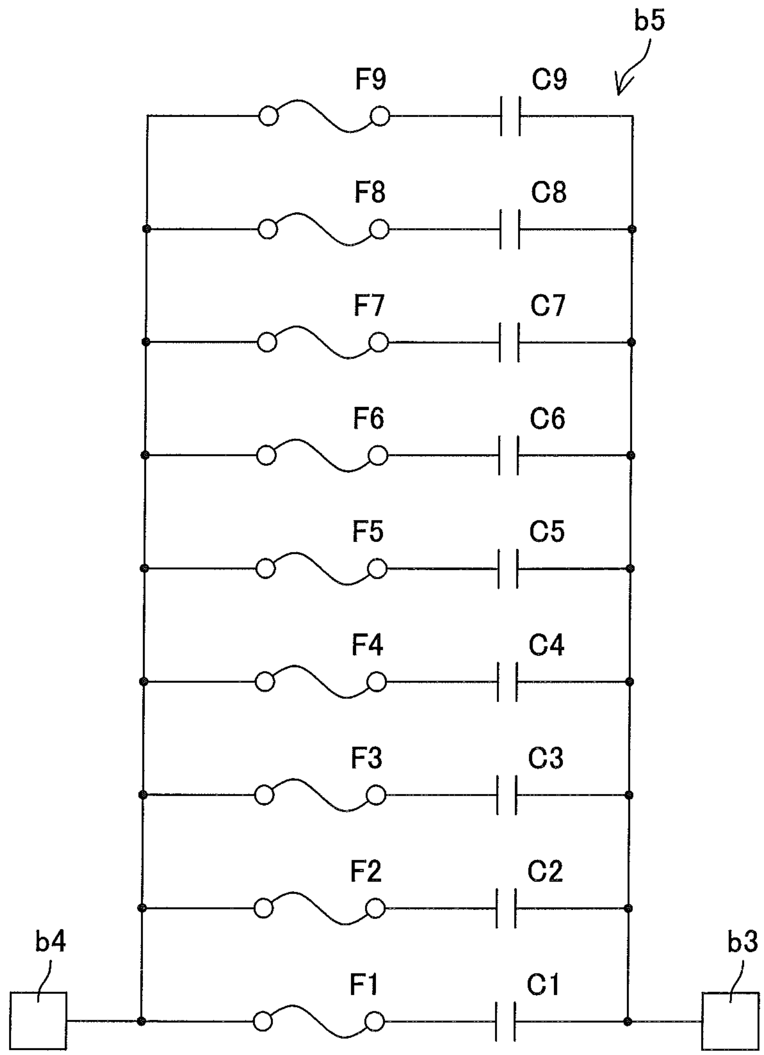
FIG. 63 is a circuit diagram showing the internal electrical configuration of the chip capacitor.

FIG. 63 is a circuit diagram showing the internal electrical configuration of the chip capacitor b101. The plurality of capacitor elements C1 to C9 are connected in parallel between the first connection electrode b3 and the second connection electrode b4. Fuses F1 to F9 each including one or more fuse units b107 are respectively connected in series between the second connection electrode b4 and the capacitor elements C1 to C9.

Where all the fuses F1 to F9 are connected, the overall capacitance value of the chip capacitor b101 is equal to the sum of the capacitance values of the respective capacitor elements C1 to C9. Where one or two or more fuses selected from the fuses F1 to F9 are disconnected, the capacitor elements associated with the disconnected fuses are isolated, so that the overall capacitance value of the chip capacitor b101 is reduced by the sum of the capacitance values of the isolated capacitor elements.

Therefore, the overall capacitance value of the chip capacitor can be adjusted to a desired capacitance value (through laser trimming) by measuring a capacitance value between the pad regions b111B and b113B (the total capacitance value of the capacitor elements C1 to C9) and then fusing off one or more fuses properly selected from the fuses F1 to F9 according to the desired capacitance value by the laser beam. Particularly, where the capacitance values of the capacitor elements C1 to C8 are defined by the geometric progression with a geometric ratio of 2, the overall capacitance value of the chip capacitor b101 can be finely adjusted to the desired capacitance value with an accuracy equivalent to the capacitance value of the smallest capacitance capacitor element C1 (the value of the first term of the geometric progression).

For example, the capacitance values of the capacitor elements C1 to C9 may be as follows: C1=0.03125 pF; C2=0.0625 pF; C3=0.125 pF; C4=0.25 pF; C5=0.5 pF; C6=1 pF; C7=2 pF; C8=4 pF; and C9=4 pF. In this case, the capacitance of the chip capacitor b101 can be finely adjusted with a minimum adjustable accuracy of 0.03125 pF. By properly selecting the to-be-disconnected fuses from the fuses F1 to F9, the chip capacitor b101 can be provided as having a desired capacitance value ranging from 10 pF to 18 pF.

In this example, as described above, the plurality of capacitor elements C1 to C9 which can be isolated by disconnecting the associated fuses F1 to F9 are provided between the first connection electrode b3 and the second connection electrode b4. The capacitor elements C1 to C9 include a plurality of capacitor elements having different capacitance values, more specifically, a plurality of capacitor elements having capacitance values defined by the geometric progression. Therefore, the chip capacitor b101 can be adapted for the plural capacitance values without changing the design, and customized based on the same design concept so as to have a desired capacitance value which is accurately controlled by selectively fusing off one or more of the fuses F1 to F9.

The respective components of the chip capacitor b101 will hereinafter be described in detail. Referring to FIG. 60, the board b2 may have a rectangular plan shape, for example, having a size of 0.3 mm×0.15 mm or 0.4 mm×0.2 mm (preferably, a size of not greater than 0.4 mm×0.2 mm). The capacitor provision region b105 is generally a square region which has an edge having a length equivalent to the length of the shorter edge of the board b2. The board b2 may have a thickness of about 150 μm. Referring to FIG. 61, the board b2 may be a board obtained by grinding or polishing a substrate from a back side (not formed with the capacitor elements C1 to C9) for thinning the substrate. A semiconductor substrate typified by a silicon substrate, a glass substrate or a resin film may be used as a material for the board b2.

The insulative layer b20 may be an oxide film such as a silicon oxide film, and may have a thickness of about 500 Å to about 2000 Å. The lower electrode film bill is preferably an electrically conductive film, particularly preferably a metal film, and may be an aluminum film. The lower electrode film bill of the aluminum film may be formed by a sputtering method. Similarly, the upper electrode film b113 is preferably an electrically conductive film, particularly preferably a metal film, and may be an aluminum film. The upper electrode film b113 of the aluminum film may be formed by a sputtering method. Further, a photolithography and etching process may be employed for patterning to divide the capacitor electrode region b113A of the upper electrode film b113 into the electrode film portions b131 to b139 and to shape the fuse region b113C into the plurality of fuse units b107.

The capacitive film b112 may be formed of, for example, a silicon nitride film, and have a thickness of 500 Å to 2000 Å (e.g., 1000 Å). The silicon nitride film for the capacitive film b112 may be formed by plasma CVD (chemical vapor deposition). The insulative film b23 may be formed of, for example, a silicon nitride film, for example, by a plasma CVD method. The insulative film b23 may have a thickness of about 8000 Å. The resin film b24 may be formed of a polyimide film or other resin film as described above.

The first and second connection electrodes b3, b4 may each be formed of a multilayer film including a nickel layer provided in contact with the lower electrode film bill or the upper electrode film b113, a palladium layer provided on the nickel layer and a gold layer provided on the palladium layer, which may each be formed by a plating method (more specifically, an electroless plating method). The nickel layer improves the adhesiveness to the lower electrode film bill or the upper electrode film b113, and the palladium layer functions as a diffusion preventing layer which suppresses mutual diffusion of the material of the upper and lower electrode films and gold of the uppermost layers of the first and second connection electrodes b3, b4.

For production of the chip capacitor b101, the same production process as for the chip resistor b1 may be employed after formation of the device b5. For the formation of the device b5 (capacitor portion) for the chip capacitor b101, an insulative layer b20 of an oxide film (e.g., a silicon oxide film) is first formed on a front surface of a substrate b30 (board b2) by a thermal oxidation method and/or a CVD method. Then, a lower electrode film b111 of an aluminum film is formed on the entire surface of the insulative layer b20, for example, by a sputtering method. The lower electrode film b111 may have a thickness of about 8000 Å. In turn, a resist pattern corresponding to the final shape of the lower electrode film b111 is formed on a surface of the lower electrode film by photolithography. The lower electrode film is etched by using the resist pattern as a mask. Thus, the lower electrode film b111 is provided as having a pattern shown in FIG. 60 and the like. The etching of the lower electrode film b111 may be achieved, for example, by reactive ion etching.

Then, a capacitive film b112 such as of a silicon nitride film is formed on the lower electrode film b111, for example, by a plasma CVD method. In a region not formed with the lower electrode film b111, the capacitive film b112 is formed on the surface of the insulative layer b20. In turn, an upper electrode film b113 is formed on the capacitive film b112.

The upper electrode film b113 is formed from, for example, an aluminum film which is formed by a sputtering method. The upper electrode film b113 may have a thickness of about 8000 Å. Then, a resist pattern corresponding to the final shape of the upper electrode film b113 is formed on a surface of the upper electrode film b113 by photolithography. The upper electrode film b113 is etched with the use of this resist pattern as a mask to be thereby patterned into the final shape (see FIG. 60 and the like). Thus, the upper electrode film b113 is configured in a pattern such as to include a plurality of electrode film portions b131 to b139 in the capacitor electrode region b113A, a plurality of fuse units b107 in the fuse region b113C and a pad region b113B connected to the fuse units b107. The etching for the patterning of the upper electrode film b113 may be achieved by wet etching with the use of an etching liquid such as phosphoric acid or by reactive ion etching.

In this manner, devices b5 (the capacitor elements C1 to C9 and the fuse units b107) for chip capacitors b101 are formed. After the formation of the devices b5, an insulative film b45 is formed as entirely covering the devices b5 (the upper electrode films b113 and a region of the capacitive film b112 not formed with the upper electrode films b113) by a plasma CVD method (see FIG. 50A). Thereafter, a trench b44 is formed (see FIG. 50B), and then openings b25 are formed (see FIG. 50C). Subsequently, probes b70 are pressed against the pad region b113B of the upper electrode film b113 and the pad region b111B of the lower electrode film bill exposed from the openings b25 to measure the total capacitance value of the capacitor elements C1 to C9 for each of the devices b5 (see FIG. 50C). Based on the total capacitance value thus measured, capacitor elements to be isolated, i.e., fuses to be disconnected, are selected according to a target capacitance value of the chip capacitor b101.

In this state, a laser trimming process is performed for selectively fusing off the fuse units b107. That is, the laser beam is applied to fuse units b107 of the fuses selected according to the result of the measurement of the total capacitance value, whereby the narrower portions b107C of the selected fuse units b107 (see FIG. 60) are fused off. Thus, the associated capacitor elements are isolated from the pad region b113B. When the laser beam is applied to the fuse units b107, the energy of the laser beam is accumulated around the fuse units b107 by the function of the insulative film b45 serving as the cover film, thereby fusing off the fuse units b107. Thus, the capacitance value of the chip capacitor b101 can be reliably adjusted to the target capacitance value.

Subsequently, a silicon nitride film is deposited on the cover film (insulative film b45), for example, by a plasma CVD method to form an insulative film b23. The aforementioned cover film is finally unified with the insulative film b23 to form a part of the insulative film b23. The insulative film b23 formed after the disconnection of the fuses enters holes formed in the cover film when the cover film is partly broken during the fuse-off of the fuses, and covers disconnection surfaces of the fuse units b107 for protection. Therefore, the insulative film b23 prevents intrusion of foreign matter and moisture in the disconnected portions of the fuse units b107. This makes it possible to produce highly reliable chip capacitors b101. The insulative film b23 may be formed as having an overall thickness of, for example, about 8000 Å.

Then, a coating film b46 is formed (see FIG. 50D). Thereafter, the openings b25 closed with the coating film b46 and the insulative film b23 are uncovered (see FIG. 50E), and the first and second connection electrodes b3, b4 are thickened, for example, by an electroless plating method (see FIG. 50F). Subsequently, as in the case of the chip resistors b1, the substrate b30 is ground from the back surface b30B (see FIG. 50G), whereby the resulting chip capacitors b101 are separated from each other.

In the patterning of the upper electrode film b113 by utilizing the photolithography process, the electrode film portions b131 to b139 each having a very small area can be highly accurately formed, and the fuse units b107 can be formed in a minute pattern. After the patterning of the upper electrode film b113, the total capacitance value of the capacitor elements is measured, and the fuses to be disconnected are selected. The chip capacitors b101 can be provided as each having a desired capacitance value, which is accurately adjusted by disconnecting the selected fuses.

While the chip components (the chip resistor b1 and the chip capacitor b101) according to the second reference embodiment have thus been described, the second reference embodiment may be embodied in other forms. In the aforementioned examples, the chip resistor b1 includes a plurality of resistor circuits having different resistance values defined by the geometric progression with a geometric ratio r ($0<r$, $r\neq1$)=2 by way of example, but the geometric ratio for the geometric progression may have a value other than 2. The chip capacitor b101 includes a plurality of capacitor elements having different capacitance values defined by the geometric progression with a geometric ratio r ($0<r$, $r\neq1$)=2 by way of example, but the geometric ratio for the geometric progression may have a value other than 2.

In the chip resistor b1 and the chip capacitor b101, the insulative layer b20 is provided on the front surface of the board b2. Where the board b2 is an insulative board, however, the insulative layer b20 may be obviated. In the chip capacitor b101, only the upper electrode film b113 is divided into a plurality of electrode film portions. However, only the lower electrode film b111 may be divided into a plurality of electrode film portions, or the upper electrode film b113 and the lower electrode film b111 may be each divided into a plurality of electrode film portions. In the aforementioned example, the fuse units are provided integrally with the upper electrode film or the lower electrode film, but may be formed from a conductor film different from the upper and lower electrode films. The chip capacitor b101 described above has a single-level capacitor structure including the upper electrode film b113 and the lower electrode film b111. Alternatively, a multi-level capacitor structure may be provided by stacking another electrode film on the upper electrode film b113 with the intervention of a capacitive film.

The chip capacitor b101 may be configured such that an electrically conductive board employed as the board b2 serves as the lower electrode and the capacitive film b112 is provided in contact with a surface of the electrically conductive board. In this case, one of the external electrodes may extend from the back surface of the electrically conductive board.

<Third Reference Embodiment of Present Invention>

(1) Inventive Features of Third Reference Embodiment

The third reference embodiment has, for example, the following inventive features (C1) to (C23):

(C1) A chip component is provided, which includes: a main body; an electrode provided on a front surface of the main body; and a resin film provided on a side surface of the main body.

With this arrangement, the resin film of the chip component functions as a bumper. Therefore, even if adjacent chip components supported by a support tape or the like before separation thereof bump against each other, the resin films of the respective chip components are first brought into contact with each other. This prevents or suppresses the chipping of corner portions of the chip components.

(C2) In the chip component of the feature (C1), the resin film projects outward of an edge of the front surface of the main body.

With this arrangement, the corner portion of the front surface of the chip component is not brought into contact with the surroundings, so that the chipping of the corner portion can be prevented or suppressed.

(C3) In the chip component of the feature (C1) or (C2), the edge of the front surface of the main body is uncovered with the resin film. For mounting the chip component on a mount board, in general, the chip component is sucked and moved by a suction nozzle of an automatic mounting machine. Prior to the suction of the chip component by the suction nozzle, the contour of the chip component is detected from the side of the front or back surface through image recognition, and then a portion of the chip component to be sucked by the suction nozzle is determined. With the inventive arrangement, the edge of the front surface of the main body is exposed, so that the contour of the chip component can be easily detected based on the edge of the front surface. Therefore, the intended portion of the chip component can be accurately sucked by the suction nozzle.

(C4) In the chip component of any one of the features (C1) to (C3), the resin film is provided on a region of the side surface of the main body spaced from the front surface of the main body.

With this arrangement, the edge of the front surface of the main body can be reliably exposed.

(C5) In the chip component of the feature (C1) or (C2), the resin film continuously extends from the side surface to the front surface of the main body.

With this arrangement, the corner portion of the front surface of the main body is covered with the resin film, so that the chipping of the corner portion can be reliably prevented or suppressed.

(C6) In the chip component of any one of the features (C1) to (C5), the front surface of the main body forms an acute angle or an obtuse angle with respect to the side surface.

With this arrangement, the corner portion of the main body is not right-angled, so that the chipping of the corner portion (particularly, an obtuse corner portion) can be prevented or suppressed.

(C7) The chip component of any one of the features (C1) to (C6) further includes a second resin film which covers the front surface of the main body with the electrode being exposed therefrom.

With this arrangement, the front surface of the main body can be protected with the second resin film.

(C8) In the chip component of the feature (C7), the second resin film has a surface located at a higher height level than the electrode.

With this arrangement, when an impact is applied to the front surface of the main body, the second resin film first receives the impact. Thus, the impact is reduced by the second resin film, whereby the front surface of the main body can be reliably protected.

(C9) In the chip component of any one of the features (C1) to (C8), the main body includes a board and a plurality of resistor elements provided on the board, wherein the resistor elements each include a resistive film provided on the front surface of the board and an interconnection film provided on the resistive film, and the electrode is electrically connected to the interconnection film.

With this arrangement, the chip component is a chip resistor, which can be customized to have any of plural resistance values by selectively combining the resistor elements.

(C10) In the chip component of the feature (C9), the main body includes a plurality of fuses provided on the board and disconnectably connecting the resistor elements to the electrode.

With this arrangement, the chip component (chip resistor) can be easily and speedily customized to have any of the plural resistance values by selectively disconnecting one or more of the fuses. In other words, the chip resistor can be customized based on the same design concept so as to have various resistance values by selectively combining resistor elements having different resistance values.

(C11) The chip component may be a chip inductor.

(C12) The chip component may be a chip diode.

(C13) The chip component may be a chip capacitor.

(C14) A chip component production method is provided, which includes the steps of: forming an electrode in each of plural chip component regions defined on a substrate; forming a trench having a predetermined depth from a front surface of the substrate in a boundary region defined between the chip component regions, whereby main bodies respectively defined in the chip component regions are separated from each other; forming a resin film on a side wall of the trench, whereby the resin film is formed on a side surface of each of the main bodies; and grinding a back surface of the substrate to the trench to divide the substrate into a plurality of chip components.

According to this method, the resin film is provided on the side surface of each of the completed chip components to function as a bumper. Therefore, even if adjacent chip components supported by a support tape or the like before separation thereof bump against each other, the resin films of the respective chip components are first brought into contact with each other. This prevents or suppresses the chipping of corner portions of the chip components.

(C15) In the chip component production method of the feature (C14), the trench is formed by etching.

According to this method, the trench can be formed in the boundary region between all the chip component regions on the substrate at a time. This reduces the time required for the production of the chip components.

(C16) In the chip component production method of the feature (C14) or (C15), the resin film is formed as projecting outward of an edge of a front surface of each of the main bodies. According to this method, a corner portion of the front surface of the chip component is not brought into contact with the surroundings, so that the chipping of the corner portion can be prevented or suppressed.

(C17) In the chip component production method of any of the features (C14) to (C16), the resin film is formed so as to uncover the edge of the front surface of each of the main bodies.

For mounting the chip component on a mount board, in general, the chip component is sucked and moved by a suction nozzle of an automatic mounting machine. Prior to the suction of the chip component by the suction nozzle, the contour of the chip component is detected from the side of the front or back surface through image recognition, and then a portion of the chip component to be sucked by the suction nozzle is determined. With the inventive arrangement, the edge of the front surface of the main body is exposed, so that the contour of the chip component can be easily detected based on the edge of the front surface.

Therefore, the intended portion of the chip component can be accurately sucked by the suction nozzle.

(C18) In the chip component production method of any one of the features (C14) to (C17), the resin film is formed on a region of the side surface of the main body spaced from the front surface of the main body.

According to this method, the edge of the front surface of the main body can be reliably exposed.

(C19) In the chip component production method of any one of the features (C14) to (C16), the resin film is formed as continuously extending from the side surface to the front surface of the main body.

According to this method, the corner portion of the front surface of the main body is covered with the resin film, so that the chipping of the corner portion can be reliably prevented or suppressed.

(C20) In the chip component production method of any one of the features (C14) to (C19), the front surface of the main body forms an acute angle or an obtuse angle with respect to the side surface.

According to this method, the corner portion of the main body is not right-angled, so that the chipping of the corner portion (particularly, an obtuse corner portion) can be prevented or suppressed.

(C21) The chip component production method of any one of the features (C14) to (C20) further includes the step of forming a second resin film which covers the front surface of the main body with the electrode being exposed therefrom.

According to this method, the front surface of the main body can be protected with the second resin film.

(C22) In the chip component production method of the feature (C21), the second resin film has a surface located at a higher height level than the electrode.

According to this method, when an impact is applied to the front surface of the main body, the second resin film first receives the impact. The impact is reduced by the second resin film, whereby the front surface of the main body can be reliably protected.

(C23) In the chip component production method of any one of the features (C14) to (C22), the main body includes a board and a plurality of resistor elements provided on the board, wherein the resistor elements each include a resistive film provided on the front surface of the board and an interconnection film provided on the resistive film, and the electrode is electrically connected to the interconnection film.

According to this method, the chip component is a chip resistor, which can be customized to have any of plural resistance values by selectively combining the resistor elements.

(2) Examples of Third Reference Embodiment of Present Invention

Examples of the third reference embodiment will hereinafter be described in detail with reference to the attached drawings. Reference characters shown in FIGS. 64 to 86 are effective only in FIGS. 64 to 86, so that components designated by these reference characters may be different from those designated by the same reference characters in other embodiments.

Figure 64:
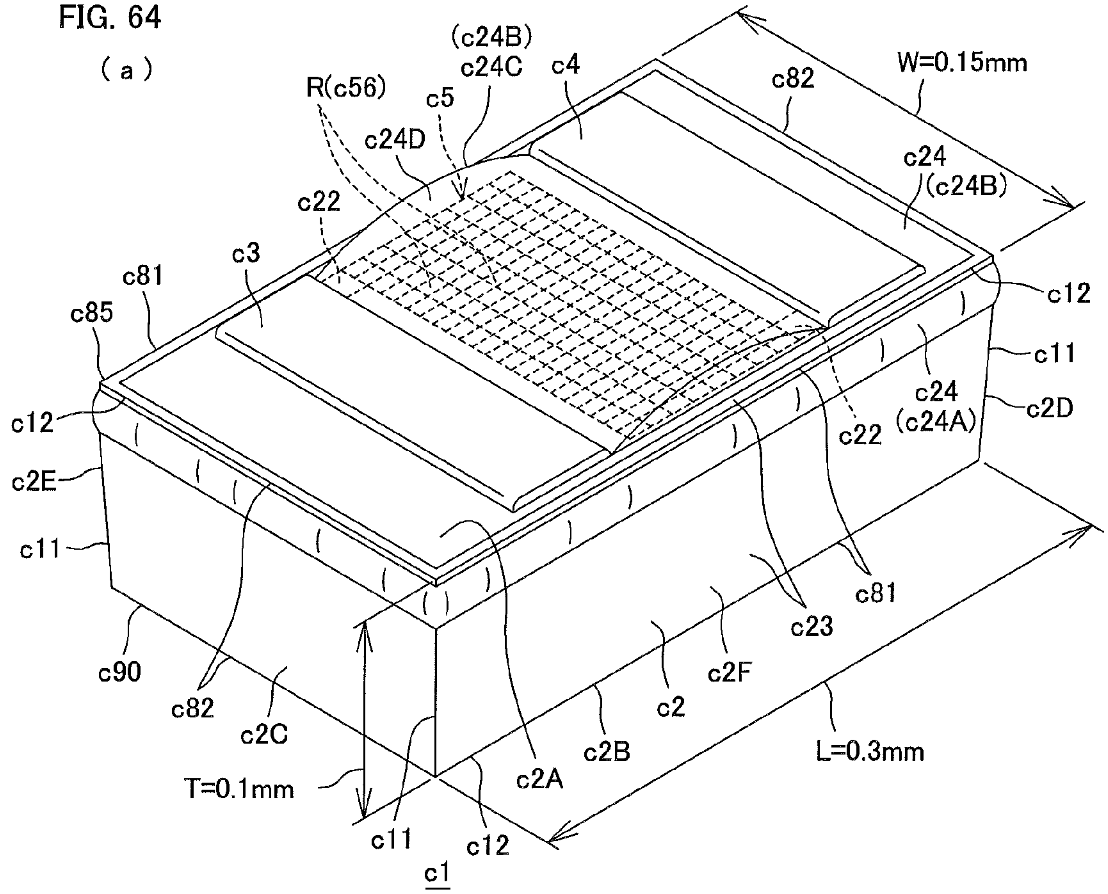
FIG. 64(*a*) is a schematic perspective view for explaining the construction of a chip resistor according to an example of a third reference embodiment, and FIG. 64(*b*) is a schematic side view illustrating the chip resistor, which is mounted on a mount board.
Figure 64:
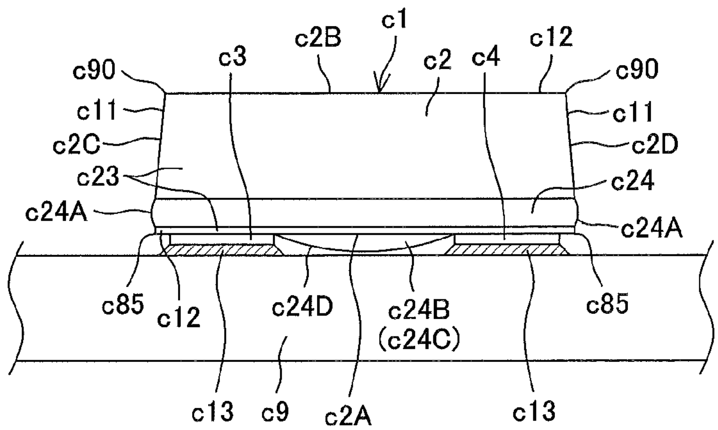

FIG. 64(*a*) is a schematic perspective view for explaining the construction of a chip resistor according to an example of the third reference embodiment, and FIG. 64(*b*) is a schematic side view illustrating the chip resistor, which is mounted on a mount board. The chip resistor c1 is a minute chip component, and has a rectangular prismatic shape as shown in FIG. 64(*a*). The chip resistor c1 has a rectangular plan shape defined by two perpendicularly intersecting edges (a longer edge c81 and a shorter edge c82), one of which has a length of not greater than 0.4 mm and the other of which has a length of not greater than 0.2 mm. More preferably, the chip resistor c1 is dimensioned such as to have a length L (a length of the longer edge c81) of about 0.3 mm, a width W (a length of the shorter edge c82) of about 0.15 mm, and a thickness T of about 0.1 mm.

The chip resistor c1 is obtained by forming a multiplicity of chip resistors c1 in a lattice form on a substrate, then forming a trench in the substrate, and grinding a back surface of the substrate (or dividing the substrate along the trench) to separate the chip resistors c1 from each other. The chip resistor c1 principally includes a board c2 which constitutes a part of a main body of the chip resistor c1 (resistor main body), a first connection electrode c3 and a second connection electrode c4 serving as external connection electrodes, and a device (element) c5 connected to the outside via the first connection electrode c3 and the second connection electrode c4.

The board c2 has a generally rectangular prismatic chip shape. An upper surface of the board c2 as seen in FIG. 64(*a*) is a front surface c2A. The front surface c2A is a surface (device formation surface) of the board c2 on which the device c5 is provided, and has a generally rectangular shape. A surface of the board c2 opposite from the front surface c2A with respect to the thickness of the board c2 is a back surface c2B. The front surface c2A and the back surface c2B have substantially the same shape, and are parallel to each other. However, the front surface c2A is greater than the back surface c2B. When the back surface c2B is seen in plan perpendicularly to the front surface c2A, therefore, the back surface c2B is accommodated within the front surface c2A. The front surface c2A has a rectangular edge portion c85 defined along a pair of longer edges c81 and a pair of shorter edges c82 thereof, and the back surface c2B has a rectangular edge portion c90 defined along a pair of longer edges c81 and a pair of shorter edges c82 thereof.

In addition to the front surface c2A and the back surface c2B, the board c2 has side surfaces c2C, c2D, c2E and c2F intersecting the front surface c2A and the back surface c2B to connect the front surface c2A and the back surface c2B to each other. The side surface c2C is disposed between shorter edges c82 of the front surface c2A and the back surface c2B on one of longitudinally opposite sides (on a left front side in FIG. 64(*a*)). The side surface c2D is disposed between shorter edges c82 of the front surface c2A and the back surface c2B on the other of the longitudinally opposite sides (on a right rear side in FIG. 64(*a*)). The side surfaces c2C, c2D are longitudinally opposite end faces of the board c2. The side surface c2E is disposed between longer edges c81 of the front surface c2A and the back surface c2B on one of widthwise opposite sides (on a left rear side in FIG. 64(*a*)). The side surface c2F is disposed between longer edges c81 of the front surface c2A and the back surface c2B on the other of the widthwise opposite sides (on a right front side in FIG. 64(*a*)). The side surfaces c2E, c2F are widthwise opposite end faces of the board c2. The side surfaces c2C, c2D intersect (generally orthogonally intersect) the side surfaces c2E, c2F. Since the front surface c2A is greater than the back surface c2B as described above, the side surfaces c2C to c2F each have an isosceles trapezoidal shape having an upper base on the side of the back surface c2B and a lower base on the side of the front surface c2A. That is, side surfaces of the chip resistor c1 each have an isosceles trapezoidal shape. Therefore, adjacent ones of the front surface c2A, the back surface c2B and the side surfaces c2C to c2F form an acute angle or an obtuse angle. More specifically, the side surfaces c2C, c2D, c2E, c2F each form an acute angle with respect to the front surface c2A, and each form an obtuse angle with respect to the back surface c2B. For convenience of description, the inclinations of the side surfaces c2C to c2F are greater than actual inclinations (exaggerated) in FIG. 64 and subsequent figures.

The front surface c2A and the side surfaces c2C to c2F of the board c2 are entirely covered with an insulative film c23. More strictly, therefore, the front surface c2A and the side surfaces c2C to c2F are entirely located on an inner side (back side) of the insulative film c23, and are not exposed to the outside in FIG. 64(*a*). Further, the chip resistor c1 has a resin film c24. The resin film c24 includes a first resin film c24A, and a second resin film c24B which is different from the first resin film c24A. The first resin film c24A is provided on portions of the side surfaces c2C, c2D, c2E, c2F located slightly apart from the edge portion c85 of the front surface c2A toward the back surface c2B. The second resin film c24B covers a portion of the insulative film c23 on the front surface c2A in a region not overlapping the edge portion c85 of the front surface c2A (inward of the edge portion c85). The insulative film c23 and the resin film c24 will be detailed later.

The first connection electrode c3 and the second connection electrode c4 are provided inward of the edge portion c85 on the front surface c2A of the board c2, and partly exposed from the second resin film c24B on the front surface c2A. In other words, the second resin film c24B covers the front surface c2A (strictly, the insulative film c23 on the front surface c2A) with the first connection electrode c3 and the second connection electrode c4 being exposed therefrom. The first connection electrode c3 and the second connection electrode c4 each have a structure such that an Ni (nickel) layer, a Pd (palladium) layer and an Au (gold) layer are stacked in this order on the front surface c2A. The first connection electrode c3 and the second connection electrode c4 are spaced from each other longitudinally of the front surface c2A, and are each elongated widthwise of the front surface c2A. On the front surface c2A, the first connection electrode c3 is disposed closer to the side surface c2C, and the second connection electrode c4 is disposed closer to the side surface c2D in FIG. 64(*a*).

The device c5 is a circuit device (element), which is provided between the first connection electrode c3 and the second connection electrode c4 on the front surface c2A of the board c2, and is covered with the insulative film c23 and the second resin film c24B from the upper side. The device c5 constitutes a part of the resistor main body described above. In this example, the device c5 is a resistor portion c56. The resistor portion c56 is a circuit network including a plurality of (unit) resistor bodies R each having the same resistance value and arranged in a matrix array on the front surface c2A. The resistor bodies R are each made of TiN (titanium nitride), TiON (titanium oxide nitride) or TiSiON. The device c5 is electrically connected to portions of an interconnection film c22 to be described later, and electrically connected to the first connection electrode c3 and the second connection electrode c4 via the interconnection film portions c22.

As shown in FIG. 64(*b*), the chip resistor c1 can be mounted on the mount board c9 (through flip chip connection) by electrically and mechanically connecting the first connection electrode c3 and the second connection electrode c4 to a circuit (not shown) of the mount board c9 by solder c13 with the first connection electrode c3 and the second connection electrode c4 opposed to the mount board c9. The first connection electrode c3 and the second connection electrode c4 functioning as the external connection electrodes are desirably formed of gold (Au) or plated with gold for improvement of solder wettability and reliability.

Figure 65:
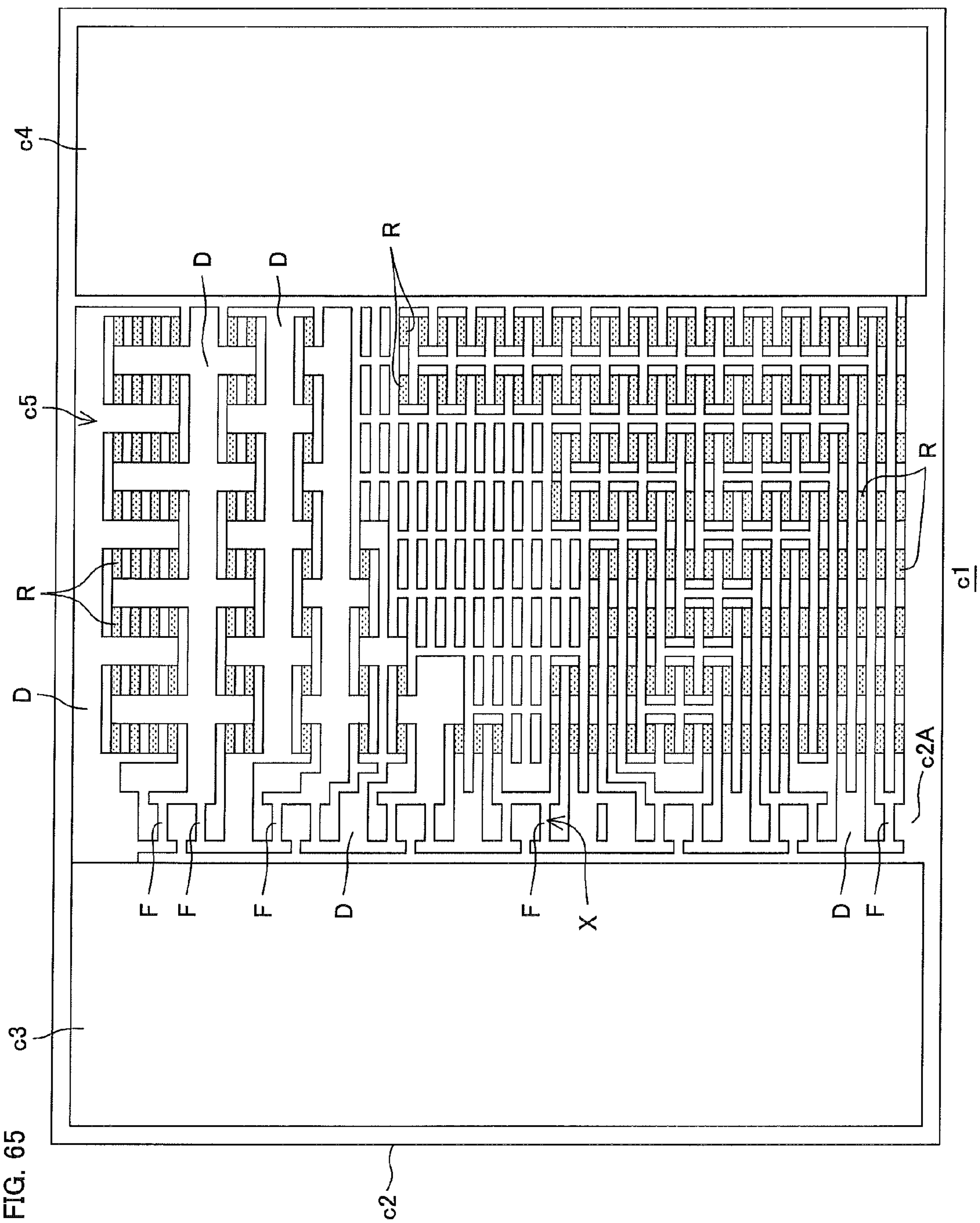
FIG. 65 is a plan view of the chip resistor showing the layout of a first connection electrode, a second connection electrode and a device, and the structure of the device as viewed in plan.

FIG. 65 is a plan view of the chip resistor showing the layout of the first connection electrode, the second connection electrode and the device, and the structure (layout pattern) of the device as viewed in plan. Referring to FIG. 65, the device c5 is a resistor circuit network. More specifically, the device c5 includes 352 resistor bodies R in total with 8 resistor bodies R aligned in each row (longitudinally of the board c2) and with 44 resistor bodies R aligned in each column (widthwise of the board c2). These resistor bodies R are elements of the resister circuit network of the device c5.

The multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface c2A of the board c2 for electrically incorporating the resistor circuits into the device c5 or electrically isolating the resistor circuits from the device c5. The fuses F and the conductor films D are arranged in a linear region alongside an inner edge of the first connection electrode c3. More specifically, the fuses F and the conductor films D are arranged in adjacent relation in a linear arrangement direction. The fuses F disconnectably (separably) connect the plural types of resistor circuits (each including a plurality of resistor bodies R) with respect to the first connection electrode c3. The fuses F and the conductor films D constitute a part of the resistor main body described above.

Figure 66A:
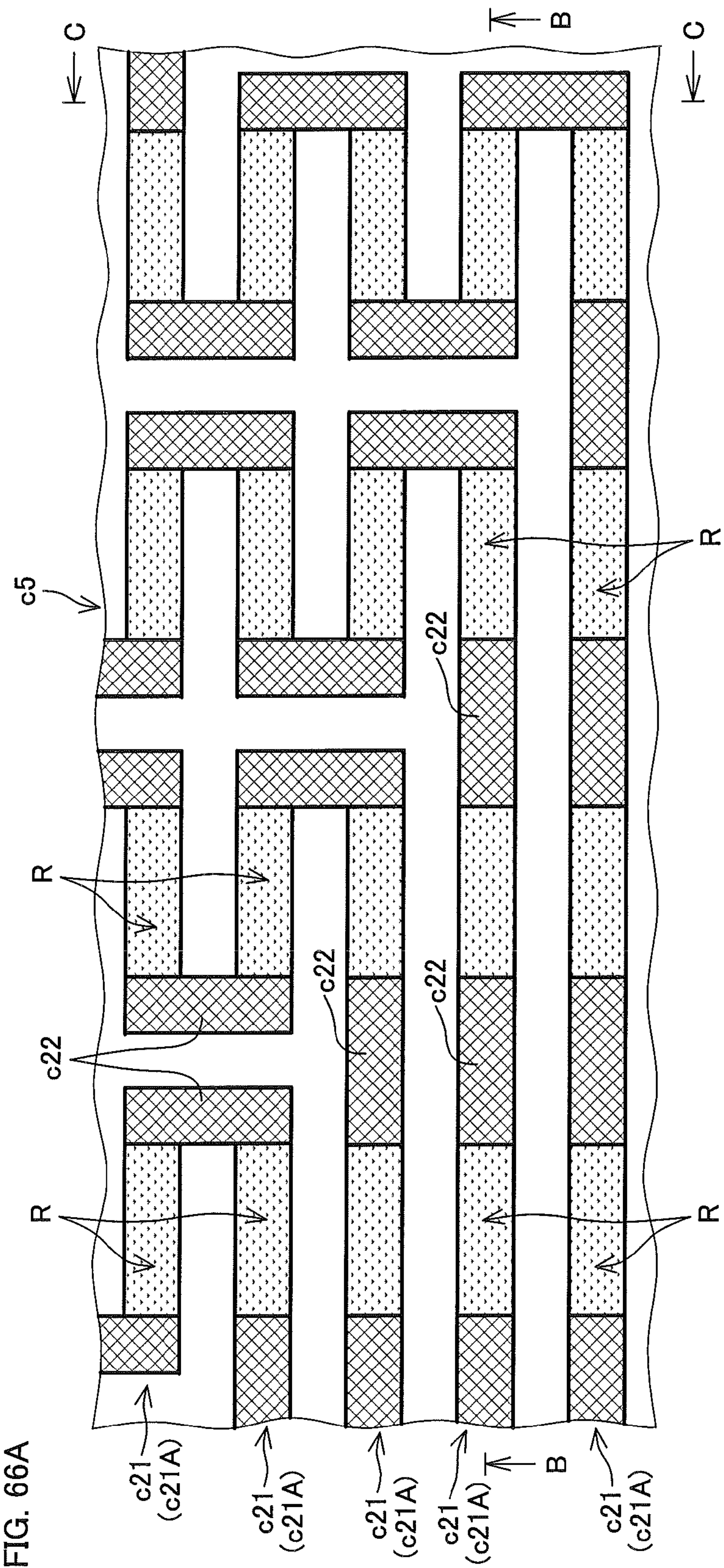
FIG. 66A is a plan view illustrating a part of the device shown in FIG. 65 on an enlarged scale.
Figure 66B:
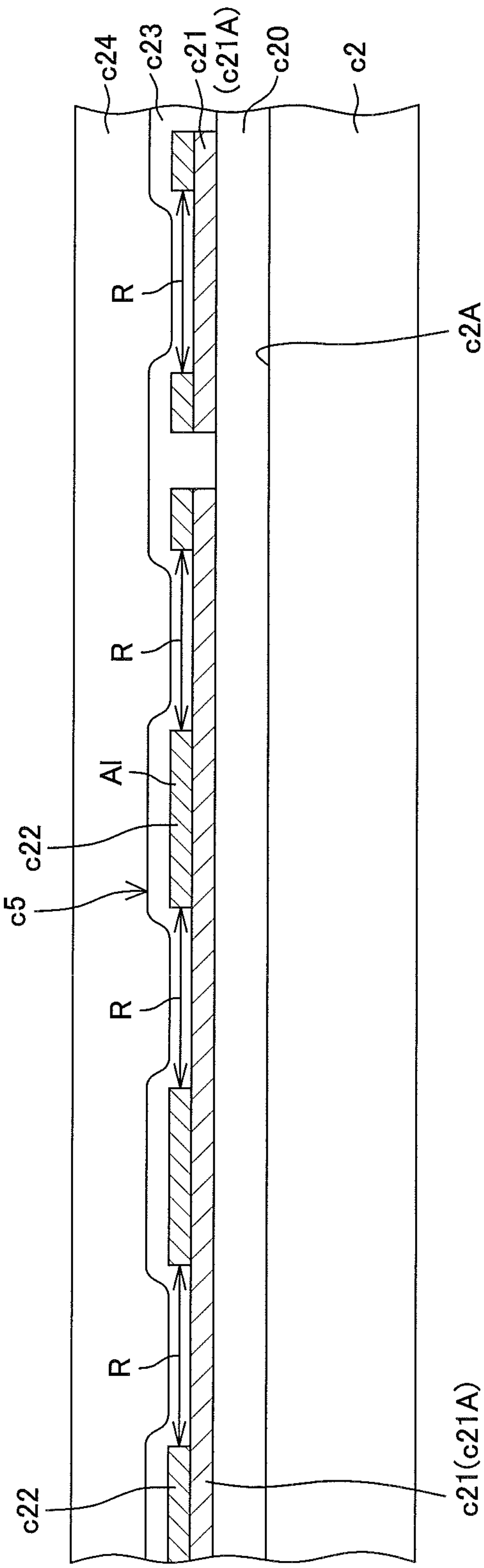
FIG. 66B is a longitudinal vertical sectional view taken along a line B-B in FIG. 66A for explaining the structure of resistor bodies of the device.
Figure 66C:
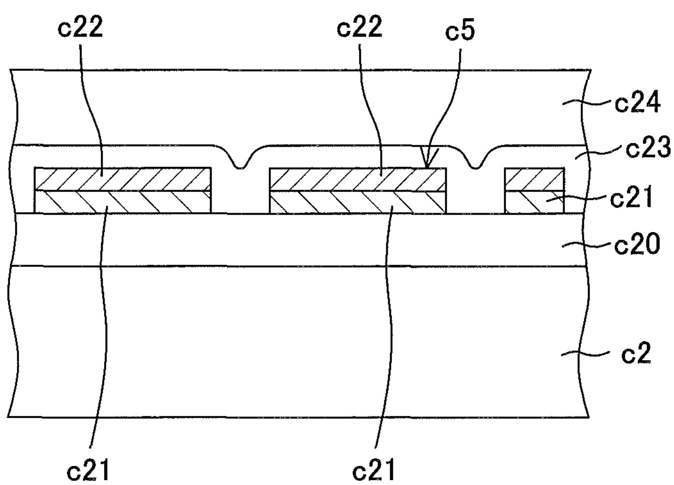
FIG. 66C is a widthwise vertical sectional view taken along a line C-C in FIG. 66A for explaining the structure of the resistor bodies of the device.

FIG. 66A is a plan view illustrating a part of the device shown in FIG. 65 on an enlarged scale. FIG. 66B is a longitudinal vertical sectional view taken along a line B-B in FIG. 66A for explaining the structure of the resistor bodies of the device. FIG. 66C is a widthwise vertical sectional view taken along a line C-C in FIG. 66A for explaining the structure of the resistor bodies of the device. Referring to FIGS. 66A, 66B and 66C, the structure of the resistor bodies R will be described.

The chip resistor c1 includes an insulative layer c20 and a resistive film c21 in addition to the interconnection film c22, the insulative film c23 and the resin film c24 described above (see FIGS. 66B and 66C). The insulative layer c20, the resistive film c21, the interconnection film c22, the insulative film c23 and the resin film c24 are provided on the board c2 (on the front surface c2A). The insulative layer c20 is made of $SiO_2$ (silicon oxide). The insulative layer c20 covers the entire front surface c2A of the board c2. The insulative layer c20 has a thickness of about 10000 Å.

The resistive film c21 is provided on the insulative layer c20. The resistive film c21 is made of TiN, TION or TiSiON. The resistive film c21 has a thickness of about 2000 Å. The resistive film c21 includes a plurality of resistive film portions (hereinafter referred to as "resistive film lines c21A") extending linearly parallel to each other between the first connection electrode c3 and the second connection electrode c4. Some of the resistive film lines c21A are cut at predetermined positions with respect to a line extending direction (see FIG. 66A).

Portions of the interconnection film c22 are provided on the resistive film lines c21A. The interconnection film portions c22 are each made of Al (aluminum) or an alloy (AlCu alloy) of aluminum and Cu (copper). The interconnection film portions c22 each have a thickness of about 8000 Å. The interconnection film portions c22 are provided on the resistive film lines c21A in contact with the resistive film lines c21A, and spaced a predetermined distance R from one another in the line extending direction.

Figure 67:
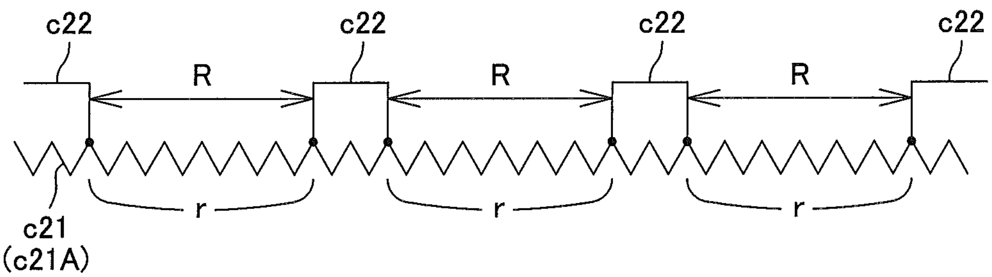
FIG. 67 are diagrams showing the electrical characteristic features of a resistive film line and an interconnection film by way of circuit symbols and electric circuit diagrams.
Figure 67:
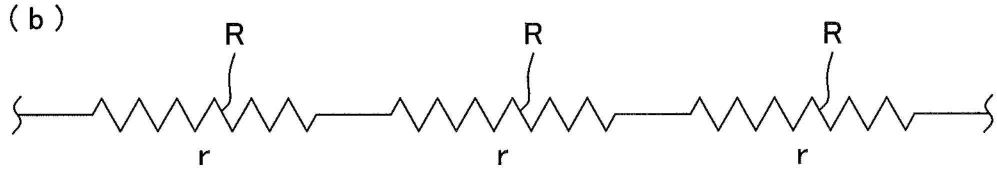
Figure 67:
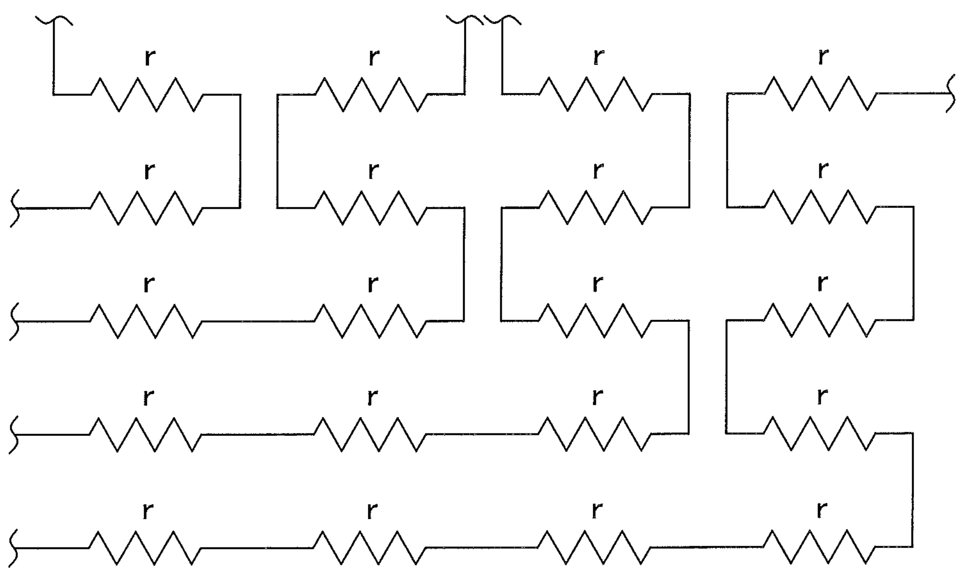

In FIG. 67, the electrical characteristic features of the resistive film lines c21A and the interconnection film portions c22 of this arrangement are shown by way of circuit symbols. As shown in FIG. 67(*a*), portions of each of the resistive film lines c21A present between the interconnection film portions c22 spaced the predetermined distance R from one another each serve as a single resistor body R having a predetermined resistance value r. The interconnection film portions c22, which electrically connect adjacent resistor bodies R to each other, cause short circuit in each of the resistive film lines c21A on which the interconnection film portions c22 are provided. Thus, a resistor circuit is provided, in which the resistor bodies R each having a resistance r are connected in series as shown in FIG. 67(*b*).

Further, adjacent resistive film lines c21A are connected to each other by the resistive film c21 and the interconnection film c22, so that the resistor circuit network of the device c5 shown in FIG. 66A constitutes a resistor circuit (including the resistor unit of the resistor bodies R described above) shown in FIG. 67(*c*). Thus, the resistor bodies R and the resistor circuits (i.e., the device c5) are constituted by the resistive film c21 and the interconnection film c22. The resistor bodies R each include a resistive film line c21A (resistive film c21), and a plurality of interconnection film portions c22 spaced the predetermined distance from one another in the line extending direction on the resistive film line c21A. Portions of the resistive film line c21A not provided with the interconnection film portions c22 spaced the predetermined distance R from one another each define a single resistor body R. The portions of the resistive film line c21A defining the resistor bodies R each have the same shape and the same size. Therefore, the multiplicity of resistor bodies R arranged in the matrix array on the board c2 have the same resistance value.

Figure 68:
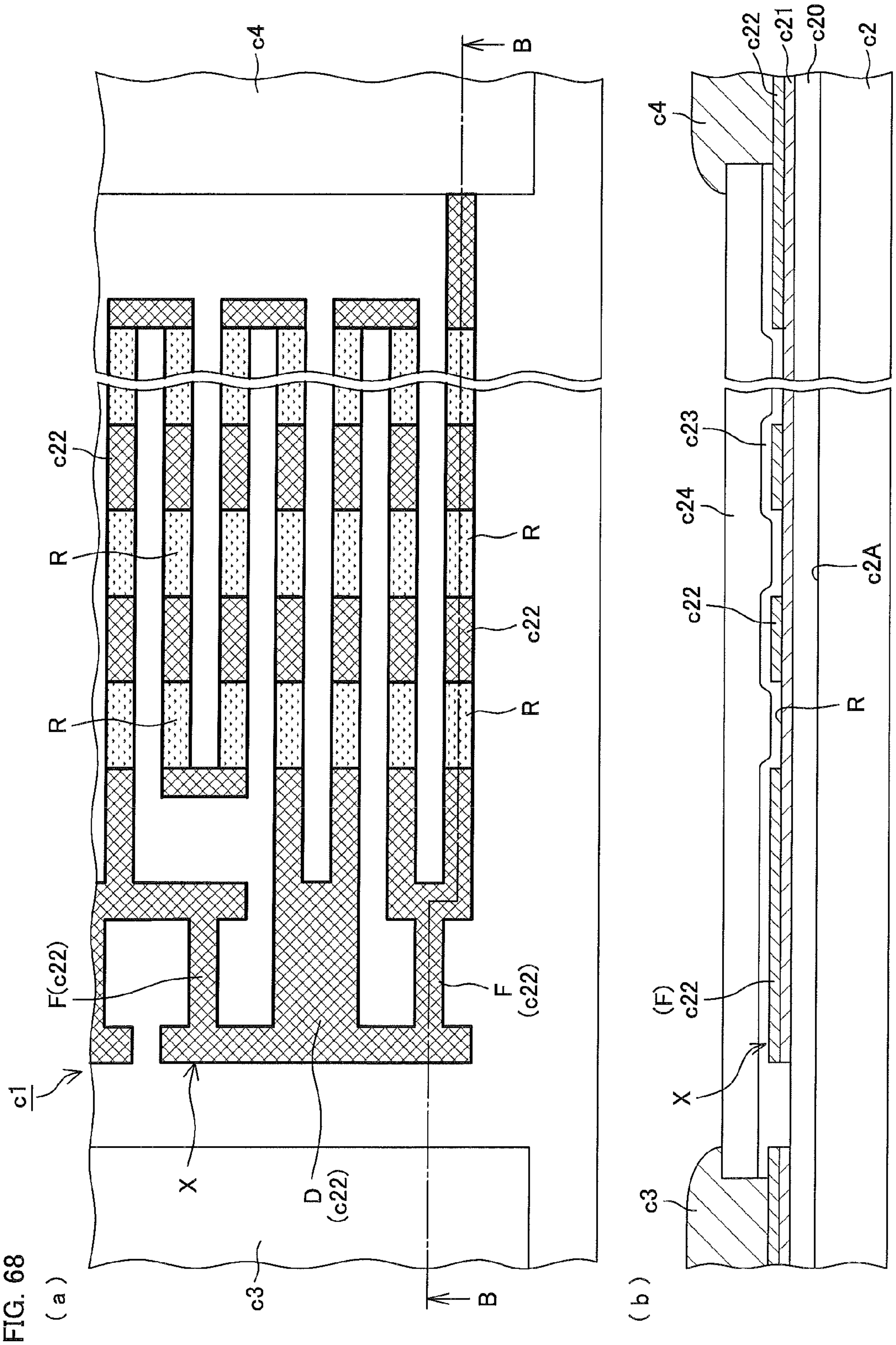
FIG. 68(*a*) is an enlarged partial plan view illustrating a region of the chip resistor including fuses shown in a part of the plan view of FIG. 65 on an enlarged scale, and FIG. 68(*b*) is a diagram showing a sectional structure taken along a line B-B in FIG. 68(*a*).

The interconnection film portions c22 provided on the resistive film lines c21A define the resistor bodies R, and also serve as conductor films D for connecting the resistor bodies R to one another to provide the resistor circuits (see FIG. 65). FIG. 68(*a*) is an enlarged partial plan view illustrating a region of the chip resistor including fuses shown in a part of the plan view of FIG. 65 on an enlarged scale, and FIG. 68(*b*) is a diagram showing a sectional structure taken along a line B-B in FIG. 68(*a*).

As shown in FIGS. 68(*a*) and 68(*b*), the interconnection film portion c22 for the fuses F and the conductor films D described above is formed from the same interconnection film c22 as the interconnection film portions c22 provided on the resistive film c21 for the resistor bodies R. That is, the fuses F and the conductor films D are formed of Al or the AlCu alloy, which is the same metal material as for the interconnection film portions c22 provided on the resistive film lines c21A to define the resistor bodies R, and provided at the same level as the interconnection film portions c22. As described above, the interconnection film portion c22 serves as the conductor films D for electrically connecting the plurality of resistor bodies R to form the resistor circuit.

That is, the interconnection film portions c22 for defining the resistor bodies R, the interconnection film portion c22 for the fuses F and the conductor films D, and the interconnection film portions c22 for connecting the device c5 to the first connection electrode c3 and the second connection electrode c4 are formed of the same metal material (Al or the AlCu alloy) and provided at the same level on the resistive film c21. It is noted that the fuses F are different (discriminated) from the other interconnection film portions c22 in that the fuses F are thinner for easy disconnection and no circuit element is present around the fuses F.

A region of the interconnection film portion c22 in which the fuses F are disposed is herein referred to as "trimming region X" (see FIGS. 65 and 68(*a*)). The trimming region X linearly extends alongside the inner edge of the first connection electrode c3, and not only the fuses F but also some of the conductor films D are present in the trimming region X. The resistive film c21 is partly present below the interconnection film portion c22 in the trimming region X (see FIG. 68(*b*)). The fuses F are each spaced a greater distance from the surrounding interconnection film portions c22 than the other interconnection film portions c22 present outside the trimming region X.

The fuses F each do not simply designate a part of the interconnection film portion c22, but may each designate a fuse element which is a combination of a part of the resistor body R (resistive film c21) and a part of the interconnection film portion c22 on the resistive film c21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

Figure 69:
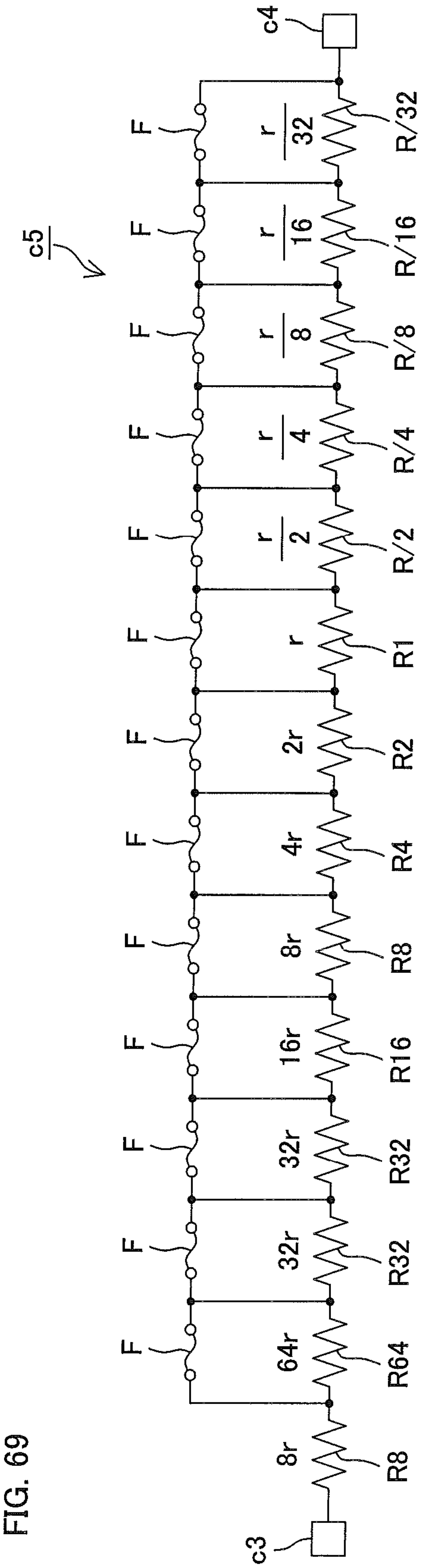
FIG. 69 is an electric circuit diagram of the device according to the example of the third reference embodiment.

FIG. 69 is an electric circuit diagram of the device according to the example of the third reference embodiment. Referring to FIG. 69, the device c5 includes a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first connection electrode c3. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 70 and 71 to be described later.

A single fuse F is connected in parallel to each of the resistor circuits R64 to R/32 except the reference resistor circuit R8. The fuses F are connected in series to one another directly or via the conductor films D (see FIG. 68(*a*)). With none of the fuses F fused off as shown in FIG. 69, the device c5 includes a resistor circuit such that the reference resistor circuit R8 including 8 resistor bodies R connected in series is provided between the first connection electrode c3 and the second connection electrode c4. Where the resistor bodies R each have a resistance value r of $r=8\Omega$, for example, the chip resistor c1 is configured such that the first connection electrode c3 and the second connection electrode c4 are connected to each other through a resistor circuit (including the reference resistor circuit R8) having a resistance value of $8r=64\Omega$.

With none of the fuses F fused off, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto. Therefore, the resistor circuits except the reference resistor circuit R8 are not electrically incorporated in the device c5.

In the chip resistor c1 according to this example, the fuses F are selectively fused off, for example, by a laser beam according to the required resistance value. Thus, a resistor circuit connected in parallel to a fused fuse F is incorporated in the device c5. Therefore, the device c5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device c5 (resistor portion c56) can be digitally and finely controlled to a desired resistance value by selectively fusing off the fuses F (or the fuse elements described above). Thus, the chip resistor c1 can have the desired resistance value.

Figure 70:
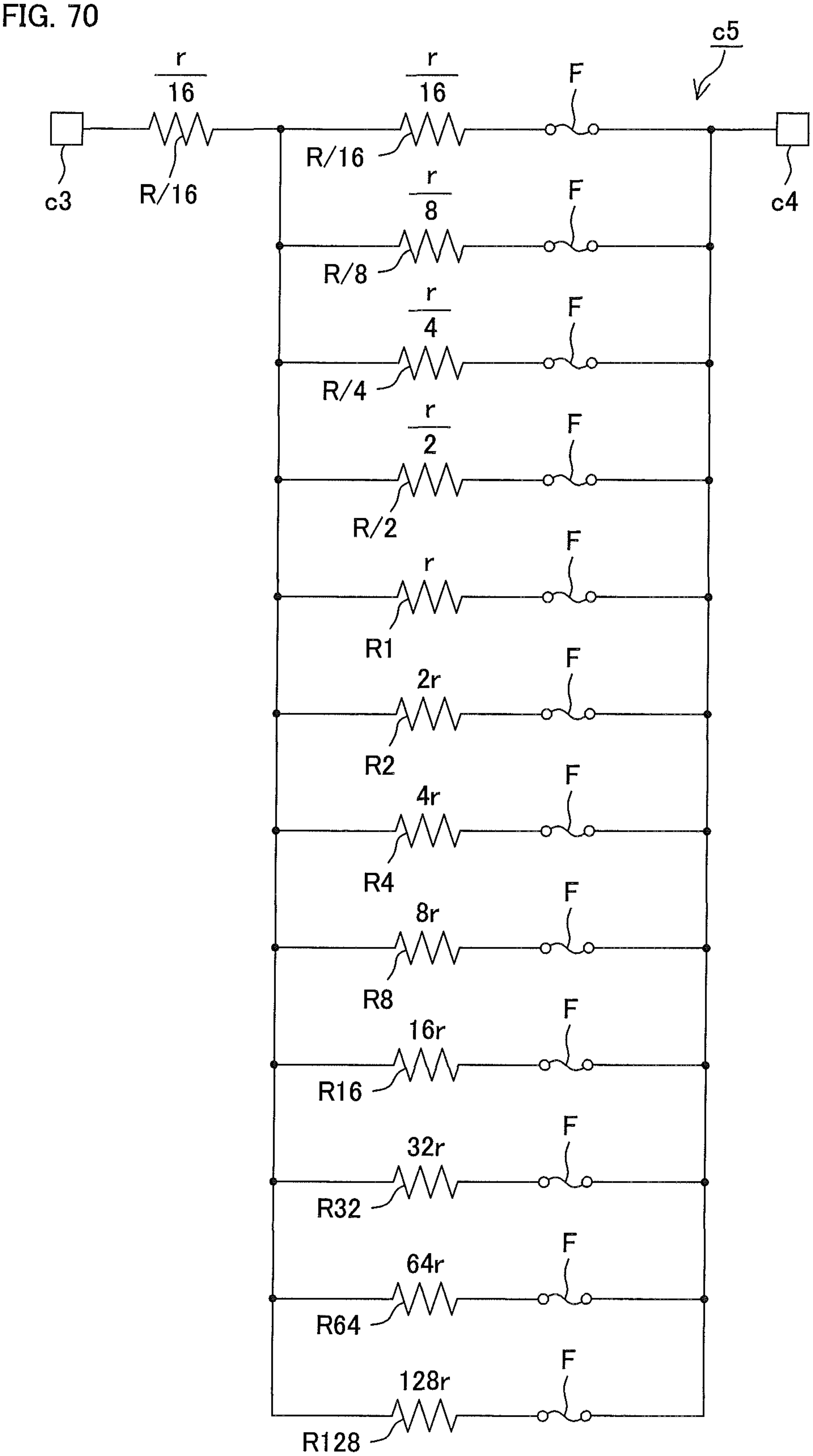
FIG. 70 is an electric circuit diagram of a device according to another example of the third reference embodiment.

FIG. 70 is an electric circuit diagram of a device according to another example of the third reference embodiment. The device c5 may be configured as shown in FIG. 70, rather than by connecting the resistor circuits R64 to R/32 in series to the reference resistor circuit R8 as shown in FIG. 69. More specifically, the device c5 may include a circuit configured such that a parallel connection circuit including 12 types of resistor circuits R/16, R/8, R/4, R/2, R1, R2, R4, R8, R16, R32, R64, R128 is connected in series to a reference resistor circuit R/16 between the first connection electrode c3 and the second connection electrode c4.

In this case, a fuse F is connected in series to each of the 12 types of resistor circuits except the reference resistor circuit R/16. With none of the fuses F fused off, all the resistor circuits are electrically incorporated in the device c5. The fuses F are selectively fused off, for example, by a laser beam according to the required resistance value. Thus, a resistor circuit associated with a fused fuse F (a resistor circuit connected in series to the fused fuse F) is electrically isolated from the device c5 to control the overall resistance value of the chip resistor c1.

Figure 71:
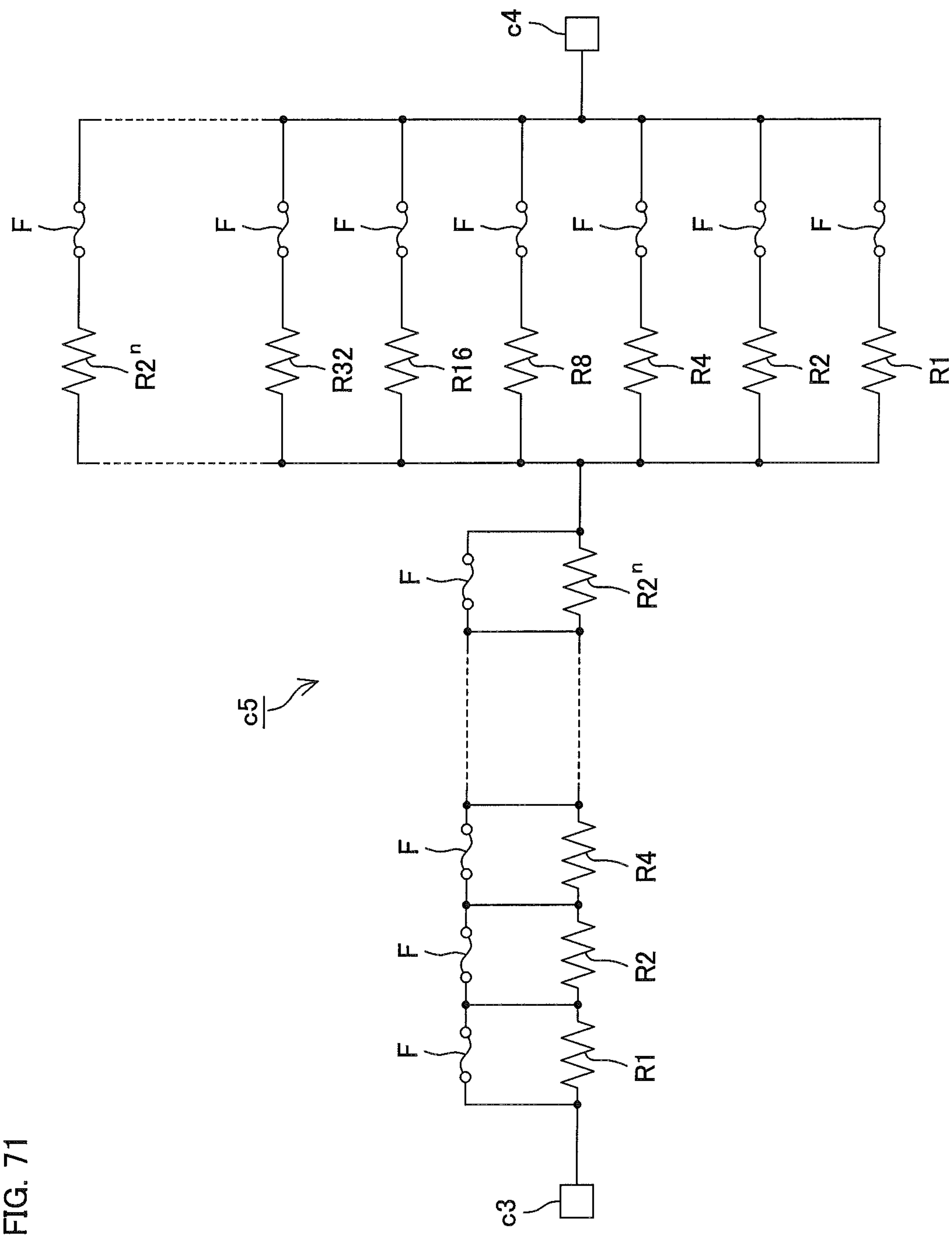
FIG. 71 is an electric circuit diagram of a device according to further another example of the third reference embodiment.

FIG. 71 is an electric circuit diagram of a device according to further another example of the third reference embodiment. The device c5 shown in FIG. 71 has a characteristic circuit configuration such that a serial connection circuit including plural types of resistor circuits is connected in series to a parallel connection circuit including plural types of resistor circuits. As in the previous example, a fuse F is connected in parallel to each of the plural types of resistor circuits connected in series, and all the plural types of resistor circuits connected in series are short-circuited by the fuses F. With a fuse F fused off, therefore, a resistor circuit which has been short-circuited by that fuse F is electrically incorporated in the device c5.

On the other hand, a fuse F is connected in series to each of the plural types of resistor circuits connected in parallel. With a fuse F fused off, therefore, a resistor circuit which has been connected in series to that fuse F is electrically isolated from the parallel connection circuit of the resistor circuits. With this arrangement, a resistance of smaller than 1 kΩ may be formed in the parallel connection circuit, and a resistor circuit of 1 kΩ or greater may be formed in the serial connection circuit. Thus, a resistor circuit having a resistance value extensively ranging from a smaller resistance value on the order of several ohms to a greater resistance value on the order of several megaohms can be produced from resistor circuit networks designed based on the same basic design concept. That is, the chip resistor c1 can be easily and speedily customized to have any of plural resistance values by selectively disconnecting one or more of the fuses F. In other words, the chip resistor c1 can be customized based on the same design concept so as to have various resistance values by selectively combining the resistor bodies R having different resistance values.

Figure 72:
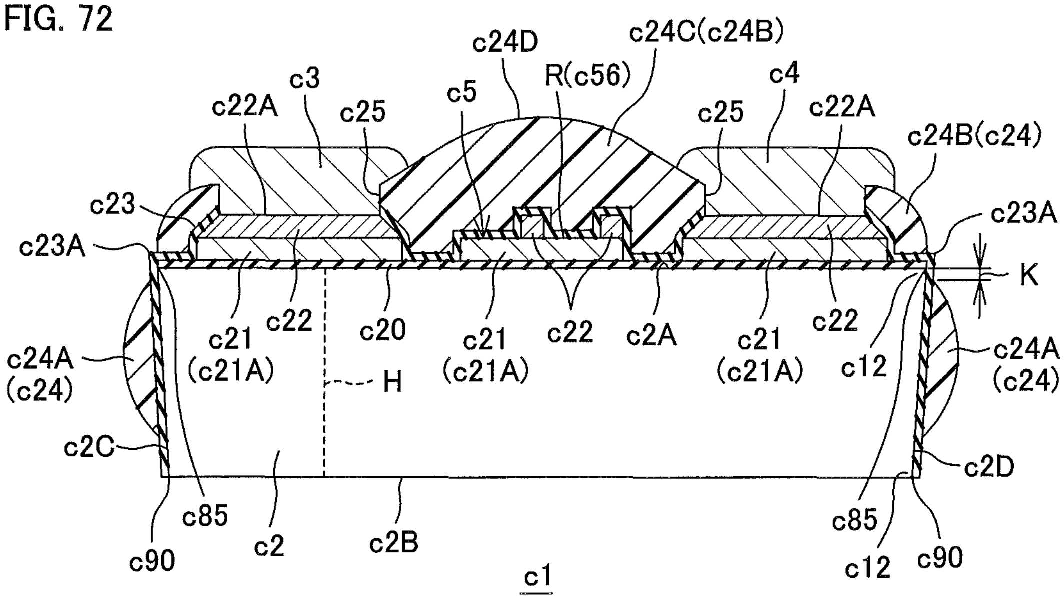
FIG. 72 is a schematic sectional view of the chip resistor.

In the chip resistor c1, as described above, the connection of the plurality of resistor bodies R (resistor circuits) can be changed in the trimming region X. FIG. 72 is a schematic sectional view of the chip resistor. Referring next to FIG. 72, the chip resistor c1 will be described in greater detail. In FIG. 72, the device c5 described above is simplified, and components other than the board c2 are hatched for convenience of description.

The insulative film c23 and the resin film c24 will be described. The insulative film c23 is made of, for example, SiN (silicon nitride), and has a thickness of 1000 Å to 5000 Å (here, about 3000 Å). The insulative film c23 is provided over the front surface c2A and the side surfaces c2C to c2F. A portion of the insulative film c23 present on the front surface c2A covers the resistive film c21 and the interconnection film portions c22 present on the resistive film c21 (i.e., the device c5) from the front side (from the upper side in FIG. 72), thereby covering the upper surfaces of the resistor bodies R of the device c5. Thus, the insulative film portion c23 also covers the interconnection film portion c22 in the trimming region X described above (see FIG. 68(*b*)). Further, the insulative film portion c23 contacts the device c5 (the interconnection film c22 and the resistive film c21), and also contacts the insulative layer c20 in a region not formed with the resistive film c21. Thus, the insulative film portion c23 present on the front surface c2A covers the entire front surface c2A to function as a protective film for protecting the device c5 and the insulative layer c20. On the front surface c2A, the insulative film portion c23 prevents an unintended short circuit which may be a short circuit other than that occurring between the interconnection film portions c22 present between the resistor bodies R (an unintended short circuit which may occur between adjacent resistive film lines c21A).

On the other hand, portions of the insulative film c23 present on the respective side surfaces c2C to c2F function as protective layers which respectively protect the side surfaces c2C to c2F. The edge portion c85 described above is present on the boundaries between the front surface c2A and the side surfaces c2C to c2F, and the insulative film c23 also covers the boundaries (the edge portion c85). A portion of the insulative film c23 covering the edge portion c85 (overlying the edge portion c85) is herein referred to as an edge portion c23A.

Together with the insulative film c23, the resin film c24 protects the front surface c2A of the chip resistor c1. The resin film c24 is made of a resin such as a polyimide. The resin film c24 has a thickness of about 5 μm. As described above, the resin film c24 includes the first resin film c24A and the second resin film c24B. The first resin film c24A covers the portions of the side surfaces c2C to c2F located slightly apart from the edge portion c85 (the edge portion c23A of the insulative film c23) toward the back surface c2B. More specifically, the first resin film c24A is provided on regions of the side surfaces c2C to c2F spaced a distance K from the edge portion c85 of the front surface c2A toward the back surface c2B. However, the first resin film c24A is located closer to the front surface c2A than to the back surface c2B. Portions of the first resin film c24A on the side surfaces c2C, c2D each linearly extend alongside the entire shorter edge c82 (see FIG. 64(*a*)). Portions of the first resin film c24A on the side surfaces c2E, c2F each linearly extend alongside the entire longer edge c81 (see FIG. 64(*a*)). The first resin film c24A on the side surfaces c2C to c2F protrudes outward of the edges (the edge portion c85) of the front surface c2A. More specifically, the first resin film c24A is arcuately bulged outward of the edge portion c85 in directions parallel to the front surface c2A. Therefore, the first resin film c24A defines the contour of the chip resistor c1 as seen in plan.

The second resin film c24B generally entirely covers the surface of the insulative film c23 on the front surface c2A (including the resistive film c21 and the interconnection film c22 covered with the insulative film c23). More specifically, the second resin film c24B is offset from the edge portion c23A of the insulative film c23 (the edge portion c85 of the front surface c2A) so as not to cover the edge portion c23A. Therefore, the first resin film c24A and the second resin film c24B are not continuous to each other, but discontinuous along the edge portion c23A (on the entire edge portion c85). Thus, the edge portion c23A of the insulative film c23 (on the entire edge portion c85) is exposed to the outside.

The second resin film c24B has two openings c25 respectively formed at two positions spaced from each other as seen in plan. The openings c25 are through-holes extending continuously thicknesswise through the second resin film c24B and the insulative film c23. Therefore, not only the second resin film c24B but also the insulative film c23 has the openings c25. The interconnection film portions c22 are partly exposed from the respective openings c25. The parts of the interconnection film portions c22 exposed from the respective openings c25 serve as pad regions c22A for the external connection.

One of the two openings c25 is completely filled with the first connection electrode c3, and the other opening c25 is completely filled with the second connection electrode c4. The first connection electrode c3 and the second connection electrode c4 partly protrude from the respective openings c25 above the surface of the second resin film c24B. The first connection electrode c3 is electrically connected to the pad region c22A of the interconnection film portion c22 present in the one opening c25 through the one opening c25. The second connection electrode c4 is electrically connected to the pad region c22A of the interconnection film portion c22 present in the other opening c25 through the other opening c25. Thus, the first connection electrode c3 and the second connection electrode c4 are electrically connected to the device c5. Here, the interconnection film portions c22 serve as interconnections connected to the assembly of the resistor bodies R (resistor portion c56), the first connection electrode c3 and the second connection electrode c4.

Thus, the second resin film c24B and the insulative film c23 formed with the openings c25 cover the front surface c2A with the first connection electrode c3 and the second connection electrode c4 being exposed from the respective openings c25. Therefore, the electrical connection between the chip resistor c1 and the mount board c9 is achieved through the first connection electrode c3 and the second connection electrode c4 partly protruding from the surface of the second resin film c24B through the openings c25 (see FIG. 64(*b*)).

Here, a portion of the second resin film c24B present between the first connection electrode c3 and the second connection electrode c4 (hereinafter referred to as "middle portion c24C") is raised to a level higher than the first connection electrode c3 and the second connection electrode c4 (away from the front surface c2A). That is, the middle portion c24C has a surface c24D raised to the level higher than the first connection electrode c3 and the second connection electrode c4. The surface c24D is convexly curved away from the front surface c2A.

Figure 73A:
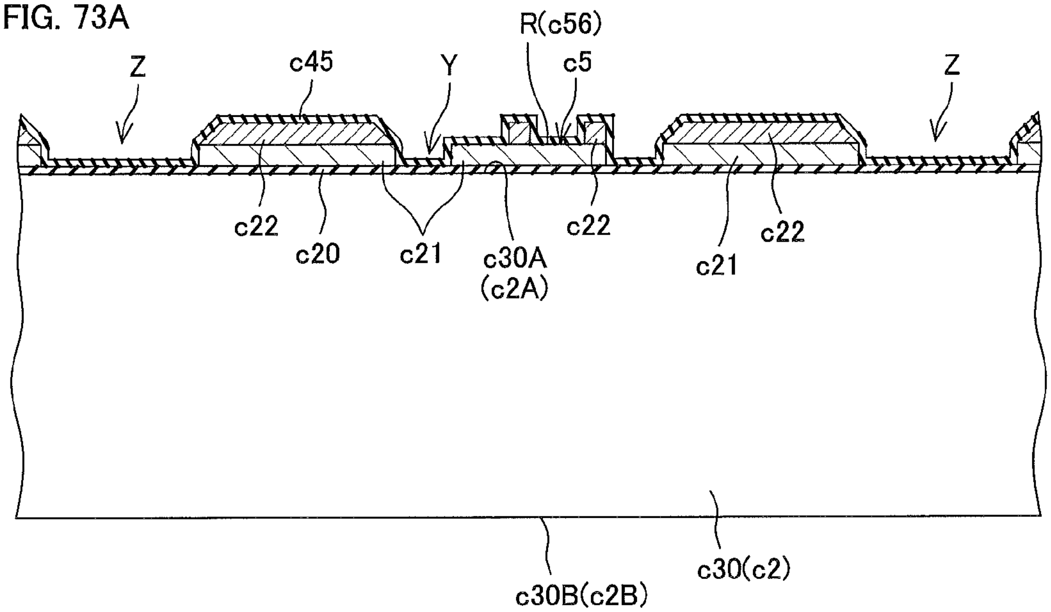
FIG. 73A is a schematic sectional view showing a production method for the chip resistor shown in FIG. 72.

FIGS. 73A to 73G are schematic sectional views showing a production method for the chip resistor shown in FIG. 72. First, as shown in FIG. 73A, a substrate c30 is prepared as a material for the board c2. In this case, a front surface c30A of the substrate c30 corresponds to the front surface c2A of the board c2, and a back surface c30B of the substrate c30 corresponds to the back surface c2B of the board c2.

Then, an insulative layer c20 of $SiO_2$ or the like is formed in the front surface c30A of the substrate c30 by thermally oxidizing the front surface c30A of the substrate c30, and devices c5 (each including resistor bodies R and interconnection film portions c22 connected to the resistor bodies R) are formed on the insulative layer c20. More specifically, a resistive film c21 of TiN, TiON or TiSiON is formed on the entire surface of the insulative layer c20 by sputtering, and then an interconnection film c22 of aluminum (Al) is formed on the resistive film c21 in contact with the resistive film c21. Thereafter, parts of the resistive film c21 and the interconnection film c22 are selectively removed for patterning by a photolithography process and dry etching such as RIE (Reactive Ion Etching). Thus, as shown in FIG. 66A, resistive film lines c21A each formed with the resistive film c21 and having a predetermined width are arranged at a predetermined interval in a column direction as seen in plan. At this time, the resistive film lines c21A and the interconnection film portions c22 are partly cut, and fuses F and conductor films D are formed in trimming regions X described above (see FIG. 65). In turn, parts of the interconnection film portions c22 formed on the respective resistive film lines c21A are selectively removed, for example, by wet etching. As a result, the devices c5 are produced, which are each configured such that interconnection film portions c22 spaced a predetermined distance R from one another are provided on the resistive film lines c21A. At this time, the overall resistance value of each of the devices c5 may be measured in order to check if the resistive film c21 and the interconnection film c22 are formed as each having intended dimensions.

Referring to FIG. 73A, a multiplicity of such devices c5 are formed on the front surface c30A of the substrate c30 according to the number of the chip resistors c1 to be formed on the single substrate c30. Regions of the substrate c30 respectively formed with the devices c5 (the aforementioned resistor portions c56) are each herein referred to as a chip component region Y (or a chip resistor region Y). Therefore, a plurality of chip component regions Y (i.e., the devices c5) each having the resistor portion c56 are formed (defined) on the front surface c30A of the substrate c30. The chip component regions Y each correspond to a single complete chip resistor c1 (see FIG. 72) as seen in plan. A region of the front surface c30A of the substrate c30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate c30. This allows for mass production of the chip resistors c1.

Then, as shown in FIG. 73A, an insulative film c45 of SiN is formed over the entire front surface c30A of the substrate c30 by a CVD (Chemical Vapor Deposition) method. The insulative film c45 entirely covers the insulative layer c20 and the devices c5 (the resistive film c21 and the interconnection film c22) present on the insulative layer c20, and contacts the insulative layer c20 and the devices c5. Therefore, the insulative film c45 also covers the interconnection film portions c22 in the aforementioned trimming regions X (see FIG. 65). Since the insulative film c45 is formed over the entire front surface c30A of the substrate c30, the insulative film c45 extends to a region other than the trimming regions X on the front surface c30A. Thus, the insulative film c45 serves as a protective film for protecting the entire front surface c30A (including the devices c5 on the front surface c30A).

Figure 73B:
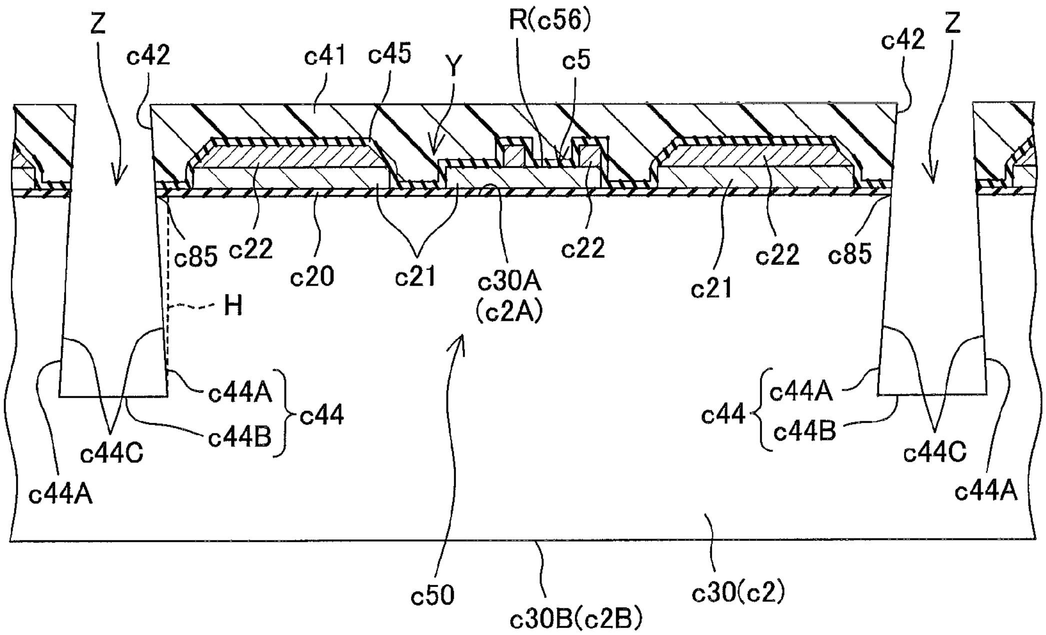
FIG. 73B is a schematic sectional view showing a process step subsequent to that shown in FIG. 73A.
Figure 74:
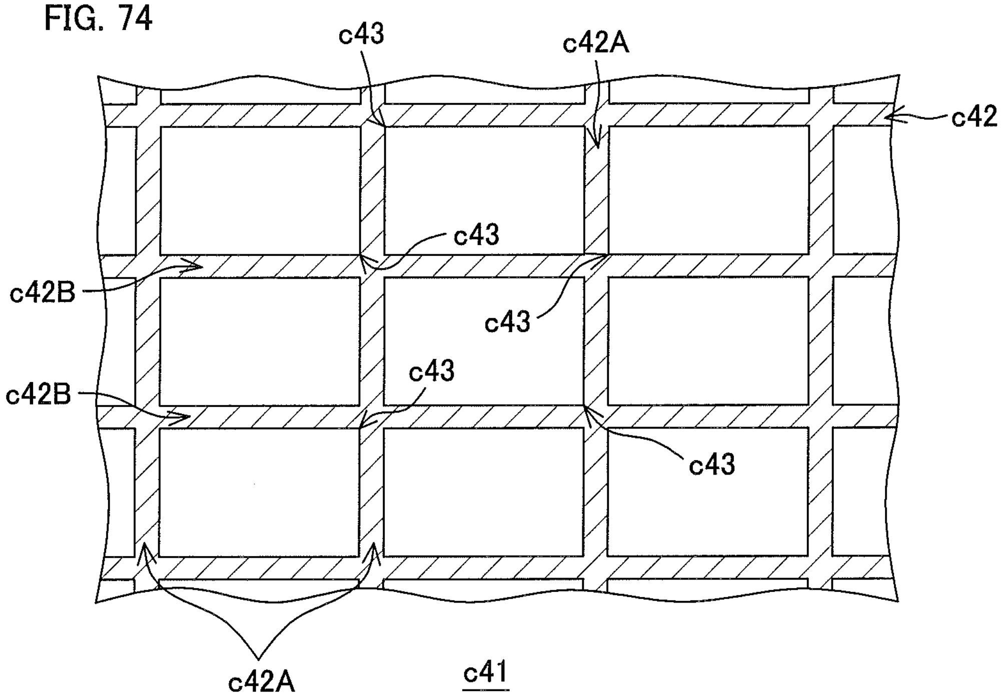
FIG. 74 is a schematic plan view showing a part of a resist pattern to be used for forming a trench in the step of FIG. 73B.

In turn, as shown in FIG. 73B, a resist pattern c41 is formed over the entire front surface c30A of the substrate c30 to entirely cover the insulative film c45. The resist pattern c41 has an opening c42. FIG. 74 is a schematic plan view showing a part of the resist pattern to be used for forming a trench in the process step of FIG. 73B.

Referring to FIG. 74, the opening c42 (hatched in FIG. 74) of the resist pattern c41 is aligned with (or corresponds to) a region (i.e., the boundary region Z) between the contours of adjacent chip resistors c1 (i.e., the chip component regions Y described above) as seen in plan when the chip resistors c1 are arranged in a matrix array (or in a lattice form). As a whole, the opening c42 has a lattice shape including linear portions c42A and linear portions c42B orthogonally crossing each other.

The linear portions c42A and the linear portions c42B of the opening c42 of the resist pattern c41 are connected to each other as crossing orthogonally to each other (without any curvature). Therefore, the linear portions c42A and the linear portions c42B interest each other at an angle of about 90 degrees as seen in plan to form angled intersection portions c43. Referring to FIG. 73B, parts of the insulative film c45, the insulative layer c20 and the substrate c30 are selectively removed by plasma etching with the use of the resist pattern c41 as a mask. Thus, a portion of the substrate c30 is removed from the boundary region Z defined between the adjacent devices c5 (chip component regions Y). As a result, a trench c44 is formed in the position (boundary region Z) corresponding to the opening c42 of the resist pattern c41 as seen in plan as extending through the insulative film c45 and the insulative layer c20 into the substrate c30 to a depth halfway the thickness of the substrate c30 from the front surface c30A of the substrate c30. The trench c44 is defined by pairs of side walls c44A opposed to each other, and a bottom wall c44B extending between lower edges of the paired side walls c44A (edges of the paired side walls c44A on the side of the back surface c30B of the substrate c30). The trench c44 has a depth of about 100 μm as measured from the front surface c30A of the substrate c30, and a width of about 20 μm (as measured between the opposed side walls c44A). However, the width of the trench c44 increases toward the bottom wall c44B. Therefore, side surfaces (wall surfaces c44C) of the respective side walls c44A defining the trench c44 are tilted with respect to a plane H perpendicular to the front surface c30A of the substrate c30.

The trench c44 of the substrate c30 has a lattice shape as a whole corresponding to the shape of the opening c42 (see FIG. 74) of the resist pattern c41 as seen in plan. On the front surface c30A of the substrate c30, rectangular frame-like portions of the trench c44 (the boundary region Z) respectively surround the chip component regions Y in which the devices c5 are respectively provided. Portions of the substrate c30 respectively formed with the devices c5 are semi-finished products c50 of the chip resistors c1. The semi-finished products c50 are respectively located in the chip component regions Y surrounded by the trench c44 on the front surface c30A of the substrate c30. These semi-finished products c50 are arranged in a matrix array. By thus forming the trench c44, the substrate c30 is divided into a plurality of boards c2 (resistor main bodies described above) respectively defined by the chip component regions Y.

Figure 73C:
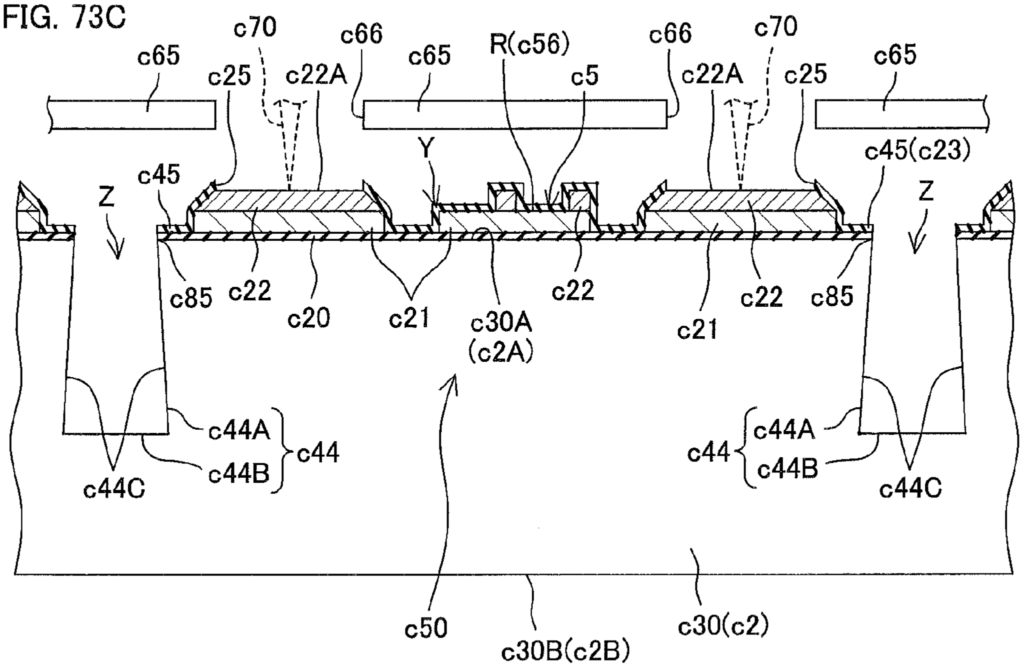
FIG. 73C is a schematic sectional view showing a process step subsequent to that shown in FIG. 73B.

After the trench c44 is formed as shown in FIG. 73B, the resist pattern c41 is removed, and the insulative film c45 is selectively etched off with the use of a mask c65 as shown in FIG. 73C. The mask c65 has openings c66 formed in association with portions of the insulative film c45 aligned with the pad regions c22A (see FIG. 72) as seen in plan. Thus, the portions of the insulative film c45 aligned with the openings c66 are etched off, whereby openings c25 are formed in these portions of the insulative film c45. Thus, the pad regions c22A are exposed from the insulative film c45 in the openings c25. The semi-finished products c50 each have two openings c25.

After the two openings c25 are formed in the insulative film c45 of each of the semi-finished products c50, probes c70 of a resistance measuring device (not shown) are brought into contact with the pad regions c22A in the respective openings c25 to detect the overall resistance value of the device c5. Subsequently, a laser beam (not shown) is applied to desired ones of the fuses F (see FIG. 65) through the insulative film c45, whereby the desired fuses F of the interconnection film portion c22 in the trimming region X described above are trimmed by the laser beam to be fused off. Thus, the overall resistance value of the semi-finished product c50 (i.e., the chip resistor c1) can be controlled, as described above, by selectively fusing off (trimming) the fuses F for the required resistance value. At this time, the insulative film c45 serves as a cover film for covering the devices c5, thereby preventing a short circuit which may otherwise occur when a debris occurring during the fusing adheres to any of the devices c5. Further, the insulative film c45 covers the fuses F (resistive film c21), so that the desired fuses F can be reliably fused off by accumulating the energy of the laser beam therein.

Figure 73D:
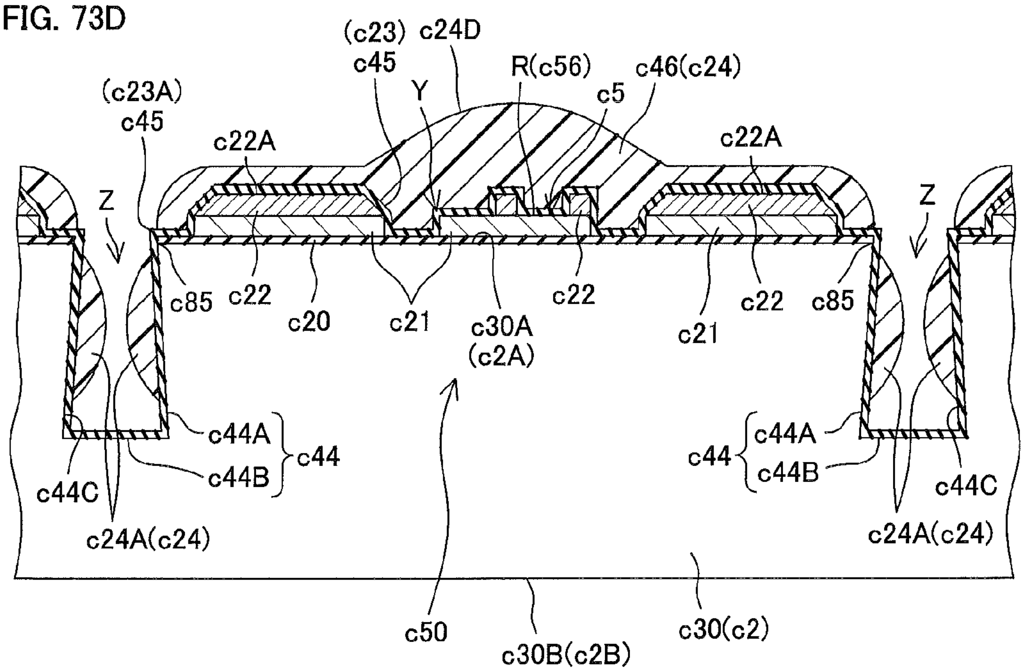
FIG. 73D is a schematic sectional view showing a process step subsequent to that shown in FIG. 73C.

Thereafter, SiN is further deposited on the insulative film c45 by the CVD method to thicken the insulative film c45. At this time, as shown in FIG. 73D, the insulative film c45 is also formed on the entire inner peripheral surface of the trench c44 (the wall surfaces c44C of the side walls c44A and an upper surface of the bottom wall c44B). The insulative film c45 finally has a thickness of 1000 Å to 5000 Å (here, about 3000 Å) (in a state shown in FIG. 73D). At this time, the insulative film c45 partly enters the openings c25 to close the openings c25.

Thereafter, a liquid photosensitive resin of a polyimide is sprayed over the resulting substrate c30 from above the insulative film c45. Thus, a photosensitive resin coating film c46 is formed as shown in FIG. 73D. The liquid photosensitive resin does not stagnate around the mouth of the trench c44 (corresponding to the edge portion c23A of the insulative film c23 and the edge portion c85 of the board c2), but flows. Therefore, the liquid photosensitive resin adheres to regions of the side walls c44A (wall surfaces c44C) of the trench c44 located apart from the front surface c30A of the substrate c30 toward the back surface c30B (toward the bottom wall c44B) and to regions of the front surface c30A located apart from the edge portion c23A of the insulative film c23 to thereby form a coating film c46 (resin film) on these regions. Portions of the coating film c46 present on the front surface c30A each have an upwardly convexly curved shape.

Portions of the coating film c46 formed on the side walls c44A of the trench c44 merely cover parts of the side walls c44A of the trench c44 on the side of the devices c5 (on the side of the front surface c30A), and do not reach the bottom wall c44B of the trench c44. Therefore, the trench c44 is not closed with the coating film c46. In turn, the coating film c46 is thermally treated (cured). Thus, the coating film c46 is thermally shrunk to a smaller thickness, and hardened to have a stable film quality.

Figure 73E:
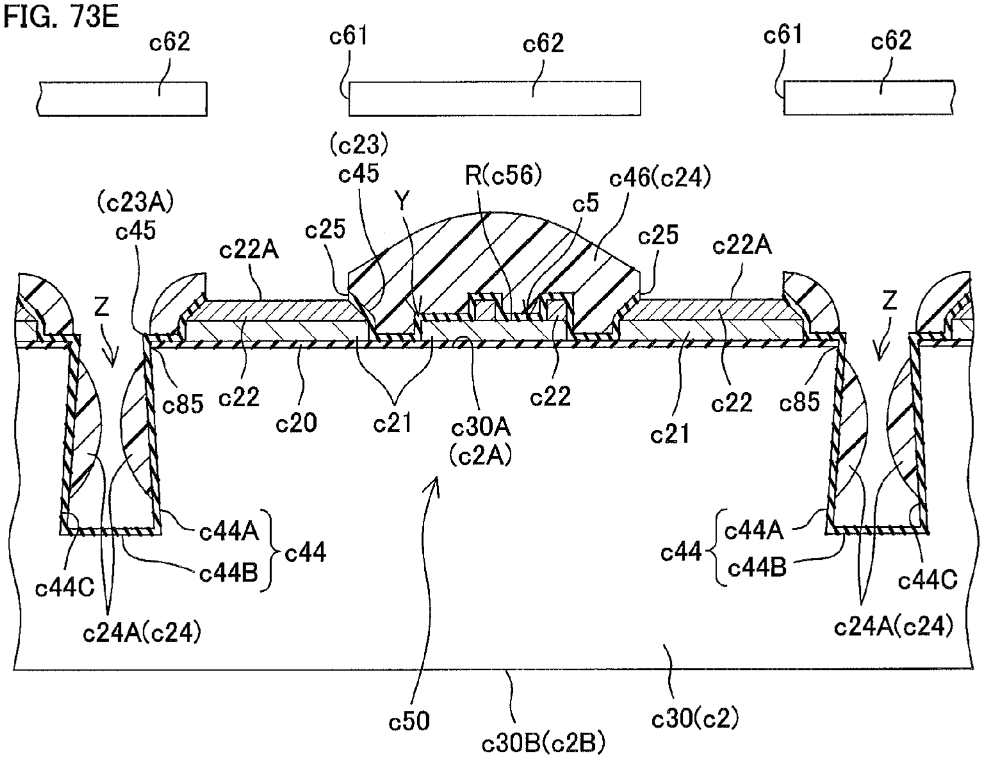
FIG. 73E is a schematic sectional view showing a process step subsequent to that shown in FIG. 73D.

In turn, as shown in FIG. 73E, parts of the coating film c46 aligned with the pad regions c22A of the interconnection film c22 (openings c25) on the front surface c30A as seen in plan are selectively removed by patterning the coating film c46. More specifically, the coating film c46 is exposed to light with the use of a mask c62 of a pattern having openings c61 aligned with (corresponding to) the pad regions c22A as seen in plan, and then developed in the pattern. Thus, the parts of the coating film c46 are removed from above the pad regions c22A. Then, parts of the insulative film c45 on the pad regions c22A are removed by RIE using a mask not shown, whereby the openings c25 are uncovered to expose the pad regions c22A.

Figure 73F:
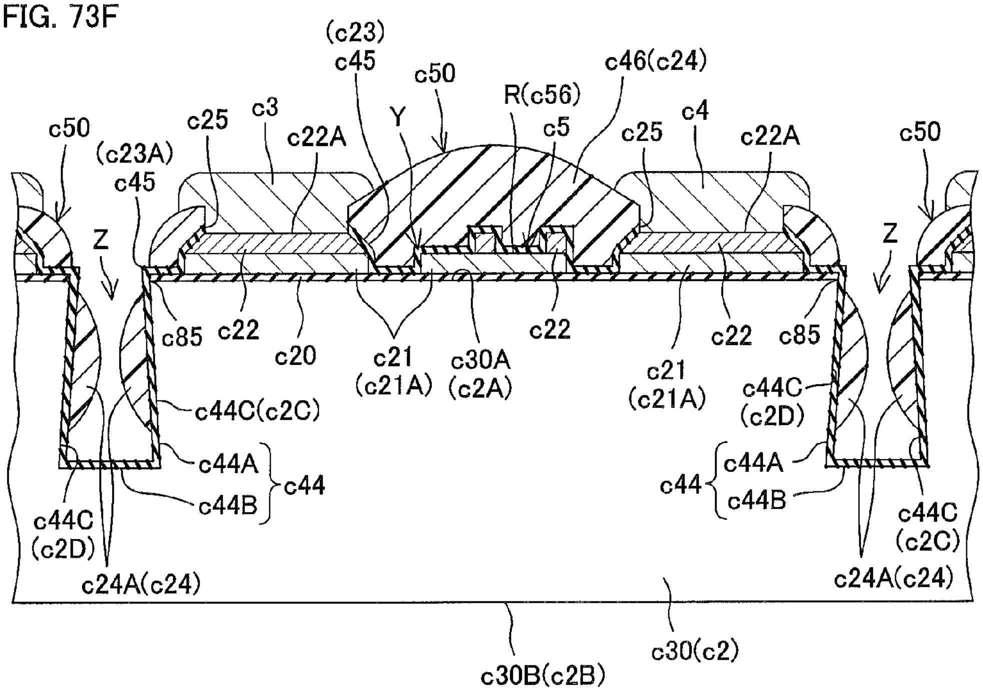
FIG. 73F is a schematic sectional view showing a process step subsequent to that shown in FIG. 73E.

In turn, Ni/Pd/Au multilayer films are formed in the openings c25 on the pad regions c22A by depositing Ni, Pd and Au by electroless plating. At this time, the Ni/Pd/Au multilayer films respectively project from the openings c25 above the surface of the coating film c46. Thus, the Ni/Pd/Au multilayer films formed in the openings c25 serve as the first and second connection electrodes c3, c4 as shown in FIG. 73F. Upper surfaces of the first and second connection electrodes c3, c4 are located at a lower level than apexes of the upwardly convexly curved portions of the coating film c46 on the front surface c30A.

Figure 73G:
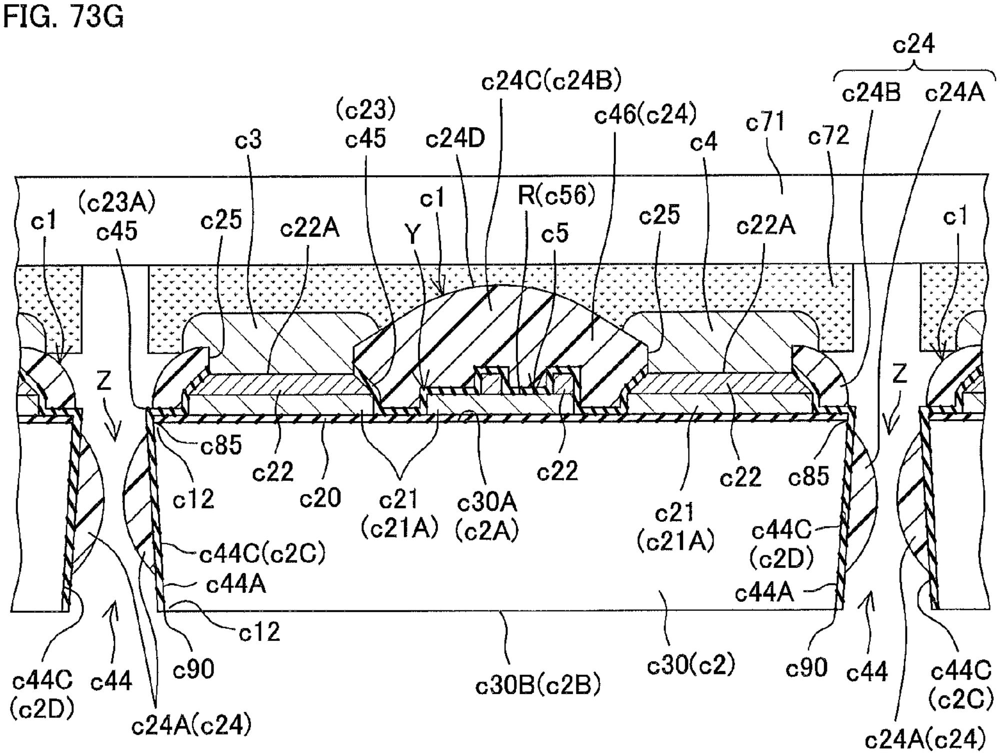
FIG. 73G is a schematic sectional view showing a process step subsequent to that shown in FIG. 73F.

After a continuity test is performed between the first connection electrode c3 and the second connection electrode c4 of each of the semi-finished products c50, the substrate c30 is ground from the back surface c30B. More specifically, as shown in FIG. 73G, a thin-plate support tape c71 of PET (polyethylene terephthalate) having an adhesive surface c72 is applied to the semi-finished products c50 with the adhesive surface c72 bonded to the first and second connection electrodes c3, c4 of the respective semi-finished products c50 (i.e., on the side of the front surface c30A) after the formation of the trench c44. Thus, the semi-finished products c50 are supported by the support tape c71. Here, a laminate tape, for example, may be used as the support tape c71.

With the semi-finished products c50 supported by the support tape c71, the substrate c30 is ground from the back surface c30B. After the substrate c30 is thinned to the bottom wall c44B of the trench c44 (see FIG. 73F) by the grinding, nothing connects the adjacent semi-finished products c50. Therefore, the substrate c30 is divided into the individual semi-finished products c50 along the trench c44. Thus, the chip resistors c1 are completed. That is, the substrate c30 is divided (split) along the trench c44 (i.e., along the boundary region Z), whereby the individual chip resistors c1 are separated from each other. Alternatively, the chip resistors c1 may be separated from each other by etching the substrate c30 from the back surface c30B to the bottom wall c44B of the trench c44.

The wall surfaces c44C of the side walls c44A of the trench c44 provide the side surfaces c2C to c2F of the boards c2 of the respective completed chip resistors c1, and the back surface c30B provides the back surfaces c2B of the respective chip resistors c1. That is, the step of forming the trench c44 by the etching as described above (see FIG. 73B) is involved in the step of forming the side surfaces c2C to c2F. In the step of forming the trench c44, the wall surfaces c44C around the chip component regions Y of the substrate c30 (the side surfaces of the respective chip resistors c1) are simultaneously formed as each having a portion tilted with respect to the plane H perpendicular to the front surface c30A of the substrate c30 (see FIG. 73B). In other words, the formation of the trench c44 is equivalent to the simultaneous formation of the side surfaces c2C to c2F of the boards c2 of the respective chip resistors c1 each having a portion tilted with respect to the plane H.

By the formation of the trench c44 by the etching, the side surfaces c2C to c2F of the completed chip resistors c1 are imparted with rough texture of an irregular pattern. Where the trench c44 is mechanically formed by means of a dicing saw (not shown), a multiplicity of streaks of a regular pattern remain on the side surfaces c2C to c2F. These streaks cannot be removed from the side surfaces c2C to c2F by the etching.

Further, the insulative film c45 provides the insulative films c23 of the respective chip resistors c1, and the divided coating film c46 provides the resin films c24 of the respective chip resistors c1. As described above, the chip resistors c1 (chip components) formed in the respective chip component regions Y defined on the substrate c30 are simultaneously separated from each other (the individual chip resistors c1 can be simultaneously provided) by forming the trench c44 in the substrate c30 and then grinding the substrate c30 from the back surface c30B. This reduces the time required for the production of the plurality of chip resistors c1, thereby improving the productivity of the chip resistors c1. Where the substrate c30 has a diameter of 8 inches, for example, about 500,000 chip resistors c1 can be produced from the single substrate c30. If only the dicing saw (not shown) was used to form the trench c44 in the substrate c30 for cutting out the chip resistors c1, it would be necessary to move the dicing saw many times to form a multiplicity of trench lines c44 in the substrate c30. Therefore, a longer period of time would be required for the production of the chip resistors c1. Where the trench c44 is formed at a time by the etching according to the third reference embodiment, in contrast, the aforementioned inconvenience can be eliminated.

Even if the chip resistors c1 each have a smaller chip size, the chip resistors c1 can be simultaneously separated from each other by first forming the trench c44 and then grinding the substrate c30 from the back surface c30B. The elimination of the dicing step reduces the costs and the production time, and improves the yield as compared with the conventional case in which the chip resistors c1 are separated from each other by dicing the substrate c30 by means of the dicing saw.

Further, the trench c44 can be formed accurately by the etching, so that the chip resistors c1 produced by dividing the substrate along the trench c44 are improved in outer dimensional accuracy. Particularly, the trench c44 can be more accurately formed by the plasma etching. More specifically, the dimensional error of the chip resistors c1 produced according to the third reference embodiment can be reduced to about ±5 μm, while the dimensional error of chip resistors c1 produced by a common method in which the dicing saw is used for the formation of the trench c44 is ±20 μm. Further, the pitch of the trench lines c44 can be reduced according to the resist pattern c41 (see FIG. 74), allowing for size reduction of the chip resistors c1 formed between adjacent trench lines c44. In addition, the chipping of corner portions c11 of the chip resistors c1 defined between the side surfaces c2C to c2F (see FIG. 64(*a*)) is less liable to occur, because the etching does not involve the cutting-out of the chip resistors c1 which may otherwise be involved when the dicing saw is used. This improves the appearance of the chip resistors c1.

When the substrate c30 is ground from the back surface c30B, the chip resistors c1 are separated from each other in a time staggered manner. That is, the chip resistors c1 are separated from each other with slight time differences. In this case, a chip resistor c1 separated earlier is liable to laterally vibrate to be brought into contact with adjacent chip resistors c1. At this time, the resin films c24 (first resin films c24A) of the respective chip resistors c1 each function as a bumper. Therefore, even if adjacent ones of the chip resistors c1 supported by the support tape c71 before separation thereof bump against each other, the resin films c24 of the respective chip resistors c1 are first brought into contact with each other. This prevents or suppresses the chipping of corner portions c12 of the front surface c2A and the back surface c2B (particularly, the edge portion c85 of the front surface c2A) of each of the chip resistors c1. Particularly, the first resin film c24A projects outward of the edge portion c85 of the front surface c2A of the chip resistor c1, preventing the edge portion c85 from being brought into contact with the surroundings. This prevents or suppresses the chipping of the edge portion c85.

Figure 75A:
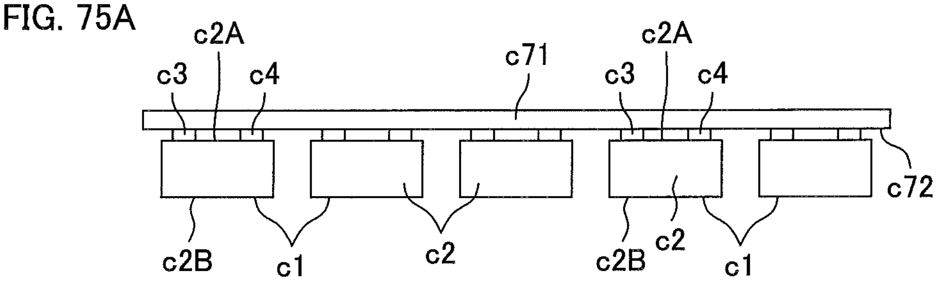
FIG. 75A is a schematic sectional view showing chip resistors after the step of FIG. 73G.
Figure 75B:
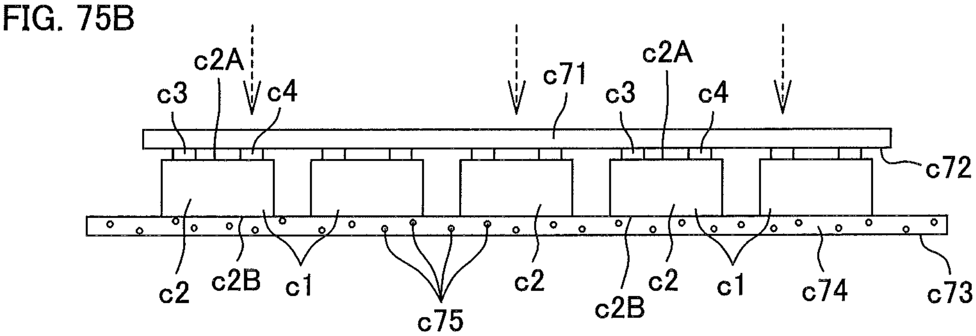

The back surface c2B of the board c2 of the completed chip resistor c1 may be polished or etched to be mirror-finished. FIGS. 75A to 75D are schematic sectional views showing a chip resistor collecting step to be performed after the process step of FIG. 73G. In FIG. 75A, the chip resistors c1 separated from each other still adhere to the support tape c71. In this state, as shown in FIG. 75B, a heat-foamable sheet c73 is bonded to the back surfaces c2B of the boards c2 of the respective chip resistors c1. The heat-foamable sheet c73 includes a sheet body c74 in a sheet form and a multiplicity of foamable particles c75 dispersed in the sheet body c74 by kneading.

Figure 75C:
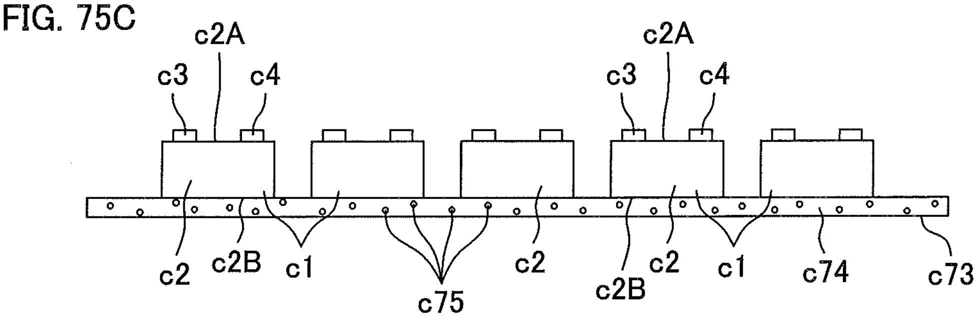

The sheet body c74 has a greater adhesive force than the adhesive surface c72 of the support tape c71. Therefore, the heat-foamable sheet c73 is bonded to the back surfaces c2B of the boards c2 of the respective chip resistors c1, and then the support tape c71 is removed from the chip resistors c1 as shown in FIG. 75C. Thus, the chip resistors c1 are transferred to the heat-foamable sheet c73. At this time, the support tape c71 is irradiated with ultraviolet radiation (as indicated by broken line arrows in FIG. 75B), whereby the adhesive force of the adhesive surface c72 is reduced. This makes it easier to remove the support tape c71 from the chip resistors c1.

Figure 75D:
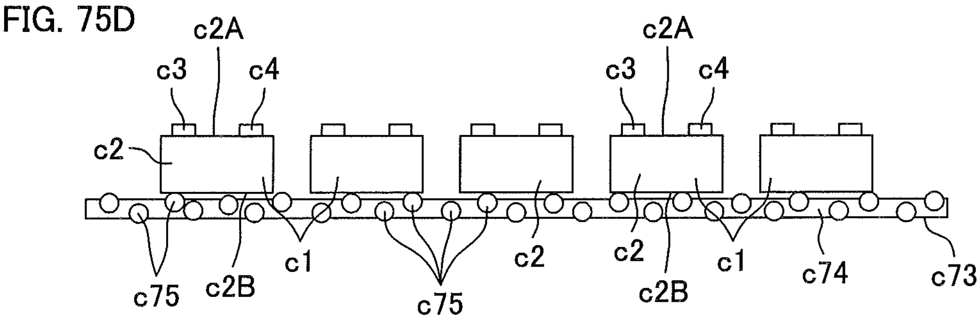

Then, the heat-foamable sheet c73 is heated. Thus, as shown in FIG. 75D, the foamable particles c75 dispersed in the sheet body c74 are foamed in the heat-foamable sheet c73, whereby the foamable particles c75 are bulged from a surface of the sheet body c74. As a result, the heat-foamable sheet c73 contacts the back surfaces c2B of the boards c2 of the respective chip resistors c1 with a smaller contact area, so that all the chip resistors c1 are naturally removed (fall out) from the heat-foamable sheet c73. The chip resistors c1 collected in this manner are each mounted on a mount board c9 (see FIG. 64(*b*)), or respectively accommodated in accommodation spaces formed in an embossed carrier tape (not shown). In this case, the process time can be reduced as compared with a case in which the chip resistors c1 are removed one by one from the support tape c71 or the heat-foamable sheet c73. Of course, a predetermined number of chip resistors c1 out of the chip resistors c1 bonded to the support tape c71 (see FIG. 75A) may be removed at a time directly from the support tape c71 without the use of the heat-foamable sheet c73.

Figure 76A:
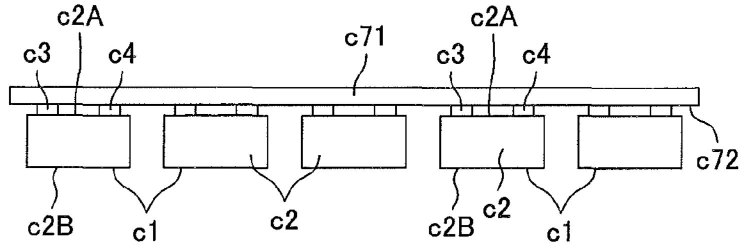
Figure 76B:
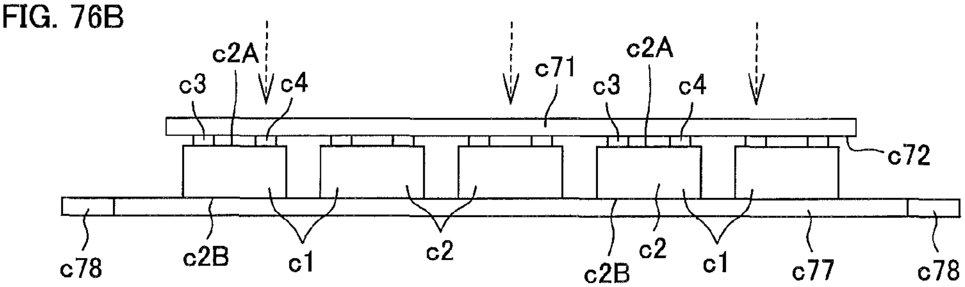
Figure 76C:
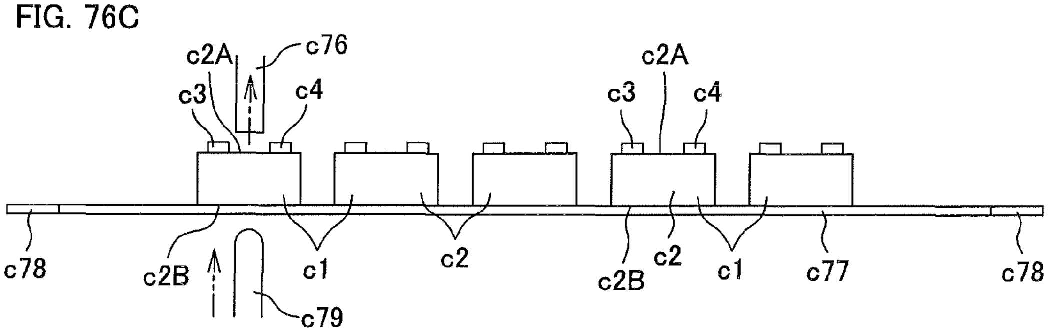

FIGS. 76A to 76C are schematic sectional views showing a modification of the chip resistor collecting step to be performed after the process step of FIG. 76G. The chip resistors c1 may be collected by another method shown in FIGS. 76A to 76C. In FIG. 76A, the chip resistors c1 separated from each other still adhere to the support tape c71 as in FIG. 75A. In this state, as shown in FIG. 76B, a transfer tape c77 is bonded to the back surfaces c2B of the boards c2 of the respective chip resistors c1. The transfer tape c77 has a greater adhesive force than the adhesive surface c72 of the support tape c71. After the transfer tape c77 is bonded to the chip resistors c1, the support tape c71 is removed from the chip resistors c1 as shown in FIG. 76C. At this time, the support tape c71 may be irradiated with ultraviolet radiation (as indicated by broken line arrows in FIG. 76B) for reduction of the adhesiveness of the adhesive surface c72 as described above.

Frames c78 of a collecting device (not shown) are respectively bonded to opposite ends of the transfer tape c77. The frames c78 on the opposite sides are movable toward and away from each other. After the support tape c71 is removed from the chip resistors c1, the opposite-side frames c78 are moved away from each other, whereby the transfer tape c77 is stretched to be thinned. This reduces the adhesive force of the transfer tape c77, making it easier to remove the chip resistors c1 from the transfer tape c77. In this state, a suction nozzle c76 of a transport device (not shown) is moved toward the front surface c2A of one of the chip resistors c1, whereby the chip resistor c1 is removed from the transfer tape c77 by a suction force generated by the transport device (not shown) and sucked by the suction nozzle c76. At this time, the chip resistor c1 may be pushed up toward the suction nozzle c76 from a side opposite from the suction nozzle c76 with the intervention of the transfer tape c77. Thus, the chip resistor c1 can be smoothly removed from the transfer tape c77. The chip resistor c1 collected in this manner is transported by the transport device (not shown) while being sucked by the suction nozzle c76.

Figure 77:
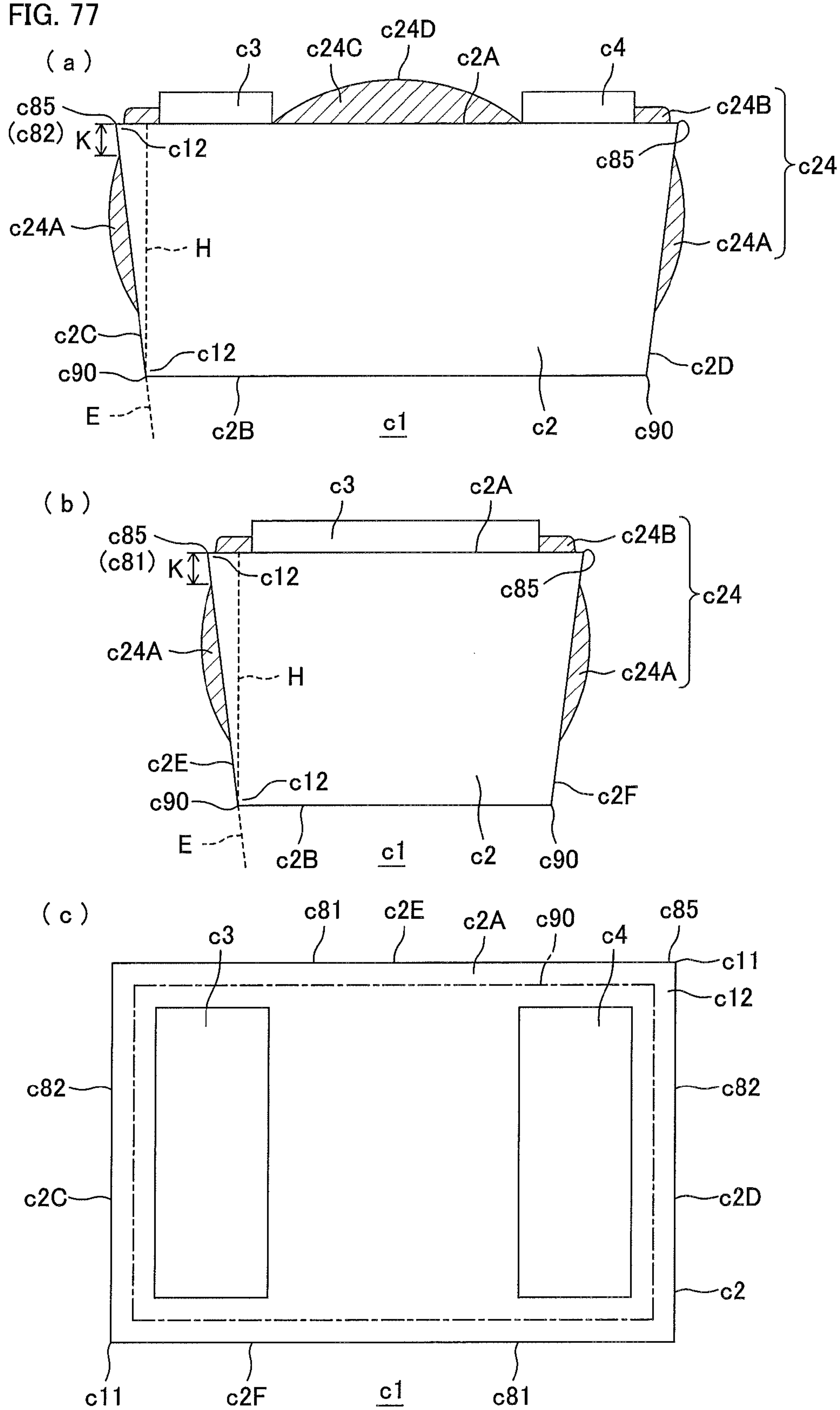
Figure 78:
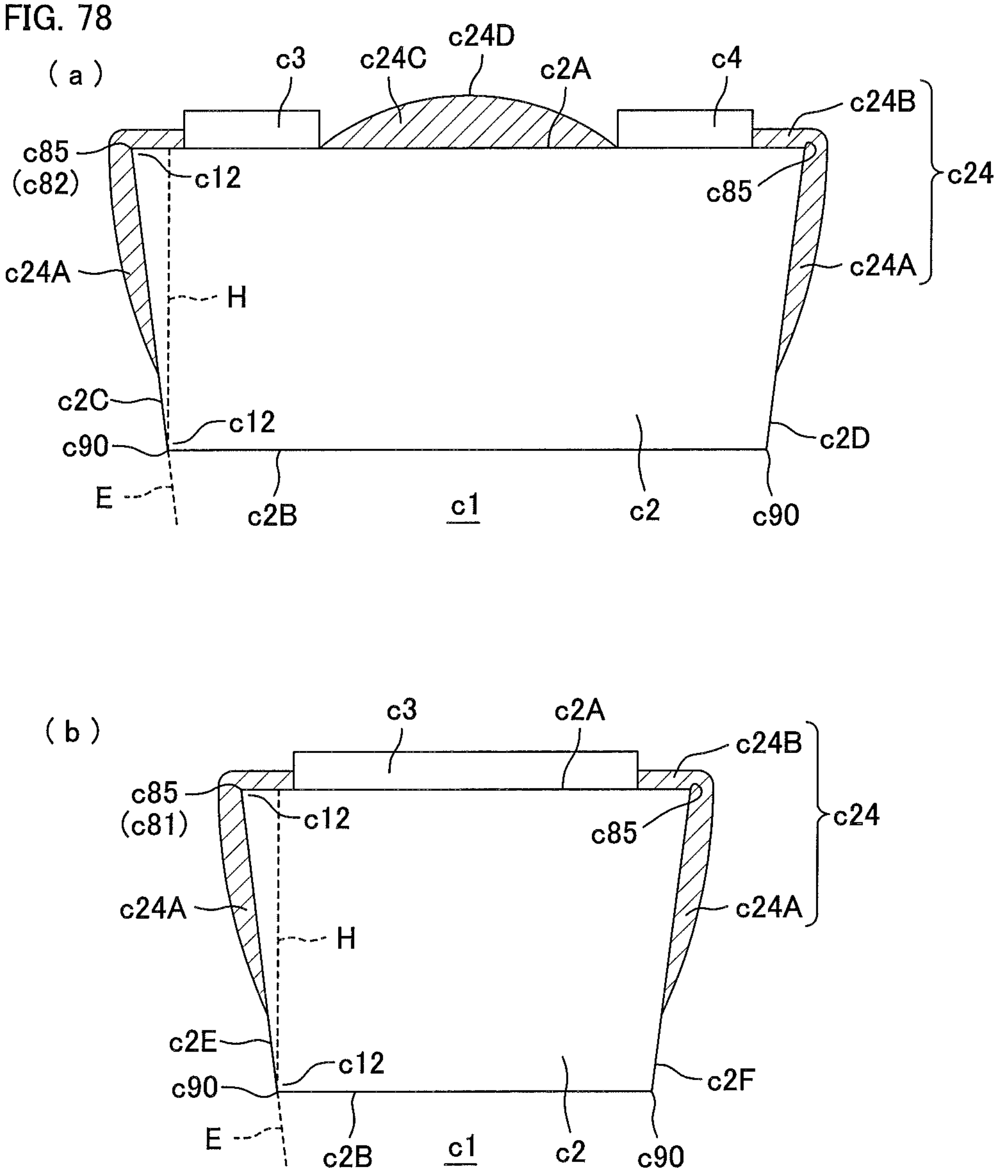
Figure 79:
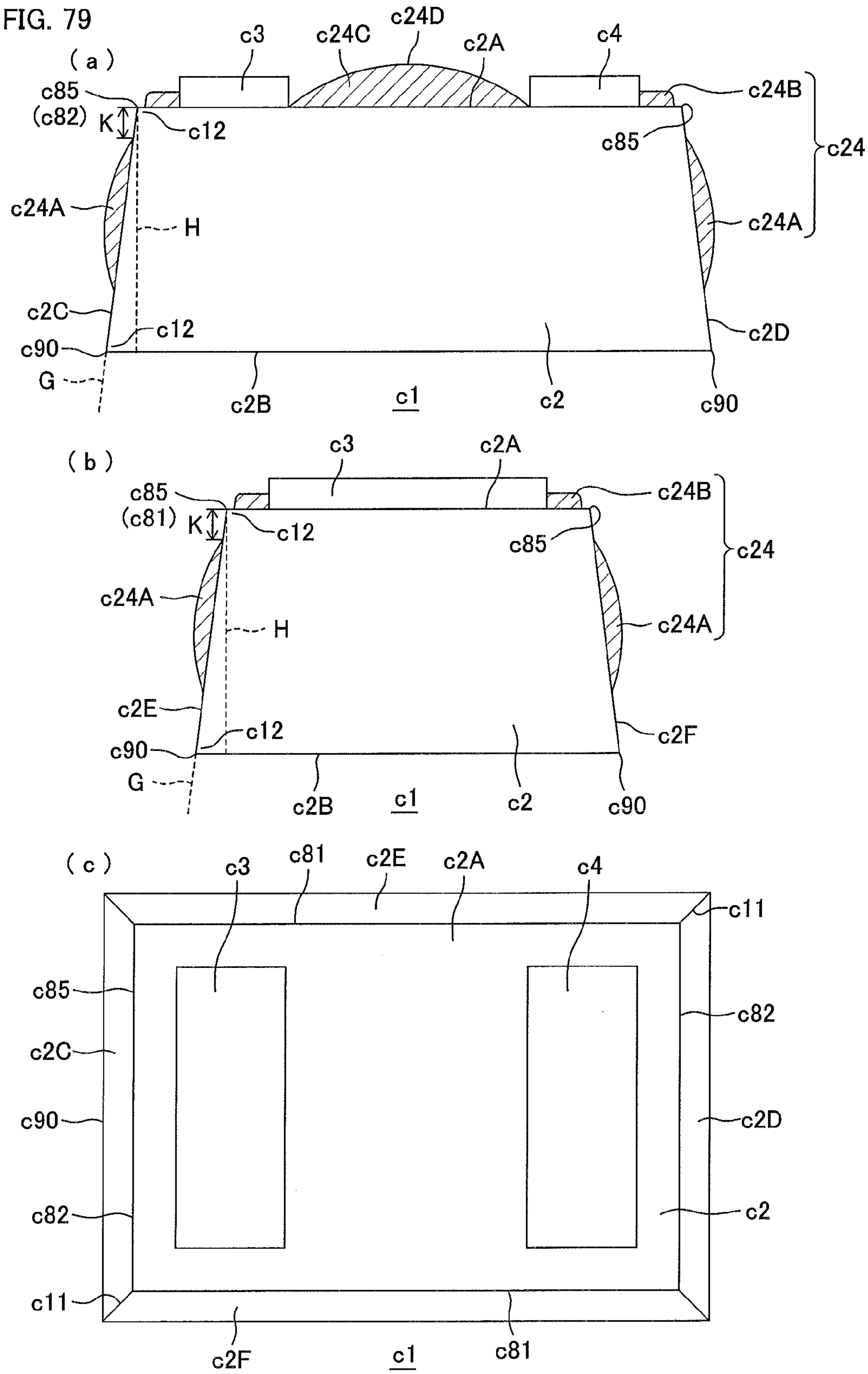

FIGS. 77 to 82 are vertical sectional views of the chip resistors according to the embodiment described above and modifications of the embodiment, and FIGS. 77 and 79 also show plan views. In FIGS. 77 to 82, the insulative film c23 and some other elements are omitted, but only the board c2, the first connection electrode c3, the second connection electrode c4 and the resin film c24 are shown for convenience of description. In FIGS. 77(*c*) and 79(*c*), the resin film c24 is not shown.

As shown in FIGS. 77 to 82, the side surfaces c2C to c2F of the board c2 each have a portion tilted with respect to the plane H perpendicular to the front surface c2A of the board c2. In each of the chip resistors c1 shown in FIGS. 77 and 78, the side surfaces c2C to c2F of the board c2 each extend along a plane E tilted with respect to the plane H described above. Further, the side surfaces c2C to c2F of the board c2 each form an acute angle with respect to the front surface c2A of the board c2. Therefore, the edge portion c90 of the back surface c2B of the board c2 is retracted with respect to the edge portion c85 of the front surface c2A of the board c2 inward of the board c2. More specifically, the rectangular edge portion c90 defining the contour of the back surface c2B is located inward of the rectangular edge portion c85 defining the contour of the front surface c2A as seen in plan (see FIG. 77(*c*)). Therefore, the planes E for the side surfaces c2C to c2F are tilted as extending from the edge portion c85 of the front surface c2A toward the edge portion c90 of the back surface c2B inward of the board c2. Thus, the side surfaces c2C to c2F of the chip resistor c1 each have a trapezoidal shape (generally isosceles trapezoidal shape) tapered toward the back surface c2B.

As described above, the first resin film c24A of the resin film c24 is provided on the portions of the side surfaces c2C to c2F located apart from the boundaries between the front surface c2A and the respective side surfaces (the edge portion c85) toward the back surface c2B, and the second resin film c24B is provided on the front surface c2A. Alternatively, as shown in FIG. 78, the first resin film c24A provided on the side surfaces c2C to c2F may be inseparable from the second resin film c24B along the boundaries between the front surface c2A and the respective side surfaces (the edge portion c85). In this case, the resin film c24 extends continuously from the side surfaces c2C to c2F to the front surface c2A.

In the chip resistor c1 shown in FIG. 79, the side surfaces c2C to c2F each extend along a plane G tilted with respect to the aforementioned plane H. The side surfaces c2C to c2F of the board c2 each form an obtuse angle with respect to the front surface c2A of the board c2. Therefore, the edge portion c90 of the back surface c2B of the board c2 projects with respect to the edge portion c85 of the front surface c2A of the board c2 outward of the board c2. More specifically, the rectangular edge portion c90 defining the contour of the back surface c2B is located outward of the rectangular edge portion c85 defining the contour of the front surface c2A as seen in plan (see FIG. 79(*c*)). Therefore, the planes G for the side surfaces c2C to c2F are tilted as extending from the edge portion c85 of the front surface c2A toward the edge portion c90 of the back surface c2B outward of the board c2. Thus, the side surfaces c2C to c2F of the chip resistor c1 each have a trapezoidal shape (generally isosceles trapezoidal shape) tapered toward the front surface c2A.

Figure 80:
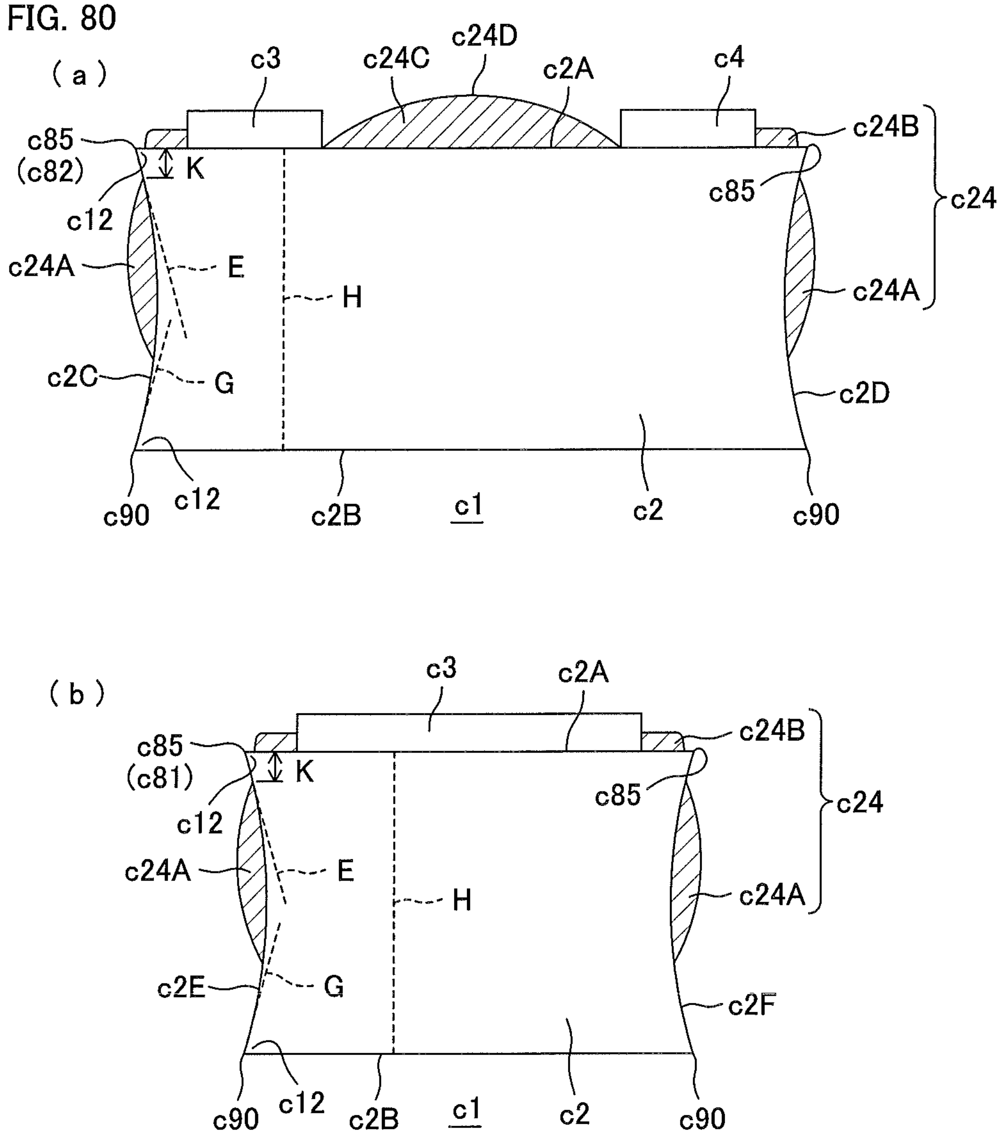
Figure 81:
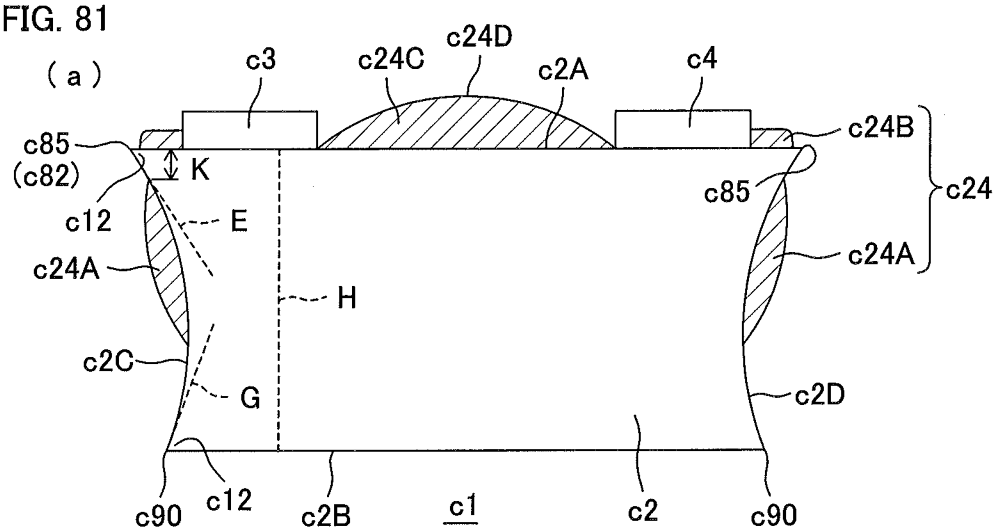
Figure 81:
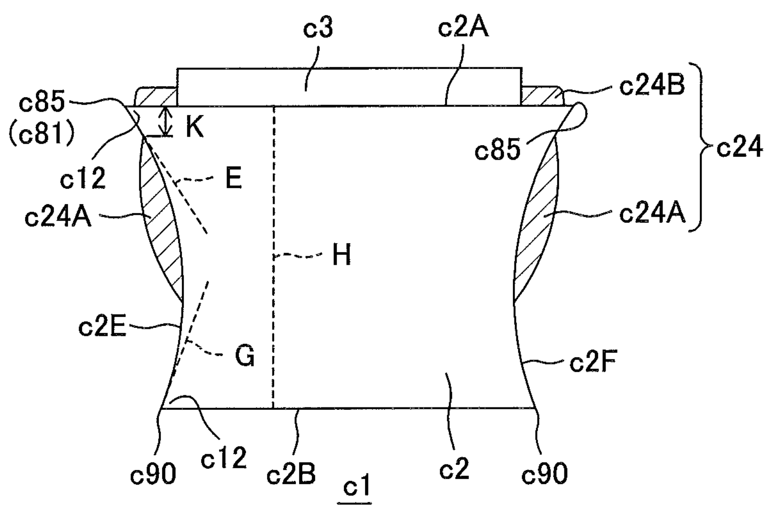
Figure 82:
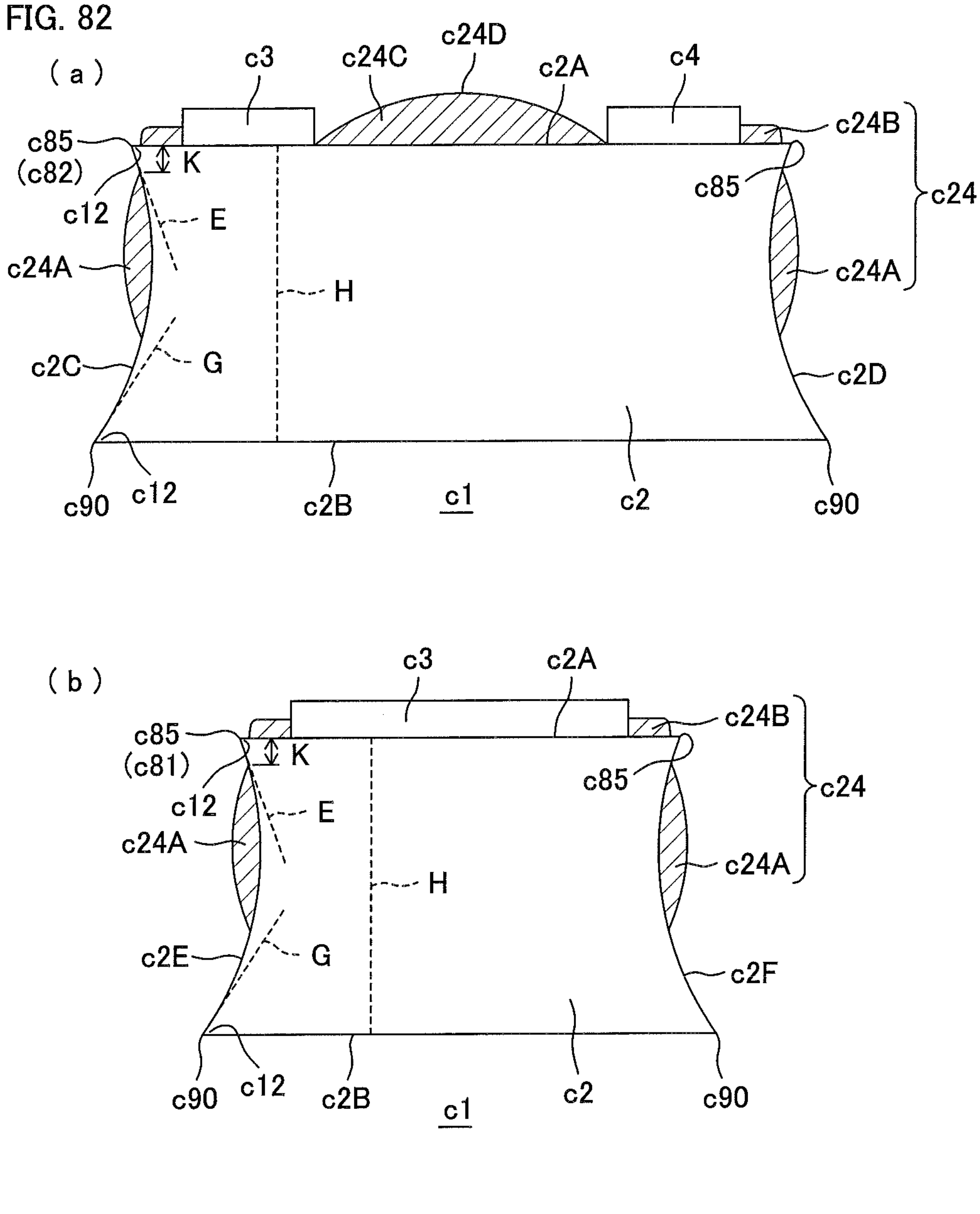

The side surfaces c2C to c2F are not necessarily each required to be a flat surface tilted with respect to the plane H as described above, but may each be a surface, as shown in FIGS. 80 to 82, which is curved concavely inward of the board c2 and has portions tilted with respect to the plane H (curved surface portions tangent to the planes E and G). In this case, the side surfaces c2C to c2F of the board c2 each form an acute angle with respect to the front surface c2A of the board c2, and each form an acute angle with respect to the back surface c2B of the board c2.

In FIG. 80, the edge portion c90 of the back surface c2B of the board c2 is not offset from the edge portion c85 of the front surface c2A of the board c2 either inward or outward of the board c2, but coincides with the edge portion c85 of the front surface c2A of the board c2 as seen in plan. In FIG. 81, the edge portion c90 of the back surface c2B of the board c2 is retracted with respect to the edge portion c85 of the front surface c2A of the board c2 inward of the board c2. In FIG. 82, the edge portion c90 of the back surface c2B of the board c2 projects with respect to the edge portion c85 of the front surface c2A of the board c2 outward of the board c2.

The side surfaces c2C to c2F shown in any of FIGS. 77 to 82 can be formed by properly controlling the etching conditions for the formation of the trench c44. That is, the shapes of the side surfaces c2C to c2F of the board c2 can be controlled by etching techniques. As described above, either one of the edge portion c85 of the front surface c2A and the edge portion c90 of the back surface c2B of the board c2 of the chip resistor c1 projects with respect to the other edge portion outward of the board c2 (the chip resistor c1 shown in FIG. 80 is excluded). Therefore, none of the corner portions c12 of the front surface c2A and the back surface c2B of the chip resistor c1 is right-angled, so that the corner portions c12 (particularly, obtuse corner portions c12) are less susceptible to the chipping.

Particularly, the back surface c2B of the board c2 of the chip resistor c1 shown in either of FIGS. 77 and 78 has obtuse corner portions c12 (in the edge portion c90), so that these corner portions c12 are less susceptible to the chipping. Further, the front surface c2A of the board c2 of the chip resistor c1 shown in FIG. 79 has obtuse corner portions c12 (in the edge portion c85), so that these corner portions c12 are less susceptible to the chipping.

When the chip resistor c1 is mounted on a mount board c9 (see FIG. 64(*b*)), a suction nozzle (not shown) of an automatic mounting machine sucks the back surface c2B of the chip resistor c1, and is moved to the mount board c9. Thus, the chip resistor c1 is mounted on the mount board c9. Prior to the suction of the chip resistor c1 by the suction nozzle (not shown), the contour of the chip resistor c1 is detected from the side of the front surface c2A or the back surface c2B through image recognition, and a portion of the back surface c2B of the chip resistor c1 to be sucked by the suction nozzle (not shown) is determined. Where either one of the edge portion c85 of the front surface c2A and the edge portion c90 of the back surface c2B of the board c2 projects with respect to the other edge portion outward of the board c2, the contour of the chip component detected from the side of the front surface c2A or the back surface c2B of the board c2 through the image recognition is clearly defined by the one edge portion c85 or c90 (the edge portion projecting outward of the board c2). Therefore, the contour of the chip resistor c1 can be accurately detected, so that the intended portion (e.g., a center portion) of the back surface c2B of the chip resistor c1 can be accurately sucked by the suction nozzle (not shown). Thus, the chip resistor c1 can be accurately mounted on the mount board c9 (see FIG. 64(*b*)). That is, the mount positioning accuracy can be improved.

In the chip resistor c1 shown in any of FIGS. 77 and 79 to 82, particularly, the first resin film c24A is provided on the regions of the side surfaces c2C to c2F each spaced the distance K from the front surface c2A so that the edge portion c85 of the board c2 is exposed. In the chip resistor c1 shown in any of FIGS. 77 and 80 to 82, the side surfaces c2C to c2F of the board c2 each form an acute angle with respect to the front surface c2A of the board c2. Therefore, the edge portion c85 of the front surface c2A of the board c2 is distinctive, so that the contour of the chip resistor c1 (the edge portion c85) can be further clearly detected. Thus, the chip resistor c1 can be more accurately mounted on the mount board c9. That is, the contour of the chip resistor c1 can be easily detected based on the edge portion c85. Thus, the suction nozzle (not shown) can accurately suck an intended portion of the chip resistor c1. Where a focus is placed on the edge portion c85 or the edge portion c90 for the image recognition, the first resin film c24A is out of focus and hence is obscure. Thus, the edge portion c85 or the edge portion c90 can be distinguished from the first resin film c24A.

Where the prevention of the chipping of the corner portions c12 precedes the improvement of the mount positioning accuracy, on the other hand, the corner portions c12 of the board c2 (here, the corner portions c12 of the front surface c2A) may be covered with the resin film c24 as shown in FIG. 78. In this case, the chipping of the corner portions c12 can be reliably prevented or suppressed. Further, the front surface c2A of the board c2 is protected with the second resin film c24B. Particularly, the surface c24D of the second resin film c24B (the middle portion c24C) is located at a higher height level than the first connection electrode c3 and the second connection electrode c4 (not shown in FIGS. 77(*b*), 78(*b*), 79(*b*), 80(*b*), 81(*b*) and 82(*b*)). Even if an impact is applied to the front surface c2A of the board c2 from the mount board c9 when the chip resistor c1 is mounted on the mount board c9 as shown in FIG. 64(*b*), the second resin film c24B (the middle portion c24C) first receives the impact. Thus, the second resin film c24B can reduce the impact, making it possible to reliably protect the front surface c2A of the board c2.

While the examples of the third reference embodiment have thus been described, the third reference embodiment may be embodied in other forms. In the examples described above, the chip resistor c1 is disclosed as an exemplary chip component according to the third reference embodiment. The third reference embodiment is applicable to a chip capacitor, a chip inductor, a chip diode and other chip components. The chip capacitor will hereinafter be described.

FIG. 83 is a plan view of a chip capacitor according to another example of the third reference embodiment. FIG. 84 is a sectional view taken along a sectional line LXXXIV-LXXXIV in FIG. 83. FIG. 85 is an exploded perspective view illustrating the chip capacitor with parts thereof separated. Components of the chip capacitor c101 corresponding to those of the chip resistor c1 will be designated by the same reference characters, and will not be described in detail. In the chip capacitor c101, components designated by the same reference characters as in the chip resistor c1 have the same construction as in the chip resistor c1 and the same effects as in the chip resistor c1, unless otherwise specified.

Referring to FIG. 83, the chip capacitor c101, like the chip resistor c1, includes a board c2, a first connection electrode c3 provided on the board c2 (on a front surface c2A of the board c2), and a second connection electrode c4 also provided on the board c2. In this example, the board c2 has a rectangular shape as seen in plan. The first connection electrode c3 and the second connection electrode c4 are respectively disposed on longitudinally opposite end portions of the board c2. In this example, the first connection electrode c3 and the second connection electrode c4 each have a generally rectangular plan shape elongated widthwise of the board c2. A plurality of capacitor elements C1 to C9 are provided in a capacitor provision region c105 between the first connection electrode c3 and the second connection electrode c4 on the front surface c2A of the board c2. The capacitor elements C1 to C9 are device elements constituting a device c5 (capacitor portion), and are electrically connected to the second connection electrode c4 via a plurality of fuse units c107 (corresponding to the fuses F described above).

As shown in FIGS. 84 and 85, an insulative layer c20 is provided on the front surface c2A of the board c2, and a lower electrode film c111 is provided on a surface of the insulative layer c20. The lower electrode film c111 extends over substantially the entire capacitor provision region c105. Further, the lower electrode film c111 extends to under the first connection electrode c3. More specifically, the lower electrode film c111 has a capacitor electrode region c111A functioning as a common lower electrode for the capacitor elements C1 to C9 in the capacitor provision region c105, and a pad region c111B disposed under the first connection electrode c3 for external electrode connection. The capacitor electrode region c111A is located in the capacitor provision region c105, while the pad region c111B is located under the first connection electrode c3 in contact with the first connection electrode c3.

A capacitive film (dielectric film) c112 is provided over the lower electrode film c111 (the capacitor electrode region c111A) in contact with the lower electrode film c111 in the capacitor provision region c105. The capacitive film c112 extends over the entire capacitor electrode region c111A (the capacitor provision region c105). In this example, the capacitive film c112 also covers a part of the insulative layer c20 outside the capacitor provision region c105.

An upper electrode film c113 is provided on the capacitive film c112. In FIG. 83, the upper electrode film c113 is hatched for clarification. The upper electrode film c113 has a capacitor electrode region c113A located in the capacitor provision region c105, a pad region c113B located under the second connection electrode c4 in contact with the second connection electrode c4, and a fuse region c113C located between the capacitor electrode region c113A and the pad region c113B.

The capacitor electrode region c113A of the upper electrode film c113 is divided (split) into a plurality of electrode film portions (upper electrode film portions) c131 to c139. In this example, the electrode film portions c131 to c139 each have a rectangular shape, and extend linearly from the fuse region c113C toward the first connection electrode c3. The electrode film portions c131 to c139 are opposed to the lower electrode film c111 with a plurality of facing areas with the intervention of the capacitive film c112 (in contact with the capacitive film c112). More specifically, the facing areas of the respective electrode film portions c131 to c139 with respect to the lower electrode film c111 may be defined to have a ratio of 1:2:4:8:16:32:64:128:128. That is, the electrode film portions c131 to c139 include a plurality of electrode film portions having different facing areas, more specifically, a plurality of electrode film portions c131 to c138 (or c131 to c137 and c139) respectively having facing areas which are defined by a geometric progression with a geometric ratio of 2. Thus, the capacitor elements C1 to C9 respectively defined by the electrode film portions c131 to c139 and the lower electrode film c111 opposed to the electrode film portions c131 to c139 with the intervention of the capacitive film c112 include a plurality of capacitor elements having different capacitance values. Where the facing areas of the electrode film portions c131 to c139 have the aforementioned ratio, the ratio of the capacitance values of the capacitor elements C1 to C9 is 1:2:4:8:16:32:64:128:128, which is equal to the ratio of the facing areas. That is, the capacitor elements C1 to C9 include a plurality of capacitor elements C1 to C8 (or C1 to C7 and C9) which respectively have capacitance values defined by the geometric progression with a geometric ratio of 2.

In this example, the electrode film portions c131 to c135 each have a strip shape of the same width, and respectively have lengths defined to have a ratio of 1:2:4:8:16. The electrode film portions c135, c136, c137, c138, c139 each have a strip shape of the same length, and respectively have widths defined to have a ratio of 1:2:4:8:8. The electrode film portions c135 to c139 extend from an edge of the second connection electrode c4 to an edge of the first connection electrode c3 in the capacitor provision region c105, and the electrode film portions c131 to c134 are shorter than the electrode film portions c135 to c139.

The pad region c113B is generally analogous to the second connection electrode c4, and has a generally rectangular plan shape. As shown in FIG. 84, the pad region c113B of the upper electrode film c113 contacts the second connection electrode c4. The fuse region c113C is located alongside a longer edge (an inner longer edge with respect to a periphery of the board c2) of the pad region c113B. The fuse region c113C includes the plurality of fuse units c107, which are arranged alongside the longer edge of the pad region c113B.

The fuse units c107 are formed of the same material as the pad region c113B of the upper electrode film c113 unitarily with the pad region c113B. The electrode film portions c131 to c139 are each formed integrally with one or more of the fuse units c107, and connected to the pad region c113B via these fuse units c107 to be thereby electrically connected to the second connection electrode c4 via the pad region c113B. As shown in FIG. 83, the electrode film portions c131 to c136 each having a relatively small area are each connected to the pad region c113B via a single fuse unit c107, and the electrode film portions c137 to c139 each having a relatively great area are each connected to the pad region c113B via a plurality of fuse units c107. It is not necessary to use all the fuse units c107, and some of the fuse units c107 are unused in this example.

The fuse units c107 each include a first wider portion c107A for connection to the pad region c113B, a second wider portion c107B for connection to the electrode film portions c131 to c139, and a narrower portion c107C connecting the first and second wider portions c107A, c107B to each other. The narrower portion c107C is configured to be disconnected (fused off) by a laser beam. With this arrangement, unnecessary ones of the electrode film portions c131 to c139 are electrically isolated from the first and second connection electrodes c3, c4 by disconnecting corresponding ones of the fuse units c107.

As shown in FIG. 84 but not shown in FIGS. 83 and 85, a front surface of the chip capacitor c101 including a surface of the upper electrode film c113 is covered with an insulative film c23. The insulative film c23 is formed of, for example, a nitride film, and extends to side surfaces c2C to c2F of the board c2 to cover not only the upper surface of the chip capacitor c101 but also the entire side surfaces c2C to c2F. Further, a resin film c24 is provided on the insulative film c23. The resin film c24 includes a first resin film c24A covering portions of the side surfaces c2C to c2F adjacent to the front surface c2A, and a second resin film c24B covering the front surface c2A. The resin film c24 is discontinuous on an edge portion c85 of the front surface c2A, so that the edge portion c85 is exposed from the resin film c24.

The insulative film c23 and the resin film c24 each serve as a protective film for protecting the front surface of the chip capacitor c101, and each have openings c25 in association with the first connection electrode c3 and the second connection electrode c4. The openings c25 extend through the insulative film c23 and the resin film c24 to expose a part of the pad region c111B of the lower electrode film c111 and a part of the pad region c113B of the upper electrode film c113. In this example, the opening c25 associated with the first connection electrode c3 also extends through the capacitive film c112.

The first connection electrode c3 and the second connection electrode c4 are respectively provided in the openings c25. Thus, the first connection electrode c3 is connected to the pad region c111B of the lower electrode film c111, while the second connection electrode c4 is connected to the pad region c113B of the upper electrode film c113. The first and second connection electrodes c3, c4 project from a surface of the resin film c24. Thus, the chip capacitor c101 can be connected to a mount board through flip chip connection.

FIG. 86 is a circuit diagram showing the internal electrical configuration of the chip capacitor c101. The plurality of capacitor elements C1 to C9 are connected in parallel between the first connection electrode c3 and the second connection electrode c4. Fuses F1 to F9 each including one or more fuse units c107 are respectively connected in series between the second connection electrode c4 and the capacitor elements C1 to C9.

Where all the fuses F1 to F9 are connected, the overall capacitance value of the chip capacitor c101 is equal to the sum of the capacitance values of the respective capacitor elements C1 to C9. Where one or two or more fuses selected from the fuses F1 to F9 are disconnected, the capacitor elements associated with the disconnected fuses are isolated, so that the overall capacitance value of the chip capacitor c101 is reduced by the sum of the capacitance values of the isolated capacitor elements.

Therefore, the overall capacitance value of the chip capacitor can be adjusted to a desired capacitance value (through laser trimming) by measuring a capacitance value between the pad regions c111B and c113B (the total capacitance value of the capacitor elements C1 to C9) and then fusing off one or more fuses properly selected from the fuses F1 to F9 according to the desired capacitance value by the laser beam. Particularly, where the capacitance values of the capacitor elements C1 to C8 are defined by the geometric progression with a geometric ratio of 2, the overall capacitance value of the chip capacitor c101 can be finely adjusted to the desired capacitance value with an accuracy equivalent to the capacitance value of the smallest capacitance capacitor element C1 (the value of the first term of the geometric progression).

For example, the capacitance values of the capacitor elements C1 to C9 may be as follows: C1=0.03125 pF; C2=0.0625 pF; C3=0.125 pF; C4=0.25 pF; C5=0.5 pF; C6=1 pF; C7=2 pF; C8=4 pF; and C9=4 pF. In this case, the capacitance of the chip capacitor c101 can be finely adjusted with a minimum adjustable accuracy of 0.03125 pF. By properly selecting the to-be-disconnected fuses from the fuses F1 to F9, the chip capacitor c101 can be provided as having a desired capacitance value ranging from 10 pF to 18 pF.

In this example, as described above, the plurality of capacitor elements C1 to C9 which can be isolated by disconnecting the associated fuses F1 to F9 are provided between the first connection electrode c3 and the second connection electrode c4. The capacitor elements C1 to C9 include a plurality of capacitor elements having different capacitance values, more specifically, a plurality of capacitor elements having capacitance values defined by the geometric progression. Therefore, the chip capacitor c101 can be adapted for the plural capacitance values without changing the design, and customized based on the same design concept so as to have a desired capacitance value which is accurately controlled by selectively fusing off one or more of the fuses F1 to F9.

The respective components of the chip capacitor c101 will hereinafter be described in detail. Referring to FIG. 83, the board c2 may have a rectangular plan shape, for example, having a size of 0.3 mm×0.15 mm or 0.4 mm×0.2 mm (preferably, a size of not greater than 0.4 mm×0.2 mm). The capacitor provision region c105 is generally a square region which has an edge having a length equivalent to the length of the shorter edge of the board c2. The board c2 may have a thickness of about 150 μm. Referring to FIG. 84, the board c2 may be a board obtained by grinding or polishing a substrate from a back side (not formed with the capacitor elements C1 to C9) for thinning the substrate. A semiconductor substrate typified by a silicon substrate, a glass substrate or a resin film may be used as a material for the board c2.

The insulative layer c20 may be an oxide film such as a silicon oxide film, and may have a thickness of about 500 Å to about 2000 Å. The lower electrode film c111 is preferably an electrically conductive film, particularly preferably a metal film, and may be an aluminum film. The lower electrode film c111 of the aluminum film may be formed by a sputtering method. Similarly, the upper electrode film c113 is preferably an electrically conductive film, particularly preferably a metal film, and may be an aluminum film. The upper electrode film c113 of the aluminum film may be formed by a sputtering method. Further, a photolithography and etching process may be employed for patterning to divide the capacitor electrode region c113A of the upper electrode film c113 into the electrode film portions c131 to c139 and to shape the fuse region c113C into the plurality of fuse units c107.

The capacitive film c112 may be formed of, for example, a silicon nitride film, and have a thickness of 500 Å to 2000 Å (e.g., 1000 Å). The silicon nitride film for the capacitive film c112 may be formed by plasma CVD (chemical vapor deposition). The insulative film c23 may be formed of, for example, a silicon nitride film, for example, by a plasma CVD method. The insulative film c23 may have a thickness of about 8000 Å. The resin film c24 may be formed of a polyimide film or other resin film as described above.

The first and second connection electrodes c3, c4 may each be formed of a multilayer film including a nickel layer provided in contact with the lower electrode film c111 or the upper electrode film c113, a palladium layer provided on the nickel layer and a gold layer provided on the palladium layer, which may each be formed by a plating method (more specifically, an electroless plating method). The nickel layer improves the adhesiveness to the lower electrode film c111 or the upper electrode film c113, and the palladium layer functions as a diffusion preventing layer which suppresses mutual diffusion of the material of the upper and lower electrode films and gold of the uppermost layers of the first and second connection electrodes c3, c4.

For production of the chip capacitor c101, the same production process as for the chip resistor c1 may be employed after formation of the device c5. For the formation of the device c5 (capacitor portion) for the chip capacitor c101, an insulative layer c20 of an oxide film (e.g., a silicon oxide film) is first formed on a front surface of a substrate c30 (board c2) by a thermal oxidation method and/or a CVD method. Then, a lower electrode film c111 of an aluminum film is formed on the entire surface of the insulative layer c20, for example, by a sputtering method. The lower electrode film c111 may have a thickness of about 8000 Å. In turn, a resist pattern corresponding to the final shape of the lower electrode film c111 is formed on a surface of the lower electrode film by photolithography. The lower electrode film is etched by using the resist pattern as a mask. Thus, the lower electrode film c111 is provided as having a pattern shown in FIG. 83 and the like. The etching of the lower electrode film c111 may be achieved, for example, by reactive ion etching.

Then, a capacitive film c112 such as of a silicon nitride film is formed on the lower electrode film c111, for example, by a plasma CVD method. In a region not formed with the lower electrode film c111, the capacitive film c112 is formed on the surface of the insulative layer c20. In turn, an upper electrode film c113 is formed on the capacitive film c112. The upper electrode film c113 is formed from, for example, an aluminum film which is formed by a sputtering method. The upper electrode film c113 may have a thickness of about 8000 Å. Then, a resist pattern corresponding to the final shape of the upper electrode film c113 is formed on a surface of the upper electrode film c113 by photolithography. The upper electrode film c113 is etched with the use of this resist pattern as a mask to be thereby patterned into the final shape (see FIG. 83 and the like). Thus, the upper electrode film c113 is configured in a pattern such as to include a plurality of electrode film portions c131 to c139 in the capacitor electrode region c113A, a plurality of fuse units c107 in the fuse region c113C and a pad region c113B connected to the fuse units c107. The etching for the patterning of the upper electrode film c113 may be achieved by wet etching with the use of an etching liquid such as phosphoric acid or by reactive ion etching.

In this manner, devices c5 (the capacitor elements C1 to C9 and the fuse units c107) for chip capacitors c101 are formed. After the formation of the devices c5, an insulative film c45 is formed as entirely covering the devices c5 (the upper electrode films c113 and a region of the capacitive film c112 not formed with the upper electrode films c113) by a plasma CVD method (see FIG. 73A). Thereafter, a trench c44 is formed (see FIG. 73B), and then openings c25 are formed (see FIG. 73C). Subsequently, probes c70 are pressed against the pad region c113B of the upper electrode film c113 and the pad region c111B of the lower electrode film c111 exposed from the openings c25 to measure the total capacitance value of the capacitor elements C1 to C9 for each of the devices c5 (see FIG. 73C). Based on the total capacitance value thus measured, capacitor elements to be isolated, i.e., fuses to be disconnected, are selected according to a target capacitance value of the chip capacitor c101.

In this state, a laser trimming process is performed for selectively fusing off the fuse units c107. That is, the laser beam is applied to fuse units c107 of the fuses selected according to the result of the measurement of the total capacitance value, whereby the narrower portions c107C of the selected fuse units c107 (see FIG. 83) are fused off. Thus, the associated capacitor elements are isolated from the pad region c113B. When the laser beam is applied to the fuse units c107, the energy of the laser beam is accumulated around the fuse units c107 by the function of the insulative film c45 serving as the cover film, thereby fusing off the fuse units c107. Thus, the capacitance value of the chip capacitor c101 can be reliably adjusted to the target capacitance value.

Subsequently, a silicon nitride film is deposited on the cover film (insulative film c45), for example, by a plasma CVD method to form an insulative film c23. The aforementioned cover film is finally unified with the insulative film c23 to form a part of the insulative film c23. The insulative film c23 formed after the disconnection of the fuses enters holes formed in the cover film when the cover film is partly broken during the fuse-off of the fuses, and covers disconnection surfaces of the fuse units c107 for protection. Therefore, the insulative film c23 prevents intrusion of foreign matter and moisture in the disconnected portions of the fuse units c107. This makes it possible to produce highly reliable chip capacitors c101. The insulative film c23 may be formed as having an overall thickness of, for example, about 8000 Å.

Then, a coating film c46 is formed (see FIG. 73D). Thereafter, the openings c25 closed with the coating film c46 and the insulative film c23 are uncovered (see FIG. 73E), and the first and second connection electrodes c3, c4 are thickened, for example, by an electroless plating method (see FIG. 73F). Subsequently, as in the case of the chip resistors c1, the substrate c30 is ground from the back surface c30B (see FIG. 73G), whereby the resulting chip capacitors c101 are separated from each other.

In the patterning of the upper electrode film c113 by utilizing the photolithography process, the electrode film portions c131 to c139 each having a very small area can be highly accurately formed, and the fuse units c107 can be formed in a minute pattern. After the patterning of the upper electrode film c113, the total capacitance value of the capacitor elements is measured, and the fuses to be disconnected are selected. The chip capacitors c101 can be provided as each having a desired capacitance value, which is accurately adjusted by disconnecting the selected fuses.

While the chip components (the chip resistor c1 and the chip capacitor c101) according to the third reference embodiment have thus been described, the third reference embodiment may be embodied in other forms. In the aforementioned examples, the chip resistor c1 includes a plurality of resistor circuits having different resistance values defined by the geometric progression with a geometric ratio r ($0<r$, $r\neq1$)=2 by way of example, but the geometric ratio for the geometric progression may have a value other than 2. The chip capacitor c101 includes a plurality of capacitor elements having different capacitance values defined by the geometric progression with a geometric ratio r ($0<r$, $r\neq1$)=2 by way of example, but the geometric ratio for the geometric progression may have a value other than 2.

In the chip resistor c1 and the chip capacitor c101, the insulative layer c20 is provided on the front surface of the board c2. Where the board c2 is an insulative board, however, the insulative layer c20 may be obviated. In the chip capacitor c101, only the upper electrode film c113 is divided into a plurality of electrode film portions. However, only the lower electrode film c111 may be divided into a plurality of electrode film portions, or the upper electrode film c113 and the lower electrode film c111 may be each divided into a plurality of electrode film portions. In the aforementioned example, the fuse units are provided integrally with the upper electrode film or the lower electrode film, but may be formed from a conductor film different from the upper and lower electrode films. The chip capacitor c101 described above has a single-level capacitor structure including the upper electrode film c113 and the lower electrode film c111. Alternatively, a multi-level capacitor structure may be provided by stacking another electrode film on the upper electrode film c113 with the intervention of a capacitive film.

The chip capacitor c101 may be configured such that an electrically conductive board employed as the board c2 serves as the lower electrode and the capacitive film c112 is provided in contact with a surface of the electrically conductive board. In this case, one of the external electrodes may extend from the back surface of the electrically conductive board.

<Fourth Reference Embodiment of Present Invention>

(1) Inventive Features of Fourth Reference Embodiment

The fourth reference embodiment has, for example, the following inventive features (D1) to (D15):

(D1) A chip component is provided, which includes: a board; a device circuit network including a plurality of device elements provided on the board; an electrode provided on the board for external connection of the device circuit network; a plurality of fuses which disconnectably connect the respective device elements to the electrode; and a protective resin film which covers the device elements and the fuses with the electrode being exposed therefrom and has an edge retracted from an edge of the board inward of the board.

With this arrangement, the protective resin film is made of a resin and hence is less susceptible to cracking which may otherwise occur due to an impact. Therefore, the protective resin film can reliably protect the front surface of the board (particularly, the device circuit network and the fuses) from the impact, so that the chip component is excellent in impact resistance. In the chip component, the device elements can be combined in a desired combination pattern in the device circuit network by selectively disconnecting one or more of the fuses. Thus, the chip component can be customized based on the same design concept so that the device circuit network has any of various levels of an electrical characteristic property.

(D2) A chip component is provided, which includes: a board; a device circuit network including a plurality of device elements provided on the board; an electrode provided on the board for external connection of the device circuit network; a plurality of fuses which disconnectably connect the respective device elements to the electrode; a passivation film having a front surface covering portion which covers a front surface of the board and a side surface covering portion which covers a side surface of the board; and a protective resin film provided on the passivation film with the electrode being exposed therefrom and having an edge aligned with the side surface covering portion of the passivation film as seen in plan.

With this arrangement, the protective resin film is made of a resin and hence is less susceptible to cracking which may otherwise occur due to an impact. Therefore, the protective resin film can reliably protect the front surface of the board (particularly, the device circuit network and the fuses) and the edge of the front surface of the board from the impact, so that the chip component is excellent in impact resistance. In the chip component, the device elements can be combined in a desired combination pattern in the device circuit network by selectively disconnecting one or more of the fuses. Thus, the chip component can be customized based on the same design concept so that the device circuit network has any of various levels of an electrical characteristic property.

(D3) A chip component is provided, which includes: a board; a device circuit network including a plurality of device elements provided on the board; an electrode provided on the board for external connection of the device circuit network; a plurality of fuses which disconnectably connect the respective device elements to the electrode; a passivation film having a front surface covering portion which covers a front surface of the board and a side surface covering portion which covers a side surface of the board; and a protective resin film provided on the passivation film with the electrode being exposed therefrom and covering the front surface covering portion and the side surface covering portion of the passivation film.

With this arrangement, the protective resin film is made of a resin and hence is less susceptible to cracking which may otherwise occur due to an impact. Therefore, the protective resin film can reliably protect the front surface of the board (particularly, the device circuit network and the fuses) and the side surface of the board from the impact, so that the chip component is excellent in impact resistance. In the chip component, the device elements can be combined in a desired combination pattern in the device circuit network by selectively disconnecting one or more of the fuses. Thus, the chip component can be customized based on the same design concept so that the device circuit network has any of various levels of an electrical characteristic property.

(D4) In the chip component of any one of the features (D1) to (D3), the device circuit network includes a resistor circuit network including a plurality of resistor elements provided on the board, and the chip component is a chip resistor.

With this arrangement, the chip component (chip resistor) can be easily and speedily customized to have any of plural resistance values by selectively disconnecting one or more of the fuses. In other words, the chip resistor can be customized based on the same design concept so as to have various resistance values by selectively combining resistor elements having different resistance values.

(D5) In the chip component of the feature (D4), the resistor elements each include a resistive film provided on the board and an interconnection film provided on the resistive film.

With this arrangement, the resistor elements each include resistor bodies defined between adjacent portions of the interconnection film on the resistive film. Therefore, the resistor elements can be easily formed simply by forming the interconnection film on the resistive film.

(D6) In the chip component of any one of the features (D1) to (D3), the device circuit network includes a capacitor circuit network including a plurality of capacitor elements provided on the board, and the chip component is a chip capacitor.

With this arrangement, the chip component (chip capacitor) can be easily and speedily customized to have any of plural capacitance values by selectively disconnecting one or more of the fuses. In other words, the chip capacitor can be customized based on the same design concept so as to have various capacitance values by selectively combining capacitor elements having different capacitance values.

(D7) In the chip component of the feature (D6), the capacitor elements include a capacitive film provided on the board, and a lower electrode film and an upper electrode film opposed to each other with the intervention of the capacitive film, wherein the lower electrode film and the upper electrode film each include a plurality of separate electrode film portions, and the electrode film portions are respectively connected to the fuses.

With this arrangement, the capacitor elements can be provided according to the number of the electrode film portions.

(D8) In the chip component of any one of the features (D1) to (D3), the device circuit network includes an inductor circuit network including a plurality of inductor elements provided on the board, and the chip component is a chip inductor.

With this arrangement, the inductor elements can be combined in a desired combination pattern in the inductor circuit network of the chip component (chip inductor) by selectively disconnecting one or more of the fuses. Thus, the chip inductor can be customized based on the same design concept so that the inductor circuit network has any of various levels of an electrical characteristic property.

(D9) In the chip component of any one of the features (D1) to (D3), the device circuit network includes a diode circuit network including a plurality of diode elements provided on the board, and the chip component is a chip diode.

With this arrangement, the diode elements can be combined in a desired combination pattern in the diode circuit network of the chip component (chip diode) by selectively disconnecting one or more of the fuses. Thus, the chip diode can be customized based on the same design concept so that the diode circuit network has any of various levels of an electrical characteristic property.

(D10) The protective resin film is preferably made of a polyimide.

(D11) In the chip component of any one of the features (D1) to (D10), the protective resin film has an opening in which the electrode is disposed, the opening extending thicknesswise through the protective resin film.

In this case, the electrode is exposed from the protective resin film through the opening.

(D12) The opening may become wider toward a front surface of the protective resin film.

(D13) The electrode has an end surface curved toward the front surface of the board.

(D14) In the chip component of any one of the features (D1) to (D13), the electrode includes an Ni layer and an Au layer, and the Au layer is exposed on an outermost surface of the electrode.

In this case, the surface of the Ni layer of the electrode is covered with the Au layer, so that the Ni layer is prevented from being oxidized.

(D15) In the chip component of the feature (D14), the electrode further includes a Pd layer provided between the Ni layer and the Au layer.

In this case, even if the Au layer has a through-hole (pin hole) because of its smaller thickness, the Pd layer provided between the Ni layer and the Au layer closes the through-hole. This prevents the Ni layer from being exposed to the outside through the through-hole and oxidized.

(2) Examples of Fourth Reference Embodiment of Present Invention

Examples of the fourth reference embodiment will hereinafter be described in detail with reference to the attached drawings. Reference characters shown in FIGS. 87 to 110 are effective only in FIGS. 87 to 110, so that components designated by these reference characters may be different from those designated by the same reference characters in other embodiments.

FIG. 87(*a*) is a schematic perspective view for explaining the construction of a chip resistor according to an example of the fourth reference embodiment, and FIG. 87(*b*) is a schematic sectional view illustrating the chip resistor, which is mounted on a mount board. The chip resistor d1 is a minute chip component, and has a rectangular prismatic shape as shown in FIG. 87(*a*). The chip resistor d1 has a rectangular plan shape. The chip resistor d1 is dimensioned such as to have a length L (a length of a longer edge d81) of about 0.6 mm, a width W (a length of a shorter edge d82) of about 0.3 mm, and a thickness T of about 0.2 mm.

The chip resistor d1 is obtained by forming a multiplicity of chip resistors d1 in a lattice form on a substrate, then forming a trench in the substrate, and grinding a back surface of the substrate (or dividing the substrate along the trench) to separate the chip resistors d1 from each other. The chip resistor d1 principally includes a board d2 which constitutes a part of a main body of the chip resistor d1, a first connection electrode d3 and a second connection electrode d4 serving as a pair of external connection electrodes, and a device (element) d5 connected to the outside via the first connection electrode d3 and the second connection electrode d4.

The board d2 has a generally rectangular prismatic chip shape. An upper surface of the board d2 as seen in FIG. 87(*a*) is a front surface d2A. The front surface d2A is a surface (device formation surface) of the board d2 on which the device d5 is provided, and has a generally rectangular shape. A surface of the board d2 opposite from the front surface d2A with respect to the thickness of the board d2 is a back surface d2B. The front surface d2A and the back surface d2B have substantially the same shape, and are parallel to each other. However, the back surface d2B is greater than the front surface d2A. When the front surface d2A is seen in plan perpendicularly to the front surface d2A, therefore, the front surface d2A is accommodated within the back surface d2B. The front surface d2A has a rectangular edge portion d85 defined along a pair of longer edges d81 and a pair of shorter edges d82 thereof, and the back surface d2B has a rectangular edge portion d90 defined along a pair of longer edges d81 and a pair of shorter edges d82 thereof.

In addition to the front surface d2A and the back surface d2B, the board d2 has a plurality of side surfaces (side surfaces d2C, d2D, d2E and d2F). The side surfaces intersect (orthogonally intersect) the front surface d2A and the back surface d2B to connect the front surface d2A and the back surface d2B to each other. The side surface d2C is disposed between shorter edges d82 of the front surface d2A and the back surface d2B on one of longitudinally opposite sides (on a left front side in FIG. 87(*a*)). The side surface d2D is disposed between shorter edges d82 of the front surface d2A and the back surface d2B on the other of the longitudinally opposite sides (on a right rear side in FIG. 87(*a*)). The side surfaces d2C, d2D are longitudinally opposite end faces of the board d2. The side surface d2E is disposed between longer edges d81 of the front surface d2A and the back surface d2B on one of widthwise opposite sides (on a left rear side in FIG. 87(*a*)). The side surface d2F is disposed between longer edges d81 of the front surface d2A and the back surface d2B on the other of the widthwise opposite sides (on a right front side in FIG. 87(*a*)). The side surfaces d2E, d2F are widthwise opposite end faces of the board d2. The side surfaces d2C, d2D intersect (generally orthogonally intersect) the side surfaces d2E, d2F.

As described above, adjacent ones of the front surface d2A, the back surface d2B and the side surfaces d2C to d2F generally orthogonally intersect each other. The side surface d2C, the side surface d2D, the side surface d2E and the side surface d2F (hereinafter referred to as the side surfaces) each have a rough surface region S adjacent to the front surface d2A, and a streak pattern region P adjacent to the back surface d2B. The rough surface regions S of the side surfaces each have a rough surface having an irregular pattern as indicated by fine dots in FIG. 87(*a*). The streak pattern regions P of the side surfaces each have a regular pattern including a multiplicity of streaks (saw mark) V which are a cutting trace remaining after cutting with a dicing saw to be described later. The side surfaces each have the rough surface region S and the streak pattern region P attributable to a production process for the chip resistor d1, which will be detailed later.

The rough surface region S occupies generally a half of each of the side surfaces adjacent to the front surface d2A, while the streak pattern region P occupies generally a half of each of the side surfaces adjacent to the back surface d2B. The streak pattern region P of each of the side surfaces projects with respect to the rough surface region S outward of the board d2 (outward of the board d2 as seen in plan). Thus, a step N is provided between the rough surface region S and the streak pattern region P. The step N connects a lower edge of the rough surface region S to an upper edge of the streak pattern region P, and extends parallel to the front surface d2A and the back surface d2B. The steps N of the respective side surfaces are continuous to one another, and form a rectangular frame-like shape as a whole which is located between the edge portion d85 of the front surface d2A and the edge portion d90 of the back surface d2B as seen in plan.

With the provision of the steps N in the respective side surfaces, the back surface d2B is greater than the front surface d2A as described above. The front surface d2A and the side surfaces d2C to d2F (the rough surface regions S and the streak pattern regions P of the respective side surfaces) of the board d2 are entirely covered with a passivation film d23. More strictly, therefore, the front surface d2A and the side surfaces d2C to d2F are entirely located on an inner side (back side) of the passivation film d23, and are not exposed to the outside in FIG. 87(*a*). Here, a portion of the passivation film d23 covering the front surface d2A is referred to as a front surface covering portion d23A, and a portion of the passivation film d23 covering the side surfaces d2C to d2F is referred to as a side surface covering portion d23B.

Further, the chip resistor d1 has a resin film d24. The resin film d24 is provided on the passivation film d23, and serves as a protective film (protective resin film) which at least covers the entire front surface d2A. The passivation film d23 and the resin film d24 will be detailed later. The first connection electrode d3 and the second connection electrode d4 are provided inward of the edge portion d85 on the front surface d2A of the board d2, and partly exposed from the resin film d24 on the front surface d2A. In other words, the resin film d24 covers the front surface d2A (strictly, the passivation film d23 on the front surface d2A) with the first connection electrode d3 and the second connection electrode d4 being exposed therefrom. The first connection electrode d3 and the second connection electrode d4 each have a structure such that an Ni (nickel) layer, a Pd (palladium) layer and an Au (gold) layer are stacked in this order on the front surface d2A. The first connection electrode d3 and the second connection electrode d4 are spaced from each other longitudinally of the front surface d2A, and are each elongated widthwise of the front surface d2A. On the front surface d2A, the first connection electrode d3 is disposed closer to the side surface d2C, and the second connection electrode d4 is disposed closer to the side surface d2D in FIG. 87(*a*).

The device d5 is a device (element) circuit network, which is provided on the board d2 (on the front surface d2A), more specifically, between the first connection electrode d3 and the second connection electrode d4 on the front surface d2A of the board d2, and is covered with the passivation film d23 (the front surface covering portion d23A) and the resin film d24 from the upper side. In this example, the device d5 is a resistor portion d56. The resistor portion d56 is a resistor circuit network including a plurality of (unit) resistor bodies R each having the same resistance value and arranged in a matrix array on the front surface d2A. The resistor bodies R are each made of TiN (titanium nitride), TiON (titanium oxide nitride) or TiSiON. The device d5 is electrically connected to portions of an interconnection film d22 to be described later, and electrically connected to the first connection electrode d3 and the second connection electrode d4 via the interconnection film portions d22.

As shown in FIG. 87(*b*), the first connection electrode d3 and the second connection electrode d4 are opposed to a mount board d9, and respectively electrically and mechanically connected to a pair of connection terminals d88 of the mount board d9 by solder d13. Thus, the chip resistor d1 can be mounted on the mount board d9 (through flip chip connection). The first connection electrode d3 and the second connection electrode d4 functioning as the external connection electrodes are desirably formed of gold (Au) or plated with gold for improvement of solder wettability and reliability.

FIG. 88 is a plan view of the chip resistor showing the layout of the first connection electrode, the second connection electrode and the device, and the structure (layout pattern) of the device as viewed in plan. Referring to FIG. 88, the device d5, which is a resistor circuit network, includes 352 resistor bodies R in total with 8 resistor bodies R aligned in each row (longitudinally of the board d2) and with 44 resistor bodies R aligned in each column (widthwise of the board d2). These resistor bodies R are elements of the resister circuit network of the device d5.

The multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface d2A of the board d2 for electrically incorporating the resistor circuits into the device d5 or electrically isolating the resistor circuits from the device d5. The fuses F and the conductor films D are arranged in a linear region alongside an inner edge of the first connection electrode d3. More specifically, the fuses F and the conductor films D are arranged in adjacent relation in a linear arrangement direction. The fuses F respectively disconnectably (separably) connect the plural types of resistor circuits (each including a plurality of resistor bodies R) with respect to the first connection electrode d3.

FIG. 89A is a plan view illustrating a part of the device shown in FIG. 88 on an enlarged scale. FIG. 89B is a longitudinal vertical sectional view taken along a line B-B in FIG. 89A for explaining the structure of the resistor bodies of the device. FIG. 89C is a widthwise vertical sectional view taken along a line C-C in FIG. 89A for explaining the structure of the resistor bodies of the device. Referring to FIGS. 89A, 89B and 89C, the structure of the resistor bodies R will be described.

The chip resistor d1 includes an insulative layer d20 and a resistive film d21 in addition to the interconnection film d22, the passivation film d23 and the resin film d24 described above (see FIGS. 89B and 89C). The insulative layer d20, the resistive film d21, the interconnection film d22, the passivation film d23 and the resin film d24 are provided on the board d2 (on the front surface d2A). The insulative layer d20 is made of $SiO_2$ (silicon oxide). The insulative layer d20 covers the entire front surface d2A of the board d2. The insulative layer d20 has a thickness of about 10000 Å.

The resistive film d21 is provided on the insulative layer d20. The resistive film d21 is made of TiN, TION or TiSiON. The resistive film d21 has a thickness of about 2000 Å. The resistive film d21 includes a plurality of resistive film portions (hereinafter referred to as "resistive film lines d21A") extending linearly parallel to each other between the first connection electrode d3 and the second connection electrode d4. Some of the resistive film lines d21A are cut at predetermined positions with respect to a line extending direction (see FIG. 89A).

Portions of the interconnection film d22 are provided on the resistive film lines d21A. The interconnection film portions d22 are each made of Al (aluminum) or an alloy (AlCu alloy) of aluminum and Cu (copper). The interconnection film portions d22 each have a thickness of about 8000 Å. The interconnection film portions d22 are provided on the resistive film lines d21A in contact with the resistive film lines d21A, and spaced a predetermined distance R from one another in the line extending direction.

In FIG. 90, the electrical characteristic features of the resistive film lines d21A and the interconnection film portions d22 of this arrangement are shown by way of circuit symbols. As shown in FIG. 90(*a*), portions of each of the resistive film lines d21A present between the interconnection film portions d22 spaced the predetermined distance R from one another each serve as a single resistor body R having a predetermined resistance value r. The interconnection film portions d22, which electrically connect adjacent resistor bodies R to each other, cause short circuit in each of the resistive film lines d21A on which the interconnection film portions d22 are provided. Thus, a resistor circuit is provided, in which the resistor bodies R each having a resistance r are connected in series as shown in FIG. 90(*b*).

Further, adjacent resistive film lines d21A are connected to each other by the resistive film d21 and the interconnection film d22, so that the resistor circuit network of the device d5 shown in FIG. 89A constitutes a resistor circuit (including the resistor unit of the resistor bodies R described above) shown in FIG. 90(*c*). Thus, the resistor bodies R and the resistor circuits (i.e., the device d5) are constituted by the resistive film d21 and the interconnection film d22. The resistor bodies R each include a resistive film line d21A (resistive film d21), and a plurality of interconnection film portions d22 spaced the predetermined distance from one another in the line extending direction on the resistive film line d21A. Portions of the resistive film line d21A not provided with the interconnection film portions d22 spaced the predetermined distance R from one another each define a single resistor body R. The portions of the resistive film line d21A defining the resistor bodies R each have the same shape and the same size. Therefore, the multiplicity of resistor bodies R arranged in the matrix array on the board d2 have the same resistance value.

The interconnection film portions d22 provided on the resistive film lines d21A define the resistor bodies R, and also serve as conductor films D for connecting the resistor bodies R to one another to provide the resistor circuits (see FIG. 88). FIG. 91(*a*) is an enlarged partial plan view illustrating a region of the chip resistor including fuses shown in a part of the plan view of FIG. 88 on an enlarged scale, and FIG. 91(*b*) is a diagram showing a sectional structure taken along a line B-B in FIG. 91(*a*).

As shown in FIGS. 91(*a*) and 91(*b*), the interconnection film portion d22 for the fuses F and the conductor films D described above is formed from the same interconnection film d22 as the interconnection film portions d22 provided on the resistive film d21 for the resistor bodies R. That is, the fuses F and the conductor films D are formed of Al or the AlCu alloy, which is the same metal material as for the interconnection film portions d22 provided on the resistive film lines d21A to define the resistor bodies R, and provided at the same level as the interconnection film portions d22. As described above, the interconnection film portion d22 serves as the conductor films D for electrically connecting the plurality of resistor bodies R to form the resistor circuit.

That is, the interconnection film portions d22 for defining the resistor bodies R, the interconnection film portion d22 for the fuses F and the conductor films D, and the interconnection film portions d22 for connecting the device d5 to the first connection electrode d3 and the second connection electrode d4 are formed of the same metal material (Al or the AlCu alloy) and provided at the same level on the resistive film d21. It is noted that the fuses F are different (discriminated) from the other interconnection film portions d22 in that the fuses F are thinner for easy disconnection and no circuit element is present around the fuses F.

A region of the interconnection film portion d22 in which the fuses F are disposed is herein referred to as "trimming region X" (see FIGS. 88 and 91(*a*)). The trimming region X linearly extends alongside the inner edge of the first connection electrode d3, and not only the fuses F but also some of the conductor films D are present in the trimming region X. The resistive film d21 is partly present below the interconnection film portion d22 in the trimming region X (see FIG. 91(*b*)). The fuses F are each spaced a greater distance from the surrounding interconnection film portions d22 than the other interconnection film portions d22 present outside the trimming region X.

The fuses F each do not simply designate a part of the interconnection film portion d22, but may each designate a fuse element which is a combination of a part of the resistor body R (resistive film d21) and a part of the interconnection film portion d22 on the resistive film d21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

FIG. 92 is an electric circuit diagram of the device according to the example of the fourth reference embodiment. Referring to FIG. 92, the device d5 includes a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first connection electrode d3. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 93 and 94 to be described later.

A single fuse F is connected in parallel to each of the resistor circuits R64 to R/32 except the reference resistor circuit R8. The fuses F are connected in series to one another directly or via the conductor films D (see FIG. 91(*a*)). With none of the fuses F fused off as shown in FIG. 92, the device d5 includes a resistor circuit such that the reference resistor circuit R8 including 8 resistor bodies R connected in series is provided between the first connection electrode d3 and the second connection electrode d4. Where the resistor bodies R each have a resistance value r of r=8Ω, for example, the chip resistor d1 is configured such that the first connection electrode d3 and the second connection electrode d4 are connected to each other through a resistor circuit (including the reference resistor circuit R8) having a resistance value of 8r=64Ω.

With none of the fuses F fused off, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto. Therefore, the resistor circuits except the reference resistor circuit R8 are not electrically incorporated in the device d5.

In the chip resistor d1 according to this example, the fuses F are selectively fused off, for example, by a laser beam according to the required resistance value. Thus, a resistor circuit connected in parallel to a fused fuse F is incorporated in the device d5. Therefore, the device d5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device d5 (resistor portion d56) can be digitally and finely controlled to a desired resistance value by selectively fusing off the fuses F (or the fuse elements described above). Thus, the chip resistor d1 can have the desired resistance value.

FIG. 93 is an electric circuit diagram of a device according to another example of the fourth reference embodiment. The device d5 may be configured as shown in FIG. 93, rather than by connecting the resistor circuits R64 to R/32 in series to the reference resistor circuit R8 as shown in FIG. 92. More specifically, the device d5 may include a circuit configured such that a parallel connection circuit including 12 types of resistor circuits R/16, R/8, R/4, R/2, R1, R2, R4, R8, R16, R32, R64, R128 is connected in series to a reference resistor circuit R/16 between the first connection electrode d3 and the second connection electrode d4.

In this case, a fuse F is connected in series to each of the 12 types of resistor circuits except the reference resistor circuit R/16. With none of the fuses F fused off, all the resistor circuits are electrically incorporated in the device d5. The fuses F are selectively fused off, for example, by a laser beam according to the required resistance value. Thus, a resistor circuit associated with a fused fuse F (a resistor circuit connected in series to the fused fuse F) is electrically isolated from the device d5 to control the overall resistance value of the chip resistor d1.

FIG. 94 is an electric circuit diagram of a device according to further another example of the fourth reference embodiment. The device d5 shown in FIG. 94 has a characteristic circuit configuration such that a serial connection circuit including plural types of resistor circuits is connected in series to a parallel connection circuit including plural types of resistor circuits. As in the previous example, a fuse F is connected in parallel to each of the plural types of resistor circuits connected in series, and all the plural types of resistor circuits connected in series are short-circuited by the fuses F. With a fuse F fused off, therefore, a resistor circuit which has been short-circuited by that fuse F is electrically incorporated in the device d5.

On the other hand, a fuse F is connected in series to each of the plural types of resistor circuits connected in parallel. With a fuse F fused off, therefore, a resistor circuit which has been connected in series to that fuse F is electrically isolated from the parallel connection circuit of the resistor circuits. With this arrangement, a resistance of smaller than 1 kΩ may be formed in the parallel connection circuit, and a resistor circuit of 1 kΩ or greater may be formed in the serial connection circuit. Thus, a resistor circuit having a resistance value extensively ranging from a smaller resistance value on the order of several ohms to a greater resistance value on the order of several megaohms can be produced from resistor circuit networks designed based on the same basic design concept. That is, the chip resistor d1 can be easily and speedily customized to have any of plural resistance values by selectively disconnecting one or more of the fuses F. In other words, the chip resistor d1 can be customized based on the same design concept so as to have various resistance values by selectively combining the resistor bodies R having different resistance values.

In the chip resistor d1, as described above, the connection of the plurality of resistor bodies R (resistor circuits) can be changed in the trimming region X. FIG. 95 is a schematic sectional view of the chip resistor. Referring next to FIG. 95, the chip resistor d1 will be described in greater detail. In FIG. 95, the device d5 described above is simplified, and components other than the board d2 are hatched for convenience of description.

The passivation film d23 and the resin film d24 will be described. The passivation film d23 is made of, for example, SiN (silicon nitride), and has a thickness of 1000 Å to 5000 Å (here, about 3000 Å). As described above, the passivation film d23 includes the front surface covering portion d23A provided on the entire front surface d2A and the side surface covering portion d23B provided over the side surfaces d2C to d2F. The front surface covering portion d23A covers the resistive film d21 and the interconnection film portions d22 present on the resistive film d21 (i.e., the device d5) from the front side (from the upper side in FIG. 95), thereby covering the upper surfaces of the resistor bodies R of the device d5. Thus, the front surface covering portion d23A also covers the interconnection film portion d22 in the trimming region X described above (see FIG. 91(*b*)). Further, the front surface covering portion d23A contacts the device d5 (the interconnection film d22 and the resistive film d21), and also contacts the insulative layer d20 in a region not formed with the resistive film d21. Thus, the front surface covering portion d23A covers the entire front surface d2A to function as a protective film for protecting the device d5 and the insulative layer d20. On the front surface d2A, the front surface covering portion d23A prevents an unintended short circuit which may be a short circuit other than that occurring between the interconnection film portions d22 present between the resistor bodies R (an unintended short circuit which may occur between adjacent resistive film lines d21A).

On the other hand, the side surface covering portion d23B provided on the side surfaces d2C to d2F functions as a protective layer which protects the side surfaces d2C to d2F. The side surface covering portion d23B completely covers the rough surface regions S and the streak pattern regions P of the side surfaces d2C to d2F, and the steps N present between the rough surface regions S and the streak pattern regions P. The edge portion d85 described above is present on the boundaries between the front surface d2A and the side surfaces d2C to d2F, and the passivation film d23 also covers the boundaries (the edge portion d85). A portion of the passivation film d23 covering the edge portion d85 (overlying the edge portion d85) is herein referred to as an edge portion d23C.

Together with the passivation film d23, the resin film d24 protects the front surface d2A of the chip resistor d1. The resin film d24 is made of a resin such as a polyimide. The resin film d24 is provided on the front surface covering portion d23A of the passivation film d23 (including the edge portion d23C described above) so as to cover a portion of the front surface d2A not provided with the first connection electrode d3 and the second connection electrode d4 as seen in plan. Therefore, the resin film d24 entirely covers the surface of the front surface covering portion d23A (including the device d5 and the fuses F covered with the front surface covering portion d23A) on the front surface d2A. On the other hand, the resin film d24 does not cover the side surfaces d2C to d2F. Therefore, an outer edge portion d24A of the resin film d24 is aligned with the side surface covering portion d23B as seen in plan. The edge portion d24A of the resin film d24 has side surfaces d24B which are flush with the side surface covering portion d23B (strictly, a portion of the side surface covering portion d23B present on the rough surface regions S of the respective side surfaces), and extend thicknesswise of the board d2. A flat front surface d24C of the resin film d24 extends parallel to the front surface d2A of the board d2. When a stress is applied to the front surface d2A of the board d2 of the chip resistor d1, the front surface d24C of the resin film d24 (particularly, a portion of the front surface d24C between the first connection electrode d3 and the second connection electrode d4) functions as a stress distributing surface to distribute the stress.

The resin film d24 has two openings d25 respectively formed at two positions spaced from each other as seen in plan. The openings d25 are through-holes extending continuously thicknesswise through the resin film d24 and the passivation film d23 (the front surface covering portion d23A). Therefore, not only the resin film d24 but also the passivation film d23 has the openings d25. The interconnection film portions d22 are partly exposed from the respective openings d25. The parts of the interconnection film portions d22 exposed from the respective openings d25 serve as pad regions d22A (pads) for the external connection. The openings d25 each extend thicknesswise through the front surface covering portion d23A (thicknesswise of the board d2), and each become progressively wider longitudinally of the board d2 (laterally in FIG. 95) toward the front surface d24C of the resin film d24 from the front surface covering portion d23A. Therefore, side walls d24D of the resin film d24 defining the respective openings d25 each have a surface inclined with respect to the thickness direction of the board d2. The openings d25 are each defined longitudinally of the board d2 by a pair of side walls d24D of the resin film d24, and a distance between these side walls d24D is progressively increased toward the front surface d24C of the resin film d24 from the front surface covering portion d23A. Further, the openings d25 are each defined widthwise of the board d2 by another pair of side walls d24D of the resin film d24 (not shown in FIG. 95), and a distance between these side walls d24D may be progressively increased toward the front surface d24C of the resin film d24 from the front surface covering portion d23A.

One of the two openings d25 is completely filled with the first connection electrode d3, and the other opening d25 is completely filled with the second connection electrode d4. The first connection electrode d3 and the second connection electrode d4 each become progressively wider toward the front surface d24C of the resin film d24, as the openings d25 each become progressively wider toward the front surface d24C of the resin film d24. Therefore, vertical sections of the first connection electrode d3 and the second connection electrode d4 (as taken along a sectional plane extending longitudinally and thicknesswise of the board d2) each have a trapezoidal shape having an upper base on the side of the front surface d2A of the board d2 and a lower base on the side of the front surface d24C of the resin film d24. Front surfaces d3A, d4A of the first connection electrode d3 and the second connection electrode d4 each defined in section by the lower base of the trapezoidal shape each have edge portions curved toward the front surface d2A of the board d2 in the opening d25. If the openings d25 do not become progressively wider toward the front surface d24C of the resin film d24 (the side walls d24D defining the respective openings d25 extend thicknesswise of the board d2), the front surfaces d3A, d4A including the edge portions in the openings d25 are entirely flat and parallel to the front surface d2A of the board d2.

As described above, the first connection electrode d3 and the second connection electrode d4 are each formed by depositing Ni, Pd and Au in this order on the front surface d2A and, therefore, each have an Ni layer d33, a Pd layer d34 and an Au layer d35 in this order from the front surface d2A. In each of the first connection electrode d3 and the second connection electrode d4, therefore, the Pd layer d34 is provided between the Ni layer d33 and the Au layer d35. The Ni layer d33 occupies the most of each of the first connection electrode d3 and the second connection electrode d4, and the Pd layer d34 and the Au layer d35 are much thinner than the Ni layer d33. When the chip resistor d1 is mounted on the mount board d9 (see FIG. 87(*b*)), the Ni layer d33 functions to connect the solder d13 to Al of the interconnection film portion d22 in the pad region d22A in each of the openings d25.

In each of the first connection electrode d3 and the second connection electrode d4, the surface of the Ni layer d33 is covered with the Au layer d35 via the Pd layer d34, so that the oxidation of the Ni layer d33 can be prevented. Even if the Au layer d35 has a smaller thickness and hence is formed with a through-hole (pin hole), the Pd layer d34 provided between the Ni layer d33 and the Au layer d35 closes the through-hole. This prevents the Ni layer d33 from being exposed to the outside through the through-hole and oxidized.

The outermost Au layers d35 are respectively exposed on the front surfaces d3A, d4A of the first connection electrode d3 and the second connection electrode d4 to the outside from the front surface d24C of the resin film d24 through the openings d25. The first connection electrode d3 is electrically connected to the pad region d22A of the interconnection film portion d22 present in the one opening d25 through the one opening d25. The second connection electrode d4 is electrically connected to the pad region d22A of the interconnection film portion d22 present in the other opening d25 through the other opening d25. The Ni layers d33 of the first connection electrode d3 and the second connection electrode d4 are respectively connected to the pad regions d22A. Thus, the first connection electrode d3 and the second connection electrode d4 are electrically connected to the device d5. Here, the interconnection film portions d22 serve as interconnections connected to the assembly of the resistor bodies R (resistor portion d56), the first connection electrode d3 and the second connection electrode d4.

Thus, the resin film d24 and the passivation film d23 formed with the openings d25 cover the front surface d2A with the first connection electrode d3 and the second connection electrode d4 being exposed from the respective openings d25. Therefore, the electrical connection between the chip resistor d1 and the mount board d9 is achieved through the first connection electrode d3 and the second connection electrode d4 exposed from the front surface d24C of the resin film d24 through the openings d25 (see FIG. 87(*b*)).

Here, the thickness of the resin film d24, i.e., the height H of the resin film d24 measured from the front surface d2A of the board d2 to the front surface d24C of the resin film d24, is not smaller than the heights J of the first connection electrode d3 and the second connection electrode d4 (measured from the front surface d2A). In the first example, as shown in FIG. 95, the height H is equal to the heights J, and the front surface d24C of the resin film d24 is flush with the front surfaces d3A, d4A of the first connection electrode d3 and the second connection electrode d4.

FIGS. 96A to 96H are schematic sectional views showing a production method for the chip resistor shown in FIG. 95. First, as shown in FIG. 96A, a substrate d30 is prepared as a material for the board d2. In this case, a front surface d30A of the substrate d30 corresponds to the front surface d2A of the board d2, and a back surface d30B of the substrate d30 corresponds to the back surface d2B of the board d2.

Then, an insulative layer d20 of $SiO_2$ or the like is formed in the front surface d30A of the substrate d30 by thermally oxidizing the front surface d30A of the substrate d30, and devices d5 (each including resistor bodies R and interconnection film portions d22 connected to the resistor bodies R) are formed on the insulative layer d20. More specifically, a resistive film d21 of TiN, TiON or TiSiON is formed on the entire surface of the insulative layer d20 by sputtering, and then an interconnection film d22 of aluminum (Al) is formed on the resistive film d21 in contact with the resistive film d21. Thereafter, parts of the resistive film d21 and the interconnection film d22 are selectively removed for patterning by a photolithography process and dry etching such as RIE (Reactive Ion Etching). Thus, as shown in FIG. 89A, resistive film lines d21A each formed with the resistive film d21 and having a predetermined width are arranged at a predetermined interval in a column direction as seen in plan. At this time, the resistive film lines d21A and the interconnection film portions d22 are partly cut, and fuses F and conductor films D are formed in trimming regions X described above (see FIG. 88). In turn, parts of the interconnection film portions d22 formed on the respective resistive film lines d21A are selectively removed for patterning, for example, by wet etching. As a result, the devices d5 are produced, which are each configured such that interconnection film portions d22 spaced a predetermined distance R from one another are provided on the resistive film lines d21A (i.e., a plurality of resistor bodies R are provided). Thus, the resistor bodies R and the fuses F can be simultaneously formed simply by forming the interconnection film d22 on the resistive film d21 and patterning the resistive film d21 and the interconnection film d22. The overall resistance value of each of the devices d5 may be measured in order to check if the resistive film d21 and the interconnection film d22 are formed as each having intended dimensions.

Referring to FIG. 96A, a multiplicity of such devices d5 are formed on the front surface d30A of the substrate d30 according to the number of the chip resistors d1 to be formed on the single substrate d30. Regions of the substrate d30 respectively formed with the devices d5 (the aforementioned resistor portions d56) are each herein referred to as a chip component region Y. Therefore, a plurality of chip component regions Y (i.e., the devices d5) each having the resistor portion d56 are formed (defined) on the front surface d30A of the substrate d30. The chip component regions Y each correspond to a single complete chip resistor d1 (see FIG. 95) as seen in plan. A region of the front surface d30A of the substrate d30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate d30. This allows for mass production of the chip resistors d1.

Then, as shown in FIG. 96A, an insulative film d45 of SiN is formed over the entire front surface d30A of the substrate d30 by a CVD (Chemical Vapor Deposition) method. The insulative film d45 entirely covers the insulative layer d20 and the devices d5 (the resistive film d21 and the interconnection film d22) present on the insulative layer d20, and contacts the insulative layer d20 and the devices d5. Therefore, the insulative film d45 also covers the interconnection film portions d22 in the aforementioned trimming regions X (see FIG. 88). Since the insulative film d45 is formed over the entire front surface d30A of the substrate d30, the insulative film d45 extends to a region other than the trimming regions X on the front surface d30A. Thus, the insulative film d45 serves as a protective film for protecting the entire front surface d30A (including the devices d5 on the front surface d30A).

In turn, as shown in FIG. 96B, a resist pattern d41 is formed over the entire front surface d30A of the substrate d30 to entirely cover the insulative film d45. The resist pattern d41 has an opening d42. FIG. 97 is a schematic plan view showing a part of the resist pattern to be used for forming a first trench in the process step of FIG. 96B.

Referring to FIG. 97, the opening d42 (hatched in FIG. 97) of the resist pattern d41 is aligned with (or corresponds to) a region (i.e., the boundary region Z) between the contours of adjacent chip resistors d1 (i.e., the chip component regions Y described above) as seen in plan when the chip resistors d1 are arranged in a matrix array (or in a lattice form). As a whole, the opening d42 has a lattice shape including linear portions d42A and linear portions d42B orthogonally crossing each other.

The linear portions d42A and the linear portions d42B of the opening d42 of the resist pattern d41 are connected to each other as crossing orthogonally to each other (without any curvature). Therefore, the linear portions d42A and the linear portions d42B interest each other at an angle of about 90 degrees as seen in plan to form angled intersection portions d43. Referring to FIG. 96B, parts of the insulative film d45, the insulative layer d20 and the substrate d30 are selectively removed by plasma etching with the use of the resist pattern d41 as a mask. Thus, a portion of the substrate d30 is etched off (removed) from the boundary region Z defined between the adjacent devices d5 (chip component regions Y). As a result, a first trench d44 is formed in the position (boundary region Z) corresponding to the opening d42 of the resist pattern d41 as seen in plan as extending through the insulative film d45 and the insulative layer d20 into the substrate d30 to a depth halfway the thickness of the substrate d30 from the front surface d30A of the substrate d30. The first trench d44 is defined by pairs of side walls d44A opposed to each other, and a bottom wall d44B extending between lower edges of the paired side walls d44A (edges of the paired side walls d44A on the side of the back surface d30B of the substrate d30). The first trench d44 has a depth that is about half the thickness T of the completed chip resistor d1 (see FIG. 87(*a*)) as measured from the front surface d30A of the substrate d30, and has a width M of about 20 μm which is constant throughout the depth of the first trench d44 (as measured between the opposed side walls d44A). Where the etching, particularly the plasma etching, is employed, the first trench d44 can be highly accurately formed.

The first trench d44 of the substrate d30 has a lattice shape as a whole corresponding to the shape of the opening d42 (see FIG. 97) of the resist pattern d41 as seen in plan. On the front surface d30A of the substrate d30, rectangular frame-like portions of the first trench d44 (the boundary region Z) respectively surround the chip component regions Y in which the devices d5 are respectively provided. Portions of the substrate d30 respectively formed with the devices d5 are semi-finished products d50 of the chip resistors d1. The semi-finished products d50 are respectively located in the chip component regions Y surrounded by the first trench d44 on the front surface d30A of the substrate d30. These semi-finished products d50 are arranged in a matrix array.

After the first trench d44 is formed as shown in FIG. 96B, the resist pattern d41 is removed. Then, a dicing machine (not shown) having a dicing saw d47 is driven as shown in FIG. 96C. The dicing saw d47 is a disk-shaped grindstone having cutting serration on its peripheral surface. The dicing saw d47 has a width Q (thickness) that is smaller than the width M of the first trench d44. Here, a dicing line U is defined along a center line of the first trench d44 (equidistantly from the paired opposed side walls d44A). The dicing saw d47 is moved along the dicing line U in the first trench d44 with its thicknesswise middle portion d47A in alignment with the dicing line U as seen in plan. At this time, the substrate d30 is cut from the bottom wall d44B of the first trench d44. Upon completion of the movement of the dicing saw d47, a second trench d48 having a predetermined depth from the bottom wall d44B of the first trench d44 is formed in the substrate d30.

The second trench d48 extends continuously from the bottom wall d44B of the first trench d44 to a predetermined depth toward the back surface d30B of the substrate d30. The second trench d48 is defined by pairs of side walls d48A opposed to each other, and a bottom wall d48B extending between lower edges of the paired side walls d48A (edges of the paired side walls d48A on the side of the back surface d30B of the substrate d30). The second trench d48 has a depth that is about half the thickness T of the completed chip resistor d1 as measured from the bottom wall d44B of the first trench d44, and has a width that is equal to the width Q of the dicing saw d47 (as measured between the opposed side walls d48A) and is constant throughout the depth of the second trench d48. In the first trench d44 and the second trench d48, steps d49 are formed between the side walls d44A and the side walls d48A which are located adjacent each other thicknesswise of the substrate d30, and extend perpendicularly to the thickness of the substrate d30 (parallel to the front surface d30A of the substrate d30). Therefore, the continuous first and second trenches d44, d48 define a square concavity having a width decreasing toward the back surface d30B. The side walls d44A provide rough surface regions S of the side surfaces (the side surfaces d2C to d2F) of the respective completed chip resistors d1, and the side walls d48A provide streak pattern regions P of the side surfaces of the respective chip resistors d1. The steps d49 provide the steps N of the side surfaces of the respective chip resistors d1.

Here, the first trench d44 is formed by the etching, so that the side walls d44A and the bottom wall d44B each have a rough surface of an irregular pattern. On the other hand, the second trench d48 is formed by the dicing saw d47, so that the side walls d48A each have a multiplicity of streaks remaining in a regular pattern as a cutting trace formed by the dicing saw d47. Even if the side walls d48A are etched, the streaks cannot be completely removed but the streaks V remain on the completed chip resistors d1 (see FIG. 87(*a*)).

Then, the insulative film d45 is selectively etched off with the use of a mask d65 as shown in FIG. 96D. The mask d65 has openings d66 formed in association with portions of the insulative film d45 aligned with the pad regions d22A (see FIG. 95) as seen in plan. Thus, the portions of the insulative film d45 aligned with the openings d66 are etched off, whereby openings d25 are formed in these portions of the insulative film d45. Thus, the pad regions d22A are exposed from the insulative film d45 in the openings d25. The semi-finished products d50 each have two openings d25.

After the two openings d25 are formed in the insulative film d45 of each of the semi-finished products d50, probes d70 of a resistance measuring device (not shown) are brought into contact with the pad regions d22A in the respective openings d25 to detect the overall resistance value of the device d5. Subsequently, a laser beam (not shown) is applied to desired ones of the fuses F (see FIG. 88) through the insulative film d45, whereby the desired fuses F of the interconnection film portion d22 in the trimming region X described above are trimmed by the laser beam to be fused off. Thus, the overall resistance value of the semi-finished product d50 (i.e., the chip resistor d1) can be controlled, as described above, by selectively fusing off (trimming) the fuses F for the required resistance value. At this time, the insulative film d45 serves as a cover film for covering the devices d5, thereby preventing a short circuit which may otherwise occur when a debris occurring during the fusing adheres to any of the devices d5. Further, the insulative film d45 covers the fuses F (resistive film d21), so that the desired fuses F can be reliably fused off by accumulating the energy of the laser beam therein.

Thereafter, SiN is further deposited on the insulative film d45 by the CVD method to thicken the insulative film d45. At this time, as shown in FIG. 96E, the insulative film d45 is also formed on the entire inner peripheral surfaces of the first trench d44 and the second trench d48 (the side walls d44A, the bottom wall d44B, the side walls d48A and the bottom wall d48B described above). Therefore, the insulative film d45 is also formed on the steps d49 described above. The insulative film d45 (in a state shown in FIG. 96E) has a thickness of 1000 Å to 5000 Å (here, about 3000 Å) on the inner peripheral surfaces of the first trench d44 and the second trench d48. At this time, the insulative film d45 partly enters the openings d25 to close the openings d25.

Thereafter, a liquid photosensitive resin of a polyimide is sprayed over the resulting substrate d30 from above the insulative film d45. Thus, a photosensitive resin film d46 is formed as shown in FIG. 96E. At this time, the liquid is applied to the substrate d30 through a mask (not shown) having a pattern covering only the first trench d44 and the second trench d48 as seen in plan so as to be prevented from entering the first trench d44 and the second trench d48. As a result, the liquid photosensitive resin is applied only on the substrate d30 to form the resin film d46 on the substrate d30. The front surface d46A of the resin film d46 on the front surface d30A is flat and parallel to the front surface d30A.

Since the liquid enters neither of the first trench d44 and the second trench d48, the resin film d46 is formed in neither of the first trench d44 and the second trench d48. The formation of the resin film d46 may be achieved by spin-coating the liquid or bonding a photosensitive resin sheet to the front surface d30A of the substrate d30 rather than by spraying the liquid photosensitive resin.

In turn, the resin film d46 is thermally treated (cured). Thus, the resin film d46 is thermally shrunk to a smaller thickness, and hardened to have a stable film quality. In turn, as shown in FIG. 96F, parts of the resin film d46 aligned with the pad regions d22A of the interconnection film d22 (openings d25) on the front surface d30A as seen in plan are selectively removed by patterning the resin film d46. More specifically, the resin film d46 is exposed to light with the use of a mask d62 of a pattern having openings d61 aligned with (corresponding to) the pad regions d22A as seen in plan, and then developed in the pattern. Thus, the parts of the resin film d46 are removed from above the pad regions d22A to form the openings d25. At this time, edge portions of the resin film d46 around the openings d25 are thermally shrunk, so that wall surfaces d46B of the edge portions defining the openings d25 are inclined at an angle with respect to the thickness direction of the substrate d30. Thus, the openings d25 each become progressively wider toward the front surface d46A of the resin film d46 (which later serves as the front surface d24C of the resin film d24) as described above.

Then, parts of the insulative film d45 on the pad regions d22A are removed by RIE using a mask not shown, whereby the openings d25 are uncovered to expose the pad regions d22A. In turn, Ni/Pd/Au multilayer films are formed in the openings d25 on the pad regions d22A by depositing Ni, Pd and Au by electroless plating. Thus, the first and second connection electrodes d3, d4 are formed on the pad regions d22A as shown in FIG. 96G.

FIG. 98 is a diagram for explaining a process for producing the first and second connection electrodes. Referring to FIG. 98, more specifically, surfaces of the pad regions d22A are cleaned (to be degreased), whereby organic substances (smut such as carbon smut and greasy dirt) are removed from the surfaces (Step S1). Then, oxide films are removed from the surfaces (Step S2). In turn, the surfaces are zincated, whereby Al (of the interconnection film d22) in the surfaces is replaced with Zn (Step S3). Subsequently, Zn in the surfaces is removed by nitric acid or the like, whereby Al is newly exposed on the pad regions d22A (Step S4).

Then, the pad regions d22A are immersed in a plating liquid, whereby the new Al surfaces of the pad regions d22A are plated with Ni. Thus, Ni in the plating liquid is chemically reduced to be deposited on the surfaces, whereby Ni layers d33 are respectively formed on the surfaces (Step S5). In turn, surfaces of the Ni layers d33 are plated with Pd by immersing the Ni layers d33 in another plating liquid. Thus, Pd in the plating liquid is chemically reduced to be deposited on the surfaces of the Ni layers d33, whereby Pd layers d34 are respectively formed on the surfaces of the Ni layers d33 (Step S6).

Then, surfaces of the Pd layers d34 are plated with Au by immersing the Pd layers d34 in further another plating liquid. Thus, Au in the plating liquid is chemically reduced to be deposited on the surfaces of the Pd layers d34, whereby Au layers d35 are respectively formed on the surfaces of the Pd layers d34 (Step S7). Thus, the first and second connection electrodes d3, d4 are formed. After the first and second connection electrodes d3, d4 thus formed are dried (Step S8), the process for producing the first and second connection electrodes d3, d4 is completed. Between the consecutive steps, a rinsing step is performed as required for rinsing the semi-finished products d50 with water. Further, the zincation may be performed a plurality of times.

FIG. 96G shows the semi-finished product d50 formed with the first connection electrode d3 and the second connection electrode d4. The front surfaces d3A, d4A of the first and second connection electrodes d3, d4 are flush with the front surface d46A of the resin film d46. As the wall surfaces d46B of the resin film d46 defining the openings d25 are inclined, as described above, edge portions of the front surfaces d3A, d4A of the first and second connection electrodes d3, d4 in the openings d25 are curved toward the back surface d30B of the substrate d30. Therefore, edge portions of the Ni layer d33, the Pd layer d34 and the Au layer d35 of each of the first and second connection electrodes d3, d4 in the openings d25 are curved toward the back surface d30B of the substrate d30.

As described above, the first and second connection electrodes d3, d4 are formed by the electroless plating. As compared with a case in which electrolytic plating is employed for the formation of the first and second connection electrodes d3, d4, therefore, the number of process steps required for the formation of the first and second connection electrodes d3, d4 can be reduced (e.g., a lithography step, a resist mask removing step and the like required for the electrolytic plating can be obviated), thereby improving the productivity of the chip resistor d1. Further, the electroless plating does not require a resist mask which may be required for the electrolytic plating. This improves the positional accuracy of the first and second connection electrodes d3, d4 and hence the yield without the possibility of displacement of the first and second connection electrodes d3, d4 due to offset of the resist mask. The first and second connection electrodes d3, d4 can be formed only on the pad regions d22A by the electroless plating of the pad regions d22A exposed from the resin film d24.

In general, Ni and Sn are contained in the plating liquid for the electrolytic plating. Therefore, Sn remaining on the front surfaces d3A, d4A of the first and second connection electrodes d3, d4 is susceptible to oxidation, resulting in connection failure between the first and second connection electrodes d3, d4 and the connection terminals d88 of the mount board d9 (see FIG. 87(*b*)). However, the fourth reference embodiment, which employs the electroless plating, is free from this problem.

After the first and second connection electrodes d3, d4 are thus formed, a continuity test is performed between the first connection electrode d3 and the second connection electrode d4 of each of the semi-finished products d50, and then the substrate d30 is ground from the back surface d30B. More specifically, as shown in FIG. 96H, a thin-plate support tape d71 of PET (polyethylene terephthalate) having an adhesive surface d72 is applied to the semi-finished products d50 with the adhesive surface d72 bonded to the first and second connection electrodes d3, d4 of the respective semi-finished products d50 (i.e., on the side of the front surface d30A). Thus, the semi-finished products d50 are supported by the support tape d71. Here, a laminate tape, for example, may be used as the support tape d71.

With the semi-finished products d50 supported by the support tape d71, the substrate d30 is ground from the back surface d30B. After the substrate d30 is thinned to the bottom wall d48B of the second trench d48 (see FIG. 96G) by the grinding, nothing connects the adjacent semi-finished products d50. Therefore, the substrate d30 is divided into the individual semi-finished products d50 along the first and second trenches d44, d48. Thus, the chip resistors d1 are completed. That is, the substrate d30 is divided (split) along the first and second trenches d44, d48 (i.e., along the boundary region Z), whereby the individual chip resistors d1 are separated from each other. The substrate d30 (board d2) has a thickness of 150 μm to 400 μm (not less than 150 μm and not greater than 400 μm) after the grinding of the back surface d30B.

The side walls d44A of the first trench d44 provide the rough surface regions S of the side surfaces d2C to d2F of the boards d2 of the respective completed chip resistors d1, and the side walls d48A of the second trench d48 provide the streak pattern regions P of the side surfaces d2C to d2F of the boards d2 of the respective chip resistors d1. The steps d49 between the side walls d44A and the side walls d48A provide the steps N of the respective chip resistors d1. Further, the back surface d30B provides the back surfaces d2B of the respective completed chip resistors d1. That is, the steps of forming the first trench d44 and the second trench d48 as described above (see FIGS. 96B and 96C) are involved in the step of forming the side surfaces d2C to d2F. Further, the insulative film d45 provides the passivation films d23 of the respective chip resistors d1, and the resin film d46 provides the resin films d24 of the respective chip resistors d1.

Even if the depth of the first trench d44 (see FIG. 96B) formed by the etching is not uniform, for example, the total depth of the first trench d44 and the second trench d48 formed by the dicing saw d47 (as measured from the front surface d30A of the substrate d30 to the bottom of the second trench d48) is constant. Therefore, where the chip resistors d1 are separated from each other by grinding the back surface d30B of the substrate d30, the time differences with which the respective chip resistors d1 are separated from the substrate d30 can be minimized. Thus, the chip resistors d1 can be generally simultaneously separated from the substrate d30. This suppresses the chipping of the chip resistors d1, which may otherwise occur when chip resistors d1 separated earlier repeatedly bump against the substrate d30. Further, corner portions d11 of the front surface d2A of each of the chip resistors d1 are defined by the first trench d44 formed by the etching and, therefore, less susceptible to the chipping as compared with a case in which the first trench d44 is formed by the dicing saw d47. As a result, the chipping can be suppressed when the chip resistors d1 are separated from each other, and the separation failure of the chip resistors d1 can be prevented. That is, it is possible to control the shape of the corner portions d11 of the front surface d2A of each of the chip resistors d1 (see FIG. 87(*a*)). As compared with a case in which the first trench d44 and the second trench d48 are each formed by the etching, the time required for separating the chip resistors d1 from each other can be reduced, thereby improving the productivity of the chip resistors d1.

Particularly, where the boards d2 of the chip resistors d1 thus separated each have a relatively great thickness on the order of 150 μm to 400 μm, it is difficult and time-consuming to form a trench extending from the front surface d30A of the substrate d30 to the bottom wall d48B of the second trench d48 (see FIG. 96C). Even in this case, the time required for separating the chip resistors d1 from each other can be reduced by forming the first trench d44 and the second trench d48 by the etching and the dicing with the dicing saw d47 and then grinding the back surface d30B of the substrate d30. Thus, the productivity of the chip resistors d1 can be improved.

If the second trench d48 is formed to reach the back surface d30B of the substrate d30 by the dicing (the second trench d48 is formed as extending through the substrate d30), the chipping is liable to occur in corner portions defined between the back surface d2B and the side surfaces d2C to d2F of each of the completed chip resistors d1. Where the second trench d48 is formed so as not to reach the back surface d30B by half-dicing (see FIG. 96C) and then the back surface d30B is ground as in the fourth reference embodiment, in contrast, the corner portions defined between the back surface d2B and the side surfaces d2C to d2F are less susceptible to the chipping.

If a trench extending from the front surface d30A of the substrate d30 to the bottom wall d48B of the second trench d48 is formed only by the etching, the trench is unlikely to have a rectangular cross section because the side walls of the completed trench do not extend thicknesswise of the board d2 due to variations in etching rate. That is, the side walls of the trench are varied in configuration. Where the etching and the dicing are employed in combination as in the fourth reference embodiment, in contrast, the variations in the configuration of the side walls of the first trench d44 and the second trench d48 (the side walls d44A and the side walls d48A) are reduced as compared with the case in which only the etching is employed. This permits the side walls of the trenches to extend thicknesswise of the board d2.

Since the width Q of the dicing saw d47 is smaller than the width M of the first trench d44, the width Q of the second trench d48 formed by the dicing saw d47 is smaller than the width M of the first trench d44. Therefore, the second trench d48 is located inward of the first trench d44 (see FIG. 96C). Hence, the width of the first trench d44 is not increased by the dicing saw d47 when the second trench d48 is formed by the dicing saw d47. The chipping of the corner portions d11 of the front surface d2A of the chip resistor d1 to be defined by the first trench d44 can be reliably suppressed, which may otherwise occur when the corner portions d11 are formed by the dicing saw d47.

The separation of the chip resistors d1 is achieved by grinding the back surface d30B after the formation of the second trench d48, but the grinding of the back surface d30B may precede the formation of the second trench d48 by the dicing. Further, it is also conceivable to separate the chip resistors d1 by etching the substrate d30 from the back surface d30B to the bottom wall d48B of the second trench d48.

As described above, the chip resistors d1 (chip components) respectively formed in the chip component regions Y defined on the substrate d30 can be simultaneously separated from each other (the individual chip resistors d1 can be simultaneously provided) by forming the first trench d44 and the second trench d48 and then grinding the substrate d30 from the back surface d30B. This reduces the time required for the production of the chip resistors d1, thereby improving the productivity of the chip resistors d1. Where the substrate d30 has a diameter of 8 inches, for example, about 500,000 chip resistors d1 can be produced from the substrate d30.

That is, even if the chip resistors d1 each have a smaller chip size, the chip resistors d1 can be simultaneously separated from each other by first forming the first trench d44 and the second trench d48 and then grinding the substrate d30 from the back surface d30B. Since the first trench d44 can be highly accurately formed by the etching, the rough surface regions S of the side surfaces d2C to d2F of each of the chip resistors d1 defined by the first trench d44 are improved in outer dimensional accuracy. Particularly, the first trench d44 can be more accurately formed by the plasma etching. Further, the pitch of trench lines of the first trench d44 can be reduced according to the resist pattern d41 (see FIG. 97), allowing for size reduction of the chip resistors d1 formed between adjacent trench lines of the first trench d44. Where the etching is employed, corner portions dll defined between adjacent rough surface regions S of the side surfaces d2C to d2F of each of the chip resistors d1 (see FIG. 87(*a*)) are less susceptible to the chipping. This improves the appearance of the chip resistors d1.

The back surface d2B of the board d2 of each of the completed chip resistors d1 may be polished or etched to be mirror-finished. As shown in FIG. 96H, the completed chip resistors d1 are each removed from the support tape d71 and transported to a predetermined space to be stored in this space. When the chip resistor d1 is mounted on the mount board d9 (see FIG. 87(*b*)), a suction nozzle d91 of an automatic mounting machine (see FIG. 87(*b*)) sucks the back surface d2B of the chip resistor d1, and moved to transport the chip resistor d1. At this time, a longitudinally middle portion of the back surface d2B is sucked by the suction nozzle d91. Then, referring to FIG. 87(*b*), the suction nozzle d91 sucking the chip resistor d1 is moved to the mount board d9. The pair of connection terminals d88 described above are provided on the mount board d9 in association with the first connection electrode d3 and the second connection electrode d4 of the chip resistor d1. The connection terminals d88 are made of, for example, Cu. Solder pieces d13 are provided on surfaces of the respective connection terminals d88 as projecting from the surfaces.

Then, the suction nozzle d91 is moved to press the chip resistor d1 against the mount board d9. Thus, the first connection electrode d3 of the chip resistor d1 is brought into contact with the solder piece d13 on one of the connection terminals d88, and the second connection electrode d4 of the chip resistor d1 is brought into contact with the solder piece d13 on the other connection terminal d88. In this state, the solder pieces d13 are heated to be melted. When the solder pieces d13 are thereafter cooled to be solidified, the first connection electrode d3 is connected to the solder piece d13 on the one connection terminal d88, and the second connection electrode d4 is connected to the solder piece d13 on the other connection terminal d88. Thus, the mounting of the chip resistor d1 on the mount board d9 is completed.

FIG. 99 is a schematic diagram for explaining how to accommodate the completed chip resistors in an embossed carrier tape. The completed chip resistor d1 shown in FIG. 96H may be accommodated in the embossed carrier tape d92 shown in FIG. 99. The embossed carrier tape d92 is a tape (an elongated sheet) made of, for example, a polycarbonate resin or the like. The embossed carrier tape d92 includes a multiplicity of pockets d93 aligned longitudinally thereof. The pockets d93 are each defined as a space recessed toward one surface (back surface) of the embossed carrier tape d92.

When the completed chip resistor d1 (see FIG. 96H) is to be accommodated in the embossed carrier tape d92, the suction nozzle d91 of the transportation device (see FIG.

87(*b*)) sucks the back surface d2B (the longitudinally middle portion) of the chip resistor d1, and is moved to remove the chip resistor d1 from the support tape d71. Then, the suction nozzle d91 is moved to a position opposed to a pocket d93 of the embossed carrier tape d92. At this time, the first connection electrode d3, the second connection electrode d4 and the resin film d24 of the chip resistor d1 sucked by the suction nozzle d91 are opposed to the pocket d93.

When the chip resistor d1 is to be accommodated in the embossed carrier tape d92, the embossed carrier tape d92 is placed on a flat support base d95. The suction nozzle d91 is moved toward the pocket d93 (as indicated by a bold arrow), and the chip resistor d1 is accommodated into the pocket d93 with its front surface d2A facing the pocket d93. With the front surface d2A of the chip resistor d1 in contact with a bottom d93A of the pocket d93, the chip resistor d1 is completely accommodated in the embossed carrier tape d92. When the front surface d2A of the chip resistor d1 is brought into contact with the bottom d93A of the pocket d93 by moving the suction nozzle d91, the first connection electrode d3, the second connection electrode d4 and the resin film d24 provided on the front surface d2A are pressed against the bottom d93A supported by the support base d95.

Upon the accommodation of the chip resistor d1 in the embossed carrier tape d92, a peelable cover d94 is applied onto a surface of the embossed carrier tape d92, whereby the inside spaces of the respective pockets d93 are sealed with the peelable cover d94. This prevents intrusion of foreign matter in the pockets d93. When the chip resistor d1 is to be taken out of the embossed carrier tape d92, the peelable cover d94 is peeled from the embossed carrier tape d92 to uncover the pocket d93. Thereafter, the chip resistor d1 is taken out of the pocket d93 and mounted as described above by the automatic mounting machine.

When the chip resistor d1 is mounted on the mount board or accommodated into the embossed carrier tape d92 or when a stress test is performed on the chip resistor d1, a force is applied to the back surface d2B (the longitudinally middle portion) of the chip resistor d1 to press the first connection electrode d3 and the second connection electrode d4 against an object (hereinafter referred to as a contact object). At this time, a stress acts on the front surface d2A of the board d2. Where the chip resistor d1 is mounted, the contact object is the mount board d9. Where the chip resistor d1 is accommodated into the embossed carrier tape d92, the contact object is the bottom d93A of the pocket d93 supported by the support base d95. In the stress test, the contact object is a support surface which supports the chip resistor d1 receiving the stress.

It is assumed that the chip resistor d1 is configured such that the height H of the resin film d24 on the front surface d2A of the board d2 (see FIG. 95) is less than the heights J of the first connection electrode d3 and the second connection electrode d4 (see FIG. 95), and the front surfaces d3A, d4A of the first connection electrode d3 and the second connection electrode d4 project to a greatest extent from the front surface d2A of the board d2 (i.e., the resin film d24 is thinner) (see FIG. 100 to be described later). In this case, the contact object contacts only the first connection electrode d3 and the second connection electrode d4 (at two points) on the front surface d2A of the chip resistor d1, so that the stress applied to the chip resistor d1 is concentrated on connections between the board d2 and the first and second connection electrodes d3, d4. This may deteriorate the electric characteristic properties of the chip resistor d1. Further, the stress may cause a strain in the chip resistor d1 (particularly, the longitudinally middle portion of the board d2) and, in the worst case, the board d2 will crack from the middle portion.

In the fourth reference embodiment, in contrast, the resin film d24 has a greater thickness so that the height H of the resin film d24 is not smaller than the heights J of the first connection electrode d3 and the second connection electrode d4 as described above (see FIG. 95). Therefore, the stress applied to the chip resistor d1 is received not only by the first connection electrode d3 and the second connection electrode d4 but also by the resin film d24. That is, the stress receiving area of the chip resistor d1 is increased, so that the stress applied to the chip resistor d1 can be distributed over the chip resistor d1. This suppresses the concentration of the stress on the first connection electrode d3 and the second connection electrode d4 of the chip resistor d1. Particularly, the front surface d24C of the resin film d24 can effectively distribute the stress applied to the chip resistor d1. This further suppresses the concentration of the stress on the chip resistor d1, thereby improving the strength of the chip resistor d1. As a result, breakage of the chip resistor d1 can be suppressed which may otherwise occur during the mounting of the chip resistor d1, during the accommodation of the chip resistor d1 into the embossed carrier tape d92 or during a durability test. As a result, the yield can be improved in the mounting of the chip resistor d1 or in the accommodation of the chip resistor d1 in the embossed carrier tape d92. Further, the chip resistor d1 is less susceptible to the breakage, so that the handlability of the chip resistor d1 can be improved.

Next, modifications of the chip resistor d1 will be described. FIGS. 100 to 104 are schematic sectional views of chip resistors according to first to fifth modifications. In the first to fifth modifications, components corresponding to those of the chip resistor d1 will be designated by the same reference characters, and will not be described in detail. In FIG. 95, the front surface d3A of the first connection electrode d3 and the front surface d4A of the second connection electrode d4 are flush with the front surface d24C of the resin film d24. If no consideration is given to the distribution of the stress applied to the chip resistor d1 in the mounting, the front surface d3A of the first connection electrode d3 and the front surface d4A of the second connection electrode d4 may project from the front surface d24C of the resin film d24 away from the front surface d2A of the board d2 (upward in FIG. 100) as in the first modification shown in FIG. 100. In this case, the height H of the resin film d24 is less than the heights J of the first connection electrode d3 and the second connection electrode d4.

If it is desirable to more efficiently distribute the stress applied to the chip resistor d1 in the mounting than in the case shown in FIG. 95, in contrast, the height H of the resin film d24 may be greater than the heights J of the first connection electrode d3 and the second connection electrode d4 as in the second modification shown in FIG. 101. Thus, the resin film d24 has a greater thickness, so that the front surface d3A of the first connection electrode d3 and the front surface d4A of the second connection electrode d4 are offset from the front surface d24C of the resin film d24 toward the front surface d2A of the board d2 (downward in FIG. 100). In this case, the first connection electrode d3 and the second connection electrode d4 are recessed from the front surface d24C of the resin film d24 toward the board d2, so that the aforementioned two-point contact at the first connection electrode d3 and the second connection electrode d4 can be eliminated. This further suppresses the concentration of the stress on the chip resistor d1. Where the chip resistor d1 of the second modification is mounted on the mount board d9, however, thicker layers of the solder d13 should be formed on the respective connection terminals d88 of the mount board d9 to reach the front surface d3A of the first connection electrode d3 and the front surface d4A of the second connection electrode d4 for prevention of connection failure between the solder d13 and the first and second connection electrodes d3, d4 (see FIG. 87(*b*)).

An end face d20A of the insulative layer d20 provided on the front surface d2A of the board d2 (aligned with the edge portion d85 of the front surface d2A as seen in plan) extends along the thickness of the board d2 (vertically in FIGS. 95, 100 and 101), but may be inclined as shown in FIGS. 102 to 104. More specifically, the end face d20A of the insulative film d20 is inclined inward of the board d2 from the front surface d2A of the board d2 toward the front surface of the insulative film d20. A portion (the edge portion d23C described above) of the passivation film d23 covering the end face d20A may be inclined along the end face d20A according to the inclination of the end face d20A.

The chip resistors d1 of the third to fifth modifications shown in FIGS. 102 to 104 are different in the position of the edge portion d24A of the resin film d24. First, the chip resistor d1 of the third modification shown in FIG. 102 is substantially the same as the chip resistor d1 shown in FIG. 95, except that the end face d20A of the insulative film d20 and the edge portion d23C of the passivation film d23 are inclined. Therefore, the edge portion d24A of the resin film d24 is aligned with the side surface covering portion d23B of the passivation film d23, and is offset outward of the edge portion d85 of the front surface d2A of the board d2 (the edges of the front surface d2A of the board d2) by the thickness of the side surface covering portion d23B as seen in plan. If it is desirable to align the edge portion d24A with the side surface covering portion d23B, it is necessary to prevent the photosensitive resin liquid from entering the first trench d44 and the second trench d48 with the use of a mask not shown when the photosensitive resin liquid is sprayed for the formation of the resin film d46 described above (see FIG. 96E). If the liquid enters the first trench d44 and the second trench d48, the mask d62 to be used for the subsequent patterning of the resin film d46 (see FIG. 96F) may be formed with an opening d61 aligned with the first trench d44 and the second trench d48 as seen in plan. Thus, a part of the resin film d46 formed in the first trench d44 and the second trench d48 can be removed by the patterning of the resin film d46, whereby the edge portion d24A of the resin film d24 is aligned with the side surface covering portion d23B.

Here, the resin film d24, which is made of the resin, is less susceptible to cracking due to impact. Therefore, the resin film d24 can reliably protect the front surface d2A of the board d2 (particularly, the device d5 and the fuses F) and the edge portion d85 of the front surface d2A of the board d2 from the impact, so that the chip resistor d1 is excellent in impact resistance. In the chip resistor d1 of the fourth modification shown in FIG. 103, on the other hand, the edge portion d24A of the resin film d24 is not aligned with the side surface covering portion d23B of the passivation film d23 as seen in plan, but retracted inward of the side surface covering portion d23B, more specifically retracted with respect to the edge portion d85 of the front surface d2A of the board d2 inward of the board d2 as seen in plan. In this case, the resin film d24 can reliably protect the front surface d2A of the board d2 (particularly, the device d5 and the fuses F) from the impact, so that the chip resistor d1 is excellent in impact resistance. In order to retract the edge portion d24A of the resin film d24 inward of the board d2, the mask d62 to be used for the patterning of the resin film d46 may be formed with an opening d61 aligned with the edge portion d85 of the board d2 (substrate d30) as seen in plan (see FIG. 96F). Thus, a portion of the resin film d46 overlying the edge portion d85 of the board d2 (substrate d30) as seen in plan is removed by the patterning of the resin film d46. As a result, the edge portion d24A of the resin film d24 can be retracted inward of the board d2.

In the chip resistor d1 of the fifth modification shown in FIG. 104, the edge portion d24A of the resin film d24 is not aligned with the side surface covering portion d23B of the passivation film d23 as seen in plan. More specifically, the resin film d24 projects outward of the side surface covering portion d23B and covers the entire side surface covering portion d23B from the outer side. That is, the resin film d24 covers both the front surface covering portion d23A and the side surface covering portion d23B of the passivation film d23 in the fifth modification. In this case, the resin film d24 can reliably protect the front surface d2A of the board d2 (particularly, the device d5 and the fuses F) and the side surfaces d2C to d2F of the board d2 from the impact, so that the chip resistor d1 is excellent in impact resistance. If it is desirable to cover both the front surface covering portion d23A and the side surface covering portion d23B with the resin film d24, the photosensitive resin liquid may be permitted to enter the first trench d44 and the second trench d48 to adhere to the side surface covering portion d23B when the photosensitive resin liquid is sprayed to form the resin film d46 (see FIG. 96E). The spin-coating of the liquid described above is not preferred, because the first trench d44 and the second trench d48 are completely filled with the liquid to make it impossible to form a film of the liquid. If the resin film d46 is formed by applying a photosensitive resin sheet onto the front surface d30A of the substrate d30, on the other hand, the sheet enters neither of the first trench d44 and the second trench d48, failing to cover the entire side surface covering portion d23B. Therefore, the spraying of the photosensitive resin liquid is an effective method for covering both the front surface covering portion d23A and the side surface covering portion d23B with the resin film d24.

While the examples of the fourth reference embodiment have thus been described, the fourth reference embodiment may be embodied in other forms. In the examples described above, the chip resistor d1 is disclosed as an exemplary chip component according to the fourth reference embodiment. The fourth reference embodiment is applicable to a chip capacitor, a chip inductor, a chip diode and other chip components. The chip capacitor will hereinafter be described.

FIG. 105 is a plan view of a chip capacitor according to another example of the fourth reference embodiment. FIG. 106 is a sectional view taken along a sectional line CVI-CVI in FIG. 105. FIG. 107 is an exploded perspective view illustrating the chip capacitor with parts thereof separated. Components of the chip capacitor d101 corresponding to those of the chip resistor d1 will be designated by the same reference characters, and will not be described in detail. In the chip capacitor d101, components designated by the same reference characters as in the chip resistor d1 have the same construction as in the chip resistor d1 and the same effects as in the chip resistor d1, unless otherwise specified.

Referring to FIG. 105, the chip capacitor d101, like the chip resistor d1, includes a board d2, a first connection electrode d3 provided on the board d2 (on a front surface d2A of the board d2), and a second connection electrode d4 also provided on the board d2. In this example, the board d2 has a rectangular shape as seen in plan. The first connection electrode d3 and the second connection electrode d4 are respectively disposed on longitudinally opposite end portions of the board d2. In this example, the first connection electrode d3 and the second connection electrode d4 each have a generally rectangular plan shape elongated widthwise of the board d2. A plurality of capacitor elements C1 to C9 are provided in a capacitor provision region d105 between the first connection electrode d3 and the second connection electrode d4 on the front surface d2A of the board d2. The capacitor elements C1 to C9 are device elements constituting a device d5 (capacitor portion), and are disconnectably electrically connected to the second connection electrode d4 via a plurality of fuse units d107 (corresponding to the fuses F described above). The device d5 including these capacitor elements C1 to C9 is a capacitor circuit network.

As shown in FIGS. 106 and 107, an insulative layer d20 is provided on the front surface d2A of the board d2, and a lower electrode film dill is provided on a surface of the insulative layer d20. The lower electrode film dill extends over substantially the entire capacitor provision region d105. Further, the lower electrode film dill extends to under the first connection electrode d3. More specifically, the lower electrode film dill has a capacitor electrode region d111A functioning as a common lower electrode for the capacitor elements C1 to C9 in the capacitor provision region d105, and a pad region d111B (pad) disposed under the first connection electrode d3 for external electrode connection. The capacitor electrode region d111A is located in the capacitor provision region d105, while the pad region d111B is located under the first connection electrode d3 in contact with the first connection electrode d3.

A capacitive film (dielectric film) d112 is provided over the lower electrode film d111 (the capacitor electrode region d111A) in contact with the lower electrode film d111 in the capacitor provision region d105. The capacitive film d112 extends over the entire capacitor electrode region d111A (the capacitor provision region d105). In this example, the capacitive film d112 also covers a part of the insulative layer d20 outside the capacitor provision region d105.

An upper electrode film d113 is provided on the capacitive film d112 in contact with the capacitive film d112. In FIG. 105, the upper electrode film d113 is hatched for clarification. The upper electrode film d113 has a capacitor electrode region d113A located in the capacitor provision region d105, a pad region d113B (pad) located under the second connection electrode d4 in contact with the second connection electrode d4, and a fuse region d113C located between the capacitor electrode region d113A and the pad region d113B.

The capacitor electrode region d113A of the upper electrode film d113 is divided (split) into a plurality of electrode film portions (upper electrode film portions) d131 to d139. In this example, the electrode film portions d131 to d139 each have a rectangular shape, and extend linearly from the fuse region d113C toward the first connection electrode d3. The electrode film portions d131 to d139 are opposed to the lower electrode film dill with a plurality of facing areas with the intervention of the capacitive film d112 (in contact with the capacitive film d112). More specifically, the facing areas of the respective electrode film portions d131 to d139 with respect to the lower electrode film dill may be defined to have a ratio of 1:2:4:8:16:32:64:128:128. That is, the electrode film portions d131 to d139 include a plurality of electrode film portions having different facing areas, more specifically, a plurality of electrode film portions d131 to d138 (or d131 to d137 and d139) respectively having facing areas which are defined by a geometric progression with a geometric ratio of 2. Thus, the capacitor elements C1 to C9 respectively defined by the electrode film portions d131 to d139, the capacitive film d112 and the lower electrode film dill opposed to the electrode film portions d131 to d139 with the intervention of the capacitive film d112 include a plurality of capacitor elements having different capacitance values. Where the facing areas of the electrode film portions d131 to d139 have the aforementioned ratio, the ratio of the capacitance values of the capacitor elements C1 to C9 is 1:2:4:8:16:32:64:128:128, which is equal to the ratio of the facing areas. That is, the capacitor elements C1 to C9 include a plurality of capacitor elements C1 to C8 (or C1 to C7 and C9) which respectively have capacitance values defined by the geometric progression with a geometric ratio of 2.

In this example, the electrode film portions d131 to d135 each have a strip shape of the same width, and respectively have lengths defined to have a ratio of 1:2:4:8:16. The electrode film portions d135, d136, d137, d138, d139 each have a strip shape of the same length, and respectively have widths defined to have a ratio of 1:2:4:8:8. The electrode film portions d135 to d139 extend from an edge of the second connection electrode d4 to an edge of the first connection electrode d3 in the capacitor provision region d105, and the electrode film portions d131 to d134 are shorter than the electrode film portions d135 to d139.

The pad region d113B is generally analogous to the second connection electrode d4, and has a generally rectangular plan shape. As shown in FIG. 106, the pad region d113B of the upper electrode film d113 contacts the second connection electrode d4. The fuse region d113C is located alongside a longer edge (an inner longer edge with respect to a periphery of the board d2) of the pad region d113B. The fuse region d113C includes the plurality of fuse units d107, which are arranged alongside the longer edge of the pad region d113B.

The fuse units d107 are formed of the same material as the pad region d113B of the upper electrode film d113 unitarily with the pad region d113B. The electrode film portions d131 to d139 are each formed integrally with one or more of the fuse units d107, and connected to the pad region d113B via these fuse units d107 to be thereby electrically connected to the second connection electrode d4 via the pad region d113B. As shown in FIG. 105, the electrode film portions d131 to d136 each having a relatively small area are each connected to the pad region d113B via a single fuse unit d107, and the electrode film portions d137 to d139 each having a relatively great area are each connected to the pad region d113B via a plurality of fuse units d107. It is not necessary to use all the fuse units d107, and some of the fuse units d107 are unused in this example.

The fuse units d107 each include a first wider portion d107A for connection to the pad region d113B, a second wider portion d107B for connection to the electrode film portions d131 to d139, and a narrower portion d107C connecting the first and second wider portions d107A, d107B to each other. The narrower portion d107C is configured to be disconnected (fused off) by a laser beam. With this arrangement, unnecessary ones of the electrode film portions d131 to d139 are electrically isolated from the first and second connection electrodes d3, d4 by disconnecting corresponding ones of the fuse units d107.

As shown in FIG. 106 but not shown in FIGS. 105 and 107, a front surface of the chip capacitor d101 including a surface of the upper electrode film d113 is covered with a passivation film d23. The passivation film d23 is formed of, for example, a nitride film, and extends to side surfaces d2C to d2F of the board d2 to cover not only the upper surface of the chip capacitor d101 but also the entire side surfaces d2C to d2F. Further, a resin film d24 is provided on the passivation film d23.

The passivation film d23 and the resin film d24 each serve as a protective film for protecting the front surface of the chip capacitor d101, and each have openings d25 in association with the first connection electrode d3 and the second connection electrode d4. The openings d25 extend through the passivation film d23 and the resin film d24 to expose a part of the pad region d111B of the lower electrode film d111 and a part of the pad region d113B of the upper electrode film d113. In this example, the opening d25 associated with the first connection electrode d3 also extends through the capacitive film d112.

The first connection electrode d3 and the second connection electrode d4 are respectively provided in the openings d25. Thus, the first connection electrode d3 is connected to the pad region d111B of the lower electrode film dill, while the second connection electrode d4 is connected to the pad region d113B of the upper electrode film d113. In this example, the first and second connection electrodes d3, d4 are flush with a front surface d24A of the resin film d24. Thus, the chip capacitor d101 can be connected to a mount board d9 through flip chip connection in the same manner as the chip resistor d1.

FIG. 108 is a circuit diagram showing the internal electrical configuration of the chip capacitor. The plurality of capacitor elements C1 to C9 are connected in parallel between the first connection electrode d3 and the second connection electrode d4. Fuses F1 to F9 each including one or more fuse units d107 are respectively connected in series between the second connection electrode d4 and the capacitor elements C1 to C9.

Where all the fuses F1 to F9 are connected, the overall capacitance value of the chip capacitor d101 is equal to the sum of the capacitance values of the respective capacitor elements C1 to C9. Where one or two or more fuses selected from the fuses F1 to F9 are disconnected, the capacitor elements associated with the disconnected fuses are isolated, so that the overall capacitance value of the chip capacitor d101 is reduced by the sum of the capacitance values of the isolated capacitor elements.

Therefore, the overall capacitance value of the chip capacitor can be adjusted to a desired capacitance value (through laser trimming) by measuring a capacitance value between the pad regions d111B and d113B (the total capacitance value of the capacitor elements C1 to C9) and then fusing off one or more fuses properly selected from the fuses F1 to F9 according to the desired capacitance value by the laser beam. Particularly, where the capacitance values of the capacitor elements C1 to C8 are defined by the geometric progression with a geometric ratio of 2, the overall capacitance value of the chip capacitor d101 can be finely adjusted to the desired capacitance value with an accuracy equivalent to the capacitance value of the smallest capacitance capacitor element C1 (the value of the first term of the geometric progression).

For example, the capacitance values of the capacitor elements C1 to C9 may be as follows: C1=0.03125 pF; C2=0.0625 pF; C3=0.125 pF; C4=0.25 pF; C5=0.5 pF; C6=1 pF; C7=2 pF; C8=4 pF; and C9=4 pF. In this case, the capacitance of the chip capacitor d101 can be finely adjusted with a minimum adjustable accuracy of 0.03125 pF. By properly selecting the to-be-disconnected fuses from the fuses F1 to F9, the chip capacitor d101 can be provided as having a desired capacitance value ranging from 10 pF to 18 pF.

In this example, as described above, the plurality of capacitor elements C1 to C9 which can be isolated by disconnecting the associated fuses F1 to F9 are provided between the first connection electrode d3 and the second connection electrode d4. The capacitor elements C1 to C9 include a plurality of capacitor elements having different capacitance values, more specifically, a plurality of capacitor elements having capacitance values defined by the geometric progression. Therefore, the chip capacitor d101 can be adapted for the plural capacitance values without changing the design, and customized based on the same design concept so as to have a desired capacitance value which is accurately controlled by selectively fusing off one or more of the fuses F1 to F9.

The respective components of the chip capacitor d101 will hereinafter be described in detail. Referring to FIG. 105, the board d2 may have a rectangular plan shape, for example, having a size of 0.3 mm×0.15 mm or 0.4 mm×0.2 mm (preferably, a size of not greater than 0.4 mm×0.2 mm). The capacitor provision region d105 is generally a square region which has an edge having a length equivalent to the length of the shorter edge of the board d2. The board d2 may have a thickness of about 150 μm. Referring to FIG. 106, the board d2 may be a board obtained by grinding or polishing a substrate from a back side (not formed with the capacitor elements C1 to C9) for thinning the substrate. A semiconductor substrate typified by a silicon substrate, a glass substrate or a resin film may be used as a material for the board d2.

The insulative layer d20 may be an oxide film such as a silicon oxide film, and may have a thickness of about 500 Å to about 2000 Å. The lower electrode film dill is preferably an electrically conductive film, particularly preferably a metal film, and may be an aluminum film. The lower electrode film dill of the aluminum film may be formed by a sputtering method. Similarly, the upper electrode film d113 is preferably an electrically conductive film, particularly preferably a metal film, and may be an aluminum film. The upper electrode film d113 of the aluminum film may be formed by a sputtering method. Further, a photolithography and etching process may be employed for patterning to divide the capacitor electrode region d113A of the upper electrode film d113 into the electrode film portions d131 to d139 and to shape the fuse region d113C into the plurality of fuse units d107.

The capacitive film d112 may be formed of, for example, a silicon nitride film, and have a thickness of 500 Å to 2000 Å (e.g., 1000 Å). The silicon nitride film for the capacitive film d112 may be formed by plasma CVD (chemical vapor deposition). The passivation film d23 may be formed of, for example, a silicon nitride film, for example, by a plasma CVD method. The passivation film d23 may have a thickness of about 8000 Å. The resin film d24 may be formed of a polyimide film or other resin film as described above.

The first and second connection electrodes d3, d4 may each be formed of a multilayer film including an Ni layer d33 provided in contact with the lower electrode film dill or the upper electrode film d113, a Pd layer d34 provided on the Ni layer d33 and an Au layer d35 provided on the Pd layer d34, which may each be formed, for example, by an electroless plating method. The Ni layer d33 improves the adhesiveness to the lower electrode film dill or the upper electrode film d113, and the Pd layer d34 functions as a diffusion preventing layer which suppresses mutual diffusion of the material of the upper and lower electrode films and gold of the uppermost layers of the first and second connection electrodes d3, d4.

For production of the chip capacitor d101, the same production process as for the chip resistor d1 may be employed after formation of the device d5. For the formation of the device d5 (capacitor portion) for the chip capacitor d101, an insulative layer d20 of an oxide film (e.g., a silicon oxide film) is first formed on a front surface of a substrate d30 (board d2) by a thermal oxidation method and/or a CVD method. Then, a lower electrode film dill of an aluminum film is formed on the entire surface of the insulative layer d20, for example, by a sputtering method. The lower electrode film dill may have a thickness of about 8000 Å. In turn, a resist pattern corresponding to the final shape of the lower electrode film dill is formed on a surface of the lower electrode film by photolithography. The lower electrode film is etched by using the resist pattern as a mask. Thus, the lower electrode film dill is provided as having a pattern shown in FIG. 105 and the like. The etching of the lower electrode film dill may be achieved, for example, by reactive ion etching.

Then, a capacitive film d112 such as of a silicon nitride film is formed on the lower electrode film dill, for example, by a plasma CVD method. In a region not formed with the lower electrode film dill, the capacitive film d112 is formed on the surface of the insulative layer d20. In turn, an upper electrode film d113 is formed on the capacitive film d112. The upper electrode film d113 is formed from, for example, an aluminum film which is formed by a sputtering method. The upper electrode film d113 may have a thickness of about 8000 Å. Then, a resist pattern corresponding to the final shape of the upper electrode film d113 is formed on a surface of the upper electrode film d113 by photolithography. The upper electrode film d113 is etched with the use of this resist pattern as a mask to be thereby patterned into the final shape (see FIG. 105 and the like). Thus, the upper electrode film d113 is configured in a pattern such as to include a plurality of electrode film portions d131 to d139 in the capacitor electrode region d113A, a plurality of fuse units d107 in the fuse region d113C and a pad region d113B connected to the fuse units d107. Thus, capacitor elements C1 to C9 are formed according to the number of the electrode film portions d131 to d139 by dividing the upper electrode film d113. The etching for the patterning of the upper electrode film d113 may be achieved by wet etching with the use of an etching liquid such as phosphoric acid or by reactive ion etching.

In this manner, devices d5 (the capacitor elements C1 to C9 and the fuse units d107) for chip capacitors d101 are formed. After the formation of the devices d5, an insulative film d45 is formed as entirely covering the devices d5 (the upper electrode films d113 and a region of the capacitive film d112 not formed with the upper electrode films d113) by a plasma CVD method (see FIG. 96A). Thereafter, a first trench d44 and a second trench d48 are formed (see FIGS. 96B and 96C), and then openings d25 are formed (see FIG. 96D). Subsequently, probes d70 are pressed against the pad region d113B of the upper electrode film d113 and the pad region d111B of the lower electrode film dill exposed from the openings d25 to measure the total capacitance value of the capacitor elements C1 to C9 (see FIG. 96D). Based on the total capacitance value thus measured, capacitor elements to be isolated, i.e., fuses to be disconnected, are selected according to a target capacitance value of the chip capacitor d101.

In this state, a laser trimming process is performed for selectively fusing off the fuse units d107. That is, the laser beam is applied to fuse units d107 of the fuses selected according to the result of the measurement of the total capacitance value, whereby the narrower portions d107C of the selected fuse units d107 (see FIG. 105) are fused off. Thus, the associated capacitor elements are isolated from the pad region d113B. When the laser beam is applied to the fuse units d107, the energy of the laser beam is accumulated around the fuse units d107 by the function of the insulative film d45 serving as the cover film, thereby fusing off the fuse units d107. Thus, the capacitance value of the chip capacitor d101 can be reliably adjusted to the target capacitance value.

Subsequently, a silicon nitride film is deposited on the cover film (insulative film d45), for example, by a plasma CVD method to form a passivation film d23. The aforementioned cover film is finally unified with the passivation film d23 to form a part of the passivation film d23. The passivation film d23 formed after the disconnection of the fuses enters holes formed in the cover film when the cover film is partly broken during the fuse-off of the fuses, and covers disconnection surfaces of the fuse units d107 for protection. Therefore, the passivation film d23 prevents intrusion of foreign matter and moisture in the disconnected portions of the fuse units d107. This makes it possible to produce highly reliable chip capacitors d101. The passivation film d23 may be formed as having an overall thickness of, for example, about 8000 Å.

Then, a resin film d46 is formed (see FIG. 96E). Thereafter, the openings d25 closed with the resin film d46 and the passivation film d23 are uncovered (see FIG. 96F), whereby the pad regions d111B, d113B are exposed from the resin film d46 (resin film d24) through the openings d25. Thereafter, the first and second connection electrodes d3, d4 are respectively formed on the pad regions d111B, d113B exposed from the resin film d46 through the openings d25, for example, by an electroless plating method (see FIG. 96G).

Thereafter, as in the case of the chip resistors d1, the substrate d30 is ground from the back surface d30B (see FIG. 96H), whereby the resulting chip capacitors d101 are separated from each other. In the patterning of the upper electrode film d113 by utilizing the photolithography process, the electrode film portions d131 to d139 each having a very small area can be highly accurately formed, and the fuse units d107 can be formed in a minute pattern. After the patterning of the upper electrode film d113, the total capacitance value of the capacitor elements is measured, and the fuses to be disconnected are selected. The chip capacitors d101 can be provided as each having a desired capacitance value, which is accurately adjusted by disconnecting the selected fuses. That is, the chip capacitors d101 can be each easily and speedily customized to have any of plural capacitance values by selectively disconnecting one or more of the fuses. In other words, the chip capacitors d101 can be customized based on the same design concept so as to have various capacitance values by selectively combining capacitor elements C1 to C9 having different capacitance values.

While the chip components (the chip resistor d1 and the chip capacitor d101) according to the fourth reference embodiment have thus been described, the fourth reference embodiment may be embodied in other forms. In the aforementioned examples, the chip resistor d1 includes a plurality of resistor circuits having different resistance values defined by the geometric progression with a geometric ratio r ($0<r$, $r\neq 1$)=2 by way of example, but the geometric ratio for the geometric progression may have a value other than 2. The chip capacitor d101 includes a plurality of capacitor elements having different capacitance values defined by the geometric progression with a geometric ratio r (0<r, r≠1)=2 by way of example, but the geometric ratio for the geometric progression may have a value other than 2.

In the chip resistor d1 and the chip capacitor d101, the insulative layer d20 is provided on the front surface of the board d2. Where the board d2 is an insulative board, however, the insulative layer d20 may be obviated. In the chip capacitor d101, only the upper electrode film d113 is divided into a plurality of electrode film portions. However, only the lower electrode film dill may be divided into a plurality of electrode film portions, or the upper electrode film d113 and the lower electrode film dill may be each divided into a plurality of electrode film portions. In the aforementioned example, the fuse units are provided integrally with the upper electrode film or the lower electrode film, but may be formed from a conductor film different from the upper and lower electrode films. The chip capacitor d101 described above has a single-level capacitor structure including the upper electrode film d113 and the lower electrode film dill. Alternatively, a multi-level capacitor structure may be provided by stacking another electrode film on the upper electrode film d113 with the intervention of a capacitive film.

The chip capacitor d101 may be configured such that an electrically conductive board employed as the board d2 serves as the lower electrode and the capacitive film d112 is provided in contact with a surface of the electrically conductive board. In this case, one of the external electrodes may extend from the back surface of the electrically conductive board. Where the fourth reference embodiment is applied to a chip inductor, a device d5 formed on a board d2 of the chip inductor includes an inductor circuit network (inductor portion) including a plurality of inductor elements (device elements). In this case, the device d5 is provided in a multilevel interconnection formed on a front surface d2A of the board d2, and is formed from an interconnection film d22. In the chip inductor, the inductor elements for the inductor circuit network can be combined in a desired combination pattern by selectively disconnecting one or more fuses F. Thus, the chip inductor can be customized based on the same design concept so that the inductor circuit network has any of various levels of an electrical characteristic property.

Where the fourth reference embodiment is applied to a chip diode, a device d5 formed on a board d2 of the chip diode includes a diode circuit network (diode portion) including a plurality of diode elements (device elements). The diode portion is formed on the board d2. In the chip diode, the diode elements for the diode circuit network can be combined in a desired combination pattern by selectively disconnecting one or more fuses F. Thus, the chip diode can be customized based on the same design concept so that the diode circuit network has any of various levels of an electrical characteristic property.

The chip inductor and the chip diode provide the same effects as the chip resistor d1 and the chip capacitor d101. In the first connection electrode d3 and the second connection electrode d4, the Pd layer d34 to be provided between the Ni layer d33 and the Au layer d35 may be obviated. If the Au layer d35 is free from the pin hole described above, the Pd layer d34 may be obviated with proper adhesion between the Ni layer d33 and the Au layer d35.

Where the intersection portions d43 of the opening d42 of the resist pattern d41 to be used for the formation of the first trench d44 by the etching as described above (see FIG. 97) are rounded, the corner portions dll of the front surface d2A of the board d2 (the corner portions between the rough surface regions S) can be rounded in each of the completed chip components. The first to fifth modifications (FIGS. 100 to 104) described above for the chip resistor d1 are also applicable to the chip capacitor d101, the chip inductor and the chip diode.

FIG. 109 is a perspective view showing the appearance of a smartphone as an exemplary electronic device which employs the chip component according to the fourth reference embodiment. The smartphone d201 includes electronic components provided in a housing d202 having a flat rectangular prismatic shape. The housing d202 has a pair of rectangular major surfaces on its front and back sides, and the pair of major surfaces are connected to each other by four side surfaces. A display screen of a display panel d203 such as a liquid crystal panel or an organic EL panel is exposed on one of the major surfaces of the housing d202. The display screen of the display panel d203 serves as a touch panel to provide an input interface to a user.

The display panel d203 has a rectangular shape occupying the most of the one major surface of the housing d202. Operation buttons d204 are provided alongside one shorter edge of the display panel d203. In this example, a plurality of operation buttons d204 (three operation buttons d204) are arranged alongside the shorter edge of the display panel d203. The user operates the smartphone d201 by operating the operation buttons d204 and the touch panel to call and execute a necessary function.

A speaker d205 is disposed adjacent the other shorter edge of the display panel d203. The speaker d205 serves as a reception port for a telephone function, and as an audio unit for playing music data and the like. On the other hand, a microphone d206 is provided adjacent the operation buttons d204 on one of the side surfaces of the housing d202. The microphone d206 serves as a transmission port for the telephone function, and as a microphone for recording.

FIG. 110 is a schematic plan view showing the configuration of an electronic circuit assembly d210 accommodated in the housing d202. The electronic circuit assembly d210 includes a wiring board d211, and circuit components mounted on a mount surface of the wiring board d211. The circuit components include a plurality of integrated circuit elements (ICs) d212 to d220, and a plurality of chip components. The ICs include a transmission IC d212, a so-called One-Seg TV receiving IC d213, a GPS receiving IC d214, an FM tuner IC d215, a power source IC d216, a flash memory d217, a microcomputer d218, a power source IC d219, and a base band IC d220. The chip components (corresponding to the chip components of the fourth reference embodiment) include chip inductors d221, d225, d235, chip resistors d222, d224, d233, chip capacitors d227, d230, d234, and chip diodes d228, d231.

The transmission IC d212 incorporates an electronic circuit which generates display control signals for the display panel d203 and receives signals inputted from the touch panel on the surface of the display panel d203. A flexible interconnection d209 is connected to the transmission IC d212 for connection to the display panel d203. The One-Seg TV receiving IC d213 incorporates an electronic circuit which serves as a receiver for receiving signals of so-called One-Seg broadcast (terrestrial digital television broadcast for mobile devices). The chip inductors d221 and the chip resistors d222 are provided adjacent the One-Seg TV receiving IC d213. The One-Seg TV receiving IC d213, the chip inductors d221 and the chip resistors d222 constitute a One-Seg broadcast receiving circuit d223. The chip inductors d221 each have an accurately adjusted inductance, and the chip resistors d222 each have an accurately adjusted resistance. Thus, the One-Seg broadcast receiving circuit d223 has a highly accurate circuit constant.

The GPS receiving IC d214 incorporates an electronic circuit which receives signals from a GPS satellite and outputs the positional information of the smartphone d201. The FM tuner IC d215, and the chip resistors d224 and the chip inductors d225 mounted adjacent the FM tuner IC d215 on the wiring board d211 constitute an FM broadcast receiving circuit d226. The chip resistors d224 each have an accurately adjusted resistance, and the chip inductors d225 each have an accurately adjusted inductance. Thus, the FM broadcast receiving circuit d226 has a highly accurate circuit constant.

The chip capacitors d227 and the chip diodes d228 are mounted adjacent the power source IC d216 on the mount surface of the wiring board d221. The power source IC d216, the chip capacitors d227 and the chip diodes d228 constitute a power source circuit d229. The flash memory d217 is a storage which stores an operating system program, data generated in the smartphone d201, and data and programs acquired from the outside by communication function.

The microcomputer d218 incorporates a CPU, a ROM and a RAM, and serves as a processing circuit which performs a variety of processing operations to execute functions of the smartphone d201. More specifically, the microcomputer d218 performs processing operations for image processing and a variety of application programs. The chip capacitors d230 and the chip diodes d231 are mounted adjacent the power source IC d219 on the mount surface of the wiring board d211. The power source IC d219, the chip capacitors d230 and the chip diodes d231 constitute a power source circuit d232.

The chip resistors d233, the chip capacitors d234 and the chip inductors d235 are mounted adjacent the base band IC d220 on the mount surface of the wiring board d211. The base band IC d220, the chip resistors d233, the chip capacitors d234 and the chip inductors d235 constitute a base band communication circuit d236. The base band communication circuit d236 provides communication functions for telephone communications and data communications.

With this arrangement, electric power properly controlled by the power source circuits d229, d232 is supplied to the transmission IC d212, the GPS receiving IC d214, the One-Seg broadcast receiving circuit d223, the FM broadcast receiving circuit d226, the base band communication circuit d236, the flash memory d217 and the microcomputer d218. The microcomputer d218 performs a processing operation in response to signals inputted thereto via the transmission IC d212, and outputs display control signals from the transmission IC d212 to the display panel d203 to cause the display panel d203 to perform a variety of display operations.

When a command for receiving One-Seg broadcast is given by operating the touch panel or the operation buttons d204, the One-Seg broadcast is received by the function of the One-Seg broadcast receiving circuit d223. Then, a processing operation for outputting a received image on the display panel d203 and outputting a received sound from the speaker d205 is performed by the microcomputer d218. When the positional information of the smartphone d201 is required, the microcomputer d218 acquires positional information outputted from the GPS receiving IC d214 and performs a processing operation using the positional information.

Further, when a command for receiving FM broadcast is inputted by operating the touch panel or the operation buttons d204, the microcomputer d218 actuates the FM broadcast receiving circuit d226 and performs a processing operation for outputting a received sound from the speaker d205. The flash memory d217 is used for storing data acquired through communications, and for storing data generated by performing a processing operation by the microcomputer d218 or data generated by inputting from the touch panel. As required, the microcomputer d218 writes data in the flash memory d217 and reads data from the flash memory d217.

The functions of the telephone communications and the data communications are performed by the base band communication circuit d236. The microcomputer d218 controls the base band communication circuit d236 to perform operations for transmitting and receiving sounds and data.

<Fifth Reference Embodiment of Present Invention>

(1) Inventive Features of Fifth Reference Embodiment

The fifth reference embodiment has, for example, the following inventive features (E1) to (E16):

(E1) A chip component production method is provided, which includes the steps of: forming a device in each of plural chip component regions defined on a front surface of a substrate; forming a first trench having a predetermined depth from the front surface of the substrate by etching off a boundary region defined between the chip component regions; forming a second trench having a predetermined depth from a bottom of the first trench by a dicing saw; and grinding a back surface of the substrate to the second trench to divide the substrate into a plurality of chip components.

According to this method, even if the depth of the first trench formed by the etching is not uniform, the total depth of the first trench and the second trench (as measured from the front surface of the substrate to the bottom of the second trench) is made uniform by forming the second trench by the dicing saw. Therefore, when the substrate is divided into the individual chip components by grinding the back surface of the substrate, the chip components can be substantially simultaneously separated from the substrate with minimum time differences. This suppresses a problem such as the chipping of the chip components, which may otherwise occur when chip components separated earlier repeatedly bump against the substrate. Further, front-side corner portions of each of the chip components are defined by the first trench formed by the etching and, therefore, less susceptible to the chipping as compared with a case in which the first trench is formed by the dicing saw. As a result, the chipping can be suppressed when the chip components are separated from each other, and the separation failure of the chip components can be prevented. As compared with a case in which the first trench and the second trench are each formed by the etching, the time required for separating the chip components from each other can be reduced, thereby improving the productivity of the chip components.

(E2) In the chip component production method of the feature (E1), the dicing saw has a smaller width than the first trench.

According to this method, the width of the second trench formed by the dicing saw is smaller than the width of the first trench, so that the second trench is located inward of the first trench. Therefore, when the second trench is formed by the dicing saw, the width of the first trench is not increased by the dicing saw. This reliably suppresses the chipping of the front-side corner portions of the chip component defined by the first trench, which may otherwise occur when the corner portions are formed by the dicing saw.

(E3) In the chip component production method of the feature (E1) or (E2), the etching is plasma etching.

According to this method, the first trench can be formed highly accurately.

(E4) In the chip component production method of any one of the features (E1) to (E3), the device forming step includes the step of forming resistor elements, and the chip components are chip resistors.

According to this method, the chip resistors can be produced, which are substantially free from the chipping and separation failure which may otherwise occur when the chip resistors are separated from each other.

(E5) In the chip component production method of the feature (E4), the resistor element forming step includes the steps of: forming a resistive film on the front surface of the substrate; forming an interconnection film in contact with the resistive film; and patterning the resistive film and the interconnection film to form the resistor elements, and the chip component production method further includes the steps of: forming an external connection electrode on the substrate for external connection of the device; and forming a plurality of fuses disconnectably connecting the resistor elements to the external connection electrode on the substrate.

According to this method, the chip components (chip resistors) can be each easily and speedily customized to have any of plural resistance values by selectively disconnecting one or more of the fuses. In other words, the chip resistors can be each customized based on the same design concept so as to have various resistance values by selectively combining resistor elements having different resistance values.

(E6) In the chip component production method of any one of the features (E1) to (E3), the device forming step includes the step of forming capacitor elements, and the chip components are chip capacitors.

According to this method, the chip capacitors can be produced, which are substantially free from the chipping and separation failure which may otherwise occur when the chip resistors are separated from each other.

(E7) In the chip component production method of the feature (E6), the capacitor element forming step includes the steps of: forming a capacitive film on the front surface of the substrate; forming an electrode film in contact with the capacitive film; dividing the electrode film into a plurality of electrode film portions to form the capacitor elements in association with the electrode film portions; forming an external connection electrode on the substrate for external connection of the device; and forming a plurality of fuses disconnectably connecting the capacitor elements to the external connection electrode on the substrate.

According to this method, the chip components (chip capacitors) can be each easily and speedily customized to have any of plural capacitance values by selectively disconnecting one or more of the fuses. In other words, the chip capacitors can be each customized based on the same design concept so as to have various capacitance values by selectively combining capacitor elements having different capacitance values.

(E8) In the chip component production method of any one of the features (E1) to (E3), the device forming step includes the step of forming inductor elements, and the chip components are chip inductors.

According to this method, the chip inductors can be produced, which are substantially free from the chipping and separation failure which may otherwise occur when the chip inductors are separated from each other.

(E9) In the chip component production method of any one of the features (E1) to (E3), the device forming step includes the step of forming diode elements, and the chip components are chip diodes.

According to this method, the chip diodes can be produced, which are substantially free from the chipping and separation failure which may otherwise occur when the chip diodes are separated from each other.

(E10) In the chip component production method of any one of the features (E1) to (E9), the substrate has a thickness of 150 μm to 400 μm after being ground from the back surface thereof.

According to this method, even if the chip components each have a board thickness of 150 μm to 400 μm after being separated from each other, the time required for separating the chip components from each other can be reduced by forming the first trench by the etching, then forming the second trench by the dicing saw and grinding the back surface of the substrate, thereby improving the productivity of the chip components.

(E11) A chip component is provided, which includes: a board having a front surface and a back surface; a plurality of device elements provided on the front surface of the board; an external connection electrode provided on the front surface of the board; and a plurality of fuses which disconnectably connect the device elements to the external connection electrode; wherein the board has a side surface having an irregular pattern rough surface region provided adjacent the front surface of the board and a streak pattern region provided adjacent the back surface of the board.

The chip component having such a construction is produced by forming a first trench in a front surface of a substrate by etching with the use of a resist pattern, then forming a second trench from a bottom of the first trench by a dicing saw, and grinding a back surface of the substrate to divide the substrate into a plurality of chip components along the trenches (the first trench and the second trench). Thus, the side surface of the board of each of the separated chip components has a front-side portion defined as the irregular pattern rough surface region by the first trench, and a back-side portion defined as the streak pattern region by the second trench.

Where the formation of the first trench by the etching precedes the formation of the second trench by the dicing saw, the depth of the first trench formed by the etching is not uniform. Even in this case, the total depth of the first trench and the second trench (as measured from the front surface of the substrate to the bottom of the second trench) is made uniform by forming the second trench by the dicing saw. Therefore, when the substrate is divided into the individual chip components by grinding the back surface of the substrate, the chip components can be substantially simultaneously separated from the substrate with minimum time differences. This suppresses a problem such as the chipping of the chip components, which may otherwise occur when chip components separated earlier repeatedly bump against the substrate. Further, front-side corner portions of each of the chip components are defined by the first trench formed by the etching and, therefore, less susceptible to the chipping as compared with a case in which the first trench is formed by the dicing saw. As a result, the chipping can be suppressed when the chip components are separated from each other, and the separation failure of the chip components can be prevented. As compared with a case in which the first trench and the second trench are each formed by the etching, the time required for separating the chip components from each other can be reduced, thereby improving the productivity of the chip components.

In the chip component, the device elements for the device can be combined in a desired combination pattern by selectively disconnecting one or more of the fuses. Thus, the chip component can be customized based on the same design concept so that the device has any of various levels of an electrical characteristic property.

(E12) In the chip component of the feature (E11), the streak pattern region projects with respect to the rough surface region outward of the board, and a step is present between the rough surface region and the streak pattern region.

For formation of the step, the dicing saw to be used for the formation of the second trench has a smaller width than the first trench. Accordingly, the width of the second trench formed by the dicing saw is smaller than the width of the first trench, so that the second trench is located inward of the first trench. Therefore, when the second trench is formed by the dicing saw, the width of the first trench is not increased by the dicing saw. This reliably suppresses the chipping of the front-side corner portions of the chip component defined by the first trench, which may otherwise occur when the corner portions are formed by the dicing saw.

(E13) In the chip component of the feature (E11) or (E12), the device elements are resistor elements each including a resistive film provided on the front surface of the board and an interconnection film provided in contact with the resistive film, and the chip component is a chip resistor.

With this arrangement, the chip component (chip resistor) can be easily and speedily customized to have any of plural resistance values by selectively disconnecting one or more of the fuses. In other words, the chip resistor can be customized based on the same design concept so as to have various resistance values by selectively combining resistor elements having different resistance values.

(E14) In the chip component of the feature (E11) or (E12), the device elements are capacitor elements each including a capacitive film provided on the front surface of the board and an electrode film provided in contact with the capacitive film, and the chip component is a chip capacitor.

With this arrangement, the chip component (chip capacitor) can be easily and speedily customized to have any of plural capacitance values by selectively disconnecting one or more of the fuses. In other words, the chip capacitor can be customized based on the same design concept so as to have various capacitance values by selectively combining capacitor elements having different capacitance values.

(E15) In the chip component of the feature (E11) or (E12), the device elements include inductor elements provided in a multilevel interconnection provided on the front surface of the board, and the chip component is a chip inductor.

With this arrangement, the inductor elements for the chip component (chip inductor) can be combined in a desired combination pattern by selectively disconnecting one or more of the fuses. Thus, the chip inductor can be customized based on the same design concept so as to have any of various levels of an electrical characteristic property.

(E16) In the chip component of the feature (E11) or (E12), the device elements include diode elements, and the chip component is a chip diode.

With this arrangement, the diode elements for the chip component (chip diode) can be combined in a desired combination pattern by selectively disconnecting one or more of the fuses. Thus, the chip diode can be customized based on the same design concept so as to have any of various levels of an electrical characteristic property.

(2) Examples of Fifth Reference Embodiment of Present Invention

Examples of the fifth reference embodiment will hereinafter be described in detail with reference to the attached drawings. Reference characters shown in FIGS. 111 to 134 are effective only in FIGS. 111 to 134, so that components designated by these reference characters may be different from those designated by the same reference characters in other embodiments.

FIG. 111(*a*) is a schematic perspective view for explaining the construction of a chip resistor according to an example of the fifth reference embodiment, and FIG. 111(*b*) is a schematic sectional view illustrating the chip resistor, which is mounted on a mount board. The chip resistor e1 is a minute chip component, and has a rectangular prismatic shape as shown in FIG. 111(*a*). The chip resistor e1 has a rectangular plan shape. The chip resistor e1 is dimensioned such as to have a length L (a length of a longer edge e81) of about 0.6 mm, a width W (a length of a shorter edge e82) of about 0.3 mm, and a thickness T of about 0.2 mm.

The chip resistor e1 is obtained by forming a multiplicity of chip resistors e1 in a lattice form on a substrate, then forming a trench in the substrate, and grinding a back surface of the substrate (or dividing the substrate along the trench) to separate the chip resistors e1 from each other. The chip resistor e1 principally includes a board e2 which constitutes a part of a main body of the chip resistor e1, a first connection electrode e3 and a second connection electrode e4 serving as a pair of external connection electrodes, and a device (element) e5 connected to the outside via the first connection electrode e3 and the second connection electrode e4.

The board e2 has a generally rectangular prismatic chip shape. An upper surface of the board e2 as seen in FIG. 111(*a*) is a front surface e2A. The front surface e2A is a surface (device formation surface) of the board e2 on which the device e5 is provided, and has a generally rectangular shape. A surface of the board e2 opposite from the front surface e2A with respect to the thickness of the board e2 is a back surface e2B. The front surface e2A and the back surface e2B have substantially the same shape, and are parallel to each other. However, the back surface e2B is greater than the front surface e2A. When the front surface e2A is seen in plan perpendicularly to the front surface e2A, therefore, the front surface e2A is accommodated within the back surface e2B. The front surface e2A has a rectangular edge portion e85 defined along a pair of longer edges e81 and a pair of shorter edges e82 thereof, and the back surface e2B has a rectangular edge portion e90 defined along a pair of longer edges e81 and a pair of shorter edges e82 thereof.

In addition to the front surface e2A and the back surface e2B, the board e2 has a plurality of side surfaces (side surfaces e2C, e2D, e2E and e2F). The side surfaces intersect (orthogonally intersect) the front surface e2A and the back surface e2B to connect the front surface e2A and the back surface e2B to each other. The side surface e2C is disposed between shorter edges e82 of the front surface e2A and the back surface e2B on one of longitudinally opposite sides (on a left front side in FIG. 111(*a*)). The side surface e2D is disposed between shorter edges e82 of the front surface e2A and the back surface e2B on the other of the longitudinally opposite sides (on a right rear side in FIG. 111(*a*)). The side surfaces e2C, e2D are longitudinally opposite end faces of the board e2. The side surface e2E is disposed between longer edges e81 of the front surface e2A and the back surface e2B on one of widthwise opposite sides (on a left rear side in FIG. 111(*a*)). The side surface e2F is disposed between longer edges e81 of the front surface e2A and the back surface e2B on the other of the widthwise opposite sides (on a right front side in FIG. 111(*a*)). The side surfaces e2E, e2F are widthwise opposite end faces of the board e2. The side surfaces e2C, e2D intersect (generally orthogonally intersect) the side surfaces e2E, e2F.

As described above, adjacent ones of the front surface e2A, the back surface e2B and the side surfaces e2C to e2F generally orthogonally intersect each other. The side surface e2C, the side surface e2D, the side surface e2E and the side surface e2F (hereinafter referred to as the side surfaces) each have a rough surface region S adjacent to the front surface e2A, and a streak pattern region P adjacent to the back surface e2B. The rough surface regions S of the side surfaces each have a rough surface having an irregular pattern as indicated by fine dots in FIG. 111(*a*). The streak pattern regions P of the side surfaces each have a regular pattern including a multiplicity of streaks (saw mark) V which are a cutting trace remaining after cutting with a dicing saw to be described later. The side surfaces each have the rough surface region S and the streak pattern region P due to a production process for the chip resistor e1, which will be detailed later.

The rough surface region S occupies generally a half of each of the side surfaces adjacent to the front surface e2A, while the streak pattern region P occupies generally a half of each of the side surfaces adjacent to the back surface e2B. The streak pattern region P of each of the side surfaces projects with respect to the rough surface region S outward of the board e2 (outward of the board e2 as seen in plan). Thus, a step N is provided between the rough surface region S and the streak pattern region P. The step N connects a lower edge of the rough surface region S to an upper edge of the streak pattern region P, and extends parallel to the front surface e2A and the back surface e2B. The steps N of the respective side surfaces are continuous to one another, and form a rectangular frame-like shape as a whole which is located between the edge portion e85 of the front surface e2A and the edge portion e90 of the back surface e2B as seen in plan.

With the provision of the steps N in the respective side surfaces, the back surface e2B is greater than the front surface e2A as described above. The front surface e2A and the side surfaces e2C to e2F (the rough surface regions S and the streak pattern regions P of the respective side surfaces) of the board e2 are entirely covered with a passivation film e23. More strictly, therefore, the front surface e2A and the side surfaces e2C to e2F are entirely located on an inner side (back side) of the passivation film e23, and are not exposed to the outside in FIG. 111(*a*). Here, a portion of the passivation film e23 covering the front surface e2A is referred to as a front surface covering portion e23A, and a portion of the passivation film e23 covering the side surfaces e2C to e2F is referred to as a side surface covering portion e23B.

Further, the chip resistor e1 has a resin film e24. The resin film e24 is provided on the passivation film e23, and serves as a protective film (protective resin film) which at least covers the entire front surface e2A. The passivation film e23 and the resin film e24 will be detailed later. The first connection electrode e3 and the second connection electrode e4 are provided inward of the edge portion e85 on the front surface e2A of the board e2, and partly exposed from the resin film e24 on the front surface e2A. In other words, the resin film e24 covers the front surface e2A (strictly, the passivation film e23 on the front surface e2A) with the first connection electrode e3 and the second connection electrode e4 being exposed therefrom. The first connection electrode e3 and the second connection electrode e4 each have a structure such that an Ni (nickel) layer, a Pd (palladium) layer and an Au (gold) layer are stacked in this order on the front surface e2A. The first connection electrode e3 and the second connection electrode e4 are spaced from each other longitudinally of the front surface e2A, and are each elongated widthwise of the front surface e2A. On the front surface e2A, the first connection electrode e3 is disposed closer to the side surface e2C, and the second connection electrode e4 is disposed closer to the side surface e2D in FIG. 111(*a*).

The device e5 is a device (element) circuit network, which is provided on the board e2 (on the front surface e2A), more specifically, between the first connection electrode e3 and the second connection electrode e4 on the front surface e2A of the board e2, and is covered with the passivation film e23 (the front surface covering portion e23A) and the resin film e24 from the upper side. In this example, the device e5 is a resistor portion e56. The resistor portion e56 is a resistor circuit network including a plurality of (unit) resistor bodies R each having the same resistance value and arranged in a matrix array on the front surface e2A. The resistor bodies R are each made of TiN (titanium nitride), TiON (titanium oxide nitride) or TiSiON. The device e5 is electrically connected to portions of an interconnection film e22 to be described later, and electrically connected to the first connection electrode e3 and the second connection electrode e4 via the interconnection film portions e22.

As shown in FIG. 111(*b*), the first connection electrode e3 and the second connection electrode e4 are opposed to a mount board e9, and respectively electrically and mechanically connected to a pair of connection terminals e88 of the mount board e9 by solder e13. Thus, the chip resistor e1 can be mounted on the mount board e9 (through flip chip connection). The first connection electrode e3 and the second connection electrode e4 functioning as the external connection electrodes are desirably formed of gold (Au) or plated with gold for improvement of solder wettability and reliability.

FIG. 112 is a plan view of the chip resistor showing the layout of the first connection electrode, the second connection electrode and the device, and the structure (layout pattern) of the device as viewed in plan. Referring to FIG. 112, the device e5, which is a resistor circuit network, includes 352 resistor bodies R in total with 8 resistor bodies R aligned in each row (longitudinally of the board e2) and with 44 resistor bodies R aligned in each column (widthwise of the board e2). These resistor bodies R are elements of the resister circuit network of the device e5.

The multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface e2A of the board e2 for electrically incorporating the resistor circuits into the device e5 or electrically isolating the resistor circuits from the device e5. The fuses F and the conductor films D are arranged in a linear region alongside an inner edge of the first connection electrode e3. More specifically, the fuses F and the conductor films D are arranged in adjacent relation in a linear arrangement direction. The fuses F respectively disconnectably (separably)

connect the plural types of resistor circuits (each including a plurality of resistor bodies R) with respect to the first connection electrode e3.

FIG. 113A is a plan view illustrating a part of the device shown in FIG. 112 on an enlarged scale. FIG. 113B is a longitudinal vertical sectional view taken along a line B-B in FIG. 113A for explaining the structure of the resistor bodies of the device. FIG. 113C is a widthwise vertical sectional view taken along a line C-C in FIG. 113A for explaining the structure of the resistor bodies of the device. Referring to FIGS. 113A, 113B and 113C, the structure of the resistor bodies R will be described.

The chip resistor e1 includes an insulative layer e20 and a resistive film e21 in addition to the interconnection film e22, the passivation film e23 and the resin film e24 described above (see FIGS. 113B and 113C). The insulative layer e20, the resistive film e21, the interconnection film e22, the passivation film e23 and the resin film e24 are provided on the board e2 (on the front surface e2A). The insulative layer e20 is made of $SiO_2$ (silicon oxide). The insulative layer e20 covers the entire front surface e2A of the board e2. The insulative layer e20 has a thickness of about 10000 Å.

The resistive film e21 is provided on the insulative layer e20. The resistive film e21 is made of TiN, TION or TiSiON. The resistive film e21 has a thickness of about 2000 Å. The resistive film e21 includes a plurality of resistive film portions (hereinafter referred to as "resistive film lines e21A") extending linearly parallel to each other between the first connection electrode e3 and the second connection electrode e4. Some of the resistive film lines e21A are cut at predetermined positions with respect to a line extending direction (see FIG. 113A).

Portions of the interconnection film e22 are provided on the resistive film lines e21A. The interconnection film portions e22 are each made of Al (aluminum) or an alloy (AlCu alloy) of aluminum and Cu (copper). The interconnection film portions e22 each have a thickness of about 8000 Å. The interconnection film portions e22 are provided on the resistive film lines e21A in contact with the resistive film lines e21A, and spaced a predetermined distance R from one another in the line extending direction.

In FIG. 114, the electrical characteristic features of the resistive film lines e21A and the interconnection film portions e22 of this arrangement are shown by way of circuit symbols. As shown in FIG. 114(*a*), portions of each of the resistive film lines e21A present between the interconnection film portions e22 spaced the predetermined distance R from one another each serve as a single resistor body R having a predetermined resistance value r. The interconnection film portions e22, which electrically connect adjacent resistor bodies R to each other, cause short circuit in each of the resistive film lines e21A on which the interconnection film portions e22 are provided. Thus, a resistor circuit is provided, in which the resistor bodies R each having a resistance r are connected in series as shown in FIG. 114(*b*).

Further, adjacent resistive film lines e21A are connected to each other by the resistive film e21 and the interconnection film e22, so that the resistor circuit network of the device e5 shown in FIG. 113A constitutes a resistor circuit (including the resistor unit of the resistor bodies R described above) shown in FIG. 114(*c*). Thus, the resistor bodies R and the resistor circuits (i.e., the device e5) are constituted by the resistive film e21 and the interconnection film e22. The resistor bodies R each include a resistive film line e21A (resistive film e21), and a plurality of interconnection film portions e22 spaced the predetermined distance from one another in the line extending direction on the resistive film line e21A. Portions of the resistive film line e21A not provided with the interconnection film portions e22 spaced the predetermined distance R from one another each define a single resistor body R. The portions of the resistive film line e21A defining the resistor bodies R each have the same shape and the same size. Therefore, the multiplicity of resistor bodies R arranged in the matrix array on the board e2 have the same resistance value.

The interconnection film portions e22 provided on the resistive film lines e21A define the resistor bodies R, and also serve as conductor films D for connecting the resistor bodies R to one another to provide the resistor circuits (see FIG. 112). FIG. 115(*a*) is an enlarged partial plan view illustrating a region of the chip resistor including fuses shown in a part of the plan view of FIG. 112 on an enlarged scale, and FIG. 115(*b*) is a diagram showing a sectional structure taken along a line B-B in FIG. 115(*a*).

As shown in FIGS. 115(*a*) and 115(*b*), the interconnection film portion e22 for the fuses F and the conductor films D described above is formed from the same interconnection film e22 as the interconnection film portions e22 provided on the resistive film e21 for the resistor bodies R. That is, the fuses F and the conductor films D are formed of Al or the AlCu alloy, which is the same metal material as for the interconnection film portions e22 provided on the resistive film lines e21A to define the resistor bodies R, and provided at the same level as the interconnection film portions e22. As described above, the interconnection film portion e22 serves as the conductor films D for electrically connecting the plurality of resistor bodies R to form the resistor circuit.

That is, the interconnection film portions e22 for defining the resistor bodies R, the interconnection film portion e22 for the fuses F and the conductor films D, and the interconnection film portions e22 for connecting the device e5 to the first connection electrode e3 and the second connection electrode e4 are formed of the same metal material (Al or the AlCu alloy) and provided at the same level on the resistive film e21. It is noted that the fuses F are different (discriminated) from the other interconnection film portions e22 in that the fuses F are thinner for easy disconnection and no circuit element is present around the fuses F.

A region of the interconnection film portion e22 in which the fuses F are disposed is herein referred to as "trimming region X" (see FIGS. 112 and 115(*a*)). The trimming region X linearly extends alongside the inner edge of the first connection electrode e3, and not only the fuses F but also some of the conductor films D are present in the trimming region X. The resistive film e21 is partly present below the interconnection film portion e22 in the trimming region X (see FIG. 115(*b*)). The fuses F are each spaced a greater distance from the surrounding interconnection film portions e22 than the other interconnection film portions e22 present outside the trimming region X.

The fuses F each do not simply designate a part of the interconnection film portion e22, but may each designate a fuse element which is a combination of a part of the resistor body R (resistive film e21) and a part of the interconnection film portion e22 on the resistive film e21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

FIG. 116 is an electric circuit diagram of the device according to the example of the fifth reference embodiment.

Referring to FIG. 116, the device e5 includes a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first connection electrode e3. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 117 and 118 to be described later.

A single fuse F is connected in parallel to each of the resistor circuits R64 to R/32 except the reference resistor circuit R8. The fuses F are connected in series to one another directly or via the conductor films D (see FIG. 115(*a*)). With none of the fuses F fused off as shown in FIG. 116, the device e5 includes a resistor circuit such that the reference resistor circuit R8 including 8 resistor bodies R connected in series is provided between the first connection electrode e3 and the second connection electrode e4. Where the resistor bodies R each have a resistance value r of r=8Ω, for example, the chip resistor e1 is configured such that the first connection electrode e3 and the second connection electrode e4 are connected to each other through a resistor circuit (including the reference resistor circuit R8) having a resistance value of 8r=64Ω.

With none of the fuses F fused off, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto. Therefore, the resistor circuits except the reference resistor circuit R8 are not electrically incorporated in the device e5.

In the chip resistor e1 according to this example, the fuses F are selectively fused off, for example, by a laser beam according to the required resistance value. Thus, a resistor circuit connected in parallel to a fused fuse F is incorporated in the device e5. Therefore, the device e5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device e5 (resistor portion e56) can be digitally and finely controlled to a desired resistance value by selectively fusing off the fuses F (or the fuse elements described above). Thus, the chip resistor e1 can have the desired resistance value.

FIG. 117 is an electric circuit diagram of a device according to another example of the fifth reference embodiment. The device e5 may be configured as shown in FIG. 117, rather than by connecting the resistor circuits R64 to R/32 in series to the reference resistor circuit R8 as shown in FIG. 116. More specifically, the device e5 may include a circuit configured such that a parallel connection circuit including 12 types of resistor circuits R/16, R/8, R/4, R/2, R1, R2, R4, R8, R16, R32, R64, R128 is connected in series to a reference resistor circuit R/16 between the first connection electrode e3 and the second connection electrode e4.

In this case, a fuse F is connected in series to each of the 12 types of resistor circuits except the reference resistor circuit R/16. With none of the fuses F fused off, all the resistor circuits are electrically incorporated in the device e5. The fuses F are selectively fused off, for example, by a laser beam according to the required resistance value. Thus, a resistor circuit associated with a fused fuse F (a resistor circuit connected in series to the fused fuse F) is electrically isolated from the device e5 to control the overall resistance value of the chip resistor e1.

FIG. 118 is an electric circuit diagram of a device according to further another example of the fifth reference embodiment. The device e5 shown in FIG. 118 has a characteristic circuit configuration such that a serial connection circuit including plural types of resistor circuits is connected in series to a parallel connection circuit including plural types of resistor circuits. As in the previous example, a fuse F is connected in parallel to each of the plural types of resistor circuits connected in series, and all the plural types of resistor circuits connected in series are short-circuited by the fuses F. With a fuse F fused off, therefore, a resistor circuit which has been short-circuited by that fuse F is electrically incorporated in the device e5.

On the other hand, a fuse F is connected in series to each of the plural types of resistor circuits connected in parallel. With a fuse F fused off, therefore, a resistor circuit which has been connected in series to that fuse F is electrically isolated from the parallel connection circuit of the resistor circuits. With this arrangement, a resistance of smaller than 1 kΩ may be formed in the parallel connection circuit, and a resistor circuit of 1 kΩ or greater may be formed in the serial connection circuit. Thus, a resistor circuit having a resistance value extensively ranging from a smaller resistance value on the order of several ohms to a greater resistance value on the order of several megaohms can be produced from resistor circuit networks designed based on the same basic design concept. That is, the chip resistor e1 can be easily and speedily customized to have any of plural resistance values by selectively disconnecting one or more of the fuses F. In other words, the chip resistor e1 can be customized based on the same design concept so as to have various resistance values by selectively combining the resistor bodies R having different resistance values.

In the chip resistor e1, as described above, the connection of the plurality of resistor bodies R (resistor circuits) can be changed in the trimming region X. FIG. 119 is a schematic sectional view of the chip resistor. Referring next to FIG. 119, the chip resistor e1 will be described in greater detail. In FIG. 119, the device e5 described above is simplified, and components other than the board e2 are hatched for convenience of description.

The passivation film e23 and the resin film e24 will be described. The passivation film e23 is made of, for example, SiN (silicon nitride), and has a thickness of 1000 Å to 5000 Å (here, about 3000 Å). As described above, the passivation film e23 includes the front surface covering portion e23A provided on the entire front surface e2A and the side surface covering portion e23B provided over the side surfaces e2C to e2F. The front surface covering portion e23A covers the resistive film e21 and the interconnection film portions e22 present on the resistive film e21 (i.e., the device e5) from the front side (from the upper side in FIG. 119), thereby covering the upper surfaces of the resistor bodies R of the device e5. Thus, the front surface covering portion e23A also covers the interconnection film portion e22 in the trimming region X described above (see FIG. 115(*b*)). Further, the front surface covering portion e23A contacts the device e5 (the interconnection film e22 and the resistive film e21), and also contacts the insulative layer e20 in a region not formed with the resistive film e21. Thus, the front surface covering portion e23A covers the entire front surface e2A to function as a protective film for protecting the device e5 and the insulative layer e20. On the front surface e2A, the front surface covering portion e23A prevents an unintended short circuit which may be a short circuit other than that occurring between the interconnection film portions e22 present between the resistor bodies R (an unintended short circuit which may occur between adjacent resistive film lines e21A).

On the other hand, the side surface covering portion e23B provided on the side surfaces e2C to e2F functions as a protective layer which protects the side surfaces e2C to e2F. The side surface covering portion e23B completely covers the rough surface regions S and the streak pattern regions P of the side surfaces e2C to e2F, and the steps N present between the rough surface regions S and the streak pattern regions P. The edge portion e85 described above is present on the boundaries between the front surface e2A and the side surfaces e2C to e2F, and the passivation film e23 also covers the boundaries (the edge portion e85). A portion of the passivation film e23 covering the edge portion e85 (overlying the edge portion e85) is herein referred to as an edge portion e23C.

Together with the passivation film e23, the resin film e24 protects the front surface e2A of the chip resistor e1. The resin film e24 is made of a resin such as a polyimide. The resin film e24 is provided on the front surface covering portion e23A of the passivation film e23 (including the edge portion e23C described above) so as to cover a portion of the front surface e2A not provided with the first connection electrode e3 and the second connection electrode e4 as seen in plan. Therefore, the resin film e24 entirely covers the surface of the front surface covering portion e23A (including the device e5 and the fuses F covered with the front surface covering portion e23A) on the front surface e2A. On the other hand, the resin film e24 does not cover the side surfaces e2C to e2F. Therefore, an outer edge portion e24A of the resin film e24 is aligned with the side surface covering portion e23B as seen in plan. The edge portion e24A of the resin film e24 has side surfaces e24B which are flush with the side surface covering portion e23B (strictly, portions of the side surface covering portion e23B present on the rough surface regions S of the respective side surfaces), and extend thicknesswise of the board e2. A flat front surface e24C of the resin film e24 extends parallel to the front surface e2A of the board e2. When a stress is applied to the front surface e2A of the board e2 of the chip resistor e1, the front surface e24C of the resin film e24 (particularly, a portion of the front surface e24C between the first connection electrode e3 and the second connection electrode e4) functions as a stress distributing surface to distribute the stress.

The resin film e24 has two openings e25 respectively formed at two positions spaced from each other as seen in plan. The openings e25 are through-holes extending continuously thicknesswise through the resin film e24 and the passivation film e23 (the front surface covering portion e23A). Therefore, not only the resin film e24 but also the passivation film e23 has the openings e25. The interconnection film portions e22 are partly exposed from the respective openings e25. The parts of the interconnection film portions e22 exposed from the respective openings e25 serve as pad regions e22A (pads) for the external connection. The openings e25 each extend thicknesswise through the front surface covering portion e23A (thicknesswise of the board e2), and each become progressively wider longitudinally of the board e2 (laterally in FIG. 119) toward the front surface e24C of the resin film e24 from the front surface covering portion e23A. Therefore, side walls e24D of the resin film e24 defining the respective openings e25 each have a surface inclined with respect to the thickness direction of the board e2. The openings e25 are each defined longitudinally of the board e2 by a pair of side walls e24D of the resin film e24, and a distance between these side walls e24D is progressively increased toward the front surface e24C of the resin film e24 from the front surface covering portion e23A. Further, the openings e25 are each defined widthwise of the board e2 by another pair of side walls e24D of the resin film e24 (not shown in FIG. 119), and a distance between these side walls e24D may be progressively increased toward the front surface e24C of the resin film e24 from the front surface covering portion e23A.

One of the two openings e25 is completely filled with the first connection electrode e3, and the other opening e25 is completely filled with the second connection electrode e4. The first connection electrode e3 and the second connection electrode e4 each become progressively wider toward the front surface e24C of the resin film e24 as the openings e25 each become progressively wider toward the front surface e24C of the resin film e24. Therefore, vertical sections of the first connection electrode e3 and the second connection electrode e4 (as taken along a sectional plane extending longitudinally and thicknesswise of the board e2) each have a trapezoidal shape having an upper base on the side of the front surface e2A of the board e2 and a lower base on the side of the front surface e24C of the resin film e24. Front surfaces e3A, e4A of the first connection electrode e3 and the second connection electrode e4 each defined in section by the lower base of the trapezoidal shape each have edge portions curved toward the front surface e2A of the board e2 in the opening e25. If the openings e25 does not become progressively wider toward the front surface e24C of the resin film e24 (the side walls e24D defining the respective openings e25 extend thicknesswise of the board e2), the front surfaces e3A, e4A including the edge portions in the openings e25 are entirely flat and parallel to the front surface e2A of the board e2.

As described above, the first connection electrode e3 and the second connection electrode e4 are each formed by depositing Ni, Pd and Au in this order on the front surface e2A and, therefore, each have an Ni layer e33, a Pd layer e34 and an Au layer e35 in this order from the front surface e2A. In each of the first connection electrode e3 and the second connection electrode e4, therefore, the Pd layer e34 is provided between the Ni layer e33 and the Au layer e35. The Ni layer e33 occupies the most of each of the first connection electrode e3 and the second connection electrode e4, and the Pd layer e34 and the Au layer e35 are much thinner than the Ni layer e33. When the chip resistor e1 is mounted on the mount board e9 (see FIG. 111(*b*)), the Ni layer e33 functions to connect the solder e13 to Al of the interconnection film portion e22 in the pad region e22A in each of the openings e25.

In each of the first connection electrode e3 and the second connection electrode e4, the surface of the Ni layer e33 is covered with the Au layer e35 via the Pd layer e34, so that the oxidation of the Ni layer e33 can be prevented. Even if the Au layer e35 has a smaller thickness and hence is formed with a through-hole (pin hole), the Pd layer e34 provided between the Ni layer e33 and the Au layer e35 closes the through-hole. This prevents the Ni layer e33 from being exposed to the outside through the through-hole and oxidized.

The outermost Au layers e35 are respectively exposed on the front surfaces e3A, e4A of the first connection electrode e3 and the second connection electrode e4 to the outside from the front surface e24C of the resin film e24 through the openings e25. The first connection electrode e3 is electrically connected to the pad region e22A of the interconnection film portion e22 present in the one opening e25 through the one opening e25. The second connection electrode e4 is electrically connected to the pad region e22A of the interconnection film portion e22 present in the other opening e25 through the other opening e25. The Ni layers e33 of the first connection electrode e3 and the second connection electrode e4 are respectively connected to the pad regions e22A. Thus, the first connection electrode e3 and the second connection electrode e4 are electrically connected to the device e5. Here, the interconnection film portions e22 serve as interconnections connected to the assembly of the resistor bodies R (resistor portion e56), the first connection electrode e3 and the second connection electrode e4.

Thus, the resin film e24 and the passivation film e23 formed with the openings e25 cover the front surface e2A with the first connection electrode e3 and the second connection electrode e4 being exposed from the respective openings e25. Therefore, the electrical connection between the chip resistor e1 and the mount board e9 is achieved through the first connection electrode e3 and the second connection electrode e4 exposed from the front surface e24C of the resin film e24 through the openings e25 (see FIG. 111(*b*)).

Here, the thickness of the resin film e24, i.e., the height H of the resin film e24 measured from the front surface e2A of the board e2 to the front surface e24C of the resin film e24, is not smaller than the heights J of the first connection electrode e3 and the second connection electrode e4 (measured from the front surface e2A). In the first example, as shown in FIG. 119, the height H is equal to the heights J, and the front surface e24C of the resin film e24 is flush with the front surfaces e3A, e4A of the first connection electrode e3 and the second connection electrode e4.

FIGS. 120A to 120H are schematic sectional views showing a production method for the chip resistor shown in FIG. 119. First, as shown in FIG. 120A, a substrate e30 is prepared as a material for the board e2. In this case, a front surface e30A of the substrate e30 corresponds to the front surface e2A of the board e2, and a back surface e30B of the substrate e30 corresponds to the back surface e2B of the board e2.

Then, an insulative layer e20 of $SiO_2$ or the like is formed in the front surface e30A of the substrate e30 by thermally oxidizing the front surface e30A of the substrate e30, and devices e5 (each including resistor bodies R and interconnection film portions e22 connected to the resistor bodies R) are formed on the insulative layer e20. More specifically, a resistive film e21 of TiN, TiON or TiSiON is formed on the entire surface of the insulative layer e20 by sputtering, and then an interconnection film e22 of aluminum (Al) is formed on the resistive film e21 in contact with the resistive film e21. Thereafter, parts of the resistive film e21 and the interconnection film e22 are selectively removed for patterning by a photolithography process and dry etching such as RIE (Reactive Ion Etching). Thus, as shown in FIG. 113A, resistive film lines e21A each formed with the resistive film e21 and having a predetermined width are arranged at a predetermined interval in a column direction as seen in plan. At this time, the resistive film lines e21A and the interconnection film portions e22 are partly cut, and fuses F and conductor films D are formed in trimming regions X described above (see FIG. 112). In turn, parts of the interconnection film portions e22 formed on the respective resistive film lines e21A are selectively removed for patterning, for example, by wet etching. As a result, the devices e5 are produced, which are each configured such that interconnection film portions e22 spaced a predetermined distance R from one another are provided on the resistive film lines e21A (i.e., a plurality of resistor bodies R are provided). Thus, the resistor bodies R and the fuses F can be simultaneously formed simply by forming the interconnection film e22 on the resistive film e21 and patterning the resistive film e21 and the interconnection film e22. The overall resistance value of each of the devices e5 may be measured in order to check if the resistive film e21 and the interconnection film e22 are formed as each having intended dimensions.

Referring to FIG. 120A, a multiplicity of such devices e5 are formed on the front surface e30A of the substrate e30 according to the number of the chip resistors e1 to be formed on the single substrate e30. Regions of the substrate e30 respectively formed with the devices e5 (the aforementioned resistor portions e56) are each herein referred to as a chip component region Y. Therefore, a plurality of chip component regions Y (i.e., the devices e5) each having the resistor portion e56 are formed (defined) on the front surface e30A of the substrate e30. The chip component regions Y each correspond to a single complete chip resistor e1 (see FIG. 119) as seen in plan. A region of the front surface e30A of the substrate e30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate e30. This allows for mass production of the chip resistors e1.

Then, as shown in FIG. 120A, an insulative film e45 of SiN is formed over the entire front surface e30A of the substrate e30 by a CVD (Chemical Vapor Deposition) method. The insulative film e45 entirely covers the insulative layer e20 and the devices e5 (the resistive film e21 and the interconnection film e22) present on the insulative layer e20, and contacts the insulative layer e20 and the devices e5. Therefore, the insulative film e45 also covers the interconnection film portions e22 in the aforementioned trimming regions X (see FIG. 112). Since the insulative film e45 is formed over the entire front surface e30A of the substrate e30, the insulative film e45 extends to a region other than the trimming regions X on the front surface e30A. Thus, the insulative film e45 serves as a protective film for protecting the entire front surface e30A (including the devices e5 on the front surface e30A).

In turn, as shown in FIG. 120B, a resist pattern e41 is formed over the entire front surface e30A of the substrate e30 to entirely cover the insulative film e45. The resist pattern e41 has an opening e42. FIG. 121 is a schematic plan view showing a part of the resist pattern to be used for forming a first trench in the process step of FIG. 120B.

Referring to FIG. 121, the opening e42 (hatched in FIG. 121) of the resist pattern e41 is aligned with (or corresponds to) a region (i.e., the boundary region Z) between the contours of adjacent chip resistors e1 (i.e., the chip component regions Y described above) as seen in plan when the chip resistors e1 are arranged in a matrix array (or in a lattice form). As a whole, the opening e42 has a lattice shape including linear portions e42A and linear portions e42B orthogonally crossing each other.

The linear portions e42A and the linear portions e42B of the opening e42 of the resist pattern e41 are connected to each other as crossing orthogonally to each other (without any curvature). Therefore, the linear portions e42A and the linear portions e42B interest each other at an angle of about 90 degrees as seen in plan to form angled intersection portions e43. Referring to FIG. 120B, parts of the insulative film e45, the insulative layer e20 and the substrate e30 are selectively removed by plasma etching with the use of the resist pattern e41 as a mask. Thus, a portion of the substrate e30 is etched off (removed) from the boundary region Z defined between the adjacent devices e5 (chip component regions Y). As a result, a first trench e44 is formed in the position (boundary region Z) corresponding to the opening e42 of the resist pattern e41 as seen in plan as extending through the insulative film e45 and the insulative layer e20 into the substrate e30 to a depth halfway the thickness of the substrate e30 from the front surface e30A of the substrate e30. The first trench e44 is defined by pairs of side walls e44A opposed to each other, and a bottom wall e44B extending between lower edges of the paired side walls e44A (edges of the paired side walls e44A on the side of the back surface e30B of the substrate e30). The first trench e44 has a depth that is about half the thickness T of the completed chip resistor e1 (see FIG. 111(*a*)) as measured from the front surface e30A of the substrate e30, and has a width M of about 20 μm which is constant throughout the depth of the first trench e44 (as measured between the opposed side walls e44A). Where the etching, particularly the plasma etching, is employed, the first trench e44 can be highly accurately formed.

The first trench e44 of the substrate e30 has a lattice shape as a whole corresponding to the shape of the opening e42 (see FIG. 121) of the resist pattern e41 as seen in plan. On the front surface e30A of the substrate e30, rectangular frame-like portions of the first trench e44 (the boundary region Z) respectively surround the chip component regions Y in which the devices e5 are respectively provided. Portions of the substrate e30 respectively formed with the devices e5 are semi-finished products e50 of the chip resistors e1. The semi-finished products e50 are respectively located in the chip component regions Y surrounded by the first trench e44 on the front surface e30A of the substrate e30. These semi-finished products e50 are arranged in a matrix array.

After the first trench e44 is formed as shown in FIG. 120B, the resist pattern e41 is removed. Then, a dicing machine (not shown) having a dicing saw e47 is driven as shown in FIG. 120C. The dicing saw e47 is a disk-shaped grindstone having cutting serration on its peripheral surface. The dicing saw e47 has a width Q (thickness) that is smaller than the width M of the first trench e44. Here, a dicing line U is defined along a center line of the first trench e44 (equidistantly from the paired opposed side walls e44A). The dicing saw e47 is moved along the dicing line U in the first trench e44 with its thicknesswise middle portion e47A in alignment with the dicing line U as seen in plan. At this time, the substrate e30 is cut from the bottom wall e44B of the first trench e44. Upon completion of the movement of the dicing saw e47, a second trench e48 having a predetermined depth from the bottom wall e44B of the first trench e44 is formed in the substrate e30.

The second trench e48 extends continuously from the bottom wall e44B of the first trench e44 to a predetermined depth toward the back surface e30B of the substrate e30. The second trench e48 is defined by pairs of side walls e48A opposed to each other, and a bottom wall e48B extending between lower edges of the paired side walls e48A (edges of the paired side walls e48A on the side of the back surface e30B of the substrate e30). The second trench e48 has a depth that is about half the thickness T of the completed chip resistor e1 as measured from the bottom wall e44B of the first trench e44, and has a width that is equal to the width Q of the dicing saw e47 (as measured between the opposed side walls e48A) and is constant throughout the depth of the second trench e48. In the first trench e44 and the second trench e48, steps e49 are formed between the side walls e44A and the side walls e48A which are located adjacent each other thicknesswise of the substrate e30, and extend perpendicularly to the thickness of the substrate e30 (parallel to the front surface e30A of the substrate e30). Therefore, the continuous first and second trenches e44, e48 define a square concavity having a width decreasing toward the back surface e30B. The side walls e44A provide rough surface regions S of the side surfaces (the side surfaces e2C to e2F) of the respective completed chip resistors e1, and the side walls e48A provide streak pattern regions P of the side surfaces of the respective chip resistors e1. The steps e49 provide the steps N of the side surfaces of the respective chip resistors e1.

Here, the first trench e44 is formed by the etching, so that the side walls e44A and the bottom wall e44B each have a rough surface of an irregular pattern. On the other hand, the second trench e48 is formed by the dicing saw e47, so that the side walls e48A each have a multiplicity of streaks remaining in a regular pattern as a cutting trace formed by the dicing saw e47. Even if the side walls e48A are etched, the streaks cannot be completely removed but the streaks V remain on the completed chip resistors e1 (see FIG. 111(*a*)).

Then, the insulative film e45 is selectively etched off with the use of a mask e65 as shown in FIG. 120D. The mask e65 has openings e66 formed in association with portions of the insulative film e45 aligned with the pad regions e22A (see FIG. 119) as seen in plan. Thus, the portions of the insulative film e45 aligned with the openings e66 are etched off, whereby openings e25 are formed in these portions of the insulative film e45. Thus, the pad regions e22A are exposed from the insulative film e45 in the openings e25. The semi-finished products e50 each have two openings e25.

After the two openings e25 are formed in the insulative film e45 of each of the semi-finished products e50, probes e70 of a resistance measuring device (not shown) are brought into contact with the pad regions e22A in the respective openings e25 to detect the overall resistance value of the device e5. Subsequently, a laser beam (not shown) is applied to desired ones of the fuses F (see FIG. 112) through the insulative film e45, whereby the desired fuses F of the interconnection film portion e22 in the trimming region X described above are trimmed by the laser beam to be fused off. Thus, the overall resistance value of the semi-finished product e50 (i.e., the chip resistor e1) can be controlled, as described above, by selectively fusing off (trimming) the fuses F for the required resistance value. At this time, the insulative film e45 serves as a cover film for covering the devices e5, thereby preventing a short circuit which may otherwise occur when a debris occurring during the fusing adheres to any of the devices e5. Further, the insulative film e45 covers the fuses F (resistive film e21), so that the desired fuses F can be reliably fused off by accumulating the energy of the laser beam therein.

Thereafter, SiN is further deposited on the insulative film e45 by the CVD method to thicken the insulative film e45. At this time, as shown in FIG. 120E, the insulative film e45 is also formed on the entire inner peripheral surfaces of the first trench e44 and the second trench e48 (the side walls e44A, the bottom wall e44B, the side walls e48A and the bottom wall e48B described above). Therefore, the insulative film e45 is also formed on the steps e49 described above. The insulative film e45 (in a state shown in FIG. 120E) has a thickness of 1000 Å to 5000 Å (here, about 3000 Å) on the inner peripheral surfaces of the first trench e44 and the second trench e48. At this time, the insulative film e45 partly enters the openings e25 to close the openings e25.

Thereafter, a liquid photosensitive resin of a polyimide is sprayed over the resulting substrate e30 from above the insulative film e45. Thus, a photosensitive resin film e46 is formed as shown in FIG. 120E. At this time, the liquid is applied to the substrate e30 through a mask (not shown) having a pattern covering only the first trench e44 and the second trench e48 as seen in plan so as to be prevented from entering the first trench e44 and the second trench e48. As a result, the liquid photosensitive resin is applied only on the substrate e30 to form the resin film e46 on the substrate e30. The front surface e46A of the resin film e46 on the front surface e30A is flat and parallel to the front surface e30A.

Since the liquid enters neither of the first trench e44 and the second trench e48, the resin film e46 is formed in neither of the first trench e44 and the second trench e48. The formation of the resin film e46 may be achieved by spin-coating the liquid or bonding a photosensitive resin sheet to the front surface e30A of the substrate e30 rather than by spraying the liquid photosensitive resin.

In turn, the resin film e46 is thermally treated (cured). Thus, the resin film e46 is thermally shrunk to a smaller thickness, and hardened to have a stable film quality. In turn, as shown in FIG. 120F, parts of the resin film e46 aligned with the pad regions e22A of the interconnection film e22 (openings e25) on the front surface e30A as seen in plan are selectively removed by patterning the resin film e46. More specifically, the resin film e46 is exposed to light with the use of a mask e62 of a pattern having openings e61 aligned with (corresponding to) the pad regions e22A as seen in plan, and then developed in the pattern. Thus, the parts of the resin film e46 are removed from above the pad regions e22A to form the openings e25. At this time, edge portions of the resin film e46 around the openings e25 are thermally shrunk, so that wall surfaces e46B of the edge portions defining the openings e25 are each inclined at an angle with respect to the thickness direction of the substrate e30. Thus, the openings e25 each become progressively wider toward the front surface e46A of the resin film e46 (which later serves as the front surface e24C of the resin film e24) as described above.

Then, parts of the insulative film e45 on the pad regions e22A are removed by RIE using a mask not shown, whereby the openings e25 are uncovered to expose the pad regions e22A. In turn, Ni/Pd/Au multilayer films are formed in the openings e25 on the pad regions e22A by depositing Ni, Pd and Au by electroless plating. Thus, the first and second connection electrodes e3, e4 are formed on the pad regions e22A as shown in FIG. 120G.

FIG. 122 is a diagram for explaining a process for producing the first and second connection electrodes. Referring to FIG. 122, more specifically, surfaces of the pad regions e22A are cleaned (to be degreased), whereby organic substances (smut such as carbon smut and greasy dirt) are removed from the surfaces (step S1). Then, oxide films are removed from the surfaces (Step S2). In turn, the surfaces are zincated, whereby Al (of the interconnection film e22) in the surfaces is replaced with Zn (Step S3). Subsequently, Zn in the surfaces is removed by nitric acid or the like, whereby Al is newly exposed on the pad regions e22A (Step S4).

Then, the pad regions e22A are immersed in a plating liquid, whereby the new Al surfaces of the pad regions e22A are plated with Ni. Thus, Ni in the plating liquid is chemically reduced to be deposited on the surfaces, whereby Ni layers e33 are respectively formed on the surfaces (Step S5). In turn, surfaces of the Ni layers e33 are plated with Pd by immersing the Ni layers e33 in another plating liquid. Thus, Pd in the plating liquid is chemically reduced to be deposited on the surfaces of the Ni layers e33, whereby Pd layers e34 are respectively formed on the surfaces of the Ni layers e33 (Step S6).

Then, surfaces of the Pd layers e34 are plated with Au by immersing the Pd layers e34 in further another plating liquid. Thus, Au in the plating liquid is chemically reduced to be deposited on the surfaces of the Pd layers e34, whereby Au layers e35 are respectively formed on the surfaces of the Pd layers e34 (Step S7). Thus, the first and second connection electrodes e3, e4 are formed. After the first and second connection electrodes e3, e4 thus formed are dried (Step S8), the process for producing the first and second connection electrodes e3, e4 is completed. Between the consecutive steps, a rinsing step is performed as required for rinsing the semi-finished products e50 with water. Further, the zincation may be performed a plurality of times.

FIG. 120G shows the semi-finished product e50 formed with the first connection electrode e3 and the second connection electrode e4. The front surfaces e3A, e4A of the first connection electrode e3 and the second connection electrode e4 are flush with the front surface e46A of the resin film e46. As the wall surfaces e46B of the resin film e46 defining the openings e25 are inclined, as described above, edge portions of the front surfaces e3A, e4A of the first and second connection electrodes e3, e4 in the openings e25 are curved toward the back surface e30B of the substrate e30. Therefore, edge portions of the Ni layer e33, the Pd layer e34 and the Au layer e35 of each of the first and second connection electrodes e3, e4 in the openings e25 are curved toward the back surface e30B of the substrate e30.

As described above, the first and second connection electrodes e3, e4 are formed by the electroless plating. As compared with a case in which electrolytic plating is employed for the formation of the first and second connection electrodes e3, e4, therefore, the number of process steps required for the formation of the first and second connection electrodes e3, e4 can be reduced (e.g., a lithography step, a resist mask removing step and the like required for the electrolytic plating can be obviated), thereby improving the productivity of the chip resistor e1. Further, the electroless plating does not require a resist mask which may be required for the electrolytic plating. This improves the positional accuracy of the first and second connection electrodes e3, e4 and hence the yield without the possibility of displacement of the first and second connection electrodes e3, e4 due to offset of the resist mask. The first and second connection electrodes e3, e4 can be formed only on the pad regions e22A by the electroless plating of the pad regions e22A exposed from the resin film e24.

In general, Ni and Sn are contained in the plating liquid for the electrolytic plating. Therefore, Sn remaining on the front surfaces e3A, e4A of the first and second connection electrodes e3, e4 is susceptible to oxidation, resulting in connection failure between the first and second connection electrodes e3, e4 and the connection terminals e88 of the mount board e9 (see FIG. 111(*b*)). However, the fifth reference embodiment, which employs the electroless plating, is free from this problem.

After the first and second connection electrodes e3, e4 are thus formed, a continuity test is performed between the first connection electrode e3 and the second connection electrode e4 of each of the semi-finished products e50, and then the substrate e30 is ground from the back surface e30B. More specifically, as shown in FIG. 120H, a thin-plate support tape e71 of PET (polyethylene terephthalate) having an adhesive surface e72 is applied to the semi-finished products e50 with the adhesive surface e72 bonded to the first and second connection electrodes e3, e4 of the respective semi-finished products e50 (i.e., on the side of the front surface e30A). Thus, the semi-finished products e50 are supported by the support tape e71. Here, a laminate tape, for example, may be used as the support tape e71.

With the semi-finished products e50 supported by the support tape e71, the substrate e30 is ground from the back surface e30B. After the substrate e30 is thinned to the bottom wall e48B of the second trench e48 (see FIG. 120G) by the grinding, nothing connects the adjacent semi-finished products e50. Therefore, the substrate e30 is divided into the individual semi-finished products e50 along the first and second trenches e44, e48. Thus, the chip resistors e1 are completed. That is, the substrate e30 is divided (split) along the first and second trenches e44, e48 (i.e., along the boundary region Z), whereby the individual chip resistors e1 are separated from each other. The substrate e30 (board e2) has a thickness of 150 μm to 400 μm (not less than 150 μm and not greater than 400 μm) after the grinding of the back surface e30B.

The side walls e44A of the first trench e44 provide the rough surface regions S of the side surfaces e2C to e2F of the boards e2 of the respective completed chip resistors e1, and the side walls e48A of the second trench e48 provide the streak pattern regions P of the side surfaces e2C to e2F of the boards e2 of the respective chip resistors e1. The steps e49 between the side walls e44A and the side walls e48A provide the steps N of the respective chip resistors e1. Further, the back surface e30B provides the back surfaces e2B of the respective completed chip resistors e1. That is, the steps of forming the first trench e44 and the second trench e48 as described above (see FIGS. 120B and 120C) are involved in the step of forming the side surfaces e2C to e2F. Further, the insulative film e45 provides the passivation films e23 of the respective chip resistors e1, and the resin film e46 provides the resin films e24 of the respective chip resistors e1.

Even if the depth of the first trench e44 (see FIG. 120B) formed by the etching is not uniform, for example, the total depth of the first trench e44 and the second trench e48 formed by the dicing saw e47 (as measured from the front surface e30A of the substrate e30 to the bottom of the second trench e48) is constant. Therefore, where the chip resistors e1 are separated from each other by grinding the back surface e30B of the substrate e30, the time differences with which the respective chip resistors e1 are separated from the substrate e30 can be minimized. Thus, the chip resistors e1 can be generally simultaneously separated from the substrate e30. This suppresses the chipping of the chip resistors e1, which may otherwise occur when chip resistors e1 separated earlier repeatedly bump against the substrate e30. Further, corner portions e11 of the front surface e2A of each of the chip resistors e1 are defined by the first trench e44 formed by the etching and, therefore, less susceptible to the chipping as compared with a case in which the first trench e44 is formed by the dicing saw e47. As a result, the chipping can be suppressed when the chip resistors e1 are separated from each other, and the separation failure of the chip resistors e1 can be prevented. That is, it is possible to control the shape of the corner portions e11 of the front surface e2A of each of the chip resistors e1 (see FIG. 111(*a*)). As compared with a case in which the first trench e44 and the second trench e48 are each formed by the etching, the time required for separating the chip resistors e1 from each other can be reduced, thereby improving the productivity of the chip resistors e1.

Particularly, where the boards e2 of the chip resistors e1 thus separated each have a relatively great thickness on the order of 150 μm to 400 μm, it is difficult and time-consuming to form a trench extending from the front surface e30A of the substrate e30 to the bottom wall e48B of the second trench e48 (see FIG. 120C). Even in this case, the time required for separating the chip resistors e1 from each other can be reduced by forming the first trench e44 and the second trench e48 by the etching and the dicing with the dicing saw e47 and then grinding the back surface e30B of the substrate e30. Thus, the productivity of the chip resistors e1 can be improved.

If the second trench e48 is formed to reach the back surface e30B of the substrate e30 by the dicing (the second trench e48 is formed as extending through the substrate e30), the chipping is liable to occur in corner portions defined between the back surface e2B and the side surfaces e2C to e2F of each of the completed chip resistors e1. Where the second trench e48 is formed so as not to reach the back surface e30B by half-dicing (see FIG. 120C) and then the back surface e30B is ground as in the fifth reference embodiment, in contrast, the corner portions defined between the back surface e2B and the side surfaces e2C to e2F are less susceptible to the chipping.

If a trench extending from the front surface e30A of the substrate e30 to the bottom wall e48B of the second trench e48 is formed only by the etching, the trench is unlikely to have a rectangular cross section because the side walls of the completed trench do not extend thicknesswise of the board e2 due to variations in etching rate. That is, the side walls of the trench are varied in configuration. Where the etching and the dicing are employed in combination as in the fifth reference embodiment, in contrast, the variations in the configuration of the side walls of the first trench e44 and the second trench e48 (the side walls e44A and the side walls e48A) are reduced as compared with the case in which only the etching is employed. This permits the side walls of the trenches to extend thicknesswise of the board e2.

Since the width Q of the dicing saw e47 is smaller than the width M of the first trench e44, the width Q of the second trench e48 formed by the dicing saw e47 is smaller than the width M of the first trench e44. Therefore, the second trench e48 is located inward of the first trench e44 (see FIG. 120C). Hence, the width of the first trench e44 is not increased by the dicing saw e47 when the second trench e48 is formed by the dicing saw e47. The chipping of the corner portions e11 of the front surface e2A of the chip resistor e1 to be defined by the first trench e44 can be reliably suppressed, which may otherwise occur when the corner portions e11 are formed by the dicing saw e47.

The separation of the chip resistors e1 is achieved by grinding the back surface e30B after the formation of the second trench e48, but the grinding of the back surface e30B may precede the formation of the second trench e48 by the dicing. Further, it is also conceivable to separate the chip resistors e1 by etching the substrate e30 from the back surface e30B to the bottom wall e48B of the second trench e48.

As described above, the chip resistors e1 (chip components) respectively formed in the chip component regions Y defined on the substrate e30 can be simultaneously separated from each other (the individual chip resistors e1 can be simultaneously provided) by forming the first trench e44 and the second trench e48 and then grinding the substrate e30 from the back surface e30B. This reduces the time required for the production of the chip resistors e1, thereby improving the productivity of the chip resistors e1. Where the substrate e30 has a diameter of 8 inches, for example, about 500,000 chip resistors e1 can be produced from the substrate e30.

That is, even if the chip resistors e1 each have a smaller chip size, the chip resistors e1 can be simultaneously separated from each other by first forming the first trench e44 and the second trench e48 and then grinding the substrate e30 from the back surface e30B. Since the first trench e44 can be highly accurately formed by the etching, the rough surface regions S of the side surfaces e2C to e2F of each of the chip resistors e1 defined by the first trench e44 are improved in outer dimensional accuracy. Particularly, the first trench e44 can be more accurately formed by the plasma etching. Further, the pitch of trench lines of the first trench e44 can be reduced according to the resist pattern e41 (see FIG. 121), allowing for size reduction of the chip resistors e1 formed between adjacent trench lines of the first trench e44. Where the etching is employed, corner portions e11 defined between adjacent rough surface regions S of the side surfaces e2C to e2F of each of the chip resistors e1 (see FIG. 111(*a*)) are less susceptible to the chipping. This improves the appearance of the chip resistors e1.

The back surface e2B of the board e2 of each of the completed chip resistors e1 may be polished or etched to be mirror-finished. As shown in FIG. 120H, the completed chip resistors e1 are each removed from the support tape e71 and transported to a predetermined space to be stored in this space. When the chip resistor e1 is mounted on the mount board e9 (see FIG. 111(*b*)), a suction nozzle e91 of an automatic mounting machine (see FIG. 111(*b*)) sucks the back surface e2B of the chip resistor e1, and is moved to transport the chip resistor e1. At this time, a longitudinally middle portion of the back surface e2B is sucked by the suction nozzle e91. Then, referring to FIG. 111(*b*), the suction nozzle e91 sucking the chip resistor e1 is moved to the mount board e9. The pair of connection terminals e88 described above are provided on the mount board e9 in association with the first connection electrode e3 and the second connection electrode e4 of the chip resistor e1. The connection terminals e88 are made of, for example, Cu. Solder pieces e13 are provided on surfaces of the respective connection terminals e88 as projecting from the surfaces.

Then, the suction nozzle e91 is moved to press the chip resistor e1 against the mount board e9. Thus, the first connection electrode e3 of the chip resistor e1 is brought into contact with the solder piece e13 on one of the connection terminals e88, and the second connection electrode e4 of the chip resistor e1 is brought into contact with the solder piece e13 on the other connection terminal e88. In this state, the solder pieces e13 are heated to be melted. When the solder pieces e13 are thereafter cooled to be solidified, the first connection electrode e3 is connected to the solder piece e13 on the one connection terminal e88, and the second connection electrode e4 is connected to the solder piece e13 on the other connection terminal e88. Thus, the mounting of the chip resistor e1 on the mount board e9 is completed.

FIG. 123 is a schematic diagram for explaining how to accommodate the completed chip resistors in an embossed carrier tape. The completed chip resistor e1 shown in FIG. 120H may be accommodated in the embossed carrier tape e92 shown in FIG. 123. The embossed carrier tape e92 is a tape (an elongated sheet) made of, for example, a polycarbonate resin or the like. The embossed carrier tape e92 includes a multiplicity of pockets e93 aligned longitudinally thereof. The pockets e93 are each defined as a space recessed toward one surface (back surface) of the embossed carrier tape e92.

When the completed chip resistor e1 (see FIG. 120H) is to be accommodated in the embossed carrier tape e92, the suction nozzle e91 of the transportation device (see FIG. 111(*b*)) sucks the back surface e2B (the longitudinally middle portion) of the chip resistor e1, and is moved to remove the chip resistor e1 from the support tape e71. Then, the suction nozzle e91 is moved to a position opposed to a pocket e93 of the embossed carrier tape e92. At this time, the first connection electrode e3, the second connection electrode e4 and the resin film e24 of the chip resistor e1 sucked by the suction nozzle e91 are opposed to the pocket e93.

When the chip resistor e1 is to be accommodated in the embossed carrier tape e92, the embossed carrier tape e92 is placed on a flat support base e95. The suction nozzle e91 is moved toward the pocket e93 (as indicated by a bold arrow), and the chip resistor e1 is accommodated into the pocket e93 with its front surface e2A facing the pocket e93. With the front surface e2A of the chip resistor e1 in contact with a bottom e93A of the pocket e93, the chip resistor e1 is completely accommodated in the embossed carrier tape e92. When the front surface e2A of the chip resistor e1 is brought into contact with the bottom e93A of the pocket e93 by moving the suction nozzle e91, the first connection electrode e3, the second connection electrode e4 and the resin film e24 provided on the front surface e2A are pressed against the bottom e93A supported by the support base e95.

Upon the accommodation of the chip resistor e1 in the embossed carrier tape e92, a peelable cover e94 is applied onto a surface of the embossed carrier tape e92, whereby the inside spaces of the respective pockets e93 are sealed with the peelable cover e94. This prevents intrusion of foreign matter in the pockets e93. When the chip resistor e1 is to be taken out of the embossed carrier tape e92, the peelable cover e94 is peeled from the embossed carrier tape e92 to uncover the pocket e93. Thereafter, the chip resistor e1 is taken out of the pocket e93 and mounted as described above by the automatic mounting machine.

When the chip resistor e1 is mounted on the mount board or accommodated into the embossed carrier tape e92 or when a stress test is performed on the chip resistor e1, a force is applied to the back surface e2B (the longitudinally middle portion) of the chip resistor e1 to press the first connection electrode e3 and the second connection electrode e4 against an object (hereinafter referred to as a contact object). At this time, a stress acts on the front surface e2A of the board e2. Where the chip resistor e1 is mounted, the contact object is the mount board e9. Where the chip resistor e1 is accommodated into the embossed carrier tape e92, the contact object is the bottom e93A of the pocket e93 supported by the support base e95. In the stress test, the contact object is a support surface which supports the chip resistor e1 receiving the stress.

It is assumed that the chip resistor e1 is configured such that the height H of the resin film e24 on the front surface e2A of the board e2 (see FIG. 119) is less than the heights J of the first connection electrode e3 and the second connection electrode e4 (see FIG. 119), and the front surfaces e3A, e4A of the first connection electrode e3 and the second connection electrode e4 project to a greatest extent from the front surface e2A of the board e2 (i.e., the resin film e24 is thinner) (see FIG. 124 to be described later). In this case, the contact object contacts only the first connection electrode e3 and the second connection electrode e4 (at two points) on the front surface e2A of the chip resistor e1, so that the stress applied to the chip resistor e1 is concentrated on connections between the board e2 and the first and second connection electrodes e3, e4. This may deteriorate the electric characteristic properties of the chip resistor e1. Further, the stress may cause a strain in the chip resistor e1 (particularly, the longitudinally middle portion of the board e2) and, in the worst case, the board e2 will crack from the middle portion.

In the fifth reference embodiment, in contrast, the resin film e24 has a greater thickness so that the height H of the resin film e24 is not smaller than the heights J of the first connection electrode e3 and the second connection electrode e4 as described above (see FIG. 119). Therefore, the stress applied to the chip resistor e1 is received not only by the first connection electrode e3 and the second connection electrode e4 but also by the resin film e24. That is, the stress receiving area of the chip resistor e1 is increased, so that the stress applied to the chip resistor e1 can be distributed over the chip resistor e1. This suppresses the concentration of the stress on the first connection electrode e3 and the second connection electrode e4 of the chip resistor e1. Particularly, the front surface e24C of the resin film e24 can effectively distribute the stress applied to the chip resistor e1. This further suppresses the concentration of the stress on the chip capacitor e1, thereby improving the strength of the chip resistor e1. As a result, breakage of the chip resistor e1 can be suppressed which may otherwise occur during the mounting of the chip resistor e1, during the accommodation of the chip resistor e1 into the embossed carrier tape e92 or during a durability test. As a result, the yield can be improved in the mounting of the chip resistor e1 or in the accommodation of the chip resistor e1 into the embossed carrier tape e92. Further, the chip resistor e1 is less susceptible to the breakage, so that the handlability of the chip resistor e1 can be improved.

Next, modifications of the chip resistor e1 will be described. FIGS. 124 to 128 are schematic sectional views of chip resistors according to first to fifth modifications. In the first to fifth modifications, components corresponding to those of the chip resistor e1 will be designated by the same reference characters, and will not be described in detail. In FIG. 119, the front surface e3A of the first connection electrode e3 and the front surface e4A of the second connection electrode e4 are flush with the front surface e24C of the resin film e24. If no consideration is given to the distribution of the stress applied to the chip resistor e1 in the mounting, the front surface e3A of the first connection electrode e3 and the front surface e4A of the second connection electrode e4 may project from the front surface e24C of the resin film e24 away from the front surface e2A of the board e2 (upward in FIG. 124) as in the first modification shown in FIG. 124. In this case, the height H of the resin film e24 is less than the heights J of the first connection electrode e3 and the second connection electrode e4.

If it is desirable to more efficiently distribute the stress applied to the chip resistor e1 in the mounting than in the case shown in FIG. 119, in contrast, the height H of the resin film e24 may be greater than the heights J of the first connection electrode e3 and the second connection electrode e4 as in the second modification shown in FIG. 125. Thus, the resin film e24 has a greater thickness, so that the front surface e3A of the first connection electrode e3 and the front surface e4A of the second connection electrode e4 are offset from the front surface e24C of the resin film e24 toward the front surface e2A of the board e2 (downward in FIG. 124). In this case, the first connection electrode e3 and the second connection electrode e4 are recessed from the front surface e24C of the resin film e24 toward the board e2, so that the aforementioned two-point contact at the first connection electrode e3 and the second connection electrode e4 can be eliminated. This further suppresses the concentration of the stress on the chip resistor e1. Where the chip resistor e1 of the second modification is mounted on the mount board e9, however, thicker layers of the solder e13 should be formed on the respective connection terminals e88 of the mount board e9 to reach the front surface e3A of the first connection electrode e3 and the front surface e4A of the second connection electrode e4 for prevention of connection failure between the solder e13 and the first and second connection electrodes e3, e4 (see FIG. 111(*b*)).

An end face e20A of the insulative layer e20 provided on the front surface e2A of the board e2 (aligned with the edge portion e85 of the front surface e2A as seen in plan) extends along the thickness of the board e2 (vertically in FIGS. 119, 124 and 125), but may be inclined as shown in FIGS. 126 to 128. More specifically, the end face e20A of the insulative film e20 is inclined inward of the board e2 from the front surface e2A of the board e2 toward the front surface of the insulative film e20. A portion (the edge portion e23C described above) of the passivation film e23 covering the end face e20A may be inclined along the end face e20A according to the inclination of the end face e20A.

The chip resistors e1 of the third to fifth modifications shown in FIGS. 126 to 128 are different in the position of the edge portion e24A of the resin film e24. First, the chip resistor e1 of the third modification shown in FIG. 126 is substantially the same as the chip resistor e1 shown in FIG. 119, except that the end face e20A of the insulative film e20 and the edge portion e23C of the passivation film e23 are inclined. Therefore, the edge portion e24A of the resin film e24 is aligned with the side surface covering portion e23B of the passivation film e23, and is offset outward of the edge portion e85 of the front surface e2A of the board e2 (the edges of the front surface e2A of the board e2) by the thickness of the side surface covering portion e23B as seen in plan. If it is desirable to align the edge portion e24A with the side surface covering portion e23B, it is necessary to prevent the photosensitive resin liquid from entering the first trench e44 and the second trench e48 with the use of a mask not shown when the photosensitive resin liquid is sprayed for the formation of the resin film e46 described above (see FIG. 120E). If the liquid enters the first trench e44 and the second trench e48, the mask e62 to be used for the subsequent patterning of the resin film e46 (see FIG. 120F) may be formed with an opening e61 aligned with the first trench e44 and the second trench e48 as seen in plan. Thus, a part of the resin film e46 formed in the first trench e44 and the second trench e48 can be removed by the patterning of the resin film e46, whereby the edge portion e24A of the resin film e24 is aligned with the side surface covering portion e23B.

Here, the resin film e24, which is made of the resin, is less susceptible to cracking due to impact. Therefore, the resin film e24 can reliably protect the front surface e2A of the board e2 (particularly, the device e5 and the fuses F) and the edge portion e85 of the front surface e2A of the board e2 from the impact, so that the chip resistor e1 is excellent in impact resistance. In the chip resistor e1 of the fourth modification shown in FIG. 127, on the other hand, the edge portion e24A of the resin film e24 is not aligned with the side surface covering portion e23B of the passivation film e23 as seen in plan, but retracted inward of the side surface covering portion e23B, more specifically retracted with respect to the edge portion e85 of the front surface e2A of the board e2 inward of the board e2 as seen in plan. In this case, the resin film e24 can reliably protect the front surface e2A of the board e2 (particularly, the device e5 and the fuses F) from the impact, so that the chip resistor e1 is excellent in impact resistance. In order to retract the edge portion e24A of the resin film e24 inward of the board e2, the mask e62 to be used for the patterning of the resin film e46 may be formed with an opening e61 aligned with the edge portion e85 of the board e2 (substrate e30) as seen in plan (see FIG. 120F). Thus, a portion of the resin film e46 overlying the edge portion e85 of the board e2 (substrate e30) as seen in plan is removed by the patterning of the resin film e46. As a result, the edge portion e24A of the resin film e24 can be retracted inward of the board e2.

In the chip resistor e1 of the fifth modification shown in FIG. 128, the edge portion e24A of the resin film e24 is not aligned with the side surface covering portion e23B of the passivation film e23 as seen in plan. More specifically, the resin film e24 projects outward of the side surface covering portion e23B and covers the entire side surface covering portion e23B from the outer side. That is, the resin film e24 covers both the front surface covering portion e23A and the side surface covering portion e23B of the passivation film e23 in the fifth modification. In this case, the resin film e24 can reliably protect the front surface e2A of the board e2 (particularly, the device e5 and the fuses F) and the side surfaces e2C to e2F of the board e2 from the impact, so that the chip resistor e1 is excellent in impact resistance. If it is desirable to cover both the front surface covering portion e23A and the side surface covering portion e23B with the resin film e24, the photosensitive resin liquid may be permitted to enter the first trench e44 and the second trench e48 to adhere to the side surface covering portion e23B when the photosensitive resin liquid is sprayed to form the resin film e46 (see FIG. 120E). The spin-coating of the liquid described above is not preferred, because the first trench e44 and the second trench e48 are completely filled with the liquid to make it impossible to form a film of the liquid. If the resin film e46 is formed by applying a photosensitive resin sheet onto the front surface e30A of the substrate e30, on the other hand, the sheet enters neither of the first trench e44 and the second trench e48, failing to cover the entire side surface covering portion e23B. Therefore, the spraying of the photosensitive resin liquid is an effective method for covering both the front surface covering portion e23A and the side surface covering portion e23B with the resin film e24.

While the examples of the fifth reference embodiment have thus been described, the fifth reference embodiment may be embodied in other forms. In the examples described above, the chip resistor e1 is disclosed as an exemplary chip component according to the fifth reference embodiment. The fifth reference embodiment is applicable to a chip capacitor, a chip inductor, a chip diode and other chip components. The chip capacitor will hereinafter be described.

FIG. 129 is a plan view of a chip capacitor according to another example of the fifth reference embodiment. FIG. 130 is a sectional view taken along a sectional line CXXX-CXXX in FIG. 129. FIG. 131 is an exploded perspective view illustrating the chip capacitor with parts thereof separated. Components of the chip capacitor e101 corresponding to those of the chip resistor e1 will be designated by the same reference characters, and will not be described in detail. In the chip capacitor e101, components designated by the same reference characters as in the chip resistor e1 have the same construction as in the chip resistor e1 and the same effects as in the chip resistor e1, unless otherwise specified.

Referring to FIG. 129, the chip capacitor e101, like the chip resistor e1, includes a board e2, a first connection electrode e3 provided on the board e2 (on a front surface e2A of the board e2), and a second connection electrode e4 also provided on the board e2. In this example, the board e2 has a rectangular shape as seen in plan. The first connection electrode e3 and the second connection electrode e4 are respectively disposed on longitudinally opposite end portions of the board e2. In this example, the first connection electrode e3 and the second connection electrode e4 each have a generally rectangular plan shape elongated widthwise of the board e2. A plurality of capacitor elements C1 to C9 are provided in a capacitor provision region e105 between the first connection electrode e3 and the second connection electrode e4 on the front surface e2A of the board e2. The capacitor elements C1 to C9 are device elements constituting a device e5 (capacitor portion), and are disconnectably electrically connected to the second connection electrode e4 via a plurality of fuse units e107 (corresponding to the fuses F described above). The device e5 including these capacitor elements C1 to C9 is a capacitor circuit network.

As shown in FIGS. 130 and 131, an insulative layer e20 is provided on the front surface e2A of the board e2, and a lower electrode film e111 is provided on a surface of the insulative layer e20. The lower electrode film e111 extends over substantially the entire capacitor provision region e105. Further, the lower electrode film e111 extends to under the first connection electrode e3. More specifically, the lower electrode film e111 has a capacitor electrode region e111A functioning as a common lower electrode for the capacitor elements C1 to C9 in the capacitor provision region e105, and a pad region e111B (pad) disposed under the first connection electrode e3 for external electrode connection. The capacitor electrode region e111A is located in the capacitor provision region e105, while the pad region e111B is located under the first connection electrode e3 in contact with the first connection electrode e3.

A capacitive film (dielectric film) e112 is provided over the lower electrode film e111 (the capacitor electrode region e111A) in contact with the lower electrode film e111 in the capacitor provision region e105. The capacitive film e112 extends over the entire capacitor electrode region e111A (the capacitor provision region e105). In this example, the capacitive film e112 also covers a part of the insulative layer e20 outside the capacitor provision region e105.

An upper electrode film e113 is provided on the capacitive film e112 in contact with the capacitive film e112. In FIG. 129, the upper electrode film e113 is hatched for clarification. The upper electrode film e113 has a capacitor electrode region e113A located in the capacitor provision region e105, a pad region e113B (pad) located under the second connection electrode e4 in contact with the second connection electrode e4, and a fuse region e113C located between the capacitor electrode region e113A and the pad region e113B.

The capacitor electrode region e113A of the upper electrode film e113 is divided (split) into a plurality of electrode film portions (upper electrode film portions) e131 to e139. In this example, the electrode film portions e131 to e139 each have a rectangular shape, and extend linearly from the fuse region e113C toward the first connection electrode e3. The electrode film portions e131 to e139 are opposed to the lower electrode film e111 with a plurality of facing areas with the intervention of the capacitive film e112 (in contact with the capacitive film e112). More specifically, the facing areas of the respective electrode film portions e131 to e139 with respect to the lower electrode film e111 may be defined to have a ratio of 1:2:4:8:16:32:64:128:128. That is, the electrode film portions e131 to e139 include a plurality of electrode film portions having different facing areas, more specifically, a plurality of electrode film portions e131 to e138 (or e131 to e137 and e139) respectively having facing areas which are defined by a geometric progression with a geometric ratio of 2. Thus, the capacitor elements C1 to C9 respectively defined by the electrode film portions e131 to e139, the capacitive film e112 and the lower electrode film e111 opposed to the electrode film portions e131 to e139 with the intervention of the capacitive film e112 include a plurality of capacitor elements having different capacitance values. Where the facing areas of the electrode film portions e131 to e139 have the aforementioned ratio, the ratio of the capacitance values of the capacitor elements C1 to C9 is 1:2:4:8:16:32:64:128:128, which is equal to the ratio of the facing areas. That is, the capacitor elements C1 to C9 include a plurality of capacitor elements C1 to C8 (or C1 to C7 and C9) which respectively have capacitance values defined by the geometric progression with a geometric ratio of 2.

In this example, the electrode film portions e131 to e135 each have a strip shape of the same width, and respectively have lengths defined to have a ratio of 1:2:4:8:16. The electrode film portions e135, e136, e137, e138, e139 each have a strip shape of the same length, and respectively have widths defined to have a ratio of 1:2:4:8:8. The electrode film portions e135 to e139 extend from an edge of the second connection electrode e4 to an edge of the first connection electrode e3 in the capacitor provision region e105, and the electrode film portions e131 to e134 are shorter than the electrode film portions e135 to e139.

The pad region e113B is generally analogous to the second connection electrode e4, and has a generally rectangular plan shape. As shown in FIG. 130, the pad region e113B of the upper electrode film e113 contacts the second connection electrode e4. The fuse region e113C is located alongside a longer edge (an inner longer edge with respect to a periphery of the board e2) of the pad region e113B. The fuse region e113C includes the plurality of fuse units e107, which are arranged alongside the longer edge of the pad region e113B.

The fuse units e107 are formed of the same material as the pad region e113B of the upper electrode film e113 unitarily with the pad region e113B. The electrode film portions e131 to e139 are each formed integrally with one or more of the fuse units e107, and connected to the pad region e113B via these fuse units e107 to be thereby electrically connected to the second connection electrode e4 via the pad region e113B. As shown in FIG. 129, the electrode film portions e131 to e136 each having a relatively small area are each connected to the pad region e113B via a single fuse unit e107, and the electrode film portions e137 to e139 each having a relatively great area are each connected to the pad region e113B via a plurality of fuse units e107. It is not necessary to use all the fuse units e107, and some of the fuse units e107 are unused in this example.

The fuse units e107 each include a first wider portion e107A for connection to the pad region e113B, a second wider portion e107B for connection to the electrode film portions e131 to e139, and a narrower portion e107C connecting the first and second wider portions e107A, e107B to each other. The narrower portion e107C is configured to be disconnected (fused off) by a laser beam. With this arrangement, unnecessary ones of the electrode film portions e131 to e139 are electrically isolated from the first and second connection electrodes e3, e4 by disconnecting corresponding ones of the fuse units e107.

As shown in FIG. 130 but not shown in FIGS. 129 and 131, a front surface of the chip capacitor e101 including a surface of the upper electrode film e113 is covered with a passivation film e23. The passivation film e23 is formed of, for example, a nitride film, and extends to side surfaces e2C to e2F of the board e2 to cover not only the upper surface of the chip capacitor e101 but also the entire side surfaces e2C to e2F. Further, a resin film e24 is provided on the passivation film e23.

The passivation film e23 and the resin film e24 each serve as a protective film for protecting the front surface of the chip capacitor e101, and each have openings e25 in association with the first connection electrode e3 and the second connection electrode e4. The openings e25 extend through the passivation film e23 and the resin film e24 to expose a part of the pad region e111B of the lower electrode film e111 and a part of the pad region e113B of the upper electrode film e113. In this example, the opening e25 associated with the first connection electrode e3 also extends through the capacitive film e112.

The first connection electrode e3 and the second connection electrode e4 are respectively provided in the openings e25. Thus, the first connection electrode e3 is connected to the pad region e111B of the lower electrode film e111, while the second connection electrode e4 is connected to the pad region e113B of the upper electrode film e113. In this example, the first and second connection electrodes e3, e4 are flush with a front surface e24A of the resin film e24. Thus, the chip capacitor e101 can be connected to a mount board e9 through flip chip connection in the same manner as the chip resistor e1.

FIG. 132 is a circuit diagram showing the internal electrical configuration of the chip capacitor. The plurality of capacitor elements C1 to C9 are connected in parallel between the first connection electrode e3 and the second connection electrode e4. Fuses F1 to F9 each including one or more fuse units e107 are respectively connected in series between the second connection electrode e4 and the capacitor elements C1 to C9.

Where all the fuses F1 to F9 are connected, the overall capacitance value of the chip capacitor e101 is equal to the sum of the capacitance values of the respective capacitor elements C1 to C9. Where one or two or more fuses selected from the fuses F1 to F9 are disconnected, the capacitor elements associated with the disconnected fuses are isolated, so that the overall capacitance value of the chip capacitor e101 is reduced by the sum of the capacitance values of the isolated capacitor elements.

Therefore, the overall capacitance value of the chip capacitor can be adjusted to a desired capacitance value (through laser trimming) by measuring a capacitance value between the pad regions e111B and e113B (the total capacitance value of the capacitor elements C1 to C9) and then fusing off one or more fuses properly selected from the fuses F1 to F9 according to the desired capacitance value by the laser beam. Particularly, where the capacitance values of the capacitor elements C1 to C8 are defined by the geometric progression with a geometric ratio of 2, the overall capacitance value of the chip capacitor e101 can be finely adjusted to the desired capacitance value with an accuracy equivalent to the capacitance value of the smallest capacitance capacitor element C1 (the value of the first term of the geometric progression).

For example, the capacitance values of the capacitor elements C1 to C9 may be as follows: C1=0.03125 pF; C2=0.0625 pF; C3=0.125 pF; C4=0.25 pF; C5=0.5 pF; C6=1 pF; C7=2 pF; C8=4 pF; and C9=4 pF. In this case, the capacitance of the chip capacitor e101 can be finely adjusted with a minimum adjustable accuracy of 0.03125 pF. By properly selecting the to-be-disconnected fuses from the fuses F1 to F9, the chip capacitor e101 can be provided as having a desired capacitance value ranging from 10 pF to 18 pF.

In this example, as described above, the plurality of capacitor elements C1 to C9 which can be isolated by disconnecting the associated fuses F1 to F9 are provided between the first connection electrode e3 and the second connection electrode e4. The capacitor elements C1 to C9 include a plurality of capacitor elements having different capacitance values, more specifically, a plurality of capacitor elements having capacitance values defined by the geometric progression. Therefore, the chip capacitor e101 can be adapted for the plural capacitance values without changing the design, and customized based on the same design concept so as to have a desired capacitance value which is accurately controlled by selectively fusing off one or more of the fuses F1 to F9.

The respective components of the chip capacitor e101 will hereinafter be described in detail. Referring to FIG. 129, the board e2 may have a rectangular plan shape, for example, having a size of 0.3 mm×0.15 mm or 0.4 mm×0.2 mm (preferably, a size of not greater than 0.4 mm×0.2 mm). The capacitor provision region e105 is generally a square region which has an edge having a length equivalent to the length of the shorter edge of the board e2. The board e2 may have a thickness of about 150 μm. Referring to FIG. 130, the board e2 may be a board obtained by grinding or polishing a substrate from a back side (not formed with the capacitor elements C1 to C9) for thinning the substrate. A semiconductor substrate typified by a silicon substrate, a glass substrate or a resin film may be used as a material for the board e2.

The insulative layer e20 may be an oxide film such as a silicon oxide film, and may have a thickness of about 500 Å to about 2000 Å. The lower electrode film e111 is preferably an electrically conductive film, particularly preferably a metal film, and may be an aluminum film. The lower electrode film e111 of the aluminum film may be formed by a sputtering method. Similarly, the upper electrode film e113 is preferably an electrically conductive film, particularly preferably a metal film, and may be an aluminum film. The upper electrode film e113 of the aluminum film may be formed by a sputtering method. Further, a photolithography and etching process may be employed for patterning to divide the capacitor electrode region e113A of the upper electrode film e113 into the electrode film portions e131 to e139 and to shape the fuse region e113C into the plurality of fuse units e107.

The capacitive film e112 may be formed of, for example, a silicon nitride film, and have a thickness of 500 Å to 2000 Å (e.g., 1000 Å). The silicon nitride film for the capacitive film e112 may be formed by plasma CVD (chemical vapor deposition). The passivation film e23 may be formed of, for example, a silicon nitride film, for example, by a plasma CVD method. The passivation film e23 may have a thickness of about 8000 Å. The resin film e24 may be formed of a polyimide film or other resin film as described above.

The first and second connection electrodes e3, e4 may each be formed of a multilayer film including an Ni layer e33 provided in contact with the lower electrode film e111 or the upper electrode film e113, a Pd layer e34 provided on the Ni layer e33 and an Au layer e35 provided on the Pd layer e34, which may each be formed, for example, by an electroless plating method. The Ni layer e33 improves the adhesiveness to the lower electrode film e111 or the upper electrode film e113, and the Pd layer e34 functions as a diffusion preventing layer which suppresses mutual diffusion of the material of the upper and lower electrode films and gold of the uppermost layers of the first and second connection electrodes e3, e4.

For production of the chip capacitor e101, the same production process as for the chip resistor e1 may be employed after formation of the device e5. For the formation of the device e5 (capacitor portion) for the chip capacitor e101, an insulative layer e20 of an oxide film (e.g., a silicon oxide film) is first formed on a front surface of a substrate e30 (board e2) by a thermal oxidation method and/or a CVD method. Then, a lower electrode film e111 of an aluminum film is formed on the entire surface of the insulative layer e20, for example, by a sputtering method. The lower electrode film e111 may have a thickness of about 8000 Å. In turn, a resist pattern corresponding to the final shape of the lower electrode film e111 is formed on a surface of the lower electrode film by photolithography. The lower electrode film is etched by using the resist pattern as a mask. Thus, the lower electrode film e111 is provided as having a pattern shown in FIG. 129 and the like. The etching of the lower electrode film e111 may be achieved, for example, by reactive ion etching.

Then, a capacitive film e112 such as of a silicon nitride film is formed on the lower electrode film e111, for example, by a plasma CVD method. In a region not formed with the lower electrode film e111, the capacitive film e112 is formed on the surface of the insulative layer e20. In turn, an upper electrode film e113 is formed on the capacitive film e112. The upper electrode film e113 is formed from, for example, an aluminum film which is formed by a sputtering method. The upper electrode film e113 may have a thickness of about 8000 Å. Then, a resist pattern corresponding to the final shape of the upper electrode film e113 is formed on a surface of the upper electrode film e113 by photolithography. The upper electrode film e113 is etched with the use of this resist pattern as a mask to be thereby patterned into the final shape (see FIG. 129 and the like). Thus, the upper electrode film e113 is configured in a pattern such as to include a plurality of electrode film portions e131 to e139 in the capacitor electrode region e113A, a plurality of fuse units e107 in the fuse region e113C and a pad region e113B connected to the fuse units e107. Thus, capacitor elements C1 to C9 are formed according to the number of the electrode film portions e131 to e139 by dividing the upper electrode film e113. The etching for the patterning of the upper electrode film e113 may be achieved by wet etching with the use of an etching liquid such as phosphoric acid or by reactive ion etching.

In this manner, devices e5 (the capacitor elements C1 to C9 and the fuse units e107) for chip capacitors e101 are formed. After the formation of the devices e5, an insulative film e45 is formed as entirely covering the devices e5 (the upper electrode films e113 and a region of the capacitive film e112 not formed with the upper electrode films e113) by a plasma CVD method (see FIG. 120A). Thereafter, a first trench e44 and a second trench e48 are formed (see FIGS. 120B and 120C), and then openings e25 are formed (see FIG. 120D). Subsequently, probes e70 are pressed against the pad region e113B of the upper electrode film e113 and the pad region e111B of the lower electrode film e111 exposed from the openings e25 to measure the total capacitance value of the capacitor elements C1 to C9 for each of the devices e5 (see FIG. 120D). Based on the total capacitance value thus measured, capacitor elements to be isolated, i.e., fuses to be disconnected, are selected according to a target capacitance value of the chip capacitor e101.

In this state, a laser trimming process is performed for selectively fusing off the fuse units e107. That is, the laser beam is applied to fuse units e107 of the fuses selected according to the result of the measurement of the total capacitance value, whereby the narrower portions e107C of the selected fuse units e107 (see FIG. 129) are fused off. Thus, the associated capacitor elements are isolated from the pad region e113B. When the laser beam is applied to the fuse units e107, the energy of the laser beam is accumulated around the fuse units e107 by the function of the insulative film e45 serving as the cover film, thereby fusing off the fuse units e107. Thus, the capacitance value of the chip capacitor e101 can be reliably adjusted to the target capacitance value.

Subsequently, a silicon nitride film is deposited on the cover film (insulative film e45), for example, by a plasma CVD method to form a passivation film e23. The aforementioned cover film is finally unified with the passivation film e23 to form a part of the passivation film e23. The passivation film e23 formed after the disconnection of the fuses enters holes formed in the cover film when the cover film is partly broken during the fuse-off of the fuses, and covers disconnection surfaces of the fuse units e107 for protection. Therefore, the passivation film e23 prevents intrusion of foreign matter and moisture in the disconnected portions of the fuse units e107. This makes it possible to produce highly reliable chip capacitors e101. The passivation film e23 may be formed as having an overall thickness of, for example, about 8000 Å.

Then, a resin film e46 is formed (see FIG. 120E). Thereafter, the openings e25 closed with the resin film e46 and the passivation film e23 are uncovered (see FIG. 120F), whereby the pad regions e111B, e113B are exposed from the resin film e46 (resin film e24) through the openings e25. Thereafter, the first and second connection electrodes e3, e4 are respectively formed on the pad regions e111B, e113B exposed from the resin film e46 through the openings e25, for example, by an electroless plating method (see FIG. 120G).

Thereafter, as in the case of the chip resistors e1, the substrate e30 is ground from the back surface e30B (see FIG. 120H), whereby the resulting chip capacitors e101 are separated from each other. In the patterning of the upper electrode film e113 by utilizing the photolithography process, the electrode film portions e131 to e139 each having a very small area can be highly accurately formed, and the fuse units e107 can be formed in a minute pattern. After the patterning of the upper electrode film e113, the total capacitance value of the capacitor elements is measured, and the fuses to be disconnected are selected. The chip capacitors e101 can be provided as each having a desired capacitance value, which is accurately adjusted by disconnecting the selected fuses. That is, the chip capacitors e101 can be each easily and speedily customized to have any of plural capacitance values by selectively disconnecting one or more of the fuses. In other words, the chip capacitors e101 can be customized based on the same design concept so as to have various capacitance values by selectively combining capacitor elements C1 to C9 having different capacitance values.

While the chip components (the chip resistor e1 and the chip capacitor e101) according to the fifth reference embodiment have thus been described, the fifth reference embodiment may be embodied in other forms. In the aforementioned examples, the chip resistor e1 includes a plurality of resistor circuits having different resistance values defined by the geometric progression with a geometric ratio r ($0<r$, $r\neq1$)=2 by way of example, but the geometric ratio for the geometric progression may have a value other than 2. The chip capacitor e101 includes a plurality of capacitor elements having different capacitance values defined by the geometric progression with a geometric ratio r ($0<r$, $r\neq1$)=2 by way of example, but the geometric ratio for the geometric progression may have a value other than 2.

In the chip resistor e1 and the chip capacitor e101, the insulative layer e20 is provided on the front surface of the board e2. Where the board e2 is an insulative board, however, the insulative layer e20 may be obviated. In the chip capacitor e101, only the upper electrode film e113 is divided into a plurality of electrode film portions. However, only the lower electrode film e111 may be divided into a plurality of electrode film portions, or the upper electrode film e113 and the lower electrode film e111 may be each divided into a plurality of electrode film portions. In the aforementioned example, the fuse units are provided integrally with the upper electrode film or the lower electrode film, but may be formed from a conductor film different from the upper and lower electrode films. The chip capacitor e101 described above has a single-level capacitor structure including the upper electrode film e113 and the lower electrode film e111. Alternatively, a multi-level capacitor structure may be provided by stacking another electrode film on the upper electrode film e113 with the intervention of a capacitive film.

The chip capacitor e101 may be configured such that an electrically conductive board employed as the board e2 serves as the lower electrode and the capacitive film e112 is provided in contact with a surface of the electrically conductive board. In this case, one of the external electrodes may extend from the back surface of the electrically conductive board. Where the fifth reference embodiment is applied to a chip inductor, a device e5 formed on a board e2 of the chip inductor includes an inductor circuit network (inductor portion) including a plurality of inductor elements (device elements). In this case, the device e5 is provided in a multilevel interconnection formed on a front surface e2A of the board e2, and is formed from an interconnection film e22. In the chip inductor, the inductor elements for the inductor circuit network can be combined in a desired combination pattern by selectively disconnecting one or more fuses F. Thus, the chip inductor can be customized based on the same design concept so that the inductor circuit network has any of various levels of an electrical characteristic property.

Where the fifth reference embodiment is applied to a chip diode, a device e5 formed on a board e2 of the chip diode includes a diode circuit network (diode portion) including a plurality of diode elements (device elements). The diode portion is formed on the board e2. In the chip diode, the diode elements for the diode circuit network can be combined in a desired combination pattern by selectively disconnecting one or more fuses F. Thus, the chip diode can be customized based on the same design concept so that the diode circuit network has any of various levels of an electrical characteristic property.

The chip inductor and the chip diode provide the same effects as the chip resistor e1 and the chip capacitor e101. In the first connection electrode e3 and the second connection electrode e4, the Pd layer e34 to be provided between the Ni layer e33 and the Au layer e35 may be obviated. If the Au layer e35 is free from the pin hole described above, the Pd layer e34 may be obviated with proper adhesion between the Ni layer e33 and the Au layer e35.

Where the intersection portions e43 of the opening e42 of the resist pattern e41 to be used for the formation of the first trench e44 by the etching as described above (see FIG. 121) are rounded, the corner portions e11 of the front surface e2A of the board e2 (the corner portions between the rough surface regions S) can be rounded in each of the completed chip components. The first to fifth modifications (FIGS. 124 to 128) described above for the chip resistor e1 are also applicable to the chip capacitor e101, the chip inductor and the chip diode.

FIG. 133 is a perspective view showing the appearance of a smartphone as an exemplary electronic device which employs the chip component according to the fifth reference embodiment. The smartphone e201 includes electronic components provided in a housing e202 having a flat rectangular prismatic shape. The housing e202 has a pair of rectangular major surfaces on its front and back sides, and the pair of major surfaces are connected to each other by four side surfaces. A display screen of a display panel e203 such as a liquid crystal panel or an organic EL panel is exposed on one of the major surfaces of the housing e202. The display screen of the display panel e203 serves as a touch panel to provide an input interface to a user.

The display panel e203 has a rectangular shape occupying the most of the one major surface of the housing e202. Operation buttons e204 are provided alongside one shorter edge of the display panel e203. In this example, a plurality of operation buttons e204 (three operation buttons e204) are arranged alongside the shorter edge of the display panel e203. The user operates the smartphone e201 by operating the operation buttons e204 and the touch panel to call and execute a necessary function.

A speaker e205 is disposed adjacent the other shorter edge of the display panel e203. The speaker e205 serves as a reception port for a telephone function, and as an audio unit for playing music data and the like. On the other hand, a microphone e206 is provided adjacent the operation buttons e204 on one of the side surfaces of the housing e202. The microphone e206 serves as a transmission port for the telephone function, and as a microphone for recording.

FIG. 134 is a schematic plan view showing the configuration of an electronic circuit assembly e210 accommodated in the housing e202. The electronic circuit assembly e210 includes a wiring board e211, and circuit components mounted on a mount surface of the wiring board e211. The circuit components include a plurality of integrated circuit elements (ICs) e212 to e220, and a plurality of chip components. The ICs include a transmission IC e212, a so-called One-Seg TV receiving IC e213, a GPS receiving IC e214, an FM tuner IC e215, a power source IC e216, a flash memory e217, a microcomputer e218, a power source IC e219, and a base band IC e220. The chip components (corresponding to the chip components of the fifth reference embodiment) include chip inductors e221, e225, e235, chip resistors e222, e224, e233, chip capacitors e227, e230, e234, and chip diodes e228, e231.

The transmission IC e212 incorporates an electronic circuit which generates display control signals for the display panel e203 and receives signals inputted from the touch panel on the surface of the display panel e203. A flexible interconnection e209 is connected to the transmission IC e212 for connection to the display panel e203. The One-Seg TV receiving IC e213 incorporates an electronic circuit which serves as a receiver for receiving signals of so-called One-Seg broadcast (terrestrial digital television broadcast for mobile devices). The chip inductors e221 and the chip resistors e222 are provided adjacent the One-Seg TV receiving IC e213. The One-Seg TV receiving IC e213, the chip inductors e221 and the chip resistors e222 constitute a One-Seg broadcast receiving circuit e223. The chip inductors e221 each have an accurately adjusted inductance, and the chip resistors e222 each have an accurately adjusted resistance. Thus, the One-Seg broadcast receiving circuit e223 has a highly accurate circuit constant.

The GPS receiving IC e214 incorporates an electronic circuit which receives signals from a GPS satellite and outputs the positional information of the smartphone e201. The FM tuner IC e215, and the chip resistors e224 and the chip inductors e225 mounted adjacent the FM tuner IC e215 on the wiring board e211 constitute an FM broadcast receiving circuit e226. The chip resistors e224 each have an accurately adjusted resistance, and the chip inductors e225 each have an accurately adjusted inductance. Thus, the FM broadcast receiving circuit e226 has a highly accurate circuit constant.

The chip capacitors e227 and the chip diodes e228 are mounted adjacent the power source IC e216 on the mount surface of the wiring board e221. The power source IC e216, the chip capacitors e227 and the chip diodes e228 constitute a power source circuit e229. The flash memory e217 is a storage which stores an operating system program, data generated in the smartphone e201, and data and programs acquired from the outside by communication function.

The microcomputer e218 incorporates a CPU, a ROM and a RAM, and serves as a processing circuit which performs a variety of processing operations to execute functions of the smartphone e201. More specifically, the microcomputer e218 performs processing operations for image processing and a variety of application programs. The chip capacitors e230 and the chip diodes e231 are mounted adjacent the power source IC e219 on the mount surface of the wiring board e211. The power source IC e219, the chip capacitors e230 and the chip diodes e231 constitute a power source circuit e232.

The chip resistors e233, the chip capacitors e234 and the chip inductors e235 are mounted adjacent the base band IC e220 on the mount surface of the wiring board e211. The base band IC e220, the chip resistors e233, the chip capacitors e234 and the chip inductors e235 constitute a base band communication circuit e236. The base band communication circuit e236 provides communication functions for telephone communications and data communications.

With this arrangement, electric power properly controlled by the power source circuits e229, e232 is supplied to the transmission IC e212, the GPS receiving IC e214, the One-Seg broadcast receiving circuit e223, the FM broadcast receiving circuit e226, the base band communication circuit e236, the flash memory e217 and the microcomputer e218. The microcomputer e218 performs a processing operation in response to signals inputted thereto via the transmission IC e212, and outputs display control signals from the transmission IC e212 to the display panel e203 to cause the display panel e203 to perform a variety of display operations.

When a command for receiving One-Seg broadcast is given by operating the touch panel or the operation buttons e204, the One-Seg broadcast is received by the function of the One-Seg broadcast receiving circuit e223. Then, a processing operation for outputting a received image on the display panel e203 and outputting a received sound from the speaker e205 is performed by the microcomputer e218. When the positional information of the smartphone e201 is required, the microcomputer e218 acquires positional information outputted from the GPS receiving IC e214 and performs a processing operation using the positional information.

Further, when a command for receiving FM broadcast is inputted by operating the touch panel or the operation buttons e204, the microcomputer e218 actuates the FM broadcast receiving circuit e226 and performs a processing operation for outputting a received sound from the speaker e205. The flash memory e217 is used for storing data acquired through communications, and for storing data generated by performing a processing operation by the microcomputer e218 or data generated by inputting from the touch panel. As required, the microcomputer e218 writes data in the flash memory e217 and reads data from the flash memory e217.

The functions of the telephone communications and the data communications are performed by the base band communication circuit e236. The microcomputer e218 controls the base band communication circuit e236 to perform operations for transmitting and receiving sounds and data.

1: Chip resistor, 2: Board, 2A: Device formation surface, 2B: Back surface, 2C: Side surface, 2D: Side surface, 2E: Side surface, 2F: Side surface, 3: First connection electrode, 4: Second connection electrode, 11: Intersection portion, 20: Insulative layer, 22: Interconnection film, 23: Insulative film, 24: Resin film, 27: Intersection portion, 30: Substrate, 30B: Back surface, 44: Trench, 56: Resistor portion, 71: Support base, R: Resistor body, X: Trimming region, Y: Chip resistance region, Z: Boundary region The invention claimed:

1. A chip resistor comprising:
- a board having a device formation surface, a back surface opposite from the device formation surface and a side surface connecting the device formation surface to the back surface;
- a resistor portion provided on the device formation surface;
- an external connection electrode provided on the device formation surface and electrically connected to the resistor portion; and
- a resin film which covers the device formation surface with the external connection electrode being exposed therefrom, the entire external connection electrode being surrounded by the resin film; wherein
- an intersection portion of the board along which the back surface intersects the side surface has a rounded shape.

2. The chip resistor according to claim 1, wherein the board has a plurality of side surfaces intersecting one another, and intersection portions of the board along which the side surfaces intersect one another each have a rounded shape.

3. The chip resistor according to claim 2, wherein the rounded shape has a curvature radius that is greater than 0 μm and not greater than 20 μm.

4. The chip resistor according to claim 1, wherein an insulative layer is provided between the board and the resistor portion.

5. The chip resistor according to claim 1,
- wherein the resistor portion includes a thin film resistor body provided on the device formation surface,
- the chip resistor further comprising an interconnection film provided on the device formation surface and connected to the thin film resistor body,
- wherein the resin film covers the thin film resistor body and the interconnection film.

6. The chip resistor according to claim 5,
- wherein the resistor portion includes a plurality of thin film resistor bodies each having the same resistance value,
- wherein the thin film resistor bodies are connected in a connection state which is changeable in a predetermined trimming region.

7. The chip resistor according to claim 5, further comprising a protective film provided over the device formation surface as covering the thin film resistor body and the interconnection film,
- wherein the resin film covers a surface of the protective film.

8. The chip resistor according to claim 1, wherein an intersection portion of the board along which the device formation surface intersects the side surface has a shape different from the rounded shape.

9. The chip resistor according to claim 8, wherein the resin film covers the intersection portion of the board along which the device formation surface intersects the side surface.

10. The chip resistor according to claim 9, wherein the resin film is bulged outwardly of the board on the intersection portion of the board along which the device formation surface intersects the side surface.

11. The chip resistor according to claim 1, wherein the resin film is provided on a region of the side surface of the board located adjacent the device formation surface away from the back surface.

12. The chip resistor according to claim 1, wherein the resin film comprises a polyimide.

13. A chip resistor production method comprising the steps of:
- defining a plurality of chip resistor regions each having a resistor portion on a device formation surface of a substrate;
- removing a part of the substrate from a boundary region defined between adjacent chip resistor regions to form a side surface perpendicular to the device formation surface;
- dividing the substrate along the boundary region to separate chip resistors from each other; and
- etching the substrate from a back surface of the substrate opposite from the device formation surface to round an intersection portion of a board of each of the separated chip resistors along which the back surface intersects the side surface.

14. The chip resistor production method according to claim 13,
- wherein a plurality of side surfaces which intersect one another are formed in the side surface forming step,
- wherein the etching is isotropic etching,
- wherein intersection portions along which the side surfaces intersect one another are rounded.

15. The chip resistor production method according to claim 13, wherein the etching step includes the step of spouting a mist of an etching liquid toward the back surfaces of the chip resistors.

16. The chip resistor production method according to claim 13, further comprising the step of forming a resin film which covers the device formation surface.

17. The chip resistor production method according to claim 16, wherein the resin film forming step includes the step of covering, with the resin film, the intersection portion of the board along which the device formation surface intersects the side surface.

18. The chip resistor production method according to claim 13, wherein the side surface forming step includes the step of forming a trench in the boundary region of the substrate defined between the adjacent chip resistor regions, wherein the chip resistor separating step includes the step of thinning the substrate from the back surface to the trench.

19. The chip resistor production method according to claim 18, further comprising the step of bonding a support base to the device formation surface after the formation of the trench, wherein the substrate is thinned from the back surface in the thinning step while being supported by the support base, wherein the plurality of chip resistors are etched while being supported by the support base.

20. The chip resistor production method according to claim 19, wherein the etching is performed while the support base is rotated within a plane coplanar with the back surface.

* * * * *